US011678498B2

(12) United States Patent
Cho et al.

(10) Patent No.: US 11,678,498 B2
(45) Date of Patent: Jun. 13, 2023

(54) ORGANIC LIGHT-EMITTING DEVICE

(71) Applicant: SAMSUNG DISPLAY CO., LTD., Yongin-si (KR)

(72) Inventors: Hwan-Hee Cho, Yongin-si (KR); Myeong-Suk Kim, Yongin-si (KR); Sung-Wook Kim, Yongin-si (KR); Chang-Woong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 583 days.

(21) Appl. No.: 15/459,258

(22) Filed: Mar. 15, 2017

(65) Prior Publication Data

US 2017/0294613 A1 Oct. 12, 2017

(30) Foreign Application Priority Data

Apr. 7, 2016 (KR) ........................ 10-2016-0042799

(51) Int. Cl.

| | |
|---|---|
| ***H01L 51/54*** | (2006.01) |
| ***H01L 51/50*** | (2006.01) |
| ***H05B 33/14*** | (2006.01) |
| ***H05B 33/20*** | (2006.01) |
| ***H01L 51/00*** | (2006.01) |
| ***C09K 11/02*** | (2006.01) |
| ***C09K 11/06*** | (2006.01) |

(52) U.S. Cl.

CPC ........ *H01L 51/5004* (2013.01); *C09K 11/025* (2013.01); *C09K 11/06* (2013.01); *H01L 51/0052* (2013.01); *H01L 51/0054* (2013.01); *H01L 51/0067* (2013.01); *H01L 51/0071* (2013.01); *H01L 51/0072* (2013.01); *H01L 51/0073* (2013.01); *H01L 51/0094* (2013.01); *H01L 51/508* (2013.01); *H01L 51/5016* (2013.01); *H05B 33/14* (2013.01); *H05B 33/20* (2013.01); *C09K 2211/1007* (2013.01); *C09K 2211/1029* (2013.01); *C09K 2211/185* (2013.01); *H01L 51/0058* (2013.01); *H01L 51/0085* (2013.01); *H01L 2251/5384* (2013.01); *H01L 2251/552* (2013.01)

(58) Field of Classification Search

CPC ... C09K 11/025; C09K 11/06; C09K 2211/00; C09K 2211/10; C09K 2211/1007; C09K 2211/1029; C09K 2211/185; H05B 33/20; H01L 51/0032; H01L 51/005; H01L 51/0054; H01L 51/0067; H01L 51/0058; H01L 51/0071; H01L 51/0072; H01L 51/0073; H01L 51/0074; H01L 51/0085; H01L 51/0094; H01L 51/50; H01L 51/5012; H01L 51/5016; H01L 51/508; H01L 51/5004; H01L 2251/552

USPC ....... 428/690, 691, 917, 411.4, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

| | | | | |
|---|---|---|---|---|
| 7,651,790 | B2 | 1/2010 | Lee et al. | |
| 7,663,304 | B2 | 2/2010 | Fukuoka et al. | |
| 9,543,538 | B2 | 1/2017 | Kim et al. | |
| 10,297,756 | B2 | 5/2019 | Lee et al. | |
| 2002/0098379 | A1 | 7/2002 | Arakane et al. | |
| 2006/0055305 | A1 | 3/2006 | Funahashi et al. | |
| 2010/0187977 | A1* | 7/2010 | Kai | H01L 51/0072 313/504 |
| 2011/0156013 | A1* | 6/2011 | Kim | C07D 401/10 257/40 |
| 2012/0080670 | A1* | 4/2012 | Park | H05B 33/14 546/276.7 |
| 2013/0207082 | A1 | 8/2013 | Cho et al. | |
| 2013/0299787 | A1 | 11/2013 | Steudel et al. | |

(Continued)

FOREIGN PATENT DOCUMENTS

| | | | |
|---|---|---|---|
| CN | 103180991 | A | 6/2013 |
| CN | 103904252 | A | 7/2014 |

(Continued)

OTHER PUBLICATIONS

Machine translation of JP2012-056880. (Year: 2012).*
Chinese Office Action dated Jul. 1, 2020, for corresponding Chinese Patent Application No. 201710224099.7 (12 pages).

(Continued)

*Primary Examiner* — Andrew K Bohaty
(74) *Attorney, Agent, or Firm* — Lewis Roca Rothgerber Christie LLP

(57) ABSTRACT

An organic light-emitting device including a first electrode; a second electrode facing the first electrode; an emission layer between the first electrode and the second electrode, the emission layer including a first compound and a second compound; a hole transport region between the first electrode and the emission layer; and an electron transport region, the electron transport region including a buffer layer between the emission layer and the second electrode, the buffer layer including a third compound, and an electron transport layer between the buffer layer and the second electrode, the electron transport layer including a fourth compound, wherein, in the emission layer, the first compound is a phosphorescent host and the second compound is a phosphorescent dopant, wherein the first compound and the third compound are different from each other, wherein the first compound and the third compound each independently include both an electron transport group and a hole transport group.

15 Claims, 2 Drawing Sheets

(56) References Cited

U.S. PATENT DOCUMENTS

| | | | | |
|---|---|---|---|---|
| 2014/0183495 A1* | 7/2014 | Lee | H01L 51/0052 257/40 |
| 2014/0374711 A1 | 12/2014 | Cho et al. | |
| 2015/0171344 A1 | 6/2015 | Bae et al. | |
| 2015/0194622 A1* | 7/2015 | Yamamoto | C09K 11/06 257/40 |
| 2015/0236262 A1 | 8/2015 | Cho et al. | |
| 2015/0325798 A1 | 11/2015 | Cho et al. | |
| 2016/0322583 A1* | 11/2016 | Kim | H01L 51/0058 |
| 2016/0351825 A1* | 12/2016 | Kim | C07D 491/044 |
| 2017/0012211 A1 | 1/2017 | Cho et al. | |
| 2017/0125699 A1* | 5/2017 | Ahn | C07F 15/0033 |

FOREIGN PATENT DOCUMENTS

| | | | | | |
|---|---|---|---|---|---|
| CN | 104364344 | A | | 2/2015 | |
| CN | 104795504 | A | | 7/2015 | |
| JP | 2012056880 | A | * | 3/2012 | |
| JP | 2012-146764 | A | | 8/2012 | |
| KR | 2003-0071617 | A | | 9/2003 | |
| KR | 10-2006-0040830 | A | | 5/2006 | |
| KR | 10-2009-0100365 | A | | 9/2009 | |
| KR | 10-1008769 | B1 | | 1/2011 | |
| KR | 10-1009784 | B1 | | 1/2011 | |
| KR | 10-2013-0093327 | A | | 8/2013 | |
| KR | 10-2014-0029182 | A | | 3/2014 | |
| KR | 1502316 | B1 | * | 7/2014 | |
| KR | 10-2014-0103436 | A | | 8/2014 | |
| KR | 10-2015-0070897 | A | | 6/2015 | |
| KR | 10-2015-0077284 | A | | 7/2015 | |
| KR | 10-2015-0085772 | A | | 7/2015 | |
| KR | 10-2015-0096593 | A | | 8/2015 | |
| KR | 10-2015-0107442 | A | | 9/2015 | |
| KR | 10-2017-0007648 | A | | 1/2017 | |
| WO | WO 2015/012528 | A3 | | 1/2015 | |
| WO | WO-2015093812 | A1 | * | 6/2015 | |
| WO | WO-2015099481 | A1 | * | 7/2015 | C09K 11/025 |
| WO | WO 2015/125986 | A1 | | 8/2015 | |
| WO | WO 2015/133807 | A1 | | 9/2015 | |
| WO | 2015/160224 | A1 | | 10/2015 | |
| WO | WO 2015/190718 | A1 | | 12/2015 | |
| WO | WO 2016/013894 | A2 | | 1/2016 | |

OTHER PUBLICATIONS

Office Action dated Jul. 28, 2021 for corresponding Chinese Patent Application No. 201710224099.7, 13 pages.

* cited by examiner

ORGANIC LIGHT-EMITTING DEVICE

CROSS-REFERENCE TO RELATED APPLICATION

Korean Patent Application No. 10-2016-0042799, filed on Apr. 7, 2016, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light-emitting devices are self-emission devices that have wide viewing angles, high contrast ratios, short response times, and excellent brightness, driving voltage, and response speed characteristics, compared to devices in the art.

For example, an organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state, thereby generating light.

SUMMARY

The embodiments may be realized by providing an organic light-emitting device including a first electrode; a second electrode facing the first electrode; an emission layer between the first electrode and the second electrode, the emission layer including a first compound and a second compound; a hole transport region between the first electrode and the emission layer; and an electron transport region, the electron transport region including a buffer layer between the emission layer and the second electrode, the buffer layer including a third compound, and an electron transport layer between the buffer layer and the second electrode, the electron transport layer including a fourth compound, wherein, in the emission layer, the first compound is a phosphorescent host and the second compound is a phosphorescent dopant, wherein the first compound and the third compound are different from each other, wherein the first compound and the third compound each independently include both an electron transport group and a hole transport group, wherein the organic light-emitting device satisfies Equations 1 to 3:

$$E_{3,LUMO} \geq E_{1,LUMO} + 0.1 \text{ eV}$$ <Equation 1>

$$E_{3,LUMO} \geq E_{4,LUMO} + 0.1 \text{ eV}$$ <Equation 2>

$$E_{3gap} \geq E_{1gap},$$ <Equation 3> wherein, in Equations 1 to 3 $E_{1,LUMO}$ refers to lowest unoccupied molecular orbital (LUMO) energy of the first compound, $E_{3,LUMO}$ refers to LUMO energy of the third compound, $E_{4,LUMO}$ refers to LUMO energy of the fourth compound, $E_{1gap}$ refers to a gap between LUMO energy and highest occupied molecular orbital (HOMO) energy of the first compound, and $E_{3gap}$ refers to a gap between LUMO energy and HUMO energy of the third compound.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
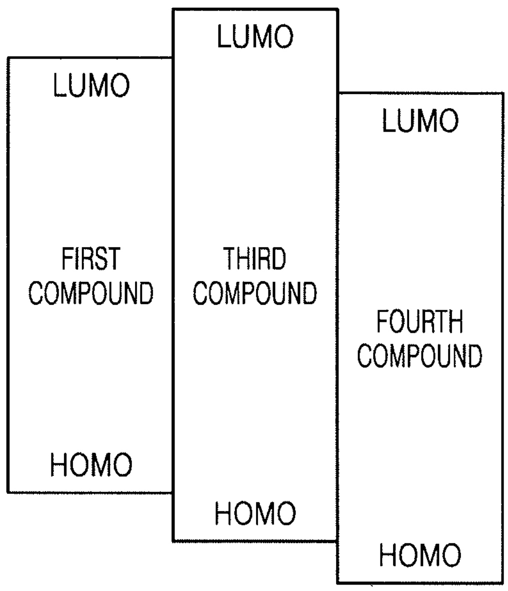
FIG. 1 illustrates a schematic view showing HOMO/LUMO energies of a first compound, a third compound, and a fourth compound in an organic light-emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening elements may also be present. In addition, it will also be understood that when an element is referred to as being "between" two elements, it can be the only element between the two elements, or one or more intervening elements may also be present. Like reference numerals refer to like elements throughout.

As used herein, the term "and/or" and "or" includes any and all combinations of one or more of the associated listed items. Expressions such as "at least one of," when preceding a list of elements, modify the entire list of elements and do not modify the individual elements of the list.

An organic light-emitting device according to one or more embodiments may include, e.g., a first electrode; a second electrode facing the first electrode; an emission layer between the first electrode and the second electrode, the emission layer including a first compound and a second compound; a hole transport region between the first electrode and the emission layer; and an electron transport region including i) a buffer layer between the emission layer and the second electrode, the buffer layer including a third compound, and ii) an electron transport layer between the buffer layer and the second electrode, the electron transport layer including a fourth compound.

In the emission layer, the first compound may be a phosphorescent host and the second compound may be a phosphorescent dopant.

The first compound and the third compound may be different from each other and may each independently include both an electron transport group and a hole transport group.

The organic light-emitting device may satisfy Equations 1 to 3.

$$E_{3,LUMO} \geq E_{1,LUMO} + 0.1 \text{ eV}$$ <Equation 1>

$$E_{3,LUMO} \geq E_{4,LUMO} + 0.1 \text{ eV}$$ <Equation 2>

$$E_{3gap} \geq E_{1gap},$$ <Equation 3>

In Equations 1 to 3, $E_{1,LUMO}$ refers to LUMO energy of the first compound, $E_{3,LUMO}$ refers to LUMO energy of the third compound, $E_{4,LUMO}$ refers to LUMO energy of the fourth compound, $E_{1gap}$ refers to a gap between LUMO energy and HOMO energy of the first compound, and $E_{3gap}$ refers to a gap between LUMO energy and HOMO energy of the third compound.

In an implementation, the organic light-emitting device may further satisfy at least one selected from Equations 4 and 5.

$$E_{3,T1} \geq E_{2,T1}$$ <Equation 4>

$$E_{3,gap,ST} \geq E_{1,gap,ST},$$ <Equation 5>

In Equations 4 and 5, $E_{2,T1}$ refers to triplet energy of the second compound, $E_{3,T1}$ refers to triplet energy of the third compound, $E_{1,gap,ST}$ refers to a gap between singlet energy and triplet energy of the first compound, and $E_{3,gap,ST}$ refers to a gap between singlet energy and triplet energy of the third compound.

The organic light-emitting device may satisfy Equations 1 to 5, and the organic light-emitting device may facilitate balance control of electrons and/or holes injected or transported to the emission layer due to relatively high $E_{3,LUMO}$, thereby obtaining long lifespan and high efficiency characteristics.

The first compound may be represented by Formula 1-1, and the third compound may be represented by Formula 1-2.

$$HT_1\text{-}(L_{11})_{a11}\text{-}ET_1$$ <Formula 1-1>

$$HT_2\text{-}(L_{12})_{a12}\text{-}ET_2,$$ <Formula 1-2>

In Formulae 1-1 and 1-2, $HT_1$ and $HT_2$ may be a hole transport group, and $ET_1$ and $ET_2$ may be an electron transport group.

For example, $HT_1$ and $HT_2$ in Formulae 1-1 and 1-2 may each independently be a group represented by one of the following Formulae 2-1 to 2-4.

In an implementation, in Formulae 1-1 and 1-2, $HT_1$ may be a group represented by Formula 2-1 or 2-2, and $HT_2$ may be selected from a group represented by one of Formulae 2-1 to 2-4.

<Formula 2-1>

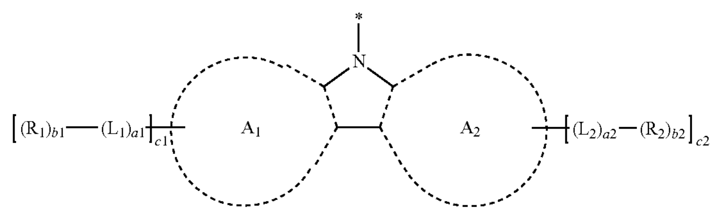

<Formula 2-2>

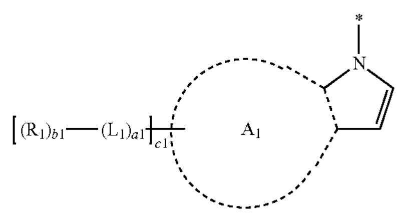

<Formula 2-3>

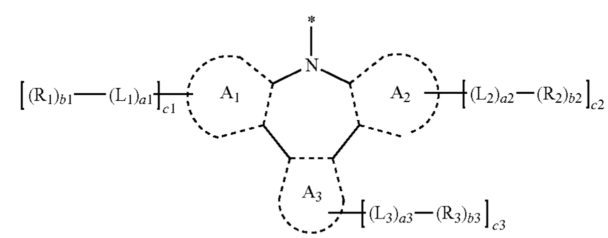

<Formula 2-4>

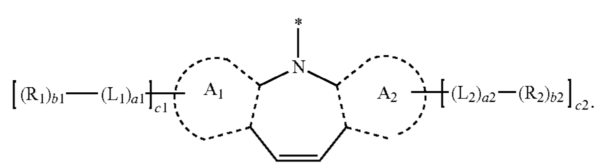

In Formulae 2-1 to 2-4, ring $A_1$, ring $A_2$, and ring $A_3$ may each independently be selected from a $C_5$-$C_{60}$ carbocyclic group or a $C_1$-$C_{60}$ heterocyclic group. Herein, the descriptions of rings (e.g., fused rings) being groups refers to a core moiety of the ring as a part of the whole compound. For example, it will be understood that when ring $A_1$ of Formula 2-1 is a C6 carbocyclic group (e.g., a phenyl group), carbon atoms and a bond are shared between ring $A_1$ and the nitrogen containing central ring of Formula 2-1, In an implementation, in Formulae 2-1 to 2-4, ring $A_1$, ring $A_2$, and ring $A_3$ may each independently be a group represented by one of Formulae 2A to 2Z.

Formula 2A

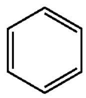

Formula 2B

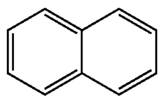

Formula 2C

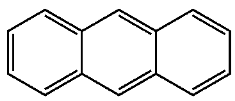

Formula 2D

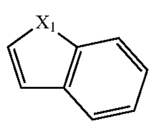

Formula 2E

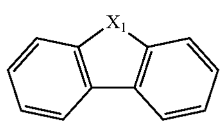

Formula 2F

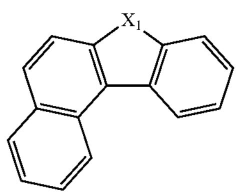

Formula 2G

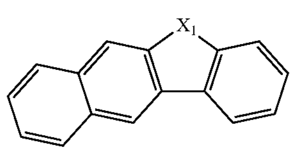

Formula 2H

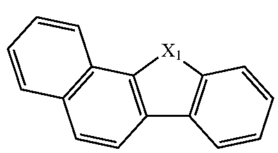

Formula 2I

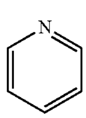

Formula 2J

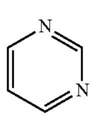

-continued

Formula 2K

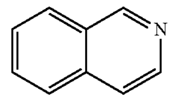

Formula 2L

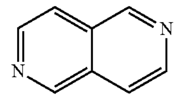

Formula 2M

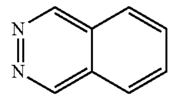

Formula 2N

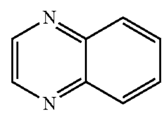

Formula 2O

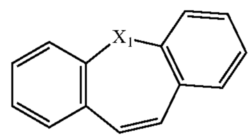

Formula 2P

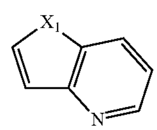

Formula 2Q

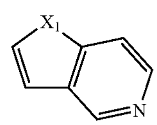

Formula 2R

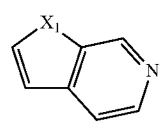

Formula 2S

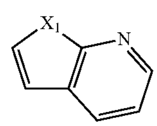

Formula 2T

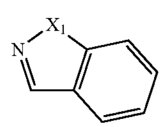

Formula 2U

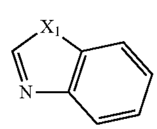

Formula 2V

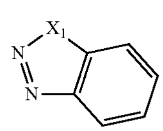

-continued

Formula 2W

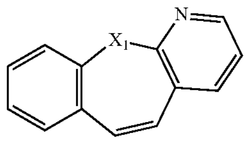

Formula 2X

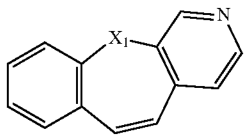

Formula 2Y

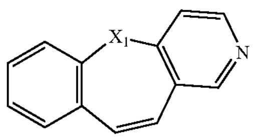

Formula 2Z

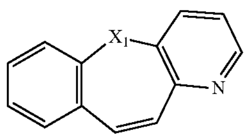

In Formulae 2A to 2Z, $X_1$ may be selected from O, S, $N(R_{11})$, and $Si(R_{11})(R_{12})$, and $R_{11}$ and $R_{12}$ may be the same as described below in connection with $R_1$.

In an implementation, in Formulae 1-1 and 1-2, $HT_1$ may be a group represented by Formula 2-1, and ring $A_1$ and ring $A_2$ in Formula 2-1 of $HT_1$ may each independently be a group represented by one of Formulae 2A to 2N, and $HT_2$ may be a group represented by one of Formulae 2-1 to 2-4, and ring $A_1$, ring $A_2$, and ring $A_3$ in Formulae 2-1 to 2-4 of $HT_2$ may each independently be a group represented by one of Formulae 2A to 2Z.

In an implementation, in Formula 1-1, $HT_1$ may be a group represented by Formula 2-1, and, in Formula 2-1, ring $A_1$ may be a group represented by one of Formulae 2A to 2C and 2I, and ring $A_2$ may be a group represented by one of Formulae 2E to 2H; or ring $A_1$ may be a group represented by one of Formulae 2A to 2C and 2I, and ring $A_2$ may be a group represented by one of Formulae 2A to 2C and 2I to 2N.

In an implementation, in Formula 1-2, $HT_2$ may be a group represented by Formula 2-1, wherein, in Formula 2-1, ring $A_1$ may be a group represented by Formula 2A or 2I, and ring $A_2$ may be a group represented by one of Formulae 2A to 2D, 2I, 2J, and 2O to 2Z;

$HT_2$ may be a group represented by Formula 2-2, wherein, in Formula 2-2, ring $A_1$ may be a group represented by Formula 2E;

$HT_2$ may be a group represented by Formula 2-3, wherein, in Formula 2-3, ring $A_1$ and ring $A_2$ may be a group represented by Formula 2A, and ring $A_3$ may be a group represented by Formula 2D; or $HT_2$ may be a group represented by Formula 2-4, wherein, in Formula 2-4, ring $A_1$ may be a group represented by Formula 2A, and ring $A_2$ may be a group represented by Formula 2E.

In an implementation, $ET_1$ and $ET_2$ in Formulae 1-1 and 1-2 may each independently be a $C_1$-$C_{60}$ heterocyclic group having at least one *=N—*' moiety as a ring-forming moiety.

In an implementation, in Formulae 1-1 and 1-2, $ET_1$ and $ET_2$ may each independently be, e.g., a group represented by one of Formulae 6-1 to 6-125.

Formula 6-1

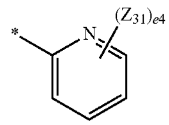

Formula 6-2

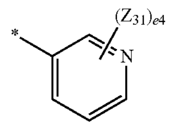

Formula 6-3

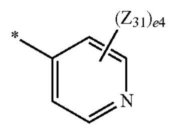

Formula 6-4

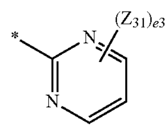

Formula 6-5

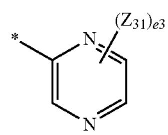

Formula 6-6

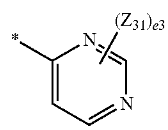

Formula 6-7

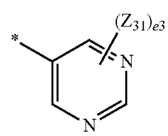

Formula 6-8

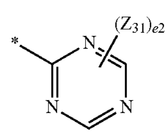

Formula 6-9

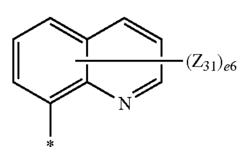

Formula 6-10

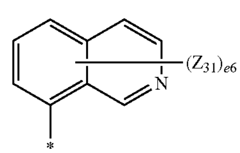

Formula 6-11

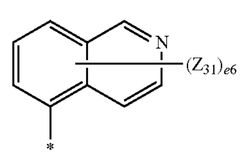

-continued
Formula 6-12
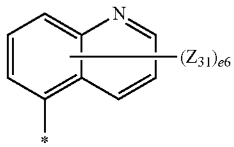
Formula 6-13
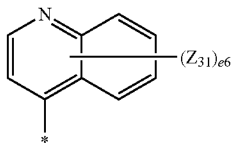
Formula 6-14
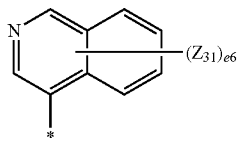
Formula 6-15
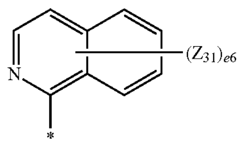
Formula 6-16
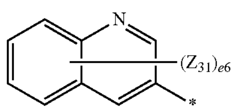
Formula 6-17
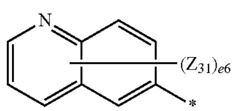
Formula 6-18
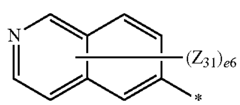
Formula 6-19
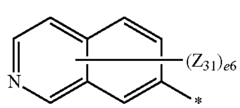
Formula 6-20
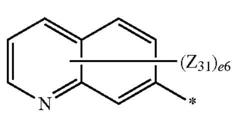
Formula 6-21
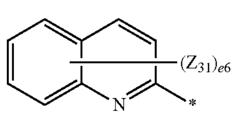
Formula 6-22
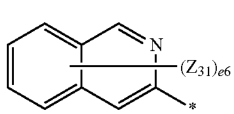
Formula 6-23
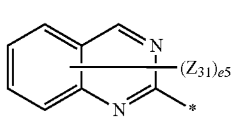
-continued
Formula 6-24
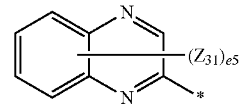
Formula 6-25
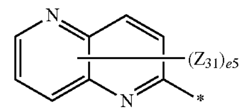
Formula 6-26
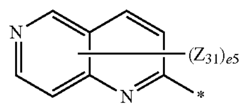
Formula 6-27
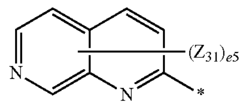
Formula 6-28
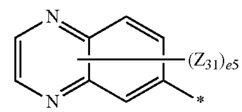
Formula 6-29
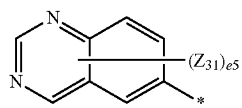
Formula 6-30
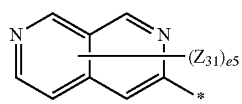
Formula 6-31
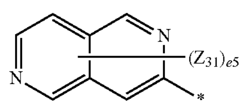
Formula 6-32
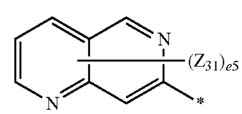
Formula 6-33
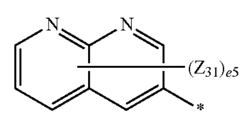
Formula 6-34
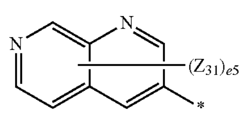
Formula 6-35
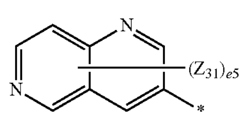
Formula 6-36
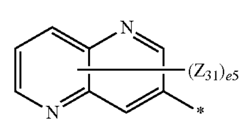

-continued
Formula 6-37
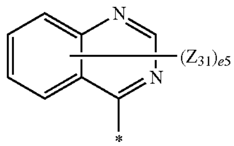
Formula 6-38
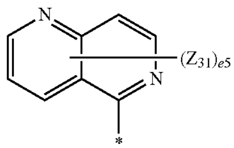
Formula 6-39
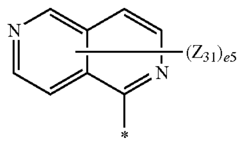
Formula 6-40
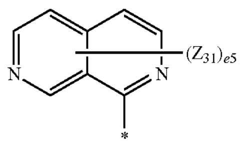
Formula 6-41
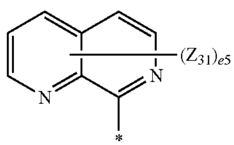
Formula 6-42
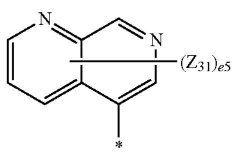
Formula 6-43
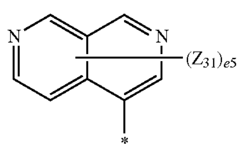
Formula 6-44
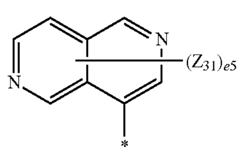
Formula 6-45
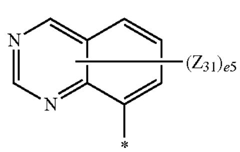
Formula 6-46
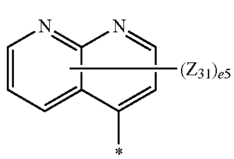
-continued
Formula 6-47
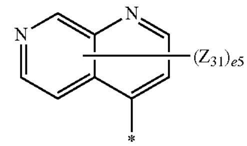
Formula 6-48
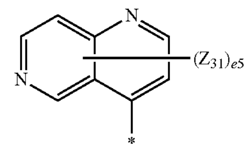
Formula 6-49
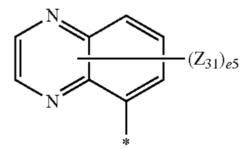
Formula 6-50
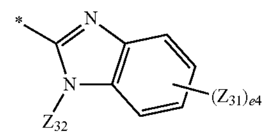
Formula 6-51
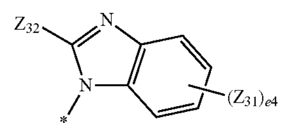
Formula 6-52
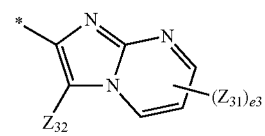
Formula 6-53
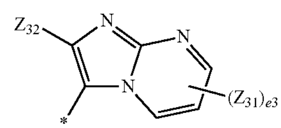
Formula 6-54
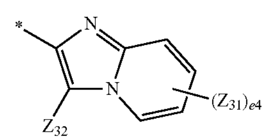
Formula 6-55
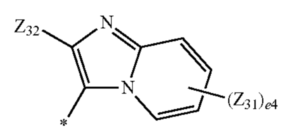
Formula 6-56
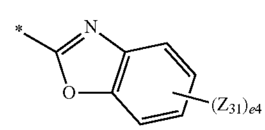
Formula 6-57
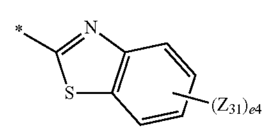

-continued
Formula 6-58
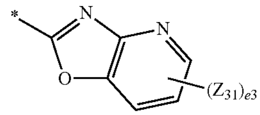
Formula 6-59
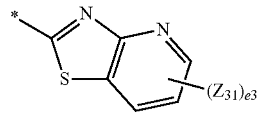
Formula 6-60
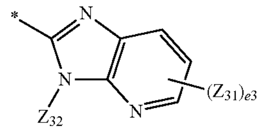
Formula 6-61
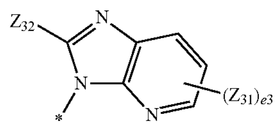
Formula 6-62
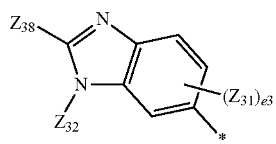
Formula 6-63
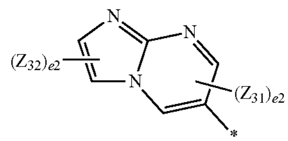
Formula 6-64
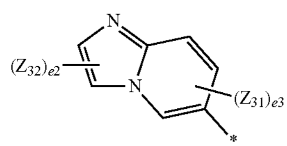
Formula 6-65
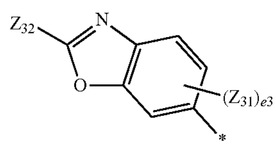
Formula 6-66
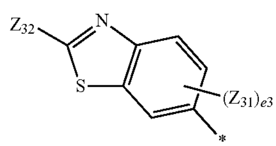
Formula 6-67
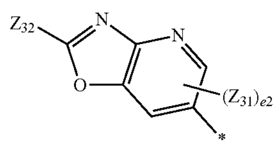
Formula 6-68
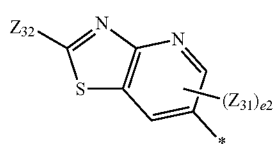
-continued
Formula 6-69
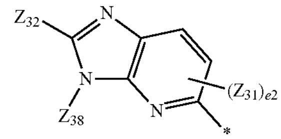
Formula 6-70
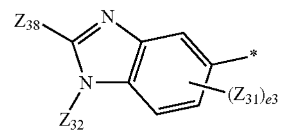
Formula 6-71
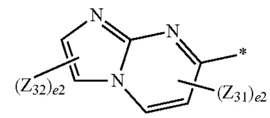
Formula 6-72
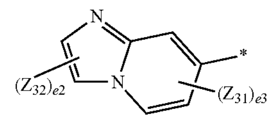
Formula 6-73
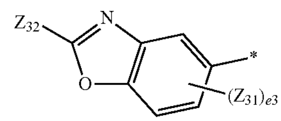
Formula 6-74
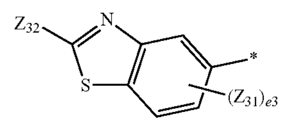
Formula 6-75
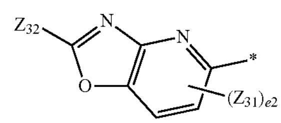
Formula 6-76
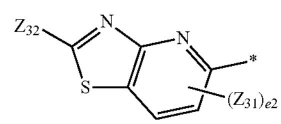
Formula 6-77
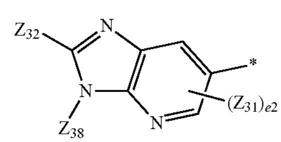
Formula 6-78
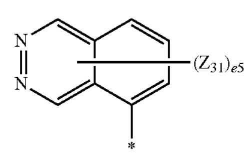
Formula 6-79
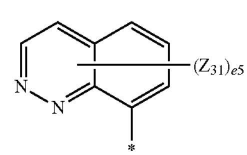

-continued
Formula 6-80
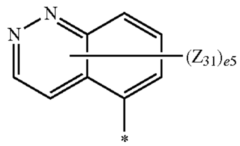
Formula 6-81
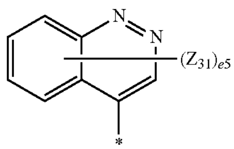
Formula 6-82
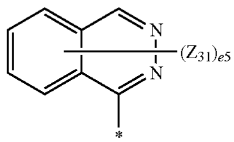
Formula 6-83
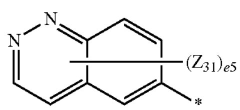
Formula 6-84
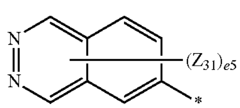
Formula 6-85
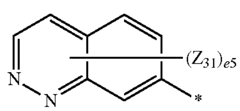
Formula 6-86
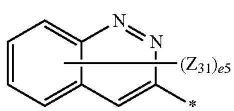
Formula 6-87
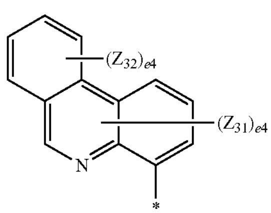
Formula 6-88
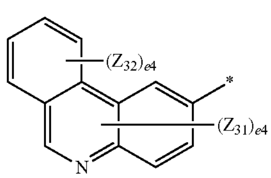
Formula 6-89
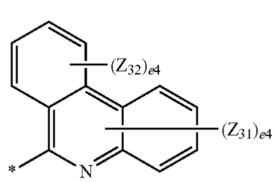
-continued
Formula 6-90
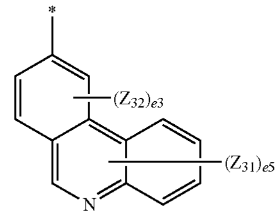
Formula 6-91
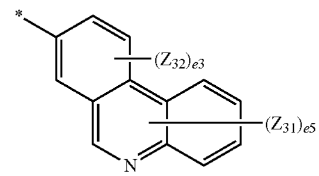
Formula 6-92
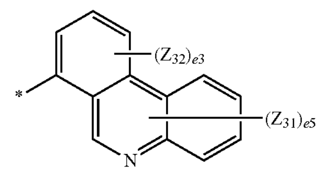
Formula 6-93
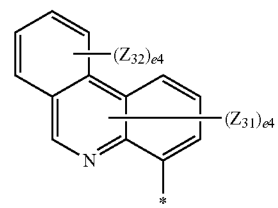
Formula 6-94
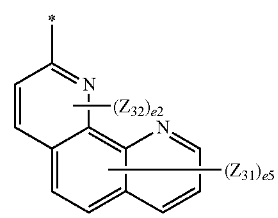
Formula 6-95
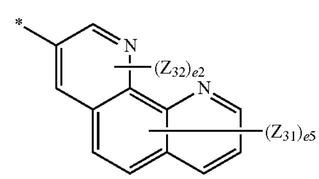
Formula 6-96
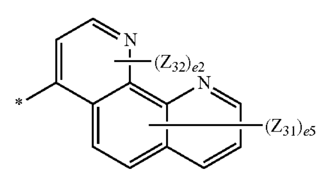
Formula 6-97
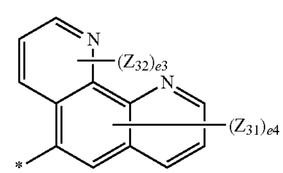

Formula 6-98
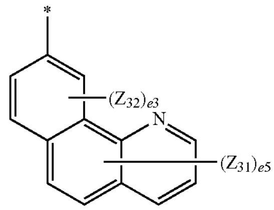
Formula 6-99
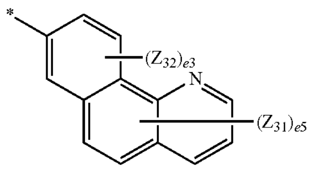
Formula 6-100
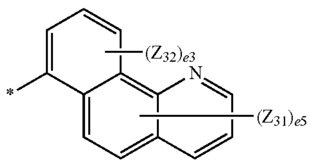
Formula 6-101
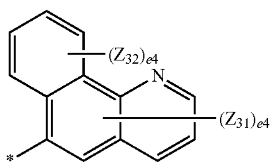
Formula 6-102
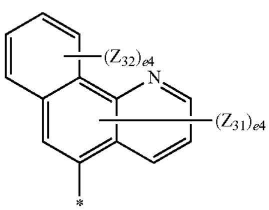
Formula 6-103
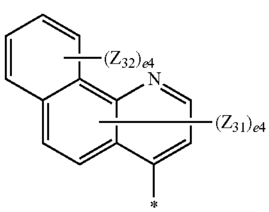
Formula 6-104
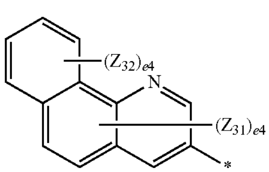
Formula 6-105
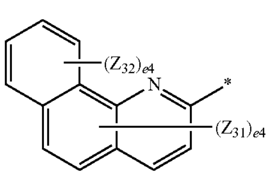
Formula 6-106
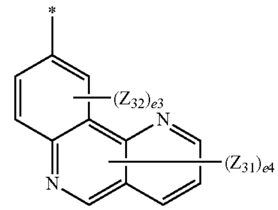
Formula 6-107
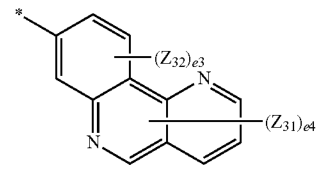
Formula 6-108
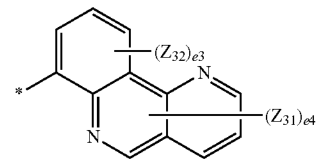
Formula 6-109
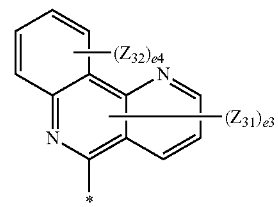
Formula 6-110
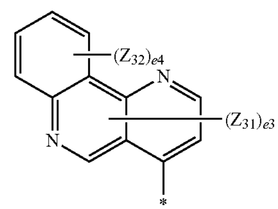
Formula 6-111
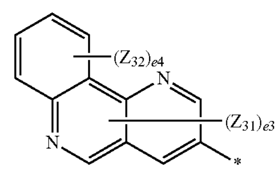
Formula 6-112
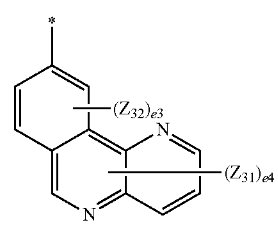
Formula 6-113
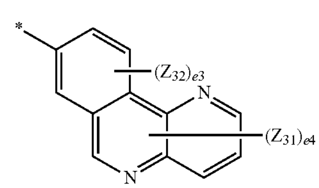

-continued

Formula 6-114

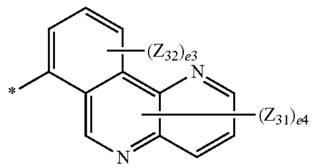

Formula 6-115

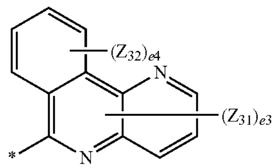

Formula 6-116

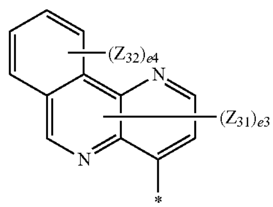

Formula 6-117

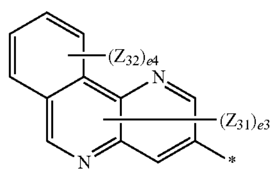

Formula 6-118

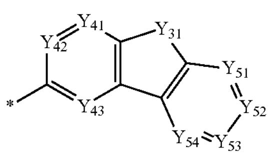

Formula 6-119

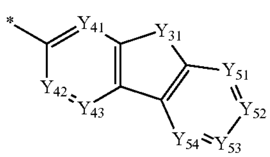

Formula 6-120

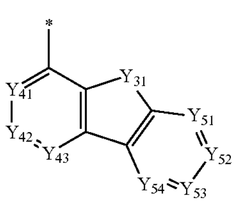

Formula 6-121

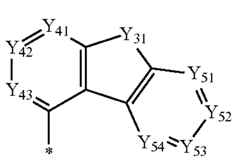

Formula 6-122

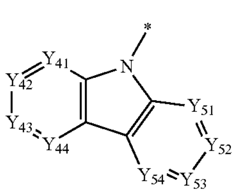

-continued

Formula 6-123

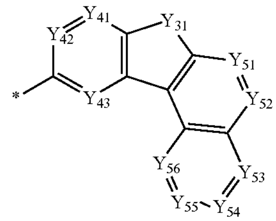

Formula 6-124

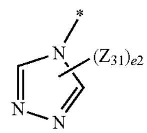

Formula 6-125

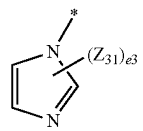

In Formulae 6-1 to 6-125, $Y_{31}$ may be selected from O, S, $C(Z_{33})(Z_{34})$, $N(Z_{35})$, and $Si(Z_{36})(Z_{37})$, $Y_{41}$ may be N or $C(Z_{41})$, $Y_{42}$ may be N or $C(Z_{42})$, $Y_{43}$ may be N or $C(Z_{43})$, $Y_{44}$ may be N or $C(Z_{44})$, $Y_{51}$ may be N or $C(Z_{51})$, $Y_{52}$ may be N or $C(Z_{52})$, $Y_{53}$ may be N or $C(Z_{53})$, $Y_{54}$ may be N or $C(Z_{54})$, $Y_{55}$ may be N or $C(Z_{55})$, $Y_{56}$ may be N or $C(Z_{56})$, at least one selected from $Y_{41}$ to $Y_{43}$ and $Y_{51}$ to $Y_{54}$ in Formulae 6-118 to 6-121 may be N, at least one selected from $Y_{41}$ to $Y_{44}$ and $Y_{51}$ to $Y_{54}$ in Formula 6-122 may be N, and at least one selected from $Y_{41}$ to $Y_{43}$ and $Y_{51}$ to $Y_{56}$ in Formula 6-123 may be N, $Z_{31}$ to $Z_{37}$, $Z_{41}$ to $Z_{44}$, and $Z_{51}$ to $Z_{56}$ may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, and —Si($Q_{31}$)($Q_{32}$)($Q_{33}$); and a phenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{20}$ alkyl group, a $C_1$-$C_{20}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, a quinazolinyl group, a carbazolyl group, a fluorenyl group, —Si($Q_{21}$)($Q_{22}$)($Q_{23}$), and —N($Q_{21}$)($Q_{22}$), wherein $Q_{21}$ to $Q_{23}$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, e2 may be an integer of 0 to 2, e3 may be an integer of 0 to 3, e4 may be an integer of 0 to 4, e5 may be an integer of 0 to 5, and e6 may be an integer of 0 to 6, and

* indicates a binding site to a neighboring atom.

In an implementation, in Formulae 1-1 and 1-2, $ET_1$ and $ET_2$ may each independently be a group represented by one of Formulae 10-1 to 10-121.

Formula 10-1

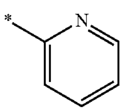

Formula 10-2

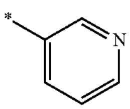

Formula 10-3

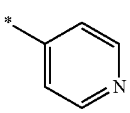

Formula 10-4

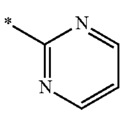

Formula 10-5

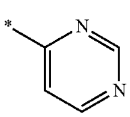

Formula 10-6

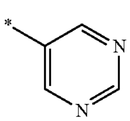

Formula 10-7

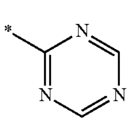

Formula 10-8

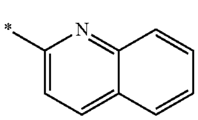

-continued

Formula 10-9

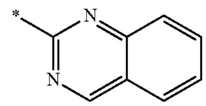

Formula 10-10

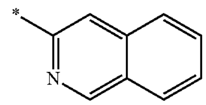

Formula 10-11

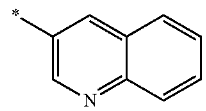

Formula 10-12

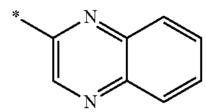

Formula 10-13

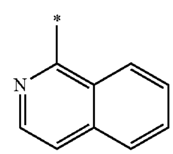

Formula 10-14

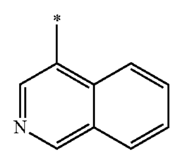

Formula 10-15

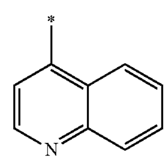

Formula 10-16

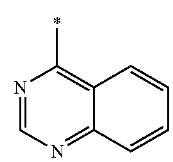

Formula 10-17

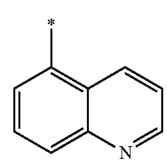

Formula 10-18

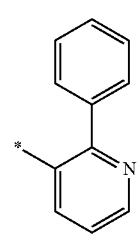

-continued
Formula 10-19
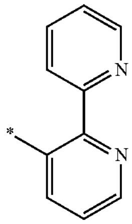
Formula 10-20
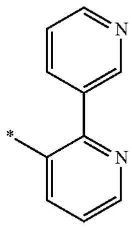
Formula 10-21
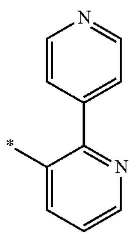
Formula 10-22
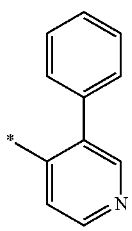
Formula 10-23
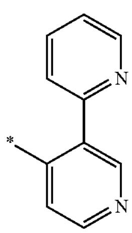
Formula 10-24
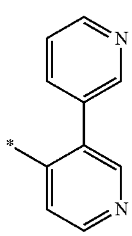
Formula 10-25
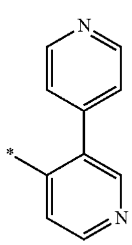
-continued
Formula 10-26
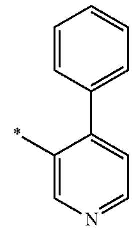
Formula 10-27
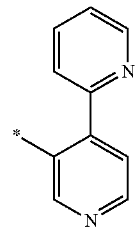
Formula 10-28
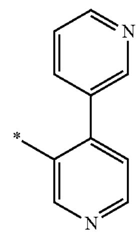
Formula 10-29
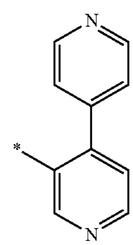
Formula 10-30
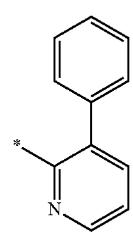
Formula 10-31
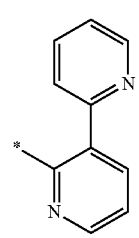

-continued
Formula 10-32
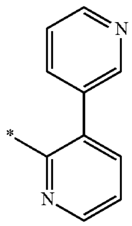
Formula 10-33
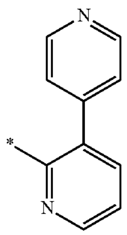
Formula 10-34
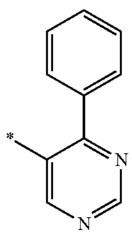
Formula 10-35
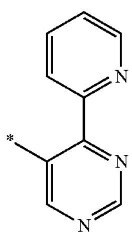
Formula 10-36
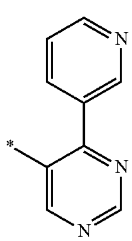
Formula 10-37
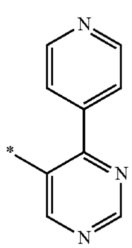
-continued
Formula 10-38
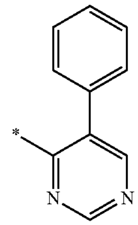
Formula 10-39
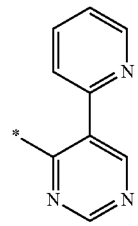
Formula 10-40
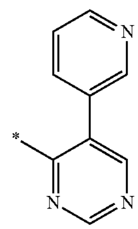
Formula 10-41
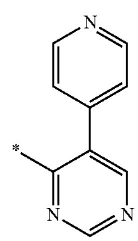
Formula 10-42
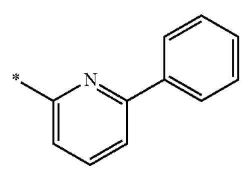
Formula 10-43
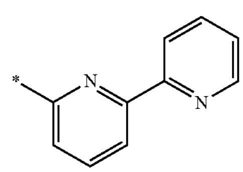
Formula 10-44
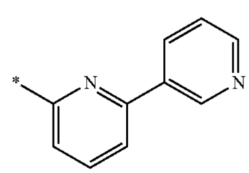
Formula 10-45
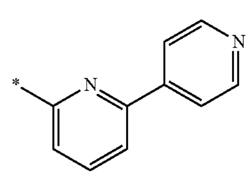

-continued
Formula 10-46
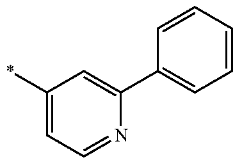
Formula 10-47
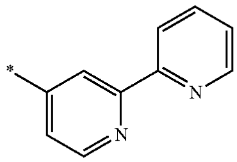
Formula 10-48
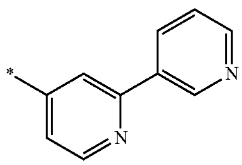
Formula 10-49
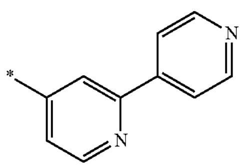
Formula 10-50
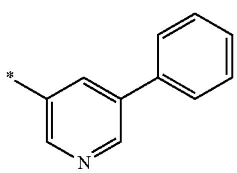
Formula 10-51
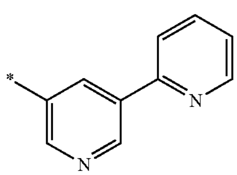
Formula 10-52
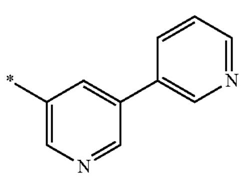
Formula 10-53
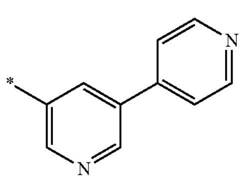
Formula 10-54
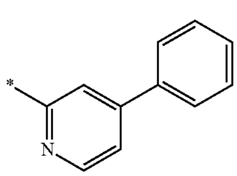
-continued
Formula 10-55
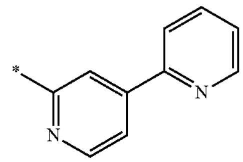
Formula 10-56
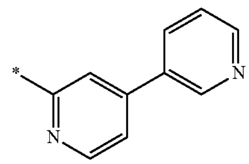
Formula 10-57
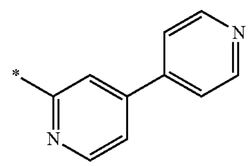
Formula 10-58
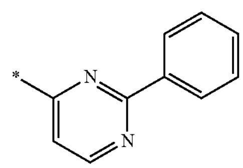
Formula 10-59
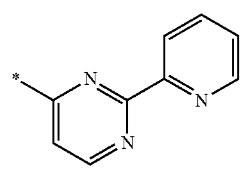
Formula 10-60
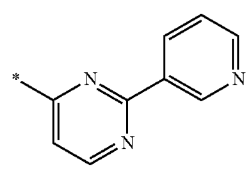
Formula 10-61
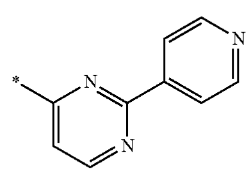
Formula 10-62
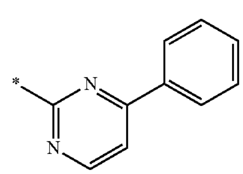
Formula 10-63
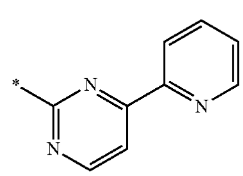

-continued
Formula 10-64
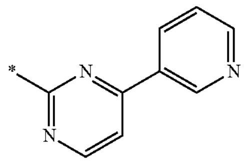
Formula 10-65
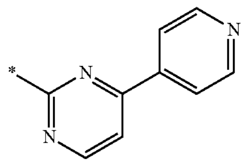
Formula 10-66
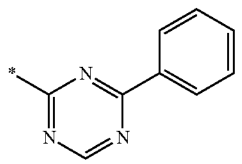
Formula 10-67
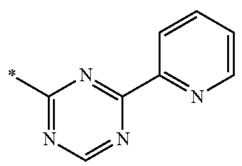
Formula 10-68
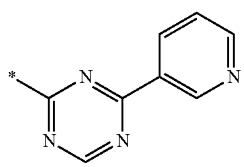
Formula 10-69
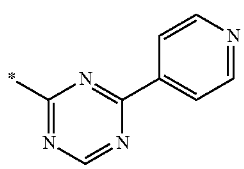
Formula 10-70
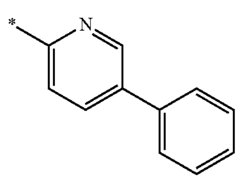
Formula 10-71
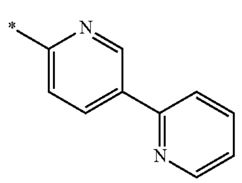
Formula 10-72
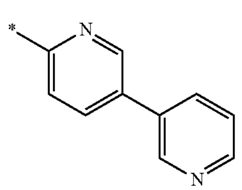
-continued
Formula 10-73
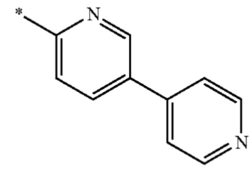
Formula 10-74
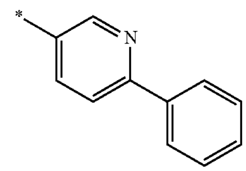
Formula 10-75
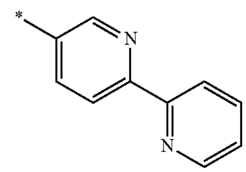
Formula 10-76
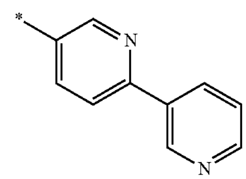
Formula 10-77
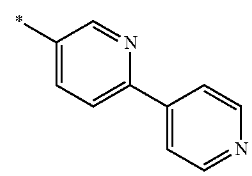
Formula 10-78
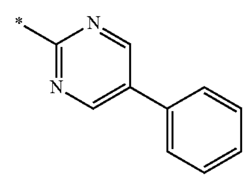
Formula 10-79
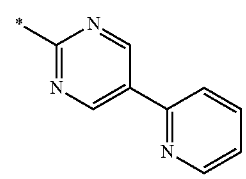
Formula 10-80
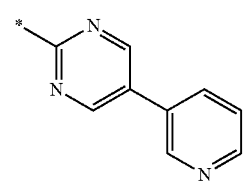
Formula 10-81
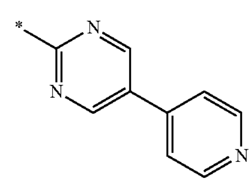

-continued
Formula 10-82
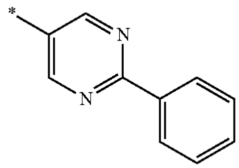
Formula 10-83
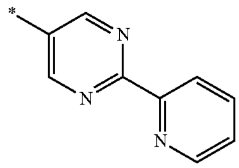
Formula 10-84
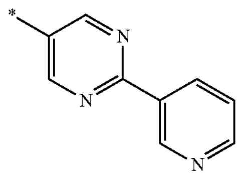
Formula 10-85
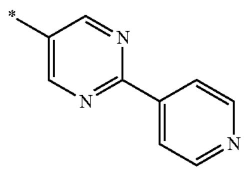
Formula 10-86
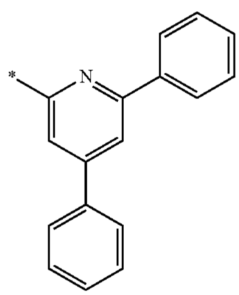
Formula 10-87
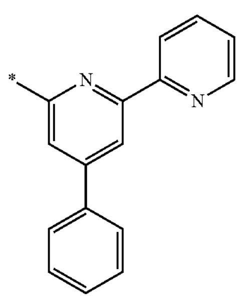
Formula 10-88
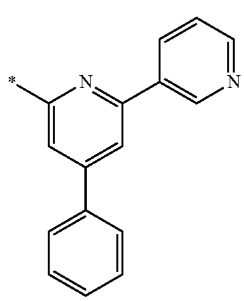
-continued
Formula 10-89
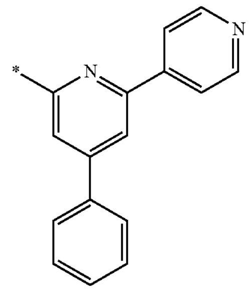
Formula 10-90
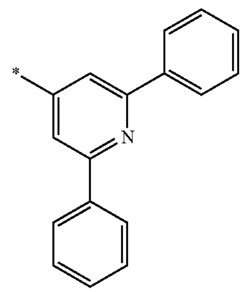
Formula 10-91
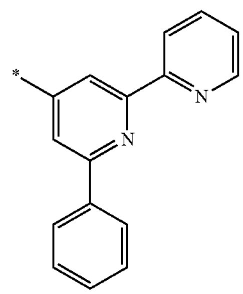
Formula 10-92
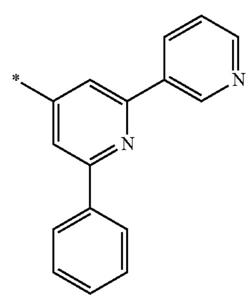
Formula 10-93
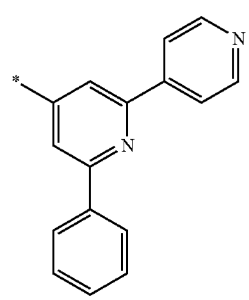

Formula 10-94
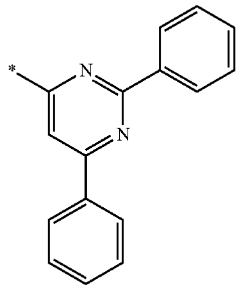
Formula 10-95
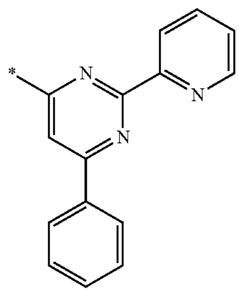
Formula 10-96
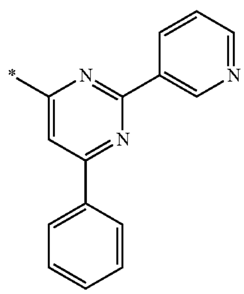
Formula 10-97
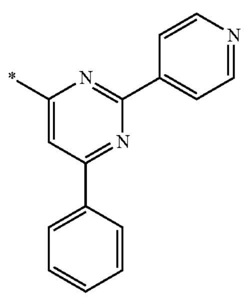
Formula 10-98
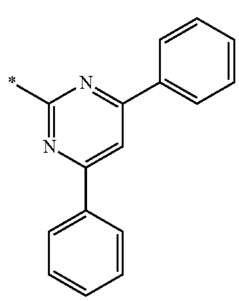
Formula 10-99
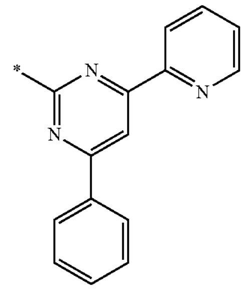
Formula 10-100
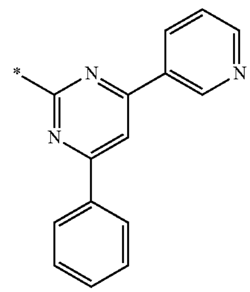
Formula 10-101
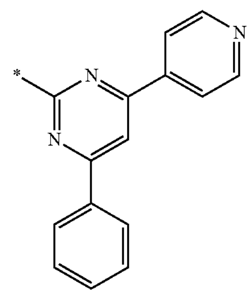
Formula 10-102
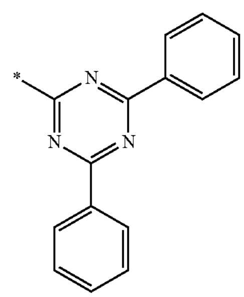
Formula 10-103
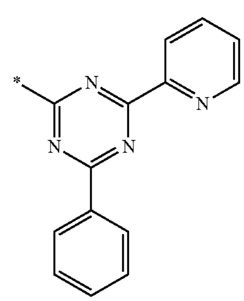

-continued
Formula 10-104
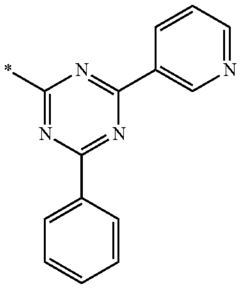
Formula 10-105
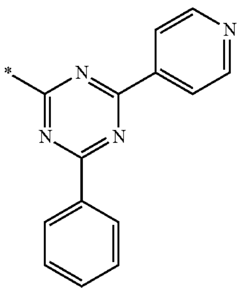
Formula 10-106
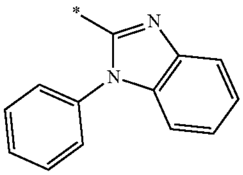
Formula 10-107
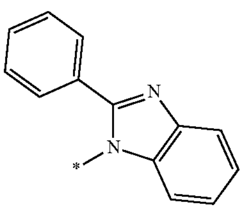
Formula 10-108
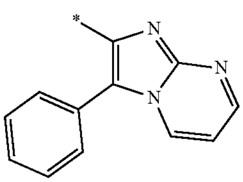
Formula 10-109
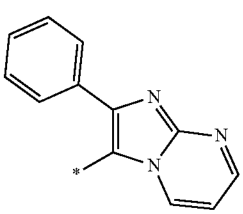
Formula 10-110
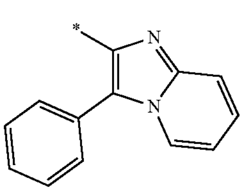
-continued
Formula 10-111
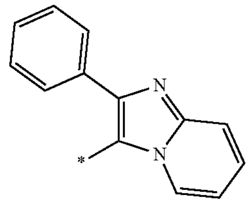
Formula 10-112
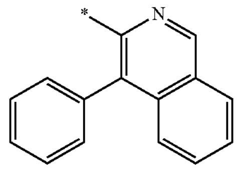
Formula 10-113
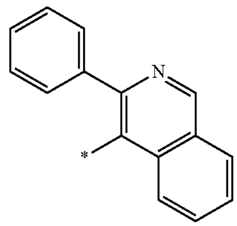
Formula 10-114
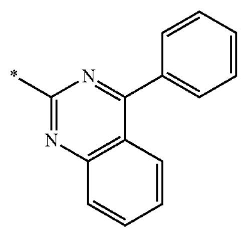
Formula 10-115
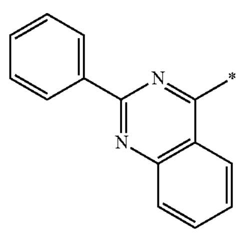
Formula 10-116
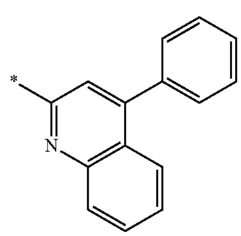
Formula 10-117
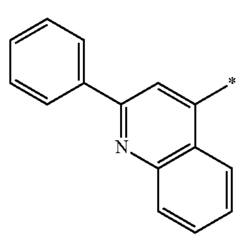

-continued

Formula 10-118

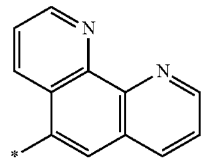

Formula 10-119

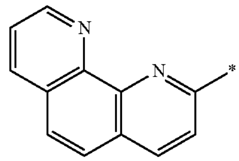

Formula 10-120

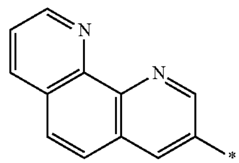

Formula 10-121

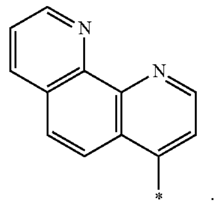

* in Formulae 10-1 to 10-121 indicates a binding site to a neighboring atom.

$L_{11}$, $L_{12}$, and $L_1$ to $L_3$ in Formulae 1-1, 1-2, and 2-1 to 2-4 may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in Formulae 1-1, 1-2, and 2-1 to 2-4, $L_{11}$, $L_{12}$, $L_1$, and $L_2$ may each independently be selected from:

a phenylene group, a pentalenylene group, an indenylene group, a naphthylene group, an azulenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{31})(Q_{32})(Q_{33})$, —$N(Q_{31})(Q_{32})$, and —$B(Q_{31})(Q_{32})$.

$Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group.

In an implementation, in Formulae 1-1, 1-2, and 2-1 to 2-4, $L_{11}$, $L_{12}$, $L_1$, and $L_2$ may each independently be a group represented by one of Formulae 3-1 to 3-43.

3-1
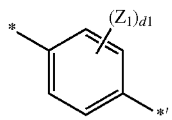
3-2
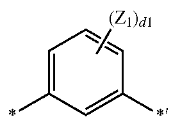
3-3
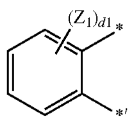
3-4
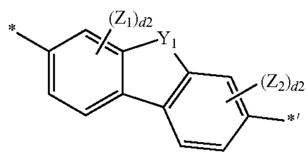
3-5
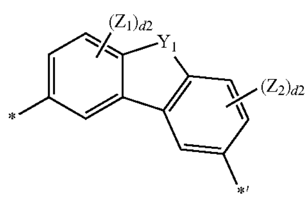
3-6
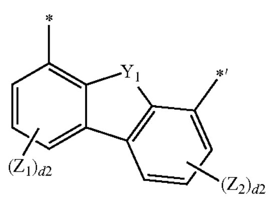
3-7
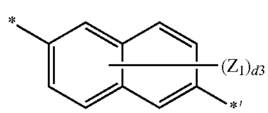
3-8
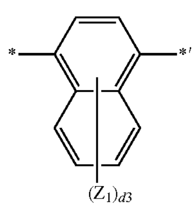
3-9
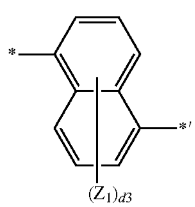
3-10
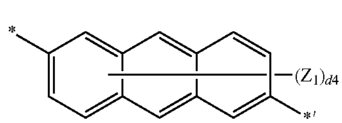
-continued
3-11
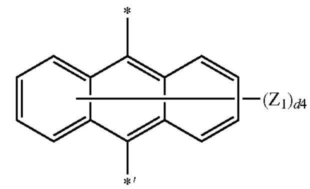
3-12
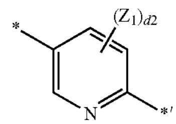
3-13
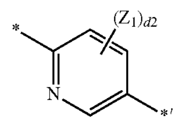
3-14
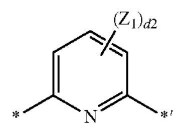
3-15
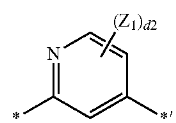
3-16
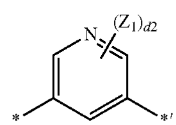
3-17
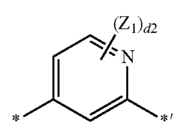
3-18
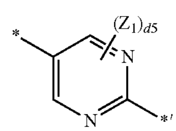
3-19
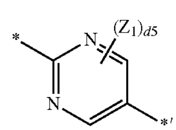
3-20
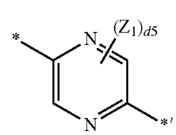
3-21
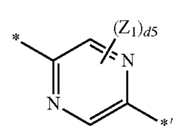
3-22
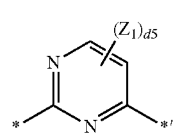

-continued
3-23
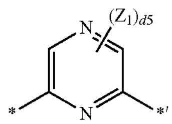
3-34
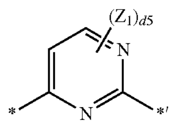
3-35
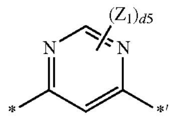
3-26
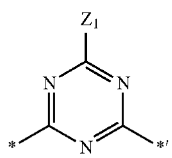
3-27
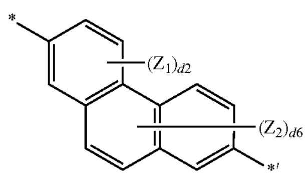
3-28
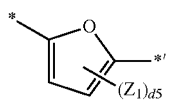
3-29
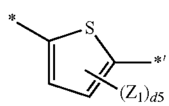
3-30
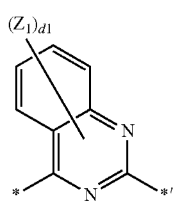
3-31
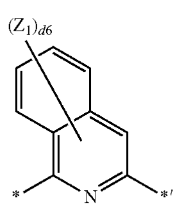
3-32
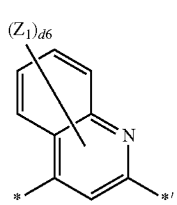
-continued
3-33
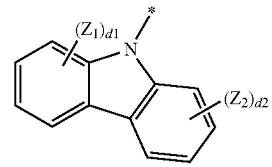
3-34
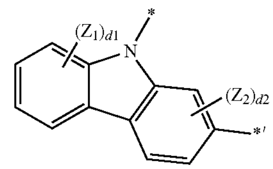
3-35
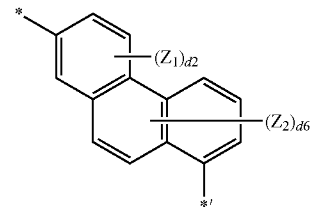
3-36
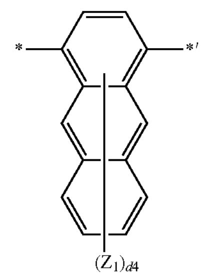
3-37
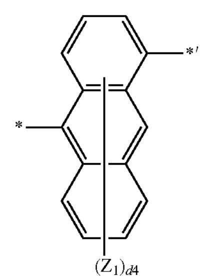
3-38
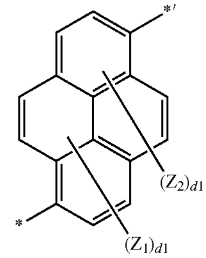

-continued

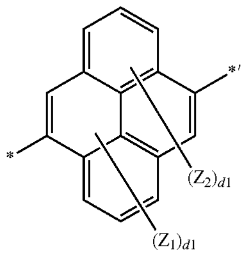

3-39

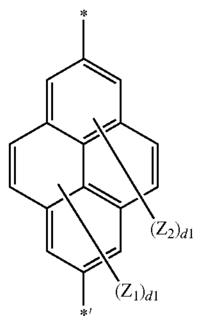

3-40

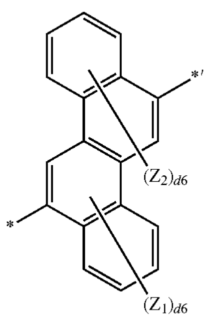

3-41

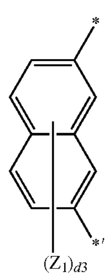

3-42

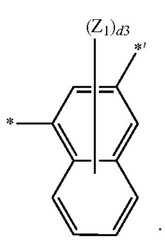

3-43

In Formulae 3-1 to 3-43, $Y_1$ may be selected from O, S, $C(Z_3)(Z_4)$, $N(Z_5)$, and $Si(Z_6)(Z_7)$, $Z_1$ to $Z_7$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, $—Si(Q_{31})(Q_{32})(Q_{33})$, $—N(Q_{31})(Q_{32})$, and $—B(Q_{31})(Q_{32})$, $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, d1 may be an integer of 1 to 4, d2 may be an integer of 1 to 3, d3 may be an integer of 1 to 6, d4 may be an integer of 1 to 8, d5 may be 1 or 2, and d6 may be an integer of 1 to 5, and

* and *' each indicate a binding site to a neighboring atom.

In Formulae 1-1, 1-2, and 2-1 to 2-4, a11 and a12 may each independently be an integer of 0 to 5, and a1 to a3 may each independently be an integer of 0 to 3.

a11 indicates the number of $L_{11}$(s), wherein when a11 is zero, $*-(L_{11})_{a11}-*'$ may be a single bond, and when a11 is two or more, two or more $L_{11}$ (s) may be identical to or different from each other. a12 and a1 to a3 may be understood by referring to the description presented in connection with a11 and the structures of Formulae 1-2 and 2-1 to 2-4.

In an implementation, a11 and a12 may each independently be an integer of 0 to 3, and a1 to a3 may each independently be 0 or 1.

$R_1$ to $R_3$ in Formulae 2-1 to 2-4 may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$). $Q_1$ to $Q_3$ may be the same as described above.

For example, $R_1$ to $R_3$ in Formulae 2-1 to 2-4 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenoxy group, —Si($Q_1$)($Q_2$)($Q_3$), —N($Q_1$) ($Q_2$), and —B($Q_1$)($Q_2$);

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, a pyridoindolyl group, an isoindolyl group, an indazolyl group, a purinyl group, a quinolinyl group, an isoquinolinyl group, an indoloisoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, and an imidazopyrimidinyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, a pyridoindolyl group, an isoindolyl group, an indazolyl group, a purinyl group, a quinolinyl group, an isoquinolinyl group, an indoloisoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, a pyridinyl group, an indolyl group, an isoindolyl group, a purinyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, —Si($Q_{31}$)($Q_{32}$)($Q_{33}$), —N($Q_{31}$)($Q_{32}$), and —B($Q_{31}$)($Q_{32}$), and $Q_1$ to $Q_3$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In an implementation, in Formulae 2-1 and 2-4, $R_1$ to $R_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenoxy group, —Si($Q_1$)($Q_2$)($Q_3$), —N($Q_1$)($Q_2$), a group represented by one of Formulae 5-1 to 5-18, and a group represented by one of Formulae 6-1 to 6-125.

Formula 5-1

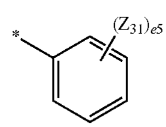

Formula 5-2

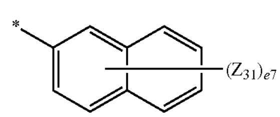

Formula 5-3

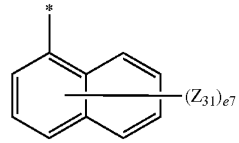

Formula 5-4

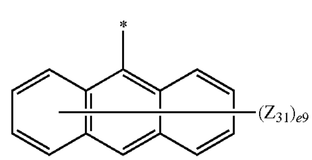

-continued

Formula 5-5

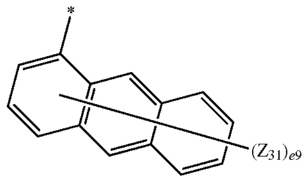

Formula 5-6

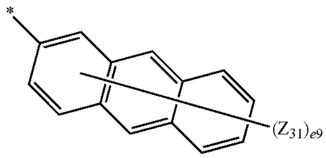

Formula 5-7

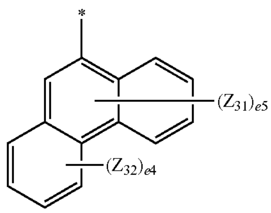

Formula 5-8

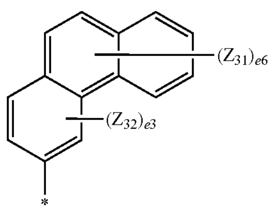

Formula 5-9

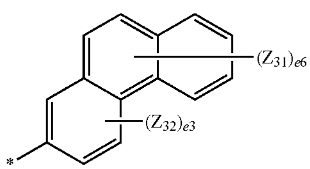

Formula 5-10

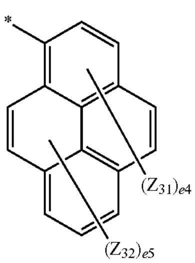

Formula 5-11

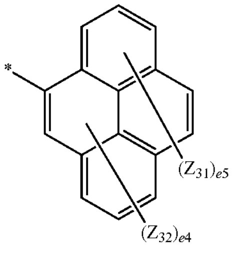

-continued

Formula 5-12

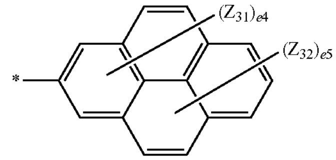

Formula 5-13

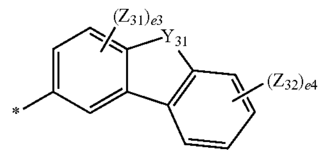

Formula 5-14

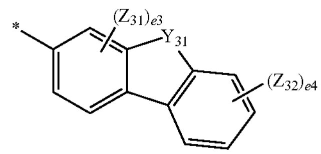

Formula 5-15

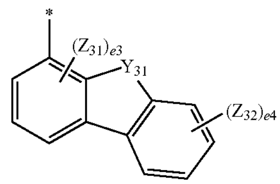

Formula 5-16

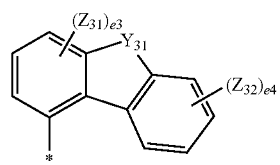

Formula 5-17

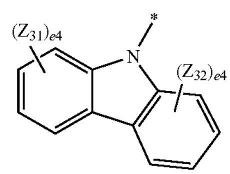

Formula 5-18

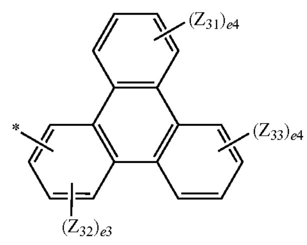

In Formulae 5-1 to 5-18 and 6-1 to 6-125, $Y_{31}$ may be selected from O, S, $C(Z_{33})(Z_{34})$, $N(Z_{35})$, $B(Z_{35})$, $P(Z_{35})$, $P(=O)(Z_{35})$, and $Si(Z_{36})(Z_{37})$, $Y_{41}$ may be N or $C(Z_{41})$, $Y_{42}$ may be N or $C(Z_{42})$, $Y_{43}$ may be N or $C(Z_{43})$, $Y_{44}$ may be N or $C(Z_{44})$, $Y_{51}$ may be N or $C(Z_{51})$, $Y_5$ may be N or $C(Z_{52})$, $Y_{53}$ may be N or $C(Z_{53})$, $Y_{54}$ may be N or $C(Z_{54})$, $Y_{55}$ may be N or $C(Z_{55})$, $Y_{56}$ may be N or $C(Z_{56})$, at least one selected from $Y_{41}$ to $Y_{43}$ and $Y_{51}$ to $Y_{54}$ in Formulae 6-118 to 6-121 may be N, at least one selected from $Y_{41}$ to $Y_{44}$ and $Y_{51}$ to $Y_{54}$ in Formula 6-122 may be N, and at least one selected from $Y_{41}$ to $Y_{43}$ and $Y_{51}$ to $Y_{56}$ in Formula 6-123 may be N, $Z_{31}$ to $Z_{37}$, $Z_{41}$ to $Z_{44}$, and $Z_{51}$ to $Z_{56}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, and —Si($Q_{31}$)($Q_{32}$)($Q_{33}$), $Z_{36}$ and $Z_{37}$ may optionally be linked to form a saturated or unsaturated ring, $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, e2 may be an integer of 0 to 2, e3 may be an integer of 0 to 3, e4 may be an integer of 0 to 4, e5 may be an integer of 0 to 5, e6 may be an integer of 0 to 6, e7 may be an integer of 0 to 7, and e9 may be an integer of 0 to 9, and

* indicates a binding site to a neighboring atom.

In an implementation, at least one of $R_1$ and $R_2$ in Formula 2-1 may be a group represented by one of Formulae 5-13 to 5-17.

In an implementation, one of $R_1$ and $R_2$ in Formula 2-1 may be a group represented by one of Formulae 5-13 to 5-17.

b1 to b3 in Formulae 2-1 to 2-4 may each independently be an integer of 1 to 3.

b1 indicates the number of $R_1$(s), wherein when b1 is two or more, two or more $R_1$(s) may be identical to or different from each other. b2 and b3 may be understood by referring to the description presented in connection with b1 and the structures of Formulae 2-1 to 2-4.

In an implementation, b1 to b3 in Formulae 2-1 to 2-4 may each independently be 1 or 2.

c1 to c3 in Formulae 2-1 to 2-4 may each independently be an integer of 0 to 5.

c1 indicates the number of *-[$(L_1)_{a1}$-$(R_1)_{b1}$](s), wherein when c2 is two or more, two or more *-[$(L_1)_{a1}$-$(R_1)_{b1}$](S) may be identical to or different from each other. c2 and c3 may be understood by referring to the description presented in connection with c1 and the structures of Formulae 2-1 to 2-4.

In an implementation, c1 to c3 in Formulae 2-1 to 2-4 may each independently be an integer of 0 to 3.

In an implementation, the first compound and the third compound may each independently be selected from Compounds 100 to 237, Compounds 101A to 207A, Compounds 301B to 314B, Compounds A-1 to A-19, Compounds B-1 to B-19, Compounds C-1 to C-19, Compounds D-1 to D-19, Compounds E-1 to E-19, Compounds F-1 to F-19, Compounds G-1 to G-19, Compounds H-1 to H-19, Compounds I-1 to I-19, Compounds J-1 to J-10, Compounds K-1 to K-10, Compounds L-1 to L-16, Compounds M-1 to M-8, Compound N-1, Compound N-2, and Compounds LE-01 to LE-32.

100

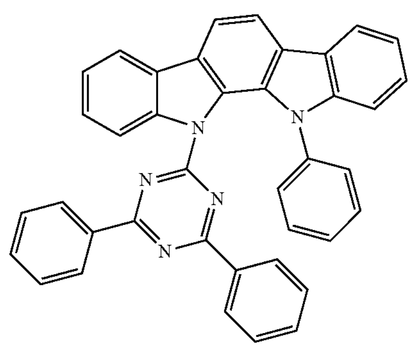

101

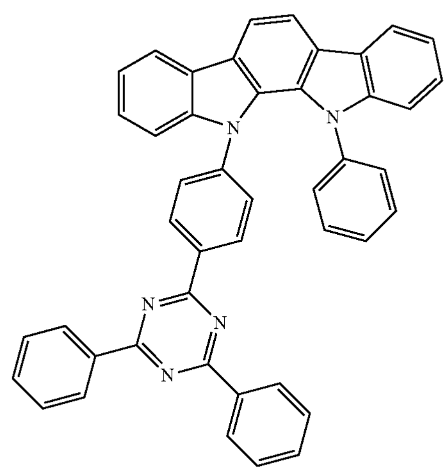

-continued
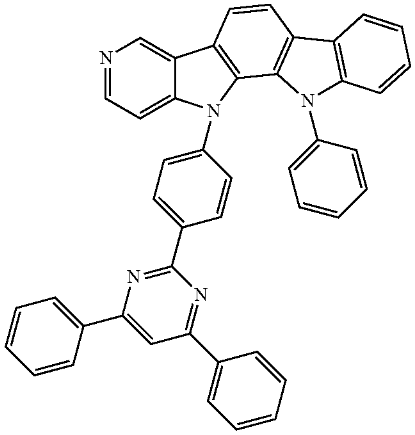
102
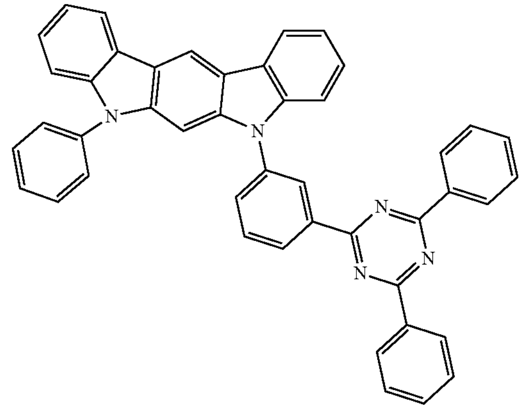
103
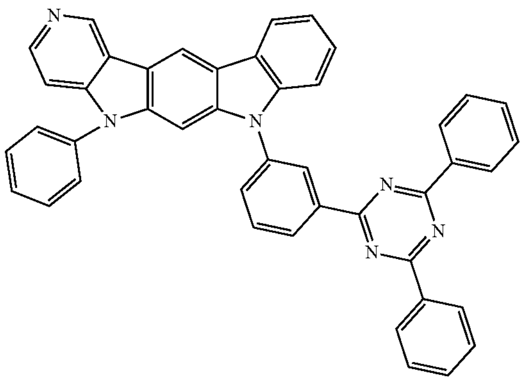
104
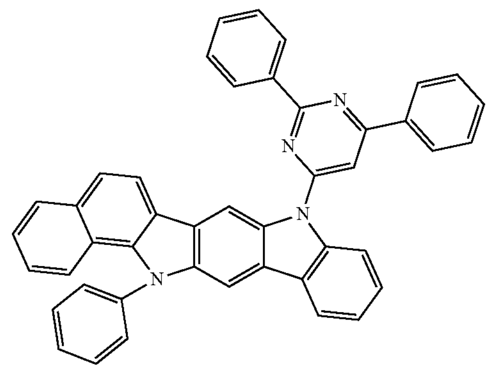
105
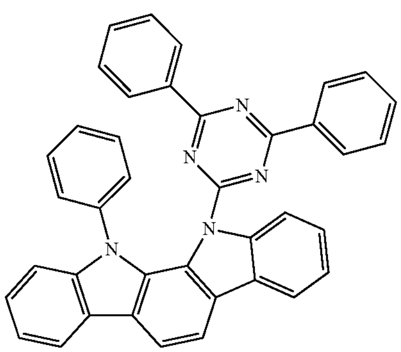
107
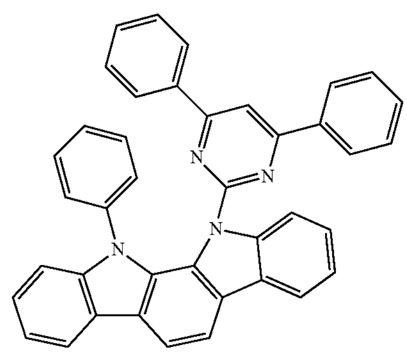
108
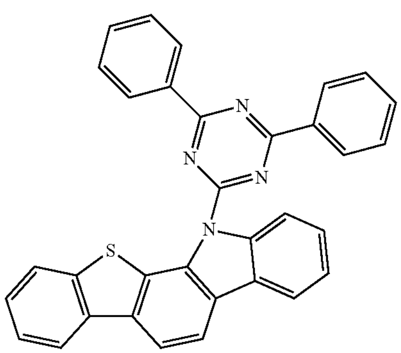
109
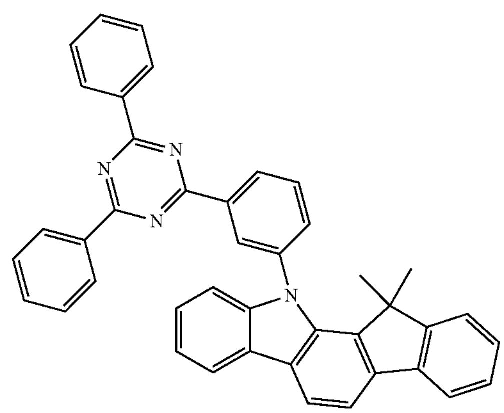
110

-continued
111
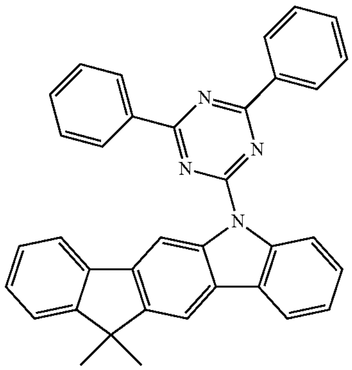
112
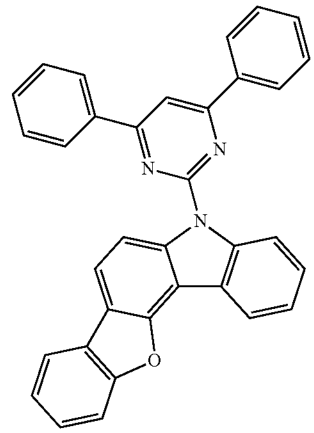
113
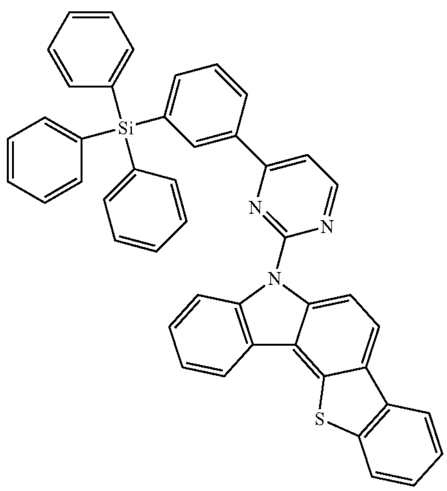
114
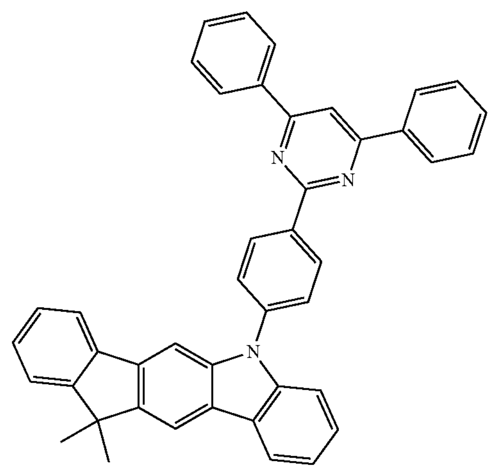
115
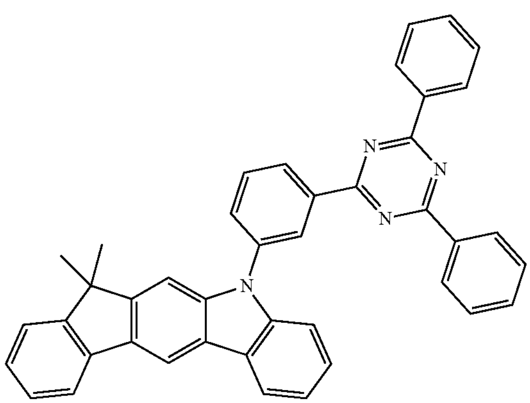
116
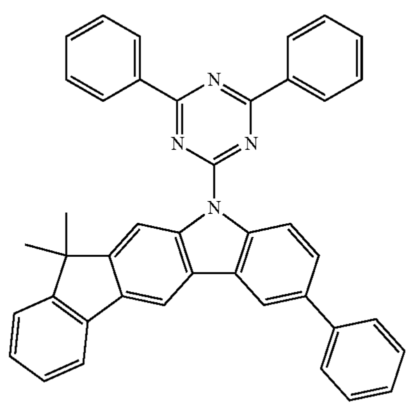

-continued
117
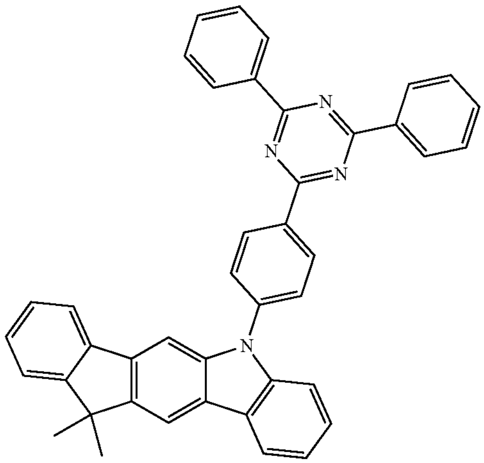
118
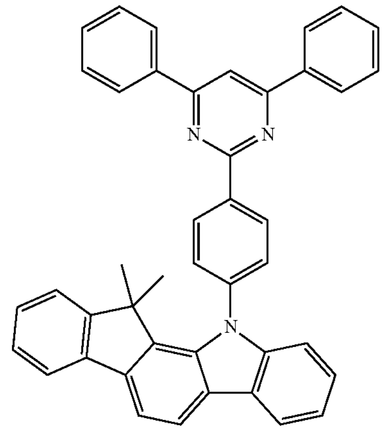
119
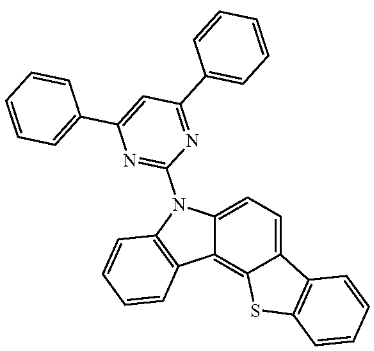
120
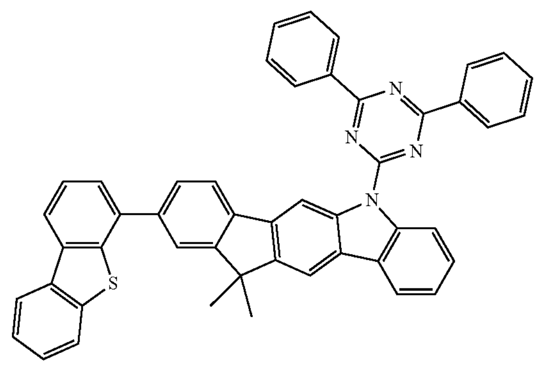
121
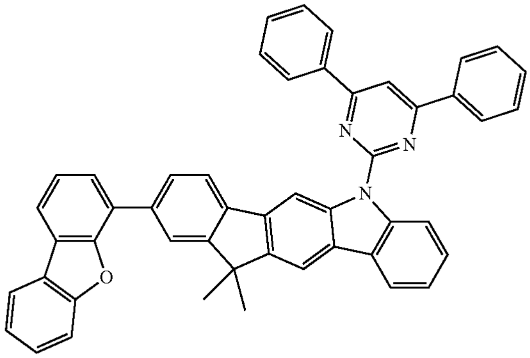
122
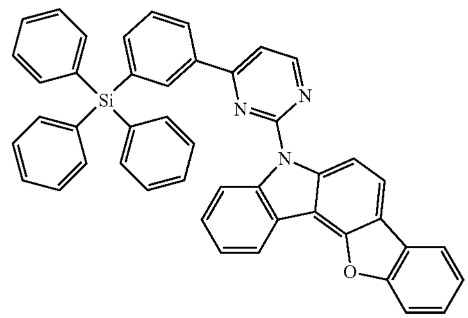

-continued
125
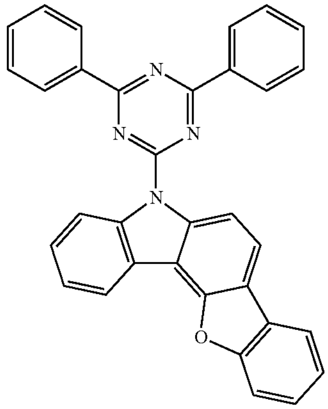
126
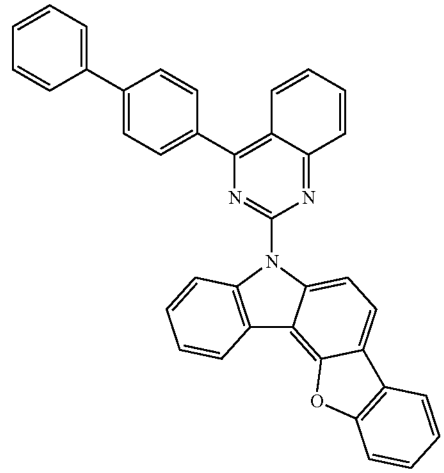
127
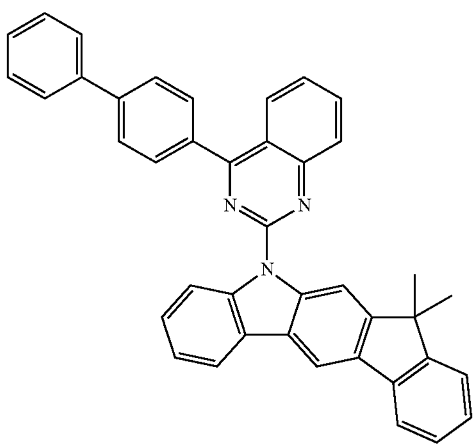
128
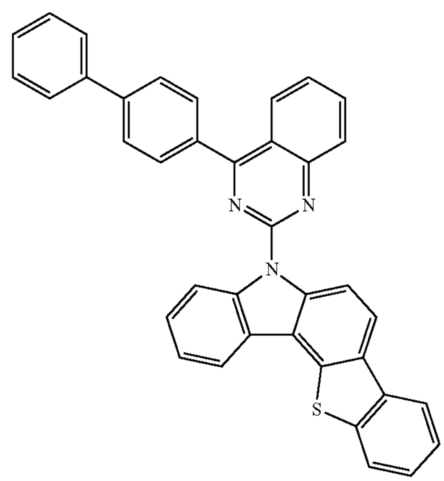
129
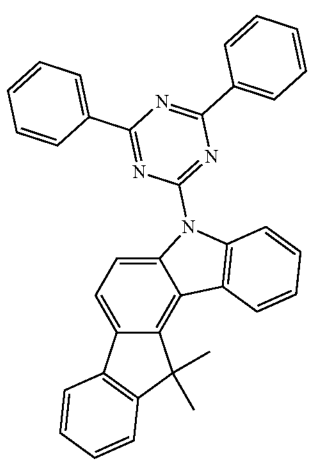
130
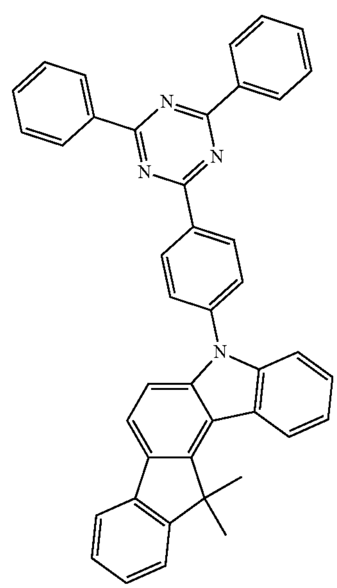

-continued
131
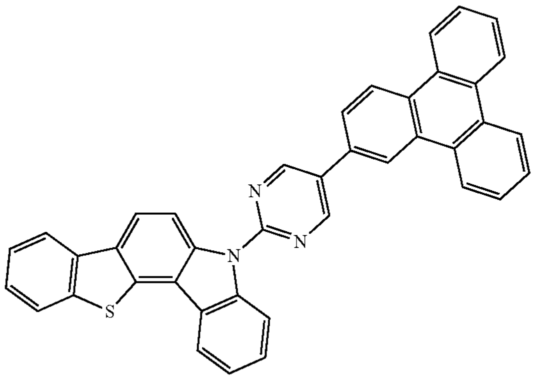
132
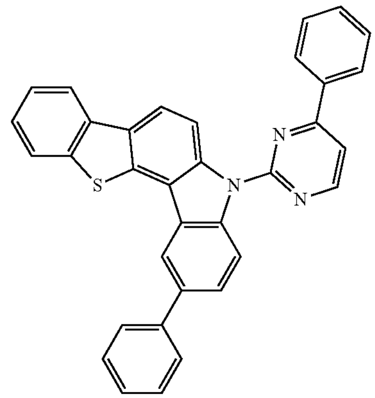
133
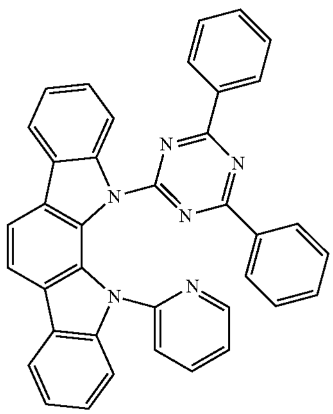
134
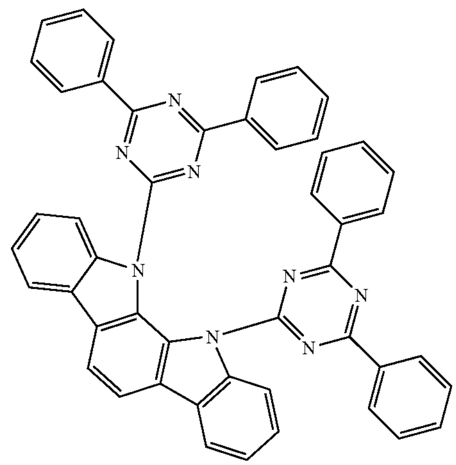
135
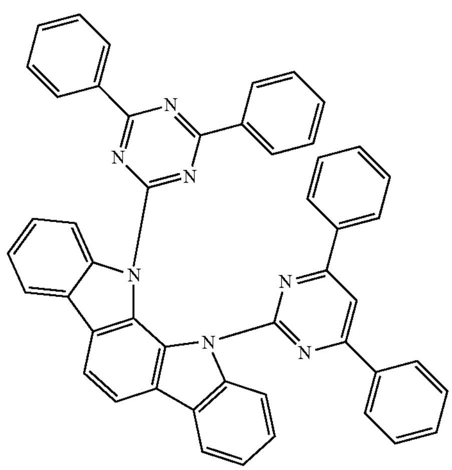
136
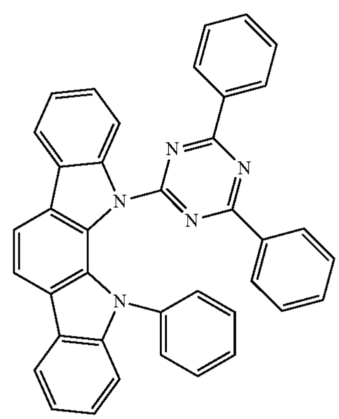

-continued
137
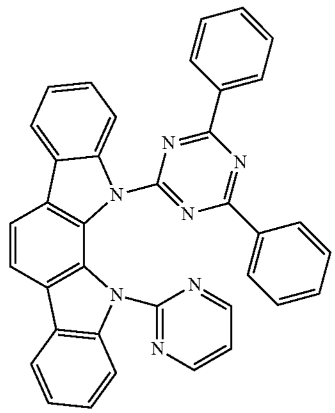
138
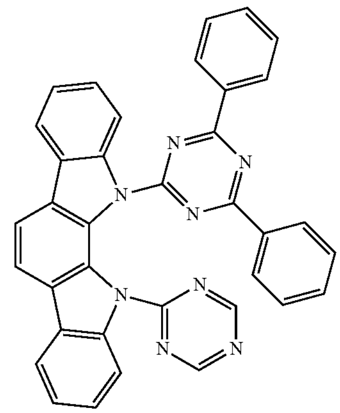
139
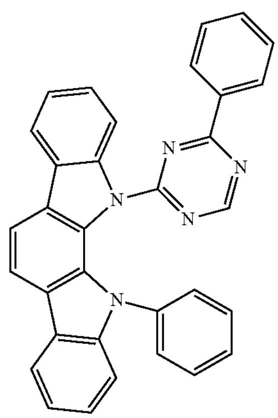
140
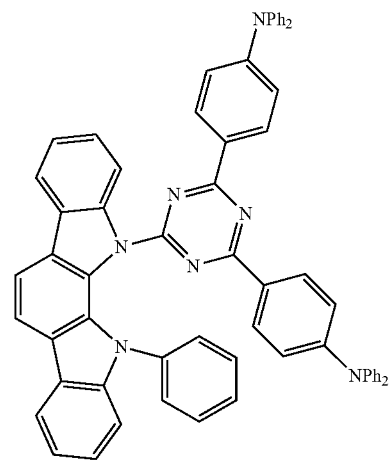
141
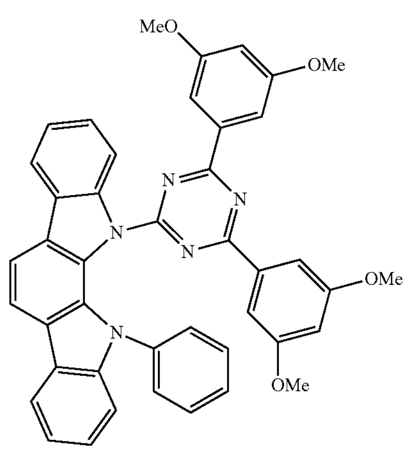
142
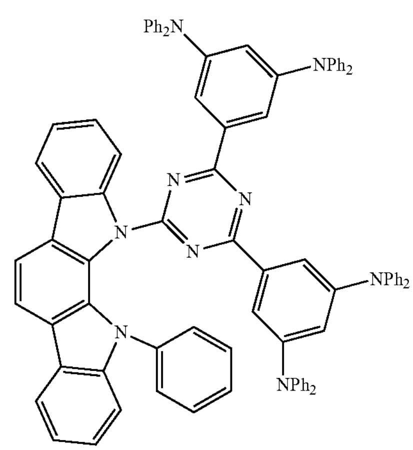

-continued
143
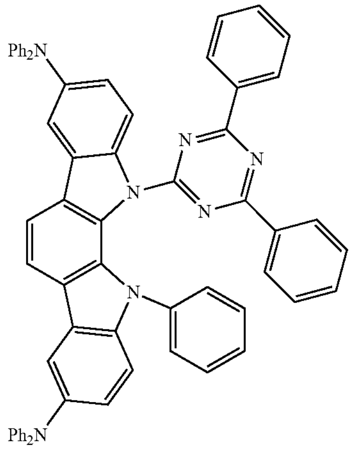
144
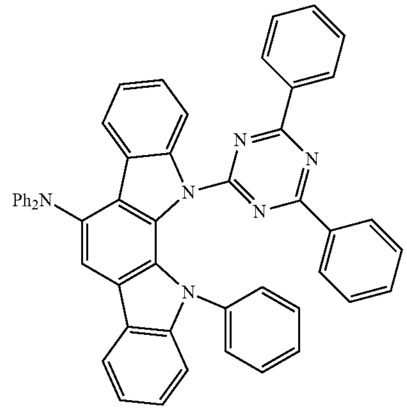
145
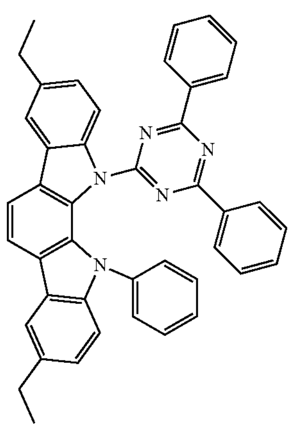
146
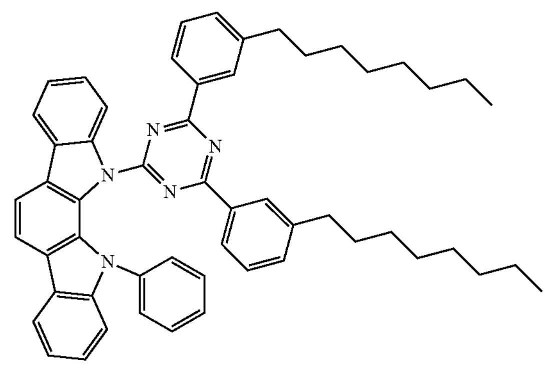
147
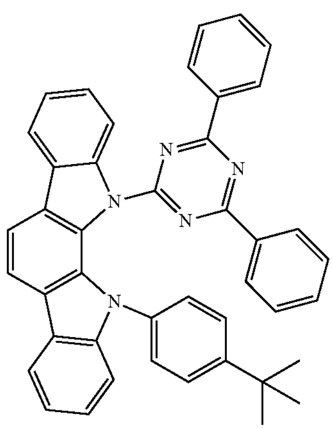
148
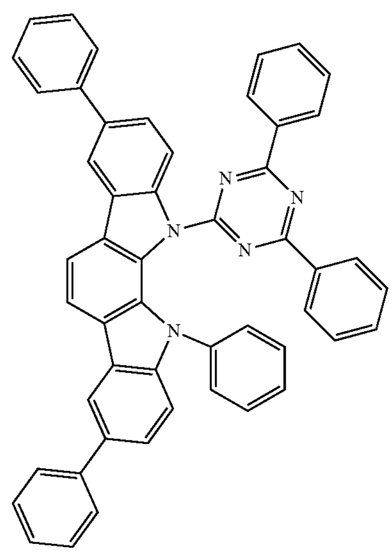

-continued
149
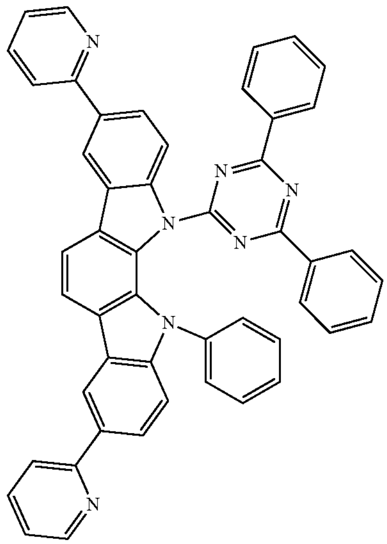
150
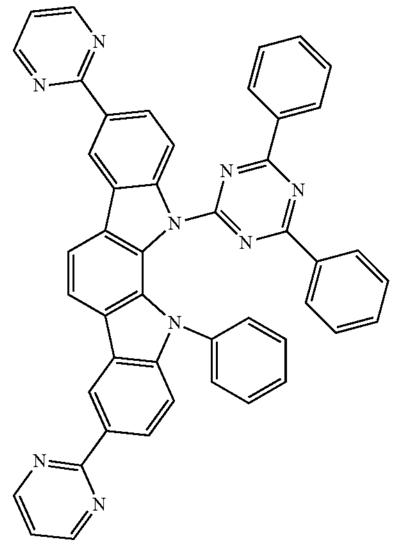
151
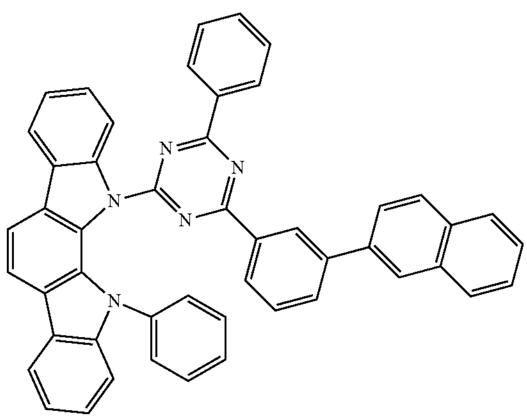
152
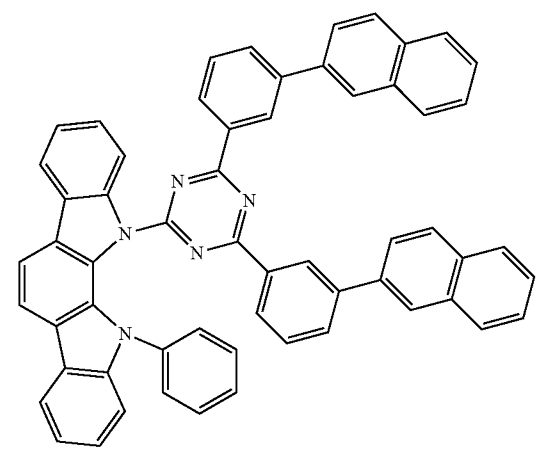
153
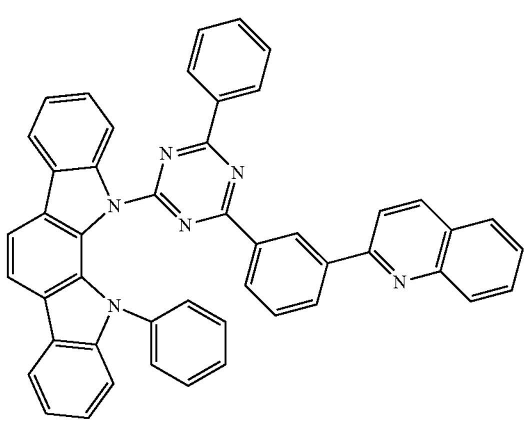
154
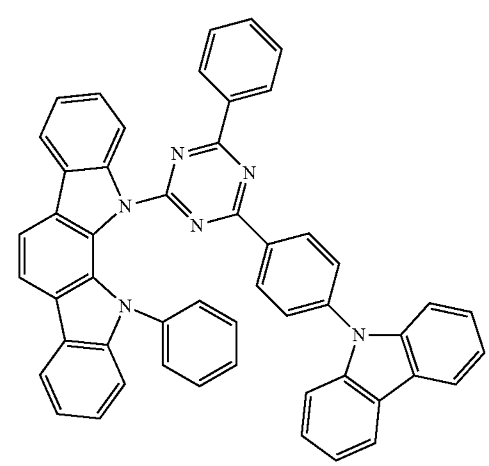

-continued
155
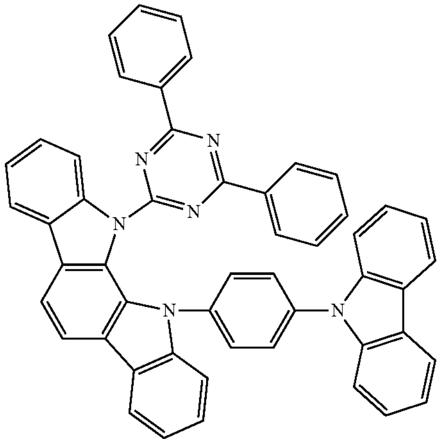
156
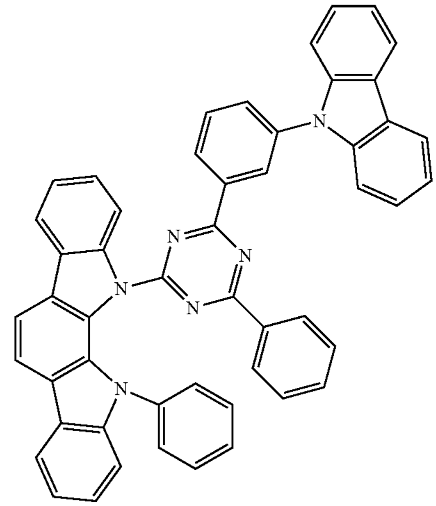
157
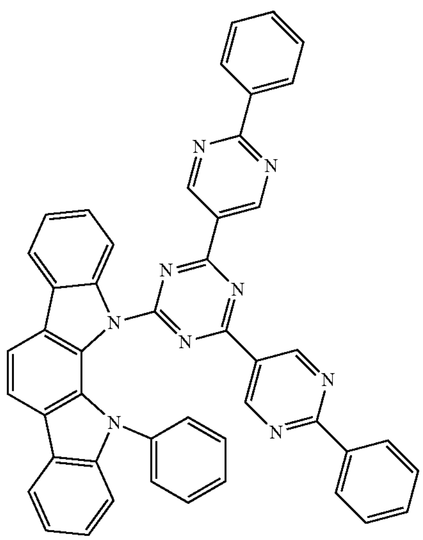
158
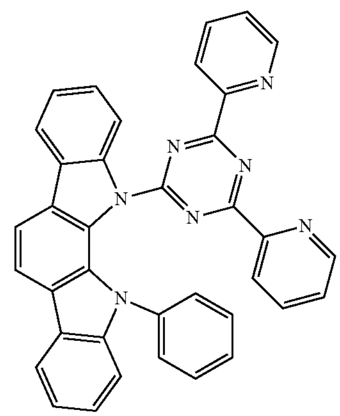
159
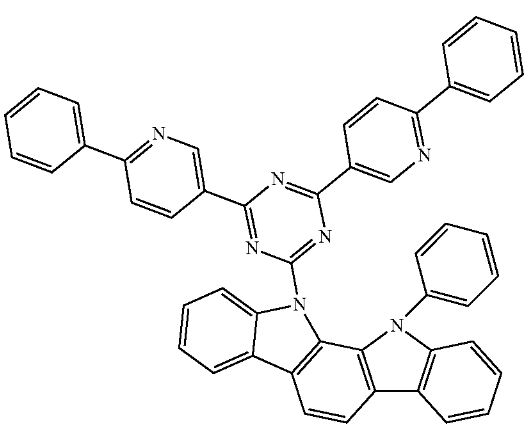
160
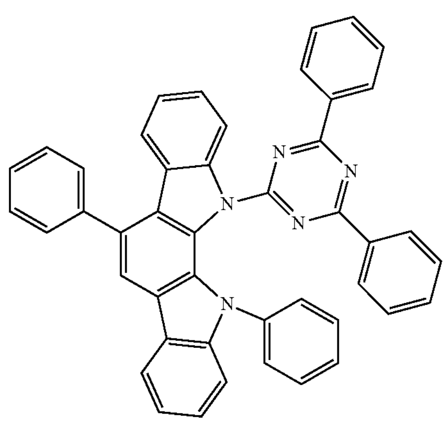

-continued
161
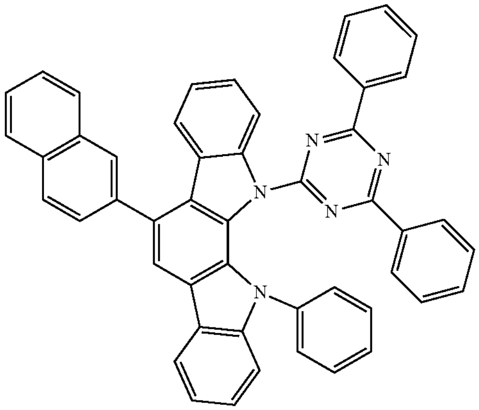
162
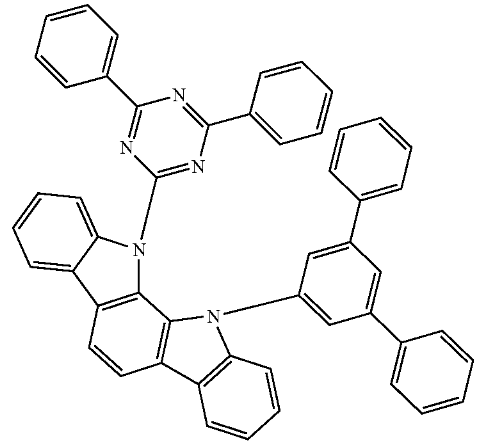
163
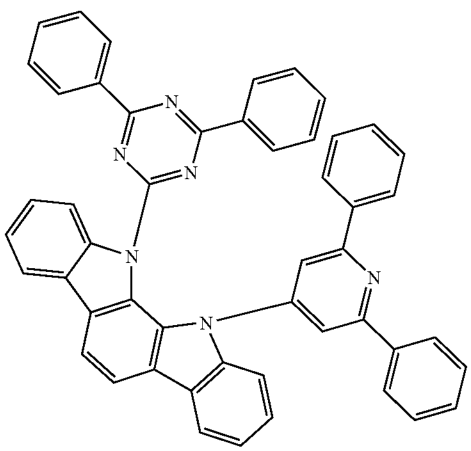
164
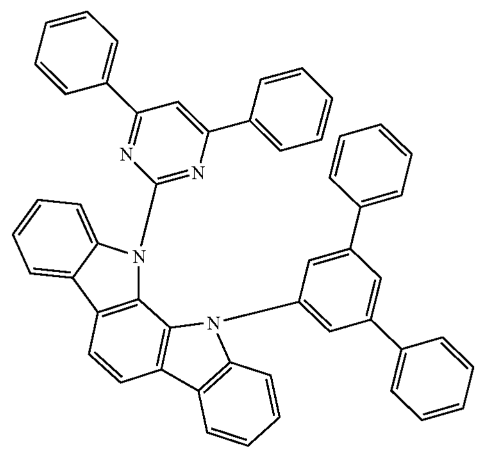
165
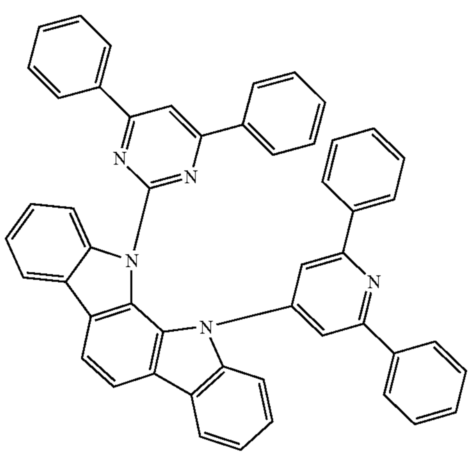
166
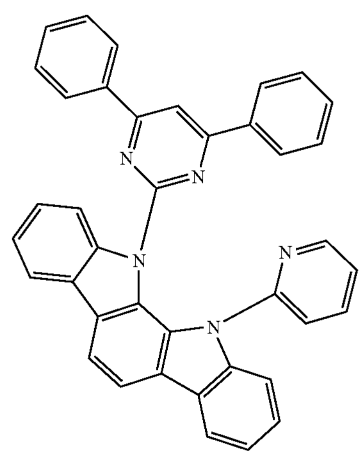

-continued
167
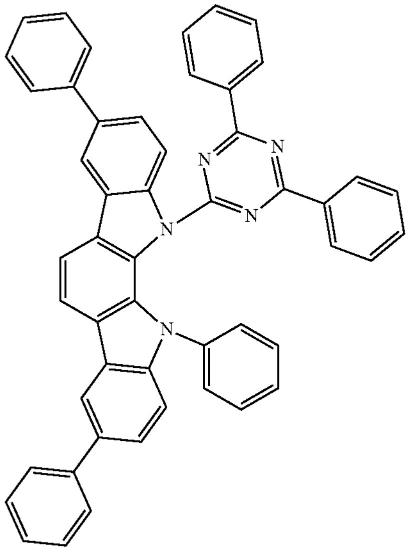
168
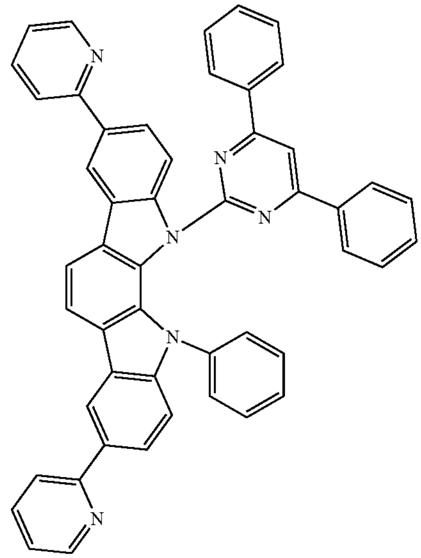
169
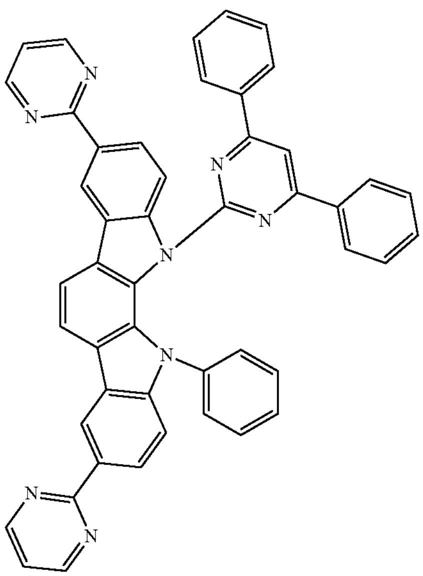
170
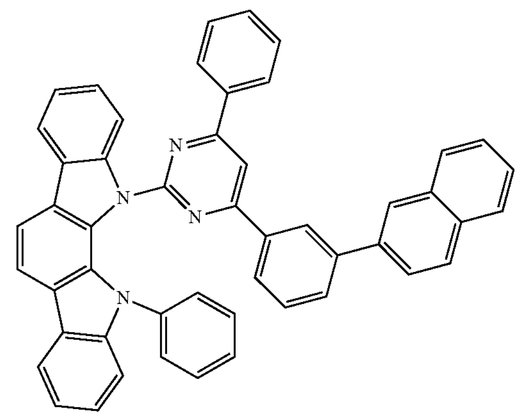
171
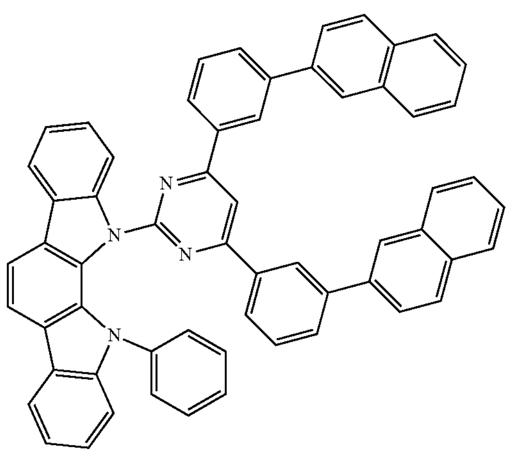
172
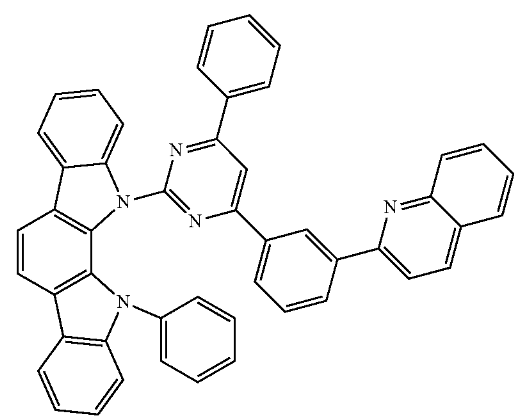

-continued
173
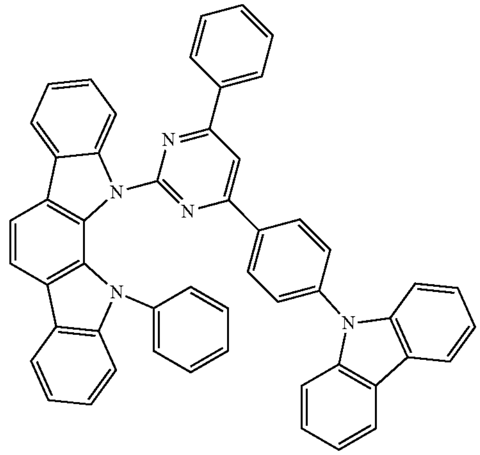
174
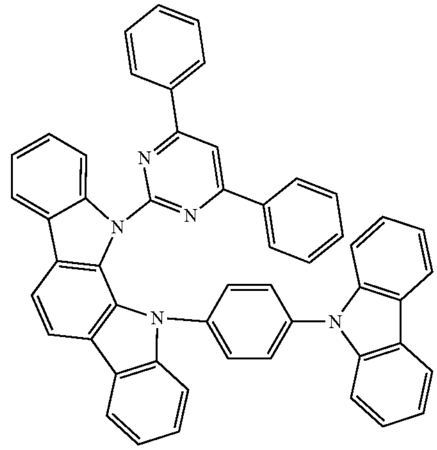
175
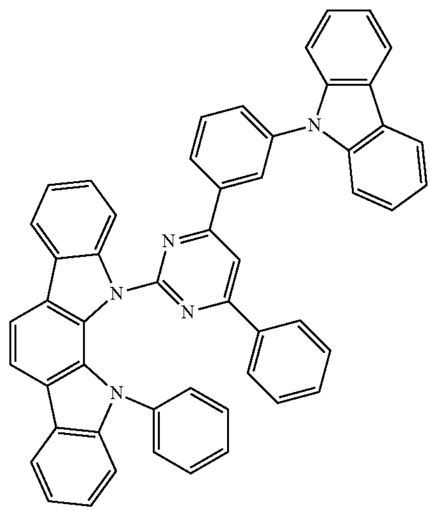
176
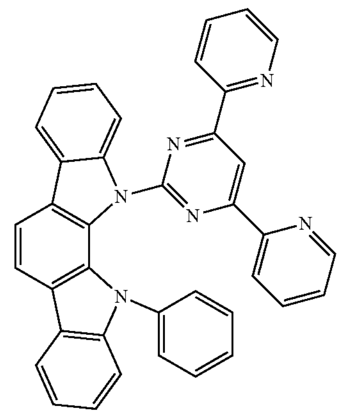
177
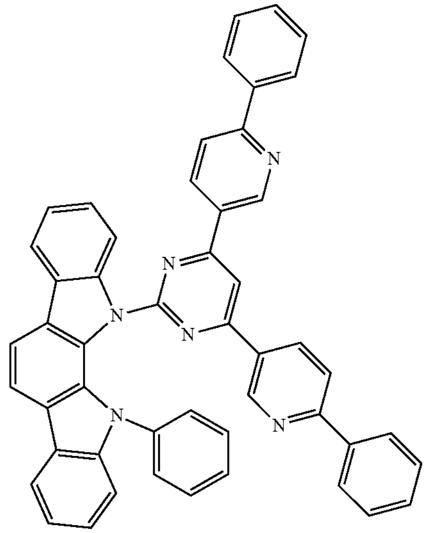
178
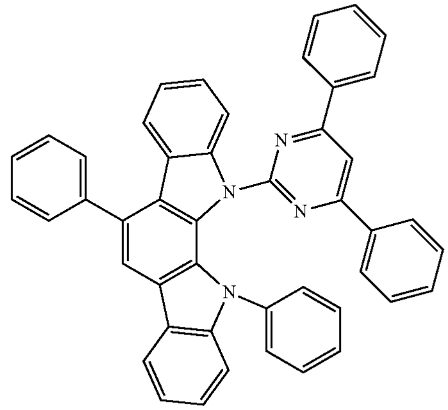

-continued
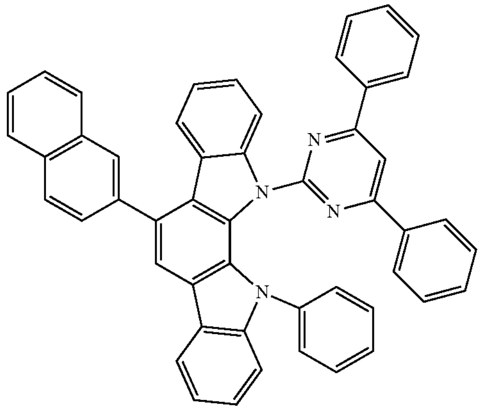
179
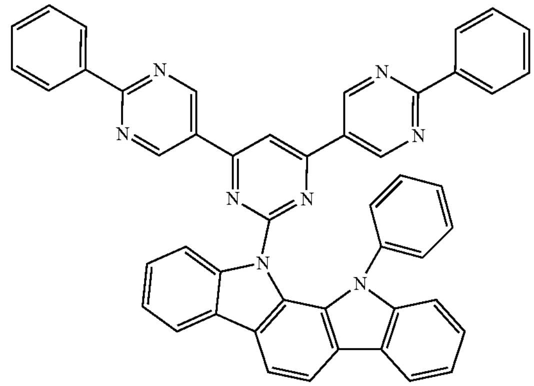
180
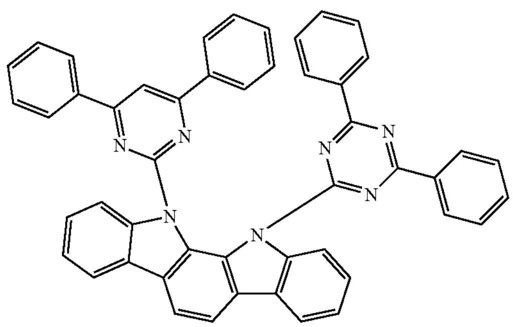
181
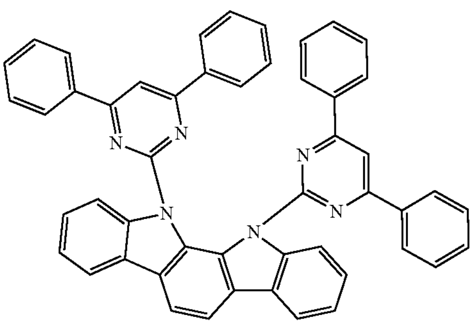
182
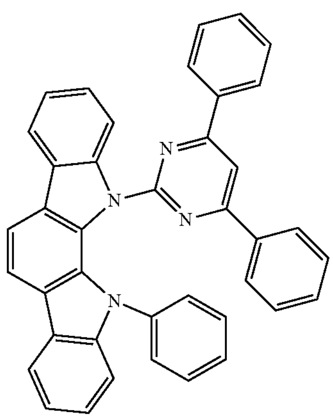
183
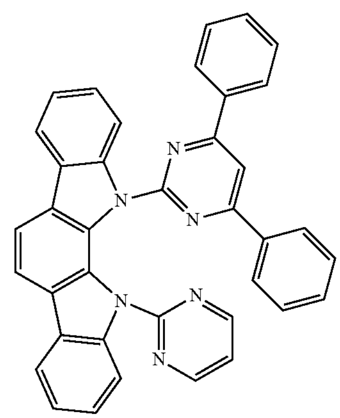
184
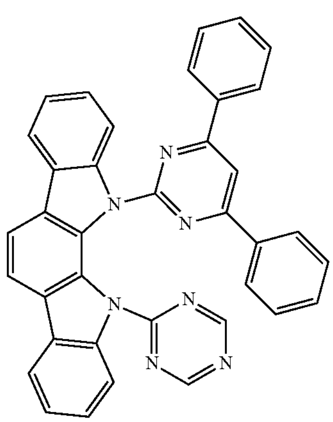
185
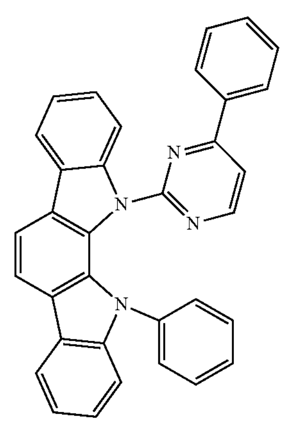
186

-continued
187
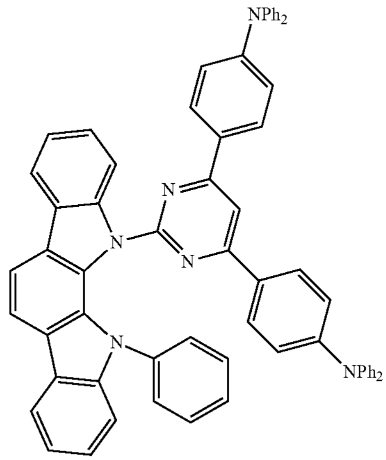
188
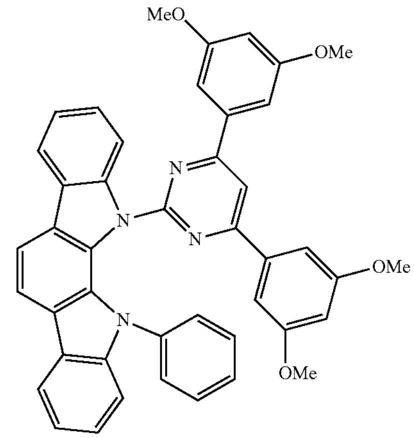
189
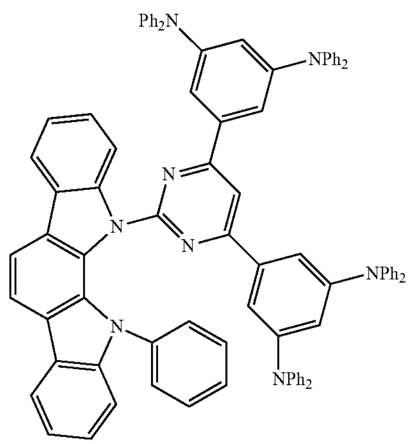
190
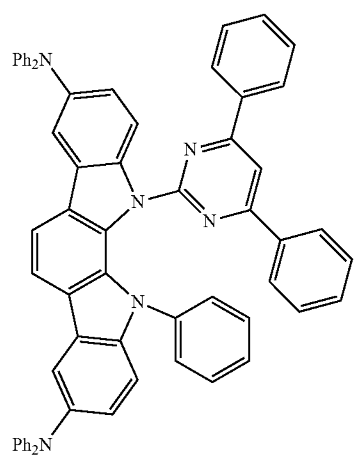
191
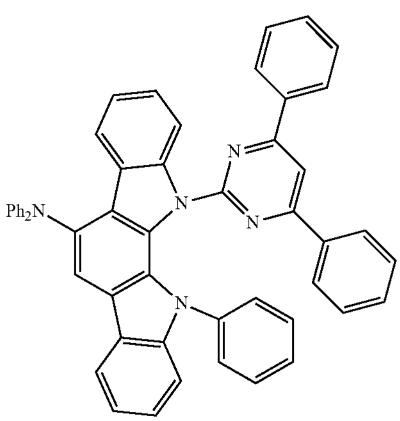
192
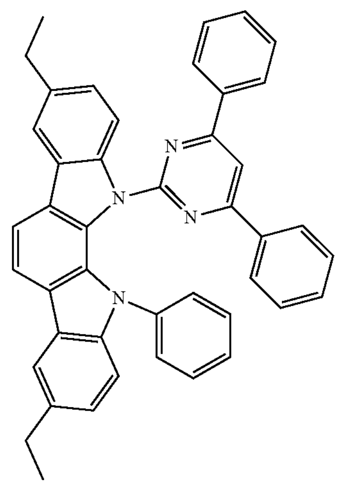

-continued
193
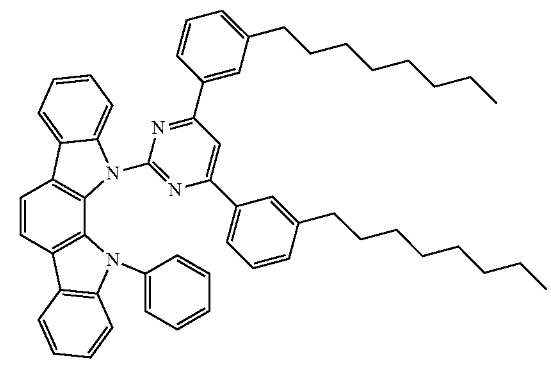
194
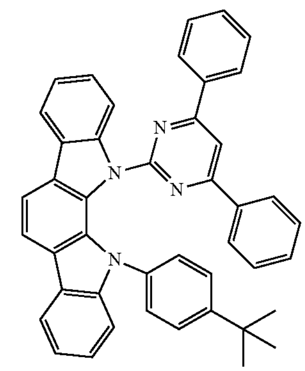
195
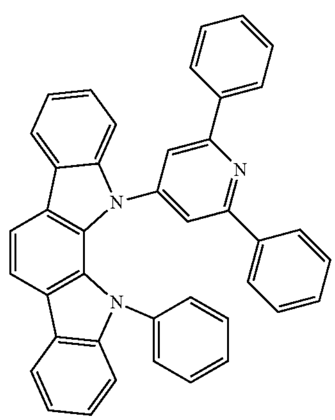
196
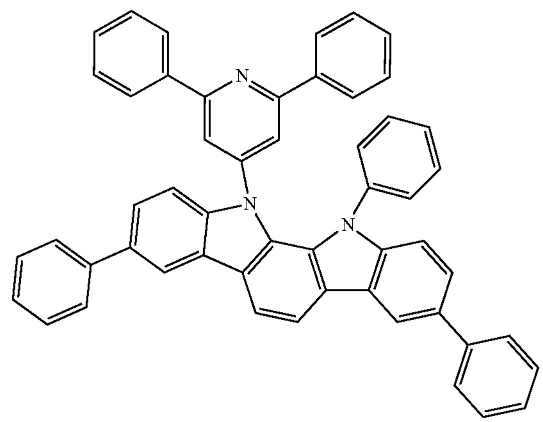
197
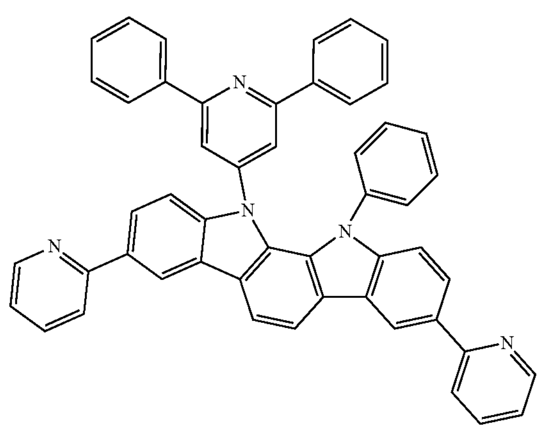
198
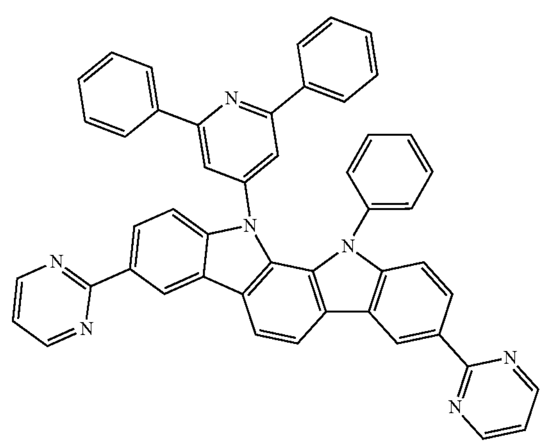

-continued
199
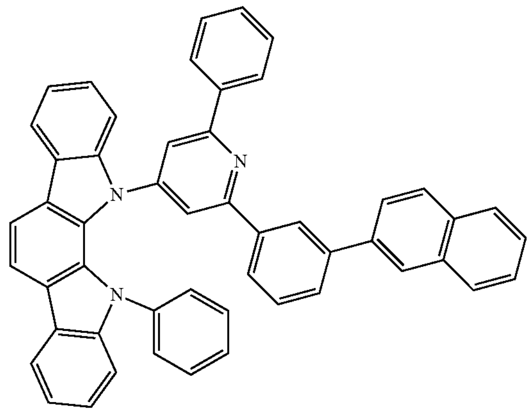
200
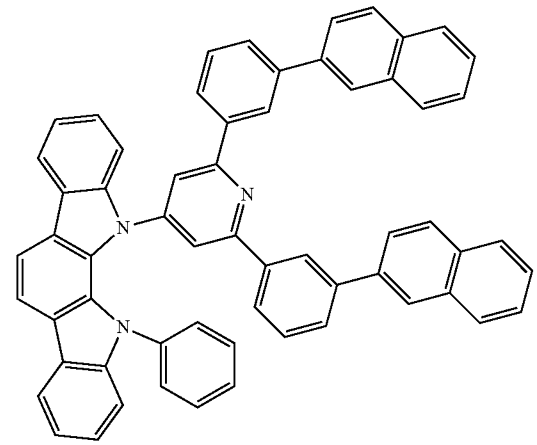
201
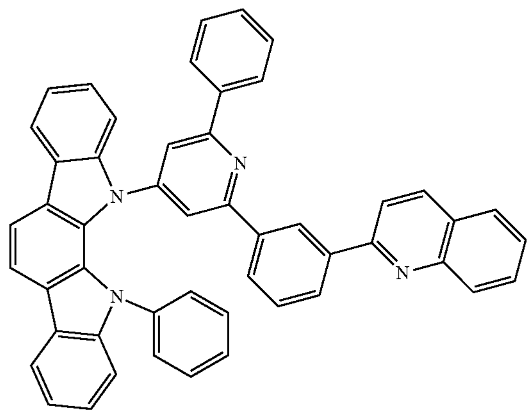
202
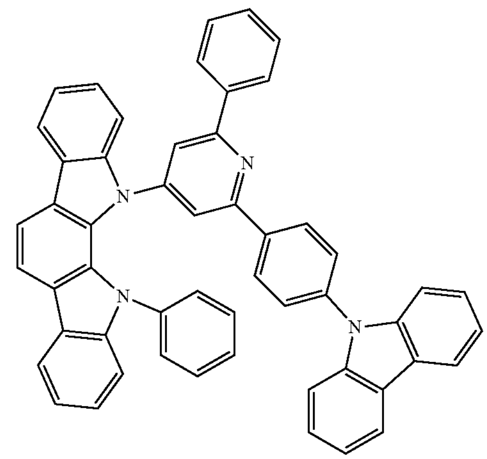
203
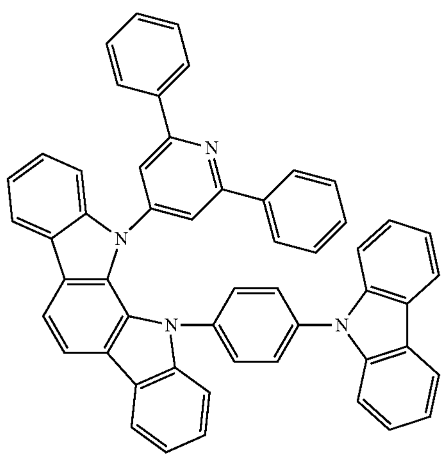
204
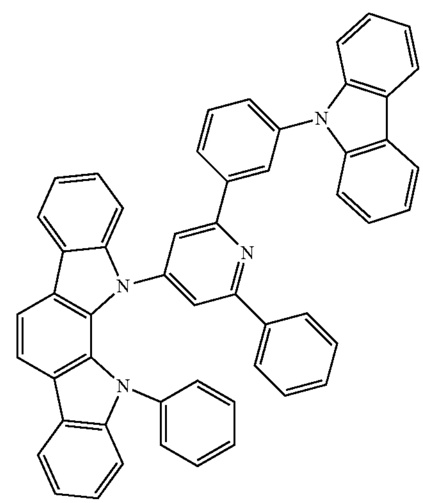

-continued
205
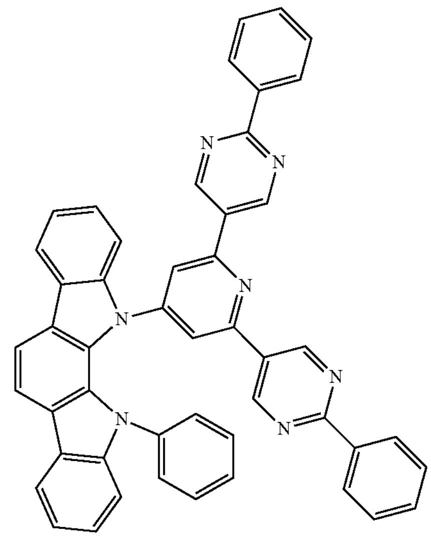
206
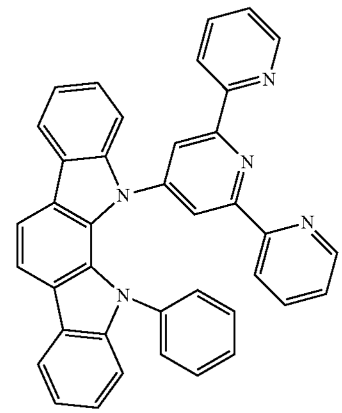
207
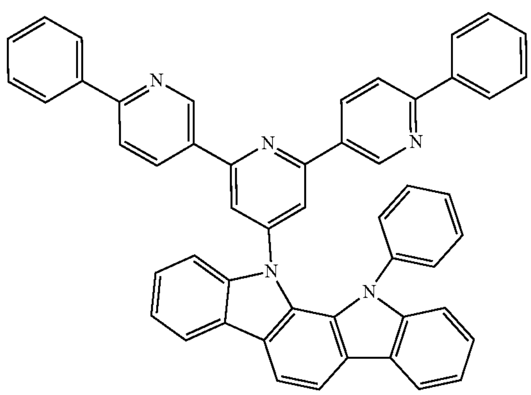
208
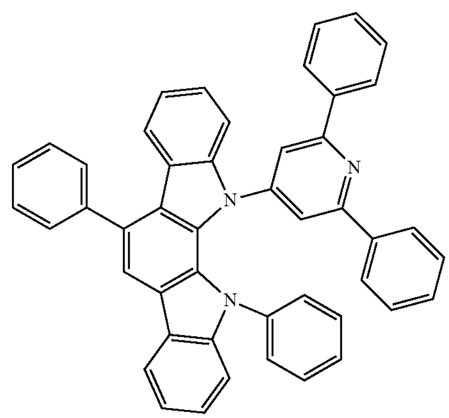
209
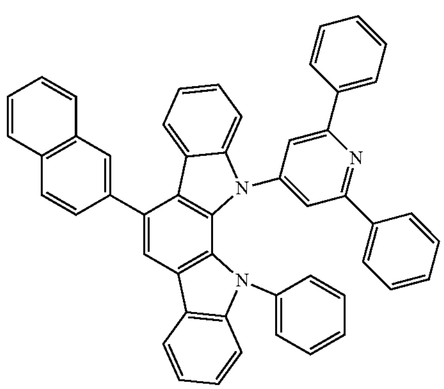
210
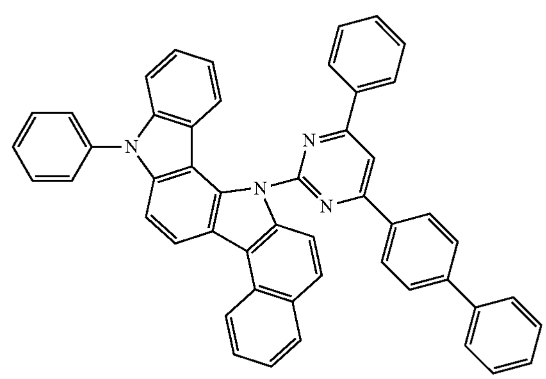

-continued
211
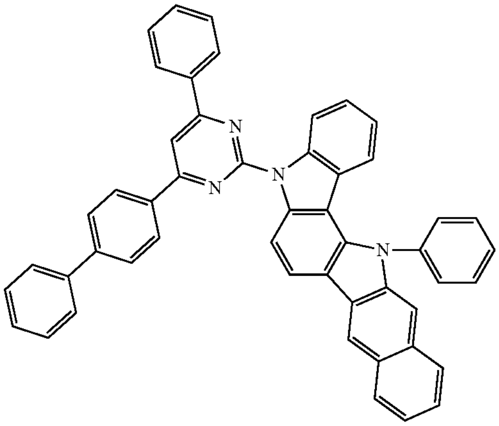
212
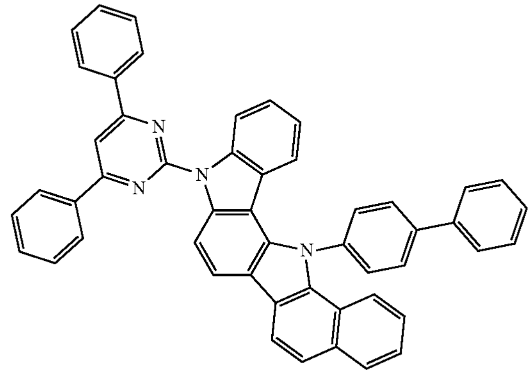
213
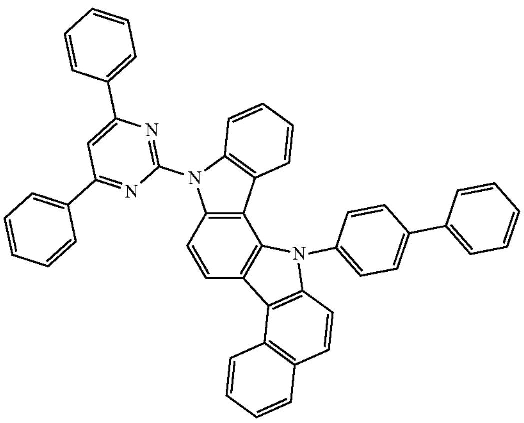
214
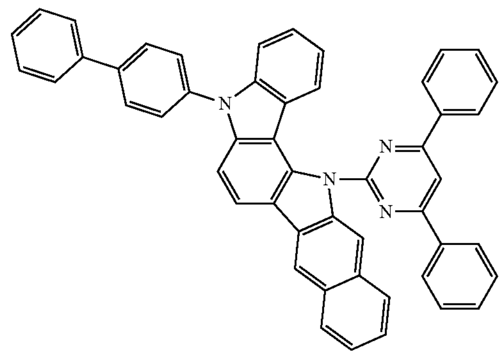
215
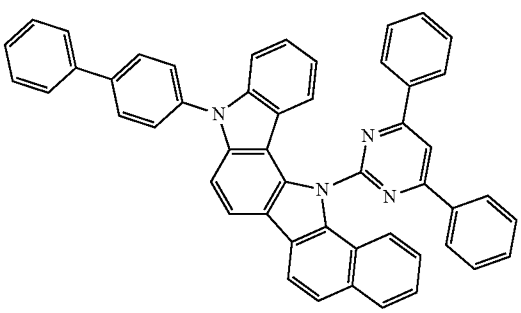
216
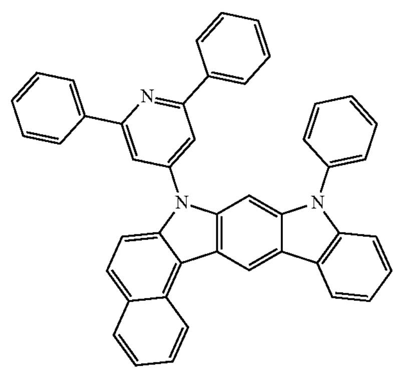
217
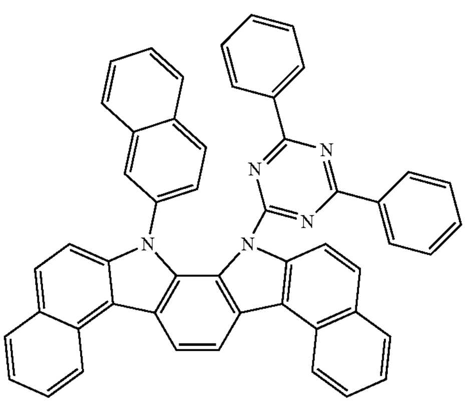
218
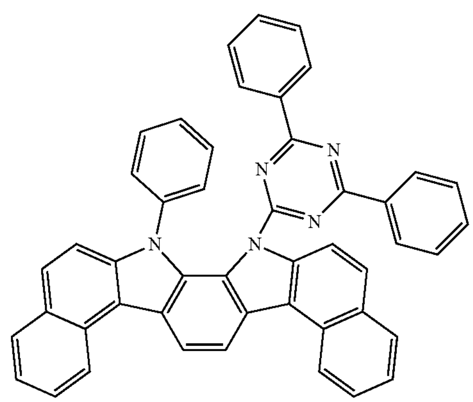

-continued
219
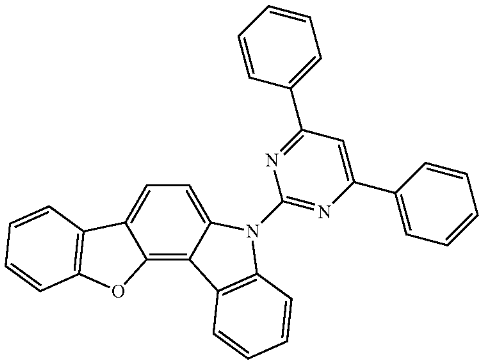
220
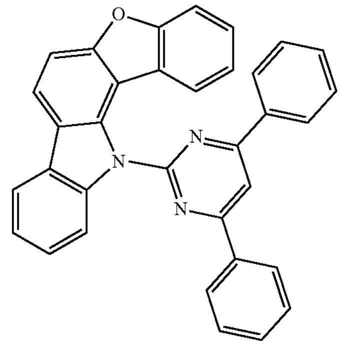
221
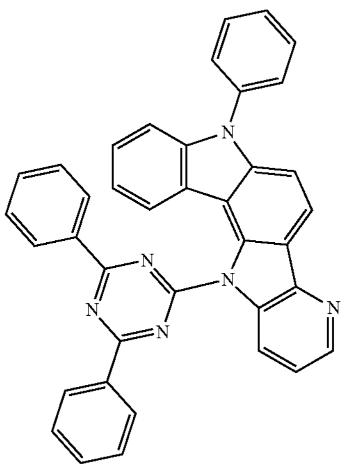
222
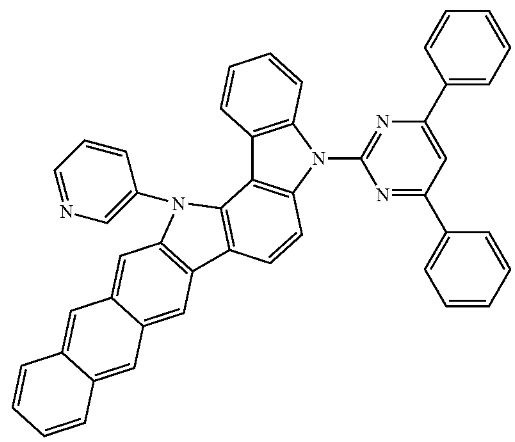
223
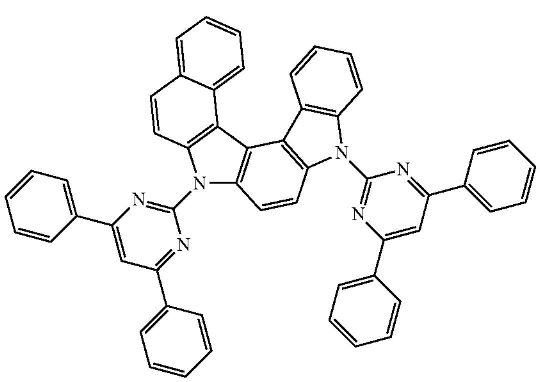
224
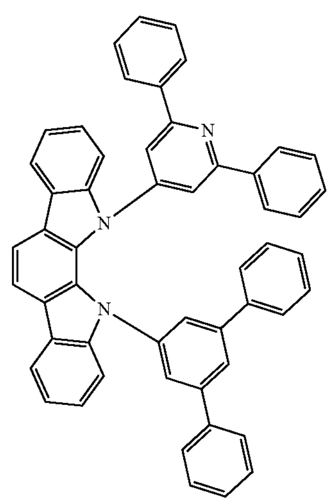

-continued
225
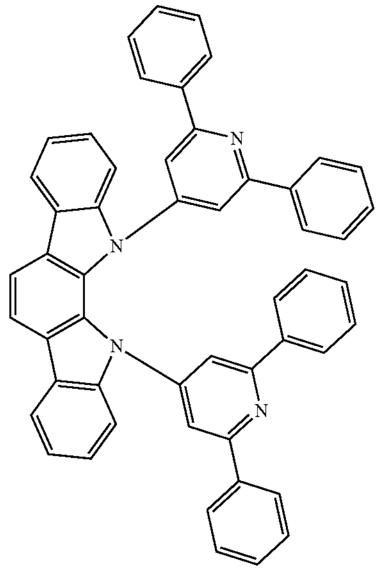
226
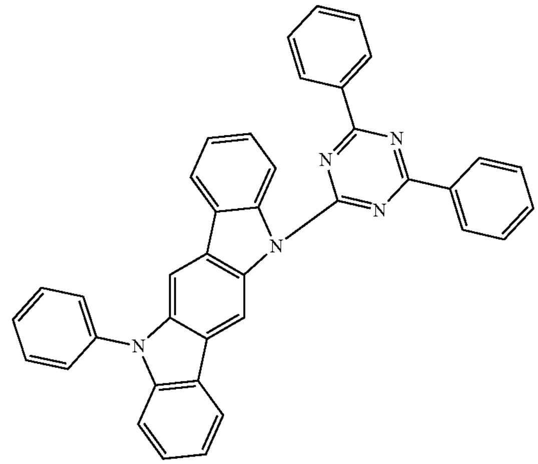
227
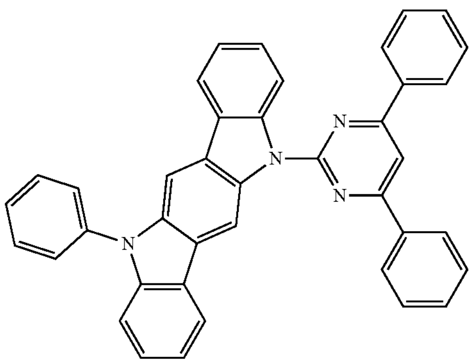
228
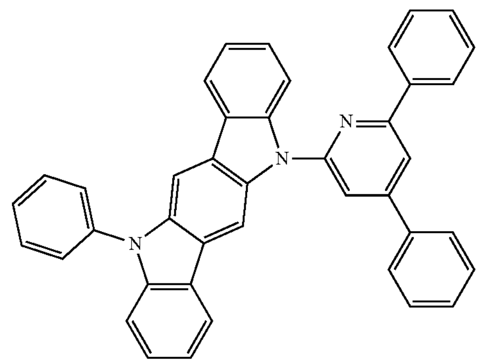
229
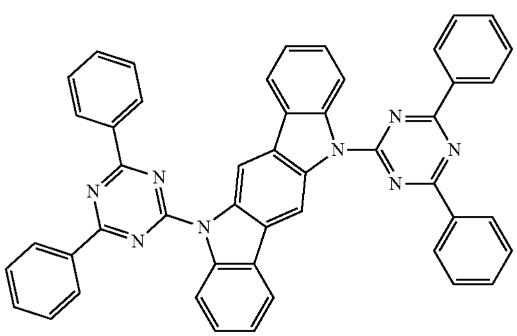
230
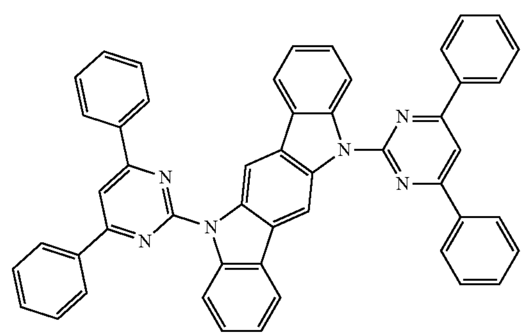
231
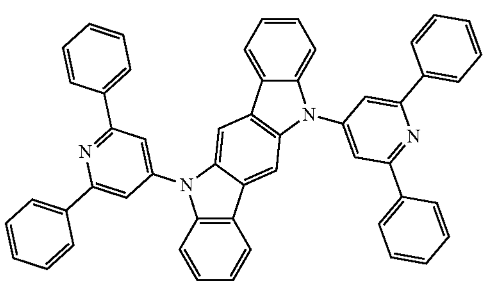
232
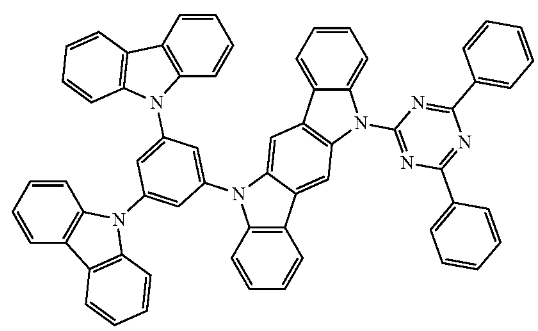

-continued
233
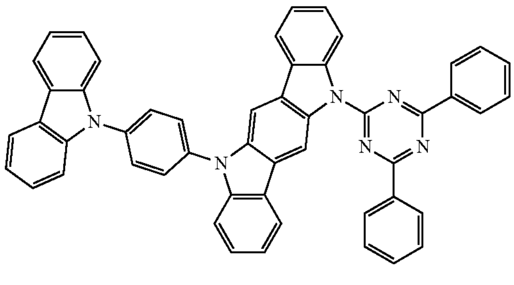
234
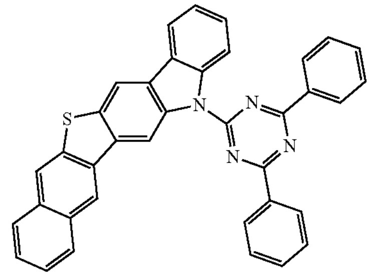
235
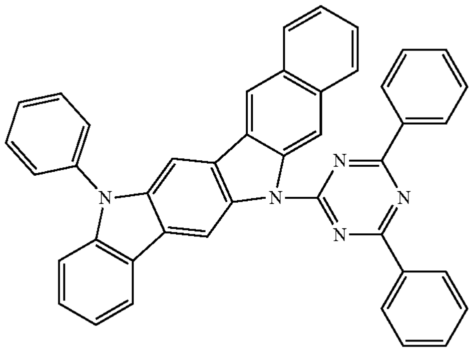
236
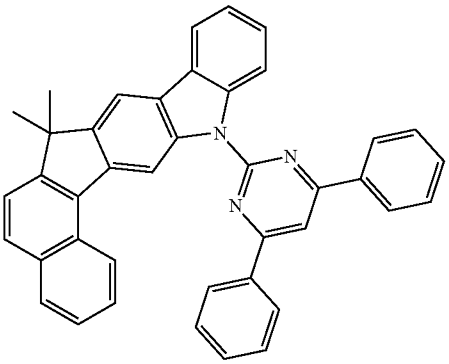
237
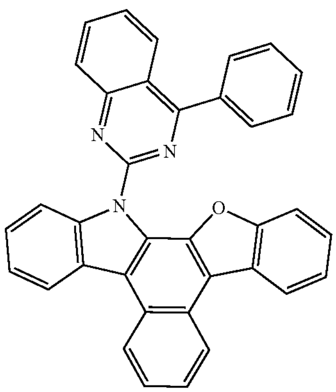
101A
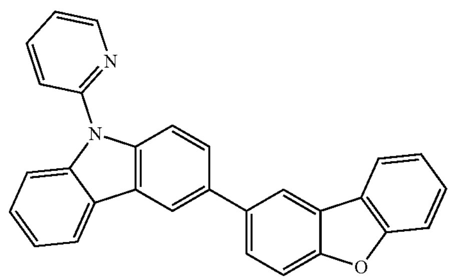
102A
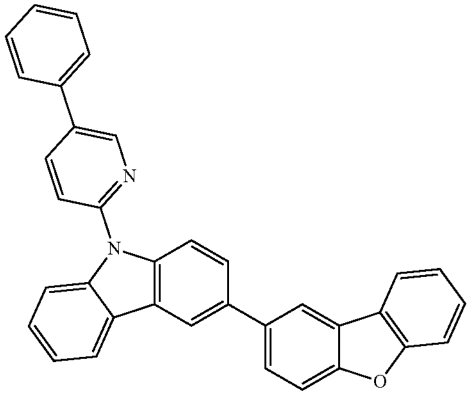
103A
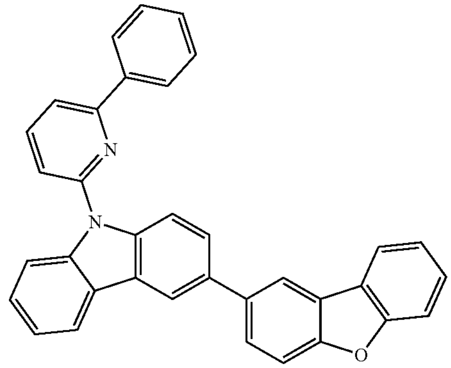

-continued
104A
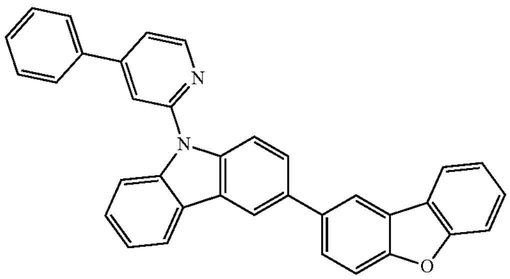
105A
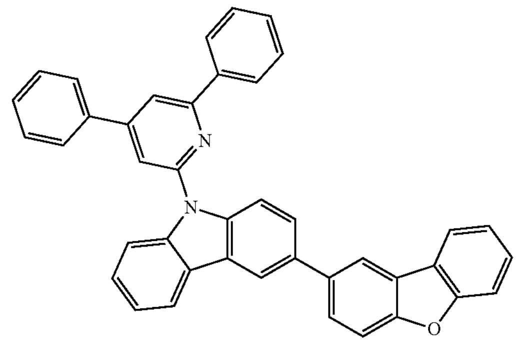
106A
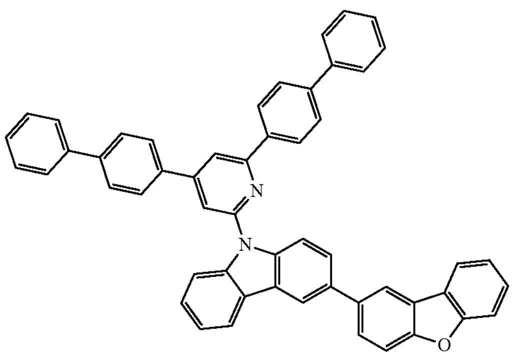
107A
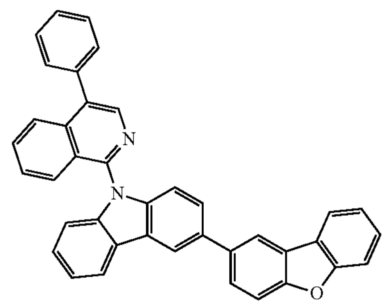
108A
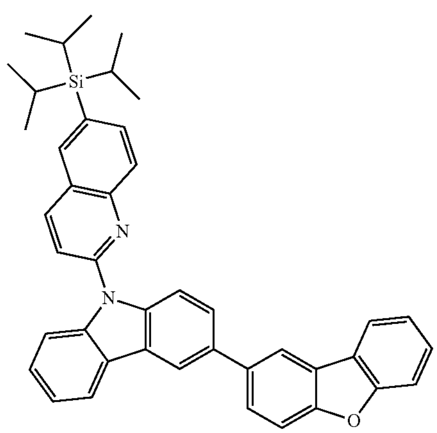
109A
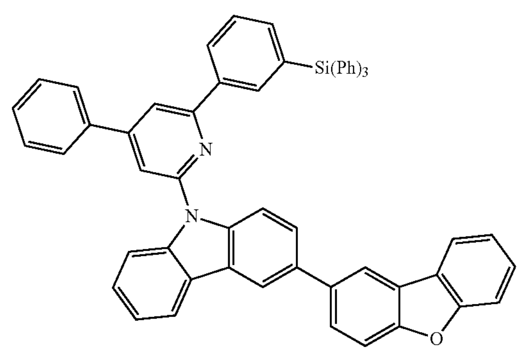
110A
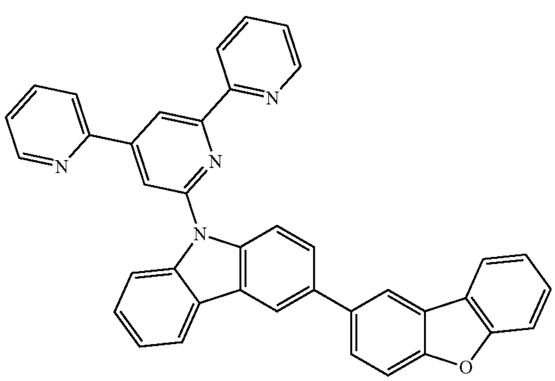
111A
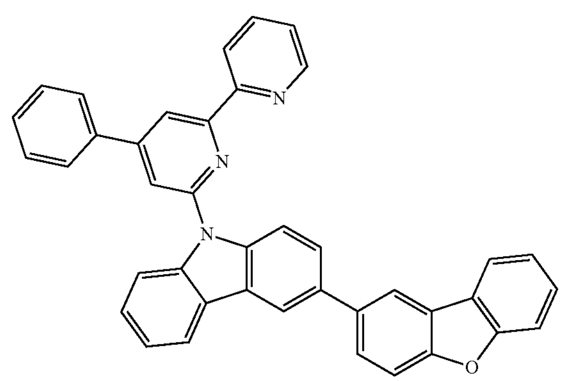

-continued
112A
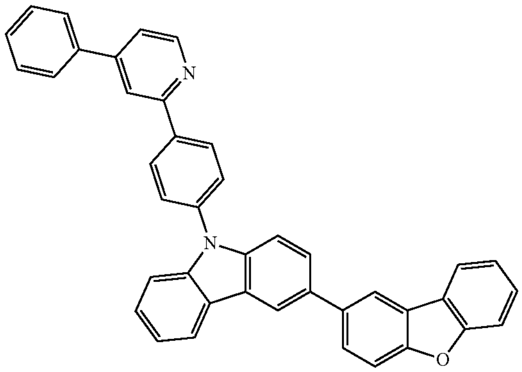
113A
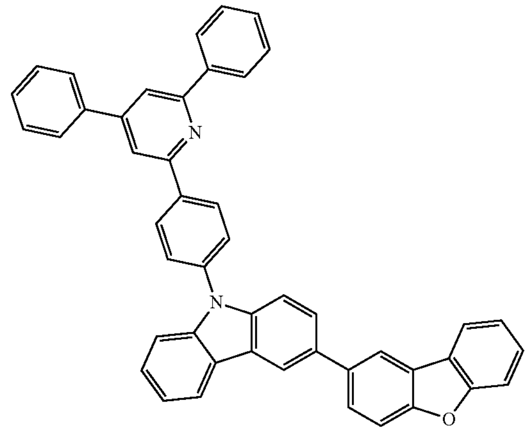
114A
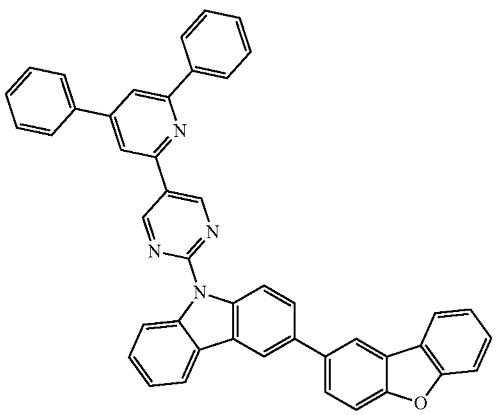
115A
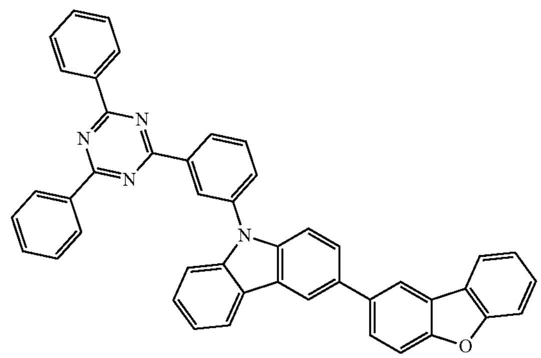
116A
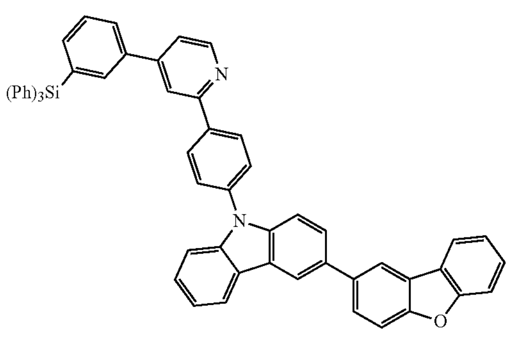
117A
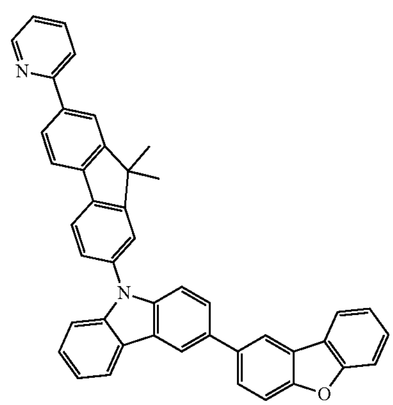

-continued
118A
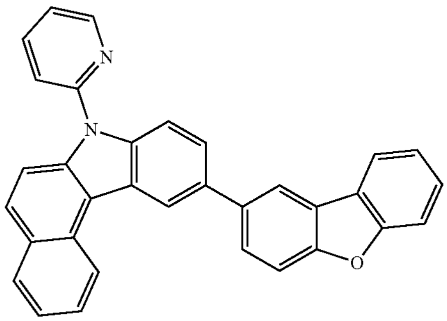
119A
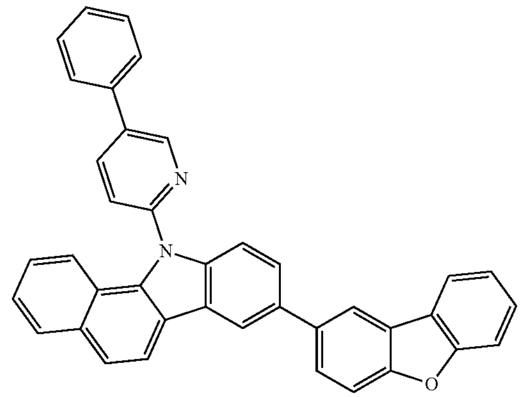
120A
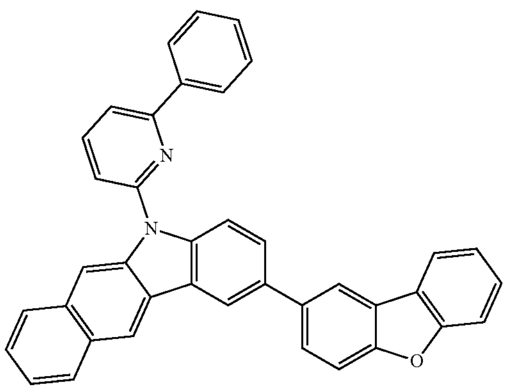
121A
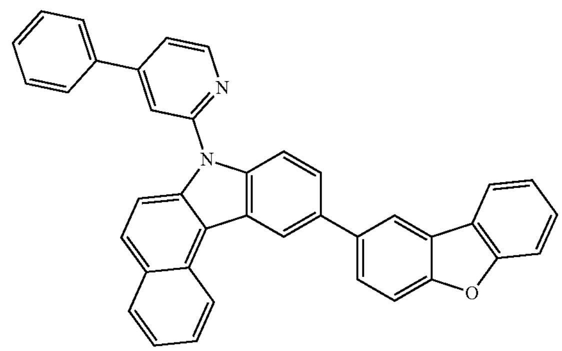
122A
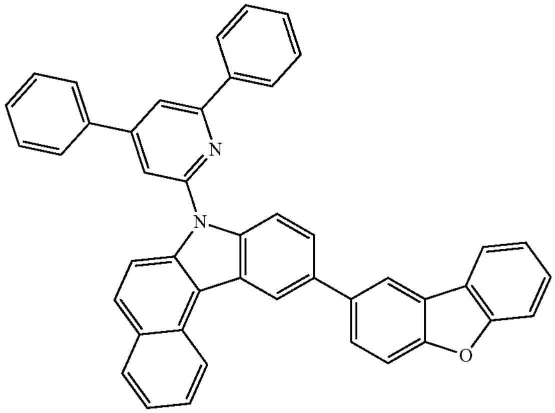
123A
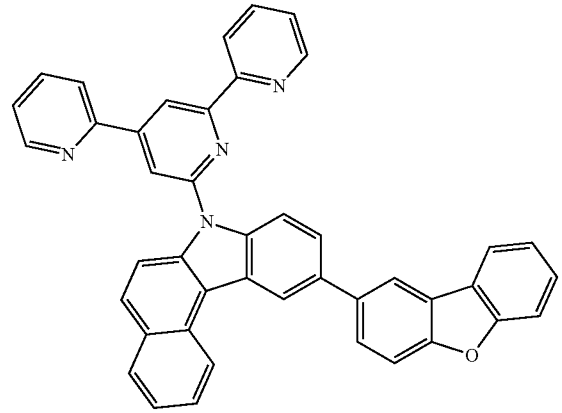

-continued
124A
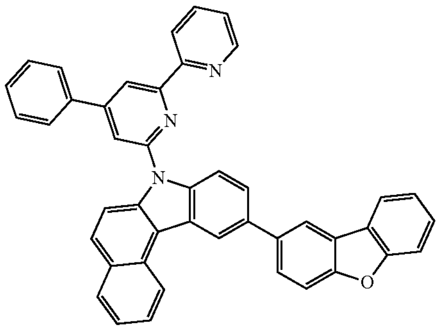
125A
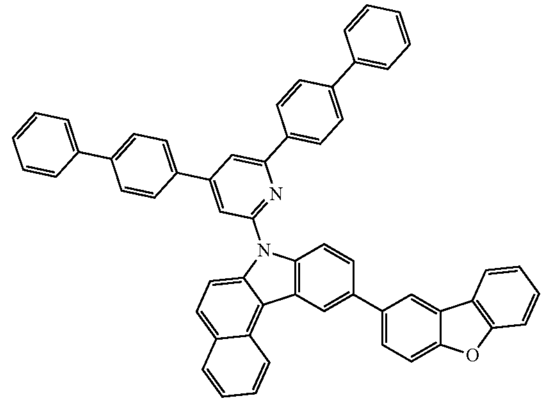
126A
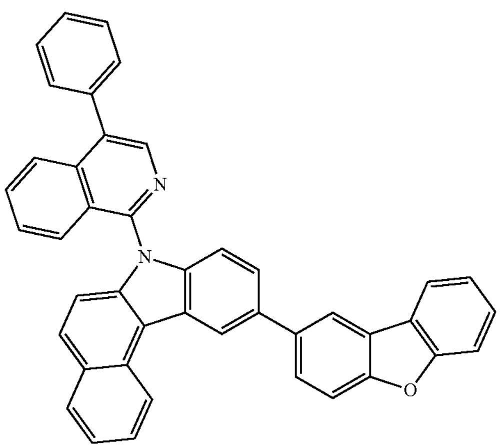
127A
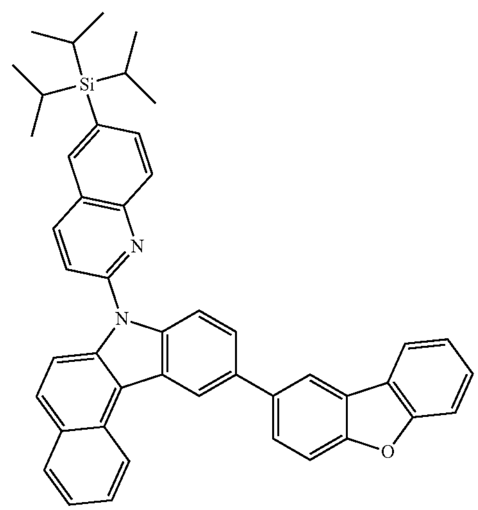
128A
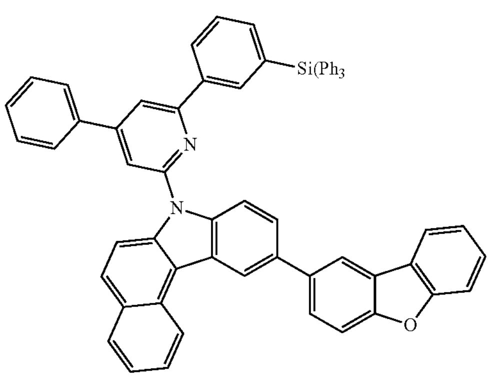
129A
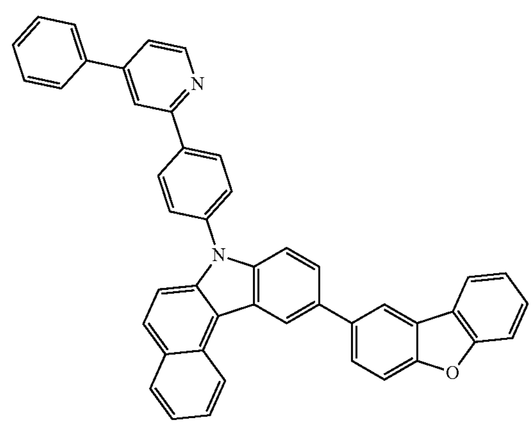

-continued
130A
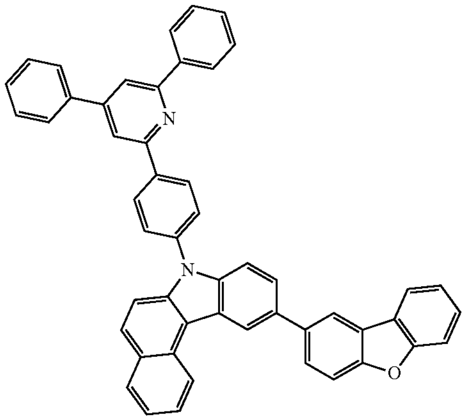
131A
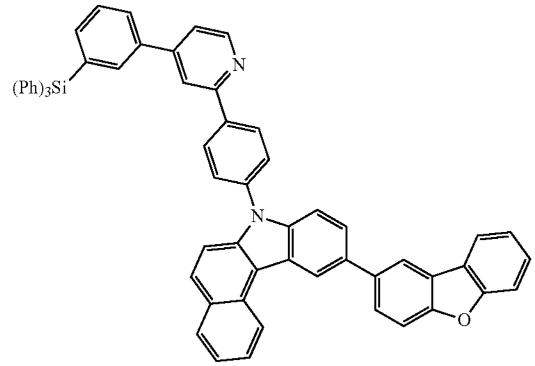
132A
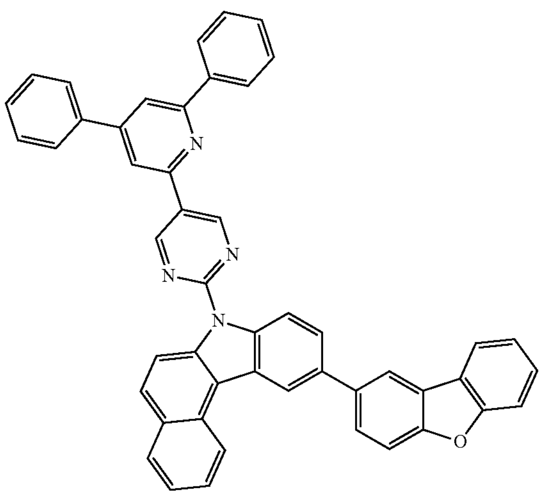
133A
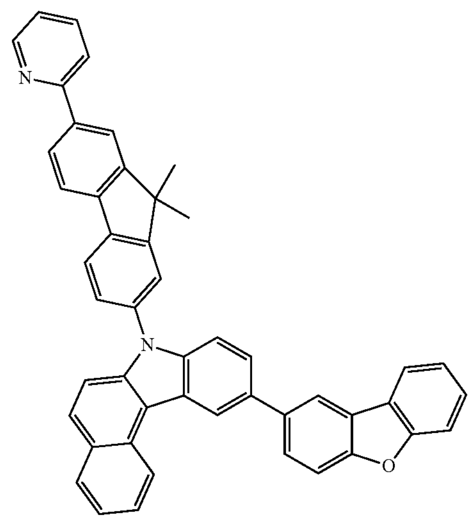
134A
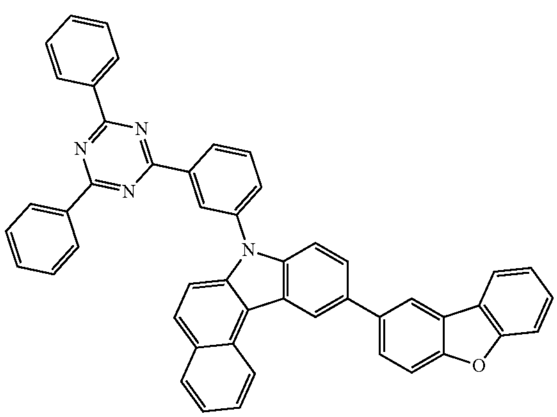
135A
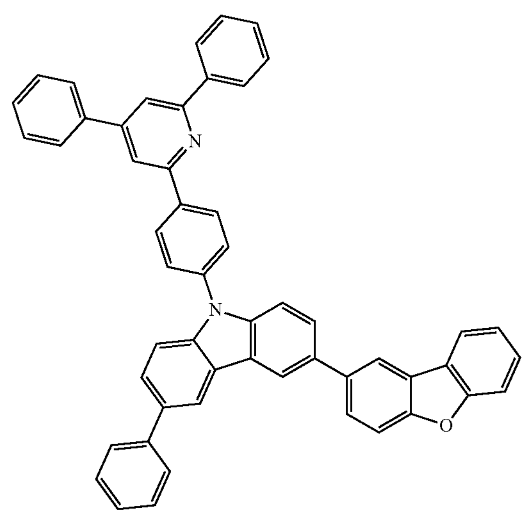

-continued
136A
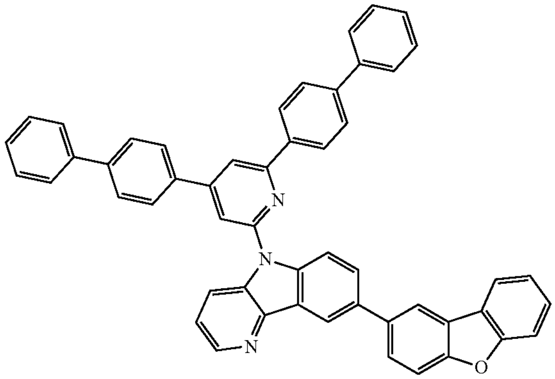
137A
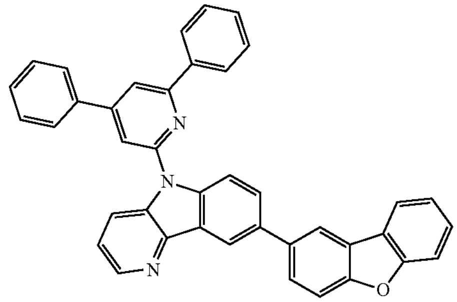
138A
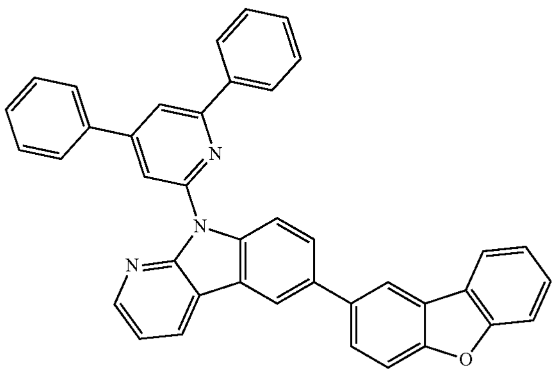
139A
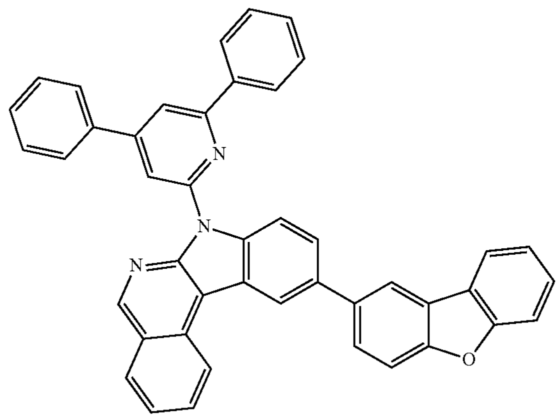
140A
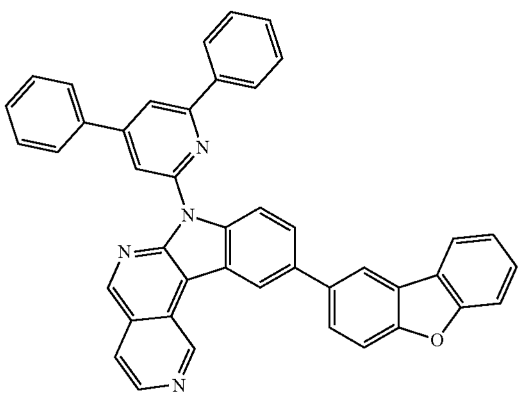
141A
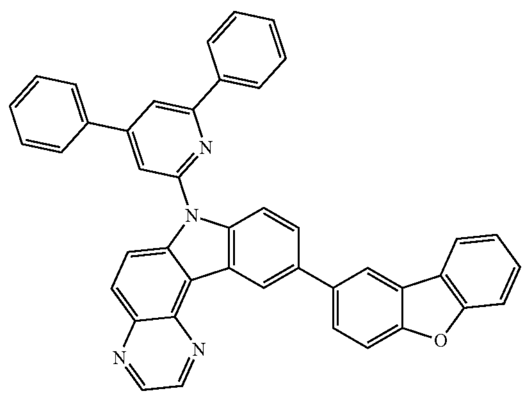
142A
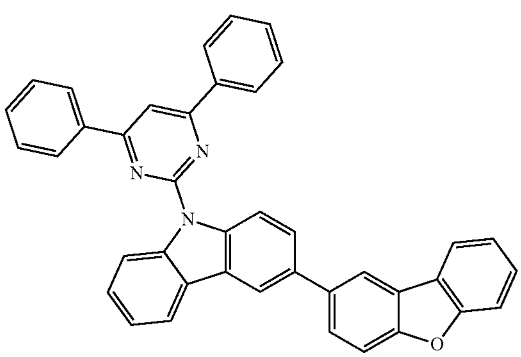
143A
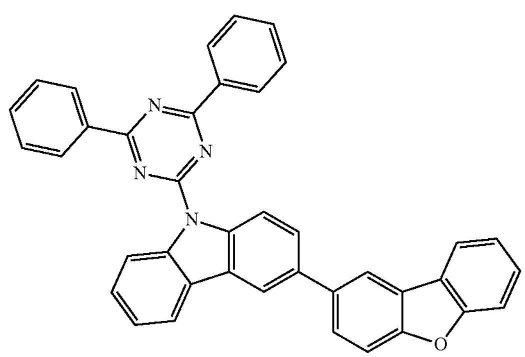

-continued
144A
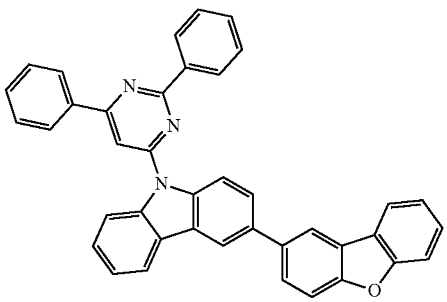
145A
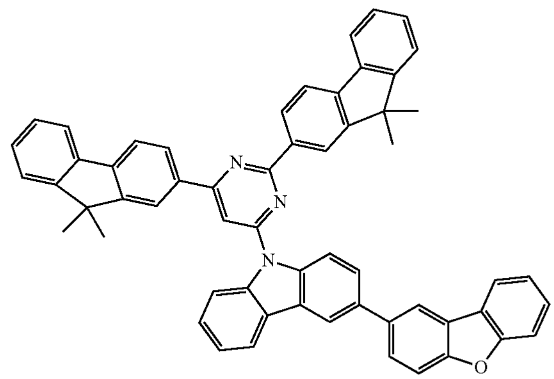
146A
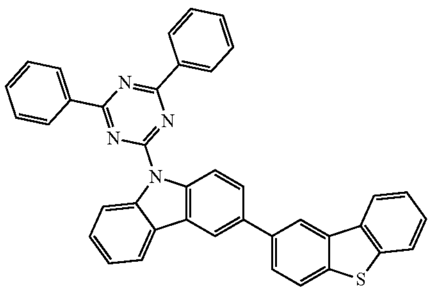
147A
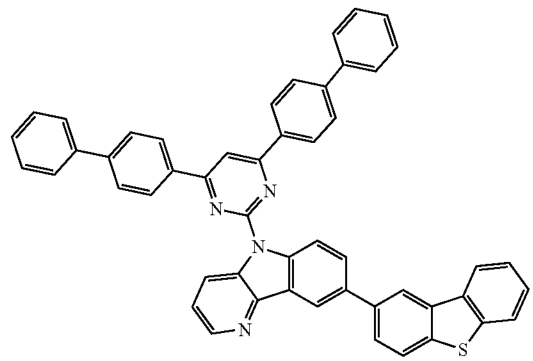
148A
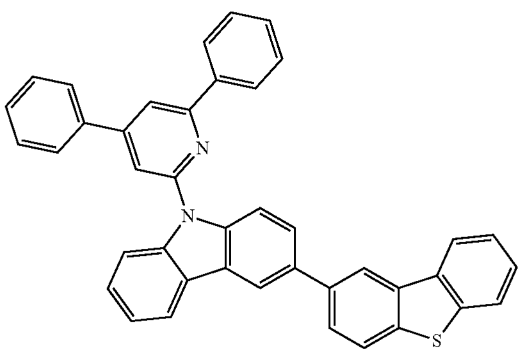
149A
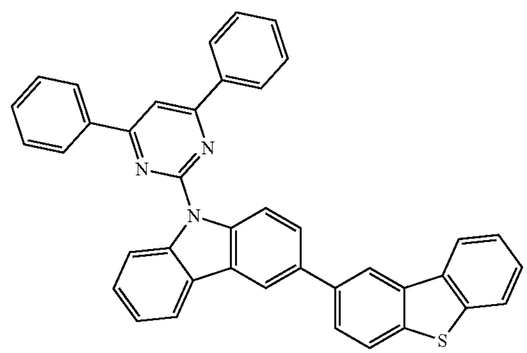
150A
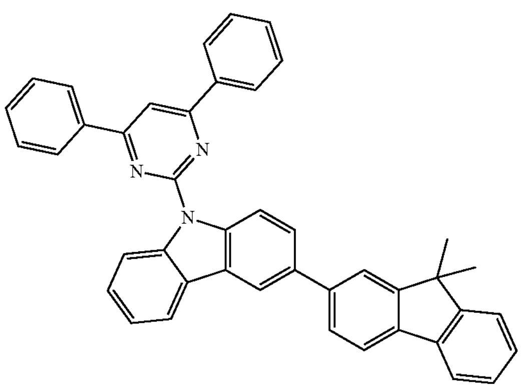
151A
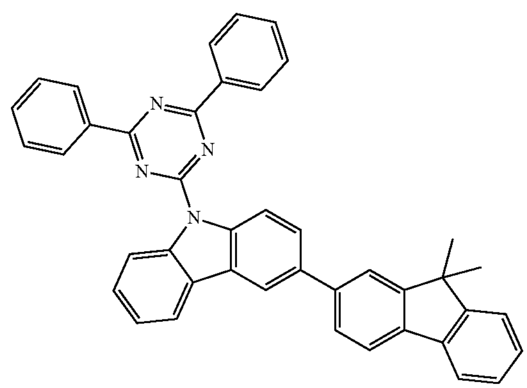

-continued
152A
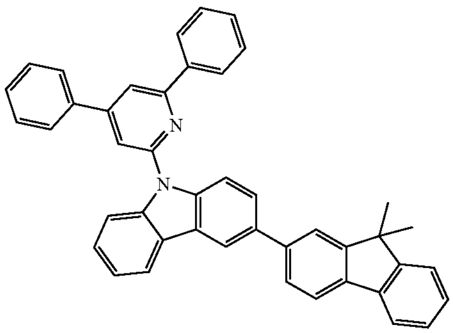
153A
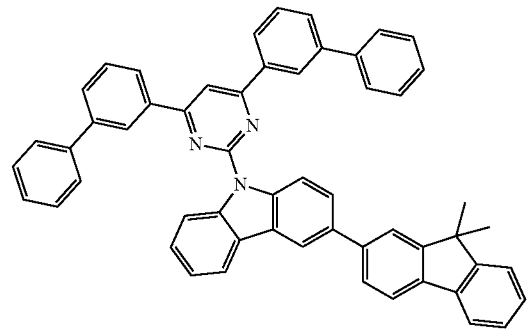
154A
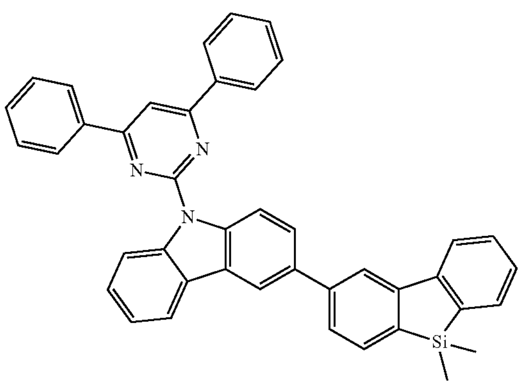
155A
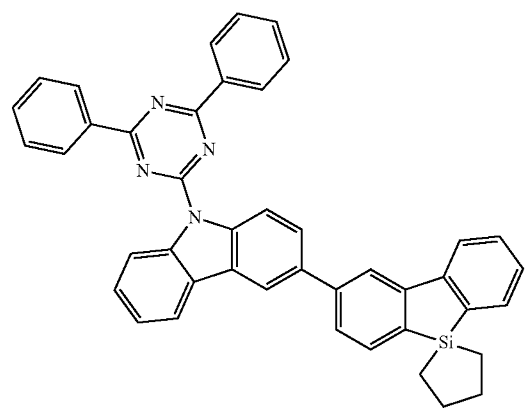
156A
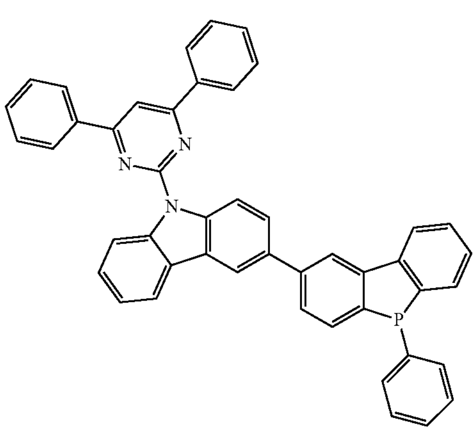
157A
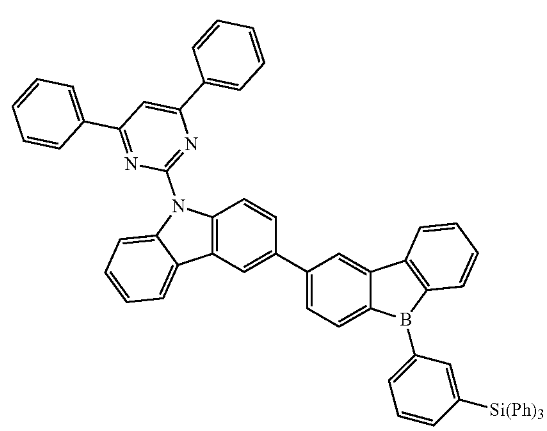

-continued
158A
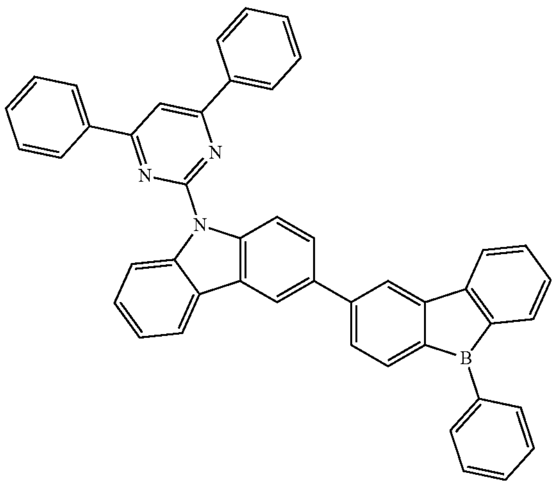
159A
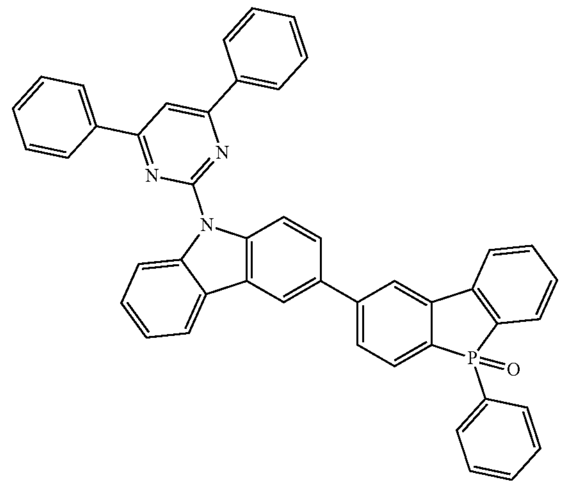
160A
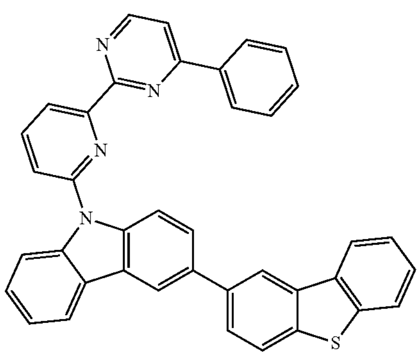
161A
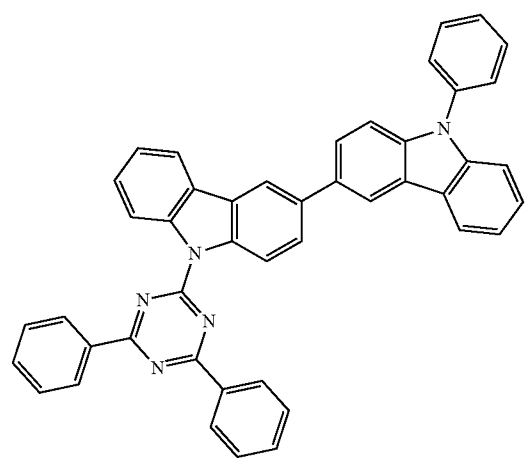
162A
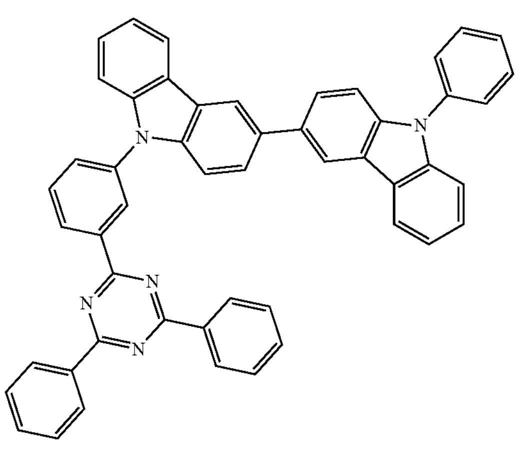
163A
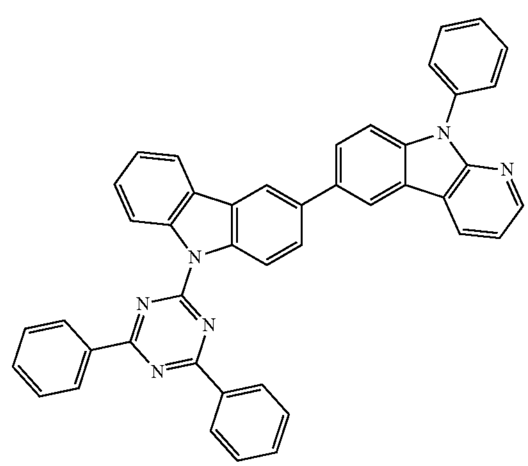

-continued
164A
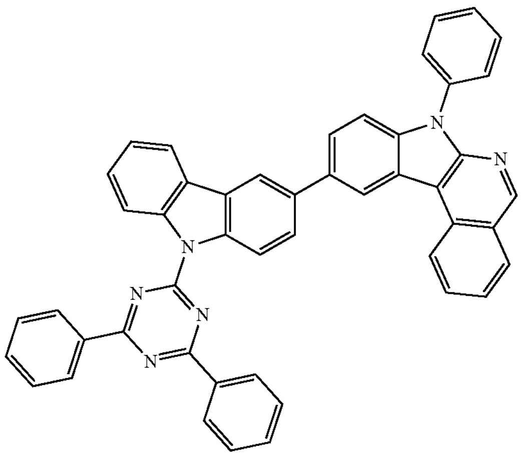
165A
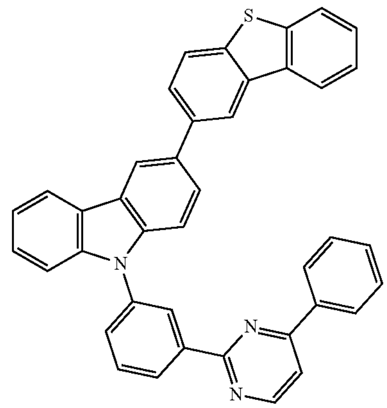
166A
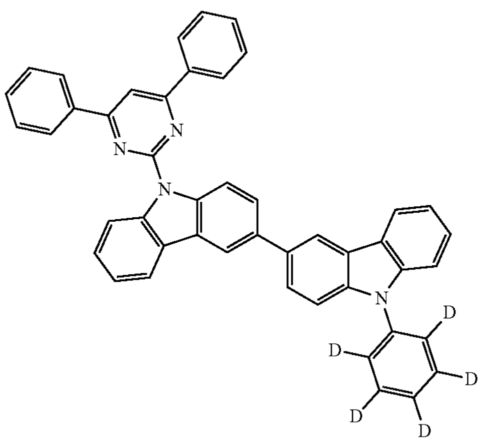
167A
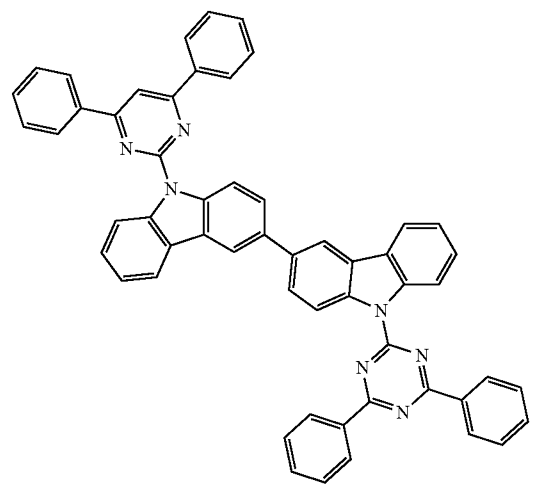
168A
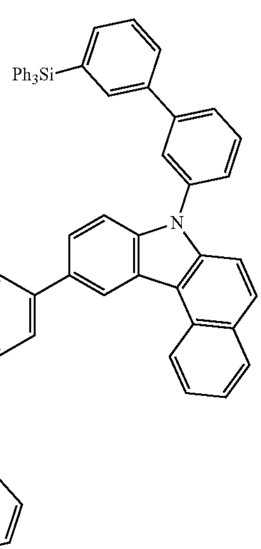
169A
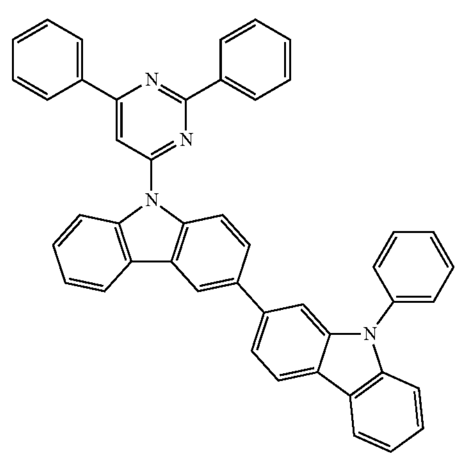

-continued
170A
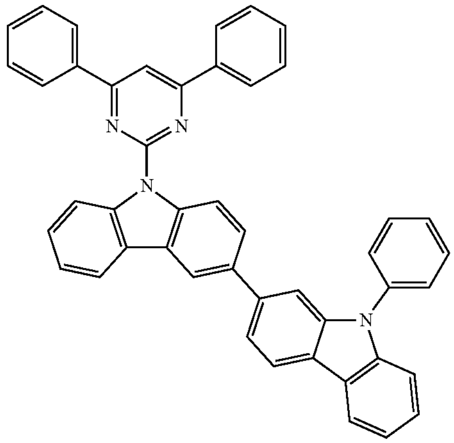
171A
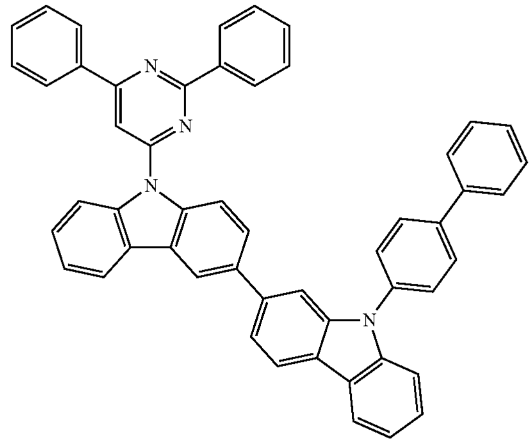
172A
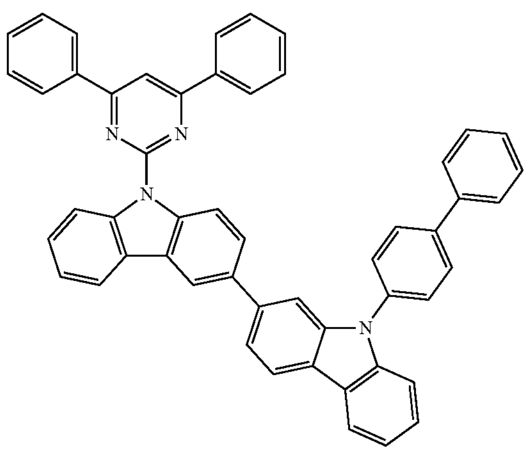
173A
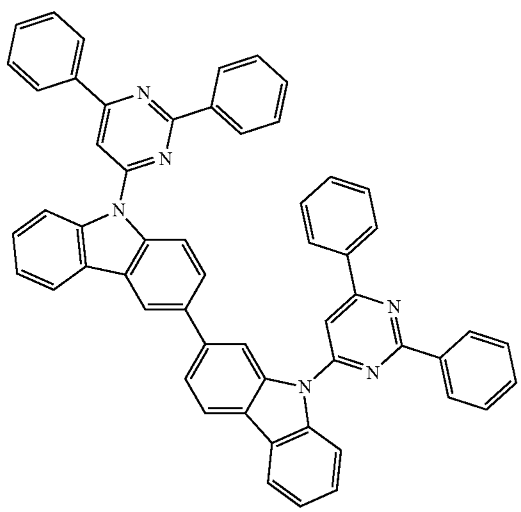
174A
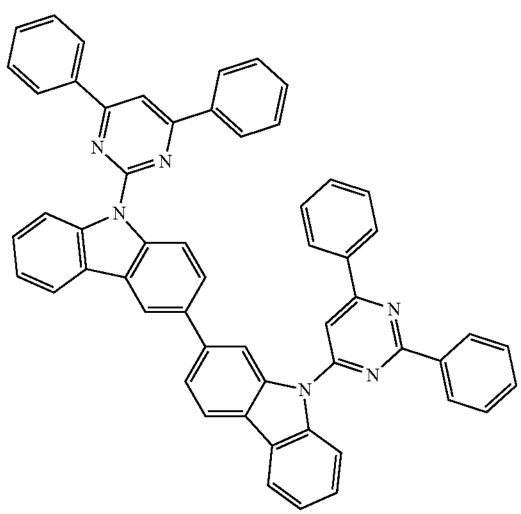
175A
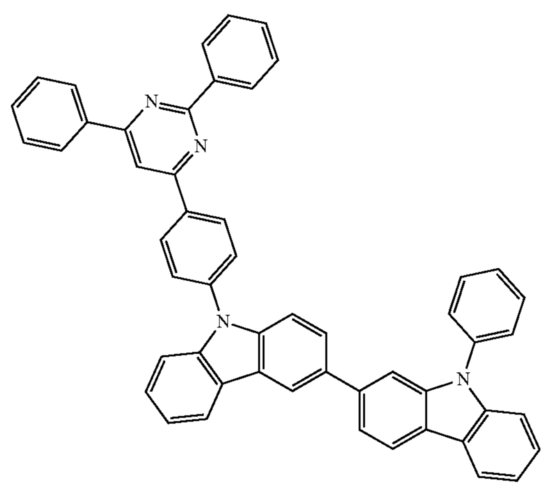

-continued
176A
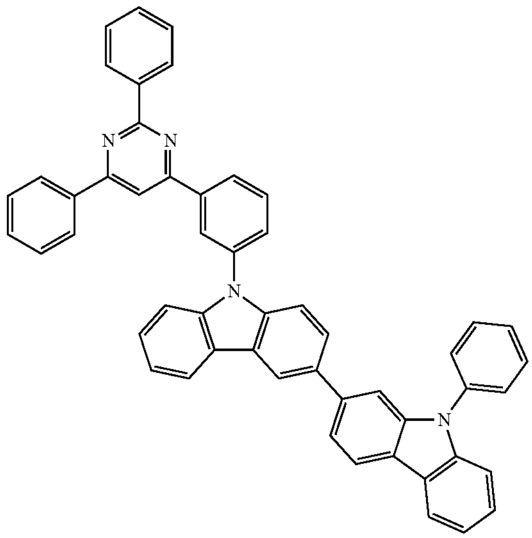
177A
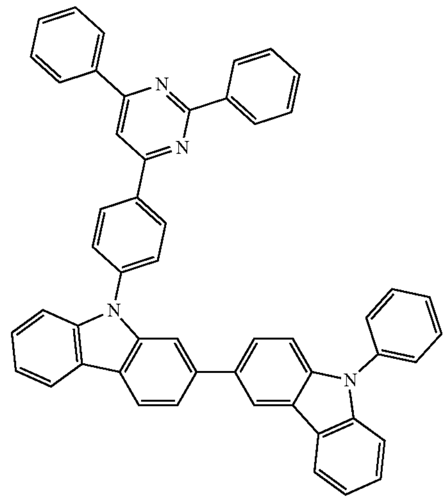
178A
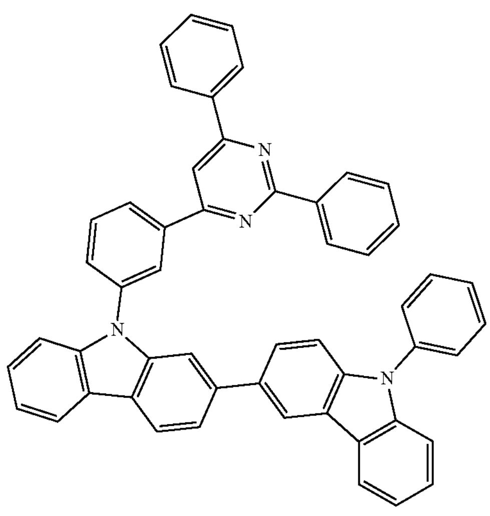
179A
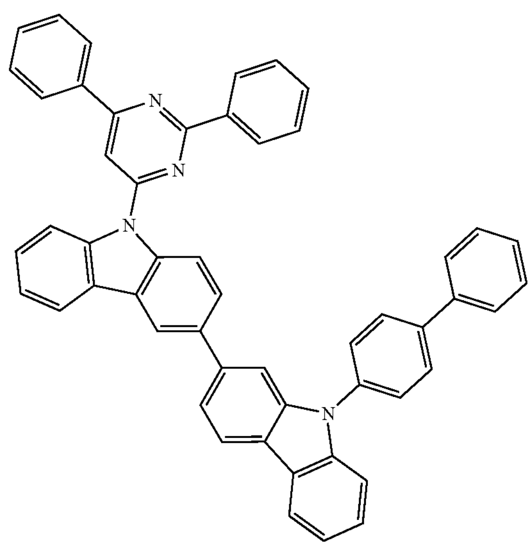

-continued
180A
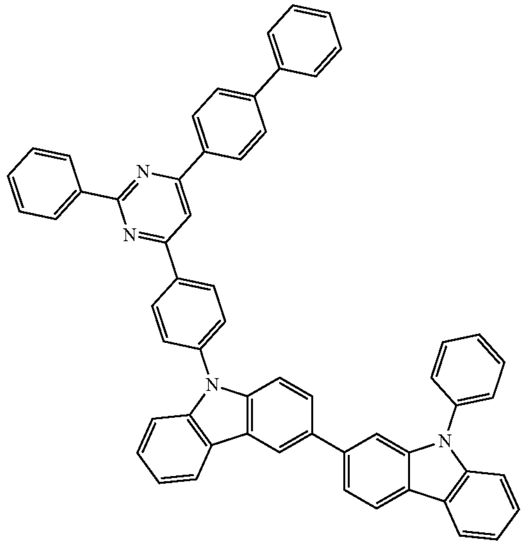
181A
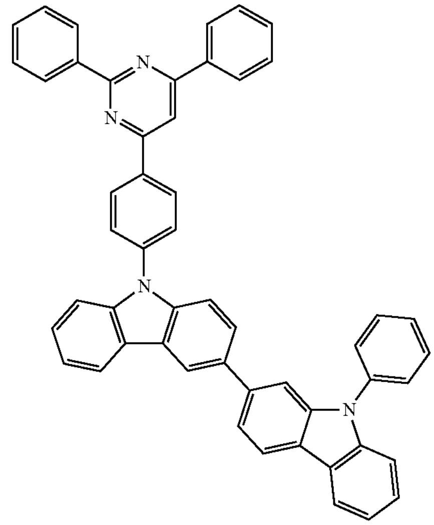
182A
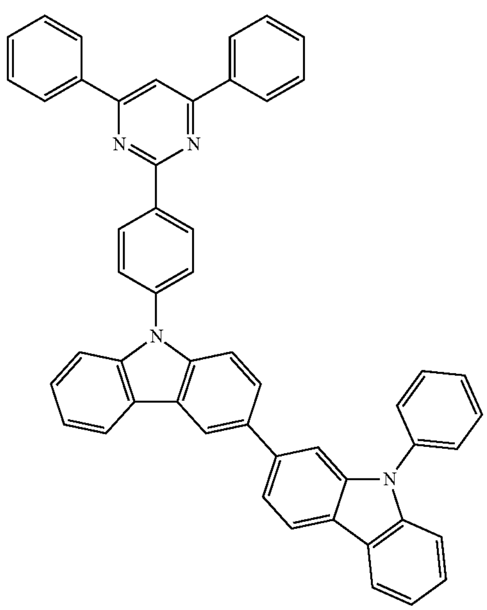
183A
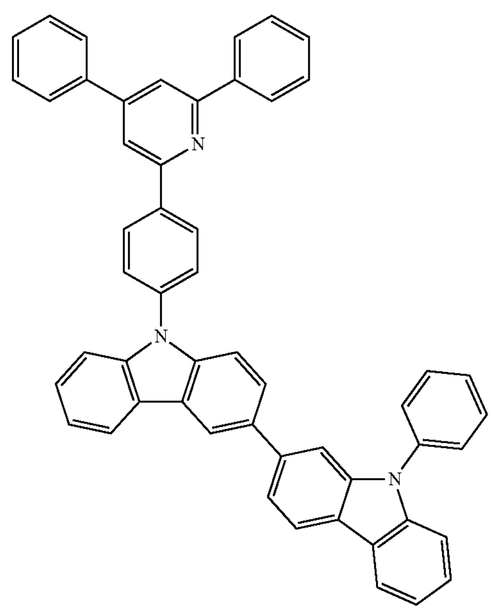

-continued
184A
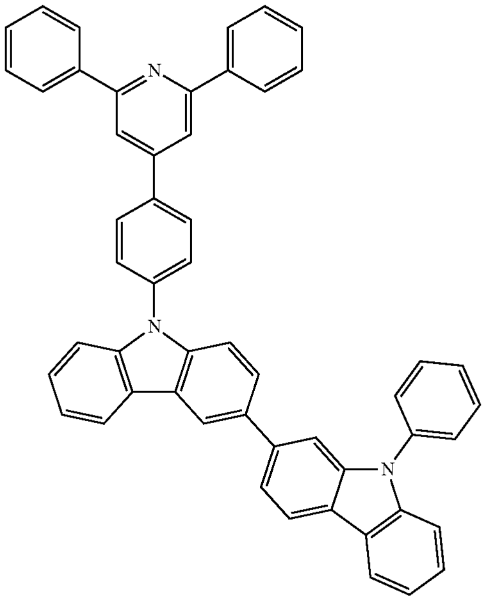
185A
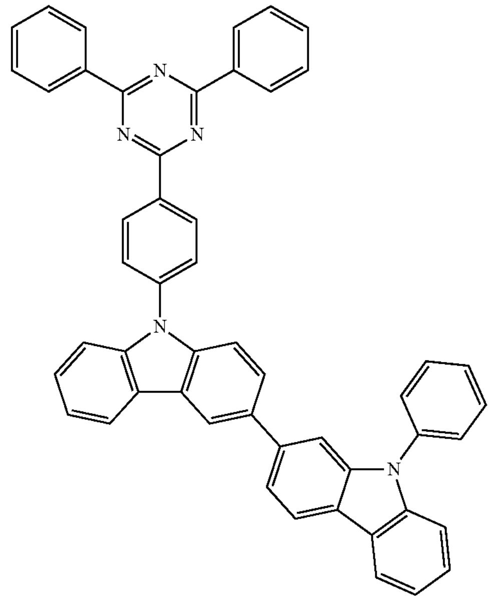
187A
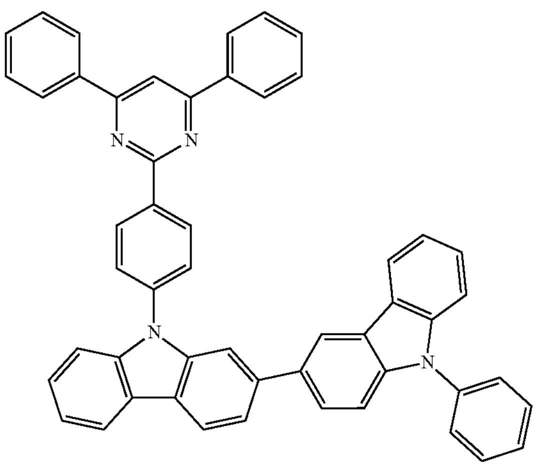
188A
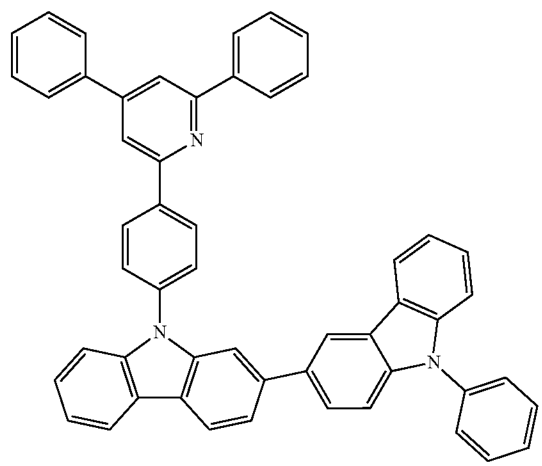
189A
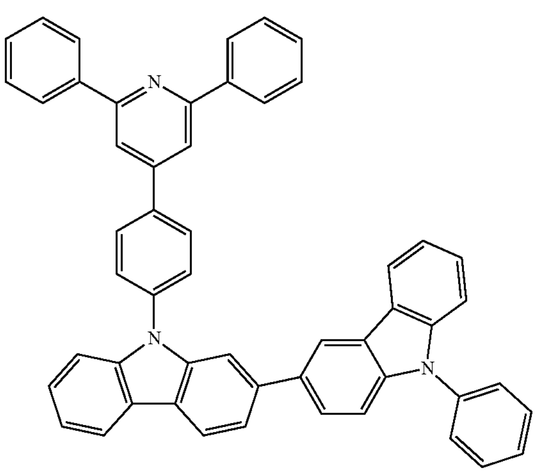
190A
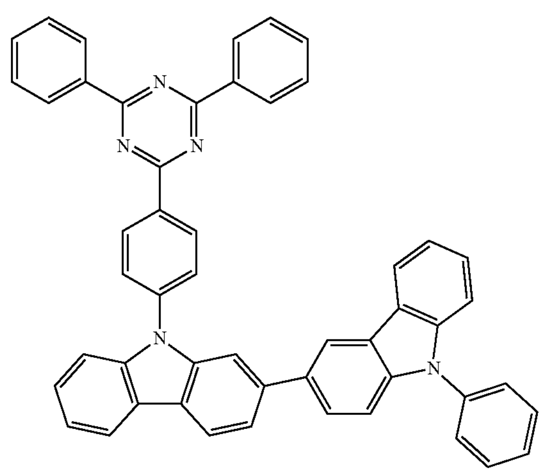

-continued
191A
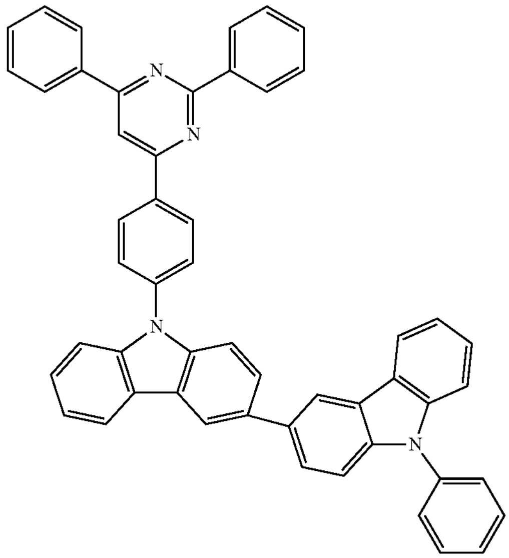
192A
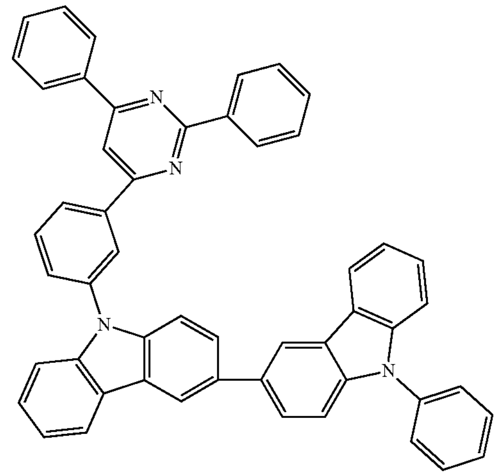
193A
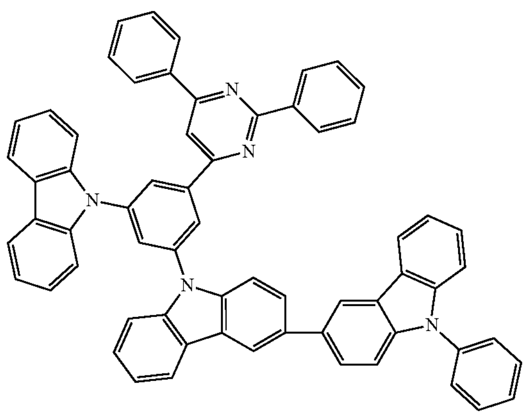
194A
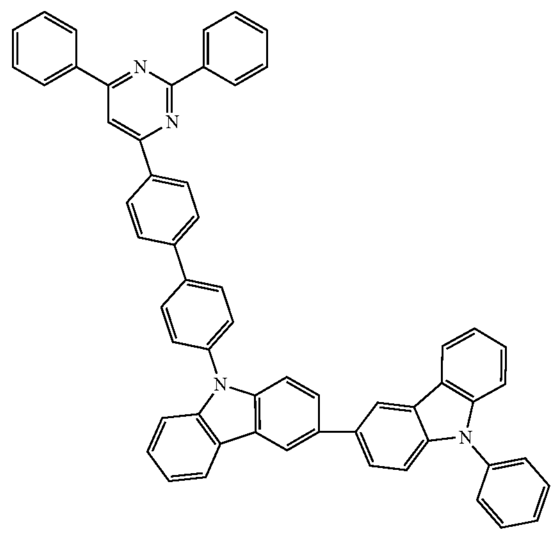
195A
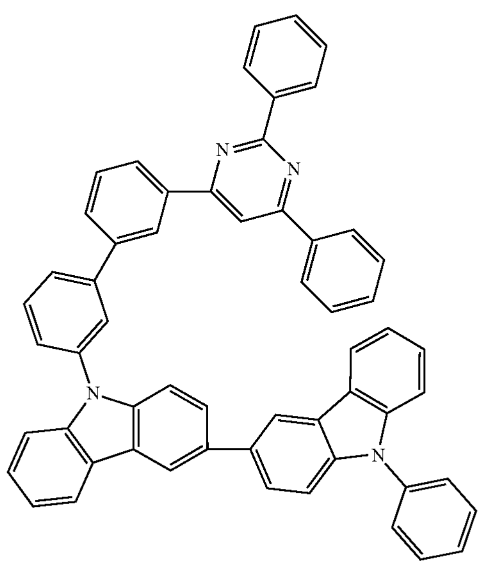
196A
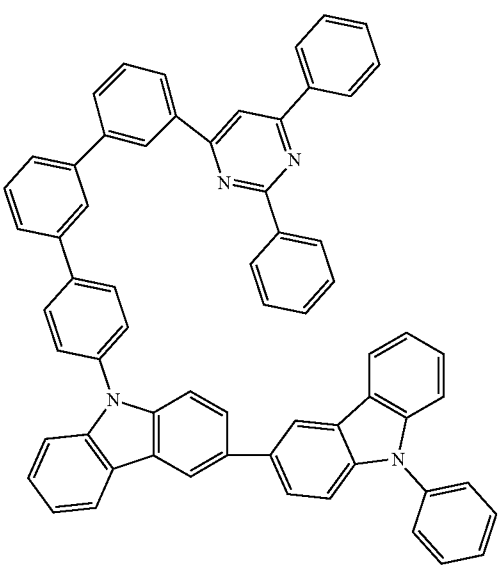

-continued
197A
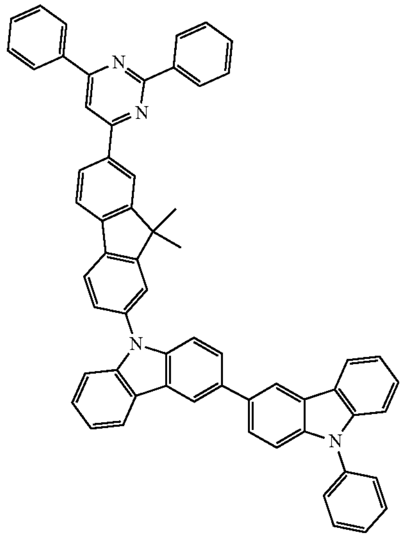
198A
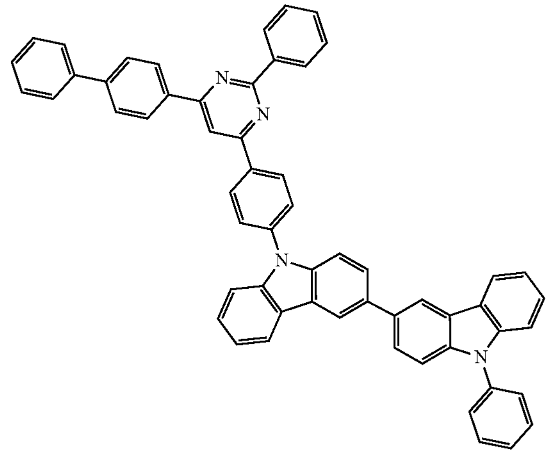
199A
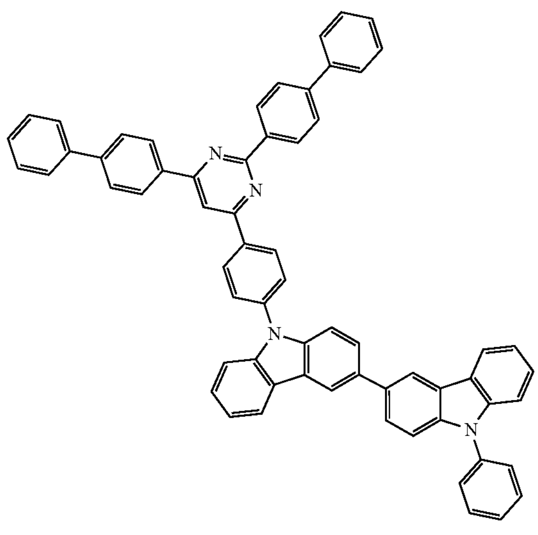
200A
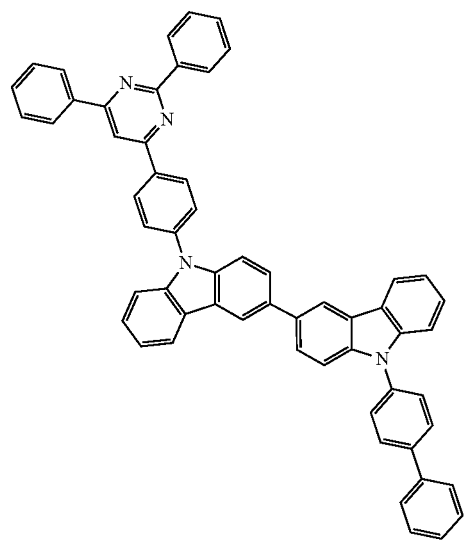
201A
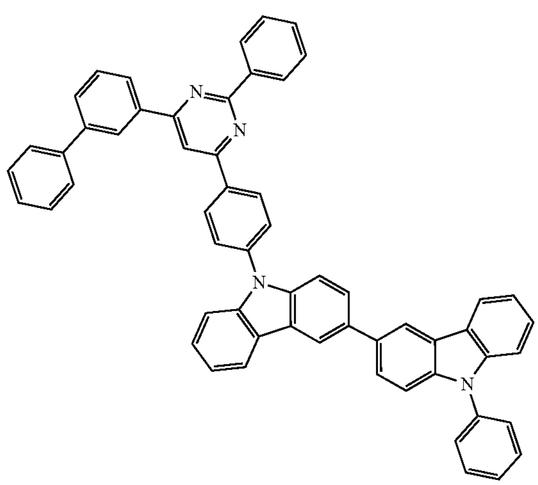

-continued
202A
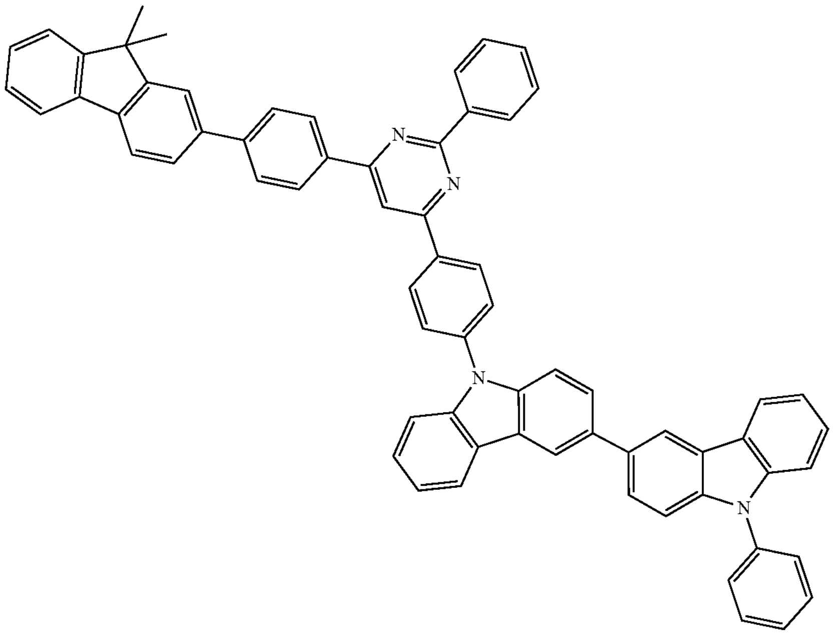
203A
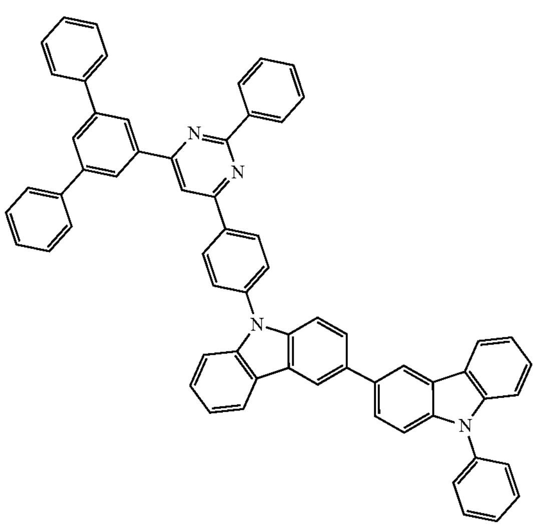
204A
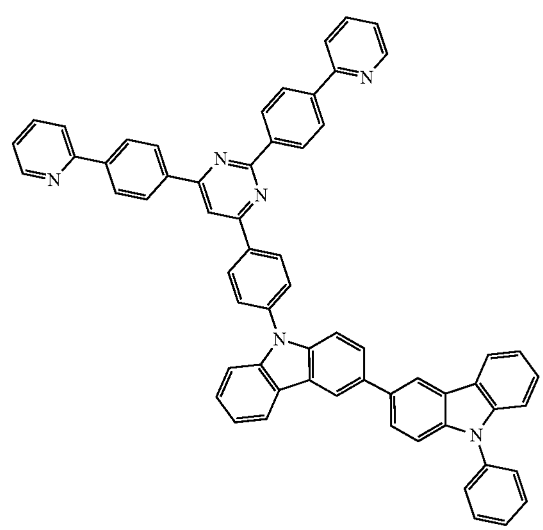

-continued
205A
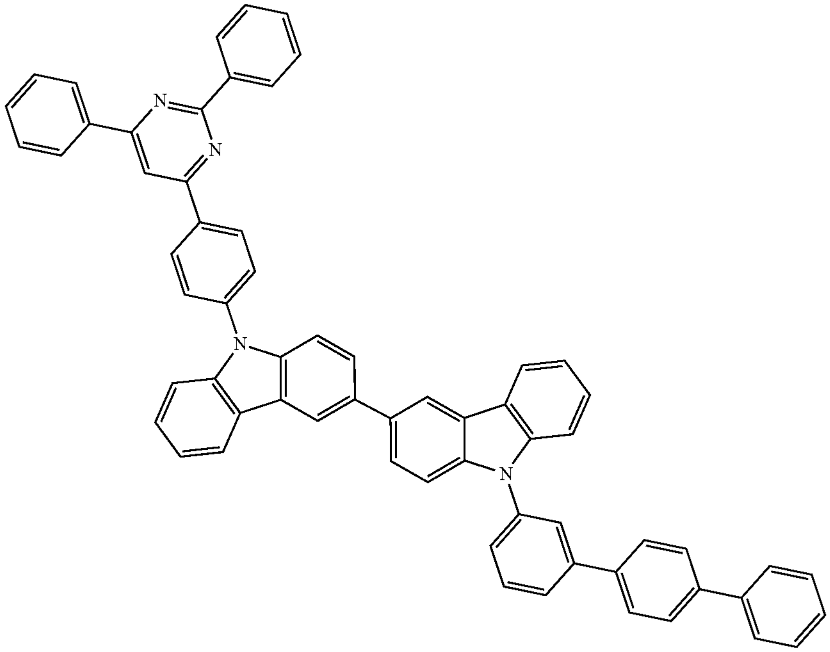
206A
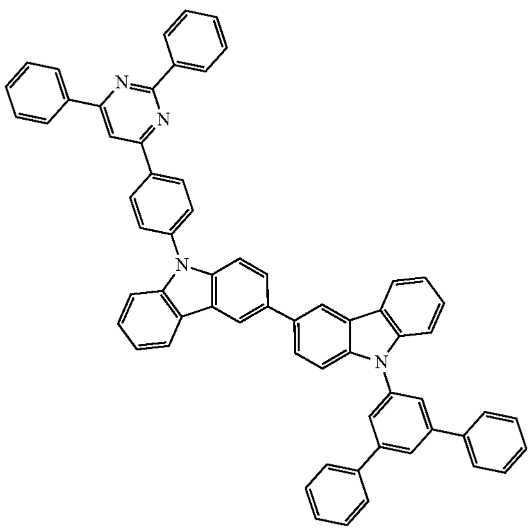
207A
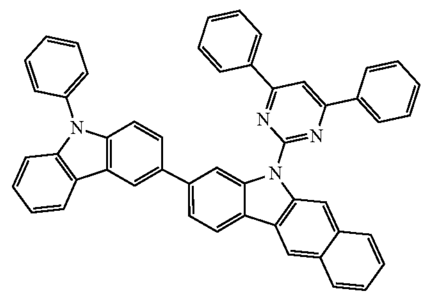
301B
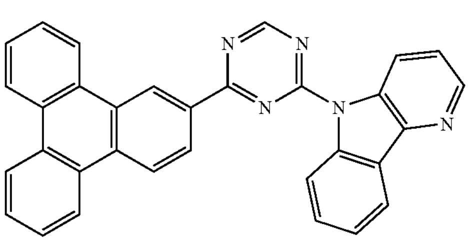
302B
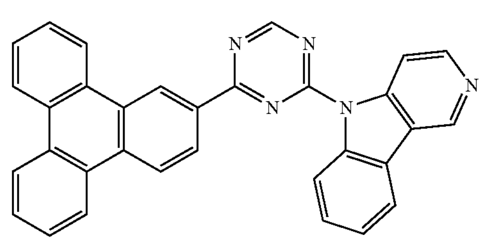

-continued
303B
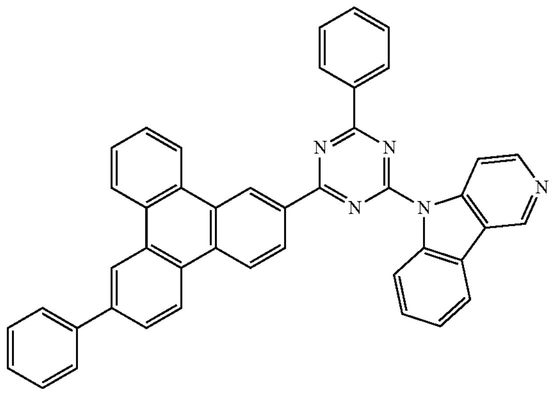
304B
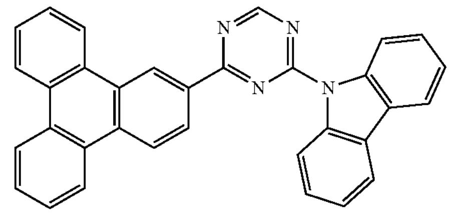
304B
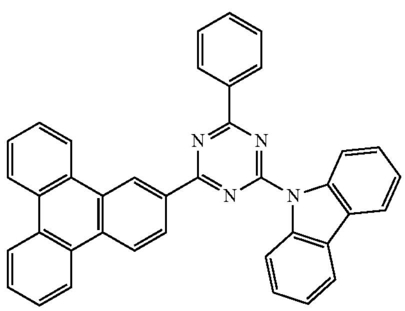
305B
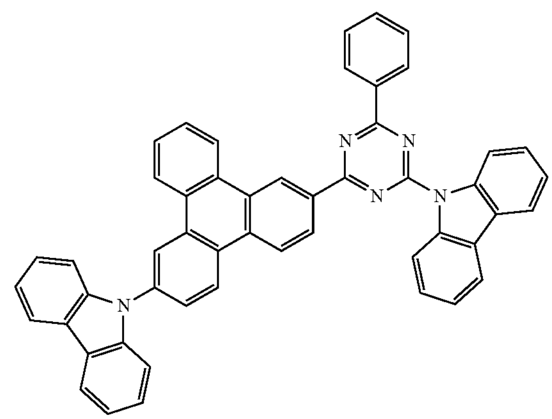
306B
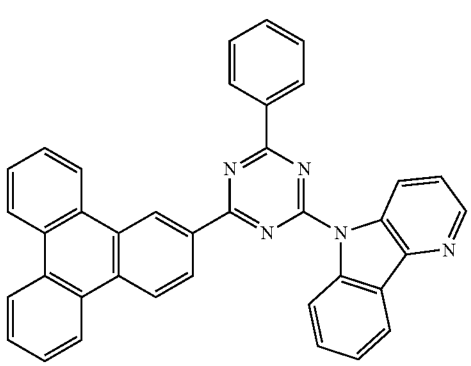

-continued
307B
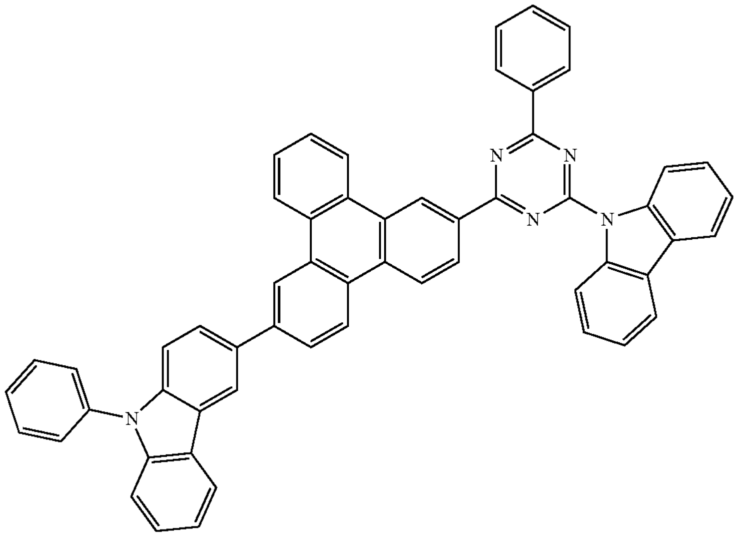
308B
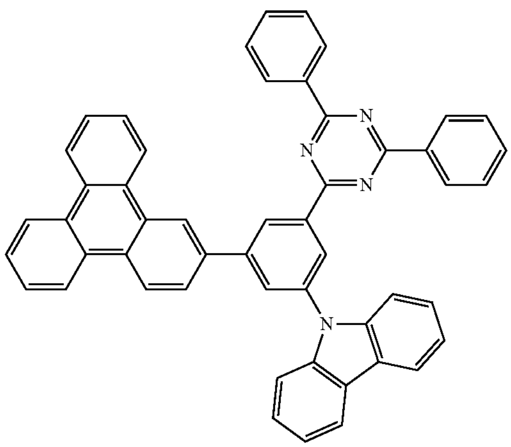
309B
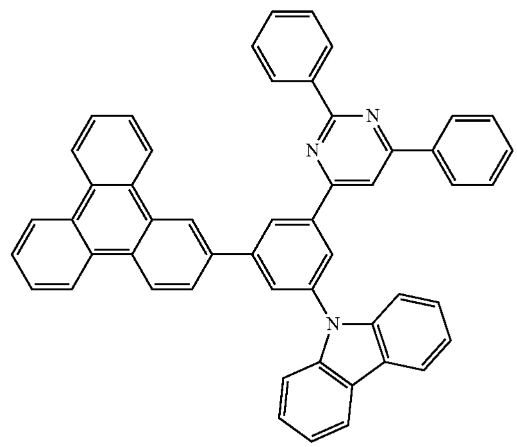
310B
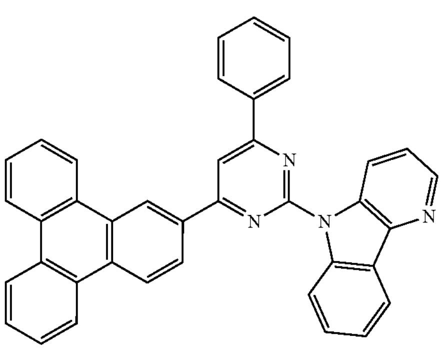
311B
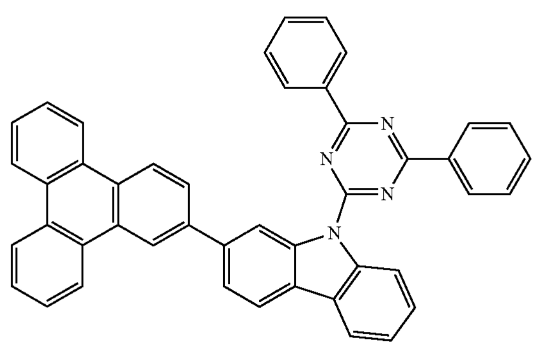

-continued
312B
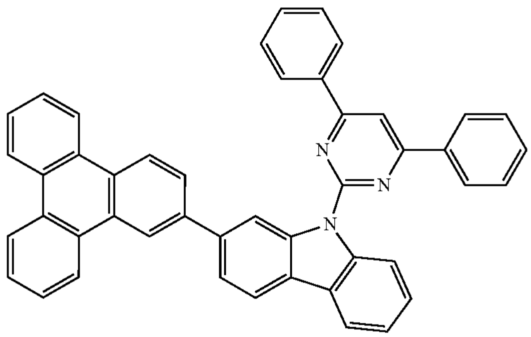
313B
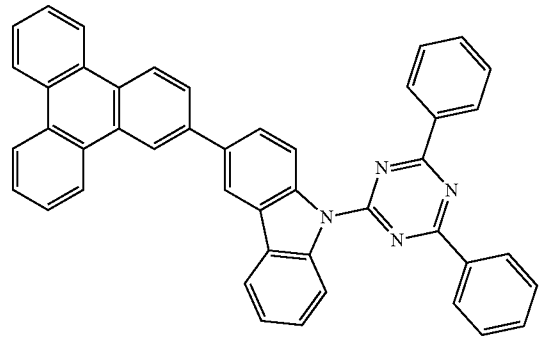
314B
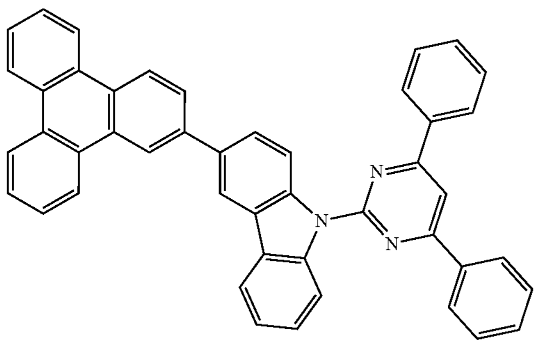
A-1
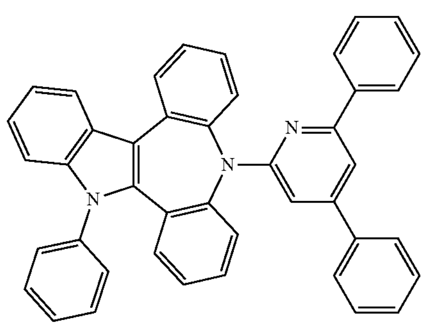
A-2
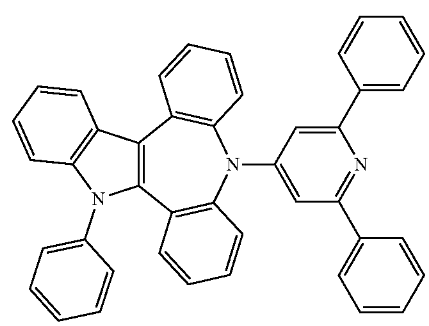
A-3
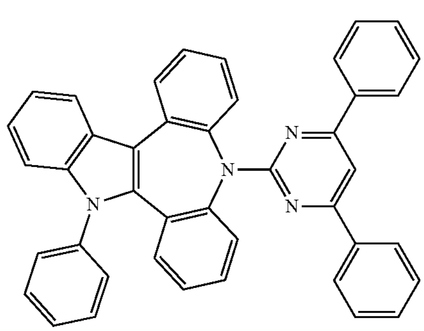
A-4
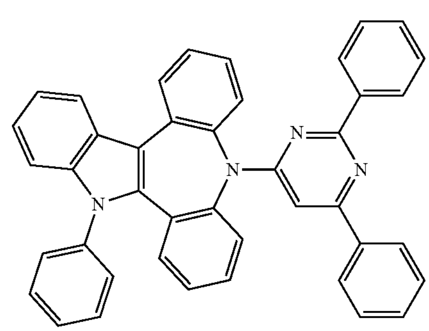

-continued
A-5
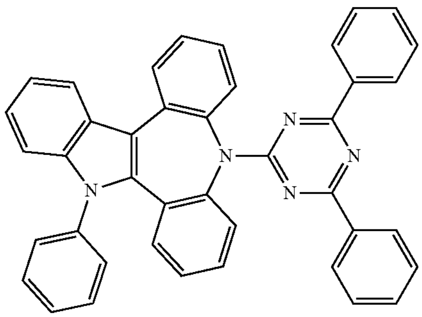
A-6
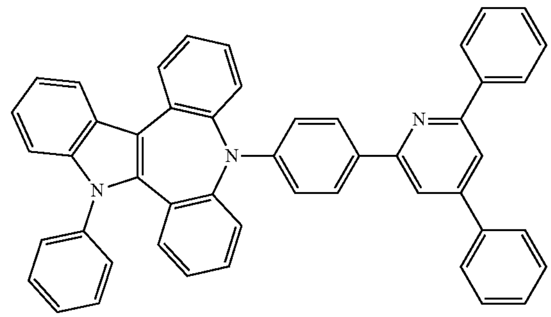
A-7
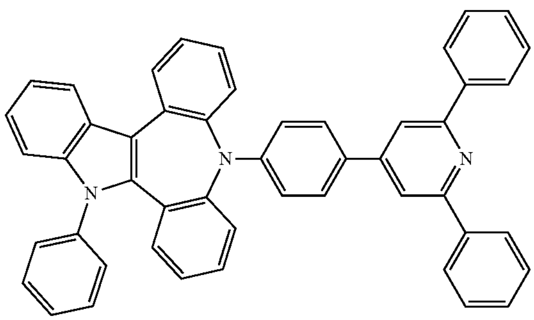
A-8
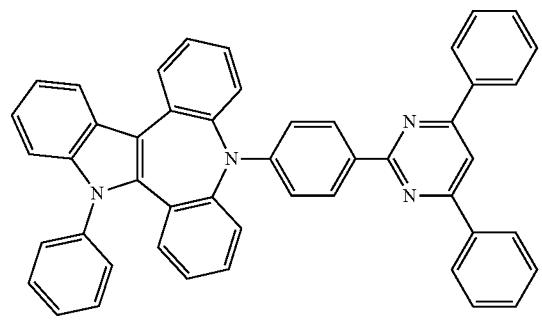
A-9
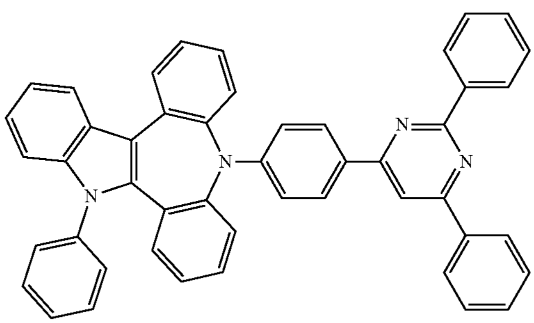
A-10
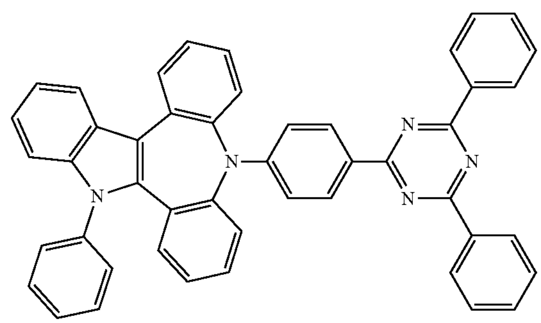
A-11
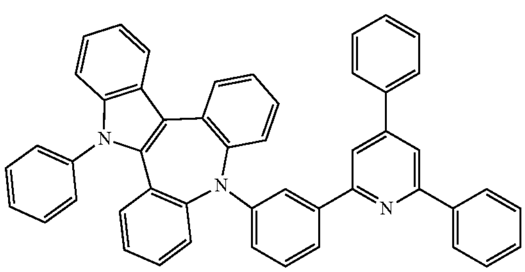
A-12
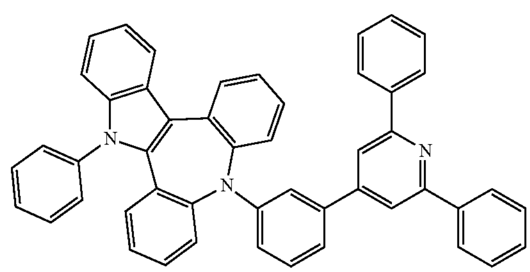
A-13
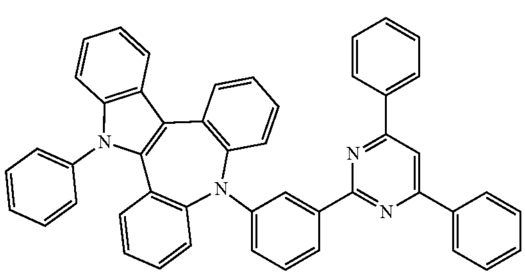
A-14
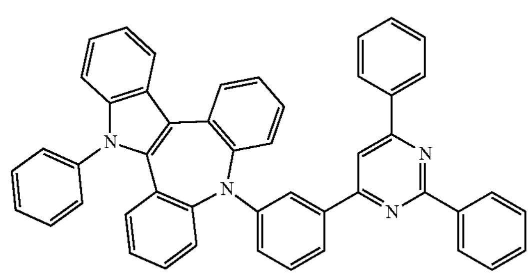

-continued
A-15
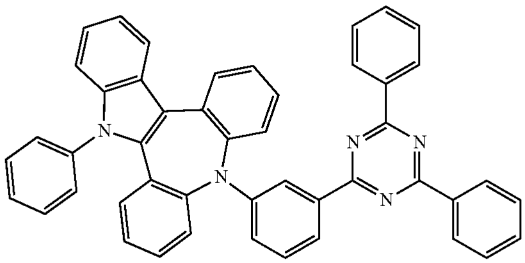
A-16
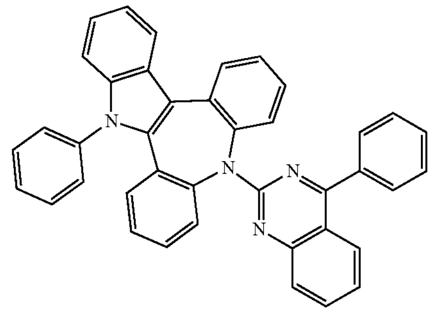
A-17
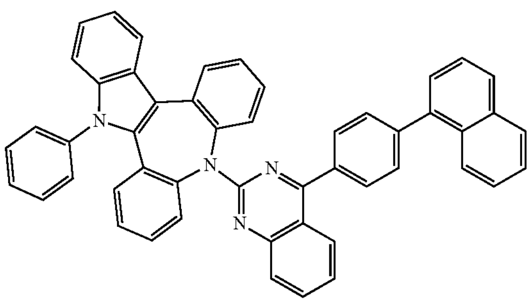
A-18
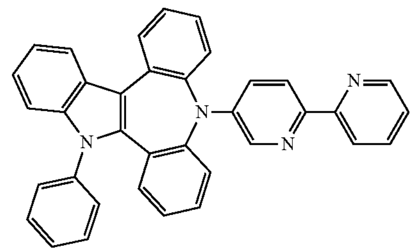
A-19
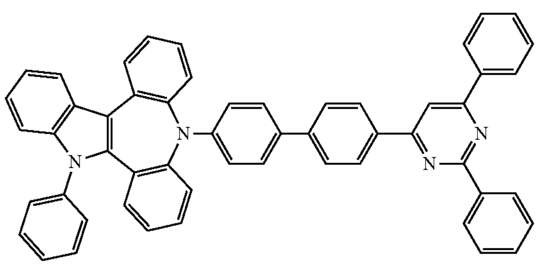
B-1
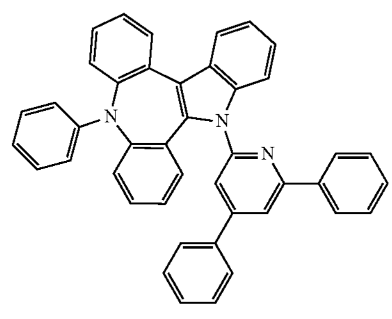
B-2
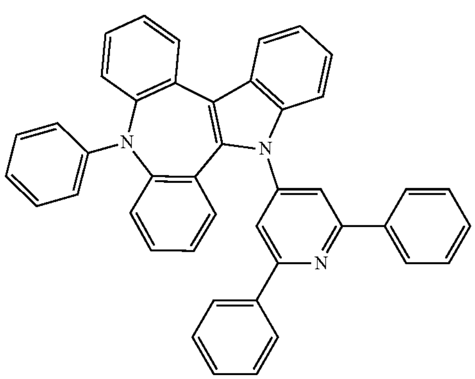
B-3
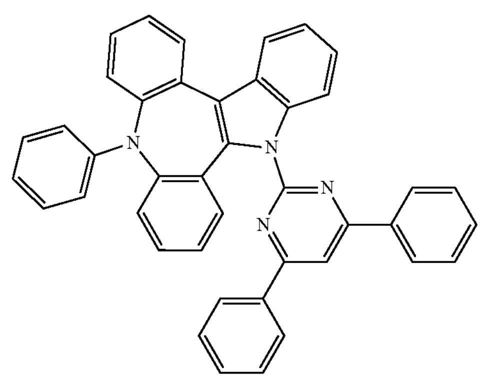

-continued
B-4
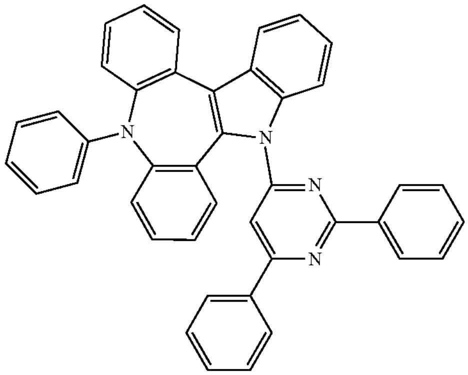
B-5
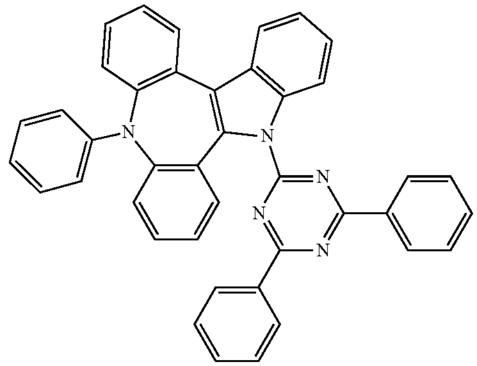
B-6
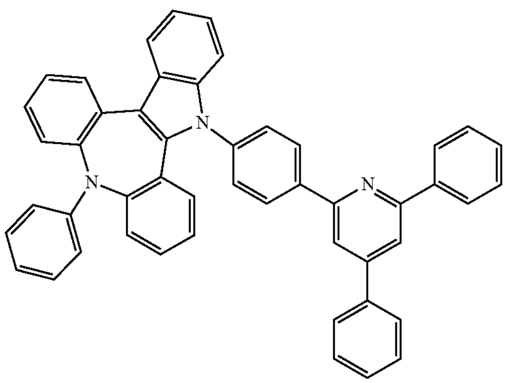
B-7
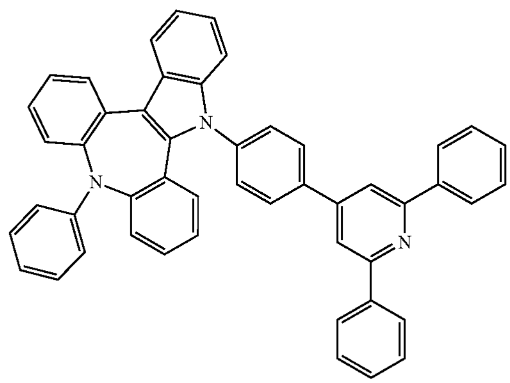
B-8
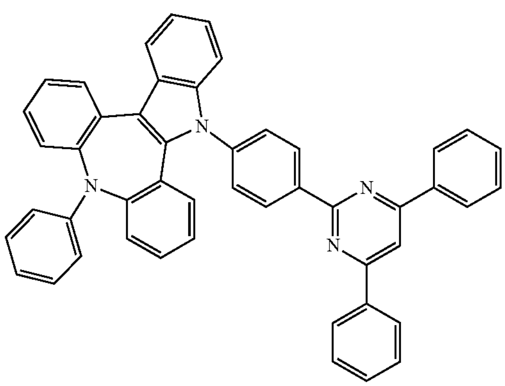
B-9
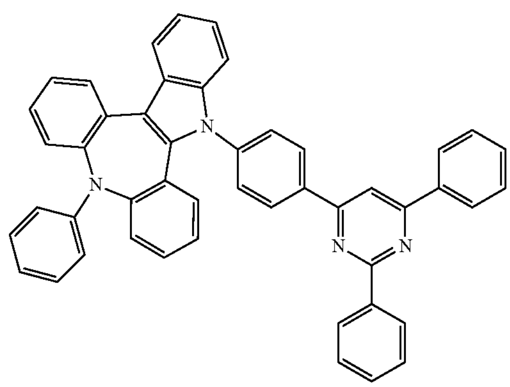
B-10
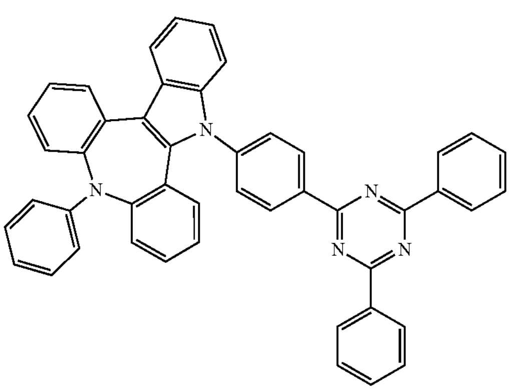
B-11
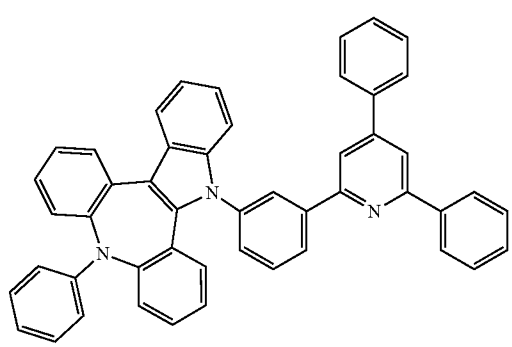

-continued
B-12
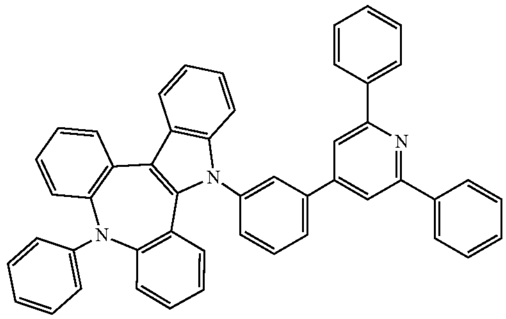
B-13
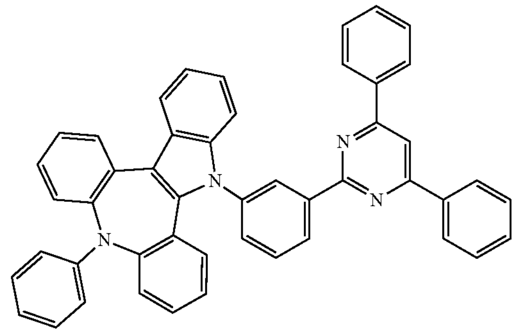
B-14
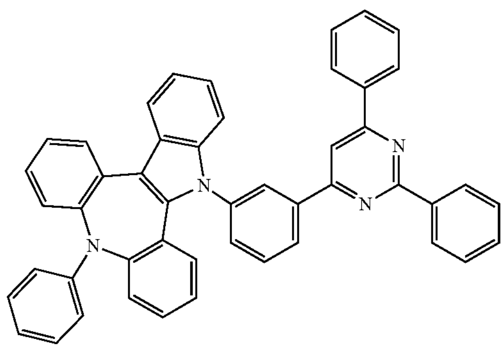
B-15
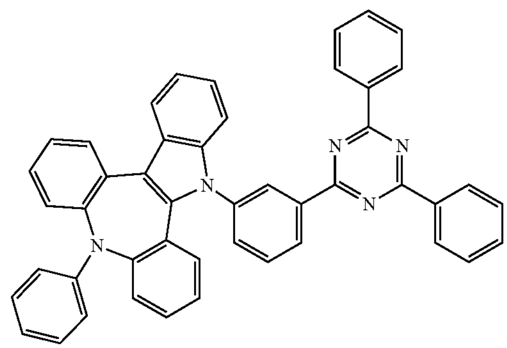
B-16
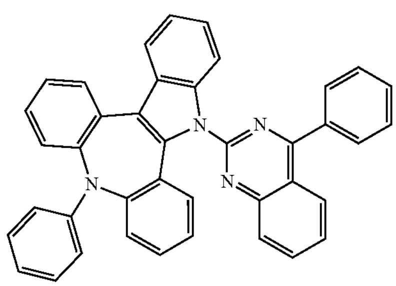
B-17
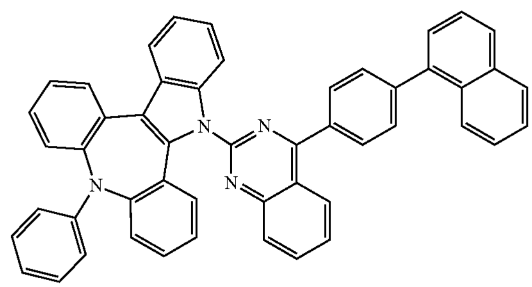
B-18
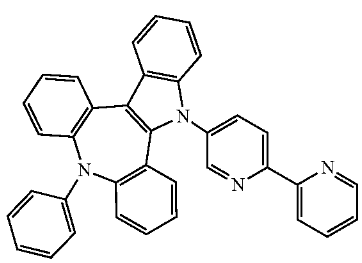
B-19
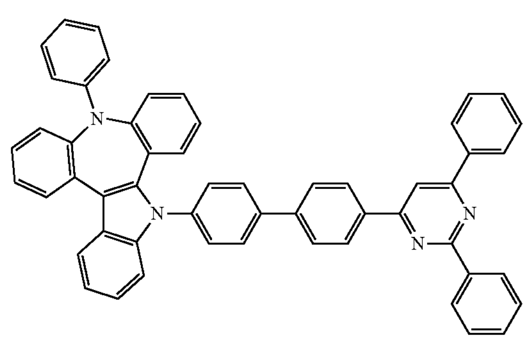

-continued
C-1
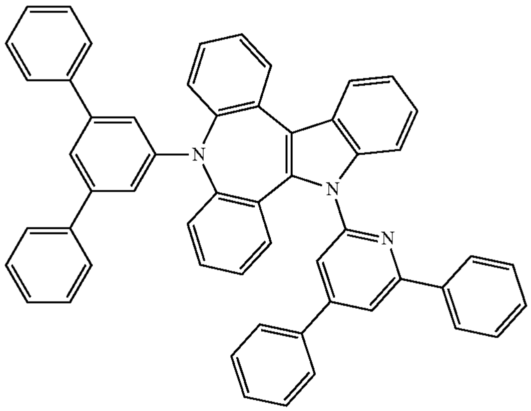
C-2
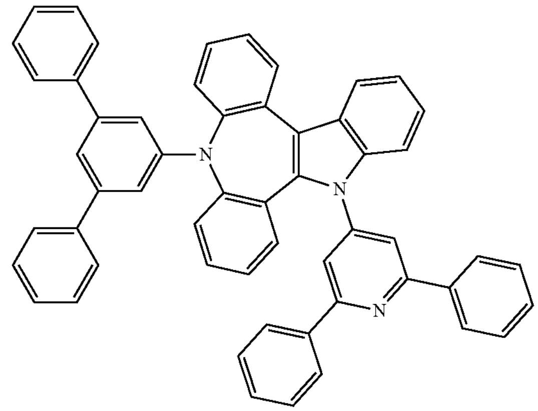
C-3
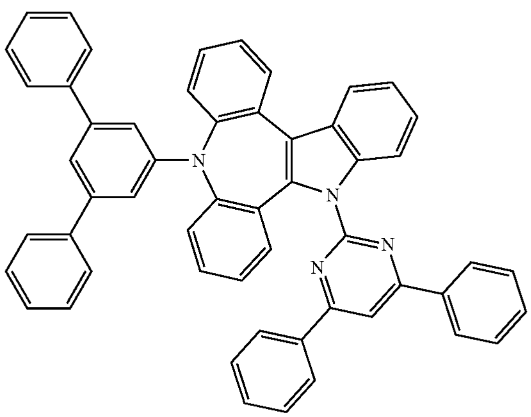
C-4
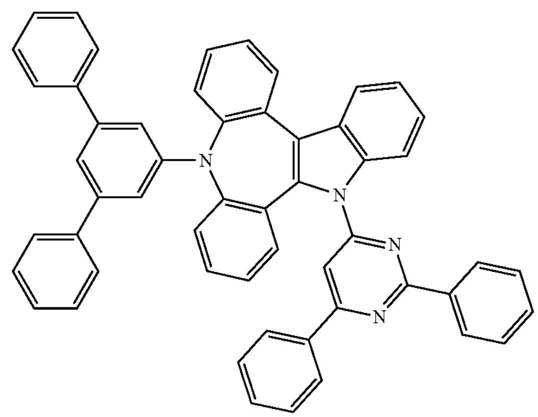
C-5
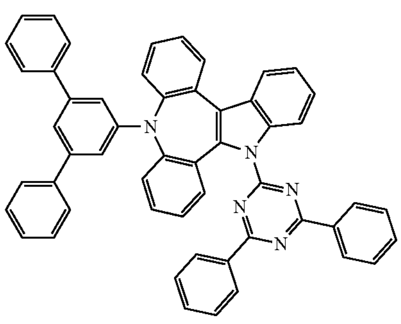
C-6
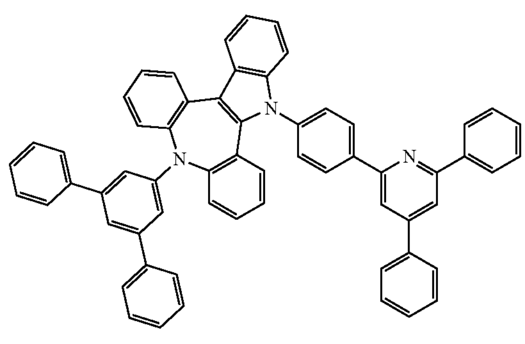
C-7
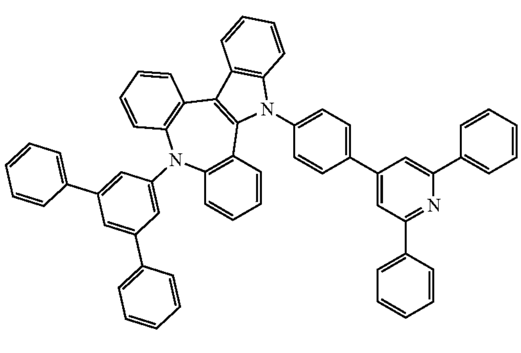
C-8
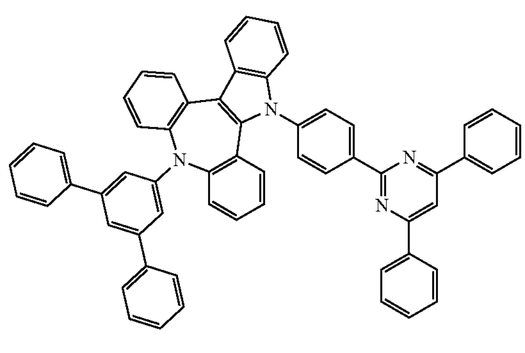

-continued
C-9
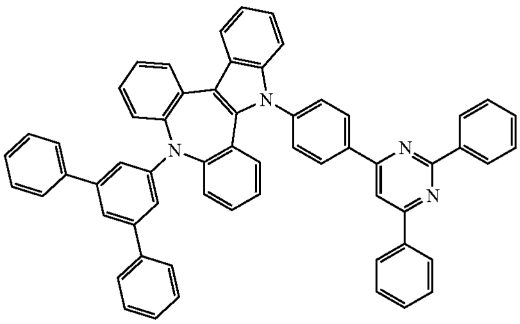
C-10
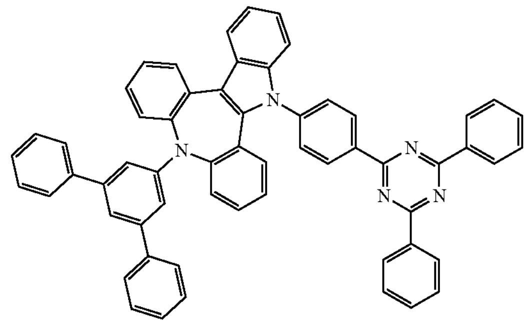
C-11
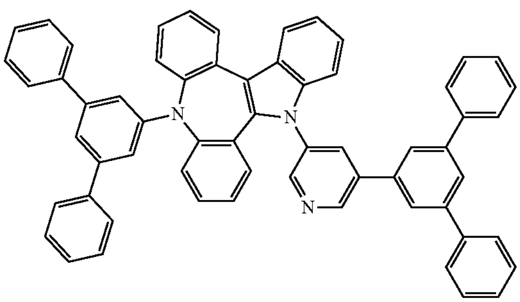
C-12
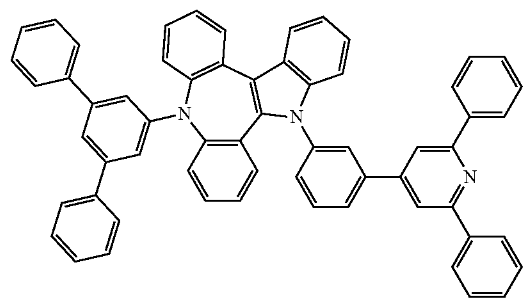
C-13
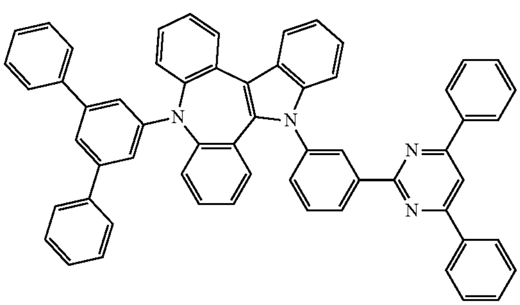
C-14
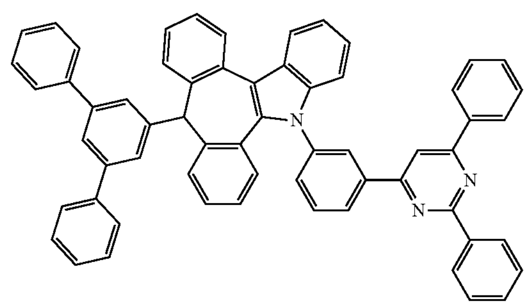
C-15
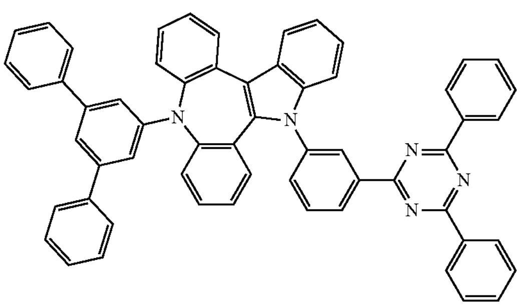
C-16
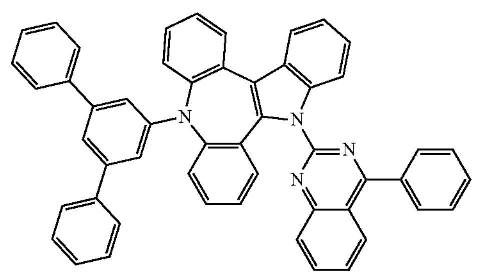
C-17
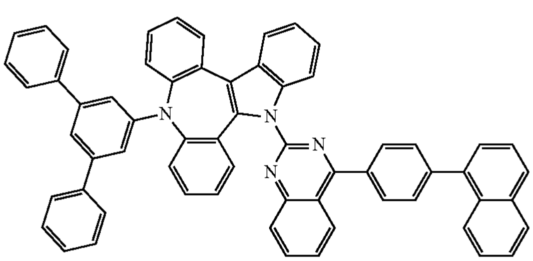
C-18
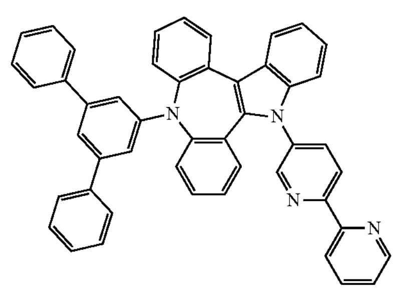

-continued
C-19
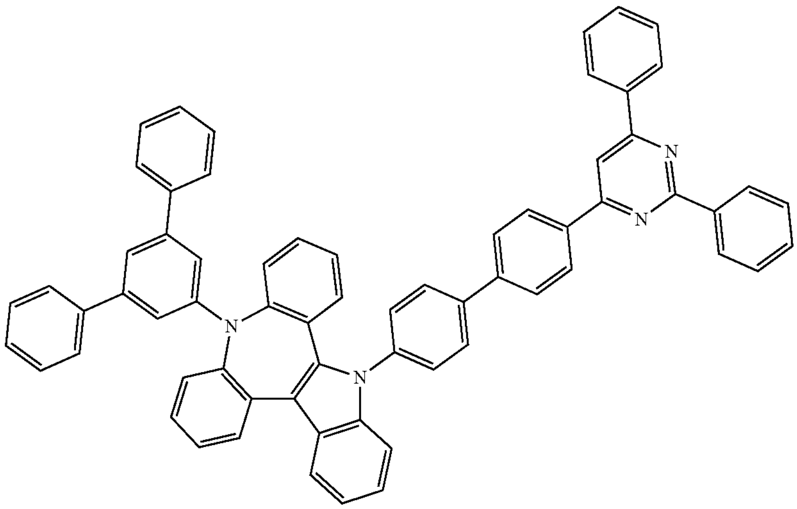
D-1
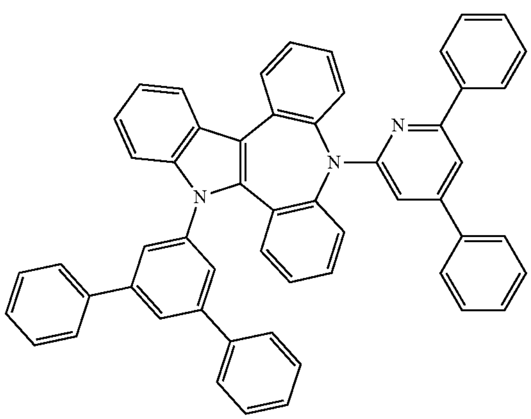
D-2
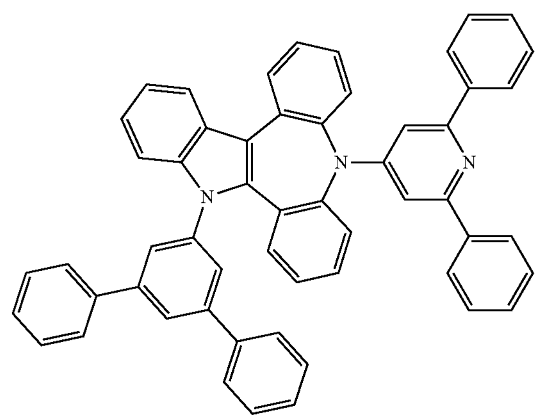
D-3
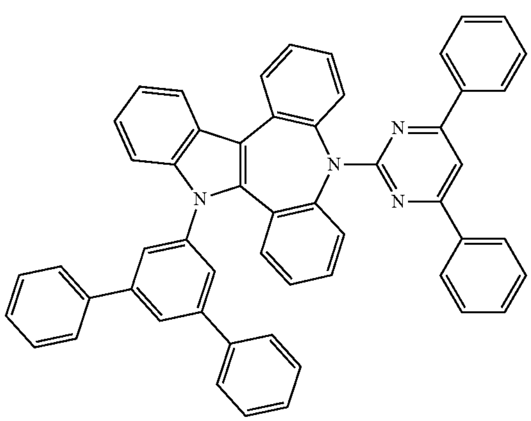
D-4
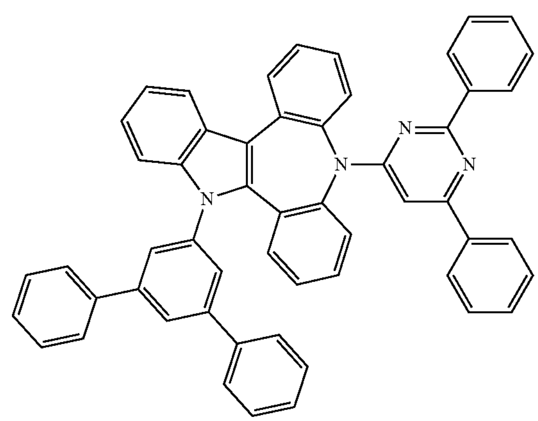

-continued
D-5
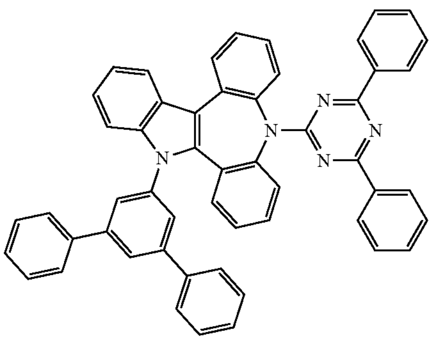
D-6
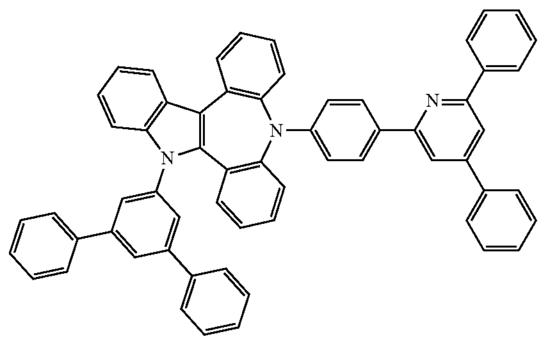
D-7
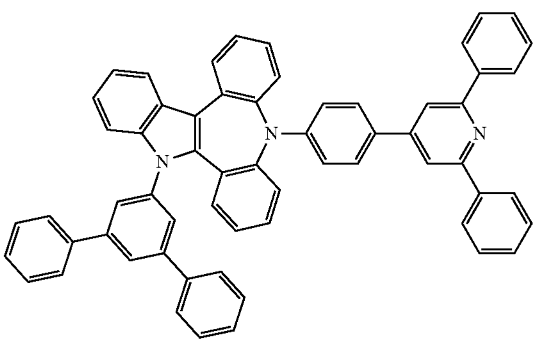
D-8
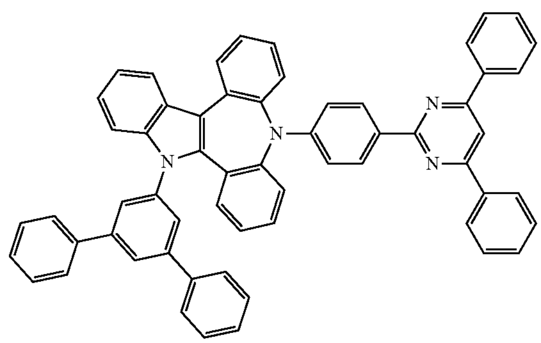
D-9
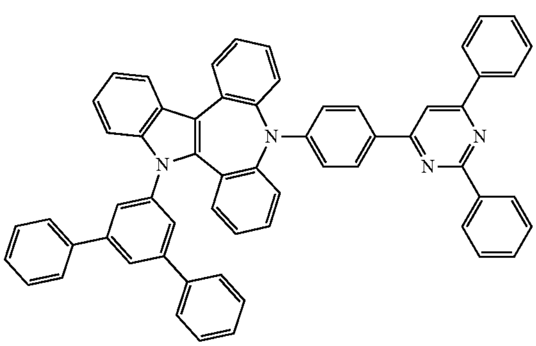
D-10
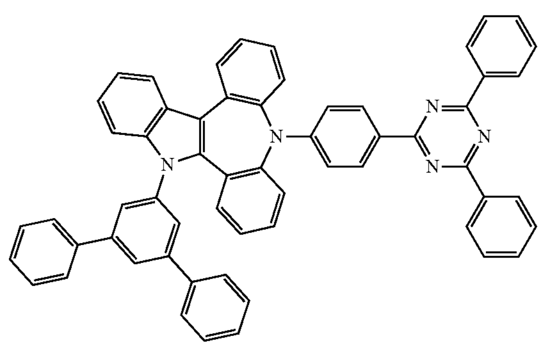
D-11
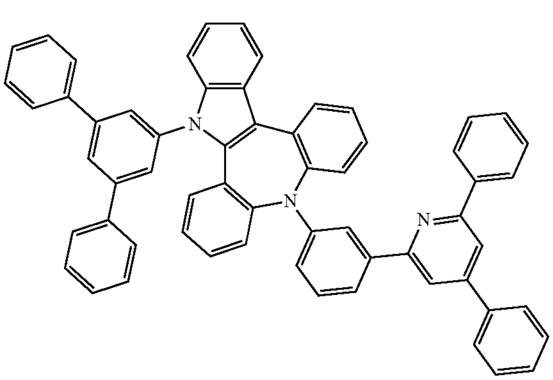
D-12
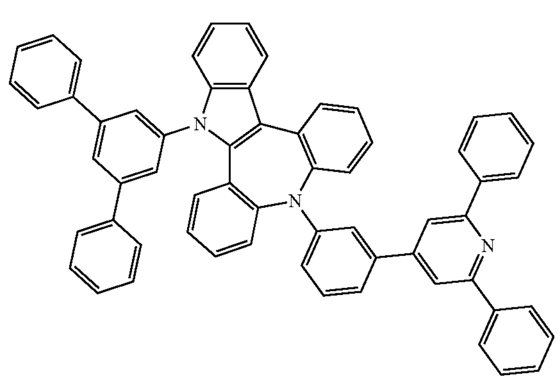

-continued
D-13
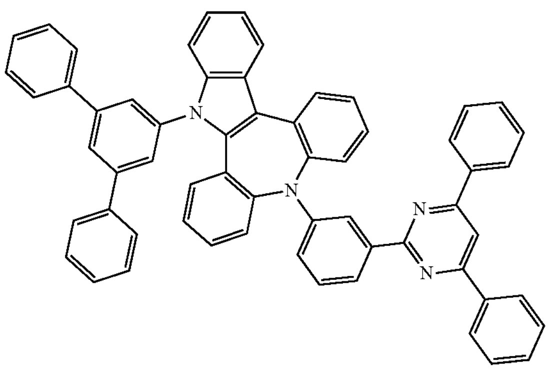
D-14
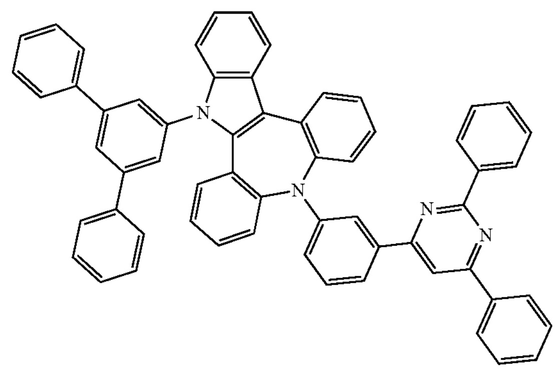
D-15
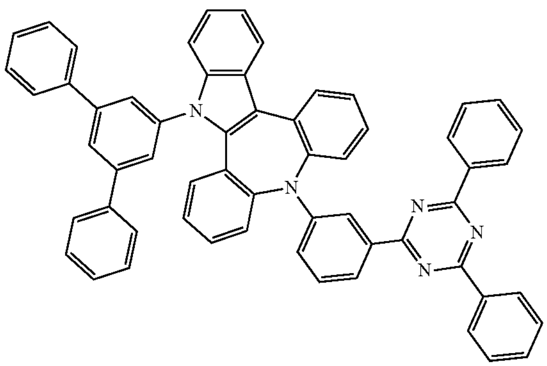
D-16
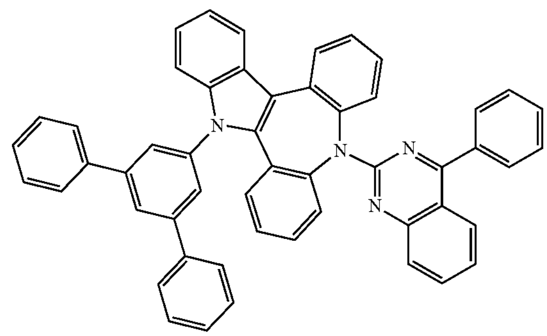
D-17
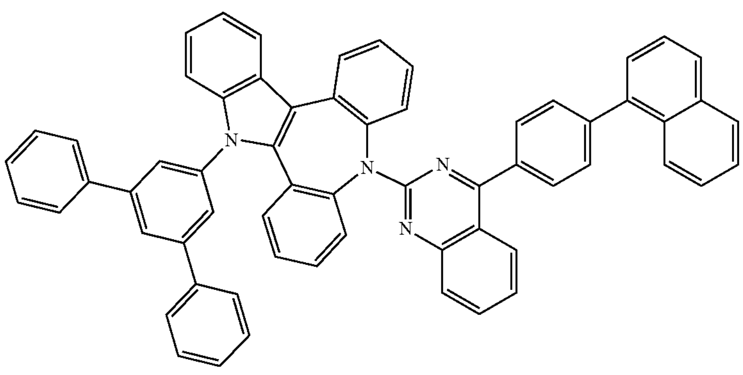
D-18
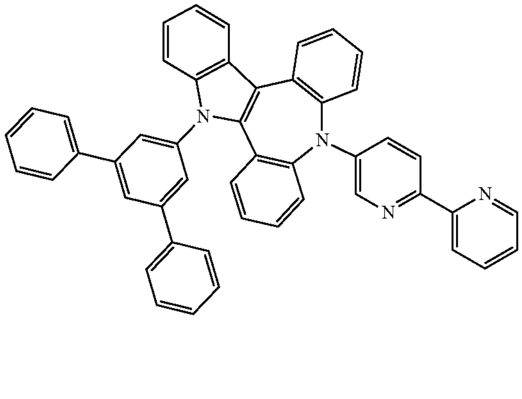

-continued
D-19
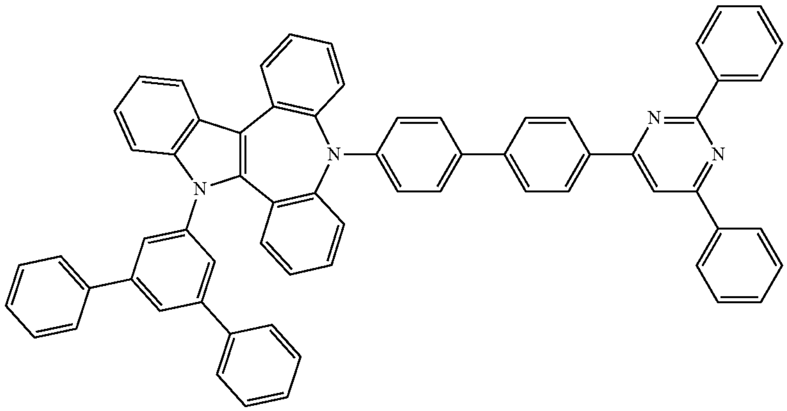
E-1
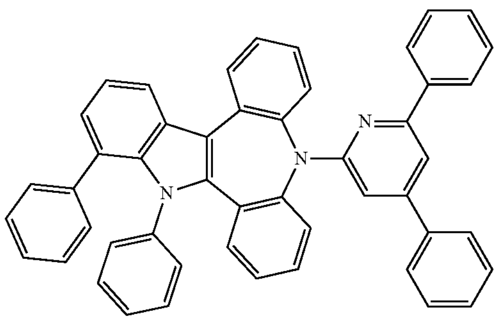
E-2
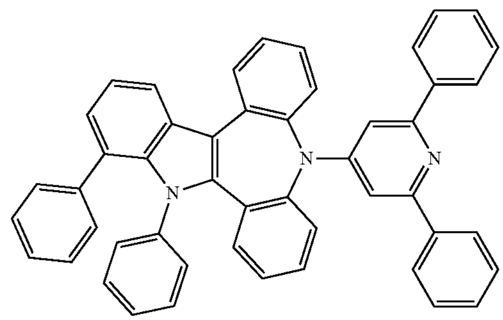
E-3
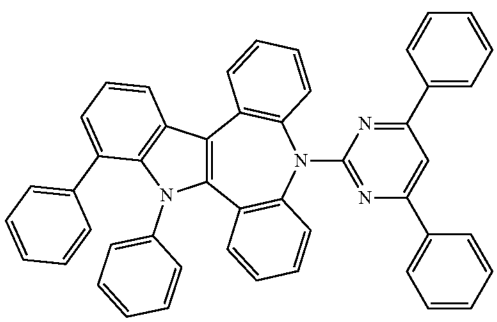
E-4
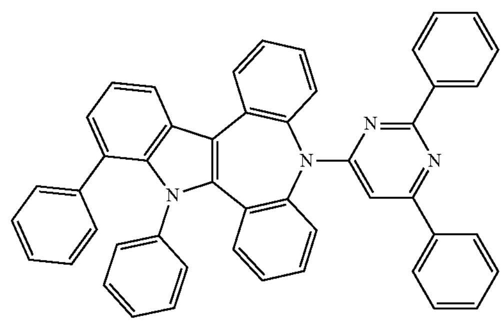
E-5
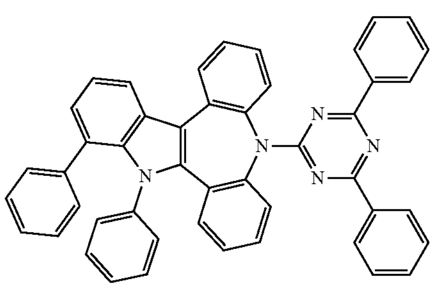
E-6
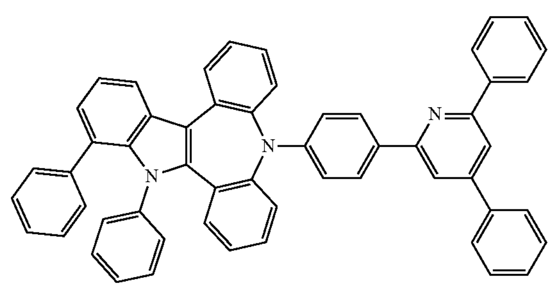
E-7
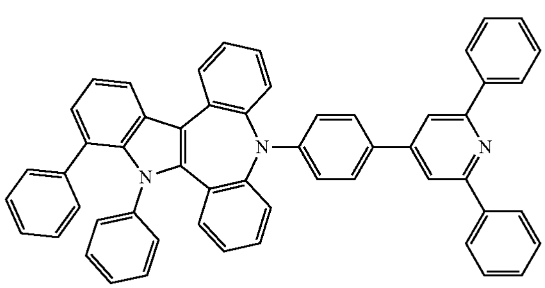
E-8
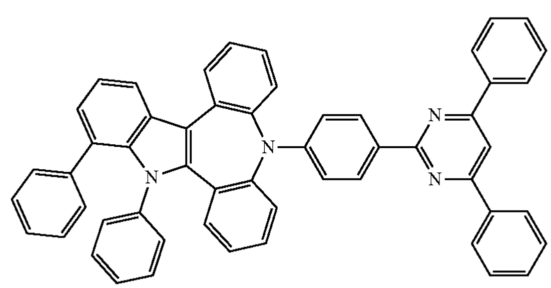

-continued
E-9
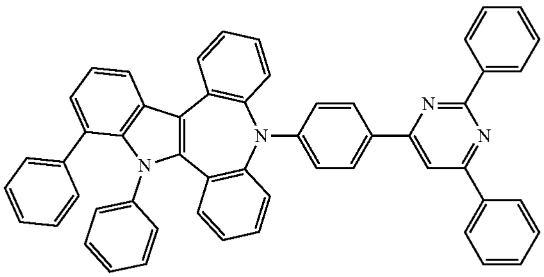
E-10
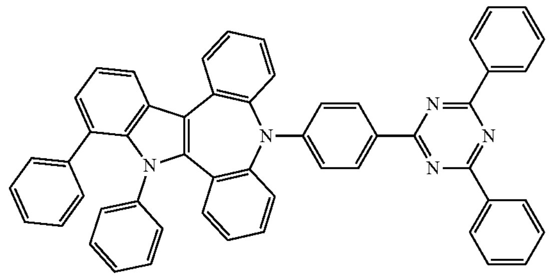
E-11
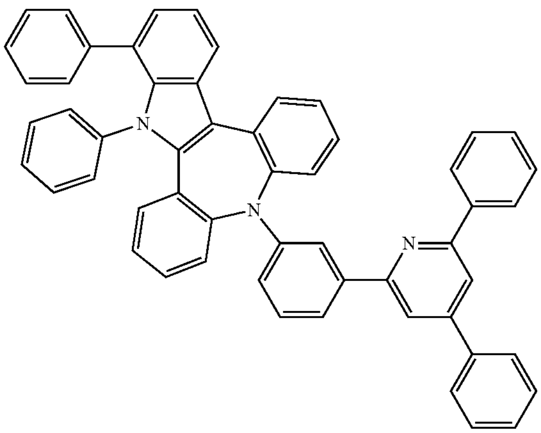
E-12
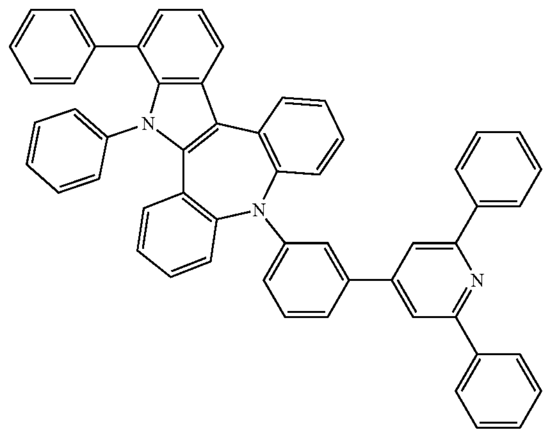
E-13
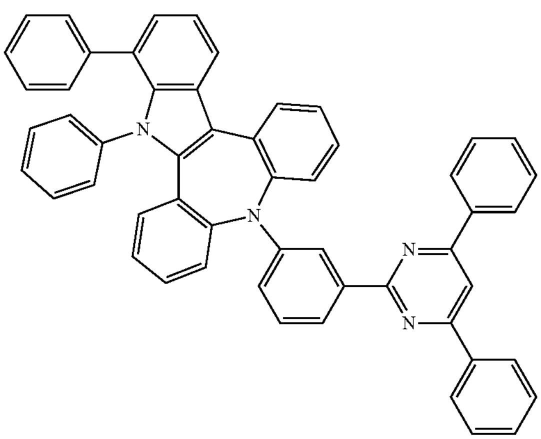
E-14
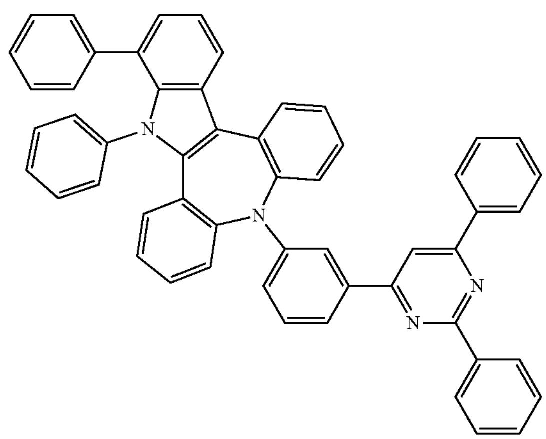
E-15
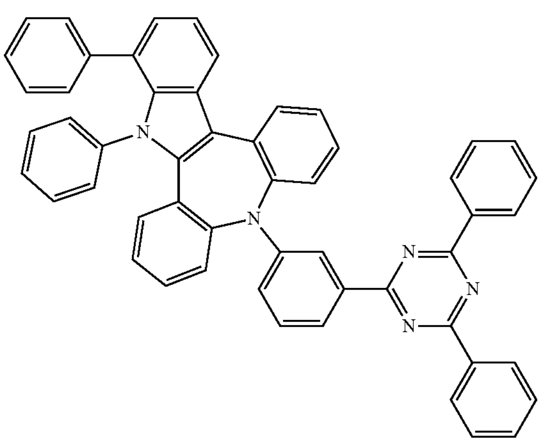
E-16
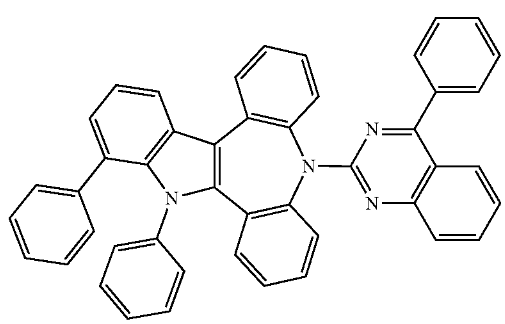

-continued
E-17
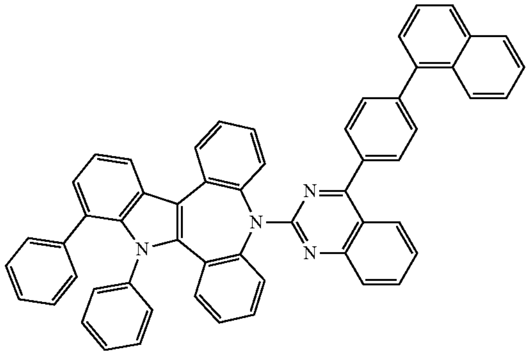
E-18
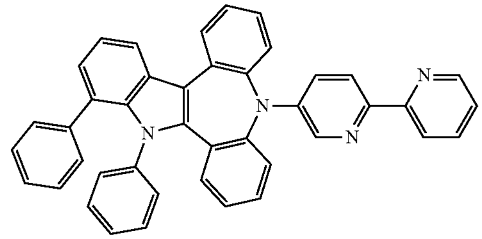
E-19
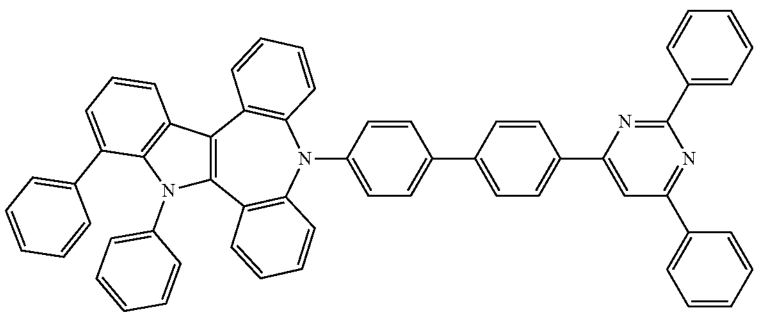
F-1
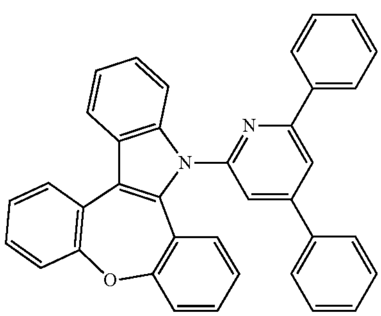
F-2
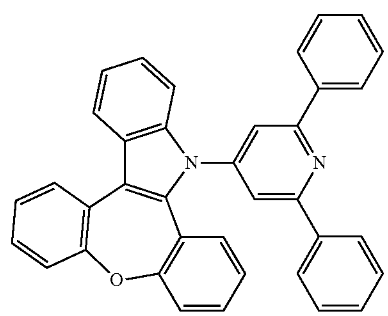
F-3
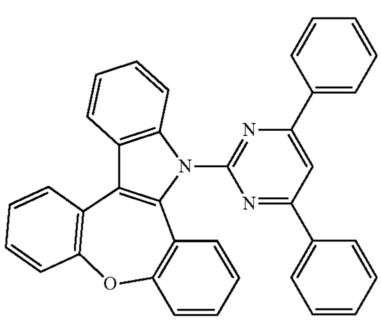
F-4
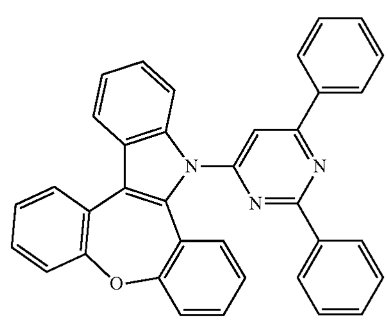

-continued
F-5
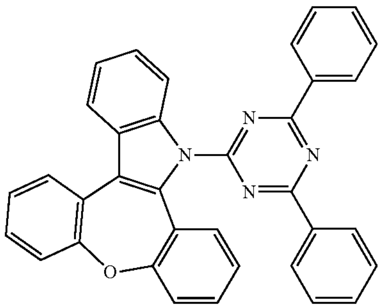
F-6
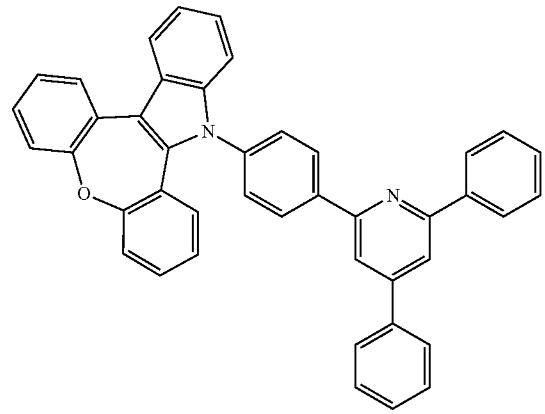
F-7
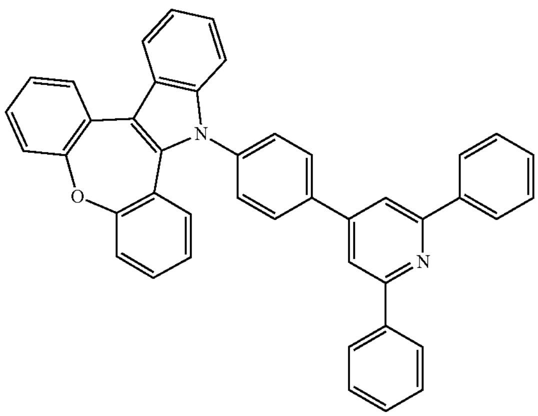
F-8
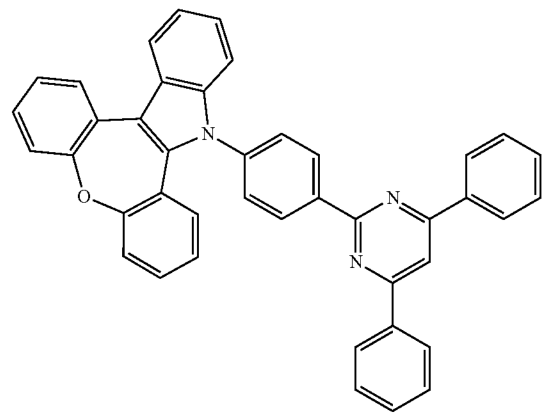
F-9
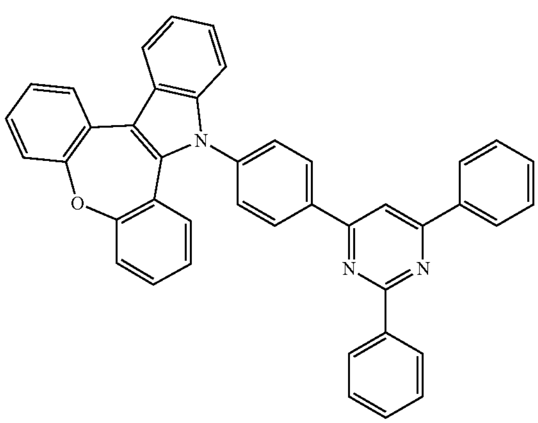
F-10
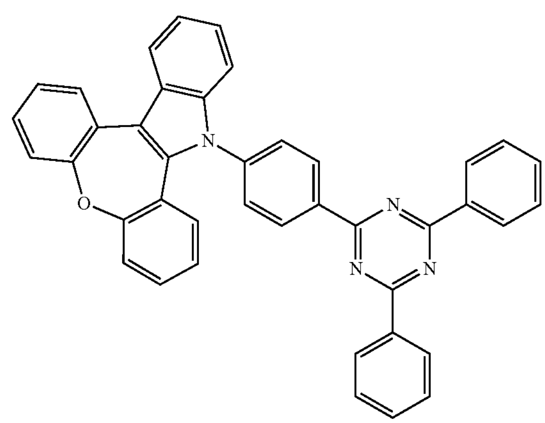

-continued
F-11
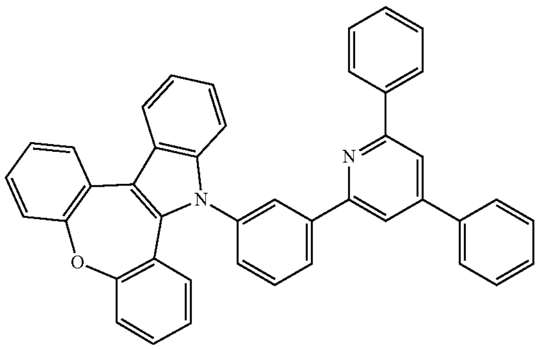
F-12
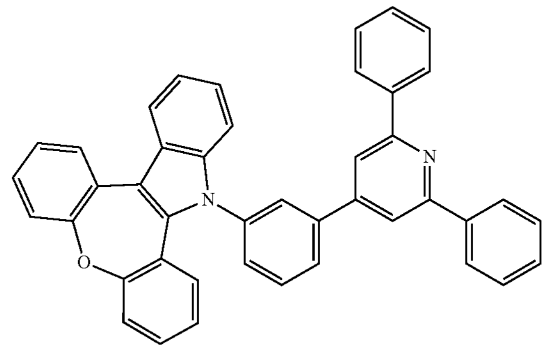
F-13
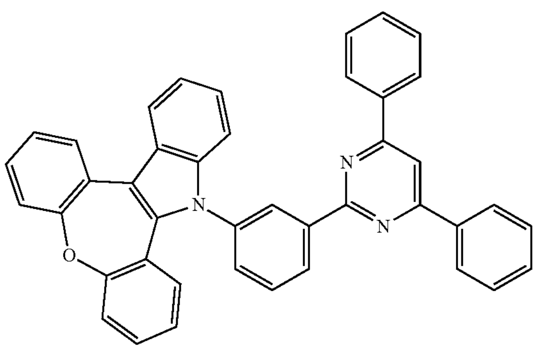
F-14
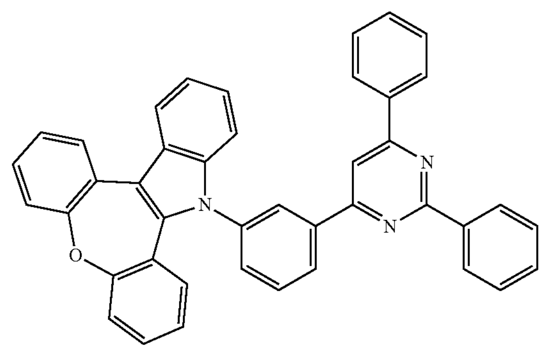
F-15
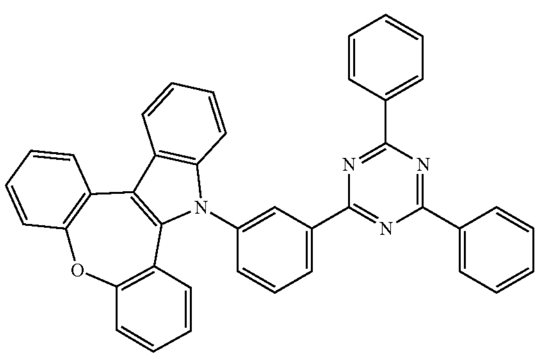
F-16
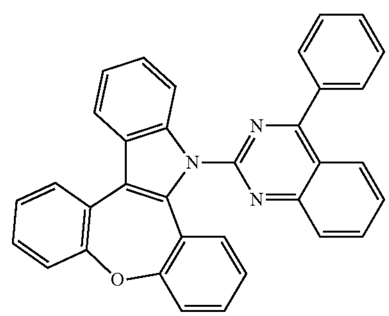
F-17
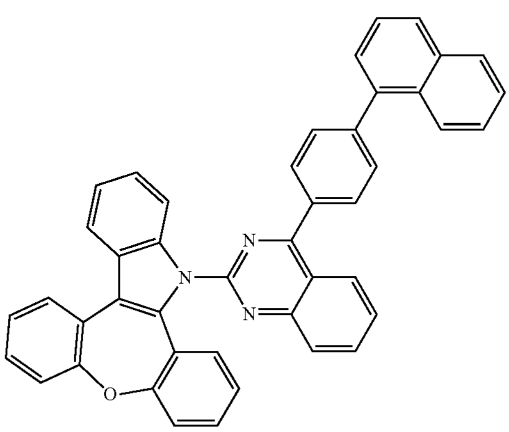
F-18
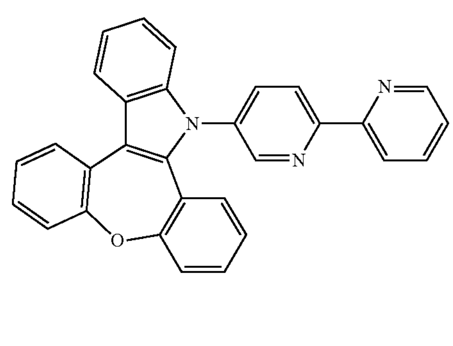

-continued
F-19
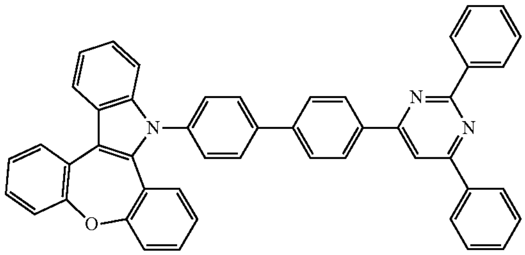
G-1
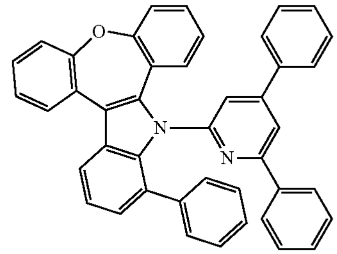
G-2
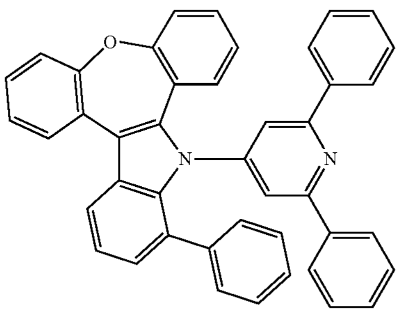
G-3
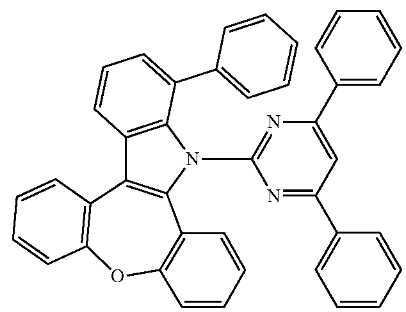
G-4
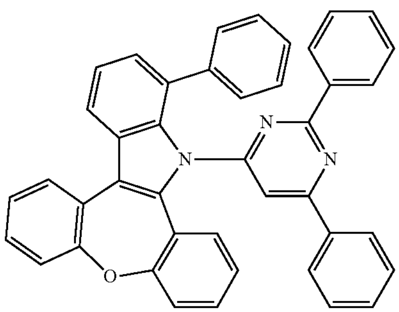
G-5
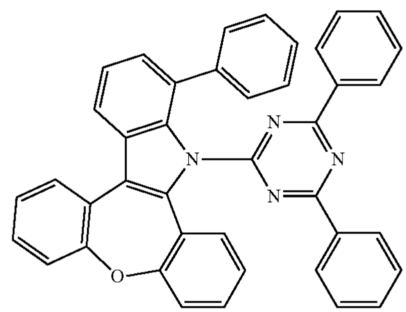
G-6
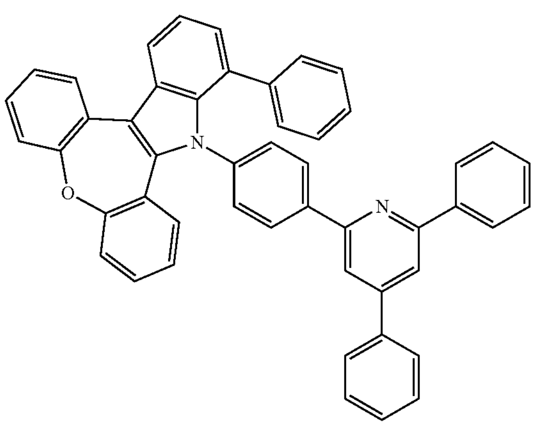
G-7
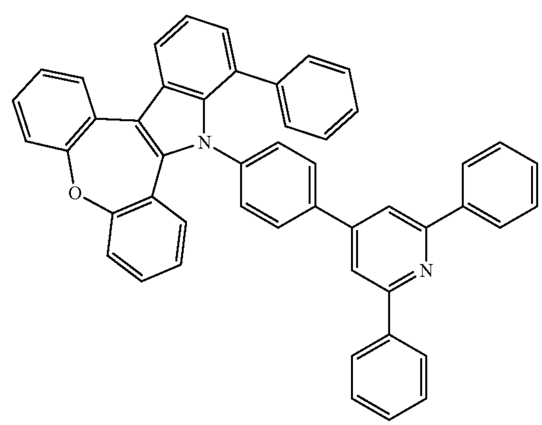

-continued
G-8
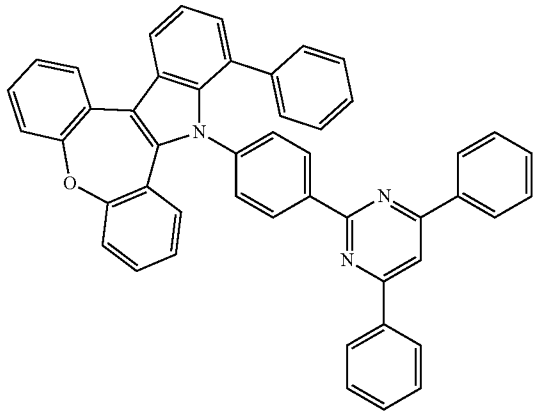
G-9
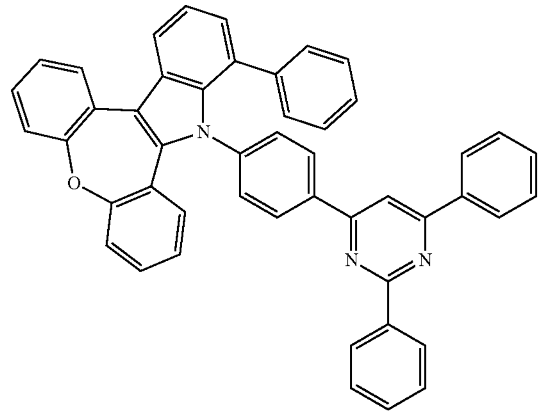
G-10
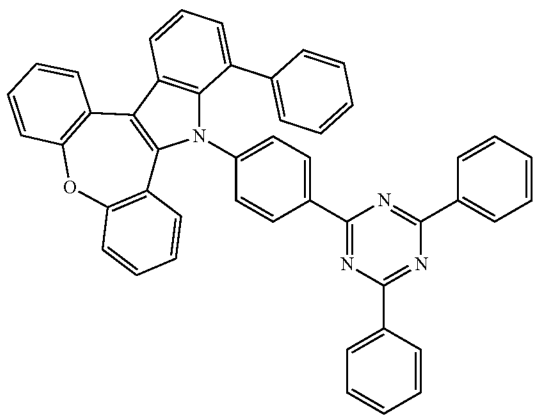
G-11
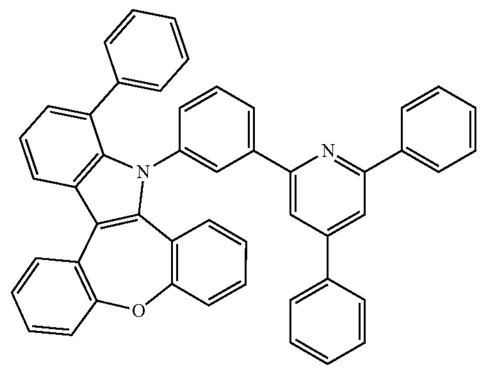
G-12
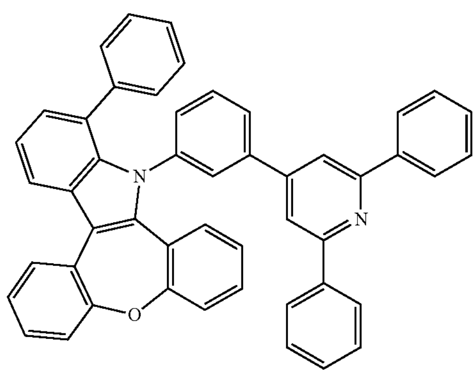
G-13
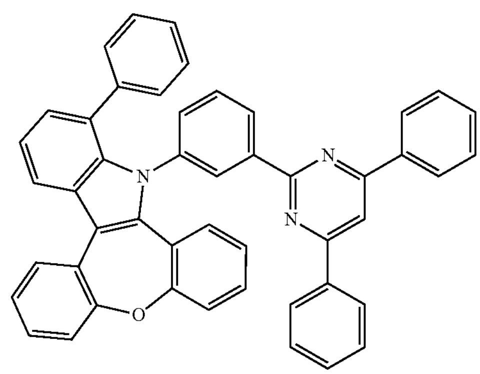
G-14
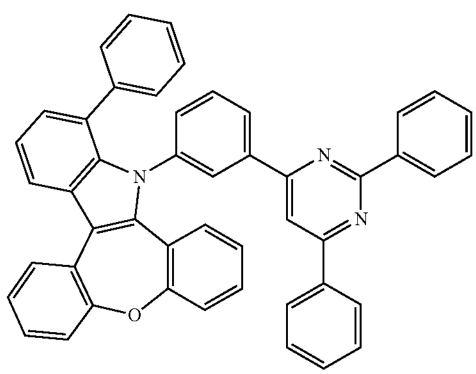
G-15
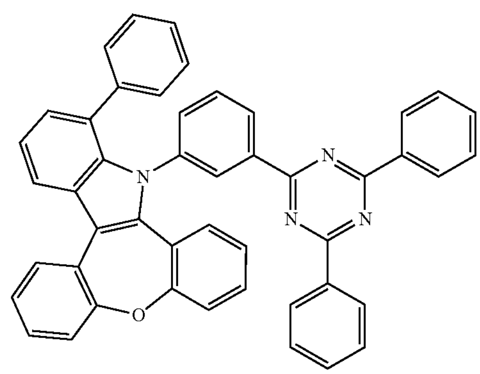

-continued
G-16
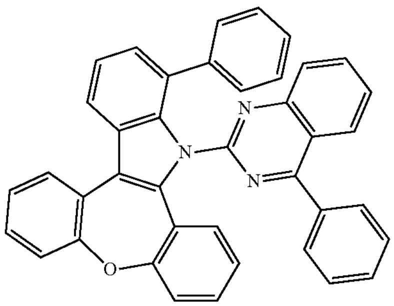
G-17
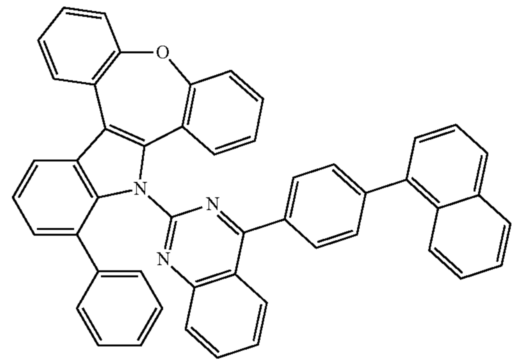
G-18
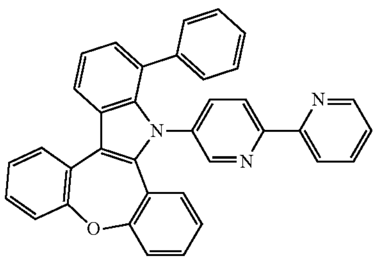
G-19
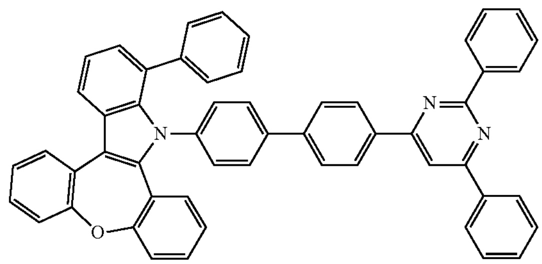
H-1
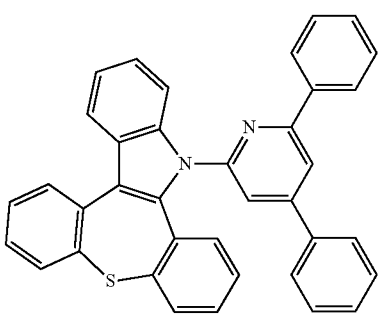
H-2
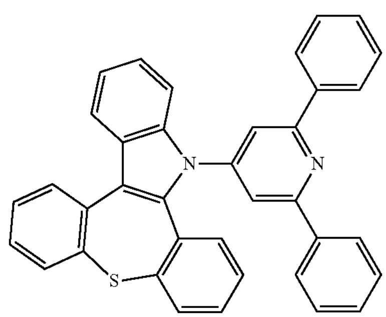
H-3
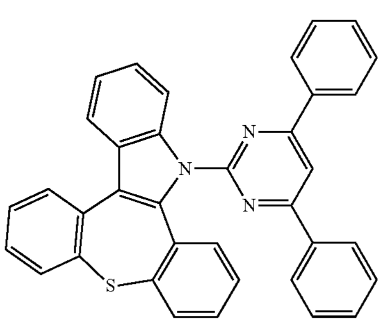
H-4
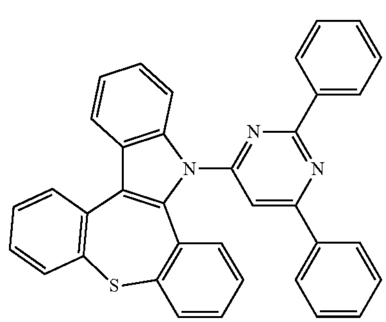

-continued
H-5
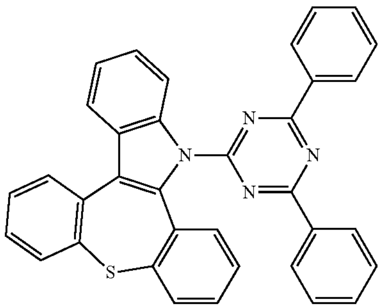
H-6
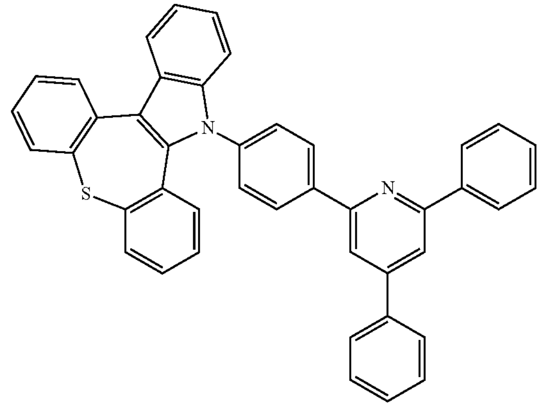
H-7
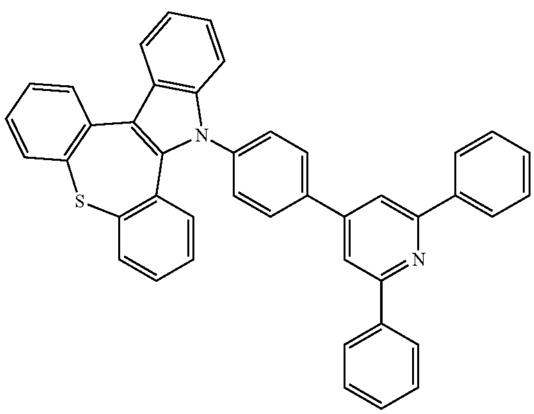
H-8
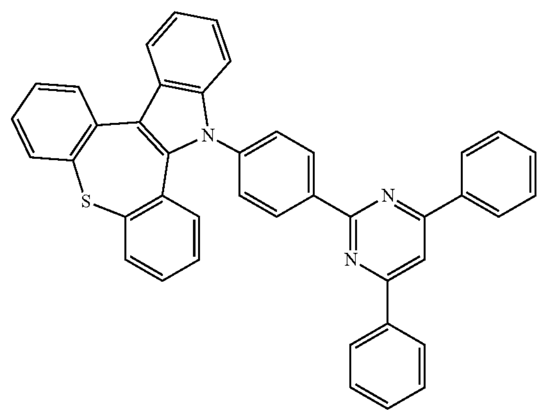
H-9
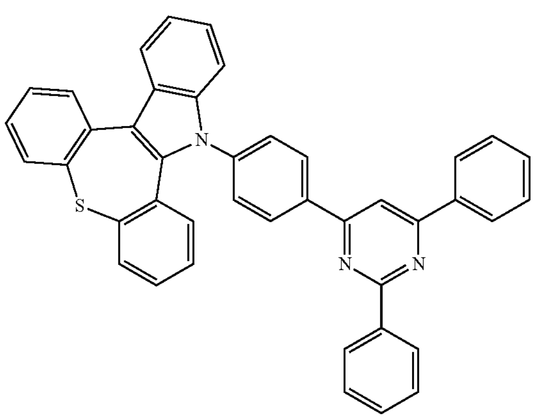
H-10
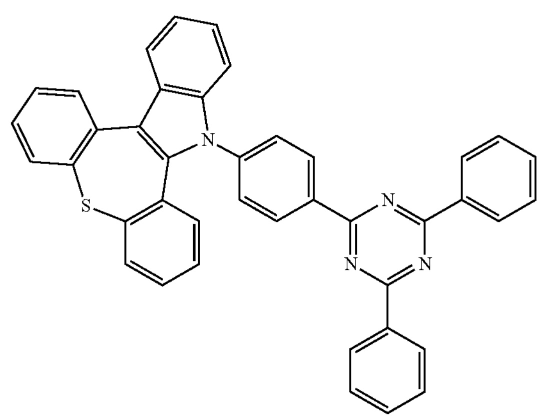

-continued
H-11
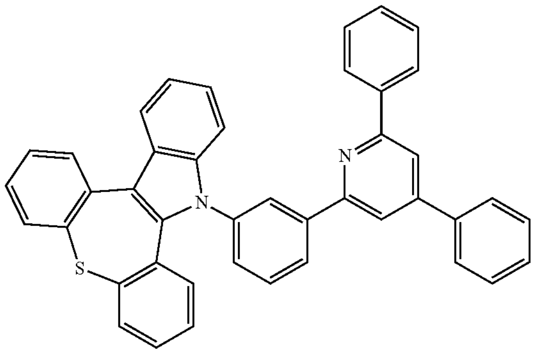
H-12
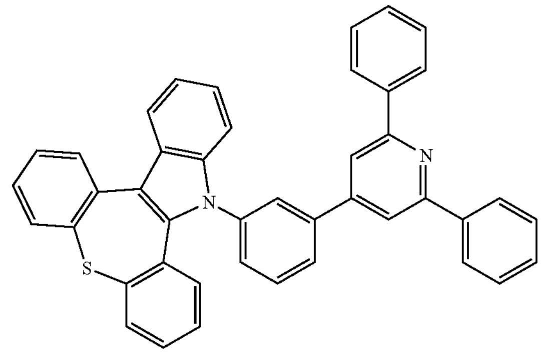
H-13
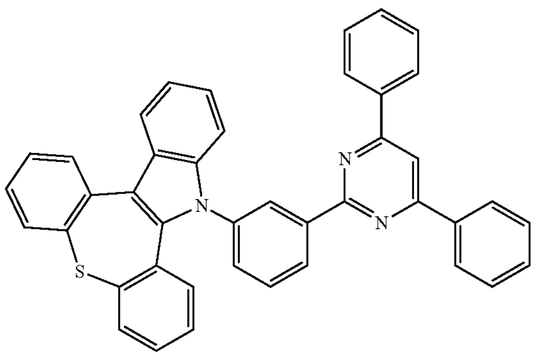
H-14
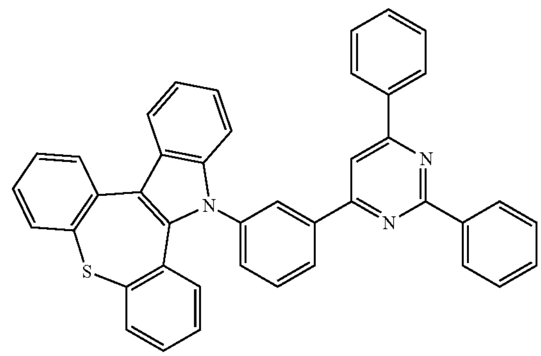
H-15
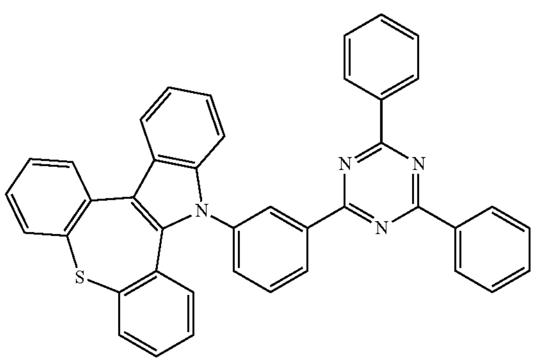
H-16
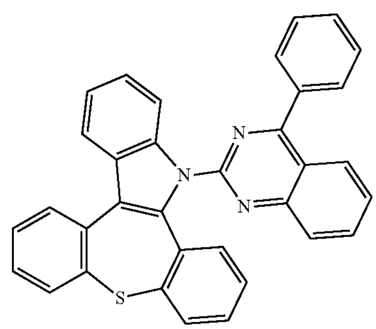
H-17
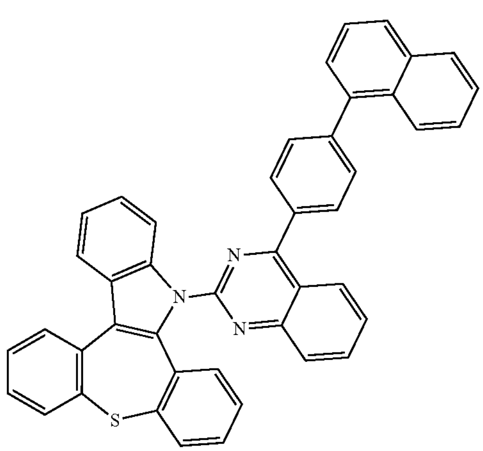
H-18
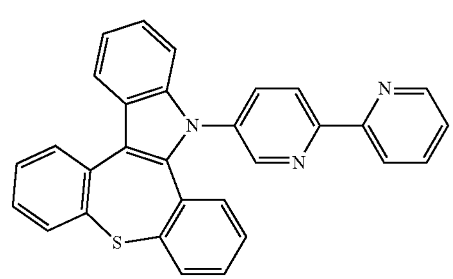

-continued
H-19
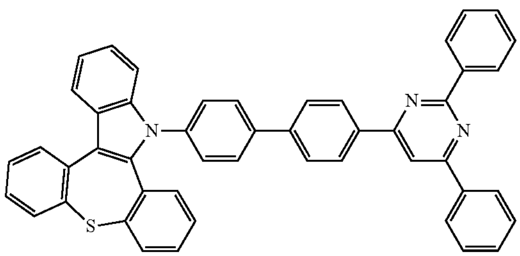
I-1
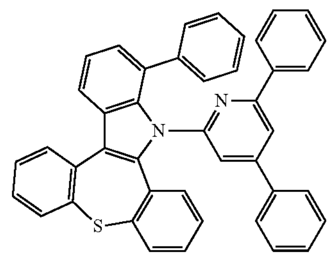
I-2
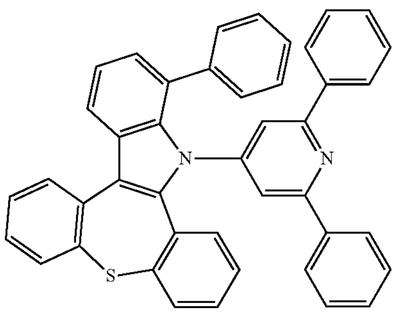
I-3
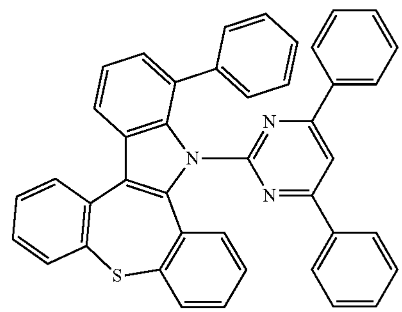
I-4
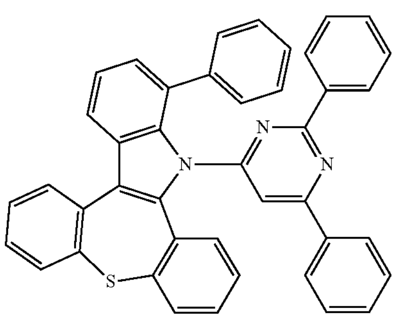
I-5
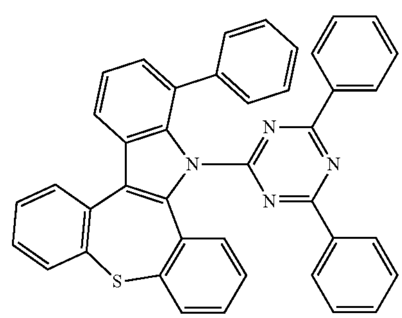
I-6
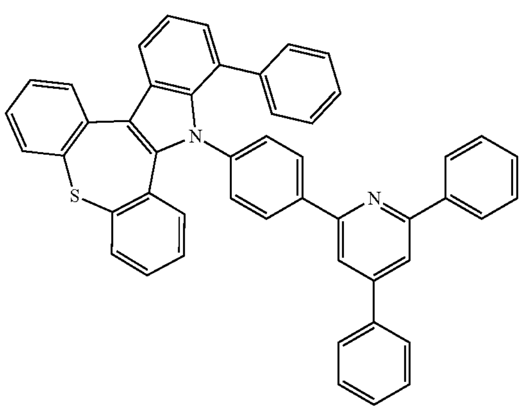
I-7
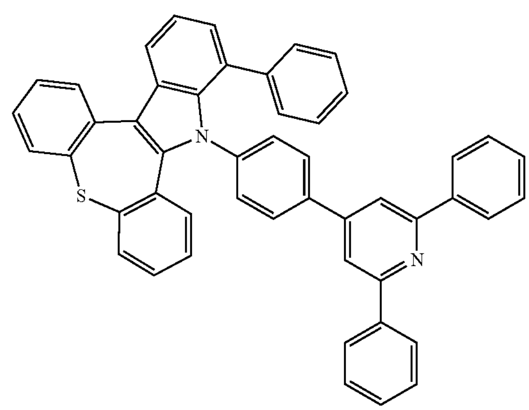

-continued
I-8
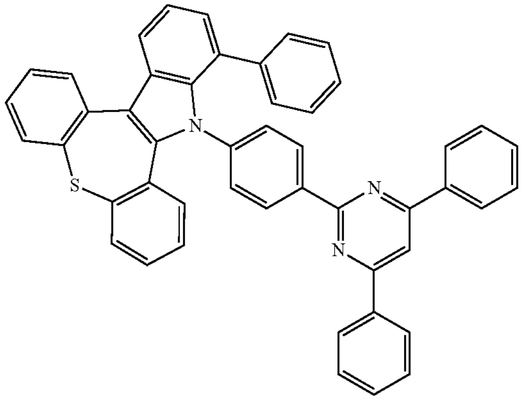
I-9
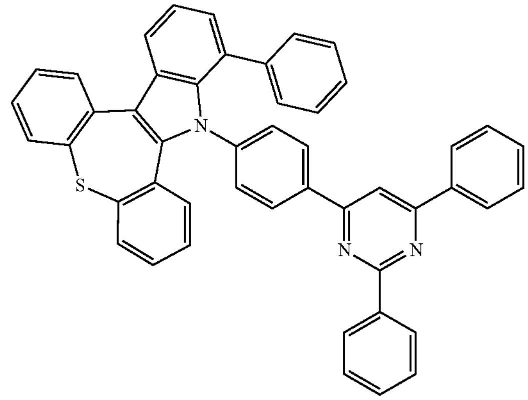
I-10
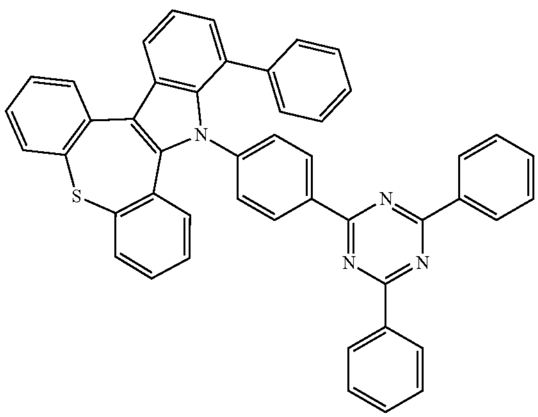
I-11
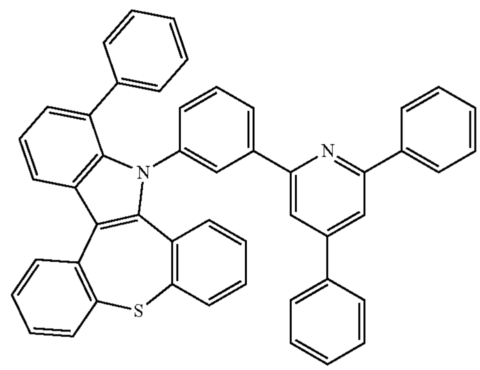
I-12
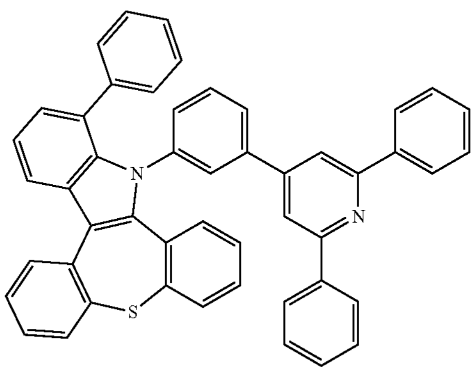
I-13
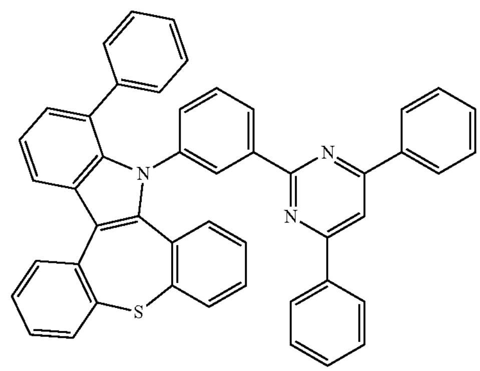
I-14
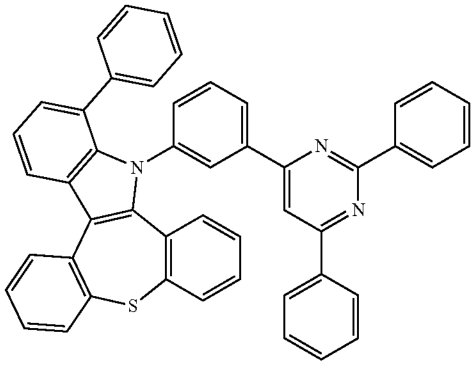
I-15
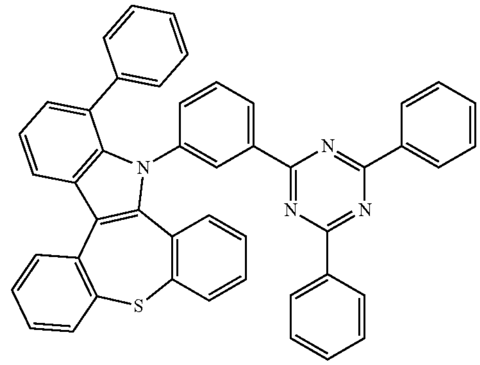

-continued
I-16
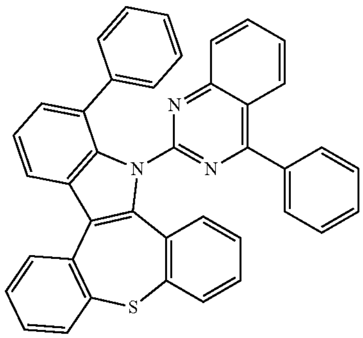
I-17
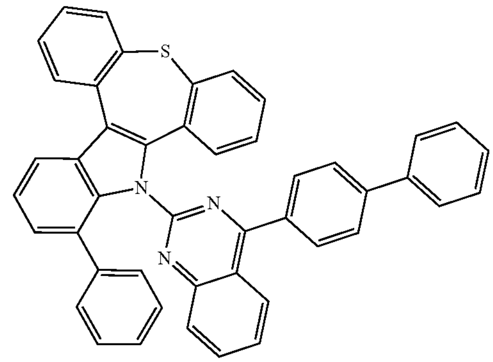
I-18
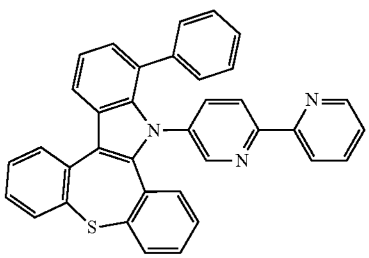
I-19
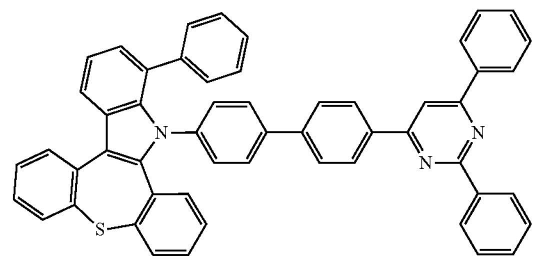
J-1
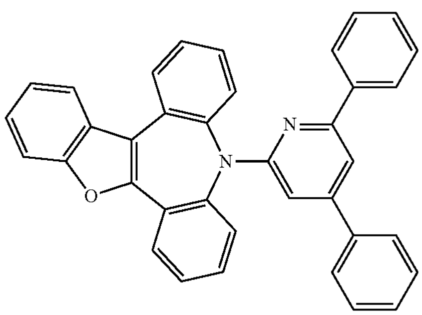
J-2
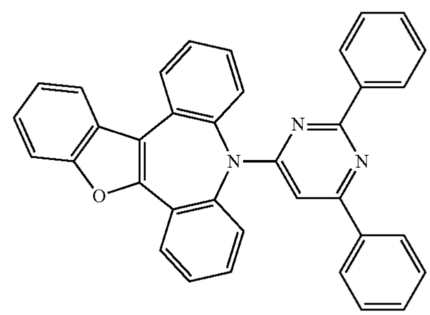
J-3
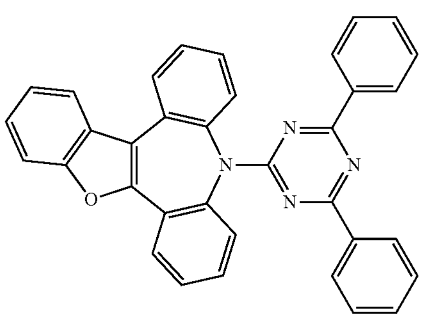
J-4
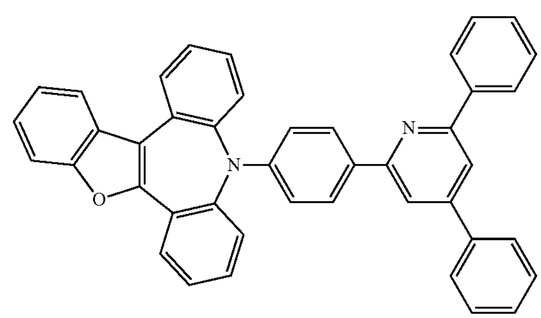
J-5
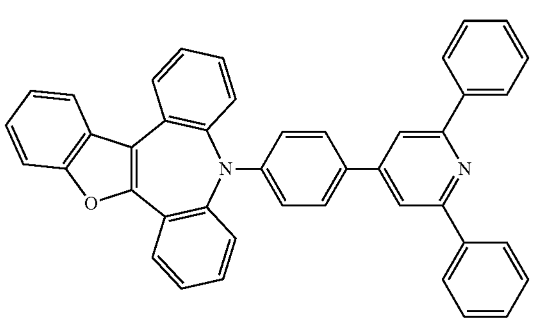
J-6
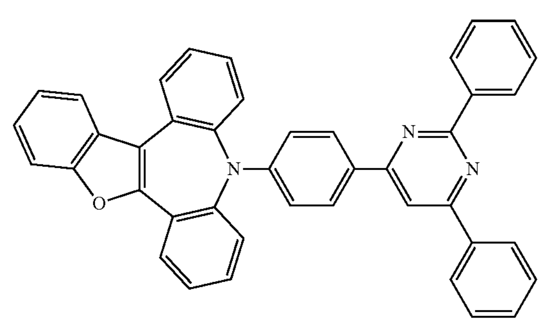

-continued
J-7
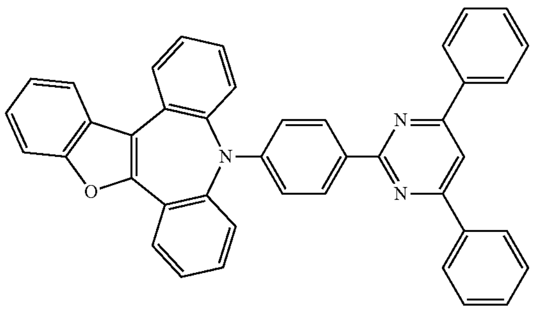
J-8
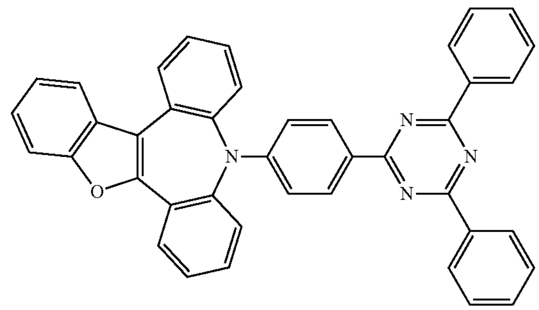
J-9
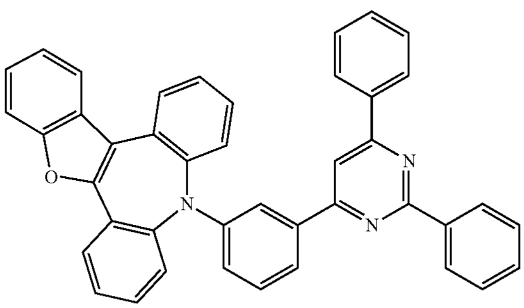
J-10
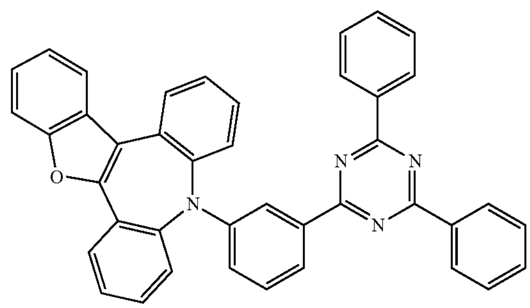
K-1
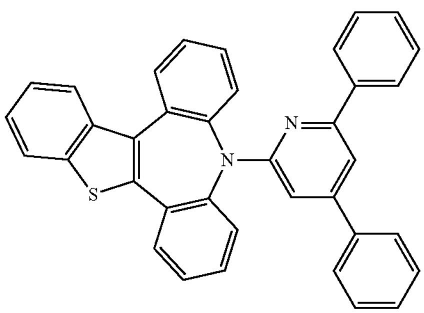
K-2
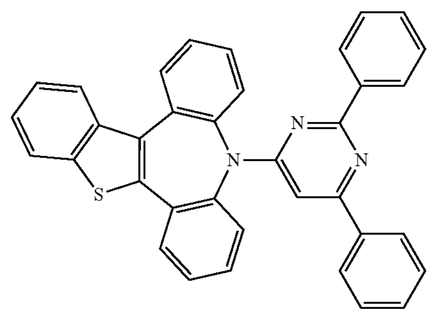
K-3
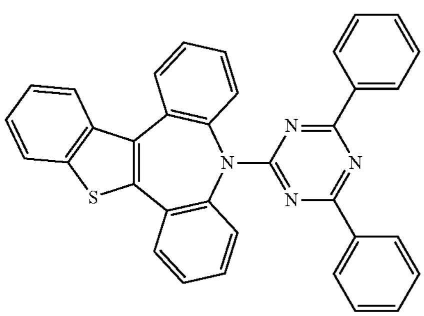
K-4
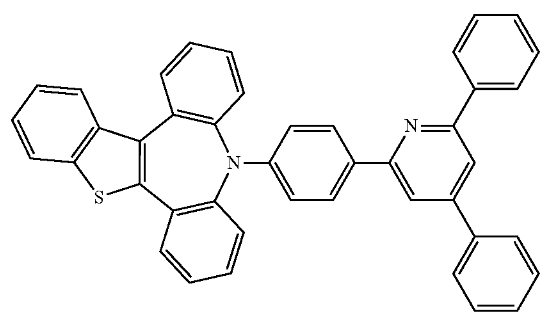
K-5
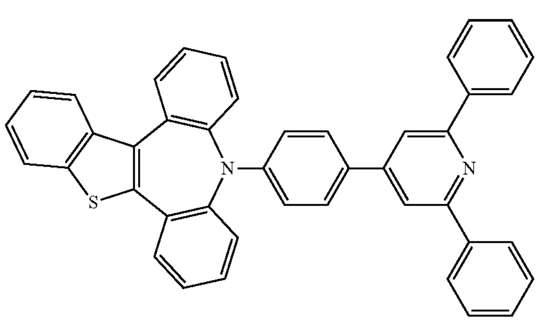
K-6
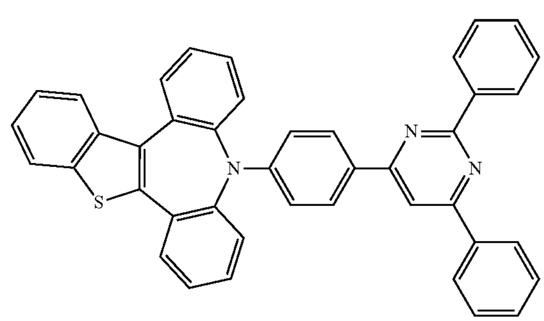

-continued
K-7
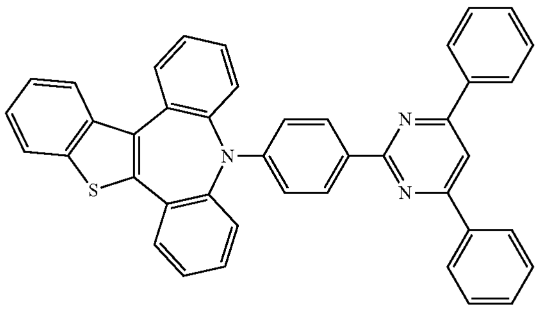
K-8
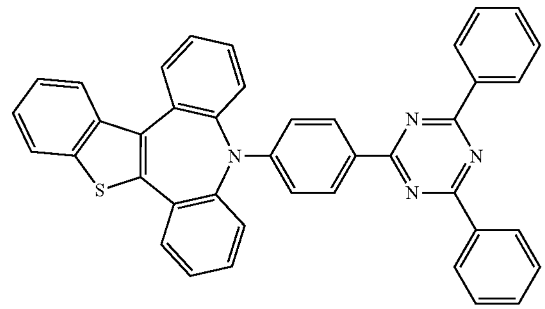
K-9
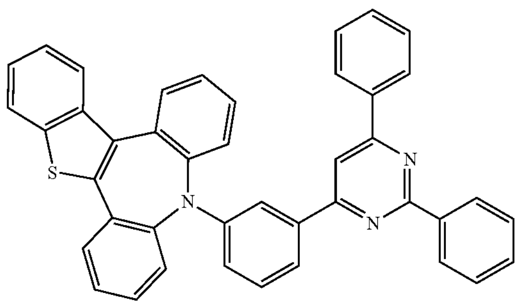
K-10
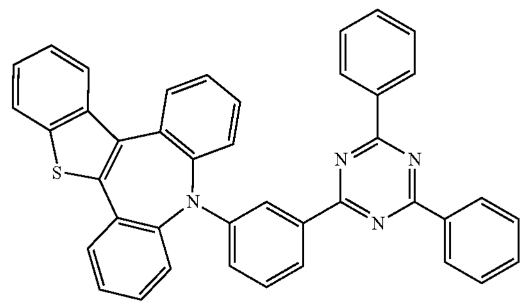
L-1
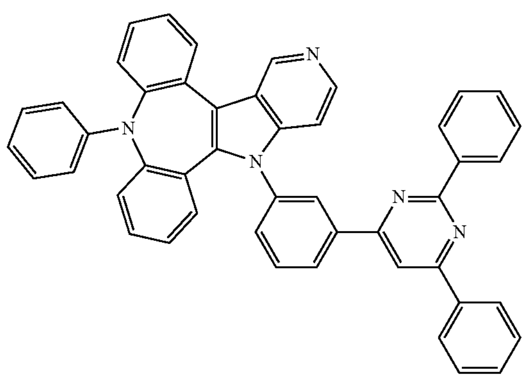
L-2
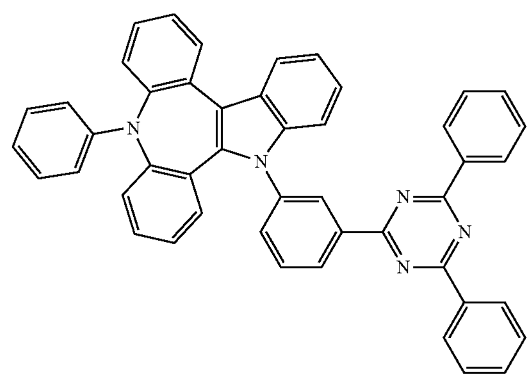
L-3
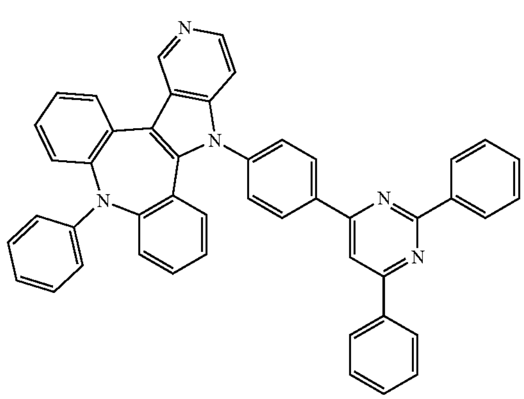
L-4
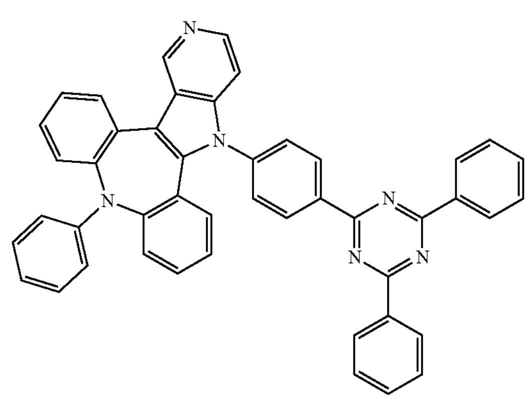

-continued
L-5
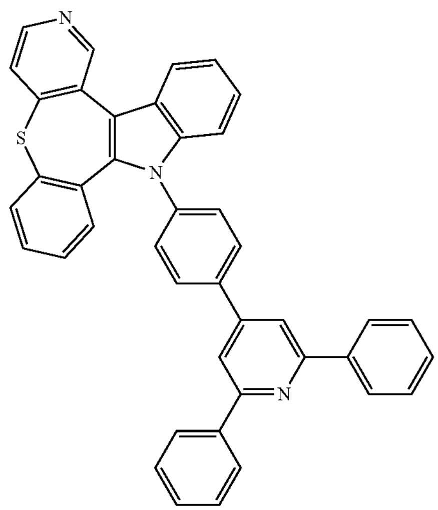
L-6
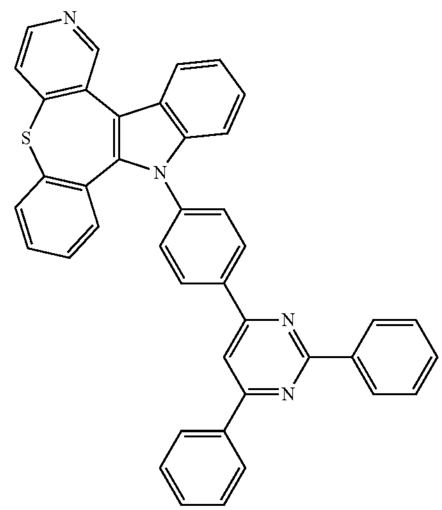
L-7
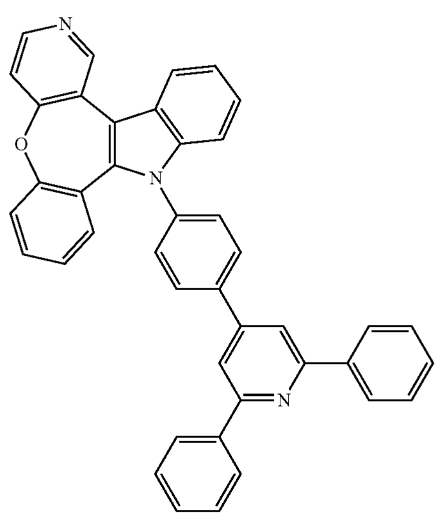
L-8
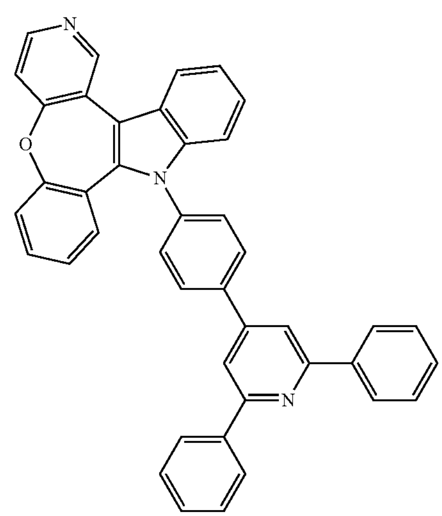
L-9
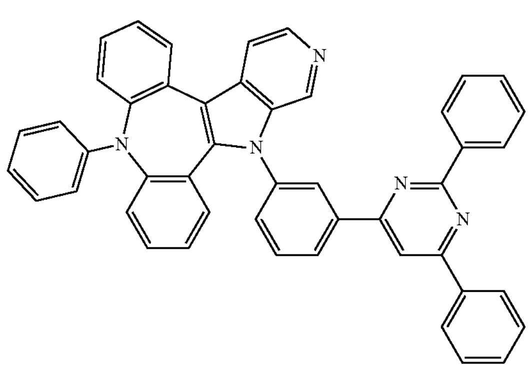
L-10
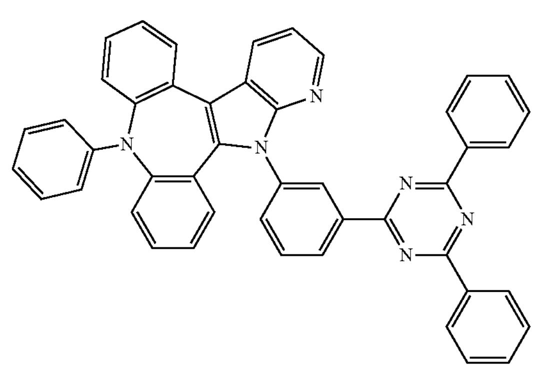

-continued
L-11
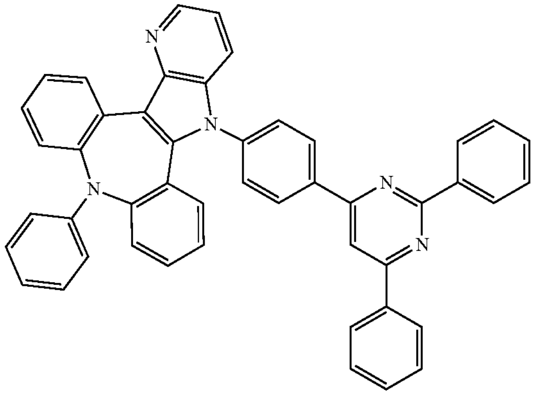
L-12
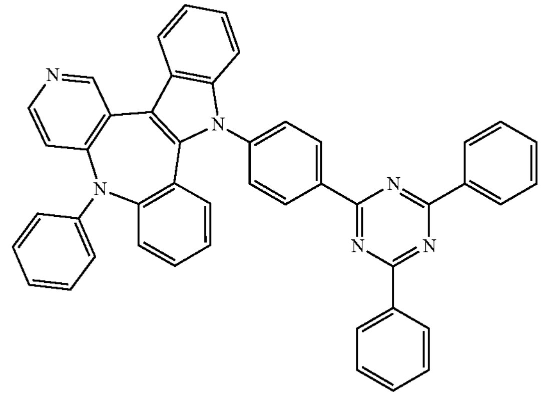
L-13
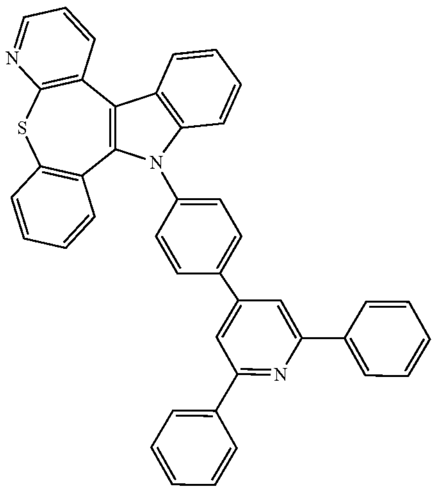
L-14
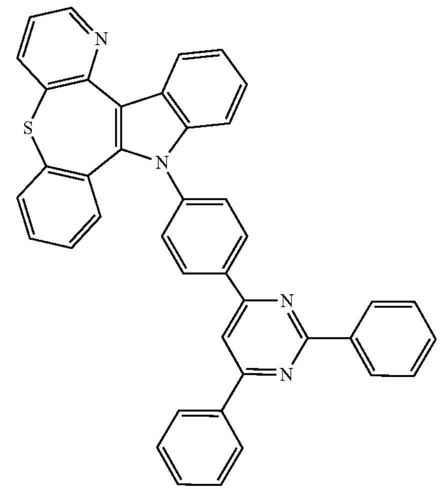
L-15
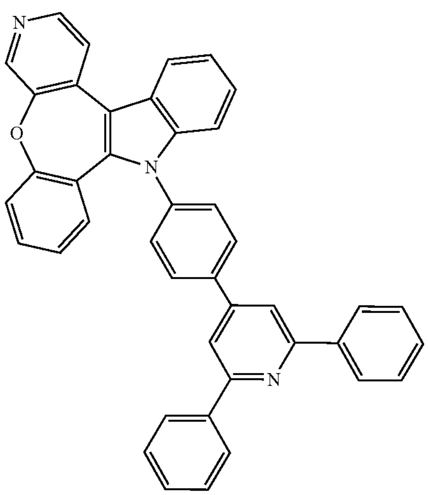
L-16
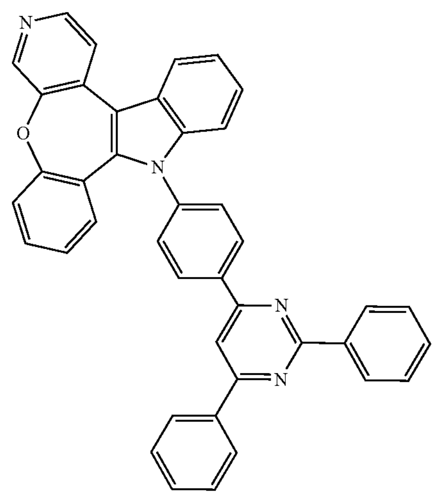

-continued
M-1
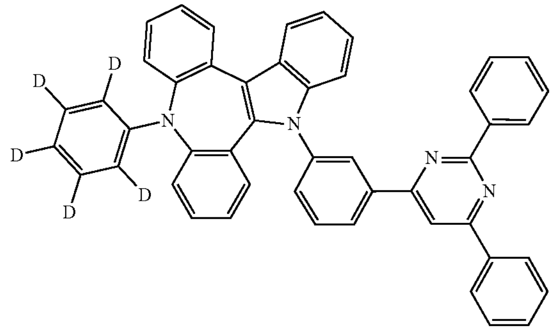
M-2
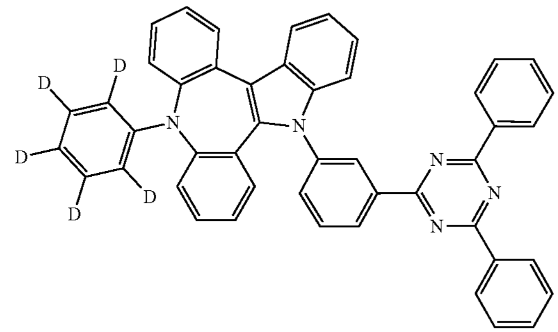
M-3
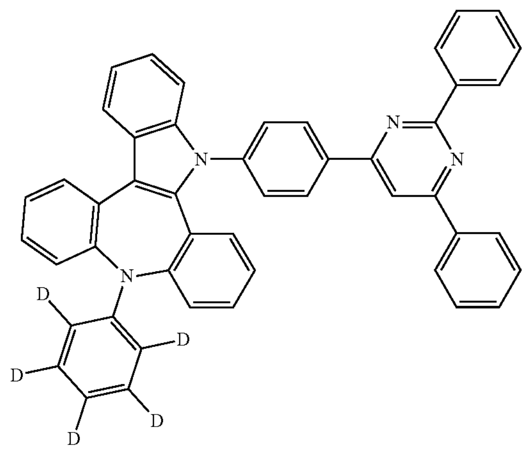
M-4
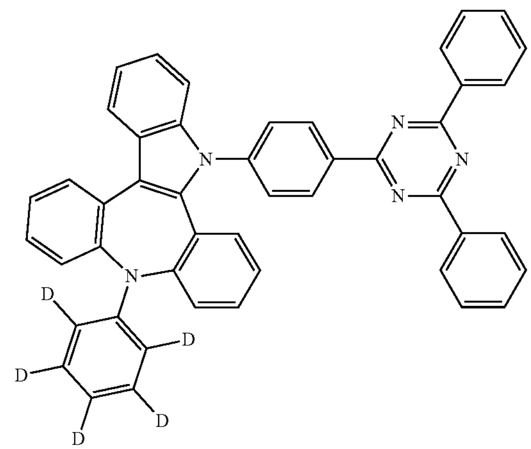
M-5
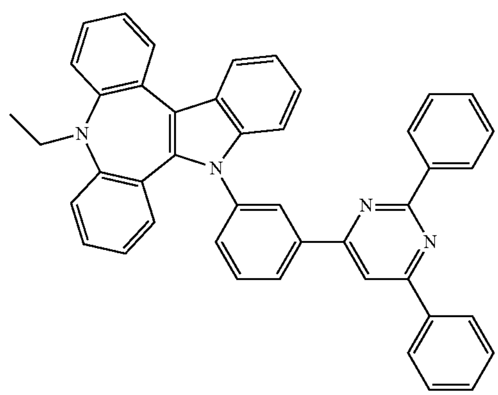
M-6
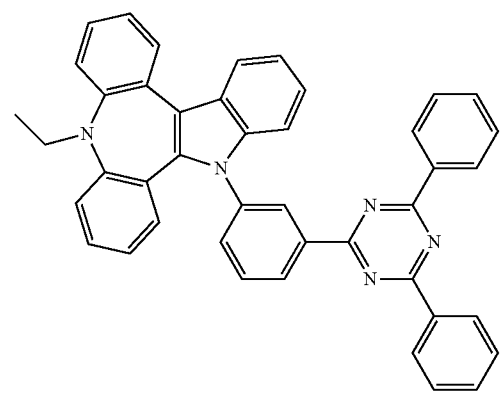
M-7
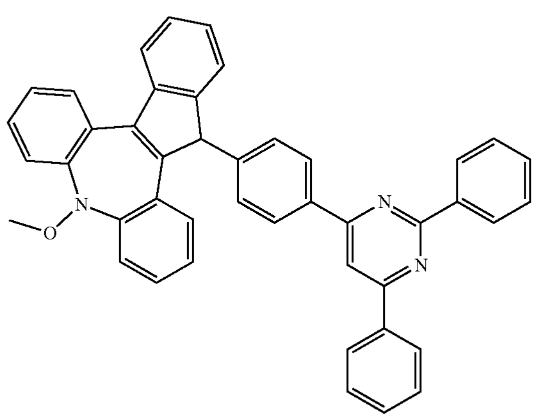
M-8
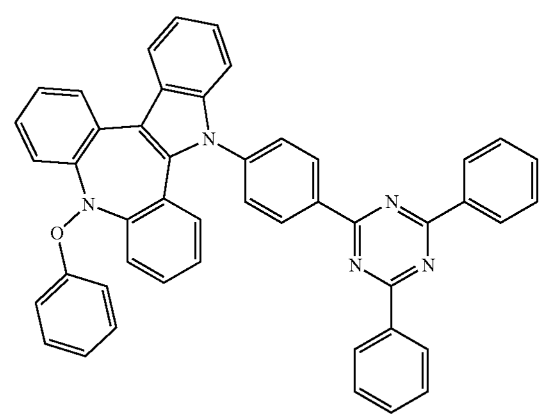

-continued
N-1
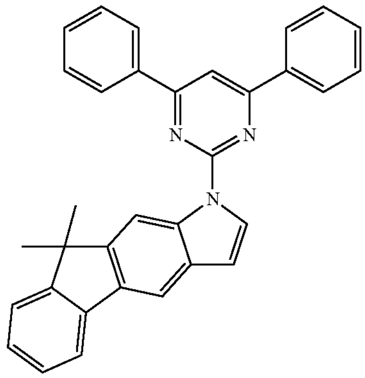
N-2
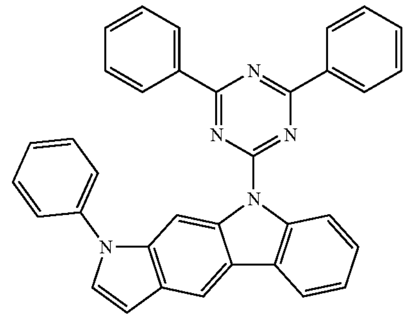
LE-01
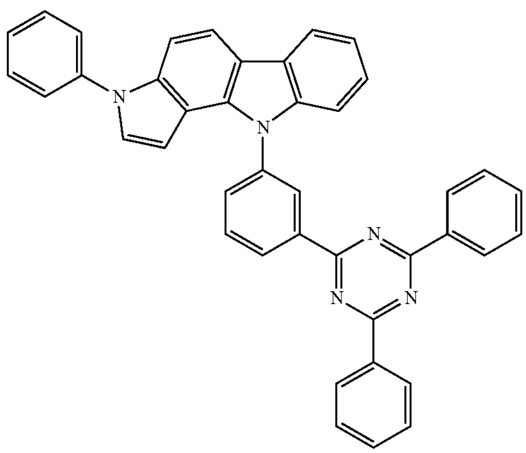
LE-02
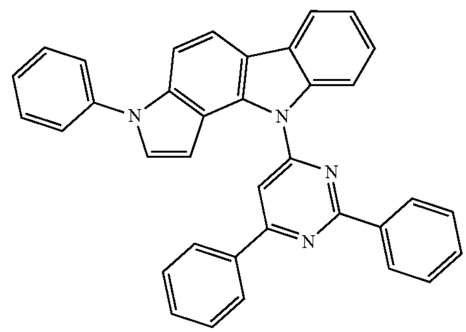
LE-03
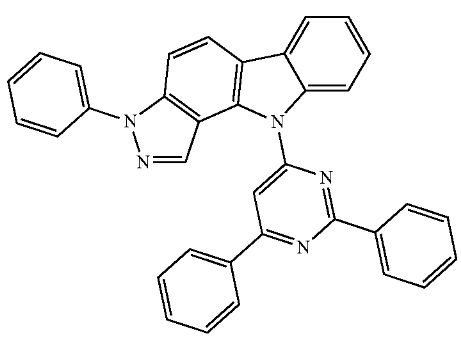
LE-04
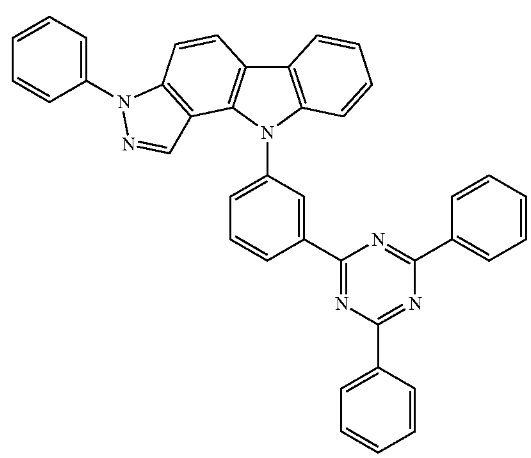

-continued
LE-05
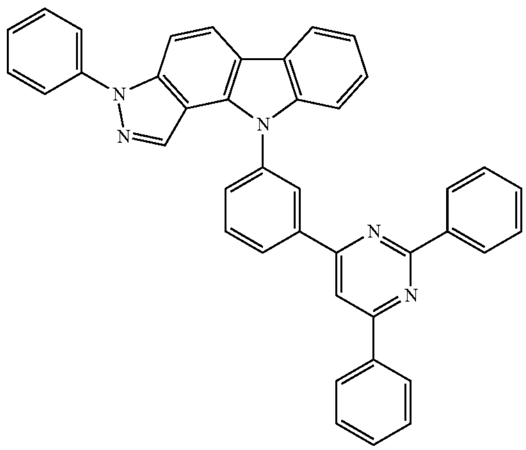
LE-06
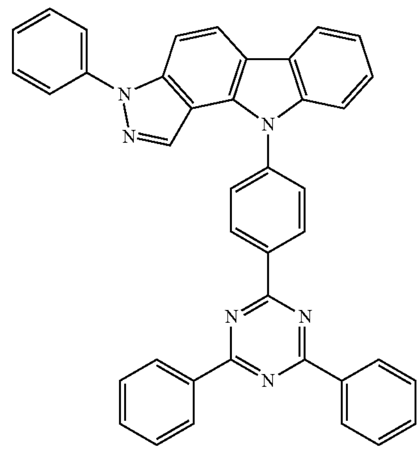
LE-07
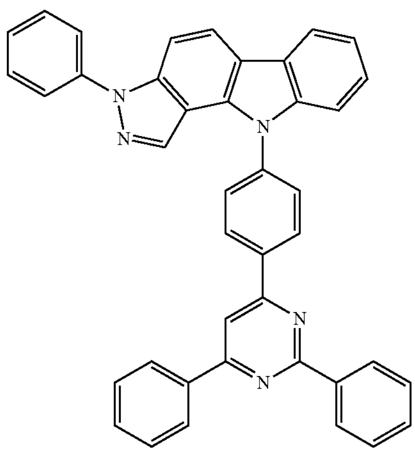
LE-08
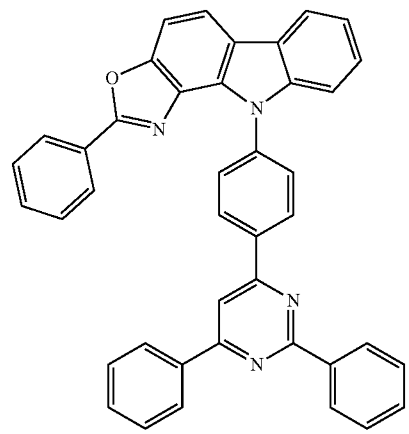
LE-09
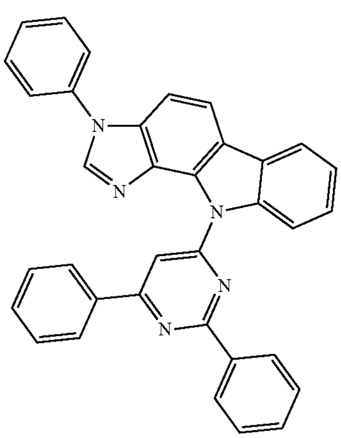
LE-10
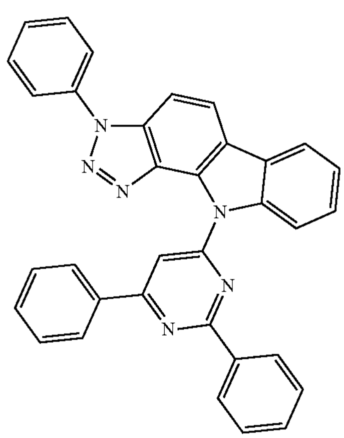

-continued
LE-11
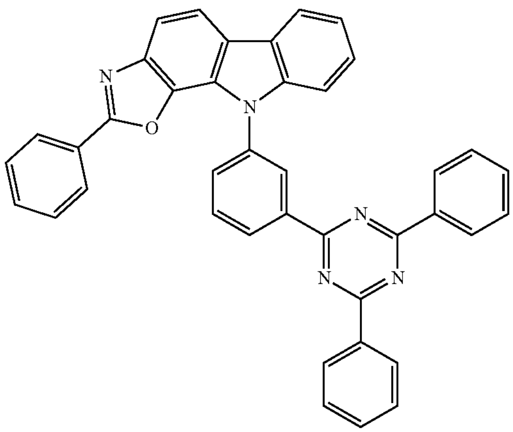
LE-12
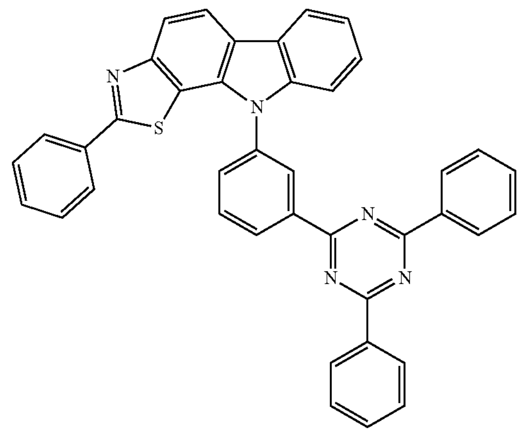
LE-13
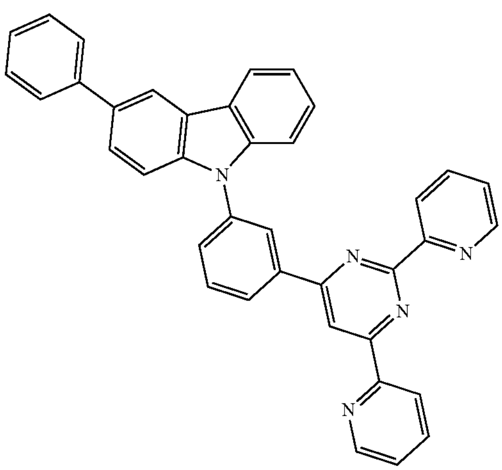
LE-14
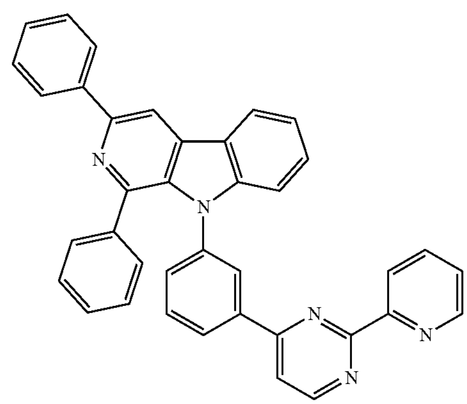
LE-15
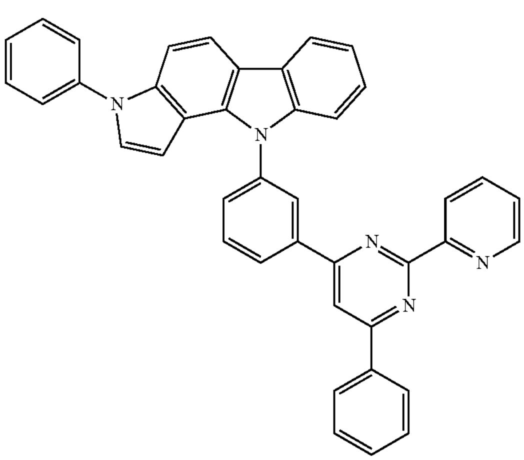
LE-16
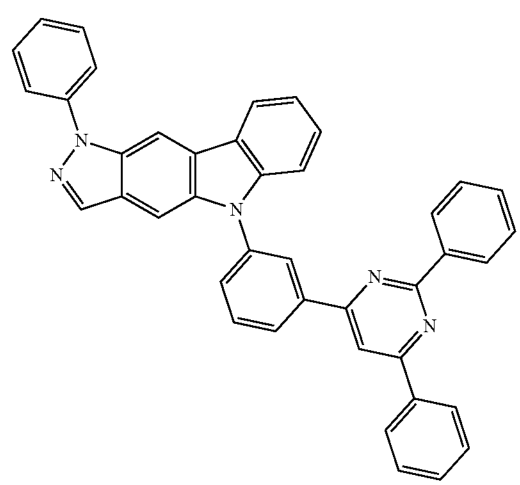

-continued
LE-17
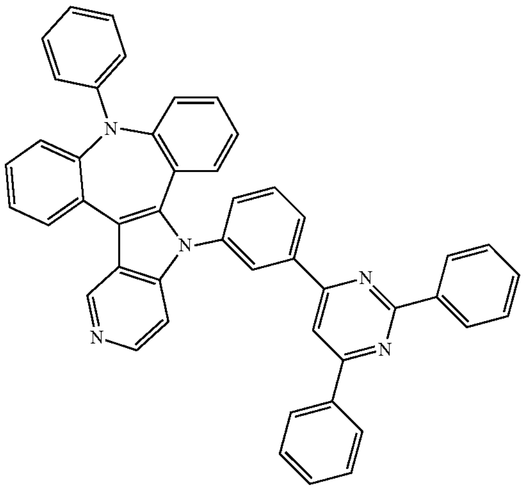
LE-18
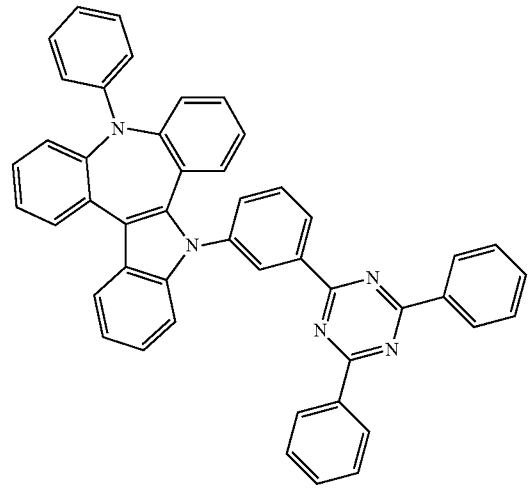
LE-19
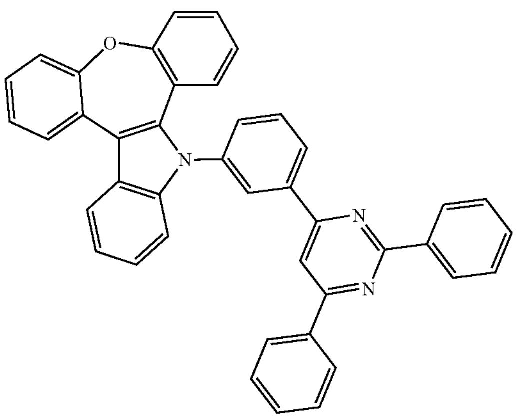
LE-20
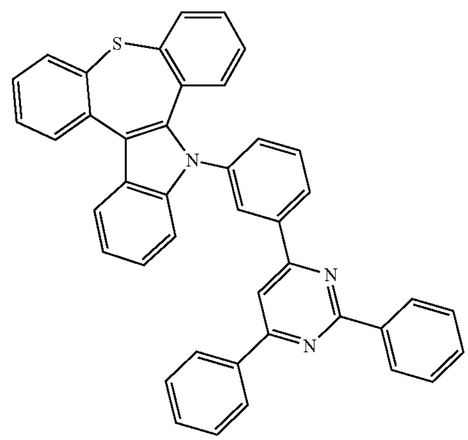
LE-21
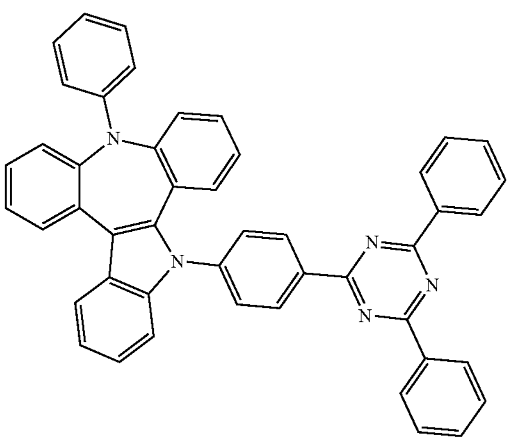
LE-22
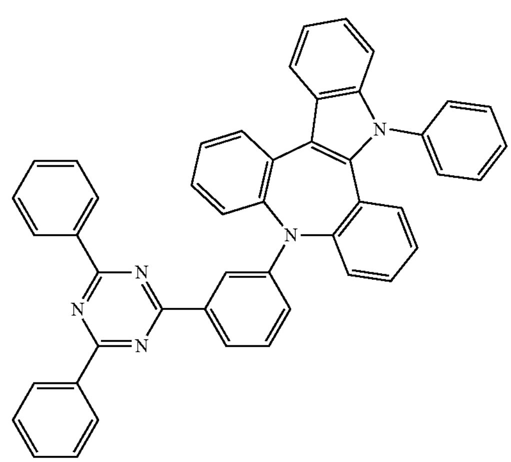

-continued
LE-23
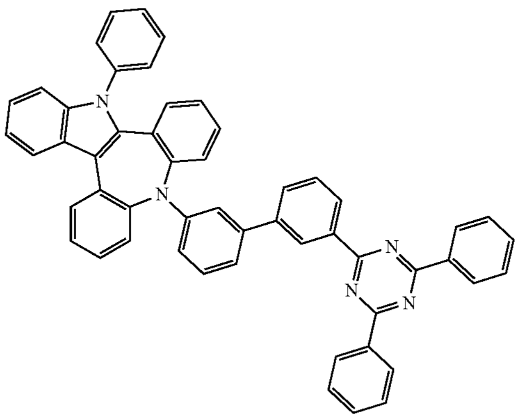
LE-24
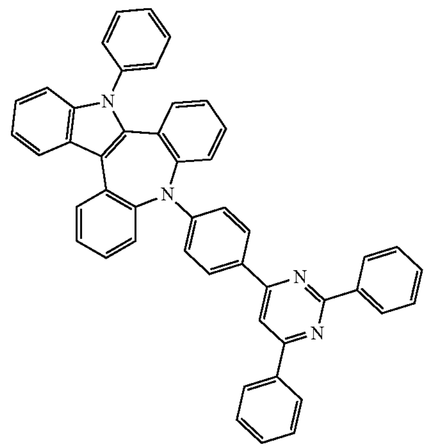
LE-25
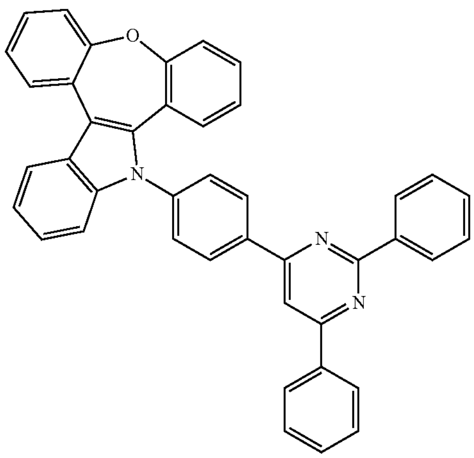
LE-26
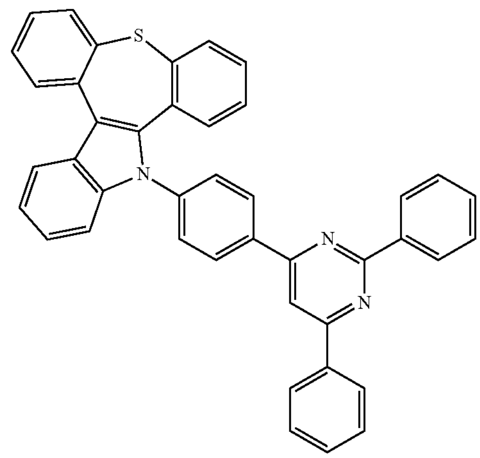
LE-27
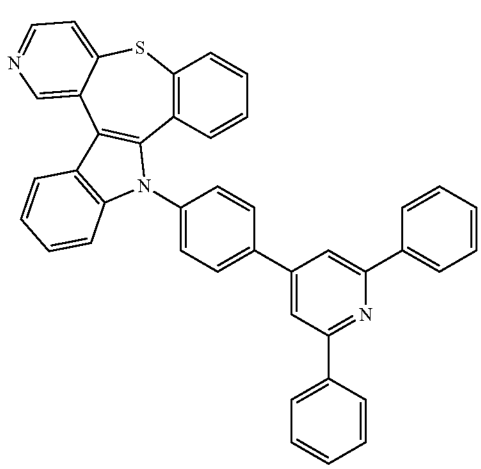
LE-28
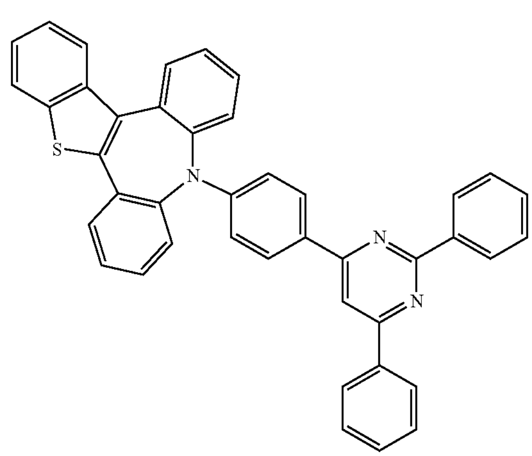

-continued

LE-29

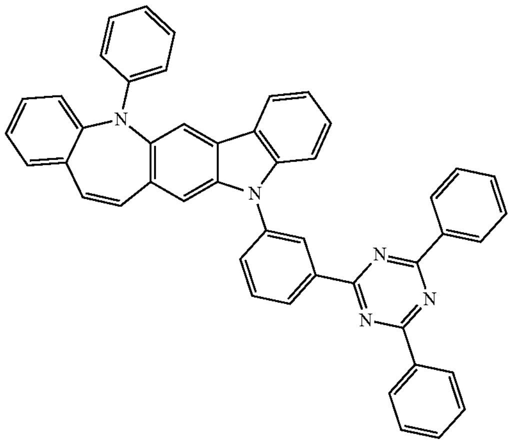

LE-30

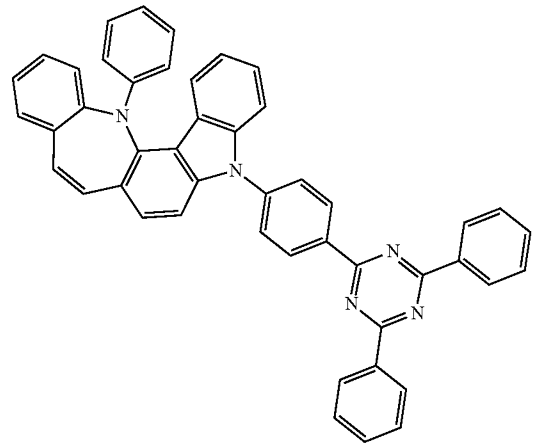

LE-31

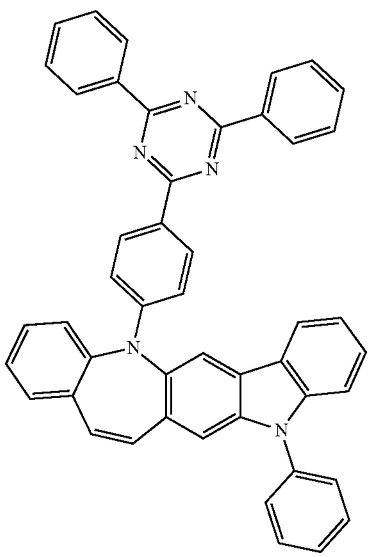

LE-32

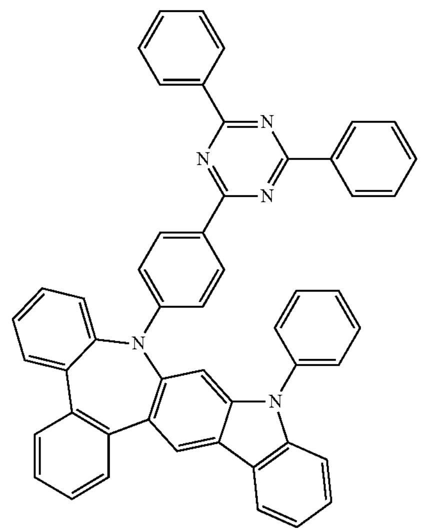

In an implementation, the first compound may be selected from Compounds 100 to 237, Compounds 101A to 207A, and Compounds 301B to 314B.

In an implementation, the third compound may be selected from Compounds A-1 to A-19, Compounds B-1 to B-19, Compounds C-1 to C-19, Compounds D-1 to D-19, Compounds E-1 to E-19, Compounds F-1 to F-19, Compounds G-1 to G-19, Compounds H-1 to H-19, Compounds I-1 to I-19, Compounds J-1 to J-10, Compounds K-1 to K-10, Compounds L-1 to L-16, Compounds M-1 to M-8, Compound N-1, Compound N-2, and Compounds LE-01 to LE-32.

In an implementation, the emission layer may further include a fifth compound, and the fifth compound may not include an electron transport group.

In an implementation, the fifth compound may be selected from Compounds 101B to 230B and Compounds 301A to 342A.

101B

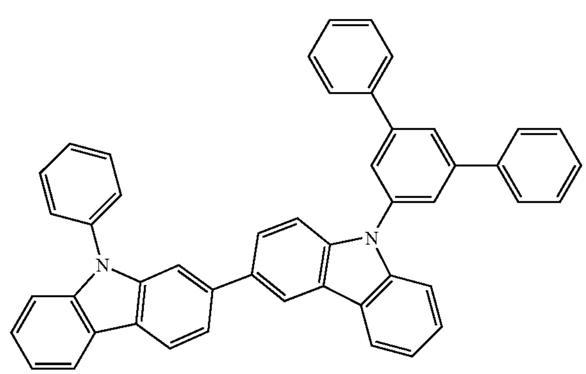

-continued
102B
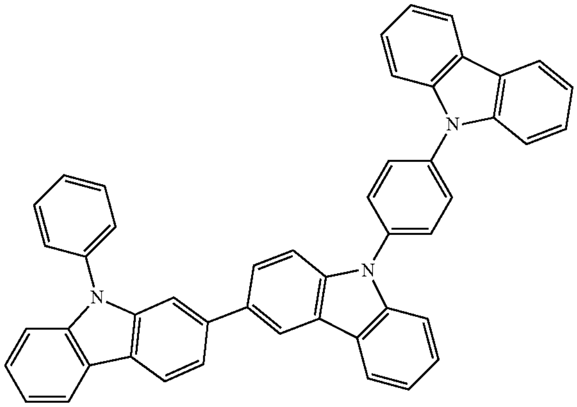
103B
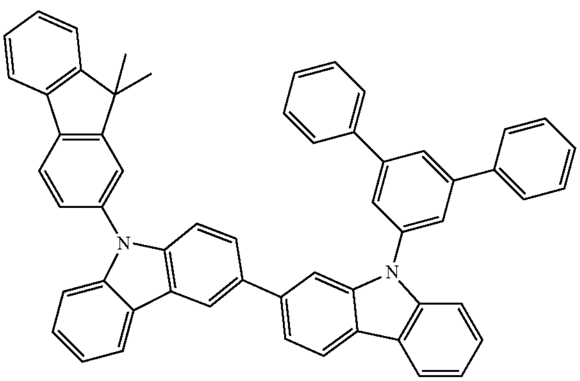
104B
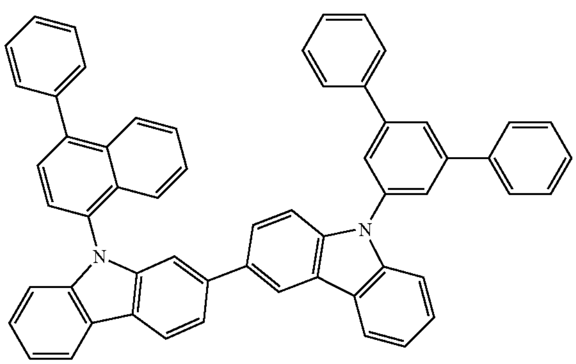
105B
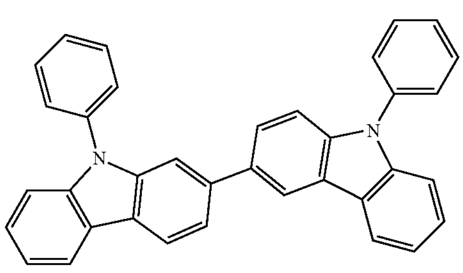
-continued
106B
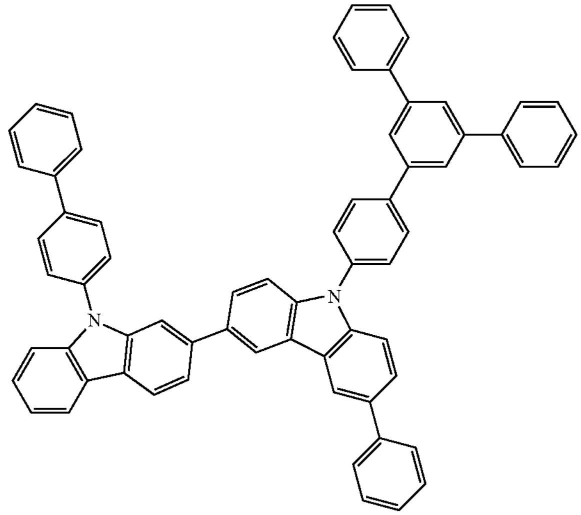
107B
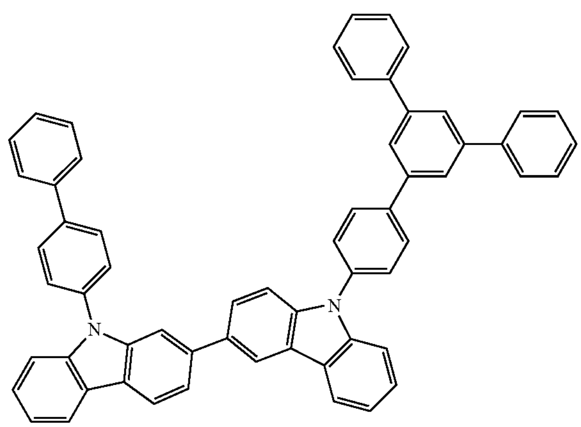
108B
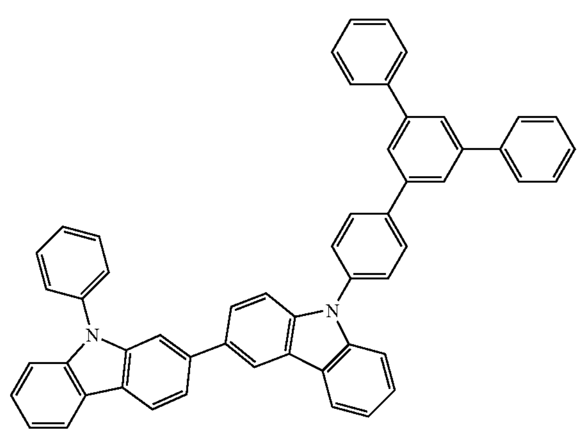

-continued
109B
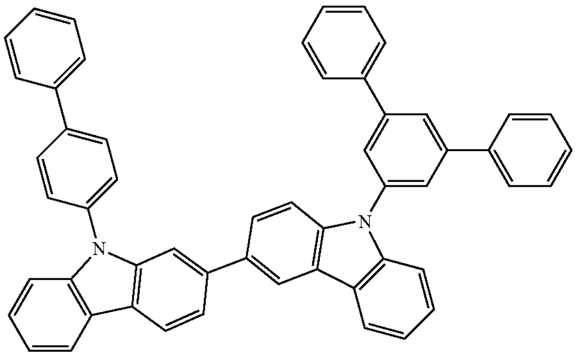
110B
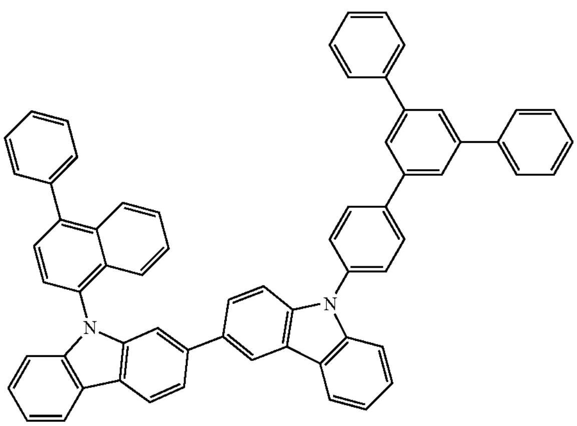
111B
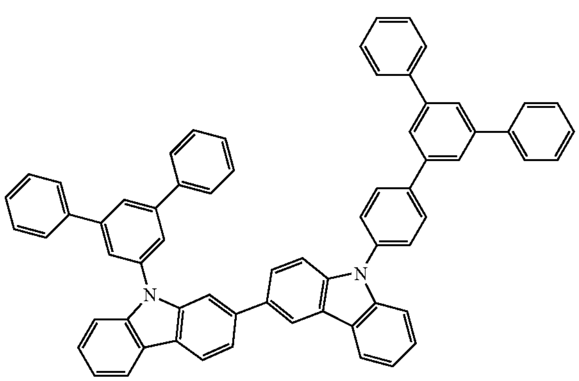
-continued
112B
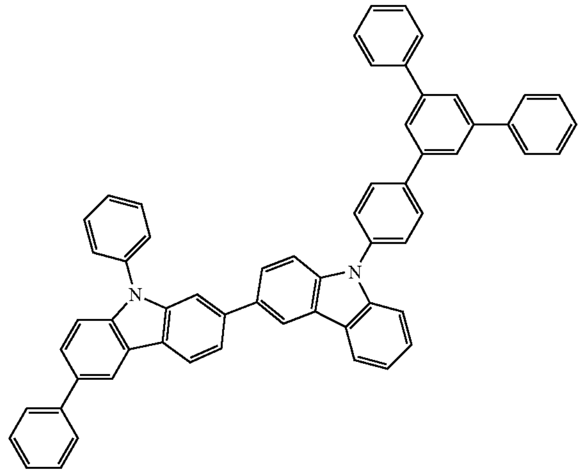
113B
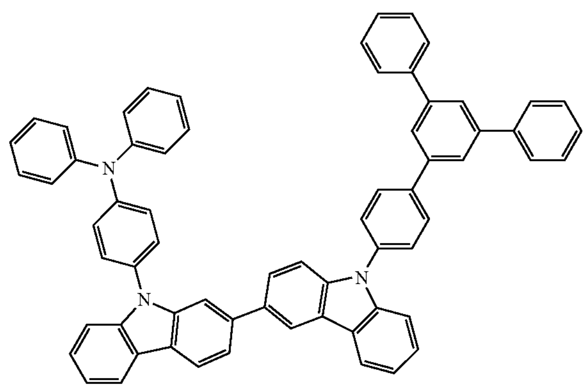
114B
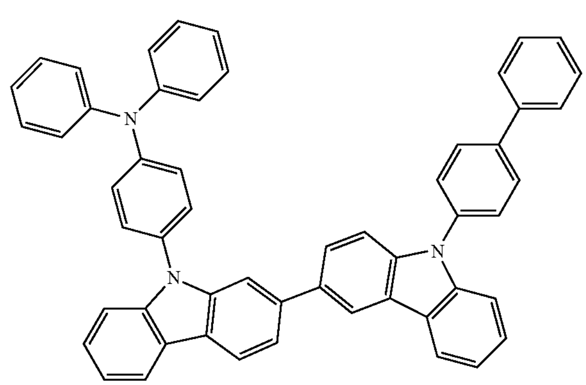

-continued
115B
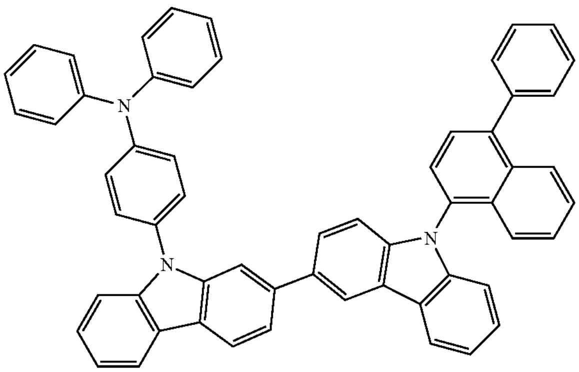
116B
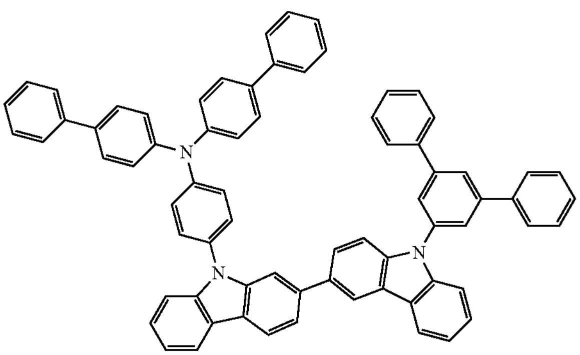
117B
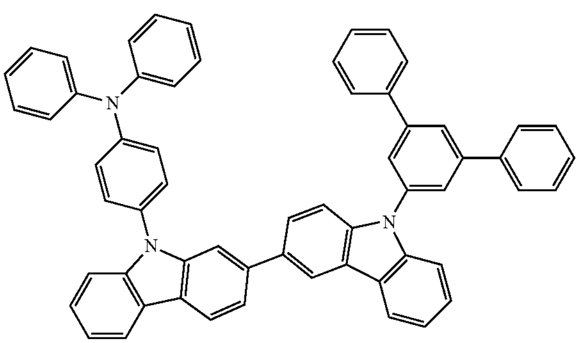
118B
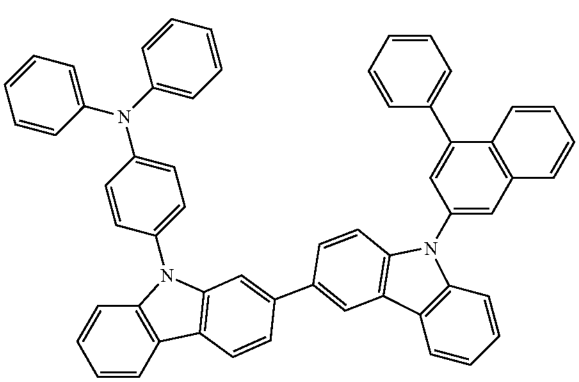
-continued
119B
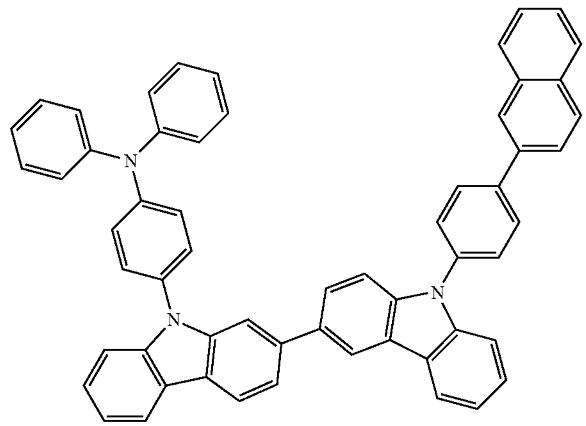
120B
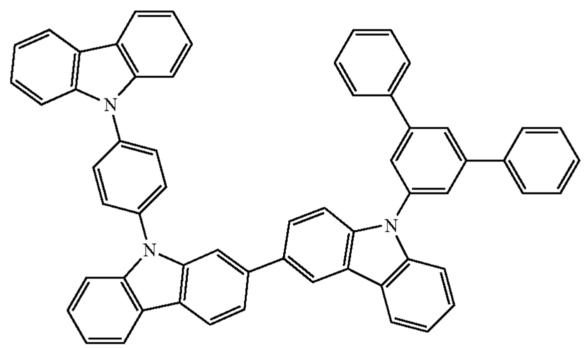
121B
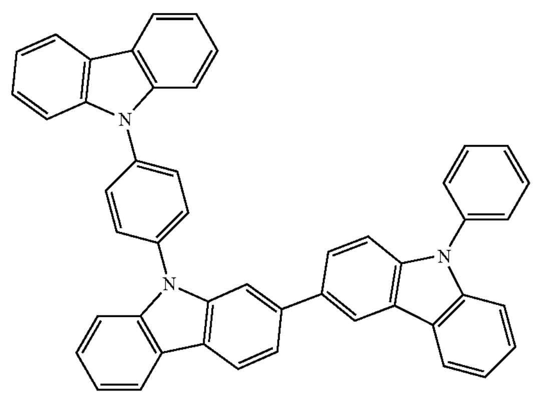
122B
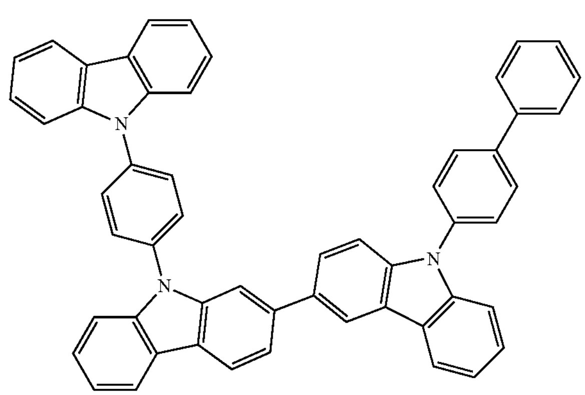

-continued
123B
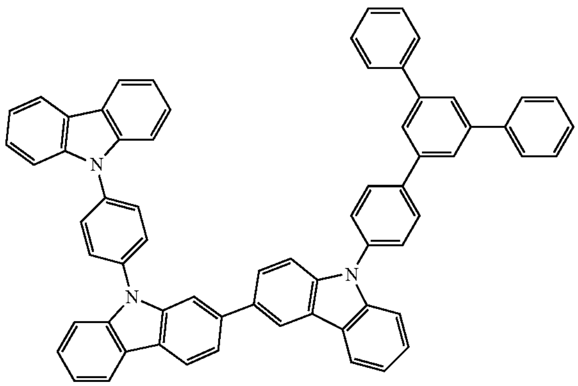
124B
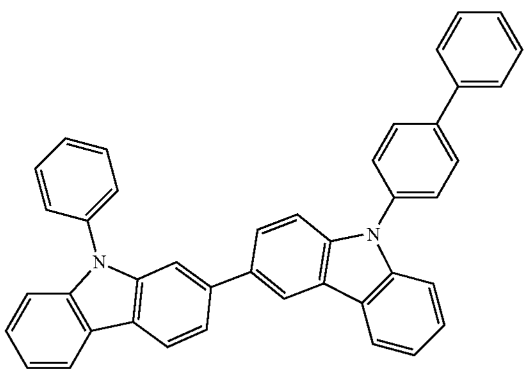
125B
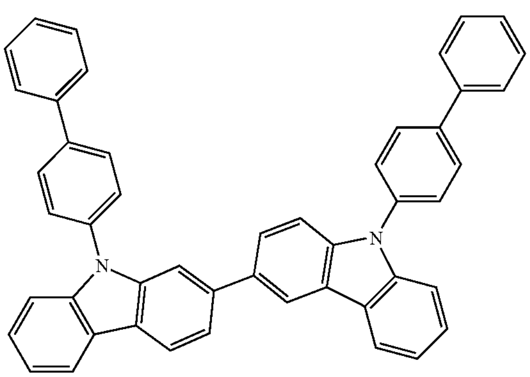
126B
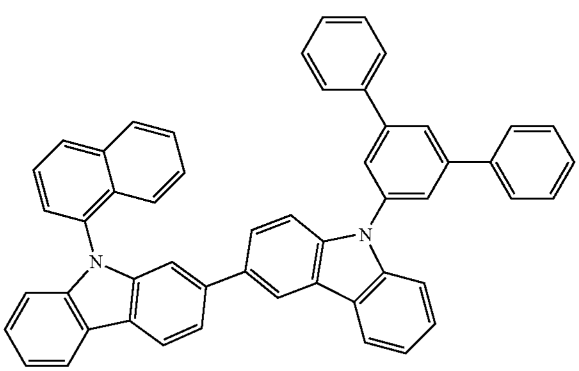
-continued
127B
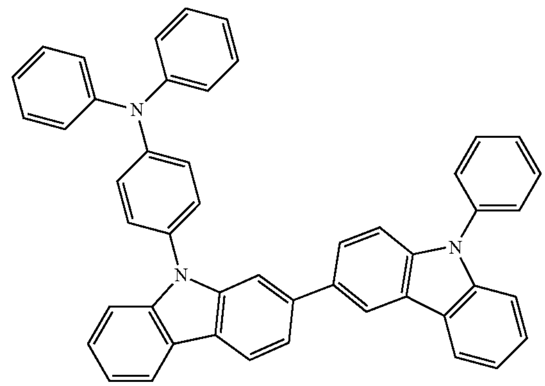
128B
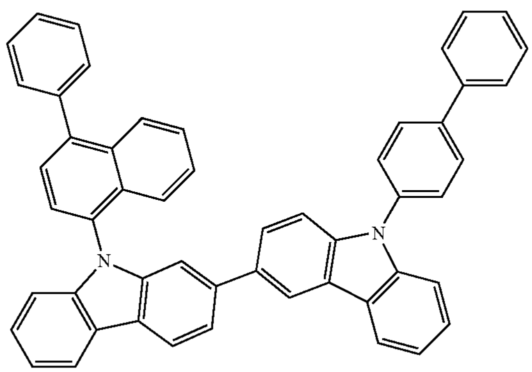
129B
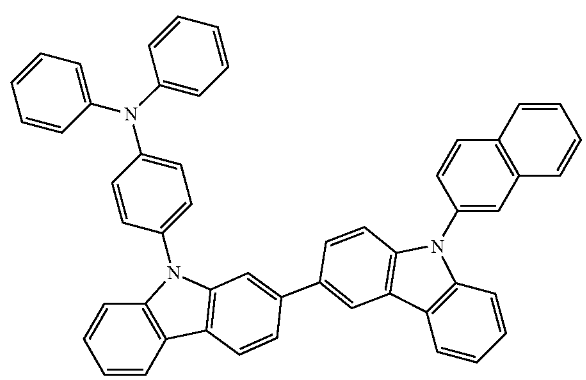
130B
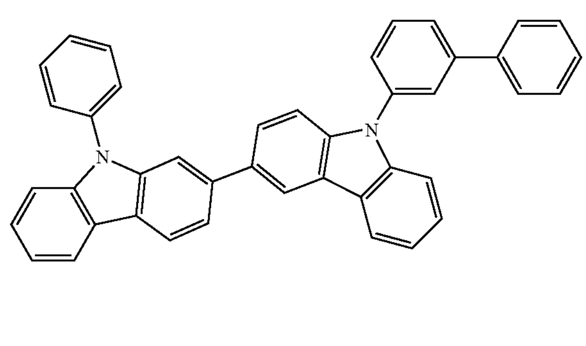

-continued
131B
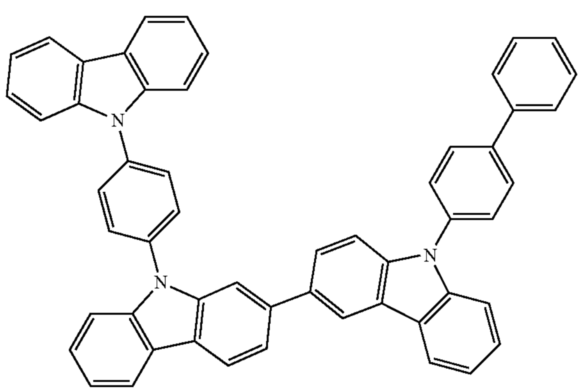
132B
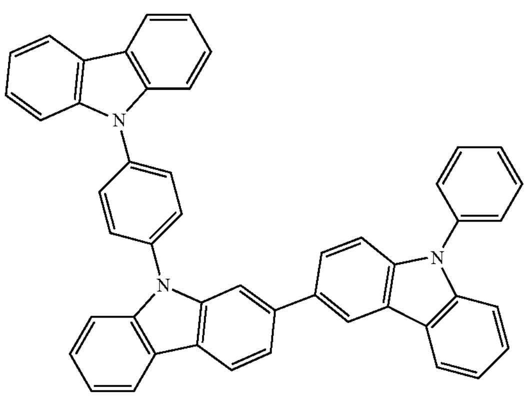
133B
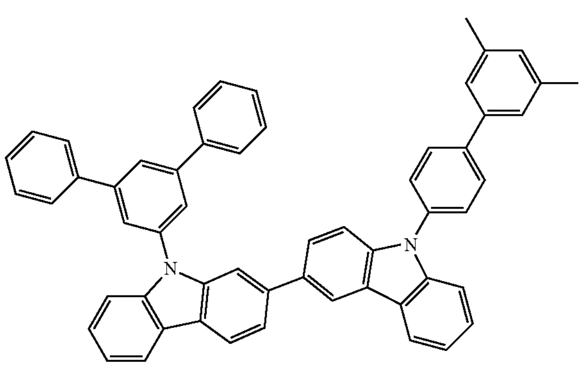
134B
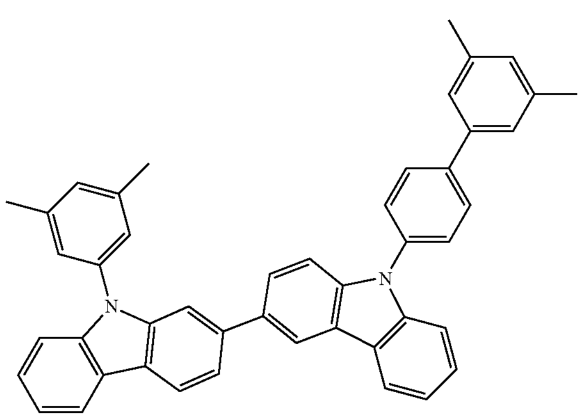
-continued
135B
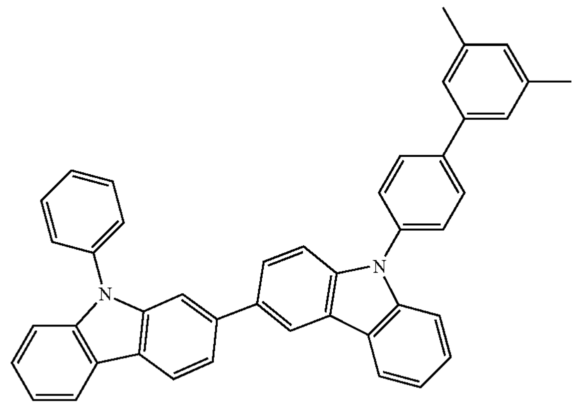
136B
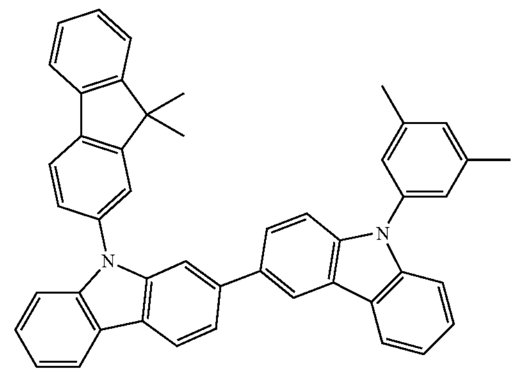
137B
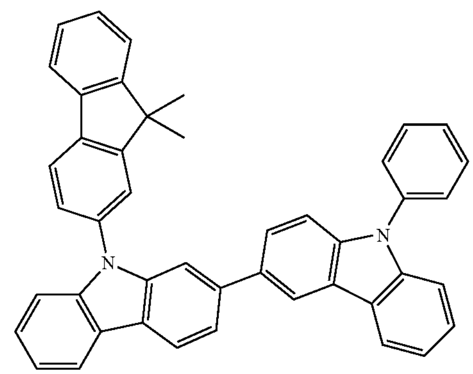
138B
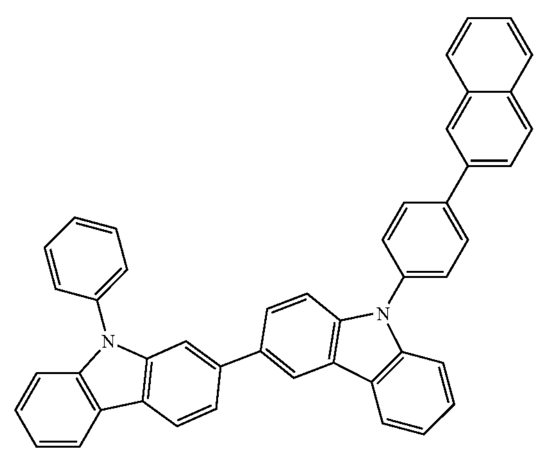

139B
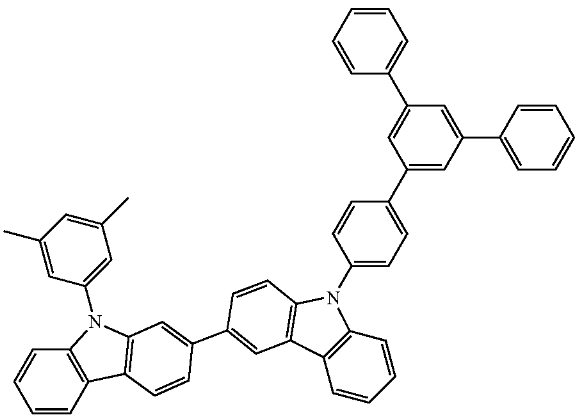
140B
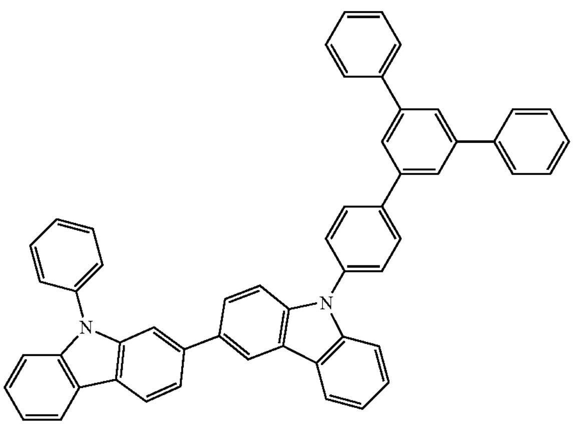
141B
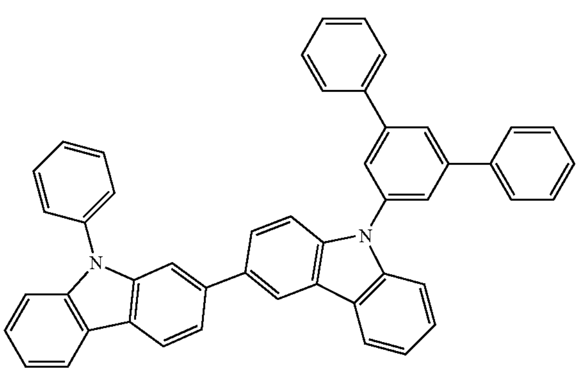
142B
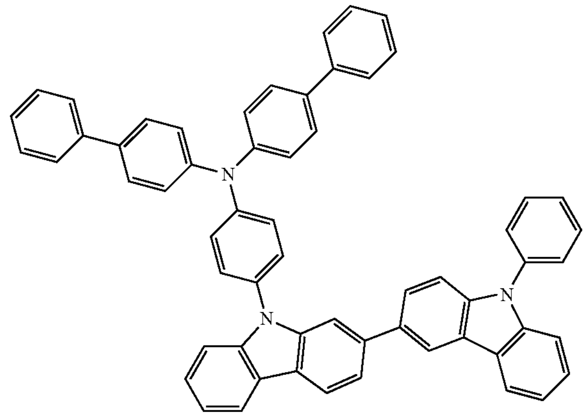
143B
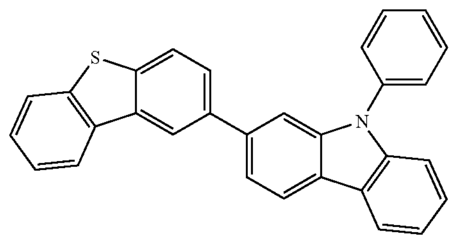
144B
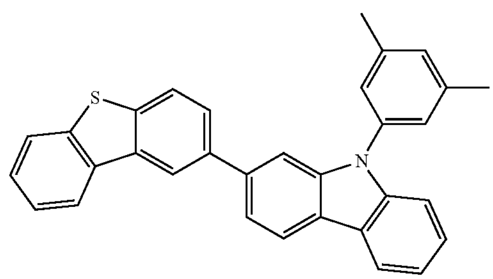
145B
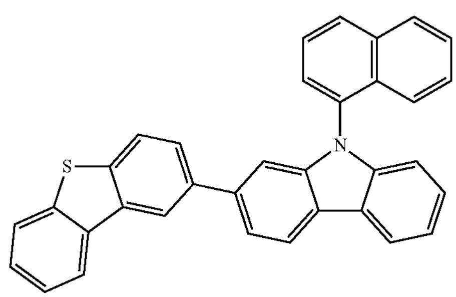
146B
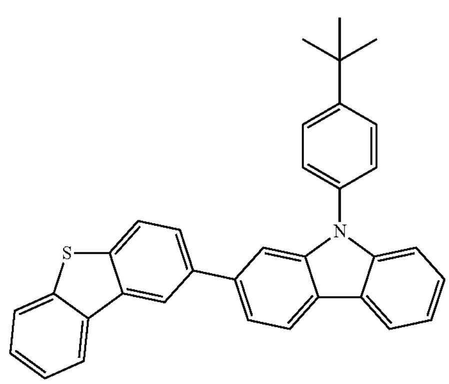

-continued
147B
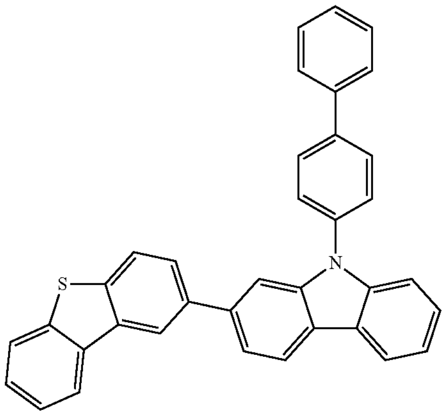
148B
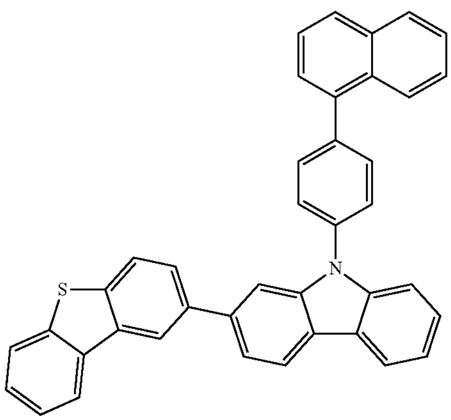
149B
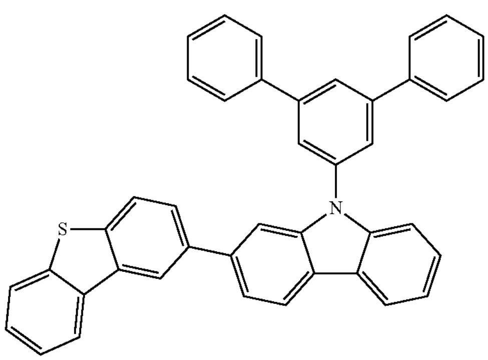
150B
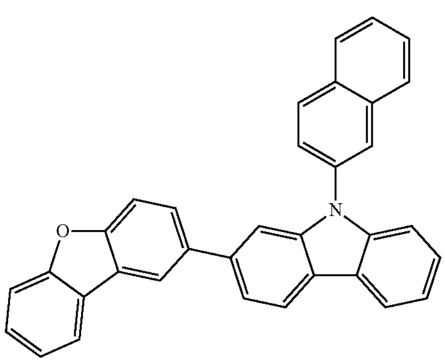
-continued
151B
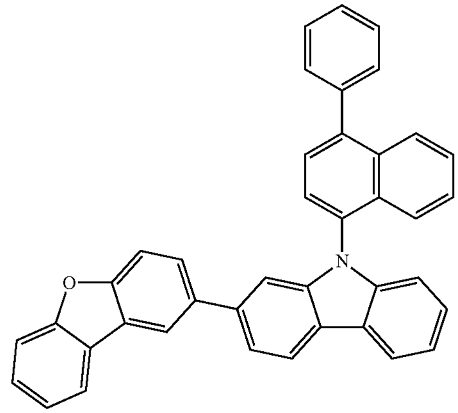
152B
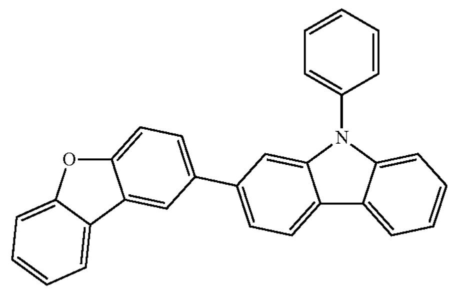
153B
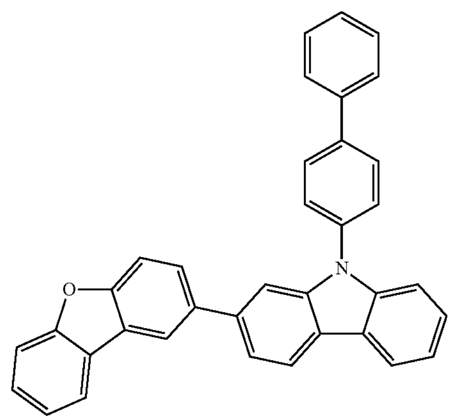
154B
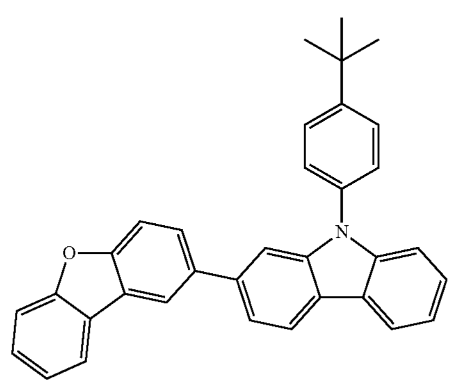

-continued
155B
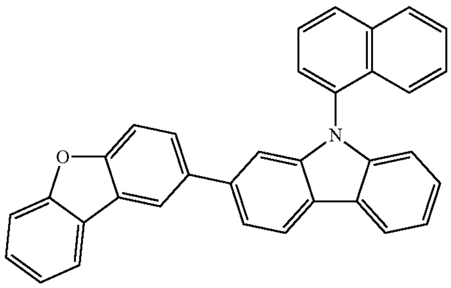
156B
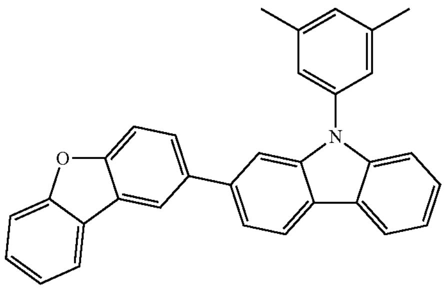
157B
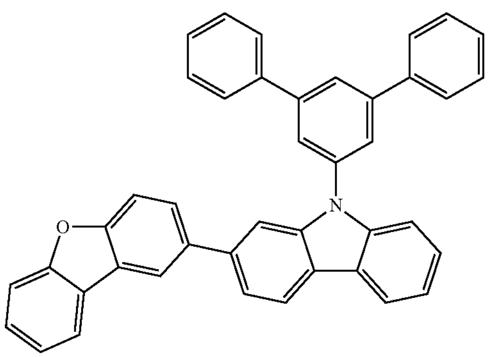
158B
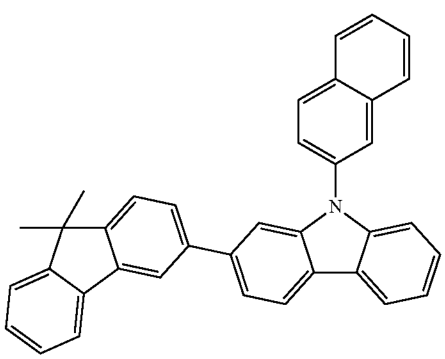
159B
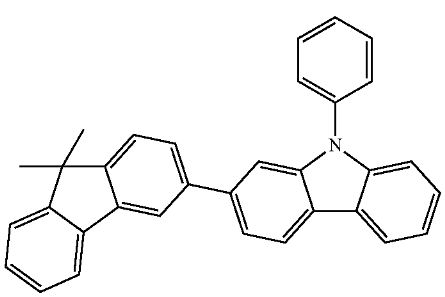
-continued
160B
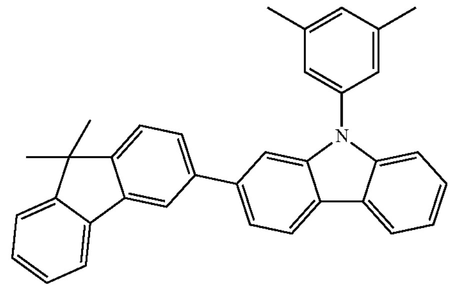
161B
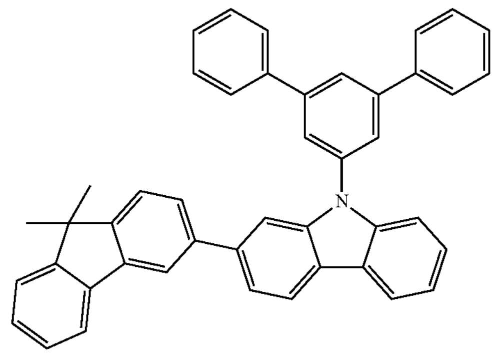
162B
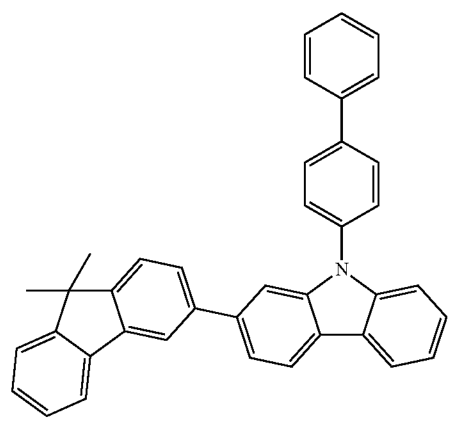
163B
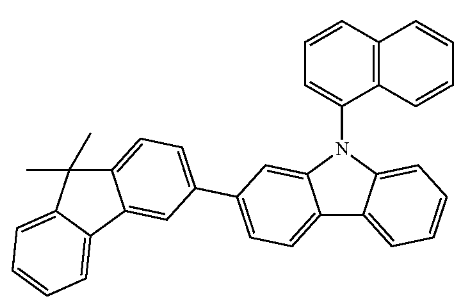

-continued
164B
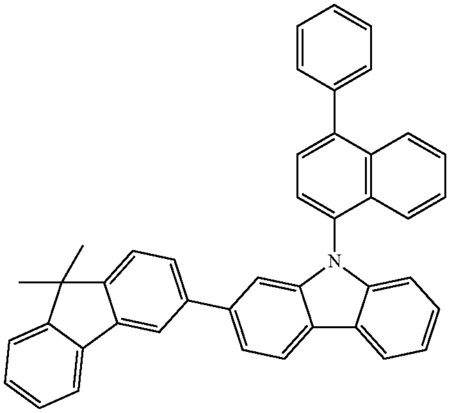
165B
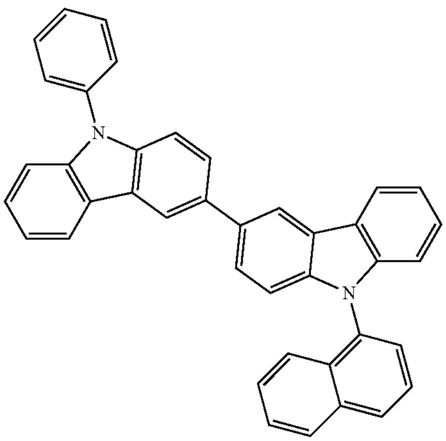
166B
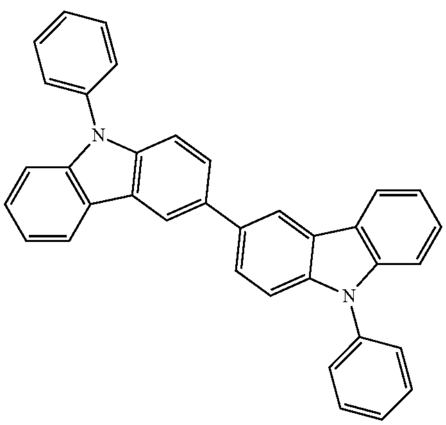
167B
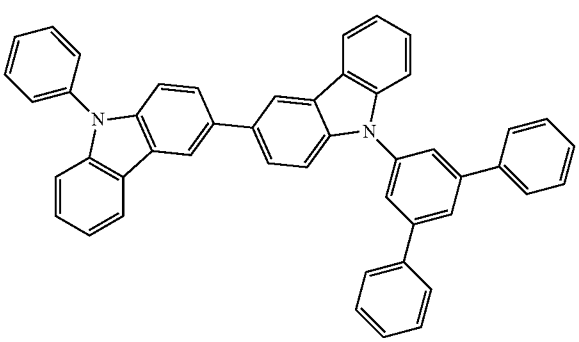
-continued
168B
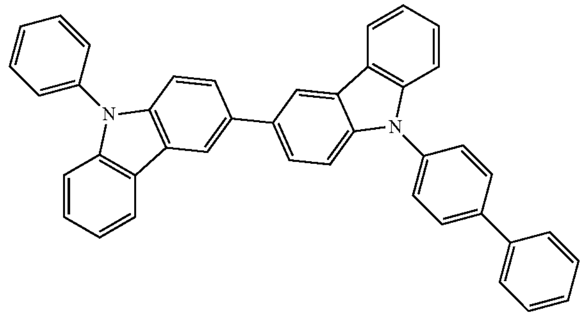
169B
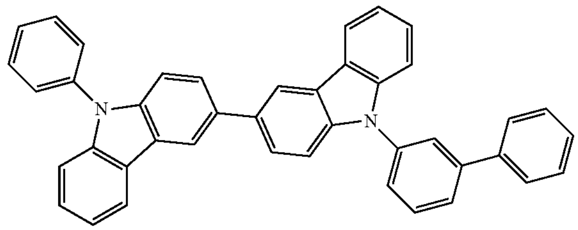
170B
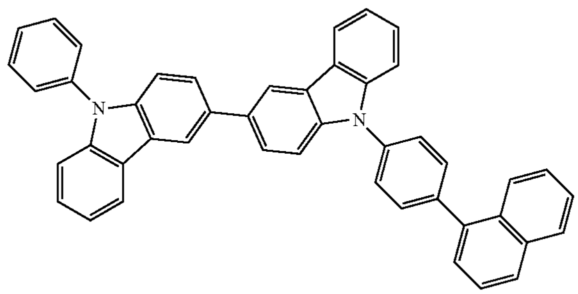
171B
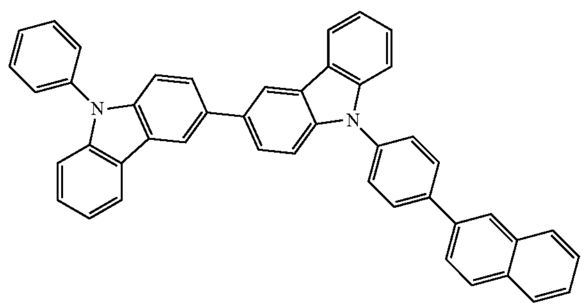
172B
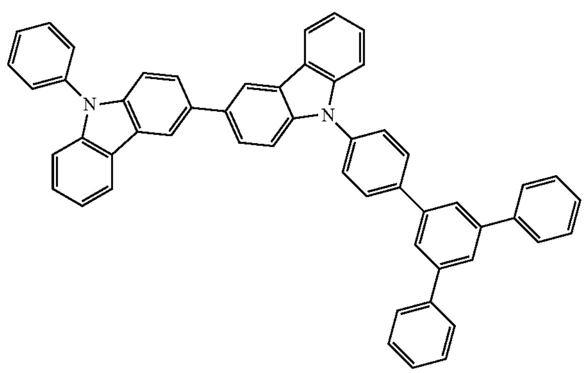

-continued
173B
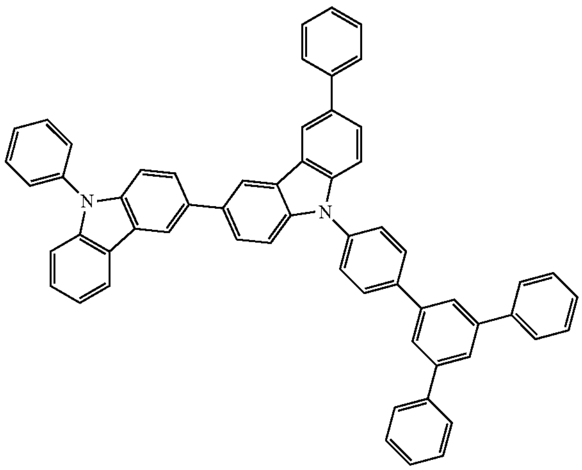
174B
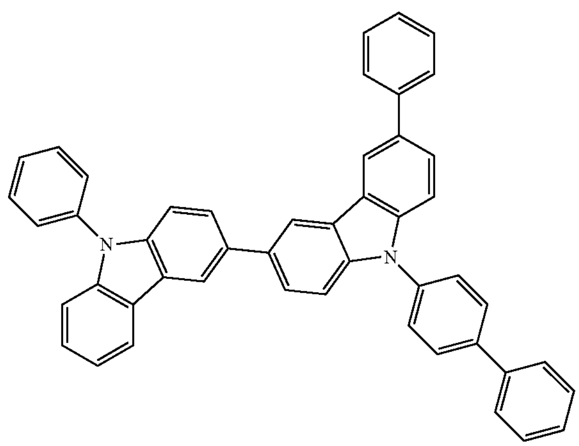
175B
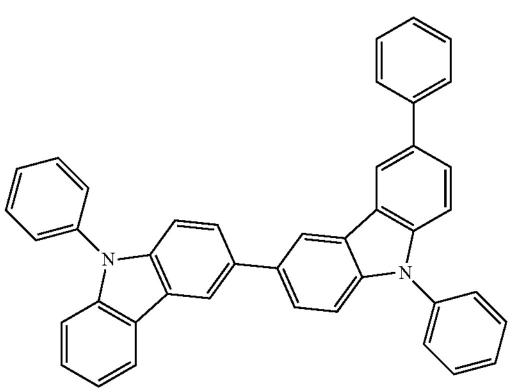
-continued
176B
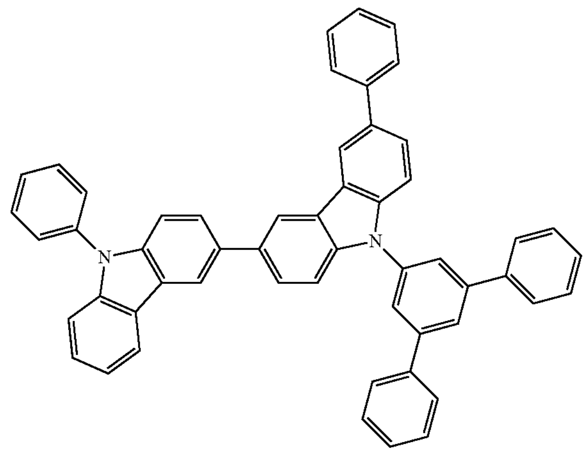
177B
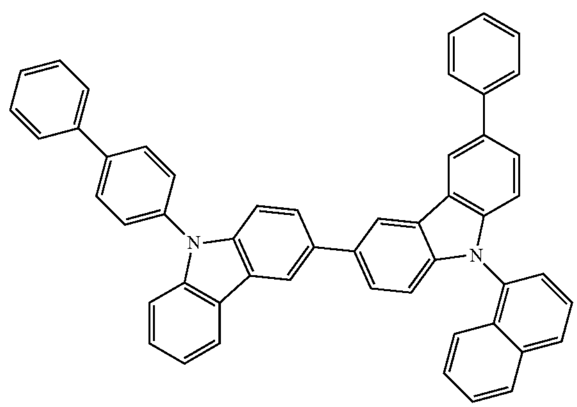
178B
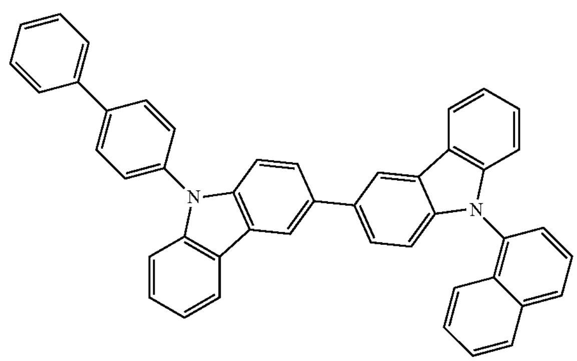
179B
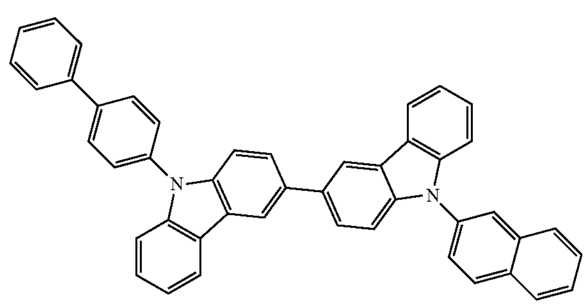

-continued
180B
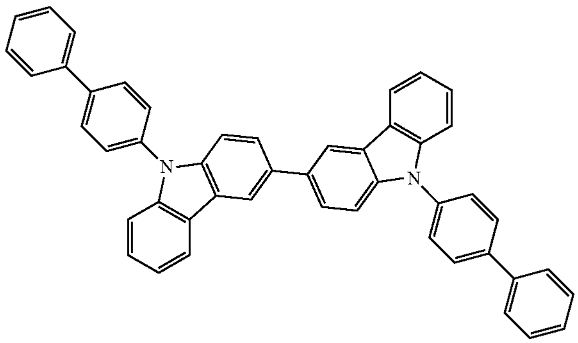
181B
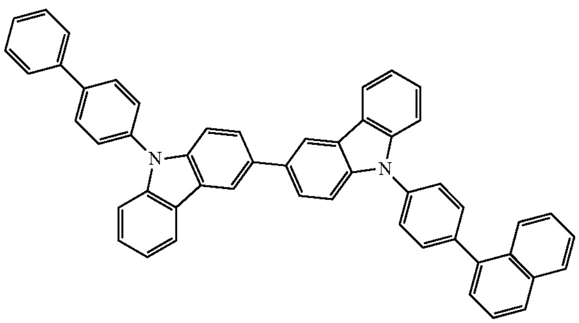
182B
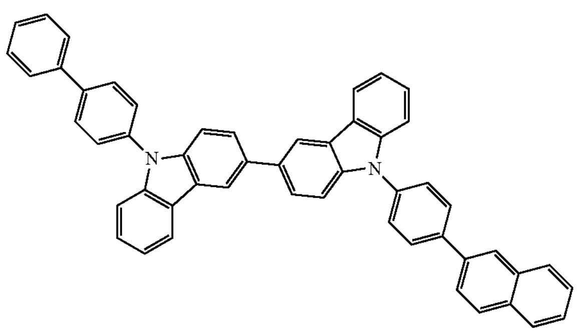
183B
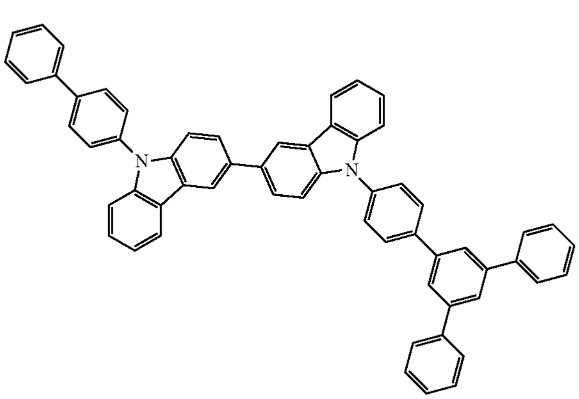
-continued
184B
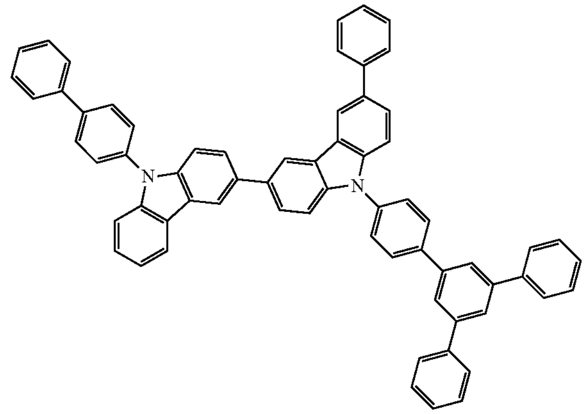
185B
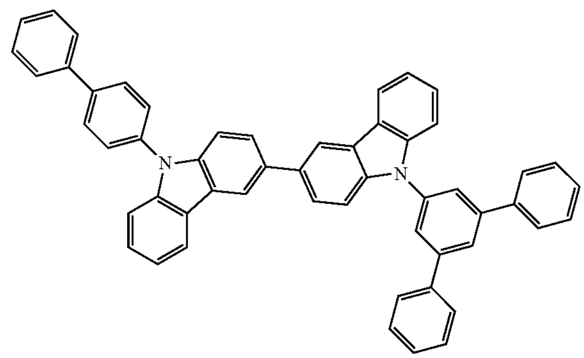
186B
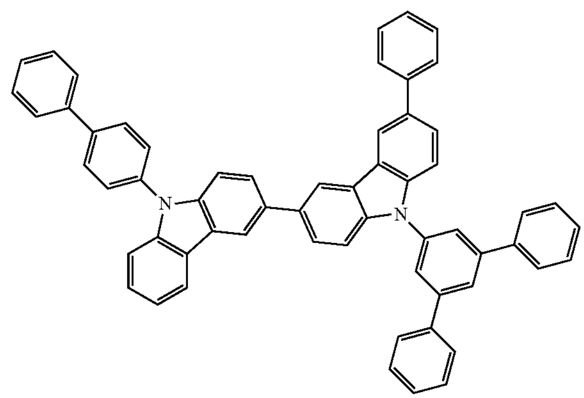
187B
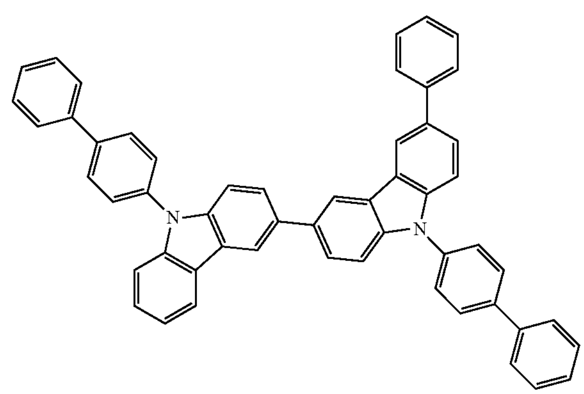

-continued
188B
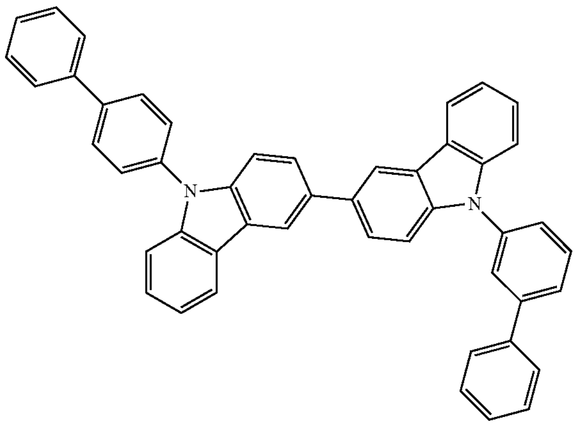
189B
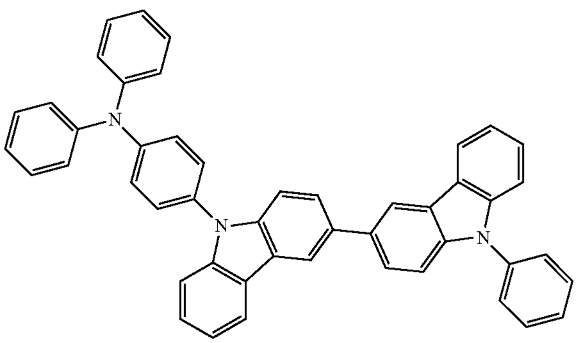
190B
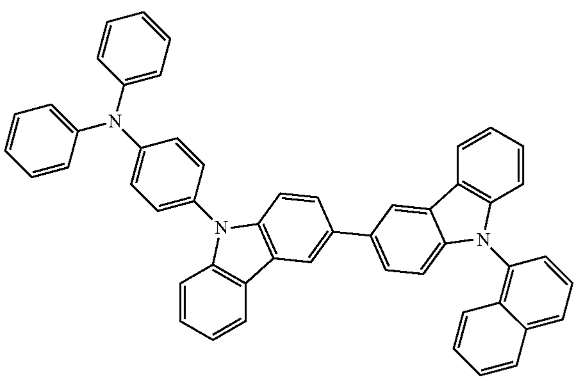
191B
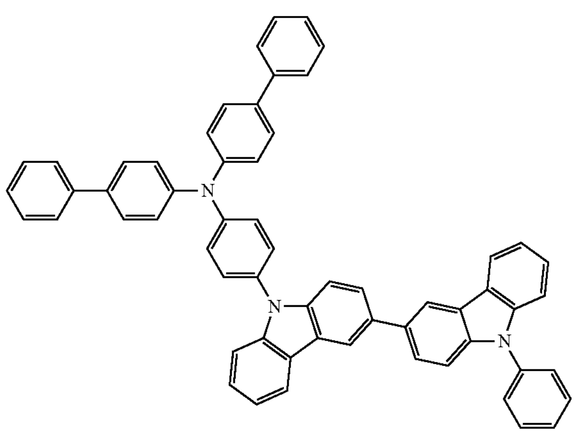
-continued
192B
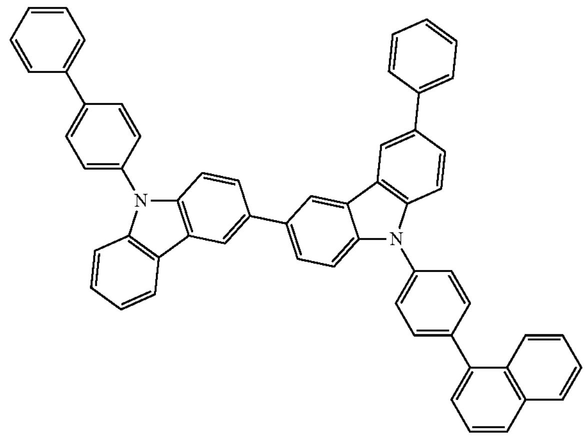
193B
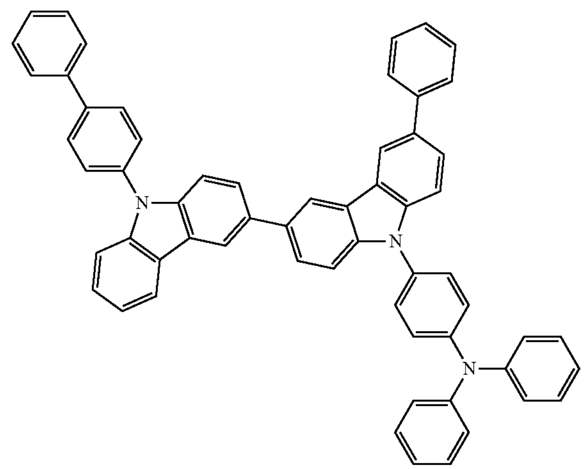
194B
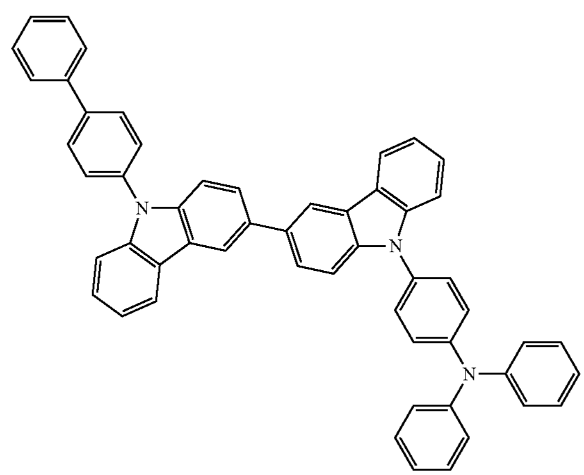

-continued
195B
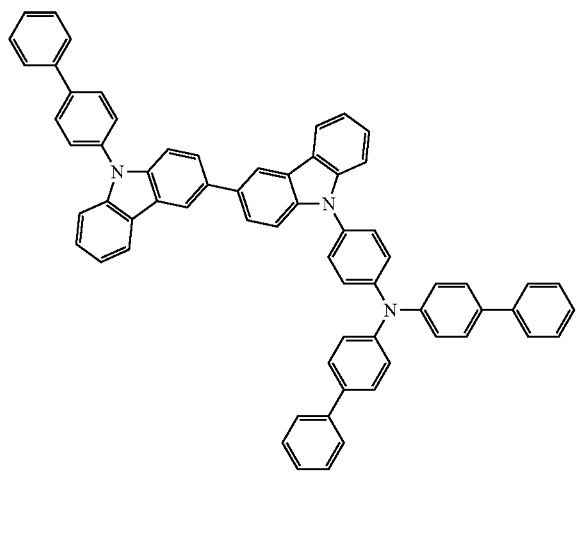
196B
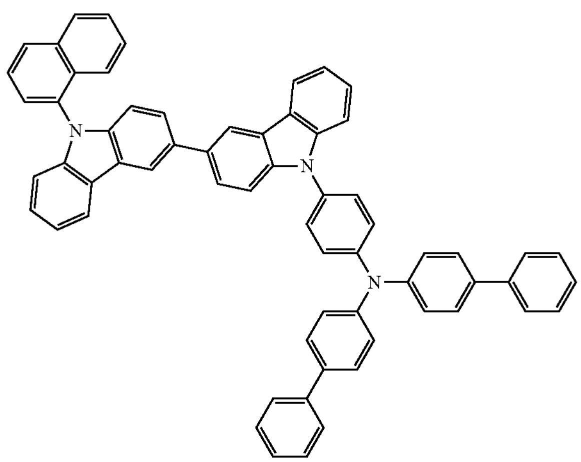
197B
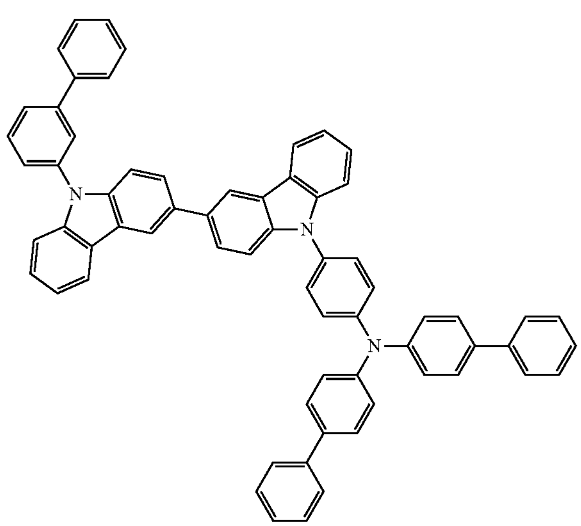
-continued
198B
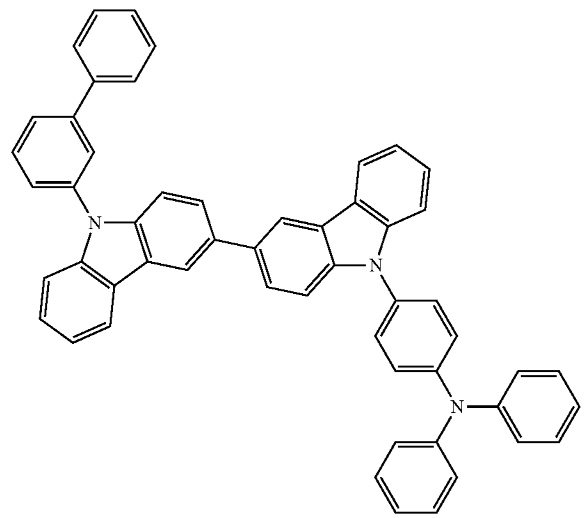
199B
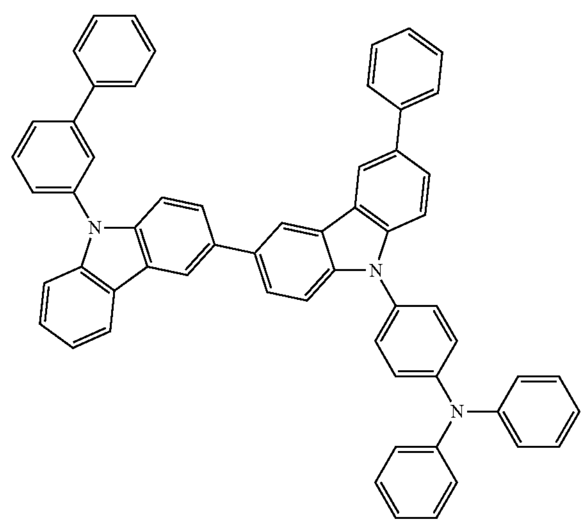
200B
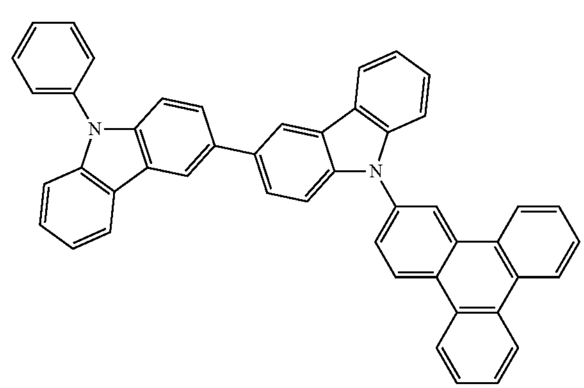

-continued
201B
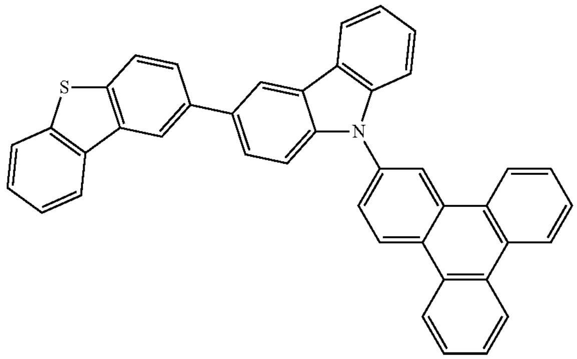
202B
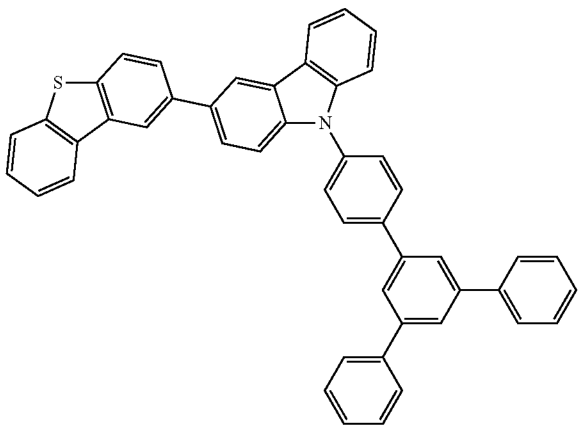
203B
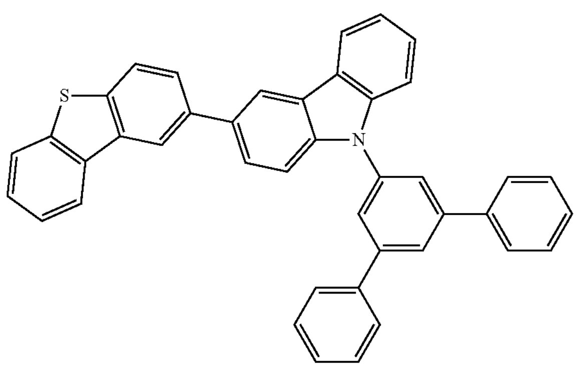
204B
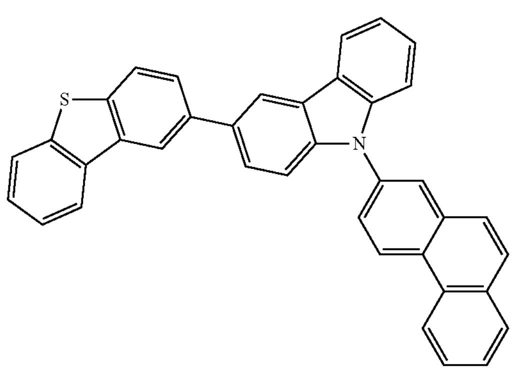
-continued
205B
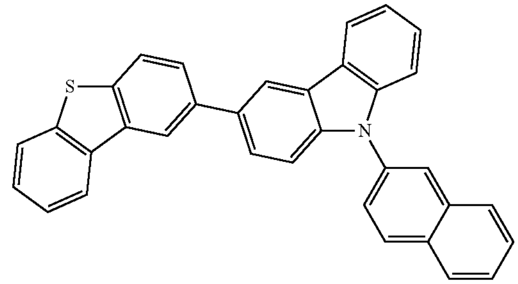
206B
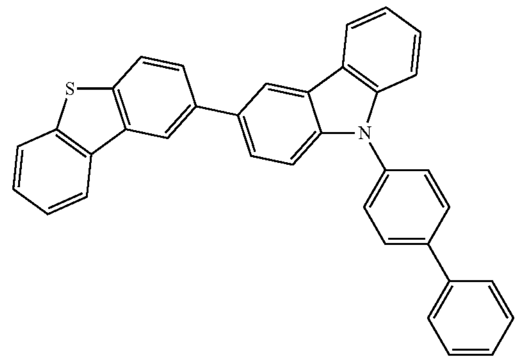
207B
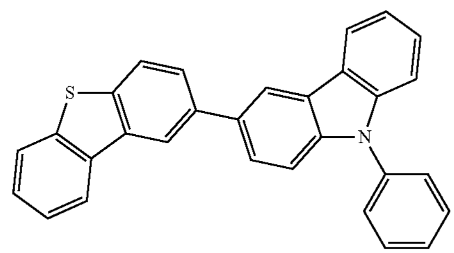
208B
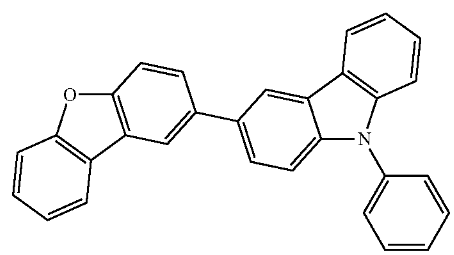
209B
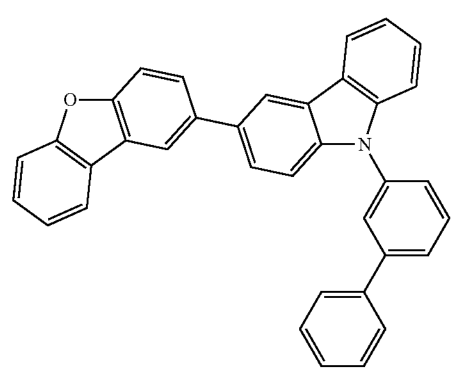

-continued
210B
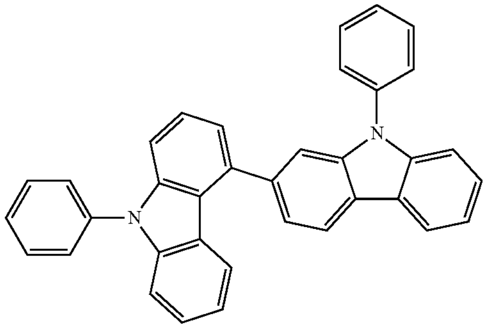
211B
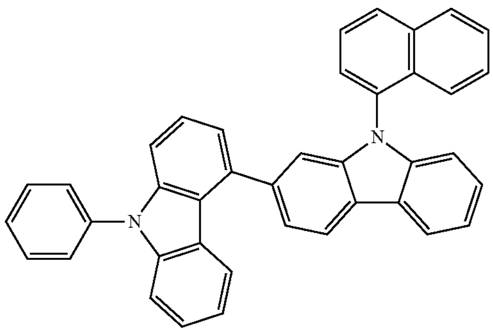
212B
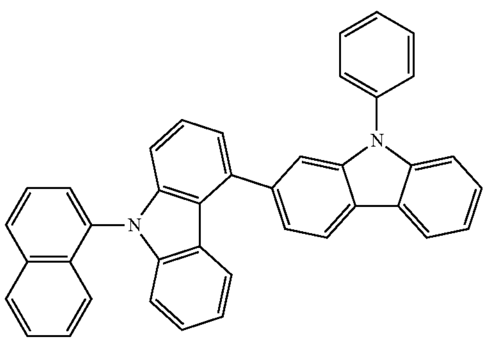
213B
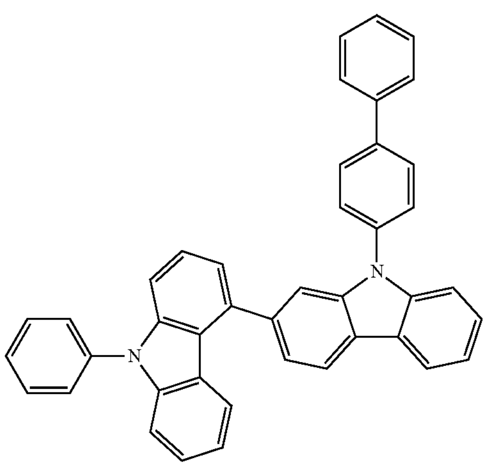
-continued
214B
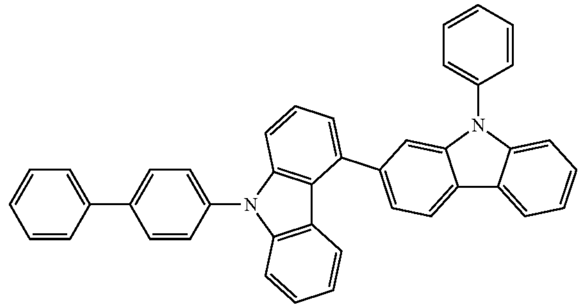
215B
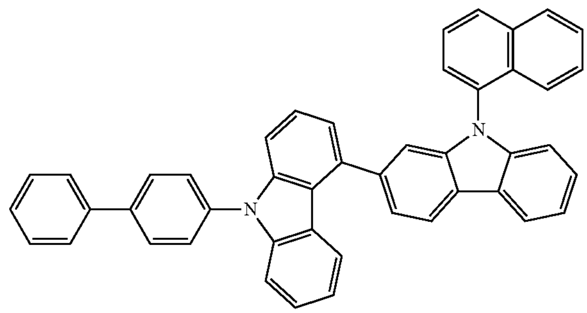
216B
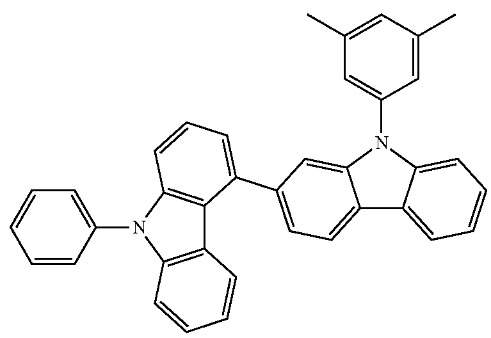
217B
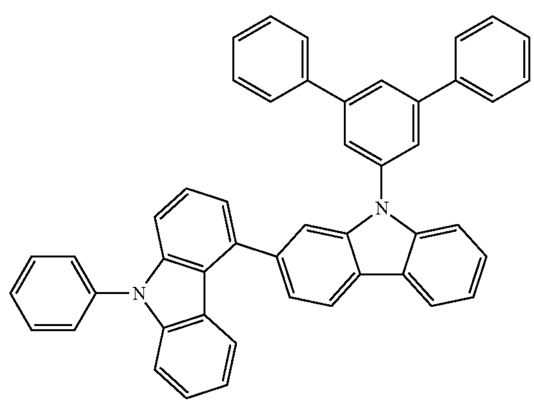

-continued
218B
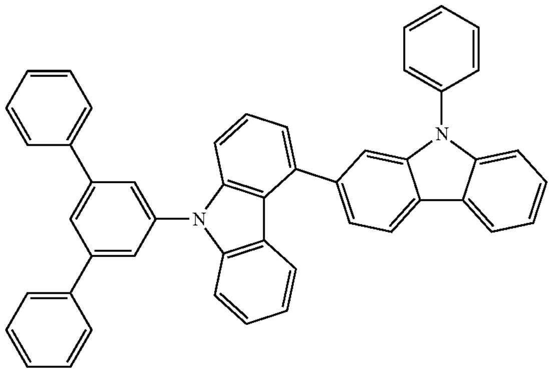
219B
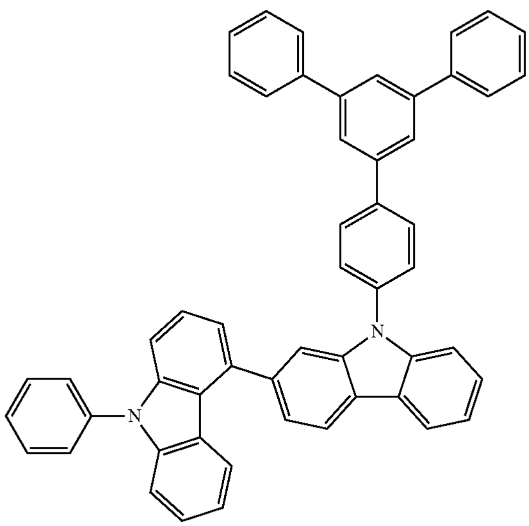
220B
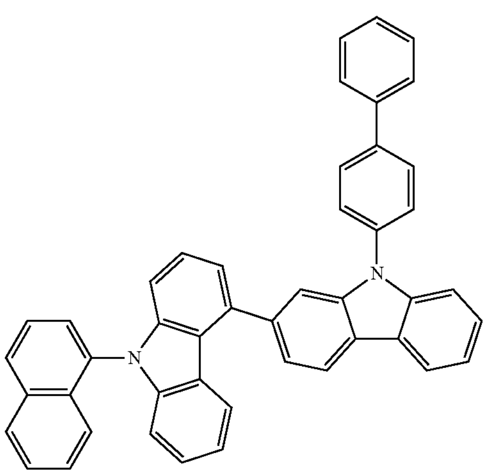
-continued
221B
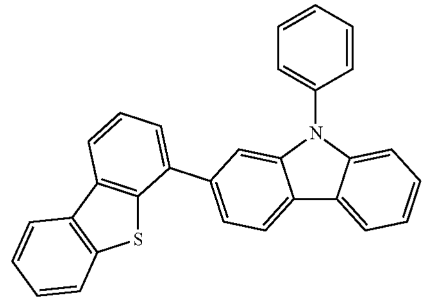
222B
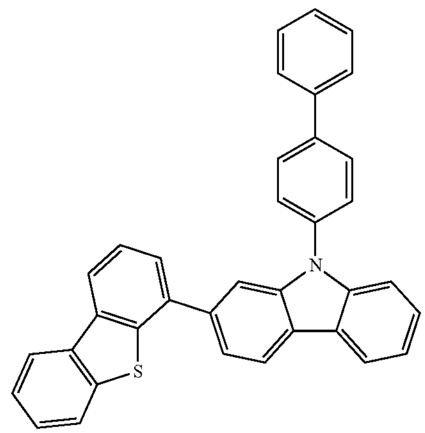
223B
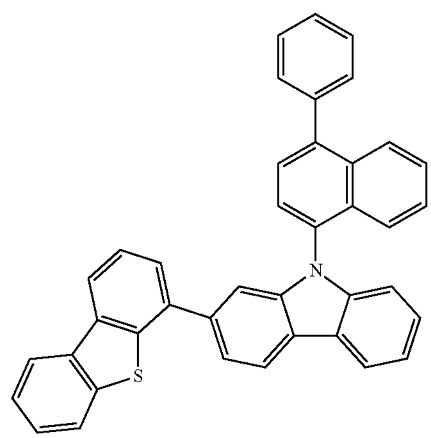
224B
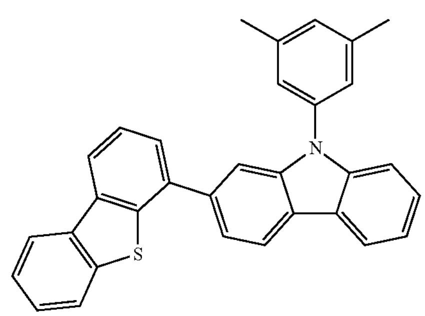

-continued
225B
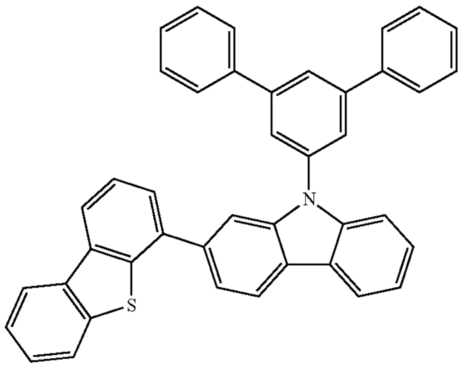
226B
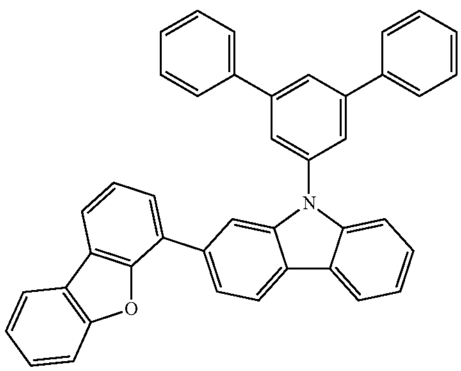
227B
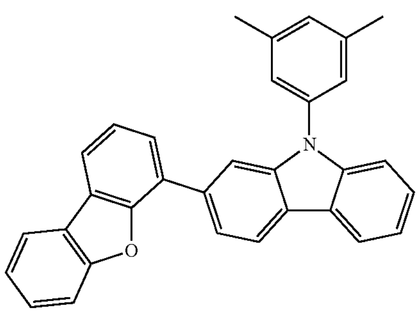
228B
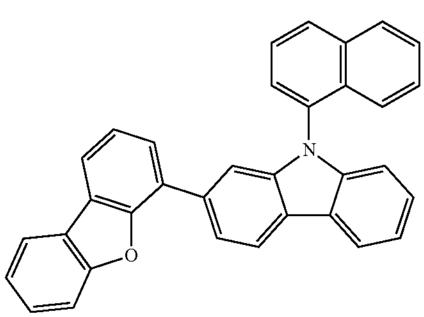
-continued
229B
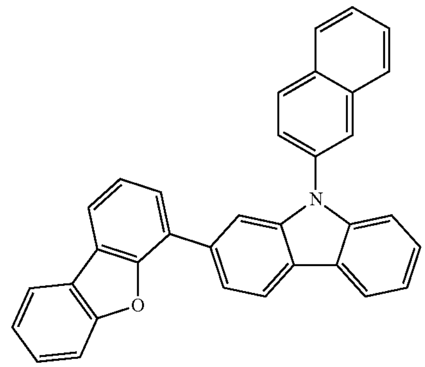
230B
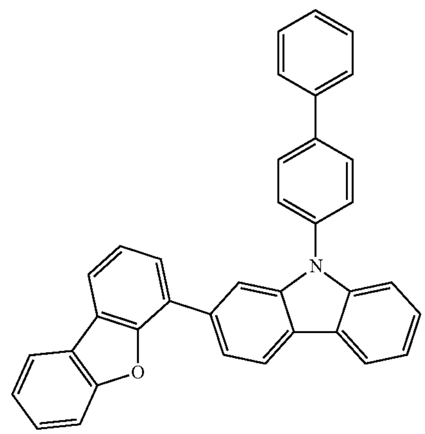
301A
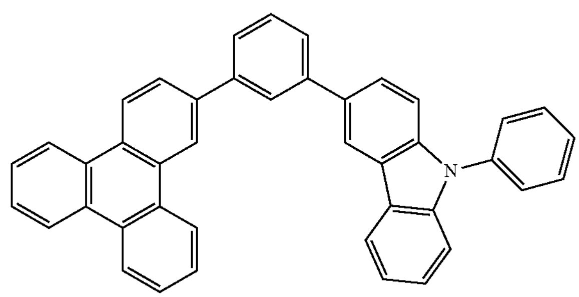
302A
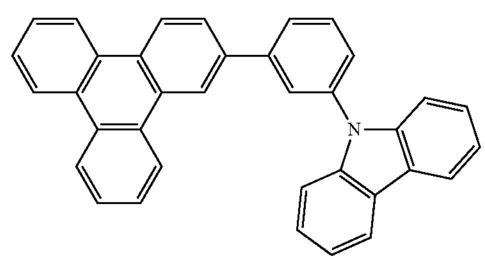
303A
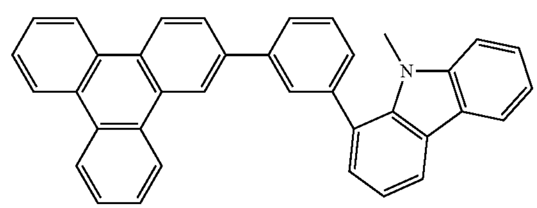

-continued
304A
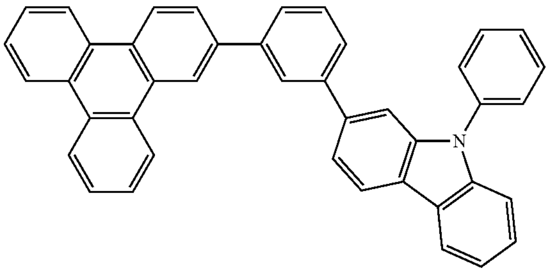
305A
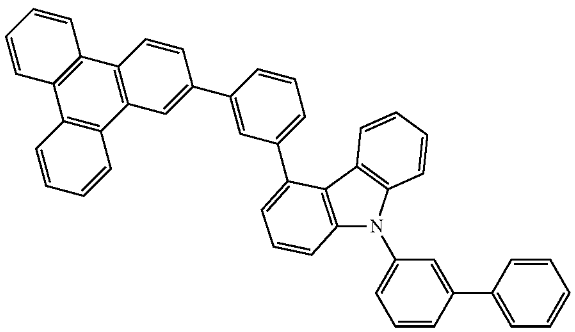
306A
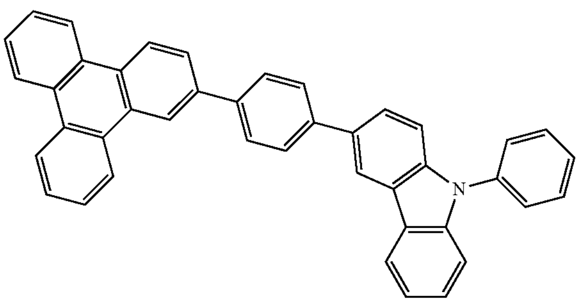
307A
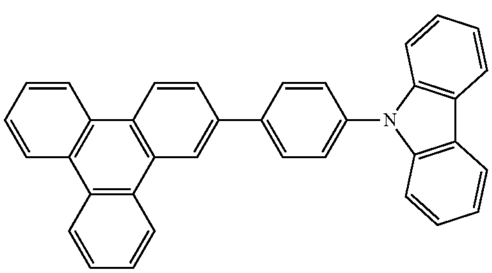
308A
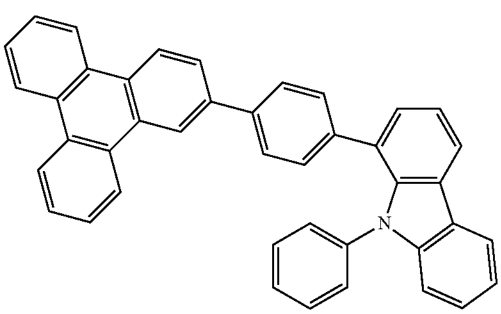
-continued
309A
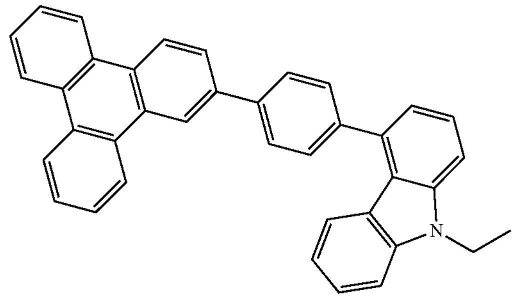
310A
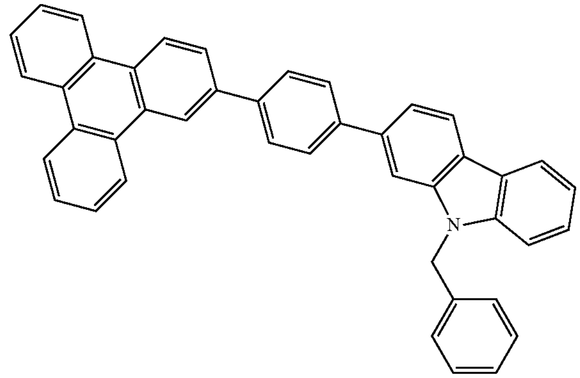
311A
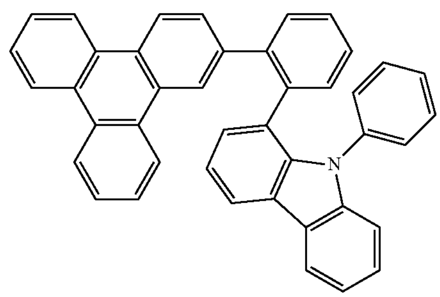
312A
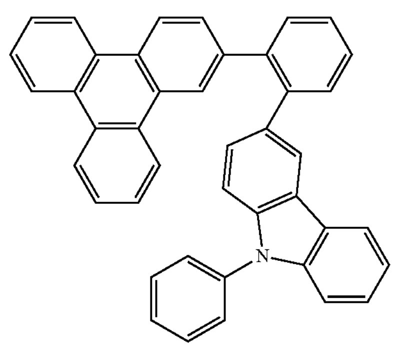

-continued
313A
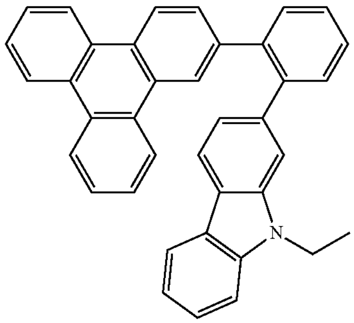
314A
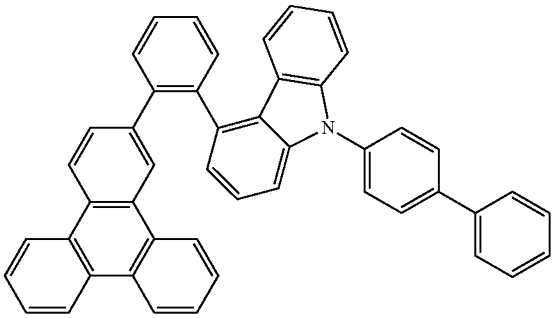
315A
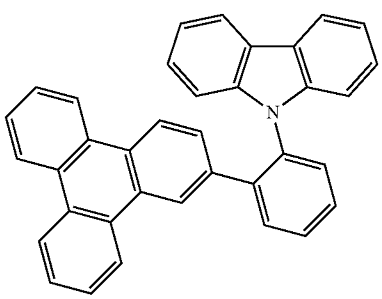
316A
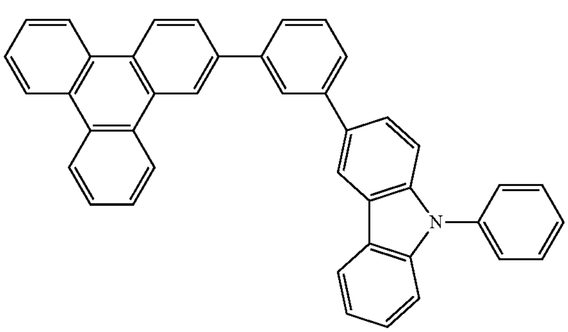
-continued
317A
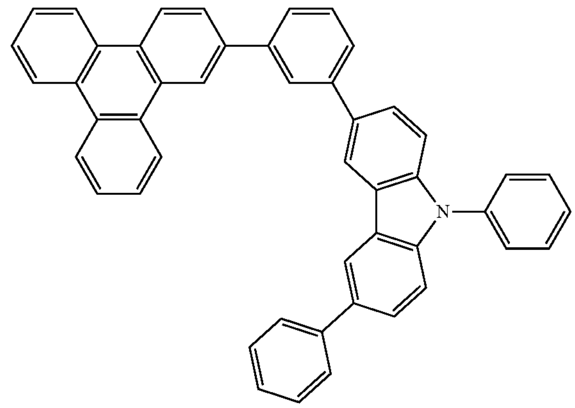
318A
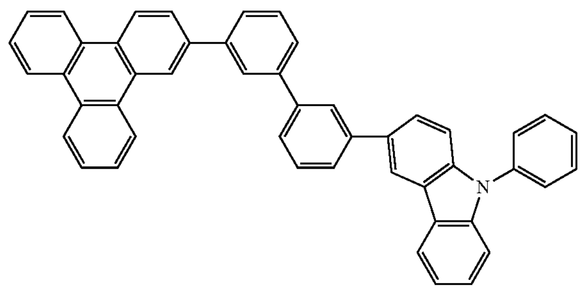
319A
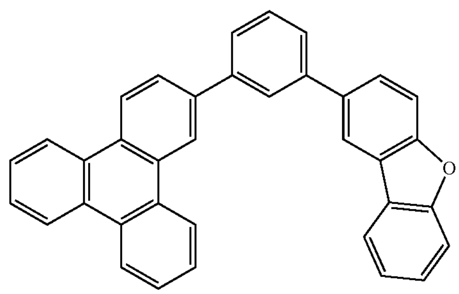
320A
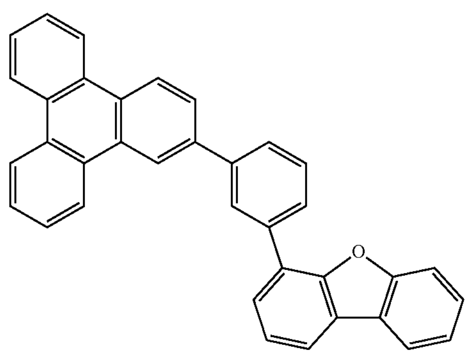

-continued
321A
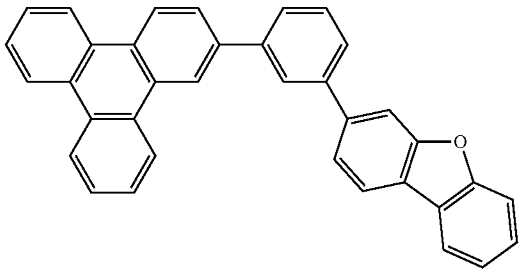
322A
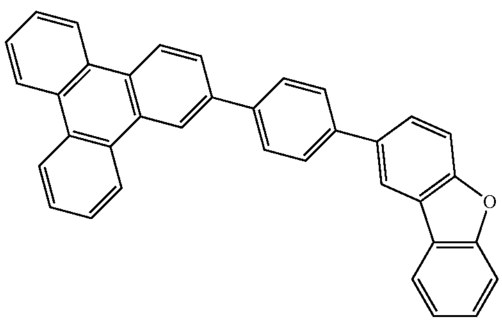
323A
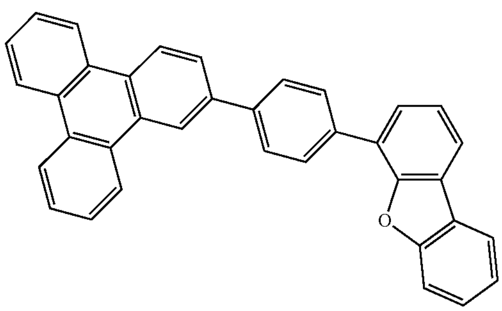
324A
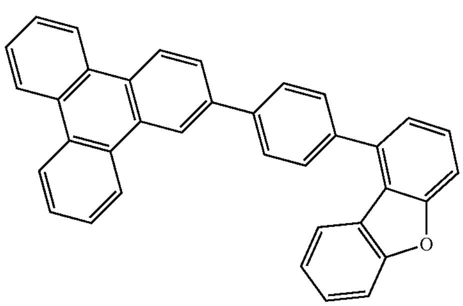
325A
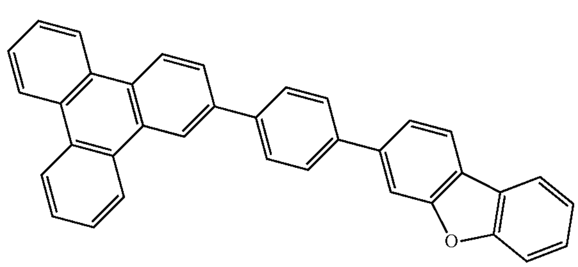
-continued
326A
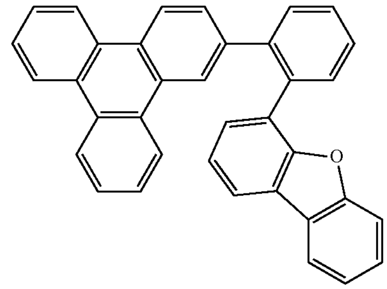
327A
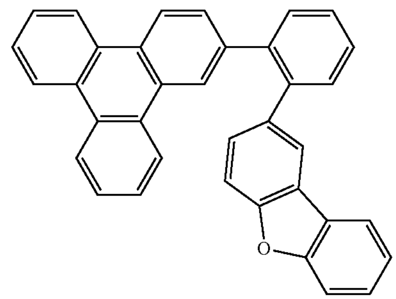
328A
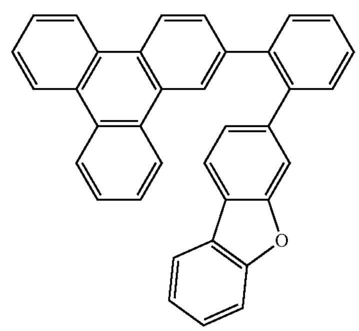
329A
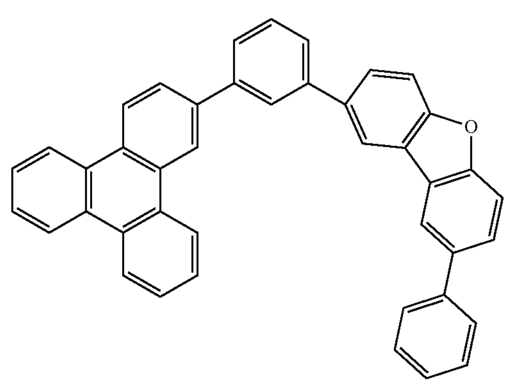

-continued
330A
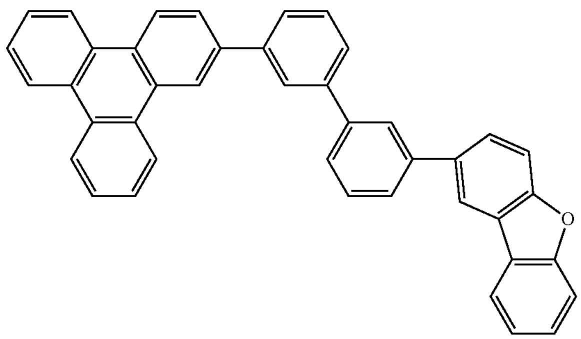
331A
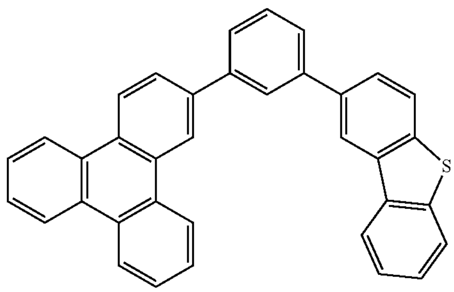
332A
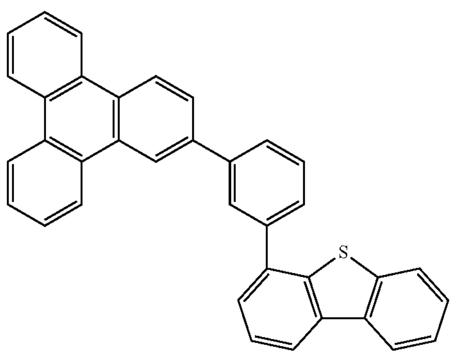
333A
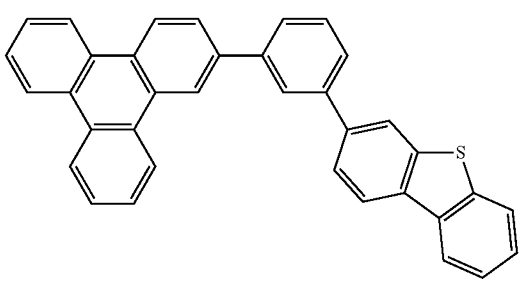
334A
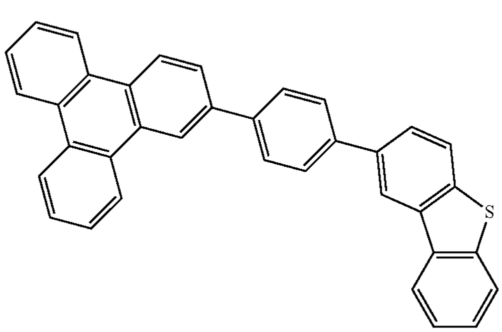
-continued
335A
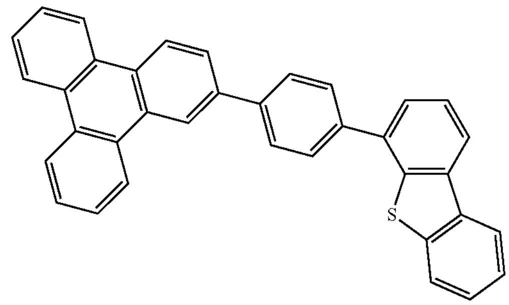
336A
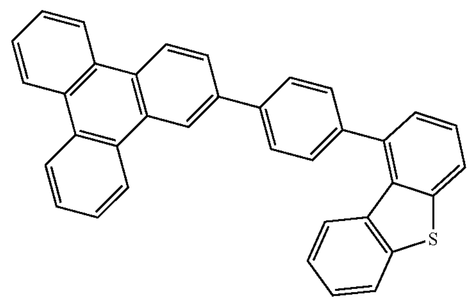
337A
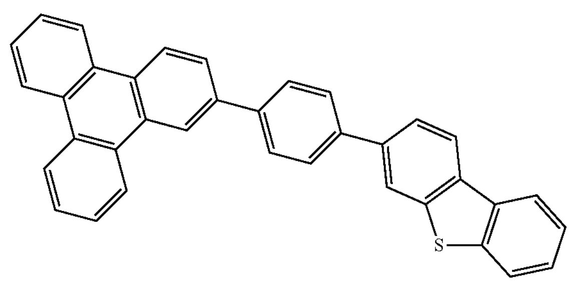
338A
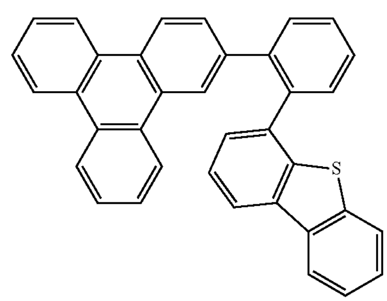
339A
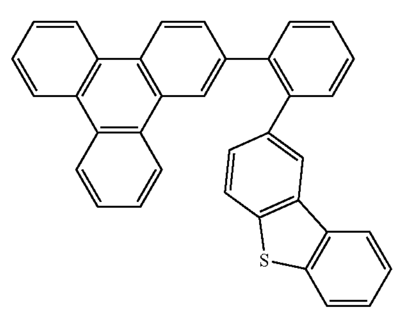

-continued

340A

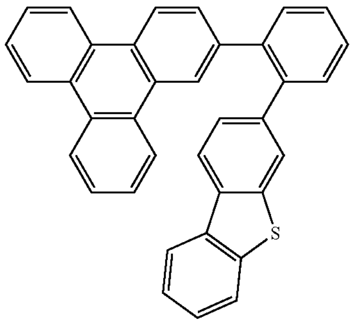

341A

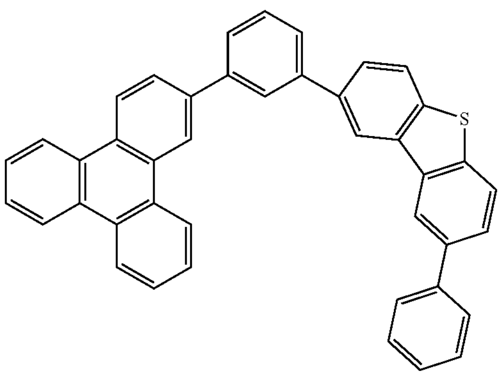

342A

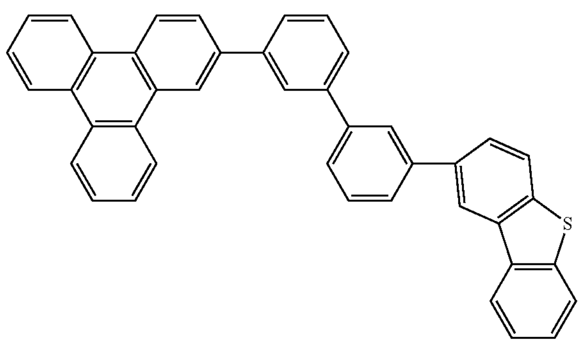

In an implementation, the buffer layer may directly contact the emission layer.

[Description of FIG. 1]

FIG. 1 illustrates HOMO/LUMO energies of a first compound, a third compound, and a fourth compound in an organic light-emitting device according to an embodiment.

Referring to FIG. 1, the first compound, the third compound, and the fourth compound may satisfy Equations 1 to 3.

Figure 2:
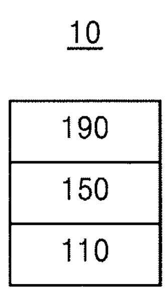
FIG. 2 illustrates a schematic view of an organic light-emitting device according to an embodiment

[Description of FIG. 2]

FIG. 2 illustrates a schematic view of an organic light-emitting device 10 according to an embodiment. The organic light-emitting device 10 may include a first electrode 110, an organic layer 150, and a second electrode 190.

Hereinafter, the structure of the organic light-emitting device 10 according to an embodiment and a method of manufacturing the organic light-emitting device 10 will be described in connection with FIG. 2.

[First Electrode 110]

In an implementation, a substrate may be additionally disposed under the first electrode 110 or above the second electrode 190. The substrate may be a glass substrate or a plastic substrate, each having excellent mechanical strength, thermal stability, transparency, surface smoothness, ease of handling, and water-resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combinations thereof. When the first electrode 110 is a semi-transmissive electrode or a reflective electrode, a material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof.

The first electrode 110 may have a single-layered structure, or a multi-layered structure including two or more layers. In an implementation, the first electrode 110 may have a three-layered structure of ITO/Ag/ITO.

[Organic Layer 150]

The organic layer 150 may be disposed on the first electrode 110. The organic layer 150 may include an emission layer.

The organic layer 150 may include a hole transport region between the first electrode 110 and the emission layer, and an electron transport region between the emission layer and the second electrode 190.

[Hole Transport Region in Organic Layer 150]

The hole transport region may have, e.g., i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer (HIL), a hole transport layer (HTL), an emission auxiliary layer, and an electron blocking layer (EBL).

In an implementation, the hole transport region may have a single-layered structure including a single layer including a plurality of different materials, or a multi-layered structure having a structure of hole injection layer/hole transport layer, hole injection layer/hole transport layer/emission auxiliary layer, hole injection layer/emission auxiliary layer, hole transport layer/emission auxiliary layer or hole injection layer/hole transport layer/electron blocking layer, wherein layers of each structure are sequentially stacked from the first electrode 110 in this stated order.

The hole transport region may include at least one selected from m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), PEDOT/PSS (poly(3,4-ethylenedioxythiophene)/poly(4-styrenesulfonate)), polyaniline/camphor sulfonic acid (Pani/CSA), polyaniline/poly(4-styrene sulfonate) (Pani/PSS), a compound represented by Formula 201, and a compound represented by Formula 202.

-continued
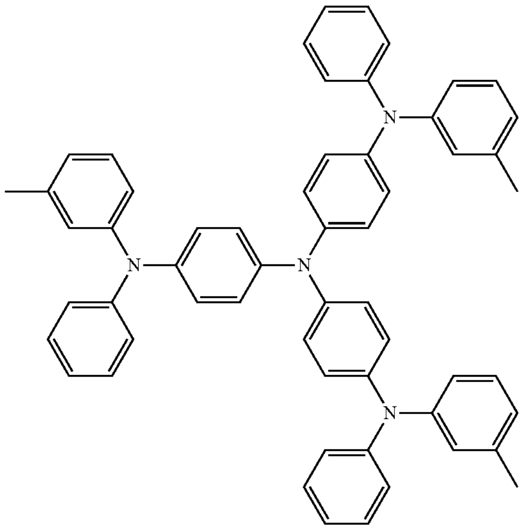
m-MTDATA
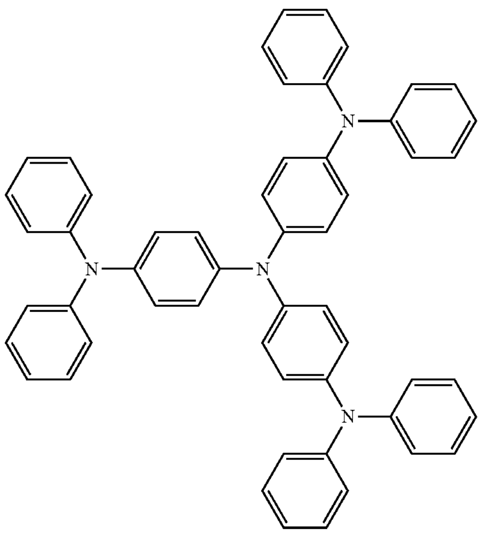
TDATA
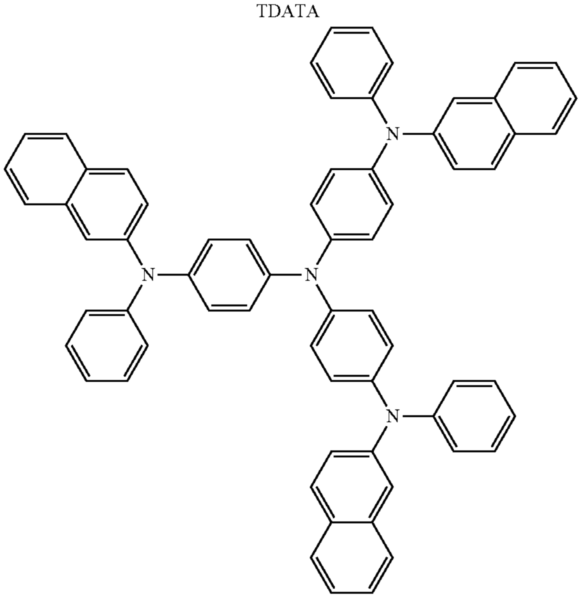
2-TNATA
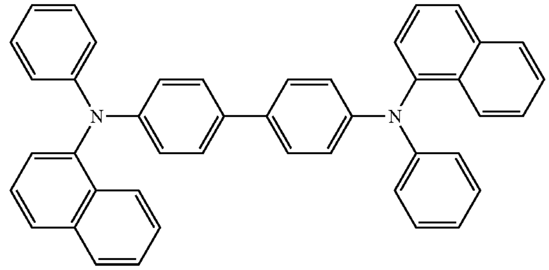
NPB
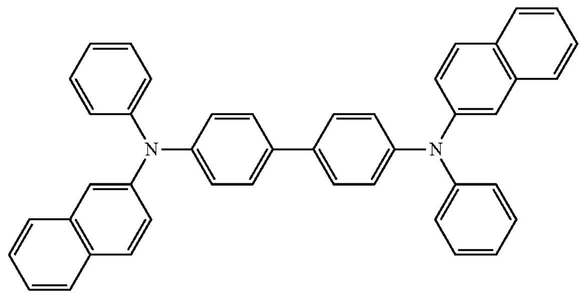
β-NPB
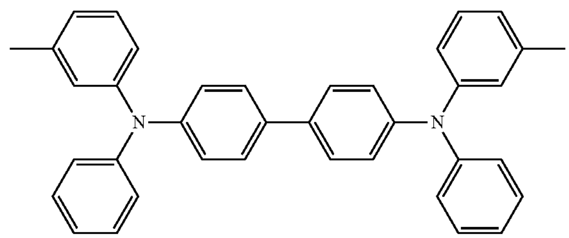
TPD
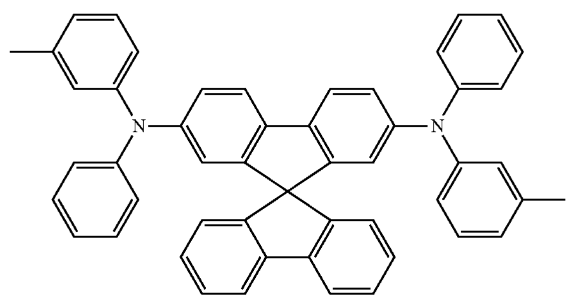
Spiro-TPD
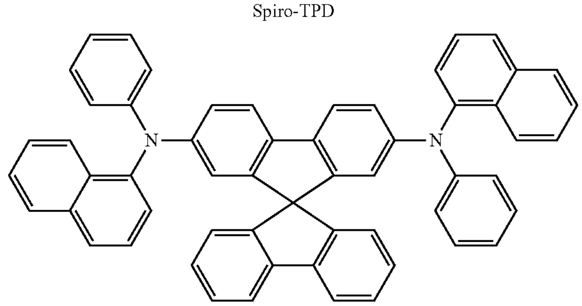
Spiro-NPB -continued

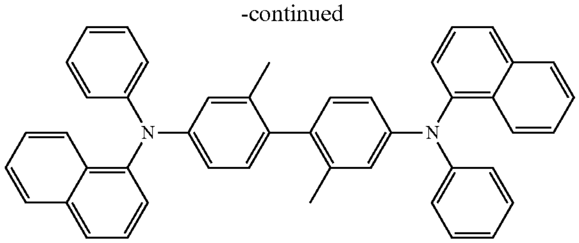

methylated NPB

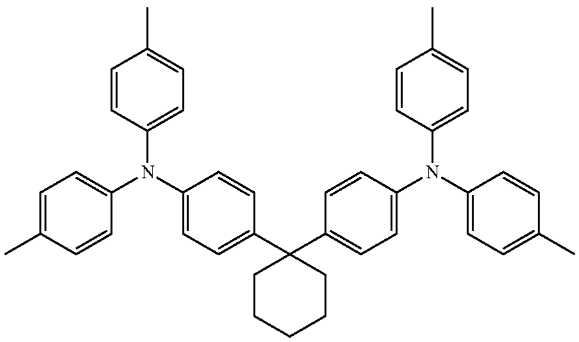

TAPC

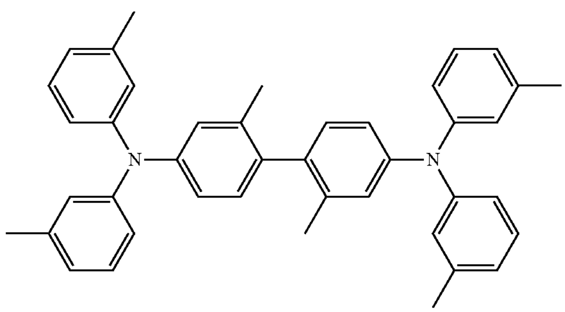

HMTPD

<Formula 201>

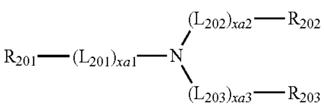

<Formula 202>

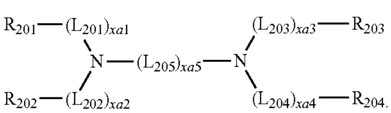

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked via a single bond, a dimethyl-methylene group, or a diphenyl-methylene group, and $R_{203}$ and $R_{204}$ may optionally be linked via a single bond, a dimethyl-methylene group, or a diphenyl-methylene group.

In an implementation, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In an implementation, xa1 to xa4 may each independently be 0, 1, or 2.

In an implementation, xa5 may be 1, 2, 3, or 4.

In an implementation, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ may be the same as described above.

In an implementation, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group.

In an implementation, in Formula 202, i) $R_{201}$ and $R_{202}$ may be linked via a single bond, and/or ii) $R_{203}$ and $R_{204}$ may be linked via a single bond.

In an implementation, at least one selected from $R_{201}$ to $R_{204}$ in Formula 202 may be selected from:

a carbazolyl group; and a carbazolyl group, substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group.

The compound represented by Formula 201 may be represented by Formula 201A.

<Formula 201A>

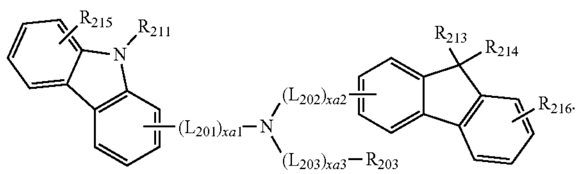

In an implementation, the compound represented by Formula 201 may be represented by Formula 201A(1) below.

<Formula 201a(1)>

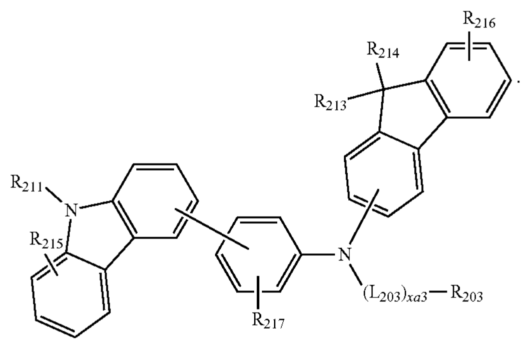

In an implementation, the compound represented by Formula 201 may be represented by Formula 201A-1.

<Formula 201A-1>

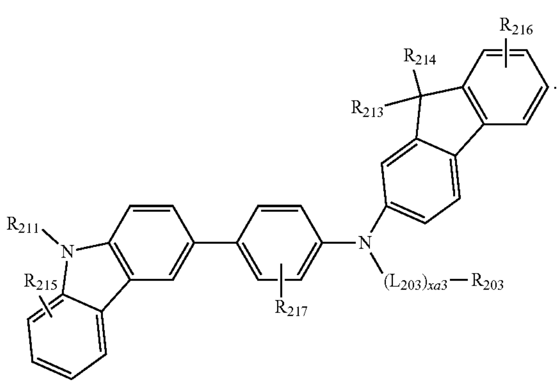

In an implementation, the compound represented by Formula 202 may be represented by Formula 202A.

<Formula 202A>

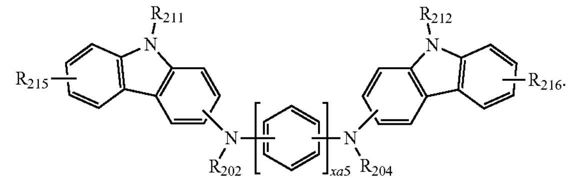

In an implementation, the compound represented by Formula 202 may be represented by Formula 202A-1.

<Formula 202A-1>

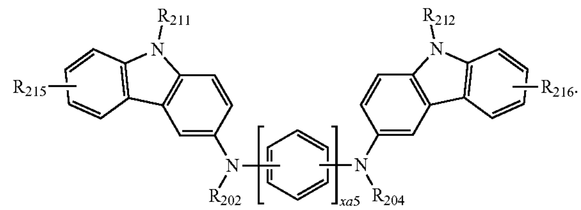

In Formulae 201A, 201A(1), 201A-1, 202A, and 202A-1, $L_{201}$ to $L_{203}$, xa1 to xa3, xa5, and $R_{202}$ to $R_{204}$ are the same as described above, $R_{211}$ and $R_{212}$ are the same as described in connection with $R_{203}$.

$R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In an implementation, the hole transport region may include at least one compound selected from Compounds HT1 to HT39.

HT1
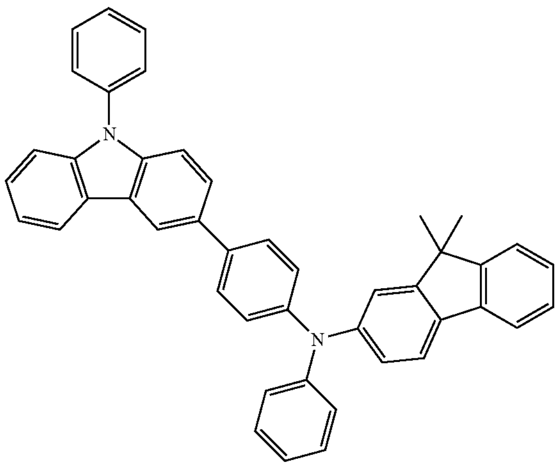
HT2
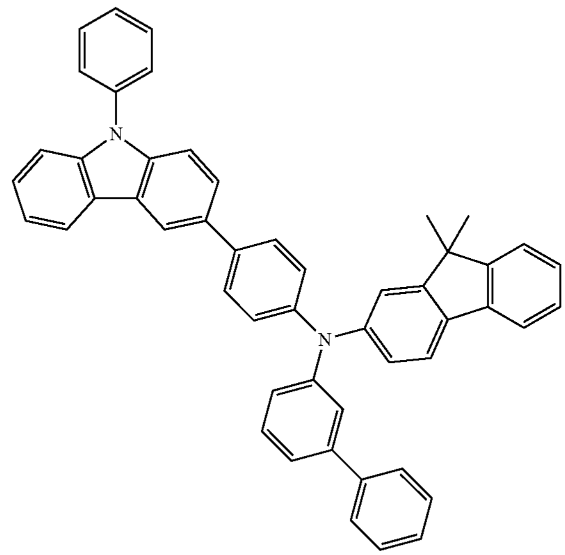
HT3
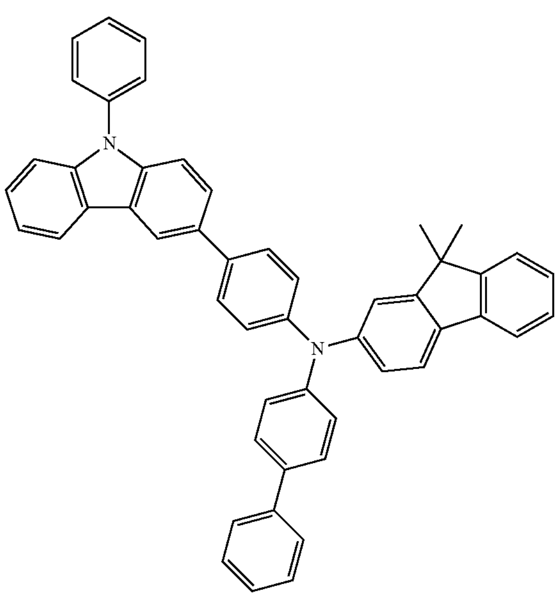
HT4
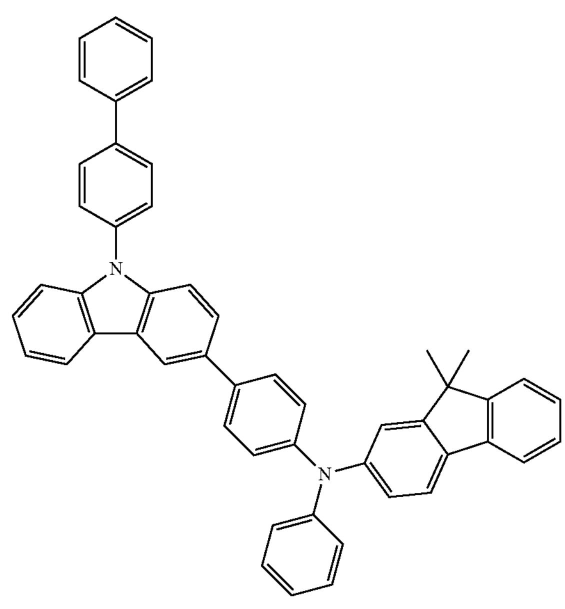

-continued
HT5
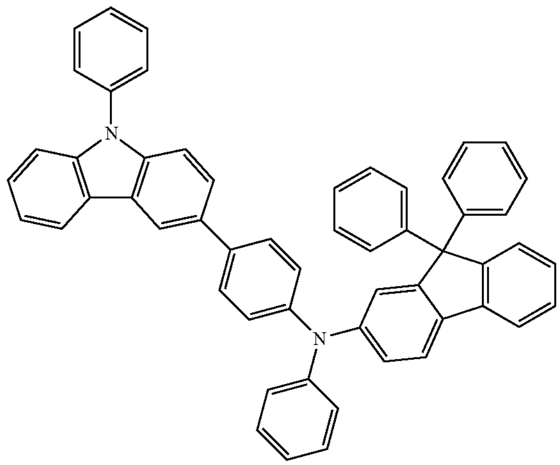
HT6
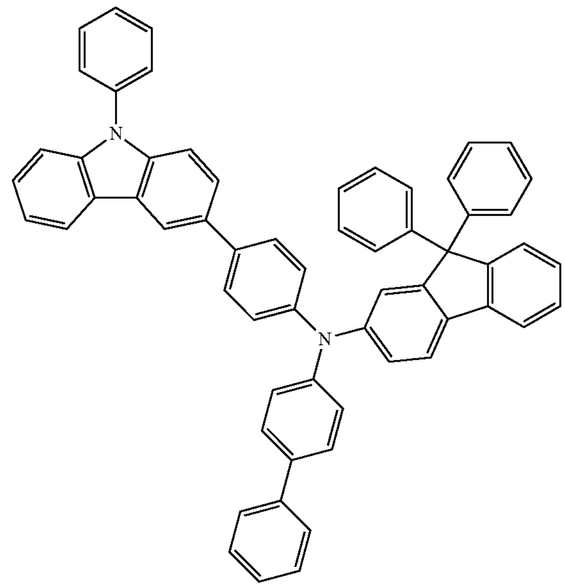
HT7
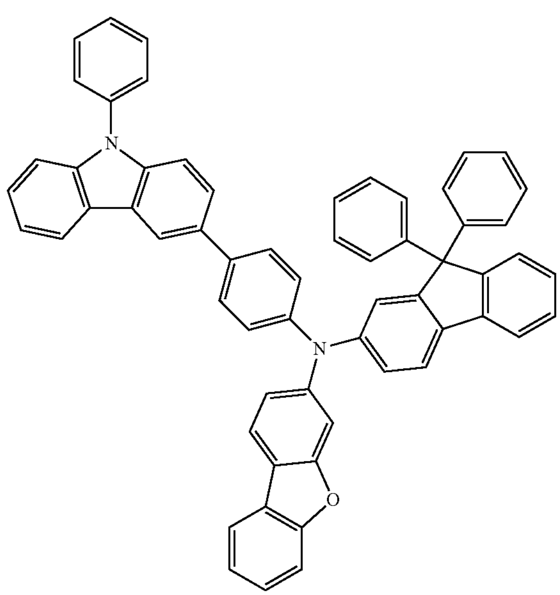
HT8
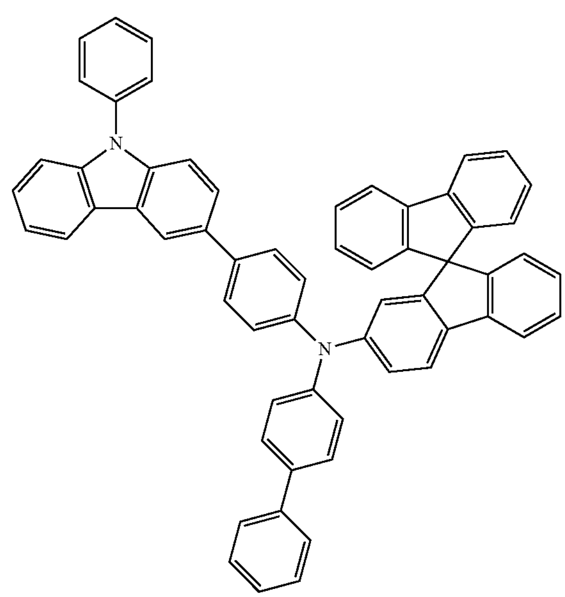

-continued
HT9
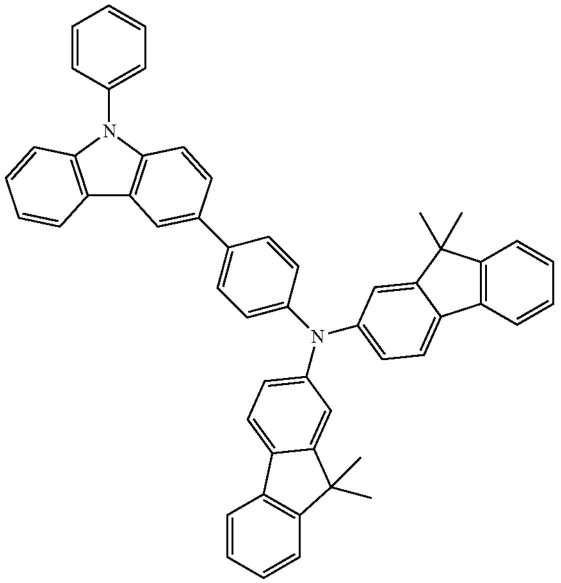
HT10
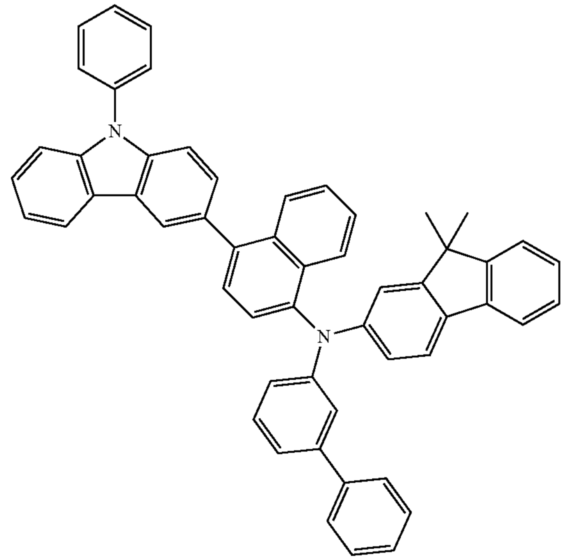
HT11
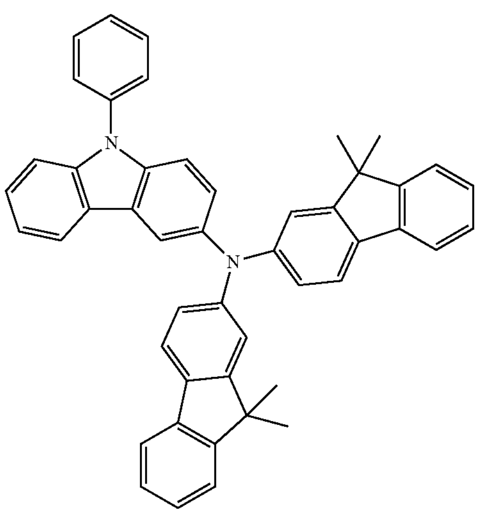
HT12
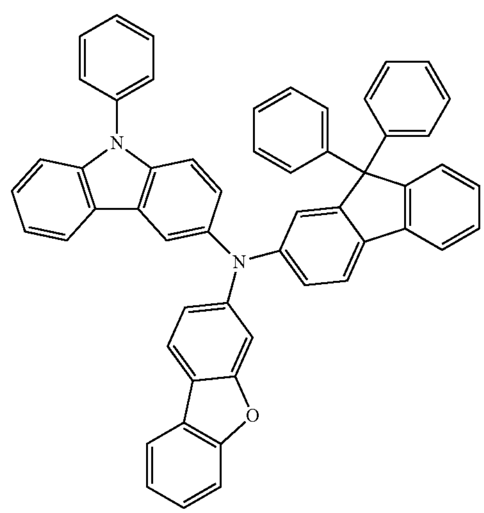

-continued
HT13
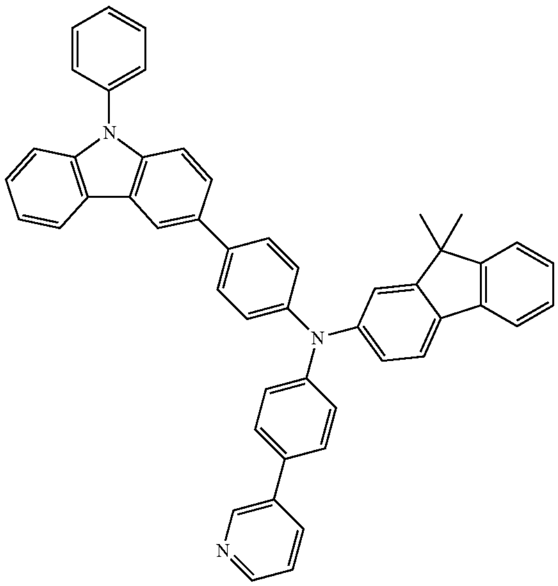
HT14
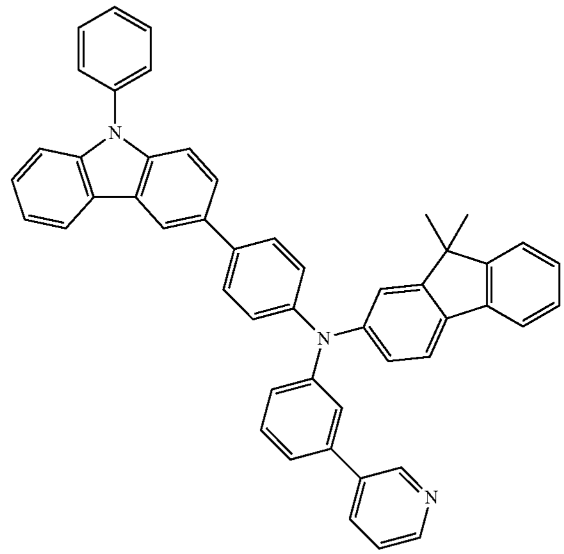
HT15
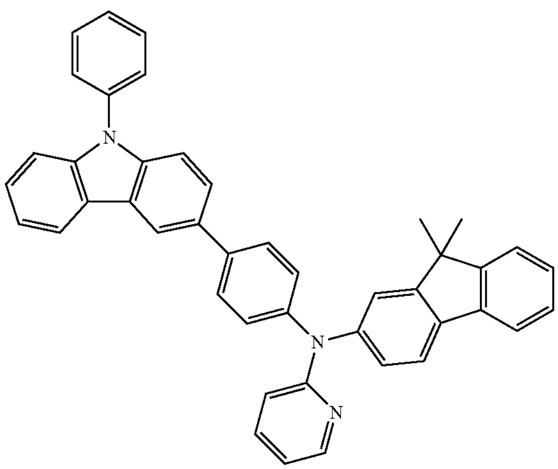
HT16
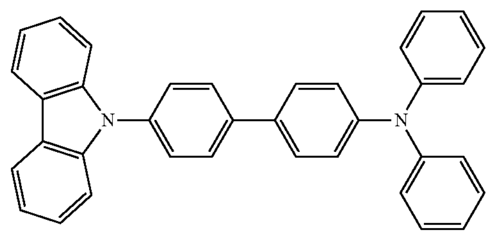
HT17
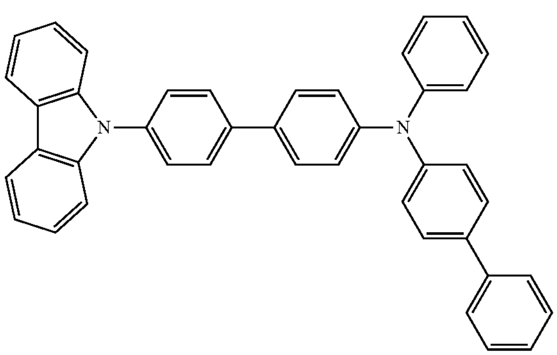
HT18
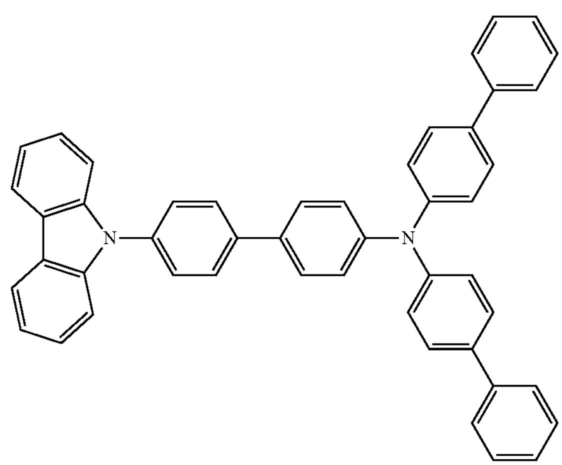

-continued
HT19
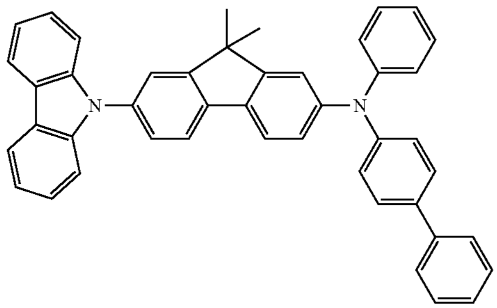
HT20
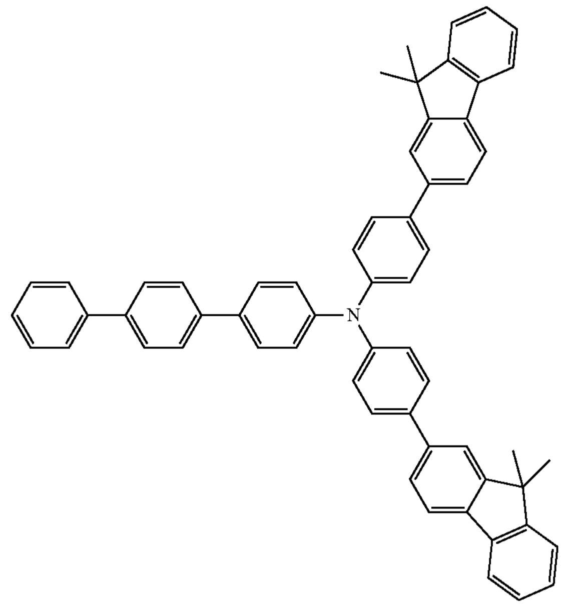
HT21
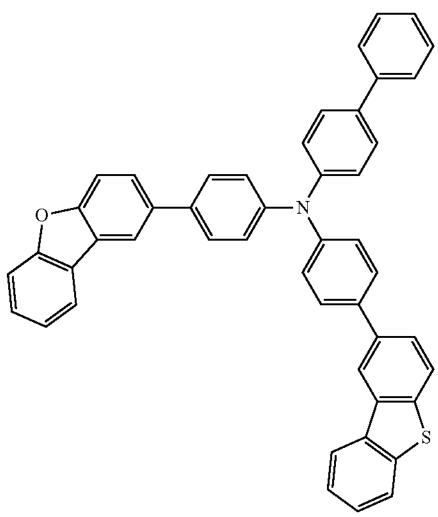
HT22
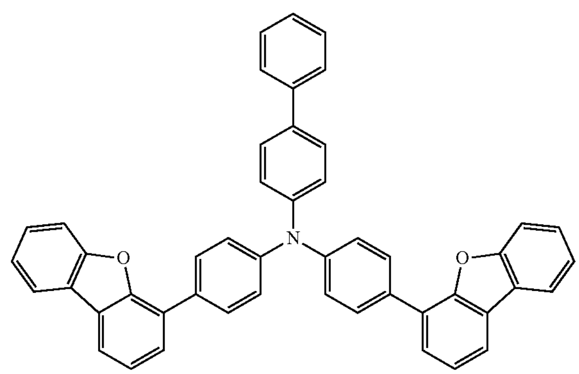
HT23
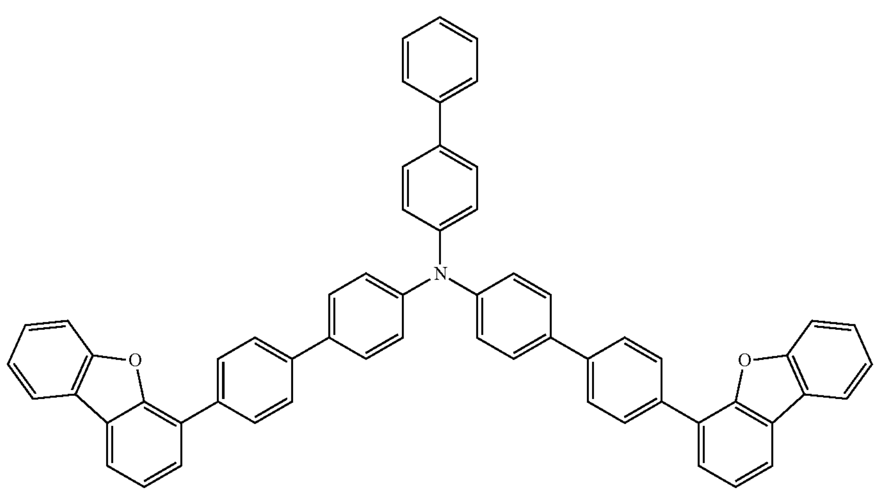

-continued
HT24
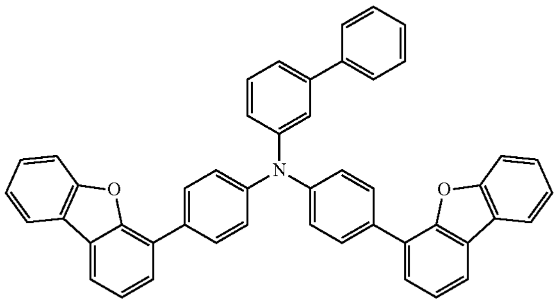
HT25
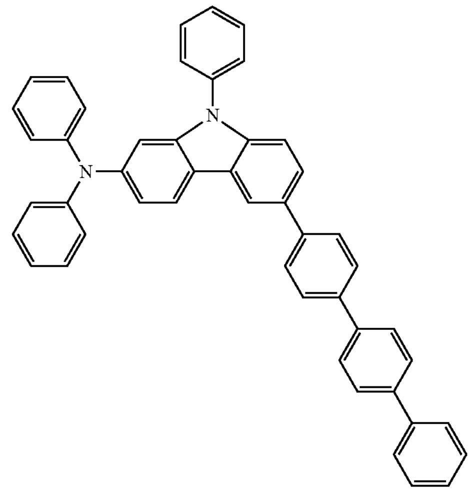
HT26
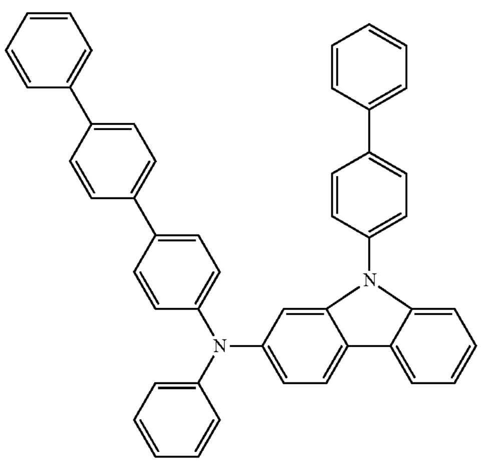
HT27
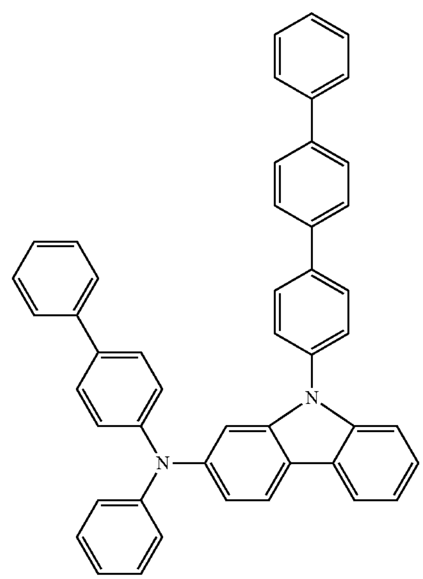
HT28
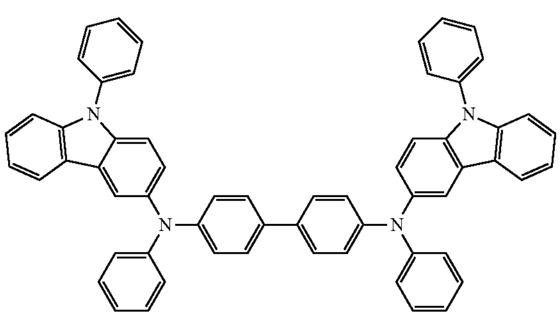
HT29
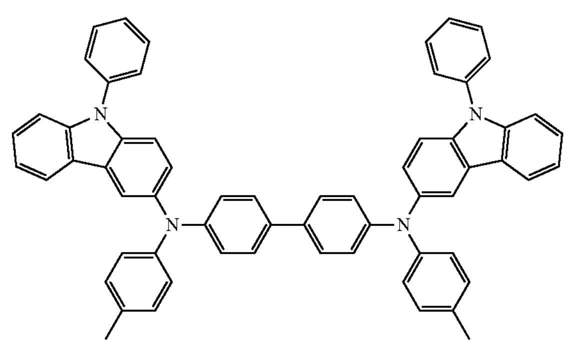

-continued
HT30
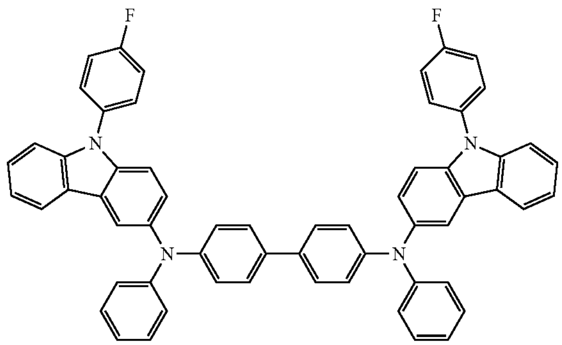
HT31
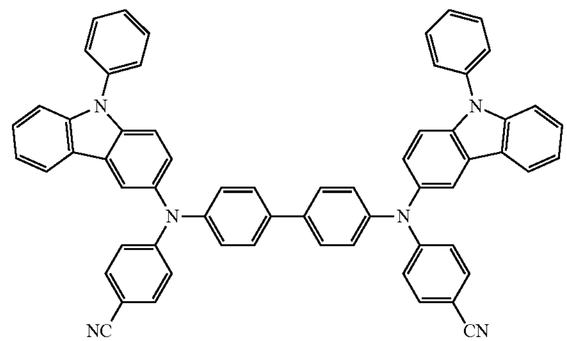
HT32
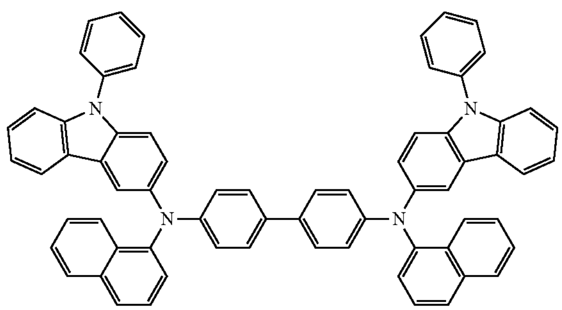
HT33
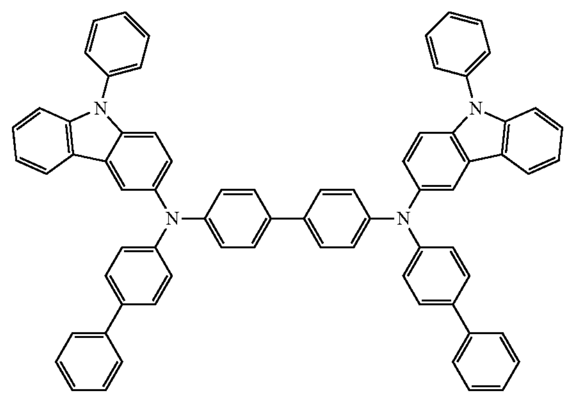
HT34
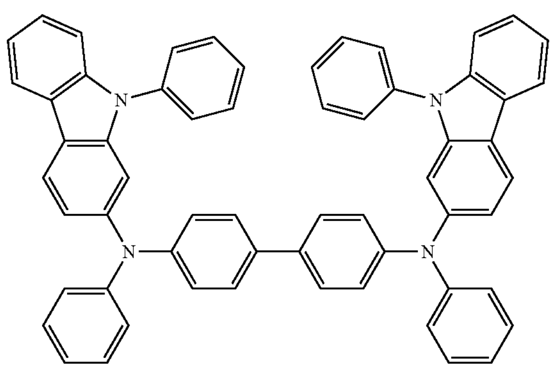
HT35
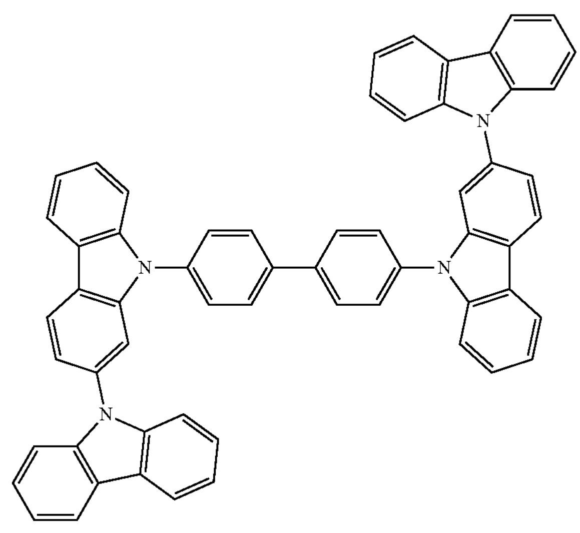

-continued

HT36

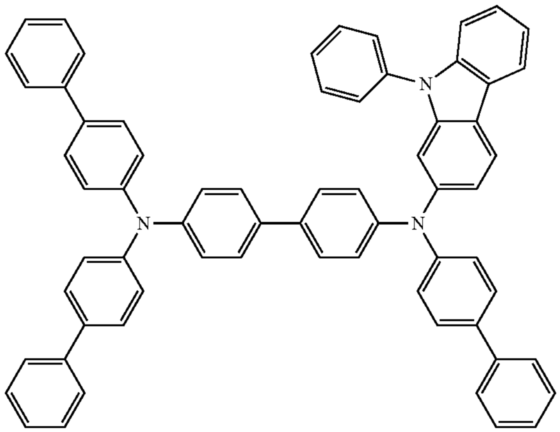

HT37

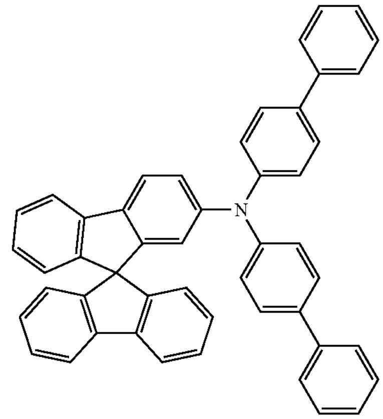

HT38

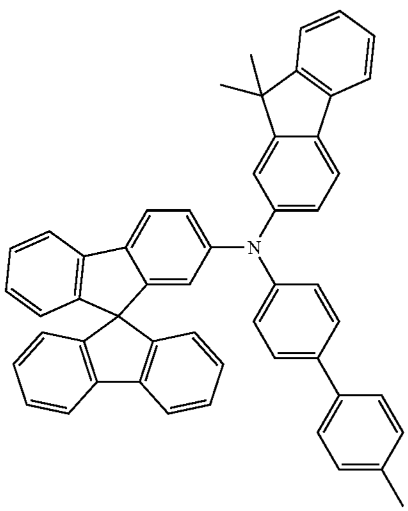

HT39

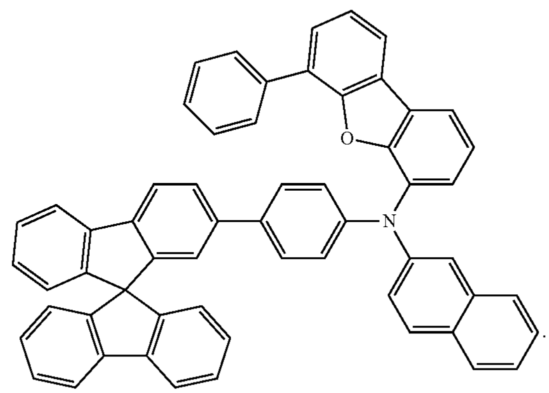

A thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, and, in some embodiments, about 100 Å to about 1,000 Å, and the thickness of the hole transport layer may be in a range of about 50 Å to about 2,000 Å, and, in some embodiments, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may help increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[p-dopant]

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one or more embodiments, a lowest unoccupied molecular orbital (LUMO) of the p-dopant may be −3.5 eV or less.

The p-dopant may include at least one selected from a quinone derivative, a metal oxide, and a cyano group-containing compound.

For example, the p-dopant may include at least one selected from:

a quinone derivative, such as tetracyanoquinodimethane (TCNQ) and 2,3,5,6-tetrafluoro-7,7,8,8-tetracyanoquinodimethane (F4-TCNQ);

a metal oxide, such as a tungsten oxide or a molybdenum oxide;

1,4,5,8,9,11-hexaazatriphenylene-hexacarbonitrile (HAT-CN); and a compound represented by Formula 221 below.

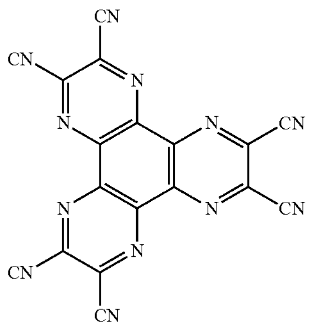

<HAT-CN>

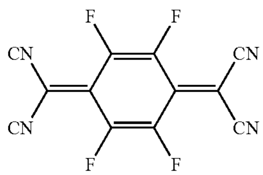

<F4-TCNQ>

<Formula 221>

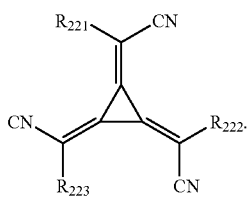

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer in Organic Layer 150]

When the organic light-emitting device 10 is a full-color organic light-emitting device, the emission layer may be patterned into a red emission layer, a green emission layer, or a blue emission layer, according to a sub pixel. In an implementation, the emission layer may have a stacked structure of two or more layers selected from a red emission layer, a green emission layer, and a blue emission layer, in which the two or more layers contact each other or are separated from each other. In an implementation, the emission layer may include two or more materials selected from a red-light emission material, a green-light emission material, and a blue-light emission material, in which the two or more materials are mixed with each other in a single layer to emit white light.

In an implementation, the emission layer of the organic light-emitting device 10 may be a first-color-light emission layer.

In an implementation, the organic light-emitting device 10 may further include i) at least one second-color-light emission layer or ii) at least one second-color-light emission layer and at least one third-color-light emission layer, between the first electrode 110 and the second electrode 190.

In an implementation, a maximum emission wavelength of the first-color-light emission layer, a maximum emission wavelength of the second-color-light emission layer, and a maximum emission wavelength of the third-color-light emission layer are identical to or different from each other.

In an implementation, the organic light-emitting device 10 may emit mixed light including first-color-light and second-color-light, or mixed light including first-color-light, second-color-light, and third-color-light.

In an implementation, the maximum emission wavelength of the first-color-light emission layer is different from a maximum emission wavelength of the second-color-light emission layer, and the mixed light including first-color-light and second-color-light may be white light.

In an implementation, the maximum emission wavelength of the first-color-light emission layer, the maximum emission wavelength of the second-color-light emission layer, and the maximum emission wavelength of the third-color-light emission layer may be different from one another, and the mixed light including first-color-light, second-color-light, and third-color-light may be white light.

The emission layer may include a host and a dopant. The dopant may include at least one selected from a phosphorescent dopant and a fluorescent dopant.

In an implementation, an amount of the dopant in the emission layer may be in a range of about 0.01 to about 15 parts by weight based on 100 parts by weight of the host.

A thickness of the emission layer may be in a range of about 100 Å to about 1,000 Å, and, in some embodiments, about 200 Å to about 600 Å. When the thickness of the emission layer is within this range, excellent light-emission characteristics may be obtained without a substantial increase in driving voltage.

[Host in Emission Layer]

The emission layer may include the first compound as a phosphorescent host. The first compound may be the same as described above.

The emission layer may include, as a phosphorescent host, in addition to the first compound (for example, a first host), a fifth compound (for example, a second host). The fifth compound may be the same as described above.

A weight ratio of the first host to the second host in the emission layer may be, e.g., 1:99 to 99:1, 80:20 to 20:80, or, 50:50.

[Phosphorescent Dopant Included in Emission Layer in Organic Layer 150]

The phosphorescent dopant may be the second compound.

The second compound may be an organometallic complex represented by Formula 401:

$$M(L_{401})_{xc1}(L_{402})_{xc2} \quad \text{<Formula 401>}$$

<Formula 402>

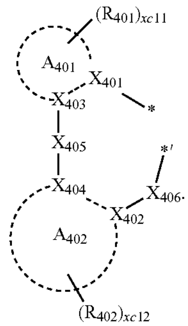

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein when xc1 is two or more, two or more $L_{401}$(s) may be identical to or different from each other, $L_{402}$ may be an organic ligand, and xc2 may be an integer selected from 0 to 4, wherein when xc2 is two or more, two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, Ring $A_{401}$ and ring $A_{402}$ may each independently be selected from a $C_5$-$C_{60}$ carbocyclic group or a $C_1$-$C_{60}$ heterocyclic group, $X_{405}$ may be a single bond, *—O—*', *—S—*', *—C(═O)—*', *—N($Q_{411}$)-*', *—C($Q_{411}$)($Q_{412}$)-*', *—C($Q_{411}$)═C($Q_{412}$)-*', *—C($Q_{411}$)═*', or *═C($Q_{411}$)═*', wherein $Q_{411}$ and $Q_{412}$ may be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer selected from 0 to 10, and

* and *' in Formula 402 each indicate a binding site to M in Formula 401.

In an implementation, rings $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In an implementation, in Formula 402, i) $X_{401}$ may be nitrogen, and $X_{402}$ may be carbon, or ii) $X_{401}$ and $X_{402}$ may each be nitrogen at the same time.

In an implementation, $R_{402}$ and $R_{401}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group.

In an implementation, when xc1 in Formula 401 is two or more, two $A_{401}$(s) in two or more $L_{401}$(s) may be optionally linked via $X_{407}$, which is a linking group, or two $A_{402}$(s) in two or more $L_{401}$(s) may be optionally linked via $X_{408}$, which is a linking group (see Compounds PD1 to PD4 and PD7). $X_{407}$ and $X_{408}$ may each independently be a single bond, *—O—*', *—S—*', *—C(═O)—*', *—N($Q_{413}$)-*', *—C($Q_{413}$)($Q_{414}$)-*', or *—C($Q_{413}$)═C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group).

$L_{402}$ in Formula 4011 may be a monovalent, divalent, or trivalent organic ligand. For example, $L_{402}$ may be selected from halogen, diketone (for example, acetylacetonate), carboxylic acid (for example, picolinate), —C(═O), isonitrile, —CN, and phosphorus (for example, phosphine, or phosphite).

In an implementation, the phosphorescent dopant may be selected from, for example, Compounds PD1 to PD27.

PD1

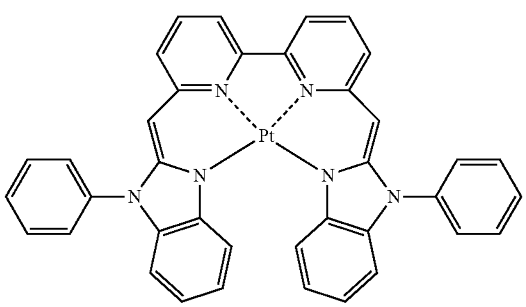

PD2

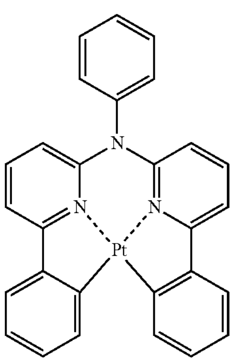

PD3

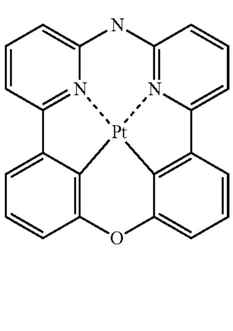

-continued

PD4

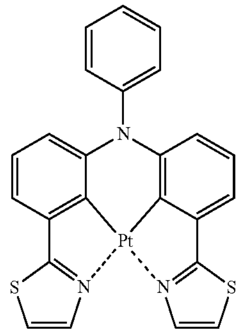

PD5

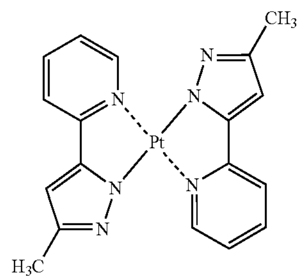

PD6

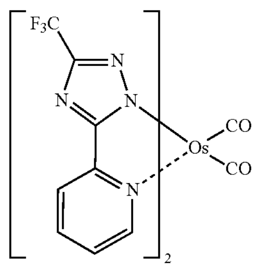

PD7

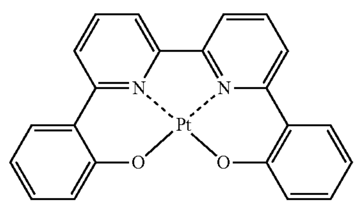

PD8

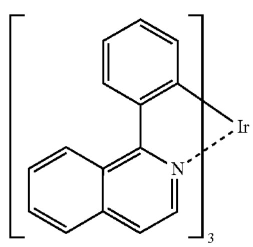

PD9

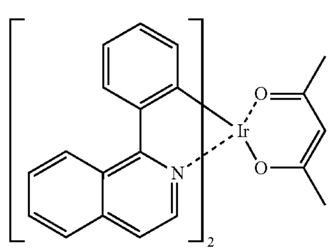

PD10
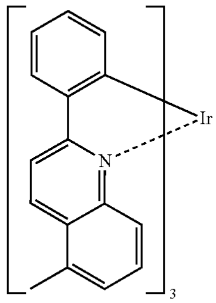
PD11
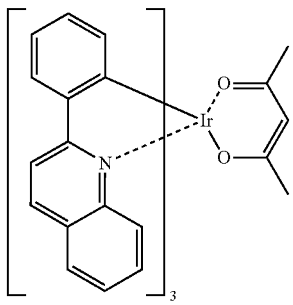
PD12
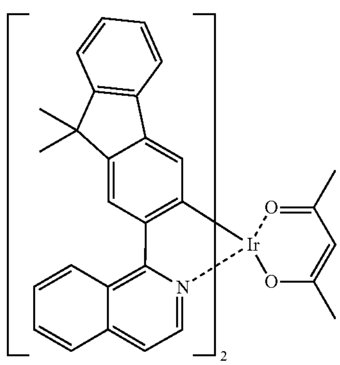
PD13
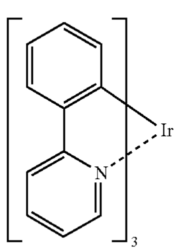
PD14
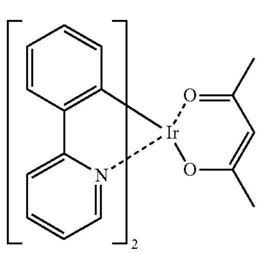
PD15
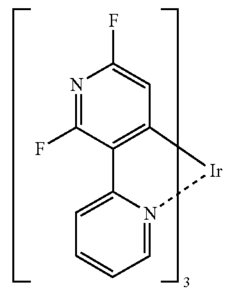
PD16
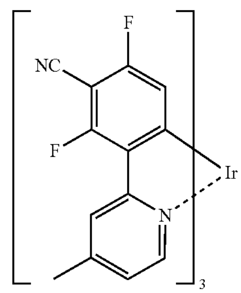
PD17
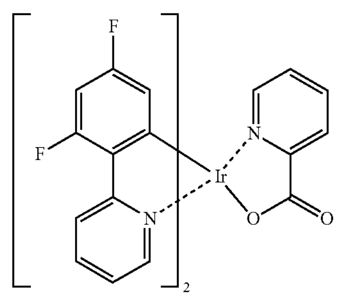
PD18
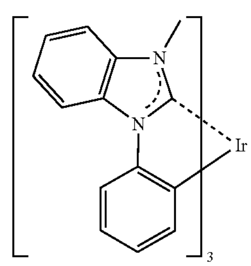
PD19
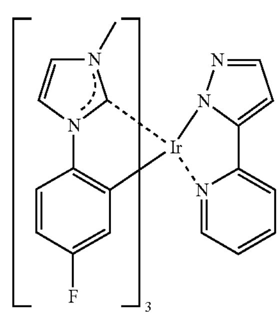

-continued

PD20

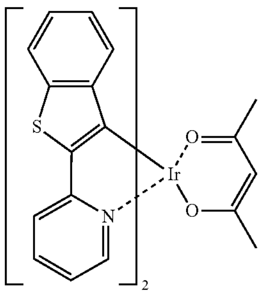

PD21

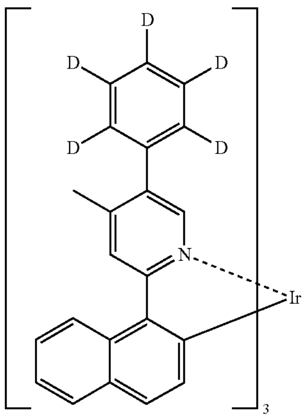

PD22

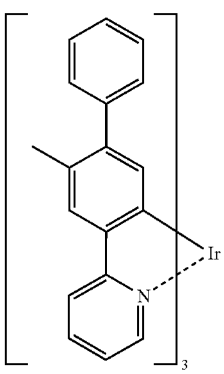

PD23

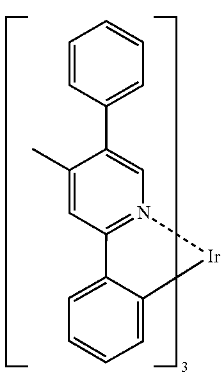

-continued

PD24

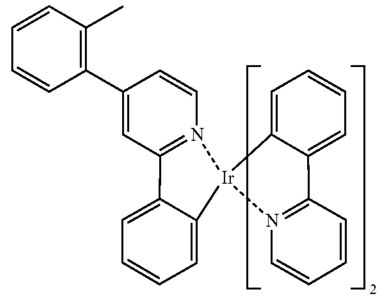

PD25

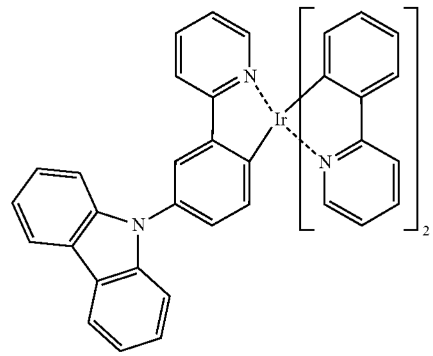

PD26

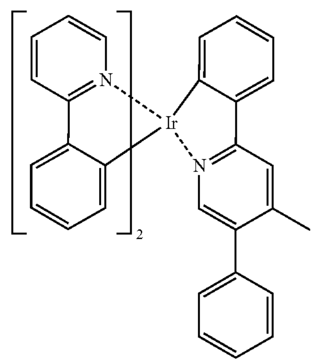

PD27

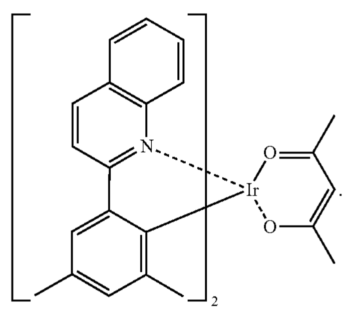

[Electron Transport Region in Organic Layer 150]

In an implementation, the electron transport region may have, e.g., i) a single-layered structure including a single layer including a single material, ii) a single-layered structure including a single layer including a plurality of different materials, or iii) a multi-layered structure having a plurality of layers including a plurality of different materials.

In an implementation, the electron transport region may include, in addition to the buffer layer and the electron transport layer, at least one layer selected from a hole blocking layer, an electron control layer, and an electron injection layer.

In an implementation, the electron transport region may have a structure of a buffer layer/electron transport layer/electron injection layer, a structure of buffer layer/hole blocking layer/electron transport layer/electron injection layer, a structure of buffer layer/electron control layer/electron transport layer/electron injection layer, or a structure of buffer layer/electron transport layer/electron injection layer, wherein layer of each structure may be sequentially stacked from the emission layer.

In the electron transport region, the buffer layer may include the third compound, and the electron transport layer may include the fourth compound.

In an implementation, the buffer layer may directly contact the emission layer, and the buffer layer may include the third compound.

The third compound is the same as described above.

For example, the fourth compound may be represented by Formula 601:

$[Ar_{601}]_{xe11}$-$[(L_{601})_{xe1}$-$R_{601}]_{xe21}$. <Formula 601>

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xe1 may be an integer of 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, and —$P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer of 1 to 5.

In an implementation, at least one of $Ar_{601}$(s) in the number of xe11 and/or at least one of $R_{601}$(s) in the number of xe21 may include the it electron-depleted nitrogen-containing ring.

In an implementation, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, thiadiazol group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, thiadiazol group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, and —$P(=O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar_{601}$(s) may be linked via a single bond.

In an implementation, $Ar_{601}$ in Formula 601 may be an anthracene group.

In an implementation, a compound represented by Formula 601 may be represented by Formula 601-1:

<Formula 601-1>

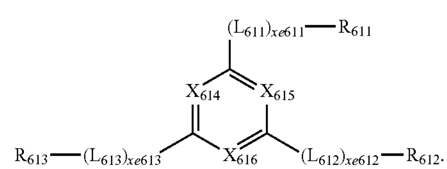

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be substantially the same as described in connection with $L_{601}$, xe611 to xe613 may each independently be substantially the same as described in connection with xe1, $R_{611}$ to $R_{613}$ may each independently be substantially the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an implementation, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group.

In an implementation, xe1 and xe611 to xe613 in Formulae 601 and 601-1 may each independently be 0, 1, or 2.

In an implementation, $R_{601}$ and $R_{611}$ to $R_{613}$ in Formula 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$($Q_{601}$), and —P(=O)($Q_{601}$)($Q_{602}$), wherein $Q_{601}$ and $Q_{602}$ are substantially the same as described above.

In an implementation, the fourth compound may include at least one compound selected from Compounds ET1 to ET36.

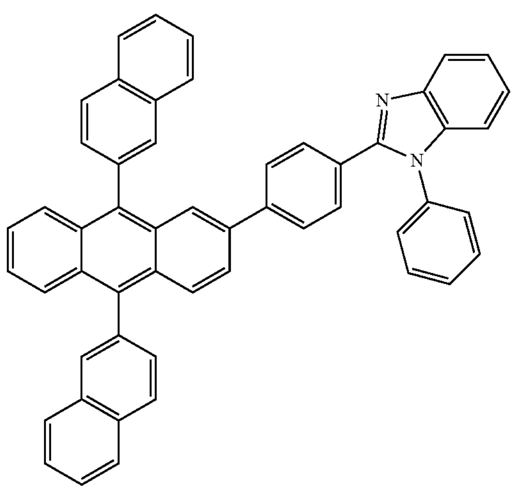

ET1

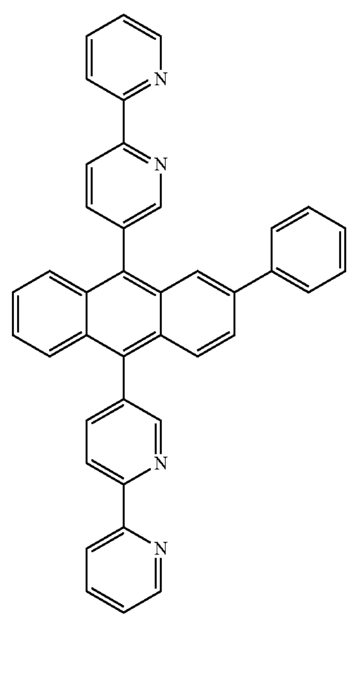

ET2

-continued
ET3
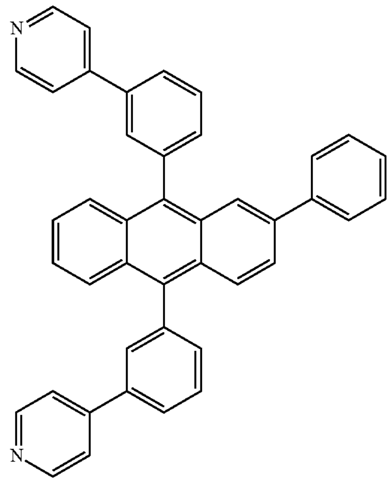
ET4
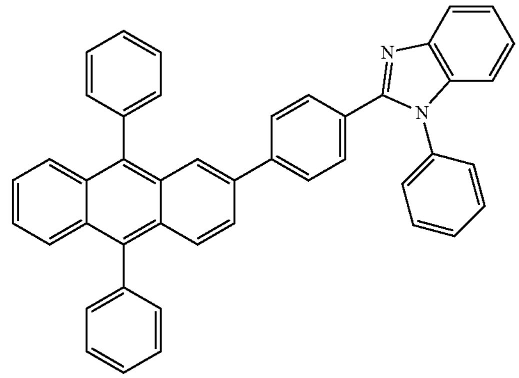
ET5
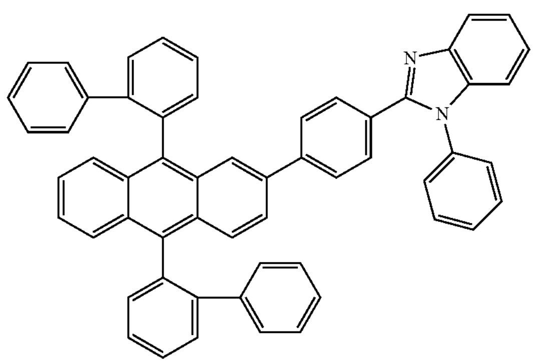
ET6
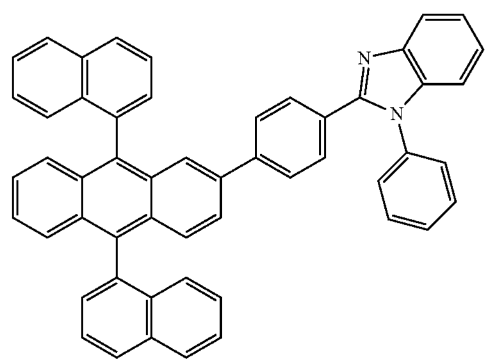
ET7
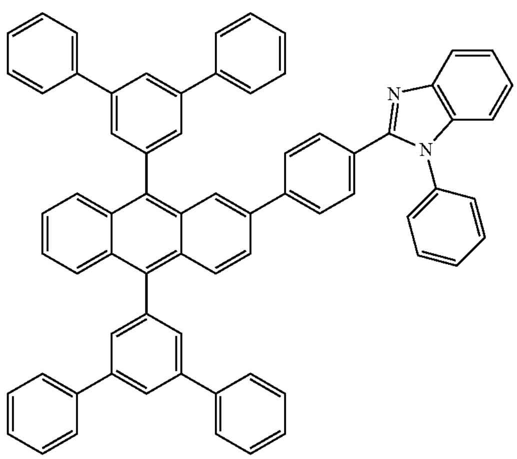
ET8
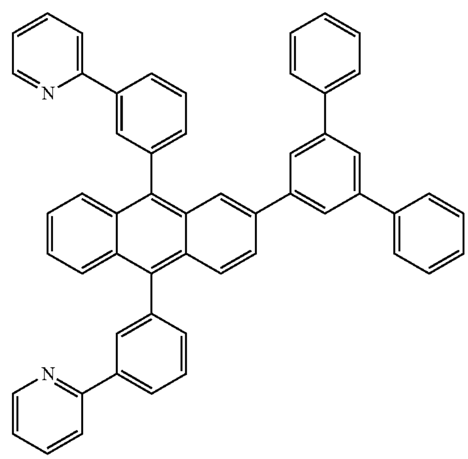

-continued
ET9
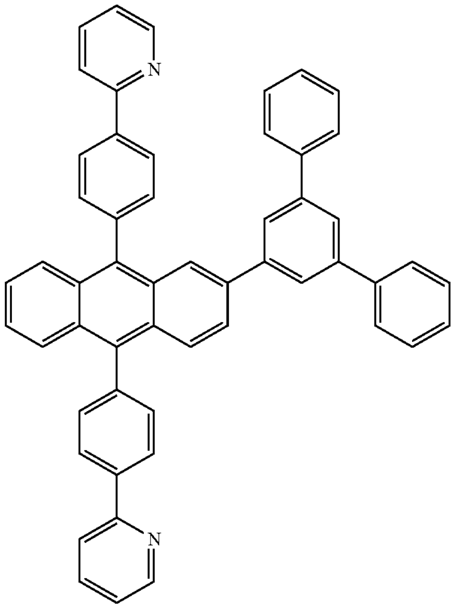
ET10
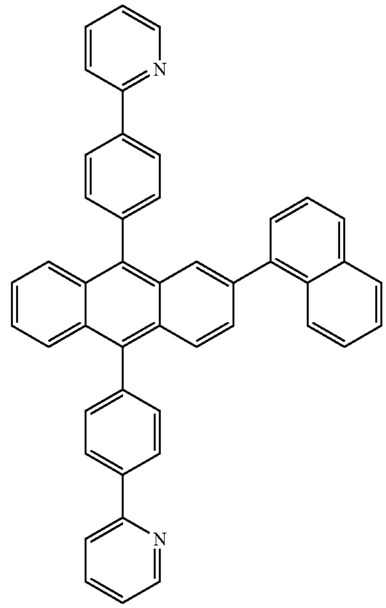
ET11
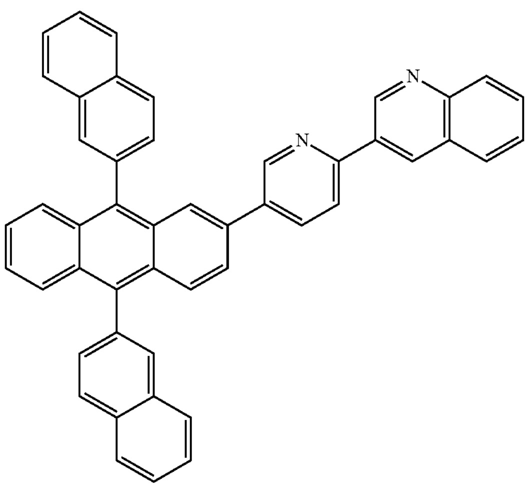
ET12
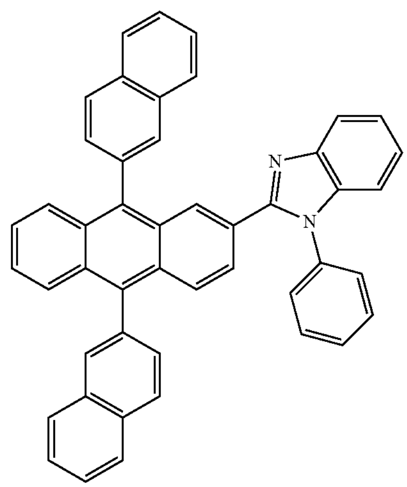
ET13
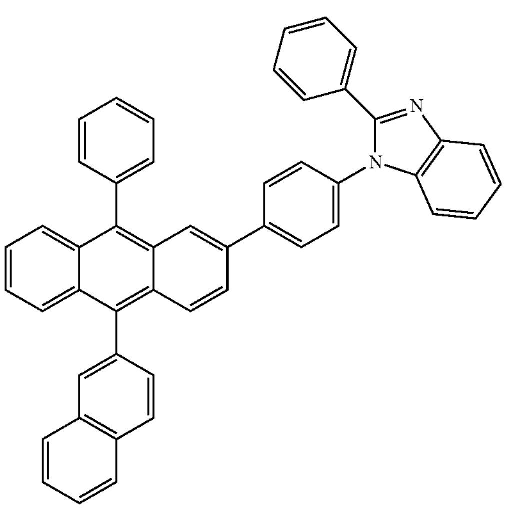
ET14
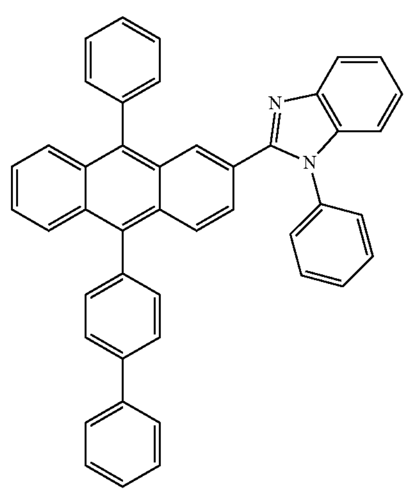

-continued
ET15
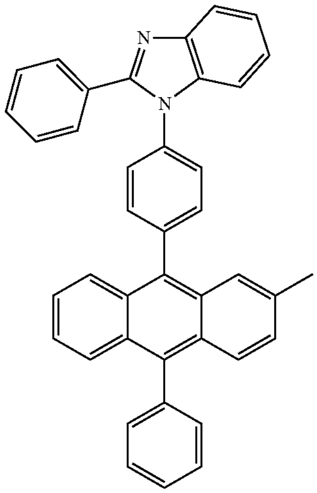
ET16
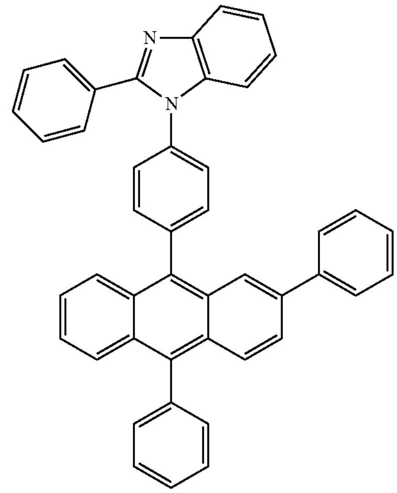
ET17
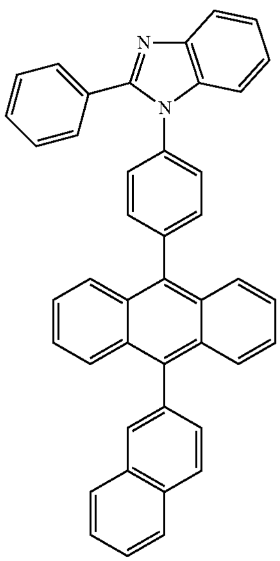
ET18
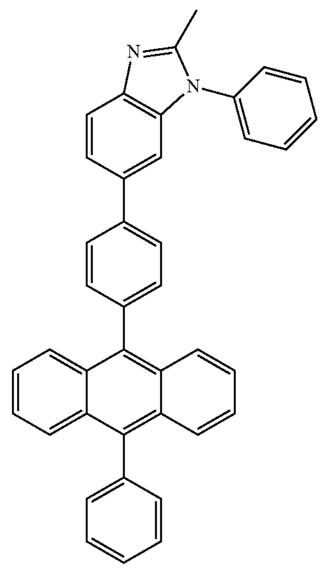
ET19
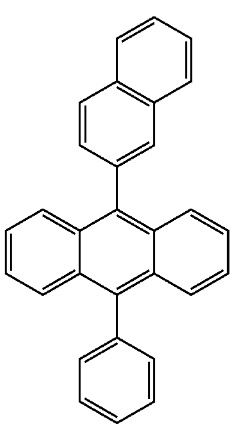
ET20
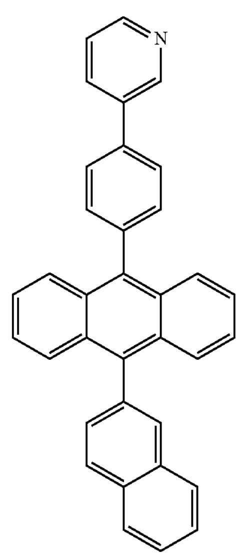

-continued
ET21
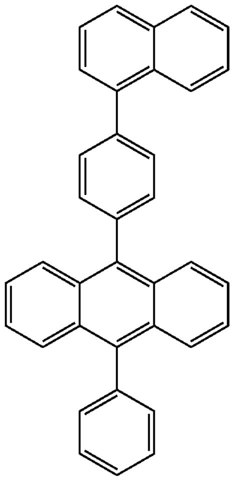
ET22
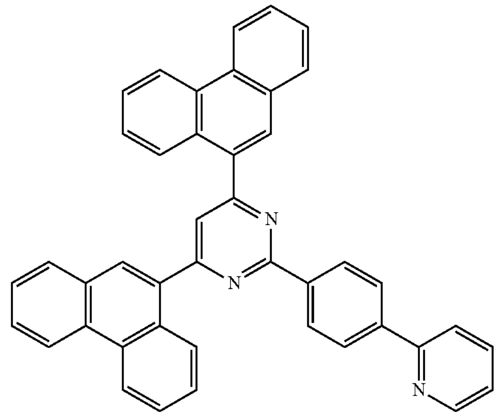
ET23
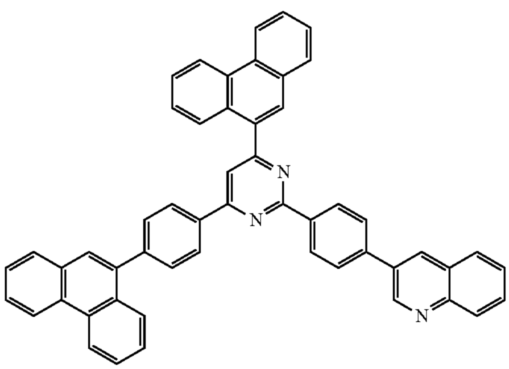
ET24
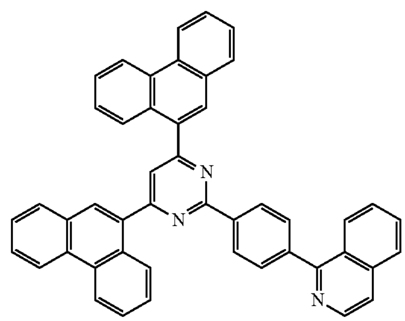
ET25
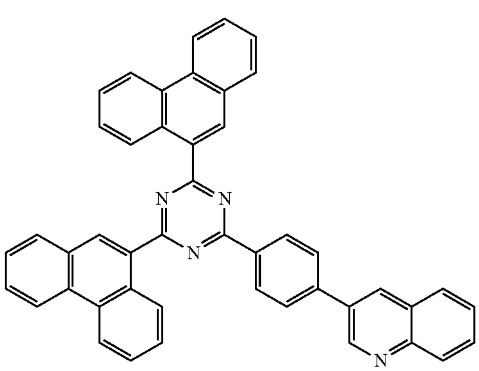
ET26
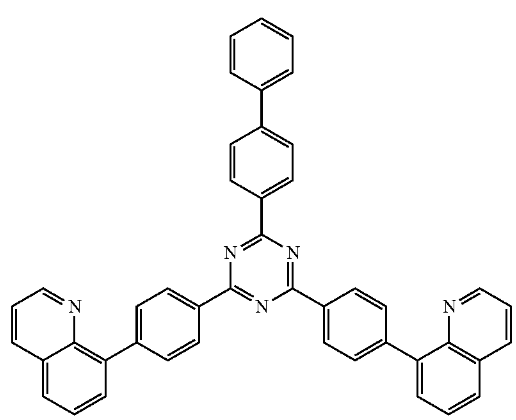

-continued
ET27
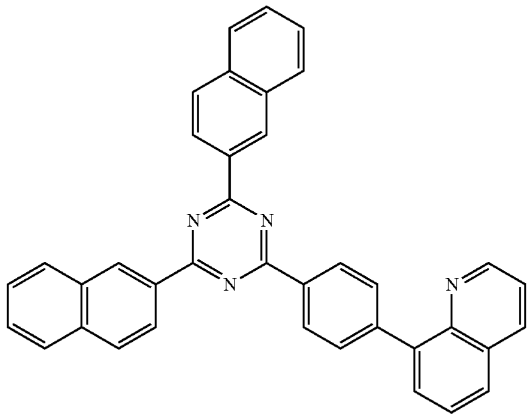
ET28
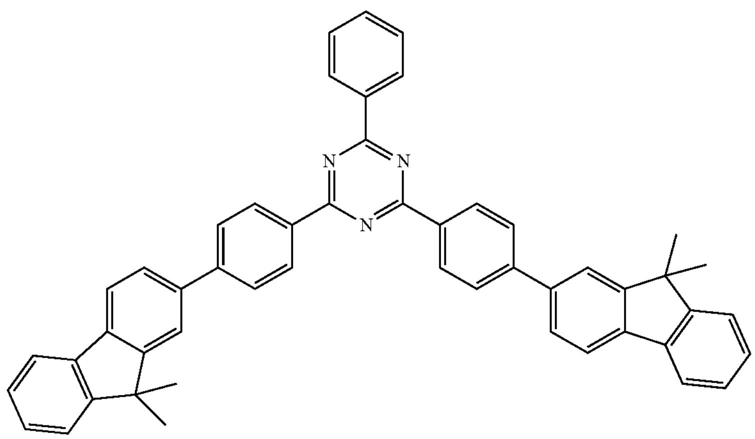
ET29
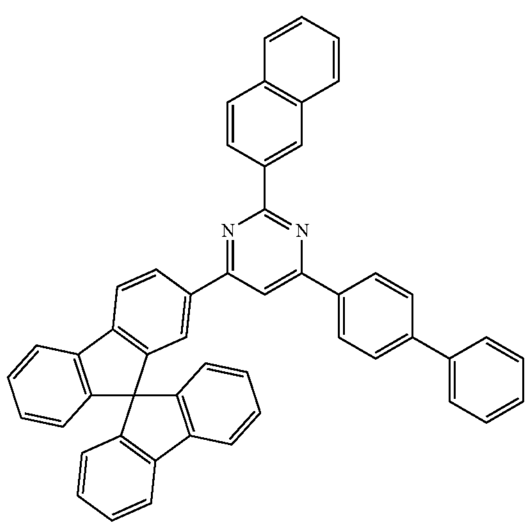
ET30
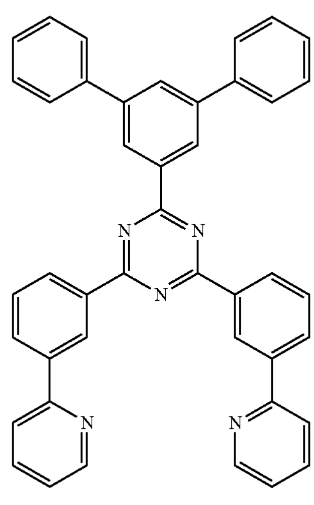

-continued
ET31
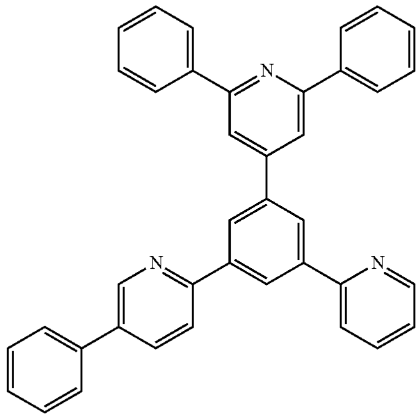
ET32
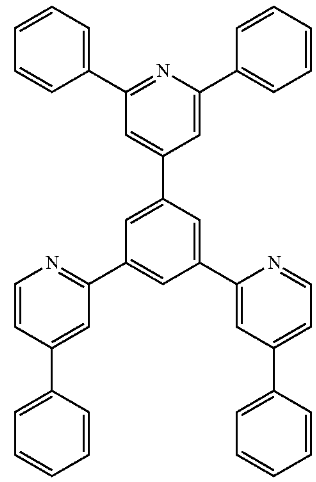
ET33
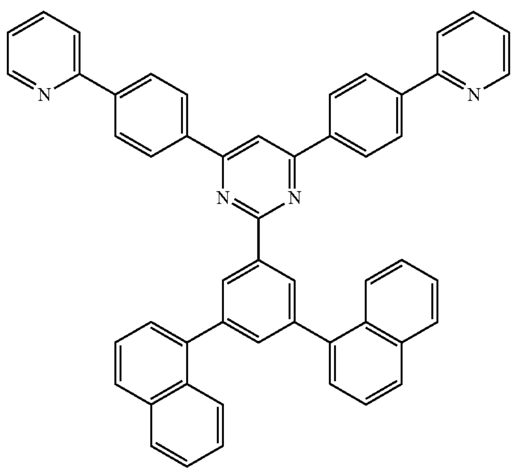
ET34
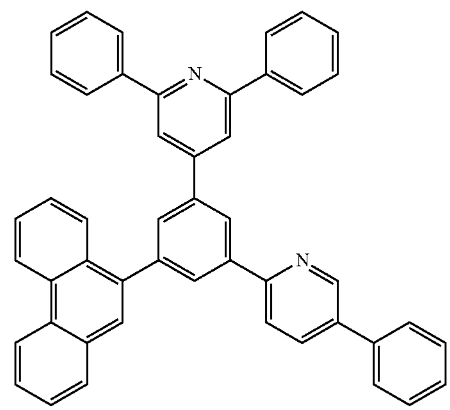
ET35
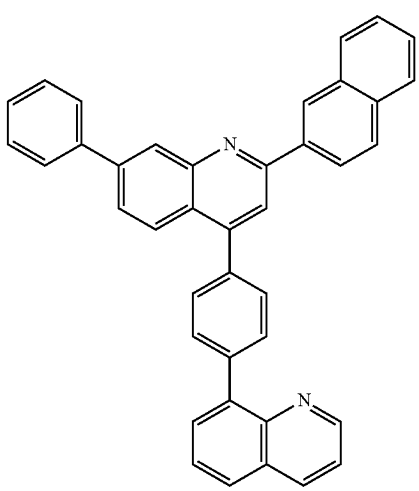
ET36
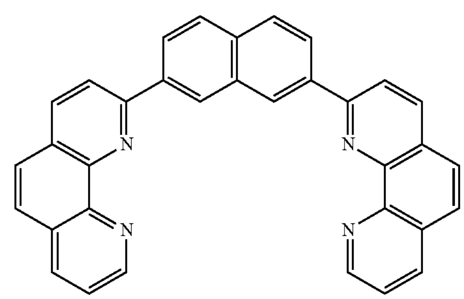
In an implementation, the electron transport region may include at least one compound selected from 2,9-dimethyl-4,7-diphenyl-1,10-phenanthroline (BCP), 4,7-diphenyl-1,10-phenanthroline (Bphen), Alq3, BAlq, 3-(Biphenyl-4-yl)-5-(4-tert-butylphenyl)-4-phenyl-4H-1,2,4-triazole (TAZ), and NTAZ.

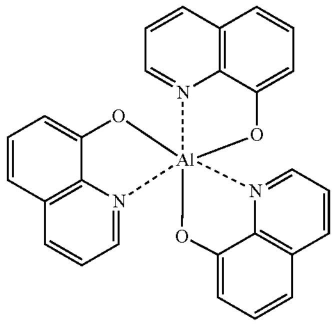

Alq3

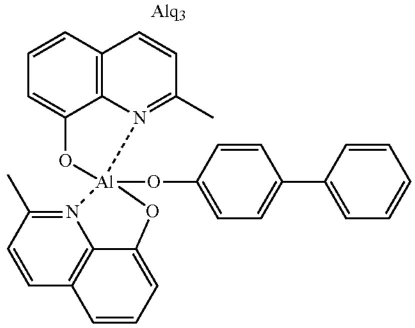

BAlq

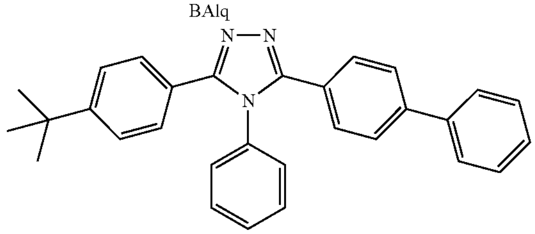

TAZ

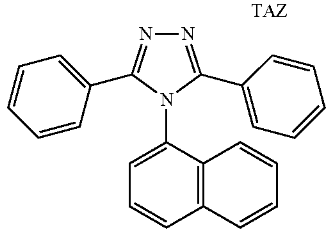

NTAZ

Thicknesses of the buffer layer, the hole blocking layer, and the electron controlling layer may each independently be in a range of about 20 Å to about 1,000 Å, for example, about 30 Å to about 300 Å. When the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region (for example, the electron transport layer in the electron transport region) may further include, in addition to the materials described above, a metal-containing material.

In an implementation, the metal-containing material may include at least one selected from alkali metal complex and alkaline earth-metal complex. The alkali metal complex may include a metal ion selected from an Li ion, a Na ion, a K ion, a Rb ion, and a Cs ion, and the alkaline earth-metal complex may include a metal ion selected from a Be ion, a Mg ion, a Ca ion, an Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenylan oxazole, a hydroxy phenylthiazole, a hydroxy diphenylan oxadiazole, a hydroxy diphenylthiadiazol, a hydroxy phenylpyridine, a hydroxy phenylbenzimidazole, a hydroxy phenylbenzothiazole, a bipyridine, a phenanthroline, and a cyclopentadiene.

In an implementation, the metal-containing material may include a Li complex. The Li complex may include, for example, Compound ET-D1 (lithium quinolate, LiQ) or ET-D2.

ET-D1

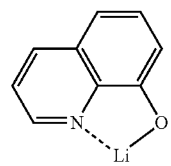

ET-D2

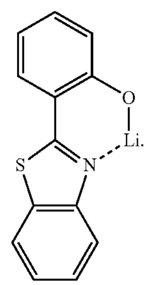

The electron transport region may include an electron injection layer that facilitates injection of electrons from the second electrode 190. The electron injection layer may directly contact the second electrode 190.

In an implementation, the electron injection layer may have, e.g., i) a single-layered structure including a single layer including a single material, ii) a single-layered structure including a single layer including a plurality of different materials, or iii) a multi-layered structure having a plurality of layers including a plurality of different materials.

The electron injection layer may include alkali metal, alkaline earth metal, rare-earth metal, alkali metal compound, alkaline earth-metal compound, rare-earth metal compound, alkali metal complex, alkaline earth-metal complex, rare-earth metal complex or any combinations thereof.

In an implementation, the electron injection layer may include Li, Na, K, Rb, Cs, Mg, Ca, Er, Tm, Yb, or any combination thereof.

The alkali metal may be selected from Li, Na, K, Rb, and Cs. In an implementation, the alkali metal may be Li, Na, or Cs. In an implementation, the alkali metal may be Li or Cs.

The alkaline earth metal may be selected from Mg, Ca, Sr, and Ba.

The rare-earth metal may be selected from Sc, Y, Ce, Yb, Gd, and Tb.

The alkali metal compound, the alkaline earth-metal compound, and the rare-earth metal compound may be selected from oxides and halides (for example, fluorides, chlorides, bromides, or iodines) of the alkali metal, the alkaline earth-metal and rare-earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In one or more embodiments, the alkali metal compound may be selected from LiF, $Li_2O$, NaF, LiI, NaI, CsI, and KI.

The alkaline earth-metal compound may be selected from alkaline earth-metal compounds, such as BaO, SrO, CaO, $Ba_xSr_{1-x}O$ ($0<x<1$), or $Ba_xCa_{1-x}O$ ($0<x<1$). In an implementation, the alkaline earth-metal compound may be selected from BaO, SrO, and CaO.

The rare-earth metal compound may be selected from $YbF_3$, $ScF_3$, $ScO_3$, $Y_2O_3$, $Ce_2O_3$, $GdF_3$, and $TbF_3$. In an implementation, the rare-earth metal compound may be selected from $YbF_3$, $ScF_3$, $TbF_3$, $YbI_3$, $ScI_3$, and $TbI_3$.

In an implementation, the alkali metal complex, the alkaline earth-metal complex, and the rare-earth metal complex may include an ion of alkali metal, alkaline earth-metal, and rare-earth metal as described above, and a ligand coordinated with a metal ion of the alkali metal complex, the alkaline earth-metal complex, and the rare-earth metal complex may each independently be selected from a hydroxy quinoline, a hydroxy isoquinoline, a hydroxy benzoquinoline, a hydroxy acridine, a hydroxy phenanthridine, a hydroxy phenylan oxazole, a hydroxy phenylthiazole, a hydroxy diphenylan oxadiazole, a hydroxy diphenylthiadiazol, a hydroxy phenylpyridine, a hydroxy phenylbenzimidazole, a hydroxy phenylbenzothiazole, a bipyridine, a phenanthroline, and a cyclopentadiene.

The electron injection layer may consist of or include alkali metal, alkaline earth metal, rare-earth metal, alkali metal compound, alkaline earth-metal compound, rare-earth metal compound, alkali metal complex, alkaline earth-metal complex, rare-earth metal complex or any combinations thereof, as described above. In one or more embodiments, the electron injection layer may further include an organic material. When the electron injection layer further includes an organic material, alkali metal, alkaline earth metal, rare-earth metal, alkali metal compound, alkaline earth-metal compound, rare-earth metal compound, alkali metal complex, alkaline earth-metal complex, rare-earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

At least one layer selected from the electron transport layer and the electron injection layer may include alkali metal, alkaline earth metal, rare-earth metal, alkali metal compound, alkaline earth-metal compound, rare-earth metal compound, alkali metal complex, alkaline earth-metal complex, rare-earth metal complex, or any combinations thereof.

[Second Electrode 190]

The second electrode 190 may be disposed on the organic layer 150 having such a structure. The second electrode 190 may be a cathode that is an electron injection electrode, and in this regard, a material for forming the second electrode 190 may be a material having a low work function, and such a material may be metal, alloy, an electrically conductive compound, or a mixture thereof.

In an implementation, the second electrode 190 may include at least one selected from lithium (Li), silver (Si), magnesium (Mg), aluminum (Al), aluminum-lithium (Al—Li), calcium (Ca), magnesium-indium (Mg—In), magnesium-silver (Mg—Ag), ITO, and IZO. The second electrode 190 may be a transmissive electrode, a semi-transmissive electrode, or a reflective electrode.

The second electrode 190 may have a single-layered structure, or a multi-layered structure including two or more layers.

Figure 3:
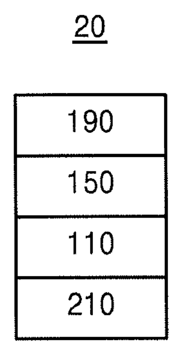
FIG. 3 illustrates a schematic view of an organic light-emitting device according to an embodiment.
Figure 4:
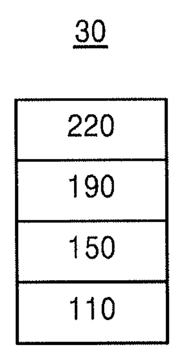
FIG. 4 illustrates a schematic view of an organic light-emitting device according to an embodiment.
Figure 5:
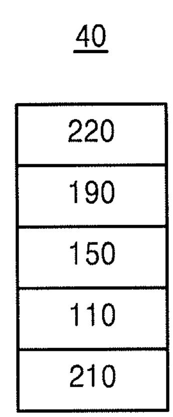
FIG. 5 illustrates a schematic view of an organic light-emitting device according to an embodiment.

[Description of FIGS. 3 to 5]

An organic light-emitting device 20 of FIG. 3 includes a first capping layer 210, a first electrode 110, an organic layer 150, and a second electrode 190 which are sequentially stacked in this stated order, an organic light-emitting device 30 of FIG. 4 includes a first electrode 110, an organic layer 150, a second electrode 190, and a second capping layer 220 which are sequentially stacked in this stated order, and an organic light-emitting device 40 of FIG. 5 includes a first capping layer 210, a first electrode 110, an organic layer 150, a second electrode 190, and a second capping layer 220.

Regarding FIGS. 3 to 5, the first electrode 110, the organic layer 150, and the second electrode 190 may be understood by referring to the description presented in connection with FIG. 2.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrine derivatives, phthalocyanine derivatives, naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In an implementation, at least one selected from the first capping layer 210 and the second capping layer 220 may each independently include an amine-based compound.

In an implementation, at least one selected from the first capping layer 210 and the second capping layer 220 may each independently include the compound represented by Formula 201 or the compound represented by Formula 202.

In an implementation, at least one selected from the first capping layer 210 and the second capping layer 220 may each independently include a compound selected from Compounds HT28 to HT33 and Compounds CP1 to CP5.

CP1

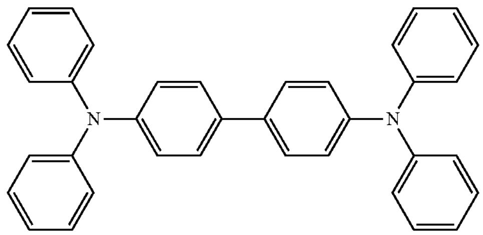

CP2

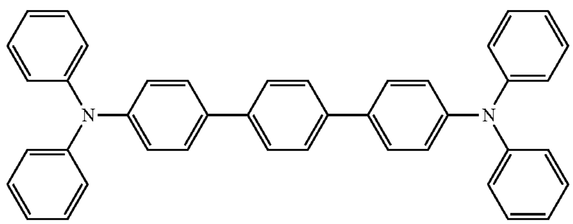

CP3

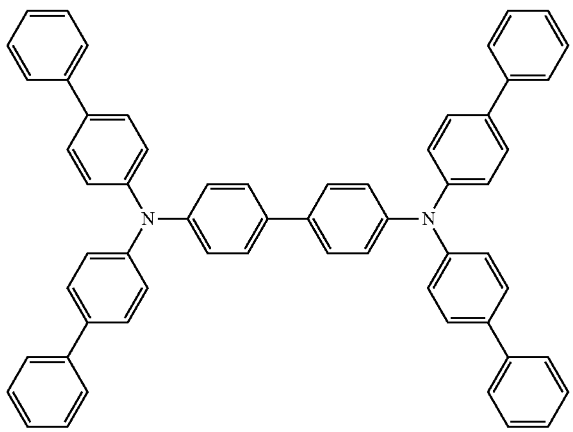

CP4

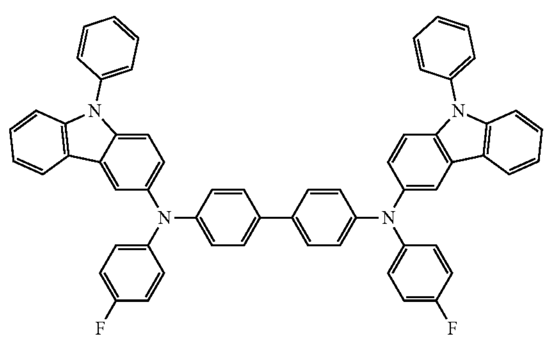

CP5

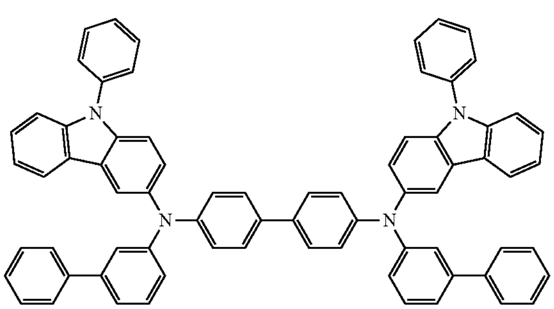

Hereinbefore, the organic light-emitting device according to an embodiment has been described in connection with FIGS. 1 to 5.

Layers constituting the hole transport region, an emission layer, and layers constituting the electron transport region may be formed in a certain region by using one or more suitable methods selected from vacuum deposition, spin coating, casting, langmuir-blodgett (LB) deposition, ink-jet printing, laser-printing, and laser-induced thermal imaging.

When the respective layers of the hole transport region, the emission layer, and the respective layers of the electron transport region are formed by deposition, the deposition may be performed at a deposition temperature of about 100 to about 500° C., at a vacuum degree of about $10^{-8}$ to about $10^{-3}$ torr, and at a deposition rate of about 0.01 to about 100 Å/sec by taking into account a compound for forming a layer to be deposited, and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to 200° C. depending on a material to be included in a layer to be formed, and the structure of a layer to be formed.

[General Definition of Substituents]

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon triple bond in the middle or at the terminus of the $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_{10}$-$C_{10}$ heterocycloalkyl group" as used herein refers to a monovalent saturated monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and does not have aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group are a 4,5-dihydro-1,2,3,4-oxatriazolyl group, a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein refers to —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) that has two or more rings condensed with each other, only carbon atoms as a ring-forming atom, and non-aromaticity in the entire molecular structure. A detailed example of the monovalent non-aromatic condensed polycyclic group is a fluorenyl group. The term "divalent non-aromatic condensed polycyclic group," used herein, refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) that has two or more rings condensed to each other, has at least one heteroatom selected from N, O, Si, P, and S, other than carbon atoms, as a ring-forming atom, and has non-aromaticity in the entire molecular structure. An example of the monovalent non-aromatic condensed heteropolycyclic group is a carbazolyl group. The term "divalent non-aromatic condensed heteropolycyclic group," used herein, refers to a divalent group having the same structure as the monovalent non-aromatic condensed heteropolycyclic group.

The term "$C_5$-$C_{60}$ carbocyclic group" as used herein refers to a monocyclic or polycyclic group having 5 to 60 carbon atoms in which a ring-forming atom is a carbon atom only. The $C_5$-$C_{60}$ carbocyclic group may be an aromatic carbocyclic group or a non-aromatic carbocyclic group. The $C_5$-$C_{60}$ carbocyclic group may be a ring, such as a benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_1$-$C_{60}$ carbocyclic group, except that as a ring-forming atom, at least one heteroatom selected from N, O, Si, P, and S is used in addition to carbon (the number of carbon atoms may be in a range of 1 to 60).

As used herein, at least one substituent selected from a substituent(s) of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

The term "Ph" as used herein, may refer to a phenyl group; the term "Me", as used herein, may refer to a methyl group; the term "Et", as used herein, may refer to an ethyl group; the terms "ter-Bu" or "But", as used herein, may refer to a tert-butyl group; and the term "OMe" as used herein may refer to a methoxy group.

The term "biphenyl group" as used therein refers to "a phenyl group substituted with a phenyl group." In other words, a "biphenyl group" is a substituted phenyl group having a $C_6$-$C_{60}$ aryl group as a substituent.

The term "terphenyl group" used herein refers to "a phenyl group substituted with a biphenyl group." In other words, a "terphenyl group" is a substituted phenyl group having a $C_6$-$C_{60}$ aryl group substituted with a $C_6$-$C_{60}$ aryl group, as a substituent.

* and *' used herein, unless defined otherwise, each refer to a binding site to a neighboring atom in a corresponding formula.

Hereinafter, a compound according to embodiments and an organic light-emitting device according to embodiments will be described in detail with reference to Synthesis Examples and Examples. The wording "B was used instead of A" used in describing Synthesis Examples means that a molar equivalent of A was identical to a molar equivalent of B.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Example 1

An anode was prepared by cutting an ITO glass substrate, on which ITO/Ag/ITO were deposited to a thickness of 70 Å/1,000 Å/70 Å, to a size of 50 mm×50 mm×0.4 mm, ultrasonically cleaning the ITO glass substrate (anode) using isopropyl alcohol and pure water each for 10 minutes, and then, exposing the ITO glass substrate (anode) to irradiation of UV for 10 minutes and ozone to clean. Then, the glass substrate (anode) was loaded into a vacuum deposition apparatus.

Compound HT28 was vacuum-deposited on the ITO glass substrate (anode) to form a hole injection layer having a thickness of 700 Å, and Compound NPB was vacuum-deposited on the hole injection layer to form a hole transport layer having a thickness of 800 Å, thereby forming a hole transport region.

Compound 119 (first compound) and Compound PD26 (second compound) were co-deposited on the hole transport region at a weight ratio of 90:10 to form an emission layer having a thickness of 400 Å.

Compound N-1 (third compound) was deposited on the emission layer to form a buffer layer having a thickness of 50 Å, and Compound ET27 (fourth compound) was deposited on the buffer layer to form an electron transport layer having a thickness of 310 Å, thereby forming an electron transport region.

Mg and Ag were co-deposited on the electron transport region at a weight ratio of 90:10 to form a cathode having a thickness of 120 Å, thereby completing the manufacture of an organic light-emitting device.

Examples 2 to 9 and Comparative Example 10

Organic light-emitting devices of Examples 2 to 9 and Comparative Example 10 were manufactured in the same manner as in Example 1, except that Compounds shown in Table 1 were used.

Examples 10 to 18

Organic light-emitting devices of Examples 10 to 18 were manufactured in the same manner as in Example 1, except that a first compound (first host), a fifth compound (second host), and a second compound (dopant), shown in Table 1, were co-deposited at a weight ratio of 45:45:10 in forming an emission layer.

Examples 19 to 27

Organic light-emitting devices of Examples 19 to 27 were manufactured in the same manner as in Example 1, except that a hole transport layer was formed to have a thickness of 1,200 Å and Compounds shown in Table 1 were used.

Comparative Examples 1 to 3

Organic light-emitting devices of Comparative Examples 1 to 3 were manufactured in the same manner as in Example 1, except that a buffer layer was not formed and Compounds shown in Table 1 were used.

Comparative Examples 4 to 6

Organic light-emitting devices of Comparative Examples 4 to 6 were manufactured in the same manner as in Example 1, except that a buffer layer was not formed, and a first compound (first host), a fifth compound (second host), and a second compound (dopant), shown in Table 1, were co-deposited at a weight ratio of 45:45:10 in forming an emission layer.

Comparative Examples 7 to 9

Organic light-emitting devices of Comparative Examples 7 to 9 were manufactured in the same manner as in Example 1, except that a buffer layer was not formed, a hole transport layer was formed to have a thickness of 1,200 Å, and Compounds shown in Table 1 were used.

TABLE 1

| | First compound | Fifth compound | Second compound | Third compound | Fourth compound |
|---|---|---|---|---|---|
| Example 1 | Compound 119 | — | Compound PD26 | Compound N-1 | Compound ET27 |
| Example 2 | Compound 308B | — | Compound PD26 | Compound N-1 | Compound ET27 |
| Example 3 | Compound 161A | — | Compound PD26 | Compound N-1 | Compound ET27 |
| Example 4 | Compound 119 | — | Compound PD26 | Compound N-2 | Compound ET27 |
| Example 5 | Compound 308B | — | Compound PD26 | Compound N-2 | Compound ET27 |
| Example 6 | Compound 161A | — | Compound PD26 | Compound N-2 | Compound ET27 |
| Example 7 | Compound 119 | — | Compound PD26 | Compound B-15 | Compound ET27 |
| Example 8 | Compound 308B | — | Compound PD26 | Compound B-15 | Compound ET27 |
| Example 9 | Compound 161A | — | Compound PD26 | Compound B-15 | Compound ET27 |
| Example 10 | Compound 119 | Compound 125B | Compound PD26 | Compound N-1 | Compound ET27 |
| Example 11 | Compound 308B | Compound 101B | Compound PD26 | Compound N-1 | Compound ET27 |
| Example 12 | Compound 161A | Compound 301A | Compound PD26 | Compound N-1 | Compound ET27 |
| Example 13 | Compound 119 | Compound 125B | Compound PD26 | Compound N-2 | Compound ET27 |
| Example 14 | Compound 308B | Compound 101B | Compound PD26 | Compound N-2 | Compound ET27 |
| Example 15 | Compound 161A | Compound 301A | Compound PD26 | Compound N-2 | Compound ET27 |
| Example 16 | Compound 119 | Compound 125B | Compound PD26 | Compound B-15 | Compound ET27 |
| Example 17 | Compound 308B | Compound 101B | Compound PD26 | Compound B-15 | Compound ET27 |
| Example 18 | Compound 161A | Compound 301A | Compound PD26 | Compound B-15 | Compound ET27 |
| Example 19 | Compound 207A | — | Compound PD27 | Compound N-1 | Compound ET27 |
| Example 20 | Compound 237 | — | Compound PD27 | Compound N-1 | Compound ET27 |
| Example 21 | Compound 235 | — | Compound PD27 | Compound N-1 | Compound ET27 |
| Example 22 | Compound 207A | — | Compound PD27 | Compound N-2 | Compound ET27 |
| Example 23 | Compound 237 | — | Compound PD27 | Compound N-2 | Compound ET27 |
| Example 24 | Compound 235 | — | Compound PD27 | Compound N-2 | Compound ET27 |
| Example 25 | Compound 207A | — | Compound PD27 | Compound B-15 | Compound ET27 |
| Example 26 | Compound 237 | — | Compound PD27 | Compound B-15 | Compound ET27 |
| Example 27 | Compound 235 | — | Compound PD27 | Compound B-15 | Compound ET27 |
| Comparative Example 1 | Compound 119 | — | Compound PD26 | — | Compound ET27 |
| Comparative Example 2 | Compound 308B | — | Compound PD26 | — | Compound ET27 |

TABLE 1-continued

| | First compound | Fifth compound | Second compound | Third compound | Fourth compound |
|---|---|---|---|---|---|
| Comparative Example 3 | Compound 161A | — | Compound PD26 | — | Compound ET27 |
| Comparative Example 4 | Compound 119 | Compound 125B | Compound PD26 | — | Compound ET27 |
| Comparative Example 5 | Compound 308B | Compound 301A | Compound PD26 | — | Compound ET27 |
| Comparative Example 6 | Compound 161A | Compound 101B | Compound PD26 | — | Compound ET27 |
| Comparative Example 7 | Compound 207A | — | Compound PD27 | — | Compound ET27 |
| Comparative Example 8 | Compound 237 | — | Compound PD27 | — | Compound ET27 |
| Comparative Example 9 | Compound 235 | — | Compound PD27 | — | Compound ET27 |
| Comparative Example 10 | CBP | — | Compound PD26 | Compound N-1 | Compound ET27 |

Evaluation Example 1

The LUMO/HOMO energy (eV) and triplet energy (Ti) of the first compound, the second compound, the third compound, and the fourth compound used in manufacturing the organic light-emitting devices of Examples 1 to 27 and Comparative Examples 1 to 10 were evaluated by using a cyclic voltammetry. Results thereof are shown in Table 2.

TABLE 2

| Energy (LUMO/HOMO/T1) | First compound | Second compound | Third compound | Fourth compound |
|---|---|---|---|---|
| Example 1 | −2.9/−6.1/2.8 | −2.7/−5.1/2.4 | −2.4/−5.8/2.6 | −3.0/−6.1/2.4 |
| Example 2 | −2.8/−6.0/2.8 | −2.7/−5.1/2.4 | −2.4/−5.8/2.6 | −3.0/−6.1/2.4 |
| Example 3 | −2.8/−5.9/2.7 | −2.7/−5.1/2.4 | −2.4/−5.8/2.6 | −3.0/−6.1/2.4 |
| Example 4 | −2.9/−6.1/2.8 | −2.7/−5.1/2.4 | −2.5/−6.0/2.6 | −3.0/−6.1/2.4 |
| Example 5 | −2.8/−6.0/2.8 | −2.7/−5.1/2.4 | −2.5/−6.0/2.6 | −3.0/−6.1/2.4 |
| Example 6 | −2.8/−5.9/2.7 | −2.7/−5.1/2.4 | −2.5/−6.0/2.6 | −3.0/−6.1/2.4 |
| Example 7 | −2.9/−6.1/2.8 | −2.7/−5.1/2.4 | −2.5/−5.8/2.5 | −3.0/−6.1/2.4 |
| Example 8 | −2.8/−6.0/2.8 | −2.7/−5.1/2.4 | −2.5/−5.8/2.5 | −3.0/−6.1/2.4 |
| Example 9 | −2.8/−5.9/2.7 | −2.7/−5.1/2.4 | −2.5/−5.8/2.5 | −3.0/−6.1/2.4 |
| Example 10 | −2.9/−6.1/2.8 | −2.7/−5.1/2.4 | −2.4/−5.8/2.6 | −3.0/−6.1/2.4 |
| Example 11 | −2.8/−6.0/2.8 | −2.7/−5.1/2.4 | −2.4/−5.8/2.6 | −3.0/−6.1/2.4 |
| Example 12 | −2.8/−5.9/2.7 | −2.7/−5.1/2.4 | −2.4/−5.8/2.6 | −3.0/−6.1/2.4 |
| Example 13 | −2.9/−6.1/2.8 | −2.7/−5.1/2.4 | −2.5/−6.0/2.6 | −3.0/−6.1/2.4 |
| Example 14 | −2.8/−6.0/2.8 | −2.7/−5.1/2.4 | −2.5/−6.0/2.6 | −3.0/−6.1/2.4 |
| Example 15 | −2.8/−5.9/2.7 | −2.7/−5.1/2.4 | −2.5/−6.0/2.6 | −3.0/−6.1/2.4 |
| Example 16 | −2.9/−6.1/2.8 | −2.7/−5.1/2.4 | −2.5/−5.8/2.5 | −3.0/−6.1/2.4 |
| Example 17 | −2.8/−6.0/2.8 | −2.7/−5.1/2.4 | −2.5/−5.8/2.5 | −3.0/−6.1/2.4 |
| Example 18 | −2.8/−5.9/2.7 | −2.7/−5.1/2.4 | −2.5/−5.8/2.5 | −3.0/−6.1/2.4 |
| Example 19 | −2.7/−5.8/2.4 | −3.1/−5.1/2.0 | −2.4/−5.8/2.6 | −3.0/−6.1/2.4 |
| Example 20 | −2.9/−6.0/2.3 | −3.1/−5.1/2.0 | −2.4/−5.8/2.6 | −3.0/−6.1/2.4 |
| Example 21 | −2.9/−5.9/2.4 | −3.1/−5.1/2.0 | −2.4/−5.8/2.6 | −3.0/−6.1/2.4 |
| Example 22 | −2.7/−5.8/2.4 | −3.1/−5.1/2.0 | −2.5/−6.0/2.6 | −3.0/−6.1/2.4 |
| Example 23 | −2.9/−6.0/2.3 | −3.1/−5.1/2.0 | −2.5/−6.0/2.6 | −3.0/−6.1/2.4 |
| Example 24 | −2.9/−5.9/2.4 | −3.1/−5.1/2.0 | −2.5/−6.0/2.6 | −3.0/−6.1/2.4 |
| Example 25 | −2.7/−5.8/2.4 | −3.1/−5.1/2.0 | −2.5/−5.8/2.5 | −3.0/−6.1/2.4 |
| Example 26 | −2.9/−6.0/2.3 | −3.1/−5.1/2.0 | −2.5/−5.8/2.5 | −3.0/−6.1/2.4 |
| Example 27 | −2.9/−5.9/2.4 | −3.1/−5.1/2.0 | −2.5/−5.8/2.5 | −3.0/−6.1/2.4 |
| Comparative Example 1 | −2.9/−6.1/2.8 | −2.7/−5.1/2.4 | — | −3.0/−6.1/2.4 |
| Comparative Example 2 | −2.8/−6.0/2.8 | −2.7/−5.1/2.4 | — | −3.0/−6.1/2.4 |
| Comparative Example 3 | −2.8/−5.9/2.7 | −2.7/−5.1/2.4 | — | −3.0/−6.1/2.4 |
| Comparative Example 4 | −2.9/−6.1/2.8 | −2.7/−5.1/2.4 | — | −3.0/−6.1/2.4 |
| Comparative Example 5 | −2.8/−6.0/2.8 | −2.7/−5.1/2.4 | — | −3.0/−6.1/2.4 |
| Comparative Example 6 | −2.8/−5.9/2.7 | −2.7/−5.1/2.4 | — | −3.0/−6.1/2.4 |
| Comparative Example 7 | −2.7/−5.8/2.4 | −3.1/−5.1/2.0 | — | −3.0/−6.1/2.4 |

TABLE 2-continued

| Energy (LUMO/ HOMO/T1) | First compound | Second compound | Third compound | Fourth compound |
|---|---|---|---|---|
| Comparative Example 8 | −2.9/−6.0/2.3 | −3.1/−5.1/2.0 | — | −3.0/−6.1/2.4 |
| Comparative Example 9 | −2.9/−5.9/2.4 | −3.1/−5.1/2.0 | — | −3.0/−6.1/2.4 |
| Comparative Example 10 | −2.5/−5.9/2.6 | −2.7/−5.1/2.4 | −2.4/−5.8/2.6 | −3.0/−6.1/2.4 |

Referring to Table 2, it may be seen that the organic light-emitting devices of Examples 1 to 27 satisfy Equations 1 to 3.

$$E_{3,LUMO} \geq E_{1,LUMO} + 0.1 \text{ eV}$$ <Equation 1>

$$E_{3,LUMO} \geq E_{4,LUMO} + 0.1 \text{ eV}$$ <Equation 2>

$$E_{3gap} \geq E_{1gap},$$ <Equation 3>

In Equations 1 to 3, $E_{1,LUMO}$ refers to LUMO energy of the first compound, $E_{3,LUMO}$ refers to LUMO energy of the third compound, $E_{4,LUMO}$ refers to LUMO energy of the fourth compound, $E_{1gap}$ refers to a gap between LUMO energy and HUMO energy of the first compound, and $E_{3gap}$ refers to a gap between LUMO energy and HUMO energy of the third compound.

Evaluation Example 2

The driving voltage, current density, efficiency, and lifespan of the organic light-emitting devices of Examples 1 to 27 and Comparative Examples 1 to 10 were evaluated by using a Keithley 2400, a Minolta Cs-1000A, and a PR650 Spectroscan Source Measurement Unit (manufactured by PhotoResearch). The lifespan ($T_{97}$) was obtained by measuring a period of time that has lapsed until the luminance was reduced to 97% when the initial luminance of 9,000 cd/m$^2$ was assumed as 100%. Results thereof are shown in Table 3:

TABLE 3

| | Driving voltage (V) | Current density (mA/cm$^2$) | Efficiency (cd/A) | Lifespan (hr@97) |
|---|---|---|---|---|
| Example 1 | 3.9 | 10.0 | 75.4 | 63 |
| Example 2 | 3.8 | 10.0 | 77.6 | 84 |
| Example 3 | 3.8 | 10.0 | 74.3 | 72 |
| Example 4 | 3.8 | 10.0 | 76.5 | 61 |
| Example 5 | 3.8 | 10.0 | 78.9 | 83 |
| Example 6 | 3.7 | 10.0 | 75.1 | 75 |
| Example 7 | 3.9 | 10.0 | 75.1 | 70 |
| Example 8 | 3.9 | 10.0 | 78.1 | 78 |
| Example 9 | 3.7 | 10.0 | 75.8 | 69 |
| Example 10 | 4.0 | 10.0 | 85.6 | 161 |
| Example 11 | 4.1 | 10.0 | 86.2 | 155 |
| Example 12 | 3.9 | 10.0 | 85.5 | 153 |
| Example 13 | 3.9 | 10.0 | 86.7 | 162 |
| Example 14 | 4.0 | 10.0 | 85.1 | 156 |
| Example 15 | 3.8 | 10.0 | 84.9 | 152 |
| Example 16 | 3.9 | 10.0 | 85.1 | 154 |
| Example 17 | 3.9 | 10.0 | 85.7 | 162 |
| Example 18 | 3.8 | 10.0 | 86.2 | 148 |
| Example 19 | 4.0 | 10.0 | 33.4 | 652 |
| Example 20 | 4.0 | 10.0 | 34.1 | 624 |
| Example 21 | 3.8 | 10.0 | 32.9 | 633 |
| Example 22 | 3.9 | 10.0 | 33.7 | 612 |
| Example 23 | 3.8 | 10.0 | 33.1 | 591 |
| Example 24 | 3.7 | 10.0 | 33.5 | 648 |

TABLE 3-continued

| | Driving voltage (V) | Current density (mA/cm$^2$) | Efficiency (cd/A) | Lifespan (hr@97) |
|---|---|---|---|---|
| Example 25 | 3.9 | 10.0 | 33.2 | 604 |
| Example 26 | 3.9 | 10.0 | 34.0 | 625 |
| Example 27 | 3.7 | 10.0 | 33.2 | 612 |
| Comparative Example 1 | 4.0 | 10.0 | 73.4 | 45 |
| Comparative Example 2 | 3.9 | 10.0 | 75.9 | 62 |
| Comparative Example 3 | 3.9 | 10.0 | 71.3 | 51 |
| Comparative Example 4 | 4.2 | 10.0 | 82.3 | 107 |
| Comparative Example 5 | 4.1 | 10.0 | 81.8 | 112 |
| Comparative Example 6 | 4.1 | 10.0 | 80.7 | 102 |
| Comparative Example 7 | 4.1 | 10.0 | 29.4 | 521 |
| Comparative Example 8 | 4.2 | 10.0 | 30.5 | 492 |
| Comparative Example 9 | 3.9 | 10.0 | 30.2 | 504 |
| Comparative Example 10 | 4.8 | 10.0 | 63.6 | 40 |

Referring to Table 3, it may be seen that the organic light-emitting devices of Examples 1 to 9 had a low driving voltage, high efficiency, and a long lifespan, compared to those of Comparative Examples 1 to 3 and 10, the organic light-emitting devices of Examples 10 to 18 had a low driving voltage, high efficiency, and a long lifespan, compared to those of Comparative Examples 4 to 6, and the organic light-emitting devices of Examples 19 to 27 had a low driving voltage, high efficiency, and a long lifespan, compared to those of Comparative Examples 7 to 9.

An organic light-emitting device according to one or more embodiments may have a low driving voltage, high efficiency, and a long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:

a first electrode;

a second electrode facing the first electrode;

an emission layer between the first electrode and the second electrode, the emission layer including a first compound and a second compound;

a hole transport region between the first electrode and the emission layer; and an electron transport region, the electron transport region including:

a buffer layer between the emission layer and the second electrode, the buffer layer including a third compound, and an electron transport layer between the buffer layer and the second electrode, the electron transport layer including a fourth compound, wherein, in the emission layer, the first compound is a phosphorescent host and the second compound is a phosphorescent dopant, wherein the first compound and the third compound are different from each other, wherein the first compound and the third compound each independently include both an electron transport group and a hole transport group, and wherein the first compound is represented by Formula 1-1, and the third compound is represented by Formula 1-2:

$$HT_1\text{-}(L_{11})_{a11}\text{-}ET_1$$ <Formula 1-1>

$$HT_2\text{-}(L_{12})_{a12}\text{-}ET_2$$ <Formula 1-2> wherein, in Formulae 1-1 and 1-2:

$HT_1$ and $HT_2$ are a hole transport group, $ET_1$ and $ET_2$ are an electron transport group, and $HT_1$ is a group represented by one of Formulae 2-1 to 2-4, $HT_2$ is a group represented by one of Formulae 2-1 or 2-2, <Formula 2-1>

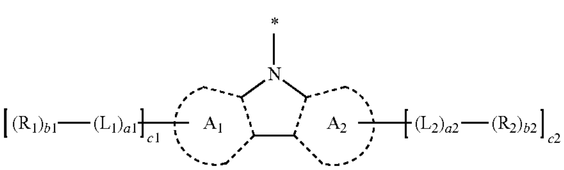

<Formula 2-2>

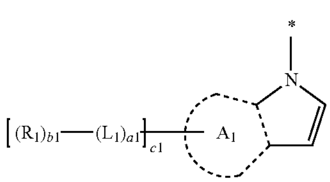

<Formula 2-3>

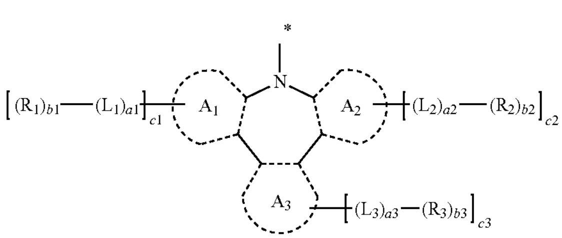

-continued

<Formula 2-4>

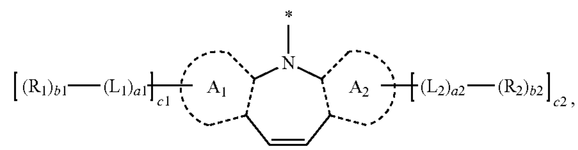

wherein, in Formulae 1-1, 1-2, and 2-1 to 2-4, ring $A_1$, ring $A_2$, and ring $A_3$ are each independently a $C_5$-$C_{60}$ carbocyclic group or a $C_1$-$C_{60}$ heterocyclic group, wherein, in Formula 1-1, when $HT_1$ is a group represented by Formula 2-1, in Formula 2-1 of $HT_1$, ring $A_1$ is a group represented by one of Formulae 2A to 2C and 2I, and ring $A_2$ is a group represented by one of Formulae 2E to 2H, in Formula 2-1 of $HT_2$, ring $A_1$ is a group represented by one of Formulae 2B, 2C, 2E to 2H, 2J to 2N, and ring $A_2$ is a group represented by one of Formulae 2A to 2C, 2E to 2N, in Formula 2-2 of $HT_2$, ring $A_1$ is a C5-C60 carbocyclic group;

Formula 2A

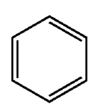

Formula 2B

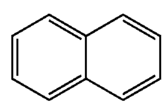

Formula 2C

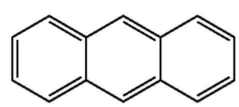

Formula 2E

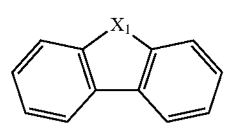

Formula 2F

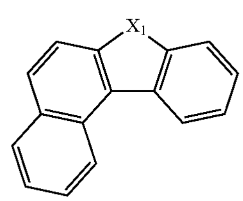

Formula 2G

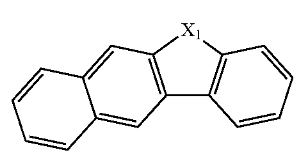

Formula 2H

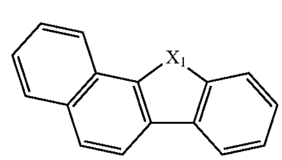

-continued

Formula 2I

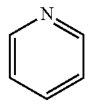

Formula 2J

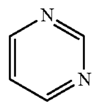

Formula 2K

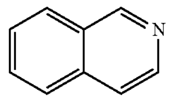

Formula 2L

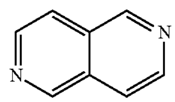

Formula 2M

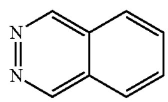

Formula 2N

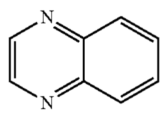

wherein, in Formulae 2E to 2H, $X_1$ is selected from O, S, $N(R_{11})$, and $Si(R_{11})(R_{12})$, and $R_{11}$ and $R_{12}$ are defined the same as $R_1$ of Formulae 2-1 to 2-4, $ET_1$ and $ET_2$ are each independently a $C_1$-$C_{60}$ heterocyclic group having at least one *═N—*' moiety as a ring-forming moiety, $L_{11}$, $L_{12}$, and $L_1$ to $L_3$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a11 and a12 are each independently an integer of 0 to 5, wherein, in Formula 1-1, when $HT_1$ is a group represented by Formula 2-1, ring $A_1$ in Formula 2-1 is a group represented by Formula 2A, ring $A_2$ in Formula 2-1 is a group represented by Formula 2E, and $X_1$ in Formula 2E is selected from O, S, and $Si(R_{11})(R_{12})$, a1 to a3 are each independently an integer of 0 to 3, $R_1$ to $R_3$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(═O)(Q_1)$, $—S(═O)_2(Q_1)$, and $—P(═O)(Q_1)(Q_2)$, b1 to b3 are each independently an integer of 1 to 3, c1 to c3 are each independently an integer of 0 to 5, at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})(Q_{12})(Q_{13})$, $—N(Q_{11})(Q_{12})$, $—B(Q_{11})(Q_{12})$, $—C(═O)(Q_{11})$, $—S(═O)_2(Q_{11})$, and $—P(═O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group,

* and *' each indicate a binding site to a neighboring atom, wherein the fourth compound is represented by Formula 601-1:

<Formula 601-1>

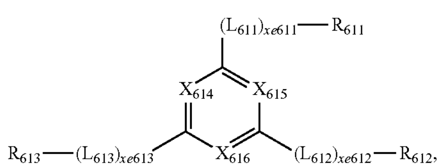

wherein, in Formula 601-1, $X_{614}$ is N or $C(R_{614})$, $X_{615}$ is N or $C(R_{615})$, $X_{616}$ is N or $C(R_{616})$, and at least one selected from $X_{614}$ to $X_{616}$ is N, xe611 to xe613 are each independently 0, 1, or 2, $R_{611}$ to $R_{613}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, and —$P(=O)(Q_{601})(Q_{602})$, in which $Q_{601}$ to $Q_{603}$ are each independently a $C_1$-$C_{10}$ alkyl group, a $C_1$-$C_{10}$ alkoxy group, a phenyl group, a biphenyl group, a terphenyl group, or a naphthyl group, $R_{614}$ to $R_{616}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group, and $L_{611}$ to $L_{613}$ are each independently selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, and wherein the organic light-emitting device satisfies Equations 1 to 3:

$$E_{3,LUMO} > E_{1,LUMO} + 0.1\ \text{eV}$$ <Equation 1>

$$E_{3,LUMO} \geq E_{4,LUMO} + 0.1\ \text{eV}$$ <Equation 2>

$$E_{3gap} \geq E_{1gap},$$ <Equation 3> wherein, in Equations 1 to 3:

$E_{1,LUMO}$ refers to lowest unoccupied molecular orbital (LUMO) energy of the first compound, $E_{3,LUMO}$ refers to LUMO energy of the third compound, $E_{4,LUMO}$ refers to LUMO energy of the fourth compound, $E_{1gap}$ refers to a gap between LUMO energy and highest occupied molecular orbital (HOMO) energy of the first compound, and $E_{3gap}$ refers to a gap between LUMO energy and HUMO energy of the third compound.

2. The organic light-emitting device as claimed in claim 1, wherein the organic light-emitting device further satisfies at least one selected from Equations 4 and 5:

$$E_{3,T1} \geq E_{2,T1}$$ <Equation 4>

$$E_{3,gap,ST} \geq E_{1,gap,ST},$$ <Equation 5> wherein, in Equations 4 and 5:

$E_{2,T1}$ refers to triplet energy of the second compound, $E_{3,T1}$ refers to triplet energy of the third compound, $E_{1,gap,ST}$ refers to a gap between singlet energy and triplet energy of the first compound, and $E_{3,gap,ST}$ refers to a gap between singlet energy and triplet energy of the third compound.

3. The organic light-emitting device as claimed in claim 1, wherein, Formula 1-1, $HT_1$ is a group represented by Formula 2-1 or 2-2.

4. The organic light-emitting device as claimed in a claim 1, wherein, in Formula 1-1, $HT_1$ is a group represented by Formula 2-1, ring $A_1$ is a group represented by one of Formulae 2A to 2C and 2I, and ring $A_2$ is a group represented by one of Formulae 2E to 2H, and wherein, in Formulae 1-2, $HT_2$ is a group represented by one of Formulae 2-1 2-2, and 2-4, and ring $A_1$, ring $A_2$, and ring $A_3$ in Formulae 2-1 2-2, and 2-4, of $HT_2$ are each independently a group represented by one of Formulae 2A to 2Z.

5. The organic light-emitting device as claimed in claim 1, wherein, in Formulae 1-1 and 1-2, $ET_1$ and $ET_2$ are each independently a group represented by one of Formulae 6-1 to 6-125:

Formula 6-1

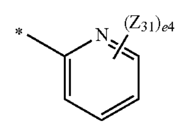

Formula 6-2

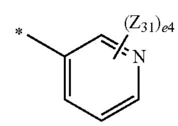

Formula 6-3

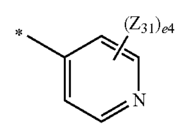

Formula 6-4

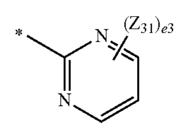

Formula 6-5

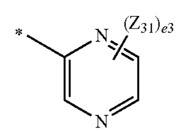

Formula 6-6

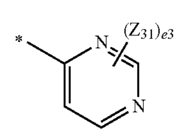

Formula 6-7

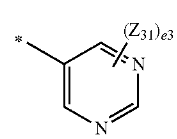

Formula 6-8

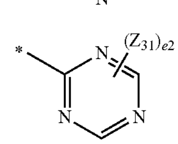

-continued
Formula 6-9
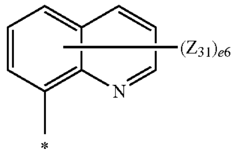
Formula 6-10
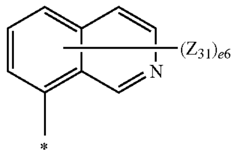
Formula 6-11
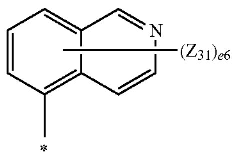
Formula 6-12
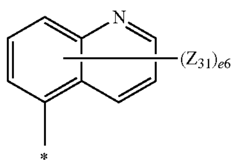
Formula 6-13
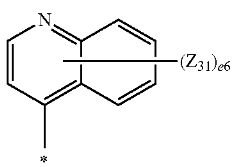
Formula 6-14
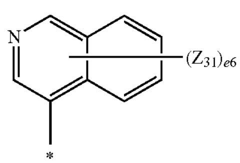
Formula 6-15
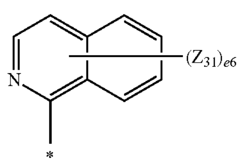
Formula 6-16
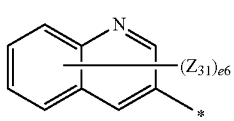
Formula 6-17
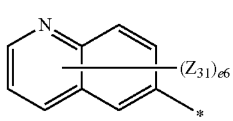
Formula 6-18
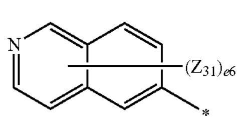
-continued
Formula 6-19
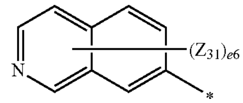
Formula 6-20
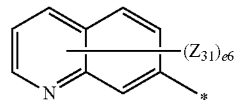
Formula 6-21
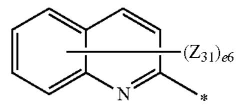
Formula 6-22
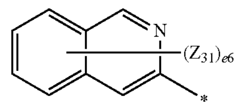
Formula 6-23
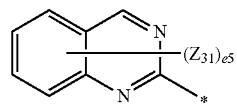
Formula 6-24
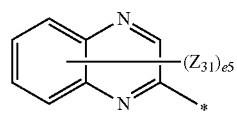
Formula 6-25
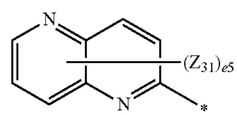
Formula 6-26
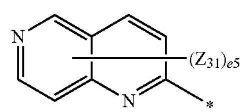
Formula 6-27
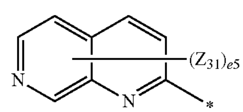
Formula 6-28
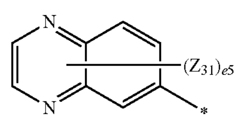
Formula 6-29
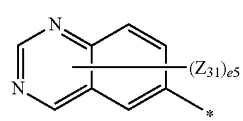
Formula 6-30
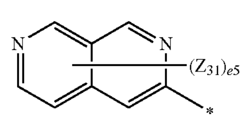

-continued
Formula 6-31
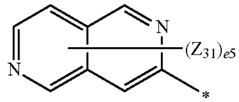
Formula 6-32
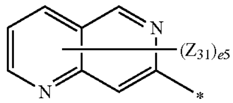
Formula 6-33
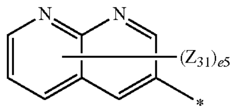
Formula 6-34
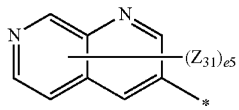
Formula 6-35
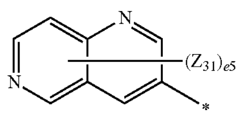
Formula 6-36
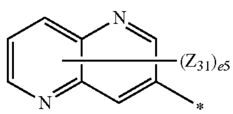
Formula 6-37
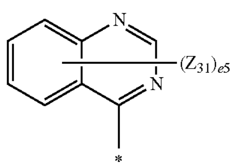
Formula 6-38
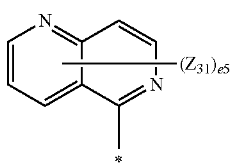
Formula 6-39
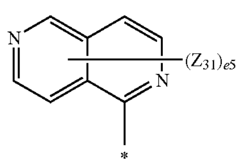
Formula 6-40
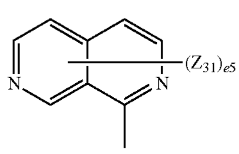
-continued
Formula 6-41
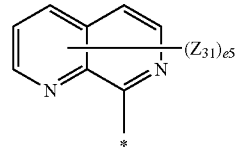
Formula 6-42
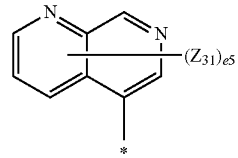
Formula 6-43
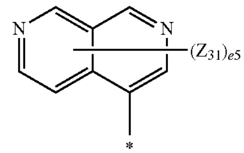
Formula 6-44
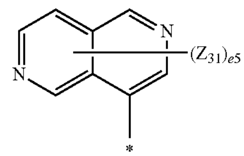
Formula 6-45
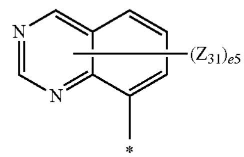
Formula 6-46
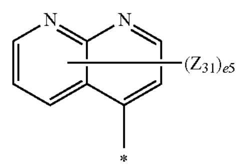
Formula 6-47
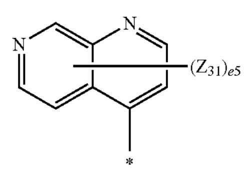
Formula 6-48
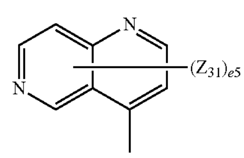
Formula 6-49
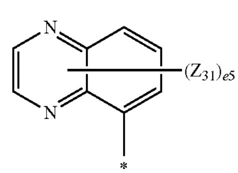

-continued
Formula 6-50
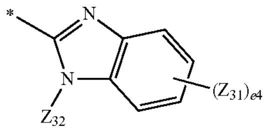
Formula 6-51
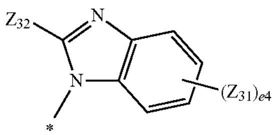
Formula 6-52
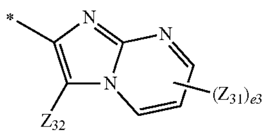
Formula 6-53
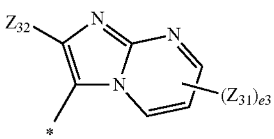
Formula 6-54
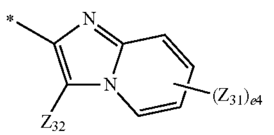
Formula 6-55
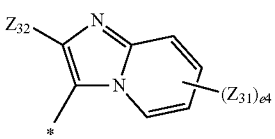
Formula 6-56
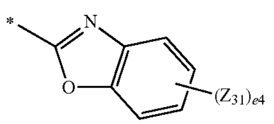
Formula 6-57
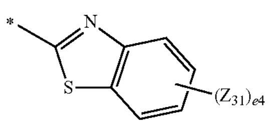
Formula 6-58
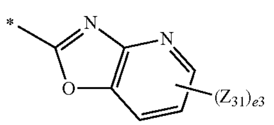
Formula 6-59
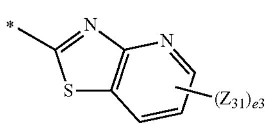
Formula 6-60
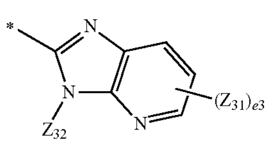
-continued
Formula 6-61
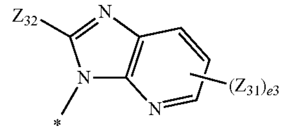
Formula 6-62
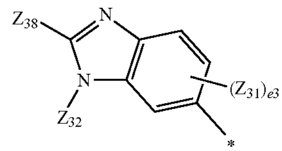
Formula 6-63
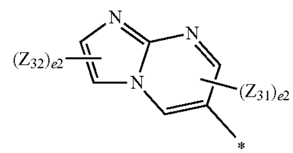
Formula 6-64
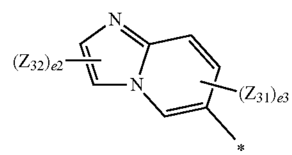
Formula 6-65
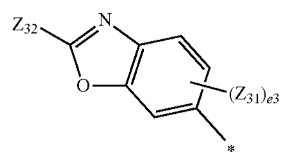
Formula 6-66
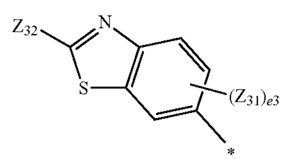
Formula 6-67
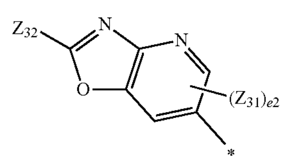
Formula 6-68
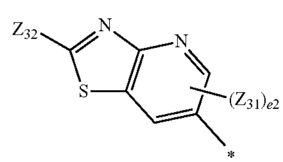
Formula 6-69
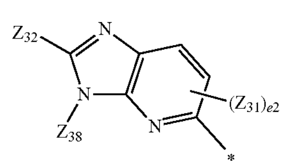

Formula 6-70
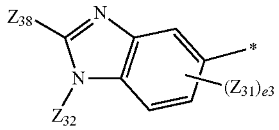
Formula 6-71
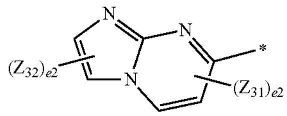
Formula 6-72
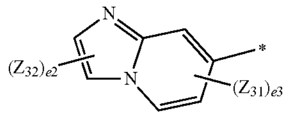
Formula 6-73
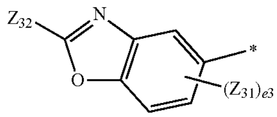
Formula 6-74
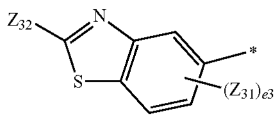
Formula 6-75
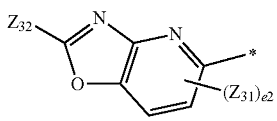
Formula 6-76
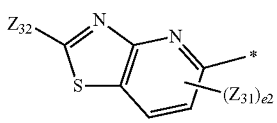
Formula 6-77
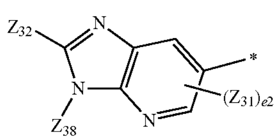
Formula 6-78
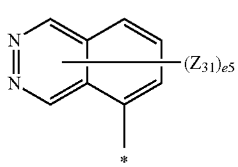
Formula 6-79
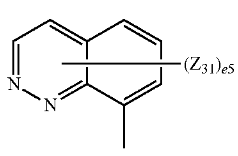
Formula 6-80
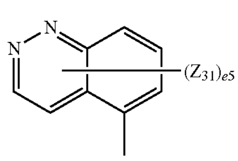
Formula 6-81
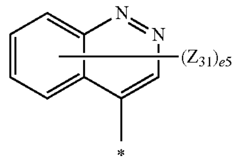
Formula 6-82
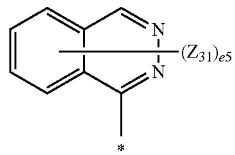
Formula 6-83
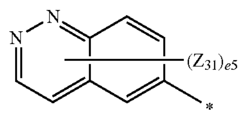
Formula 6-84
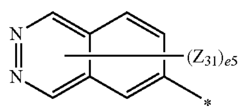
Formula 6-85
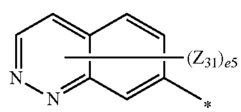
Formula 6-86
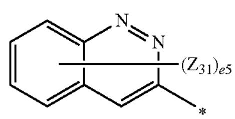
Formula 6-87
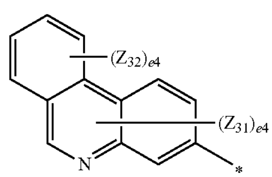
Formula 6-88
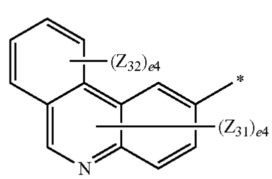
Formula 6-89
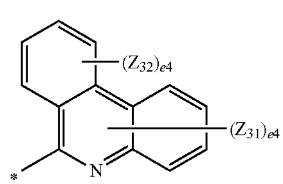

-continued
Formula 6-90
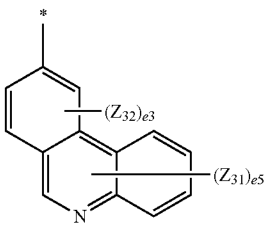
Formula 6-91
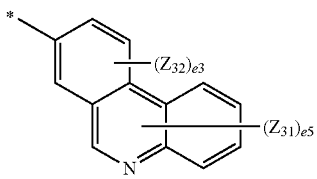
Formula 6-92
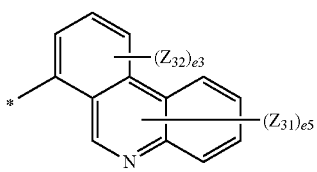
Formula 6-93
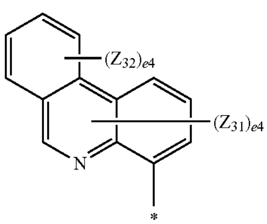
Formula 6-94
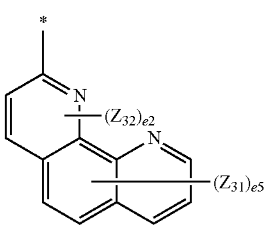
Formula 6-95
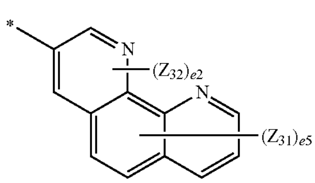
Formula 6-96
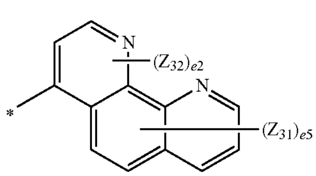
Formula 6-97
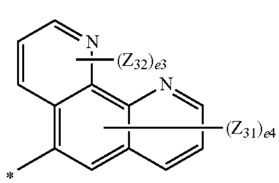
-continued
Formula 6-98
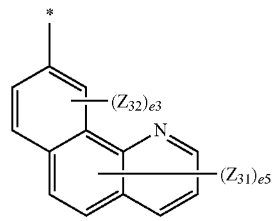
Formula 6-99
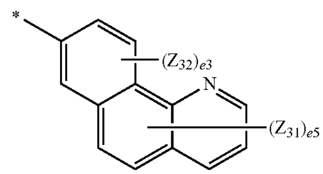
Formula 6-100
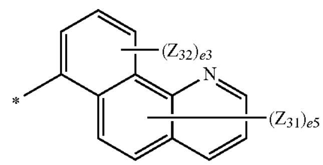
Formula 6-101
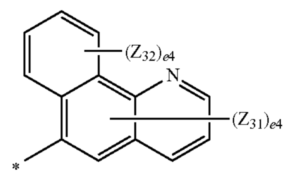
Formula 6-102
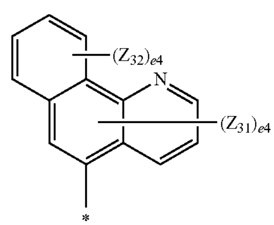
Formula 6-103
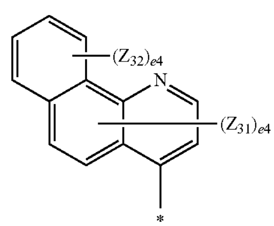
Formula 6-104
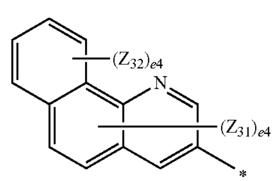
Formula 6-105
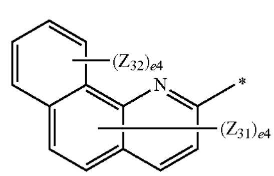

-continued
Formula 6-106
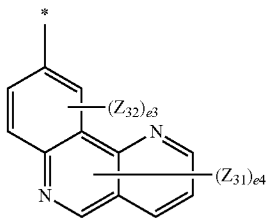
Formula 6-107
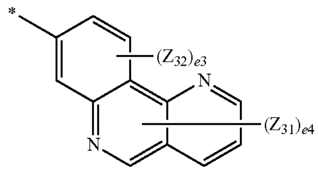
Formula 6-108
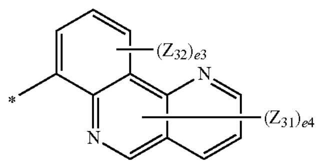
Formula 6-109
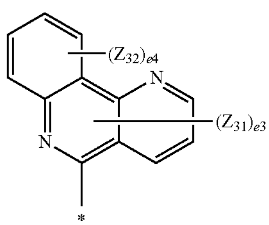
Formula 6-110
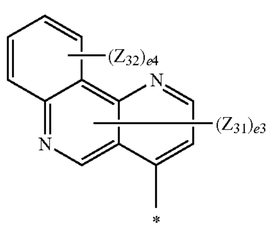
Formula 6-111
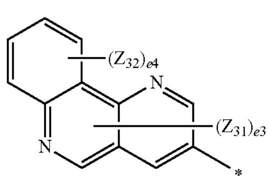
Formula 6-112
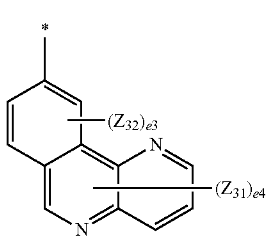
-continued
Formula 6-113
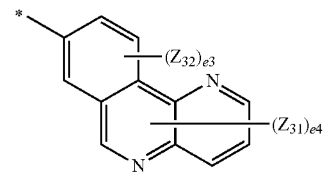
Formula 6-114
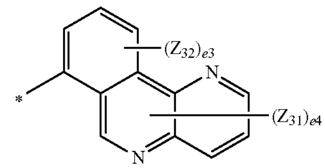
Formula 6-115
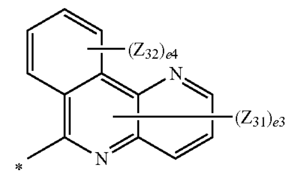
Formula 6-116
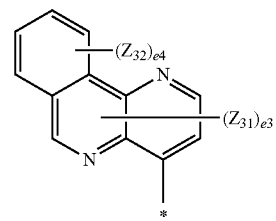
Formula 6-117
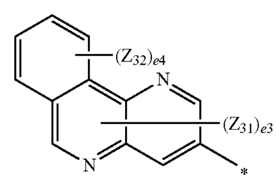
Formula 6-118
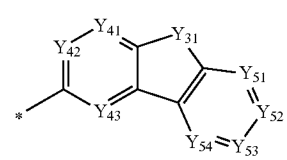
Formula 6-119
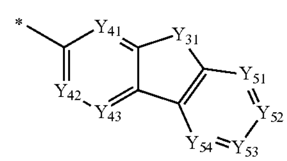
Formula 6-120
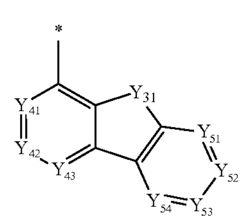

-continued

Formula 6-121

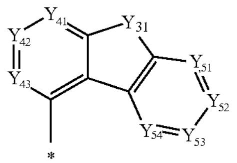

Formula 6-122

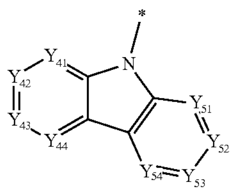

Formula 6-123

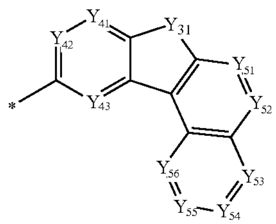

Formula 6-124

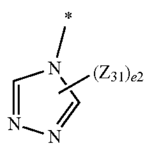

Formula 6-125

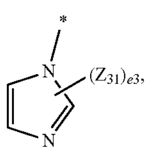

wherein, in Formulae 6-1 to 6-125, $Y_{31}$ is selected from O, S, $C(Z_{33})(Z_{34})$, $N(Z_{35})$, and $Si(Z_{36})(Z_{37})$, $Y_{41}$ is N or $C(Z_{41})$, $Y_{42}$ is N or $C(Z_{42})$, $Y_{43}$ is N or $C(Z_{43})$, $Y_{44}$ is N or $C(Z_{44})$, $Y_{51}$ is N or $C(Z_{51})$, $Y_{52}$ is N or $C(Z_{52})$, $Y_{53}$ is N or $C(Z_{53})$, $Y_{54}$ is N or $C(Z_{54})$, $Y_{55}$ is N or $C(Z_{55})$, $Y_{56}$ is N or $C(Z_{56})$, at least one selected from $Y_{41}$ to $Y_{43}$ and $Y_{51}$ to $Y_{54}$ in Formulae 6-118 to 6-121 is N, at least one selected from $Y_{41}$ to $Y_{44}$ and $Y_{51}$ to $Y_{54}$ in Formula 6-122 is N, and at least one selected from $Y_{41}$ to $Y_{43}$ and $Y_{51}$ to $Y_{56}$ in Formula 6-123 is N, $Z_{31}$ to $Z_{37}$, $Z_{41}$ to $Z_{44}$, and $Z_{51}$ to $Z_{56}$ are each independently selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, and $—Si(Q_{31})(Q_{32})(Q_{33})$; and a phenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{20}$ alkyl group, a $C_1$-$C_{20}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, a quinazolinyl group, a carbazolyl group, a fluorenyl group, $—Si(Q_{21})(Q_{22})(Q_{23})$, and $—N(Q_{21})(Q_{22})$, wherein $Q_{21}$ to $Q_{23}$ and $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, e2 is an integer of 0 to 2, e3 is an integer of 0 to 3, e4 is an integer of 0 to 4, e5 is an integer of 0 to 5, and e6 is an integer of 0 to 6, and

* indicates a binding site to a neighboring atom.

6. The organic light-emitting device as claimed in claim 1, wherein, in Formulae 1-1, 1-2, and 2-1 to 2-4, $L_{11}$, $L_{12}$, $L_1$, and $L_2$ are each independently selected from:

a phenylene group, a pentalenylene group, an indenylene group, a naphthylene group, an azulenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), and —B($Q_{31}$)($Q_{32}$), wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group.

7. The organic light-emitting device as claimed in claim 1, wherein, in Formulae 1-1, 1-2, and 2-1 to 2-4, $L_{11}$, $L_{12}$, $L_1$, and $L_2$ are each a group represented by one of Formulae 3-1 to 3-43:

3-1

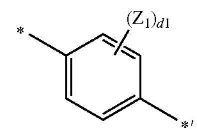

3-2

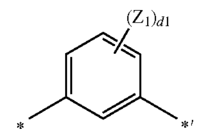

3-3

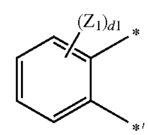

3-4

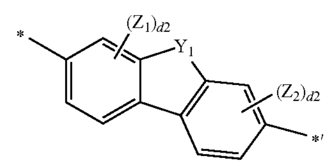

3-5

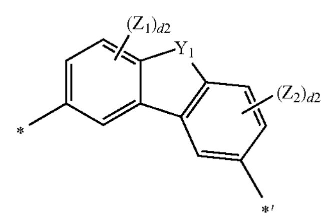

3-6

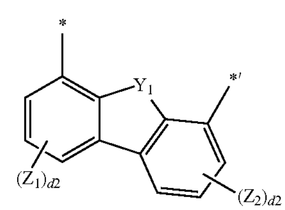

3-7

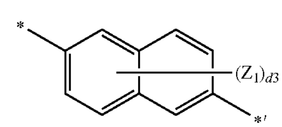

3-8

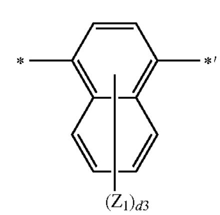

-continued
3-9
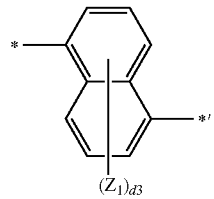
3-10
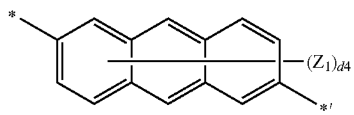
3-11
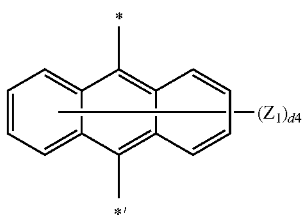
3-12
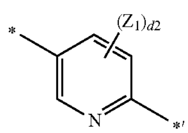
3-13
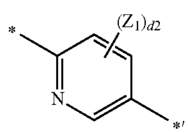
3-14
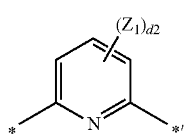
3-15
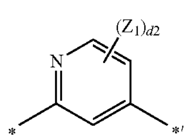
3-16
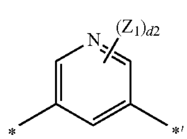
3-17
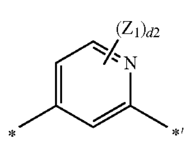
3-18
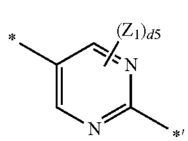
-continued
3-19
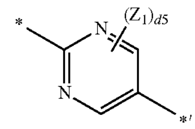
3-20
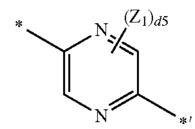
3-21
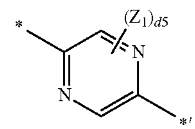
3-22
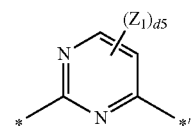
3-23
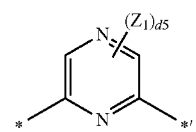
3-24
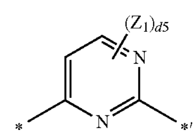
3-25
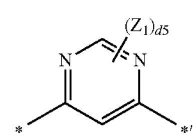
3-26
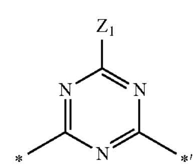
3-27
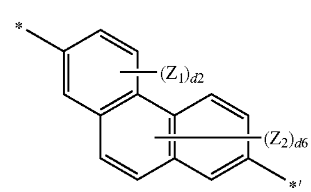
3-28
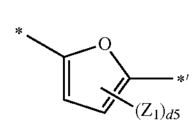

-continued
3-29
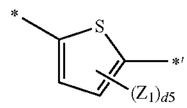
3-30
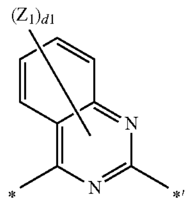
3-31
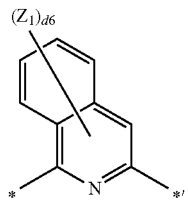
3-32
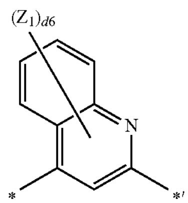
3-33
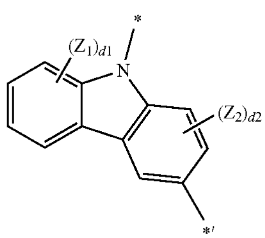
3-34
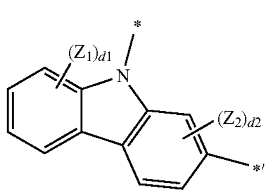
3-35
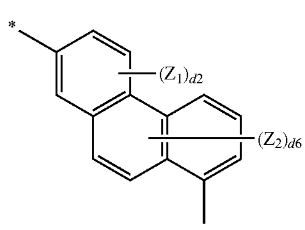
-continued
3-36
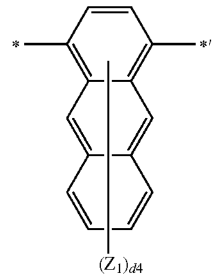
3-37
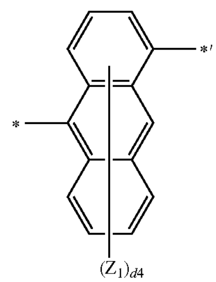
3-38
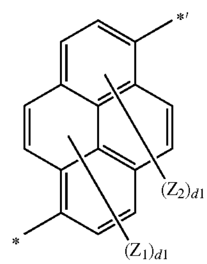
3-39
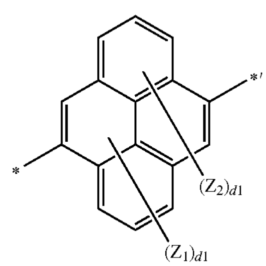
3-40
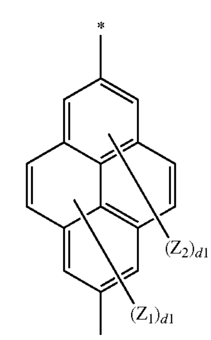

-continued 3-41

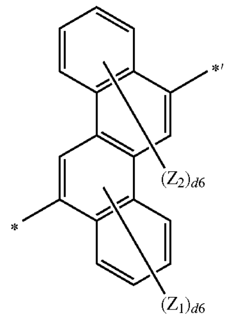

3-42

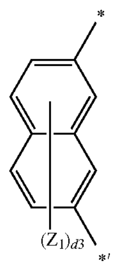

3-43

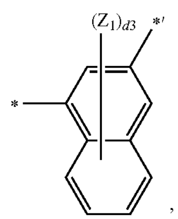

wherein, in Formulae 3-1 to 3-43, $Y_1$ is selected from O, S, $C(Z_3)(Z_4)$, $N(Z_5)$, and $Si(Z_6)(Z_7)$, $Z_1$ to $Z_7$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, $—Si(Q_{31})(Q_{32})(Q_{33})$, $—N(Q_{31})(Q_{32})$, and $—B(Q_{31})(Q_{32})$, wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, d1 is an integer of 1 to 4, d2 is an integer of 1 to 3, d3 is an integer of 1 to 6, d4 is an integer of 1 to 8, d5 is 1 or 2, and d6 is an integer of 1 to 5, and

* and *' each indicate a binding site to a neighboring atom.

8. The organic light-emitting device as claimed in claim 1, wherein, in Formulae 1-1, 1-2, and 2-1 to 2-4: a11 and a12 are each independently an integer of 0 to 3, and a1 to a3 are each independently 0 or 1.

9. The organic light-emitting device as claimed in claim 1, wherein, in Formulae 2-1 to 2-4, $R_1$ to $R_3$ are each independently selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenoxy group, $—Si(Q_1)(Q_2)(Q_3)$, $—N(Q_1)(Q_2)$, and $—B(Q_1)(Q_2)$;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, a pyridoindolyl group, an isoindolyl group, an indazolyl group, a purinyl group, a quinolinyl group, an isoquinolinyl group, an indoloisoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, and an imidazopyrimidinyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, a pyridoindolyl group, an isoindolyl group, an indazolyl group, a purinyl group, a quinolinyl group, an isoquinolinyl group, an indoloisoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, a pyridinyl group, an indolyl group, an isoindolyl group, a purinyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, —$Si(Q_{31})(Q_{32})(Q_{33})$, —$N(Q_{31})(Q_{32})$, and —$B(Q_{31})(Q_{32})$, wherein $Q_1$ to $Q_3$ and $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group.

10. The organic light-emitting device as claimed in claim 1, wherein, in Formulae 2-1 to 2-4, $R_1$ to $R_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenoxy group, —$Si(Q_1)(Q_2)(Q_3)$, —$N(Q_1)(Q_2)$, a group represented by one of Formulae 5-1 to 5-18, and a group represented by one of Formulae 6-1 to 6-125:

Formula 5-1

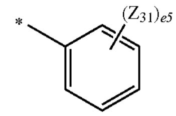

Formula 5-2

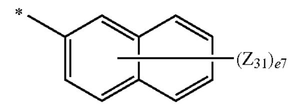

Formula 5-3

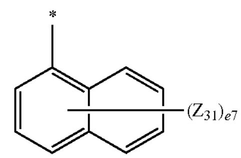

Formula 5-4

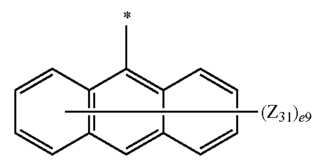

Formula 5-5

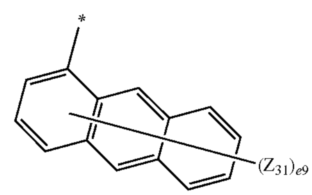

Formula 5-6

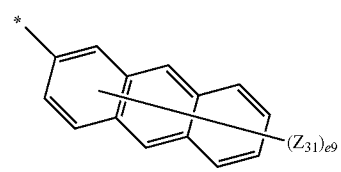

Formula 5-7

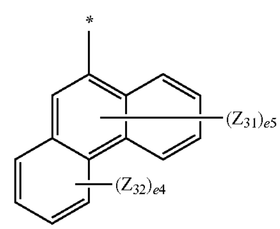

Formula 5-8

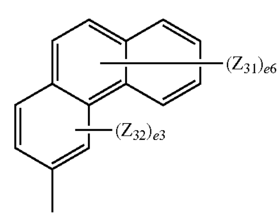

Formula 5-9

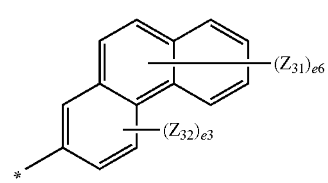

-continued
Formula 5-10
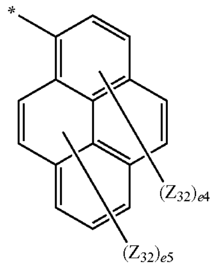
Formula 5-11
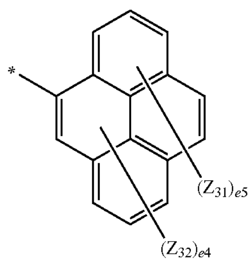
Formula 5-12
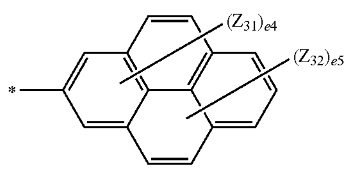
Formula 5-13
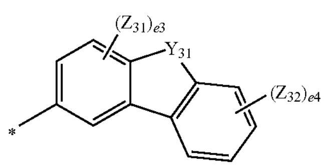
Formula 5-14
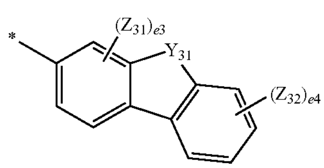
Formula 5-15
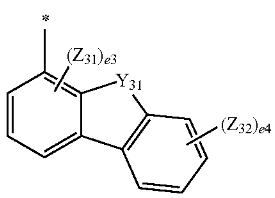
Formula 5-16
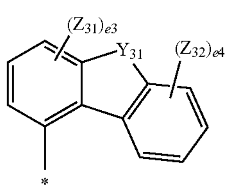
Formula 5-17
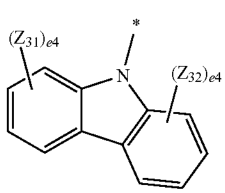
-continued
Formula 5-18
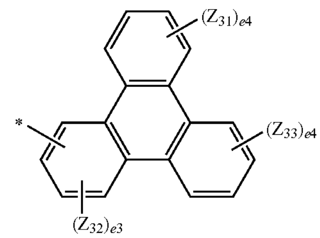
Formula 6-1
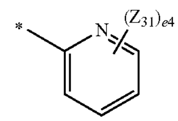
Formula 6-2
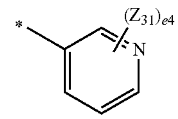
Formula 6-3
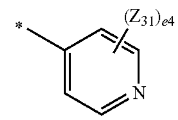
Formula 6-4
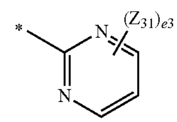
Formula 6-5
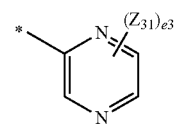
Formula 6-6
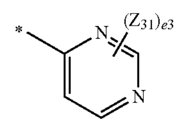
Formula 6-7
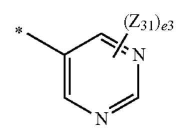
Formula 6-8
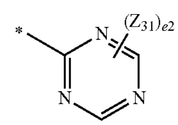
Formula 6-9
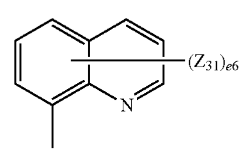
Formula 6-10
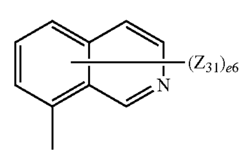

-continued
Formula 6-11
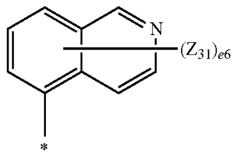
Formula 6-12
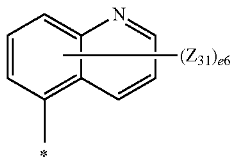
Formula 6-13
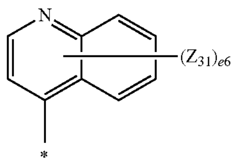
Formula 6-14
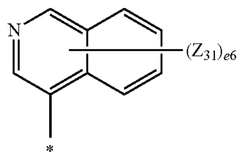
Formula 6-15
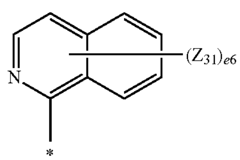
Formula 6-16
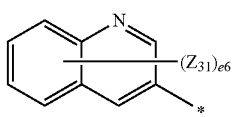
Formula 6-17
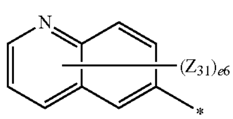
Formula 6-18
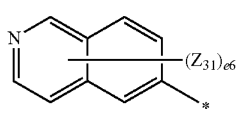
Formula 6-19
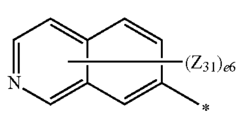
Formula 6-20
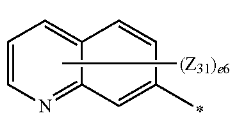
-continued
Formula 6-21
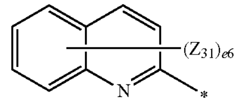
Formula 6-22
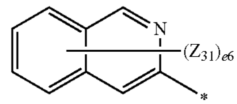
Formula 6-23
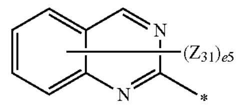
Formula 6-24
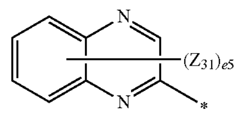
Formula 6-25
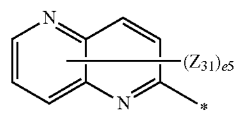
Formula 6-26
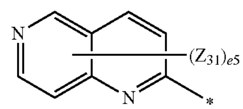
Formula 6-27
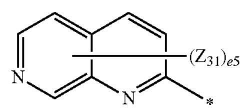
Formula 6-28
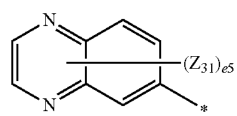
Formula 6-29
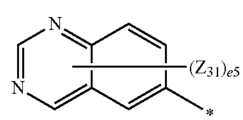
Formula 6-30
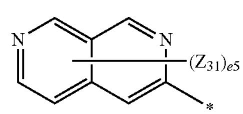
Formula 6-31
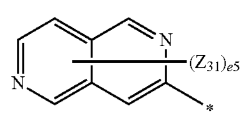
Formula 6-32
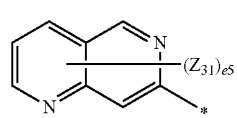

-continued
Formula 6-33
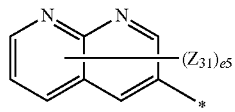
Formula 6-34
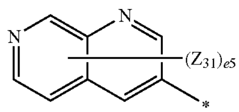
Formula 6-35
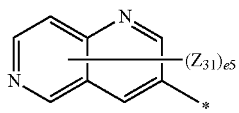
Formula 6-36
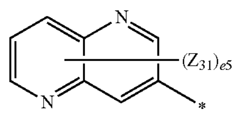
Formula 6-37
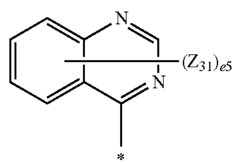
Formula 6-38
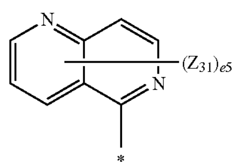
Formula 6-39
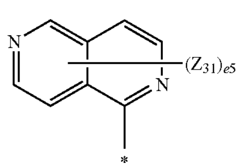
Formula 6-40
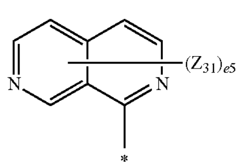
Formula 6-41
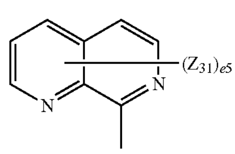
Formula 6-42
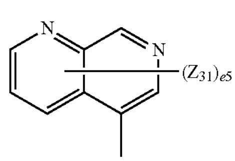
Formula 6-43
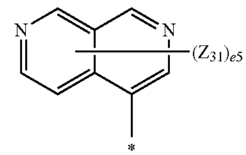
Formula 6-44
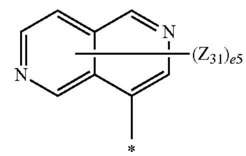
Formula 6-45
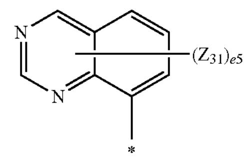
Formula 6-46
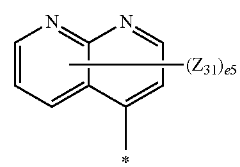
Formula 6-47
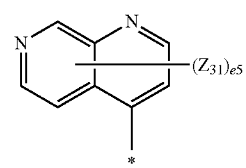
Formula 6-48
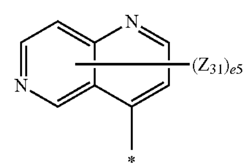
Formula 6-49
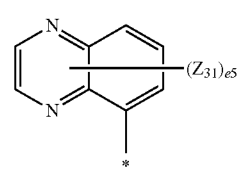
Formula 6-50
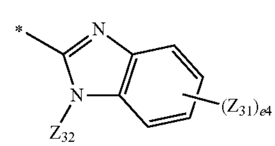
Formula 6-51
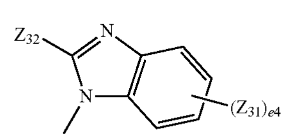

-continued
Formula 6-52
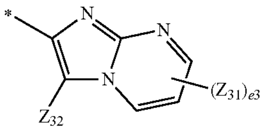
Formula 6-53
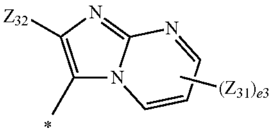
Formula 6-54
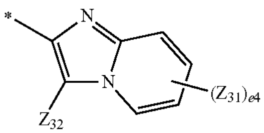
Formula 6-55
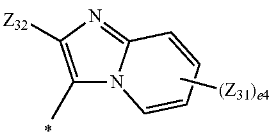
Formula 6-56
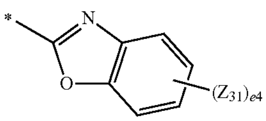
Formula 6-57
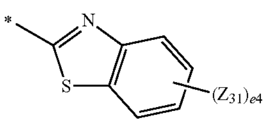
Formula 6-58
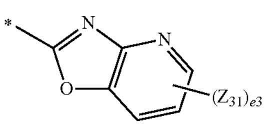
Formula 6-59
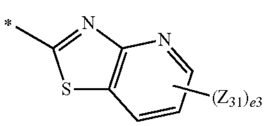
Formula 6-60
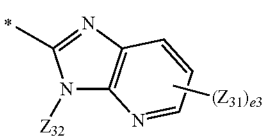
Formula 6-61
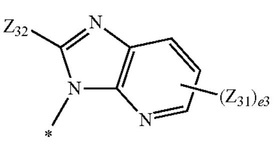
Formula 6-62
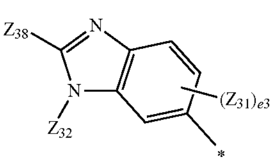
-continued
Formula 6-63
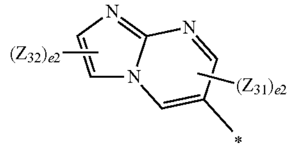
Formula 6-64
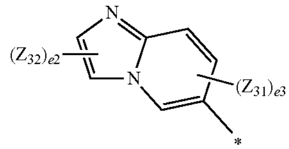
Formula 6-65
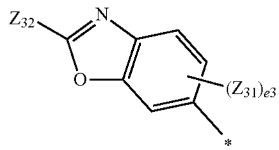
Formula 6-66
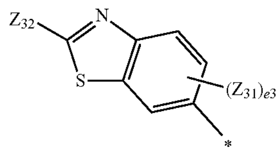
Formula 6-67
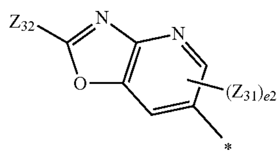
Formula 6-68
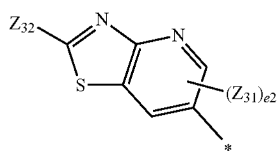
Formula 6-69
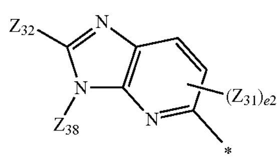
Formula 6-70
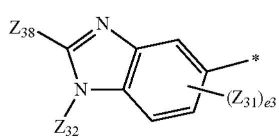
Formula 6-71
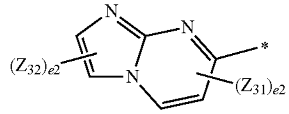
Formula 6-72
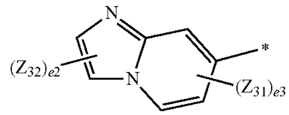

-continued
Formula 6-73
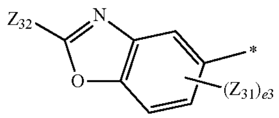
Formula 6-74
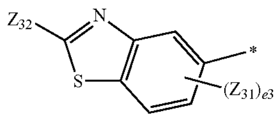
Formula 6-75
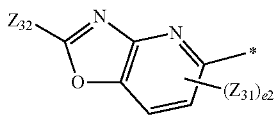
Formula 6-76
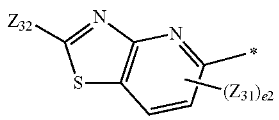
Formula 6-77
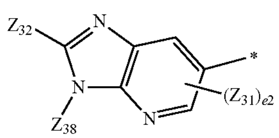
Formula 6-78
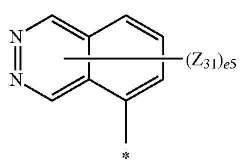
Formula 6-79
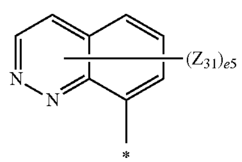
Formula 6-80
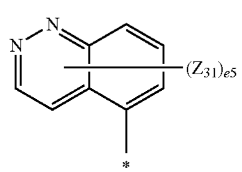
Formula 6-81
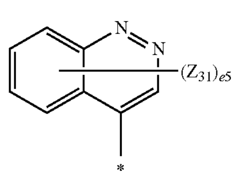
Formula 6-82
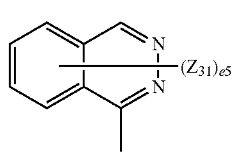
-continued
Formula 6-83
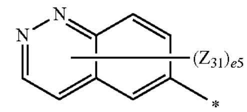
Formula 6-84
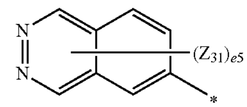
Formula 6-85
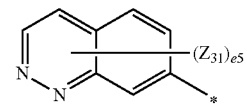
Formula 6-90
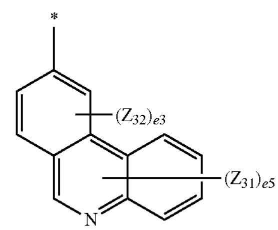
Formula 6-91
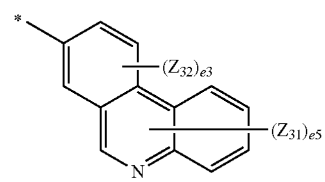
Formula 6-92
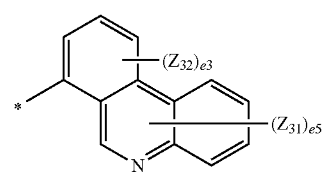
Formula 6-93
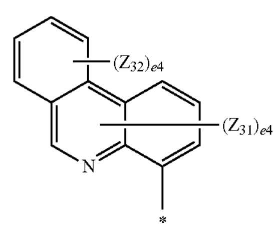
Formula 6-94
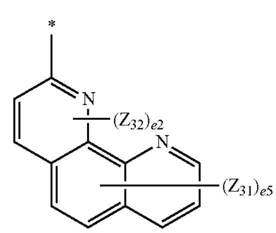
Formula 6-95
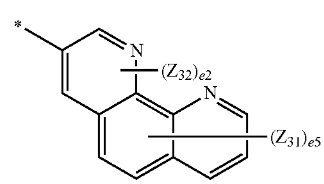

Formula 6-96
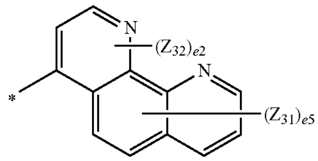
Formula 6-97
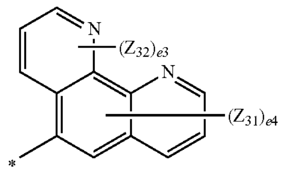
Formula 6-98
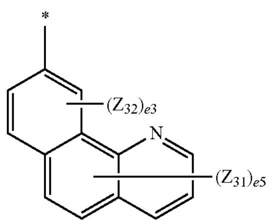
Formula 6-99
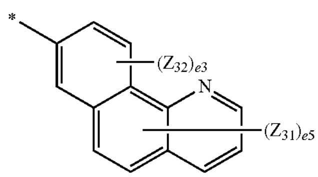
Formula 6-100
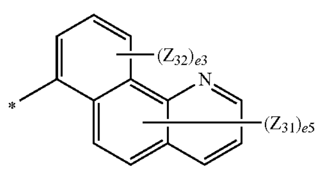
Formula 6-101
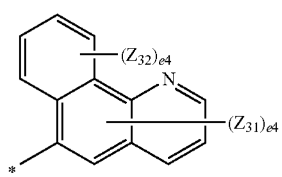
Formula 6-102
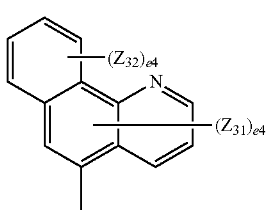
Formula 6-103
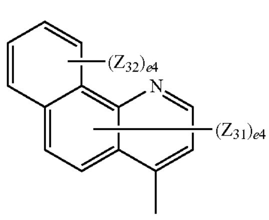
Formula 6-104
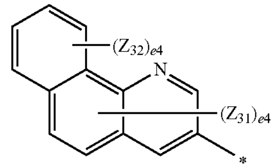
Formula 6-105
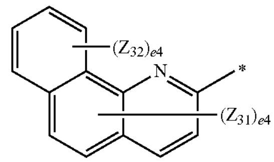
Formula 6-106
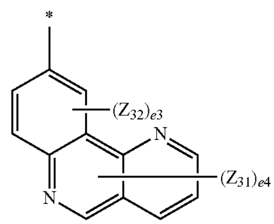
Formula 6-107
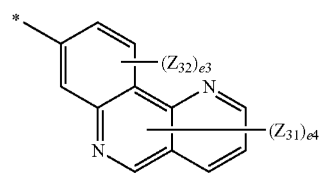
Formula 6-108
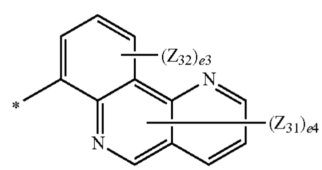
Formula 6-109
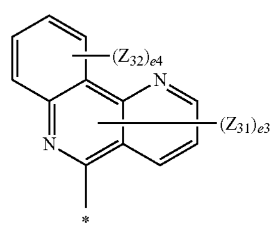
Formula 6-110
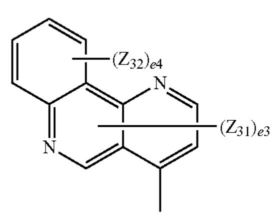
Formula 6-111
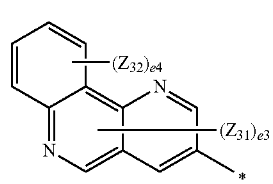

-continued

Formula 6-112

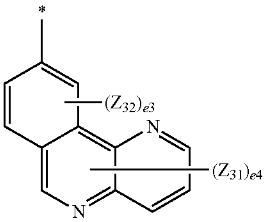

Formula 6-113

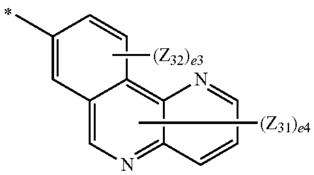

Formula 6-114

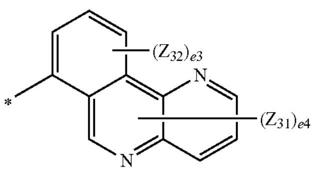

Formula 6-115

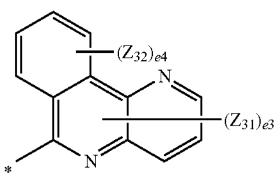

Formula 6-116

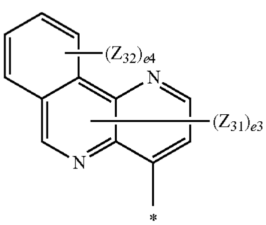

Formula 6-117

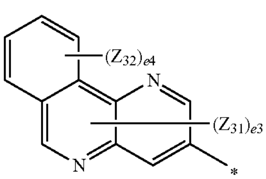

Formula 6-118

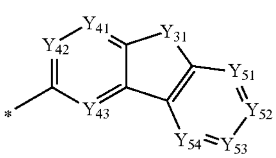

Formula 6-119

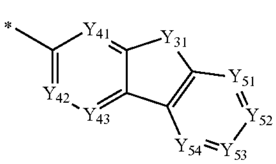

-continued

Formula 6-120

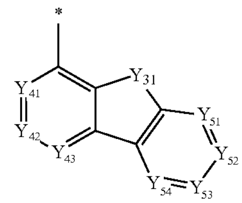

Formula 6-121

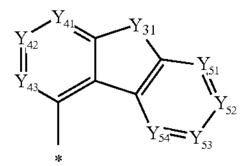

Formula 6-122

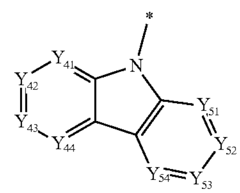

Formula 6-123

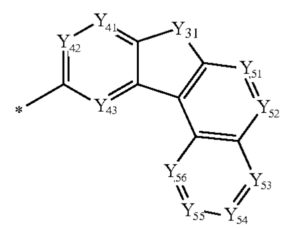

Formula 6-124

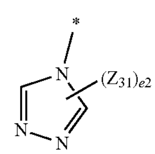

Formula 6-125

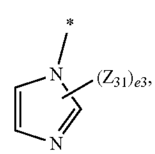

wherein, in Formulae 5-1 to 5-18 and 6-1 to 6-125, $Y_{31}$ is selected from O, S, $C(Z_{33})(Z_{34})$, $N(Z_{35})$, $B(Z_{35})$, $P(Z_{35})$, $P(=O)(Z_{35})$, and $Si(Z_{36})(Z_{37})$, $Y_{41}$ is N or $C(Z_{41})$, $Y_{42}$ is N or $C(Z_{42})$, $Y_{43}$ is N or $C(Z_{43})$, $Y_{44}$ is N or $C(Z_{44})$, $Y_{51}$ is N or $C(Z_{51})$, $Y_{52}$ is N or $C(Z_{52})$, $Y_{53}$ is N or $C(Z_{53})$, $Y_{54}$ is N or $C(Z_{54})$, $Y_{55}$ is N or $C(Z_{55})$, $Y_{56}$ is N or $C(Z_{56})$, at least one selected from $Y_{41}$ to $Y_{43}$ and $Y_{51}$ to $Y_{54}$ in Formulae 6-118 to 6-121 is N, at least one selected from $Y_{41}$ to $Y_{44}$ and $Y_{51}$ to $Y_{54}$ in Formula 6-122 is N, and at least one selected from $Y_{41}$ to $Y_{43}$ and $Y_{51}$ to $Y_{56}$ in Formula 6-123 is N, $Z_{31}$ to $Z_{37}$, $Z_{41}$ to $Z_{44}$, and $Z_{51}$ to $Z_{56}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, and —$Si(Q_{31})(Q_{32})(Q_{33})$, $Z_{36}$ and $Z_{37}$ are separate or are linked to form a saturated or unsaturated ring, wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, e2 is an integer of 0 to 2, e3 is an integer of 0 to 3, e4 is an integer of 0 to 4, e5 is an integer of 0 to 5, e6 is an integer of 0 to 6, e7 is an integer of 0 to 7, and e9 is an integer of 0 to 9, and

* indicates a binding site to a neighboring atom.

11. The organic light-emitting device as claimed in claim 1, wherein the buffer layer directly contacts the emission layer.

12. The organic light-emitting device as claimed in claim 1, wherein the second compound is represented by Formula 401:

$$M(L_{401})_{xc1}(L_{402})_{xc2}$$ <Formula 401> wherein, in Formula 401,

M is selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ is a ligand represented by Formula 402, and xc1 is 1, 2, or 3, wherein when xc1 is two or more, two or more $L_{401}$(s) are identical to or different from each other, $L_{402}$ is an organic ligand, and xc2 is an integer of 0 to 4, wherein when xc2 is two or more, two or more $L_{402}$(s) are identical to or different from each other, <Formula 402>

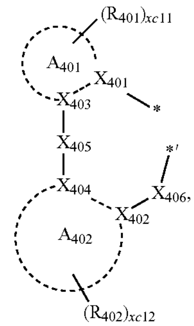

wherein, in Formulae 401 and 402, $X_{401}$ to $X_{404}$ are each independently nitrogen or carbon, $X_{401}$ and $X_{403}$ are linked via a single bond or a double bond, and $X_{402}$ and $X_{404}$ are linked via a single bond or a double bond, ring $A_{401}$ and ring $A_{402}$ are each independently selected from a $C_5$-$C_{60}$ carbocyclic group or a $C_1$-$C_{60}$ heterocyclic group, $X_{405}$ is a single bond, *—O—*', *—S—*', *—C(=O)—*', *—$N(Q_{411})$*', *—$C(Q_{411})(Q_{412})$-*', *—$C(Q_{411})$=$C(Q_{412})$-*', *—$C(Q_{411})$=*', or *=$C(Q_{411})$=*', wherein $Q_{411}$ and $Q_{412}$ are hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ is a single bond, O, or S, $R_{401}$ and $R_{402}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, and —$P(=O)(Q_{401})(Q_{402})$, wherein $Q_{401}$ to $Q_{403}$ are each independently selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 are each independently an integer of 0 to 10, and

* and *' in Formula 402 each indicate a binding site to M in Formula 401.

13. The organic light-emitting device as claimed in claim 1, wherein the emission layer further includes a fifth compound, the fifth compound not including an electron transport group.

14. An organic light-emitting device, comprising:
a first electrode;
a second electrode facing the first electrode;
an emission layer between the first electrode and the second electrode, the emission layer including a first compound and a second compound;
a hole transport region between the first electrode and the emission layer; and
an electron transport region, the electron transport region including:
a buffer layer between the emission layer and the second electrode, the buffer layer including a third compound, and
an electron transport layer between the buffer layer and the second electrode, the electron transport laver including a fourth compound,
wherein, in the emission layer, the first compound is a phosphorescent host and the second compound is a phosphorescent dopant,
wherein the first compound and the third compound are different from each other,
wherein the first compound is selected from Compounds 102, 104 to 106, 109 to 132, 210 to 223 and 234 to 237, Compounds B-1 to B-19, Compounds C-1 to C-19, Compounds D-1 to D-19, Compounds E-1 to E-19, Compounds F-1 to F-19, Compounds G-1 to G-19, Compounds H-1 to H-19, Compounds I-1 to I-19, Compounds J-1 to J-10, Compounds K-1 to K-10, Compounds L-1 to L-16, Compounds M-1 to M-8, Compound N-1, Compound N-2, and Compounds LE-01 to LE-32, and the third compound is selected from Compounds 100 to 237, Compounds A-1 to A-19, Compounds C-1 to C-19, Compounds D-1 to D-19, Compounds E-1 to E-19, Compounds F-1 to F-19, Compounds G-1 to G-19, Compounds H-1 to H-19, Compounds I-1 to I-19, Compounds J-1 to J-10, Compounds K-1 to K-10, Compounds L-1 to L-16, Compounds M-1 to M-8, Compound N-1, Compound N-2, Compounds 101A to 207A, Compounds 301B to 314B:

100

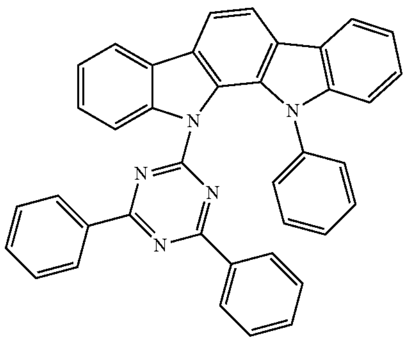

101

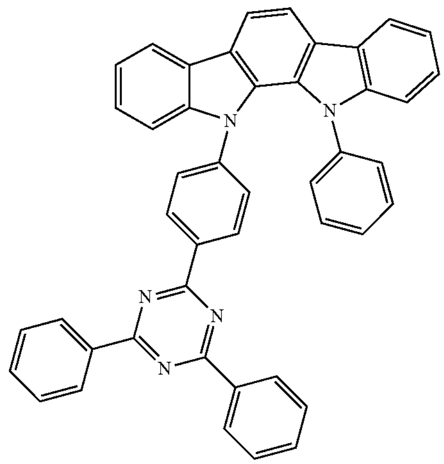

102

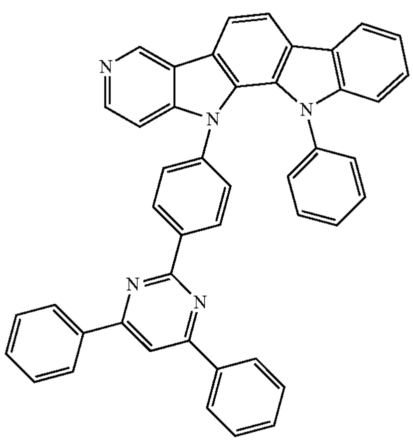

103

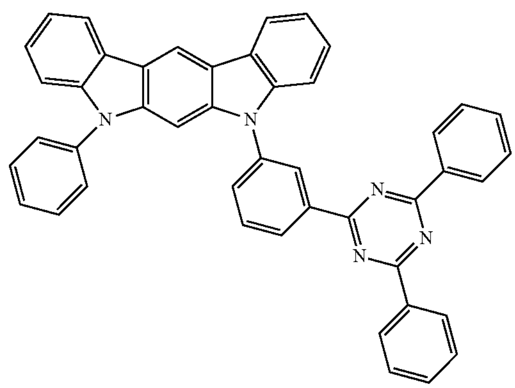

-continued
104
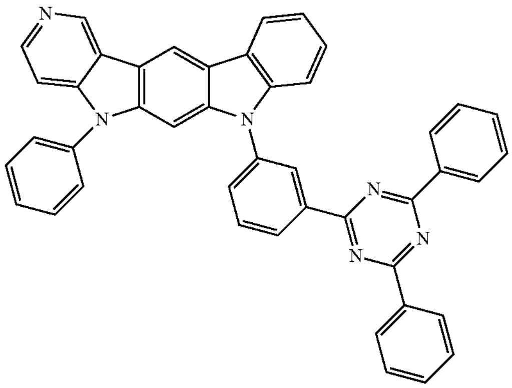
105
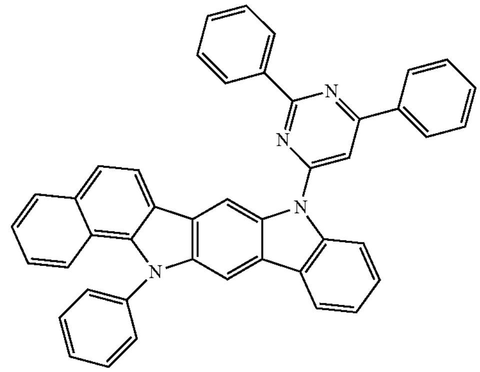
107
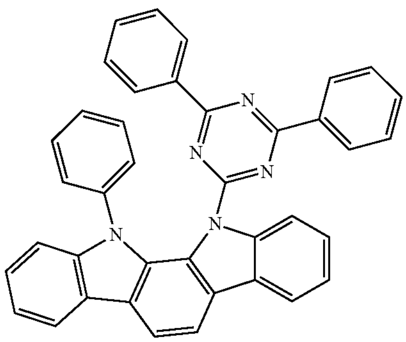
108
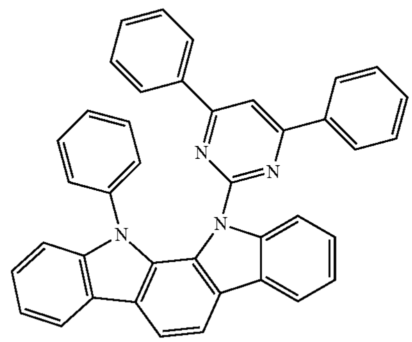
109
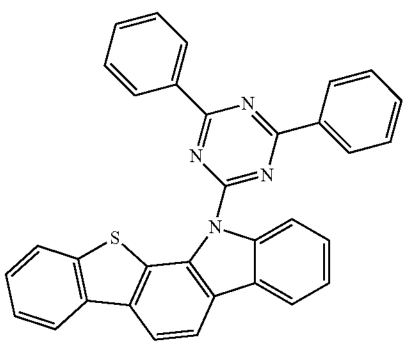
110
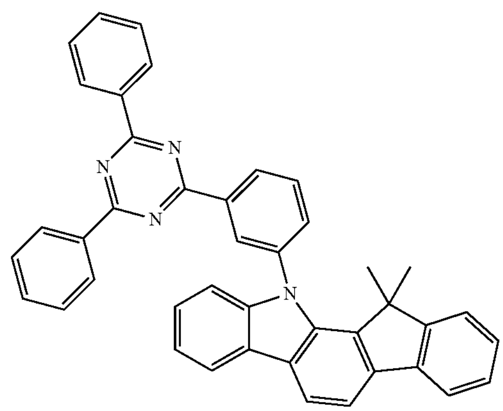
111
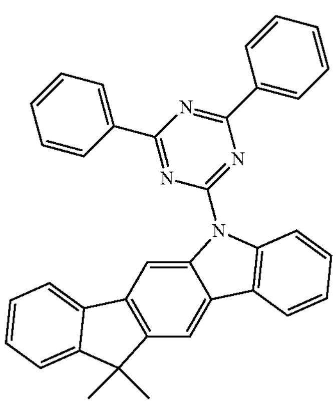
112
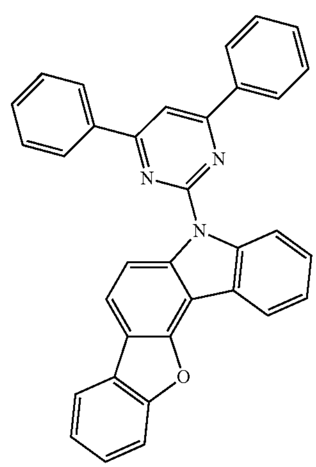

-continued
113
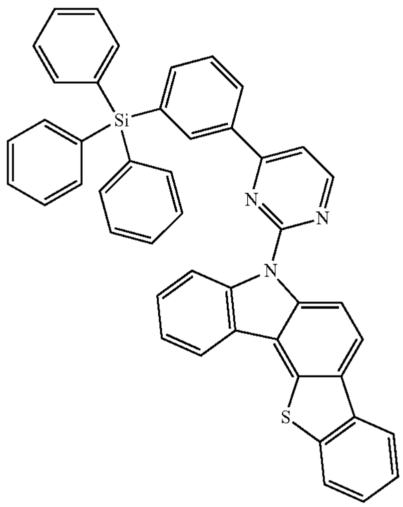
114
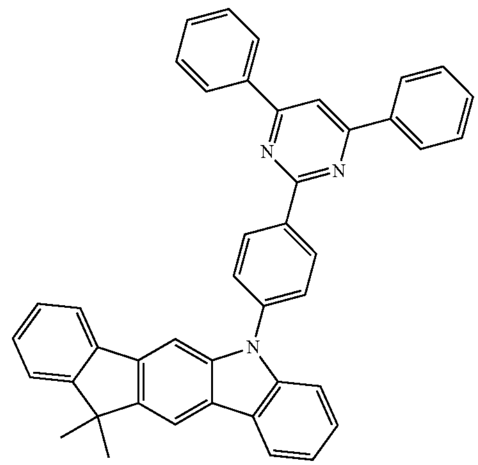
115
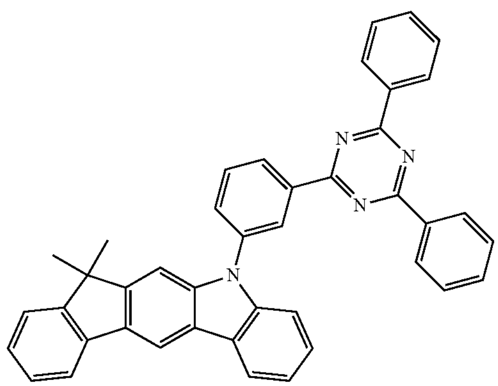
116
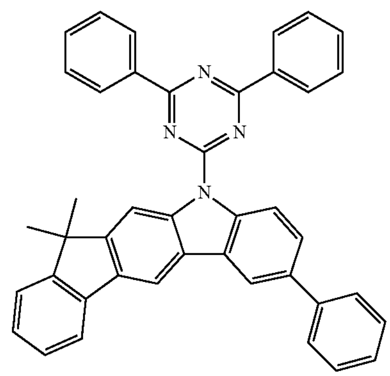
117
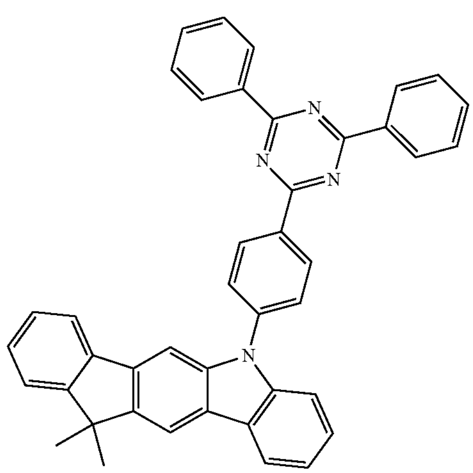
118
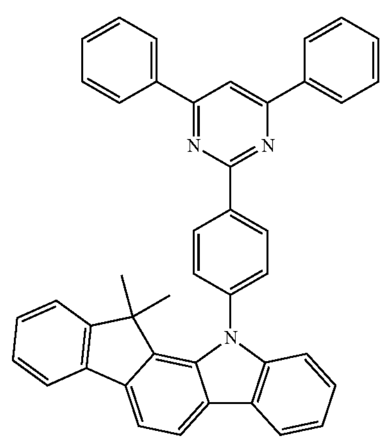

-continued
119
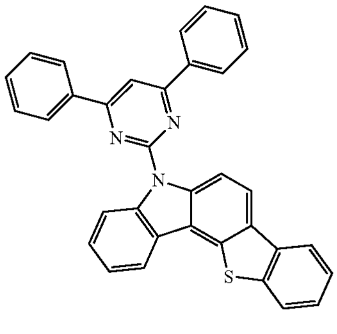
120
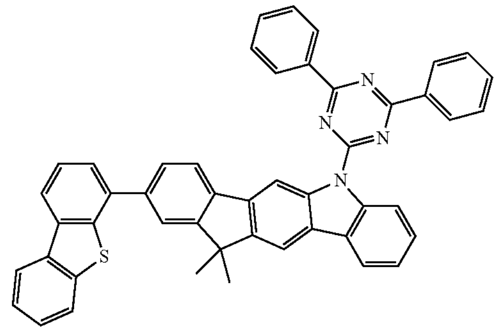
121
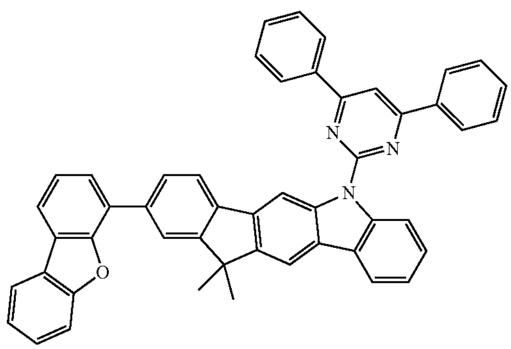
122
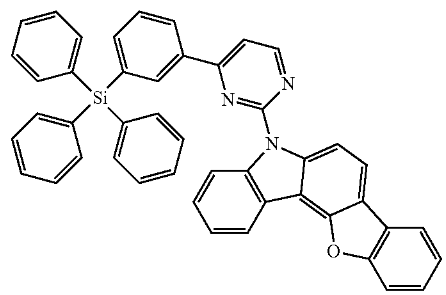
125
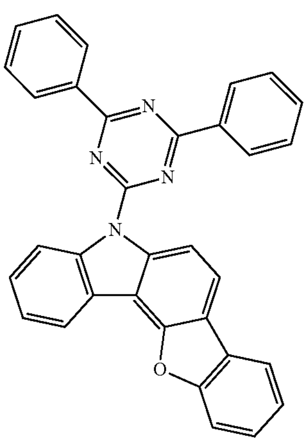
126
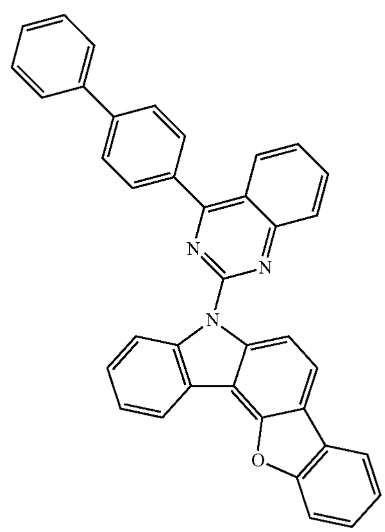

-continued
127
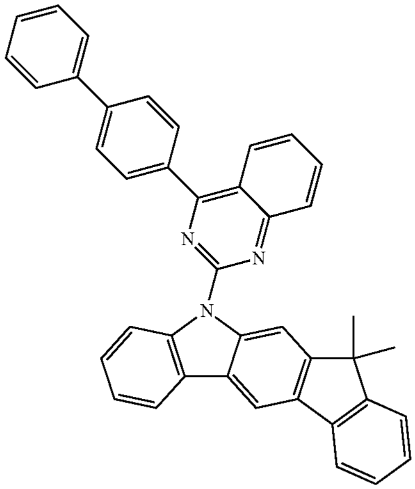
128
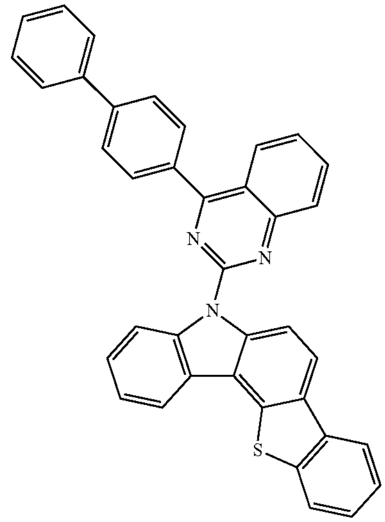
129
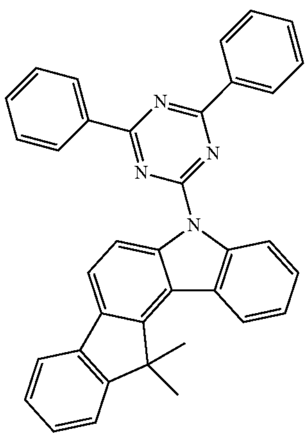
130
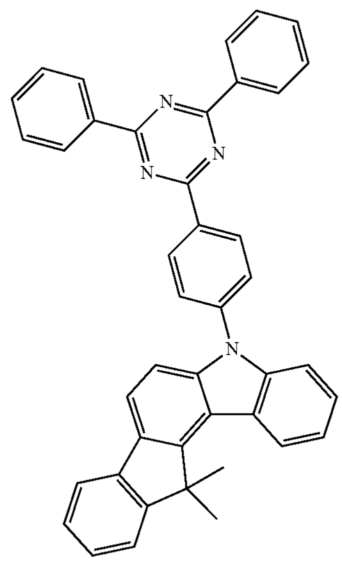
131
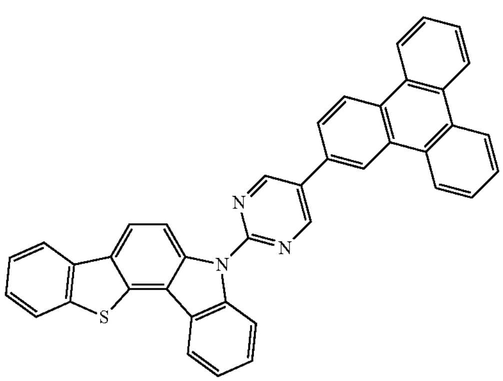
132
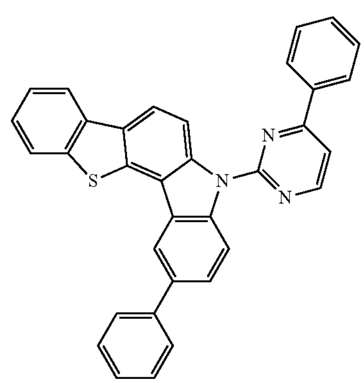

-continued
133
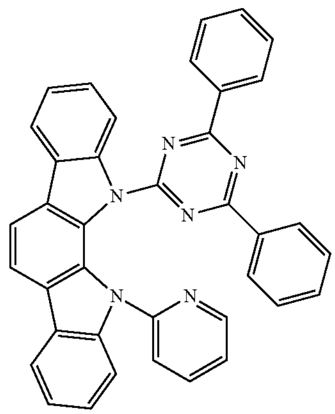
134
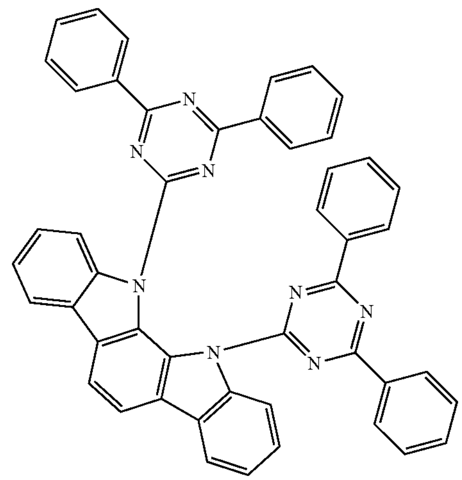
135
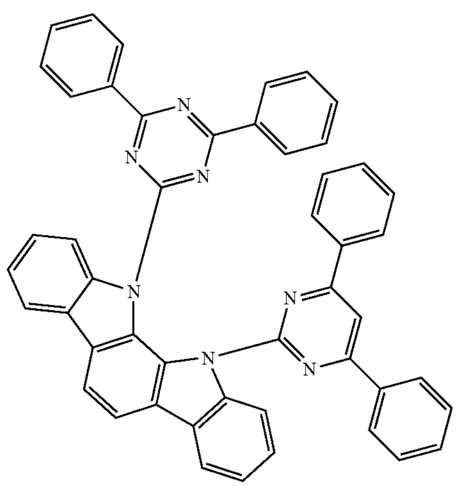
136
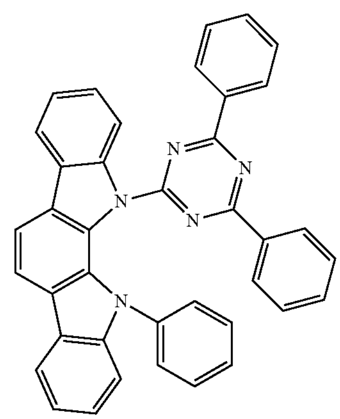
137
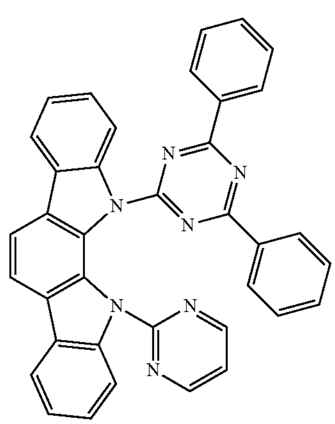
138
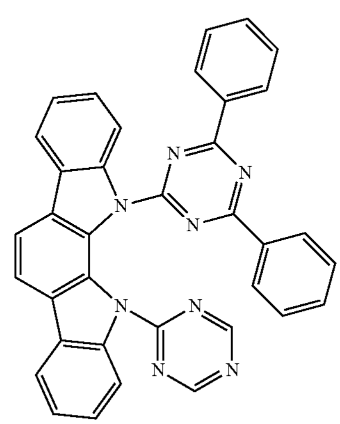

-continued
139
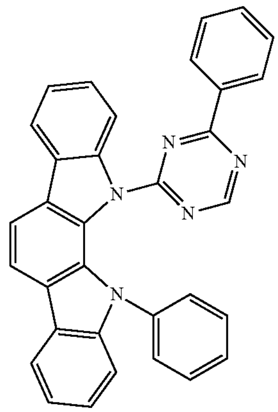
140
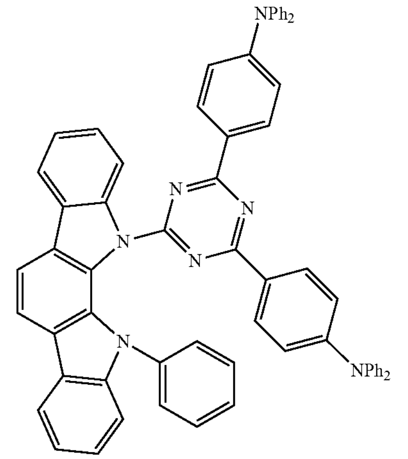
141
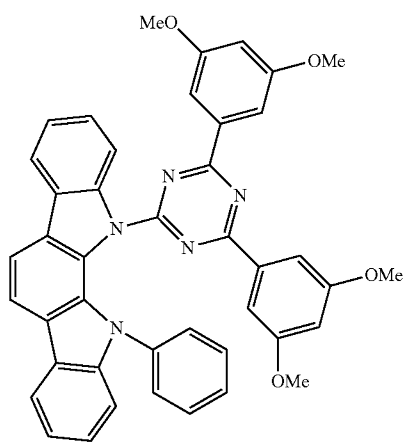
142
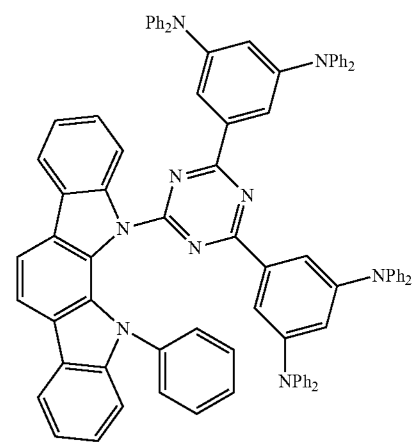
143
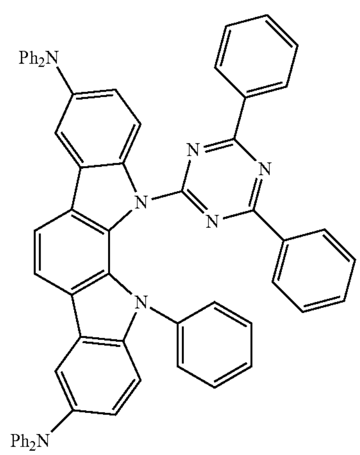
144
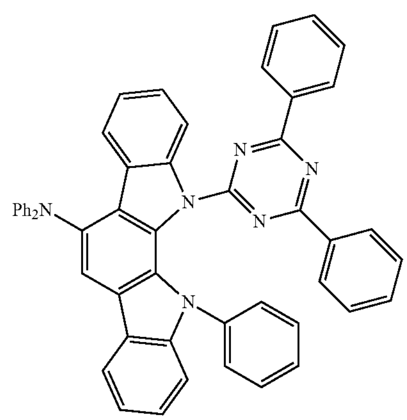

-continued
145
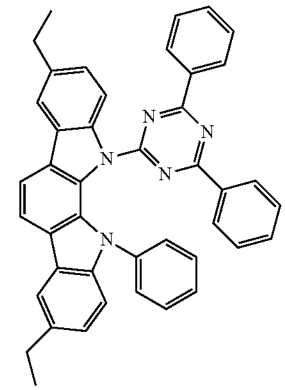
146
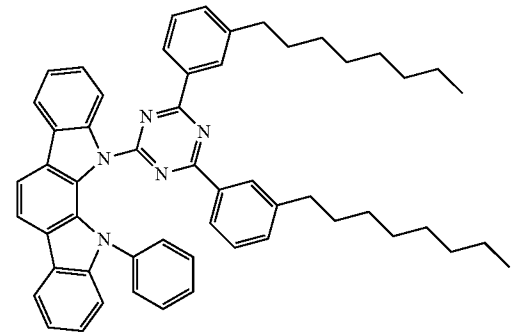
147
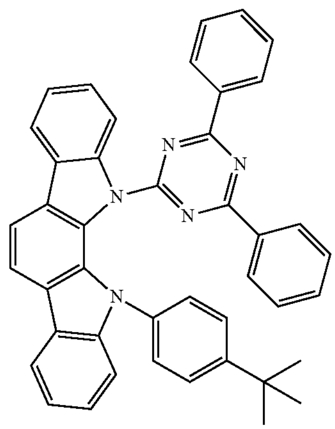
148
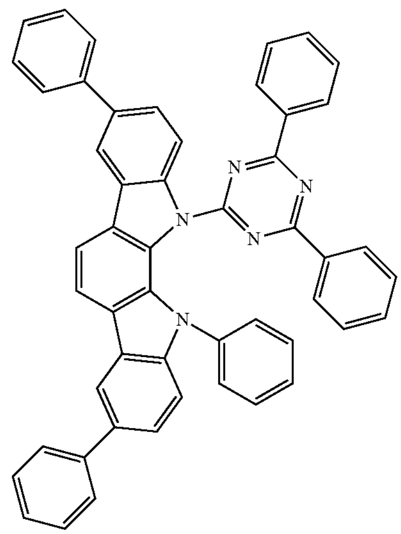
149
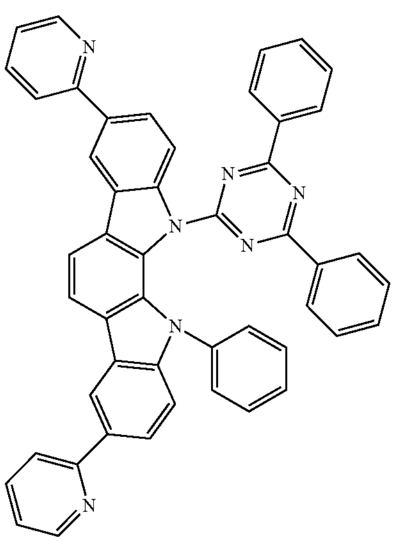
150
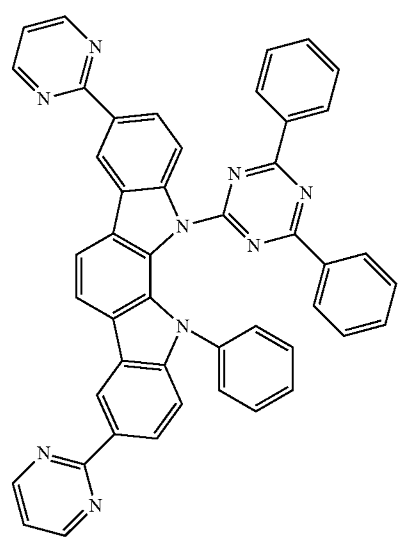

-continued
151
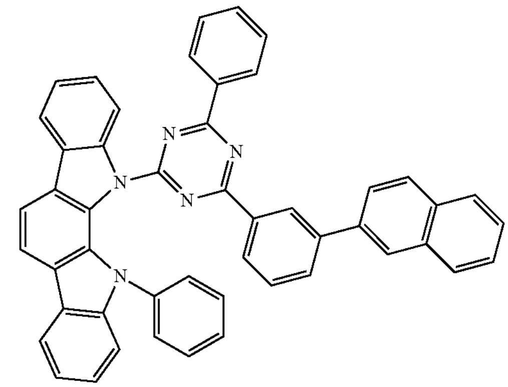
152
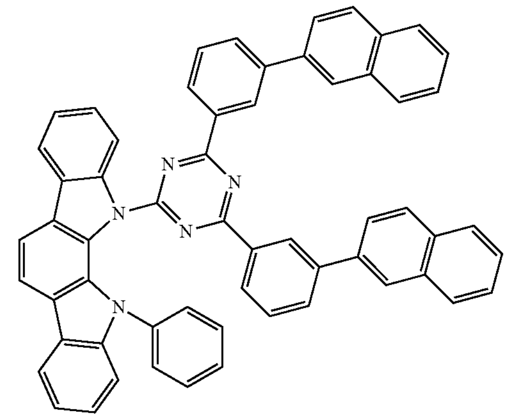
153
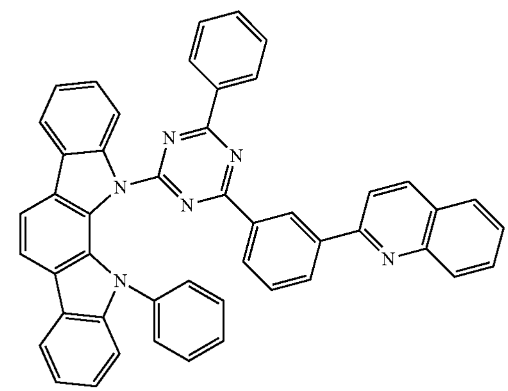
154
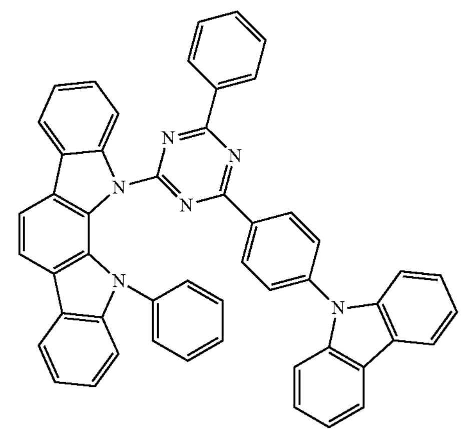
155
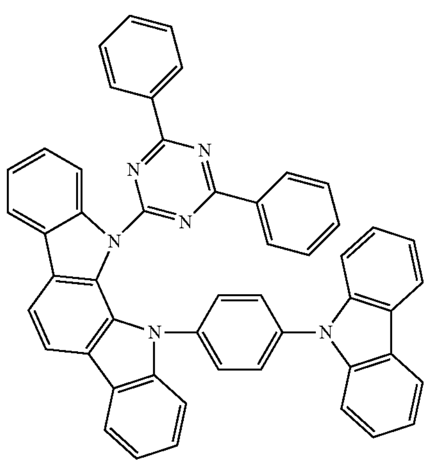
156
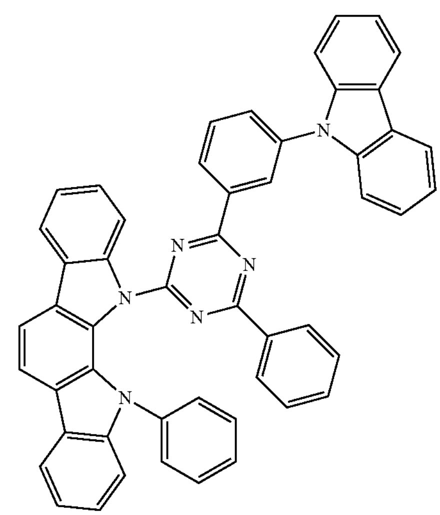

-continued
157
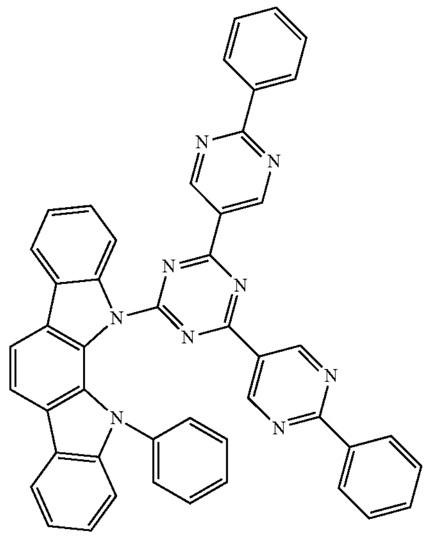
158
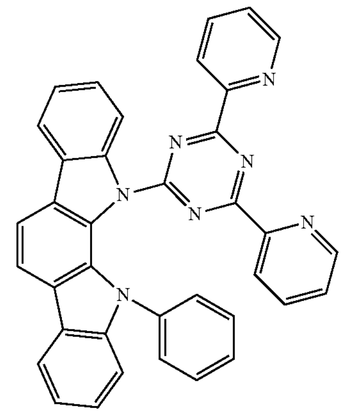
159
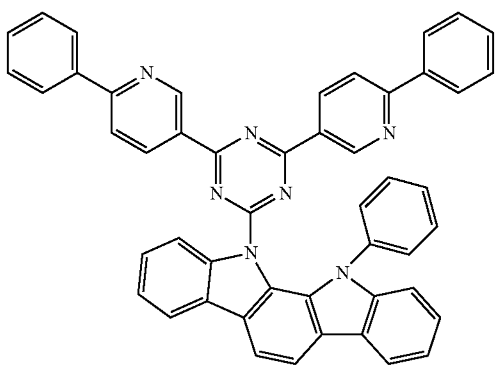
160
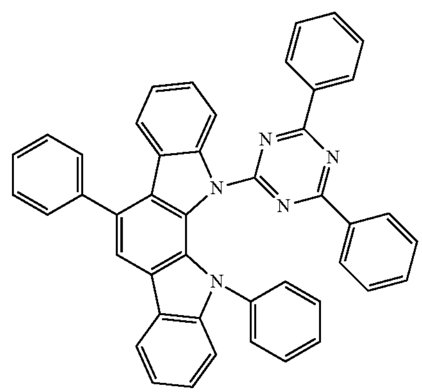
161
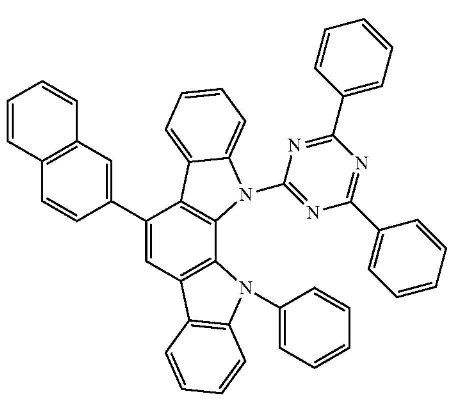
162
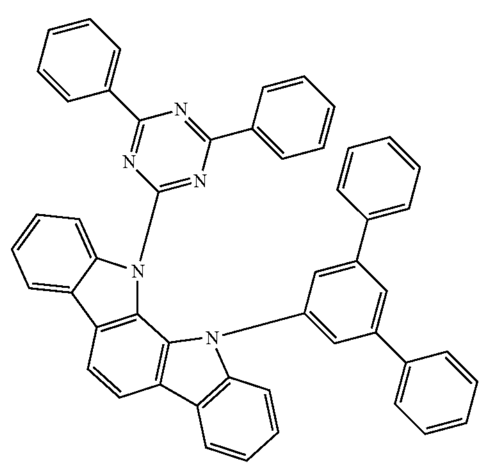

-continued
163
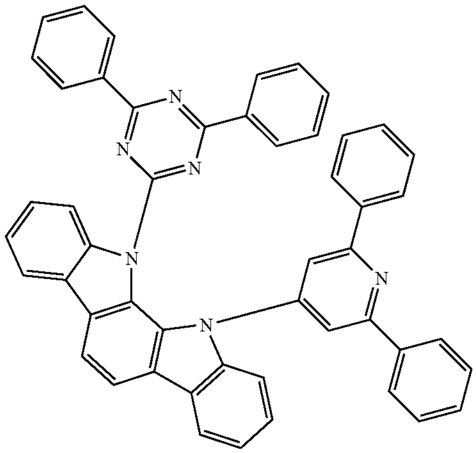
164
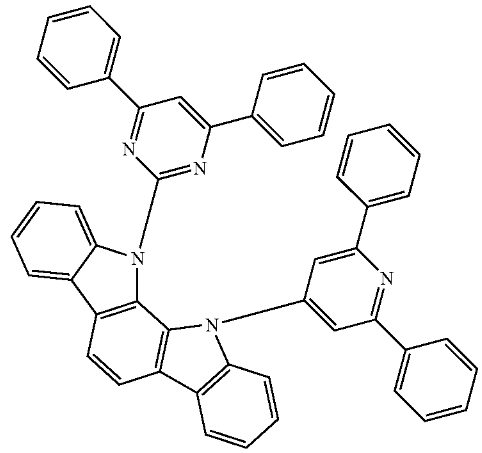
165
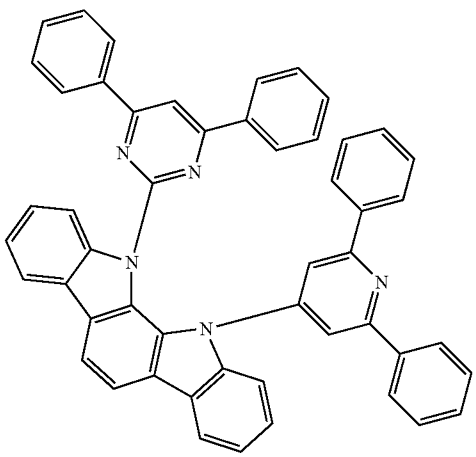
166
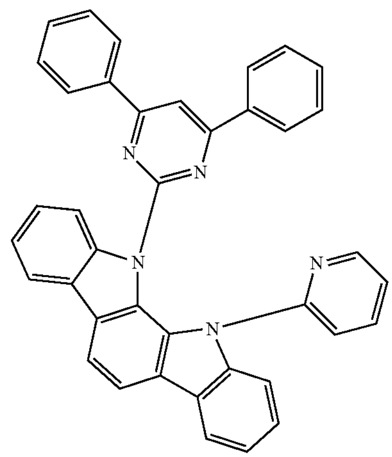
167
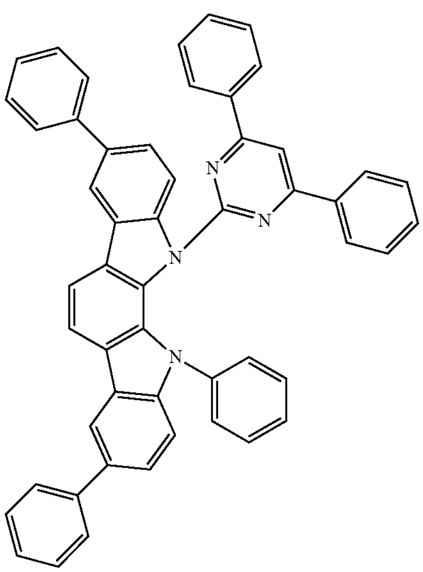
168
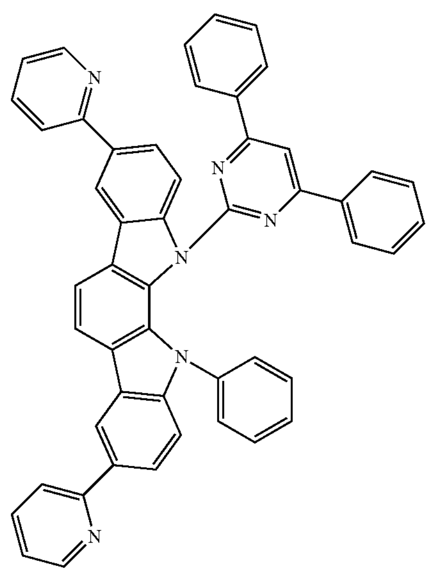

-continued
169
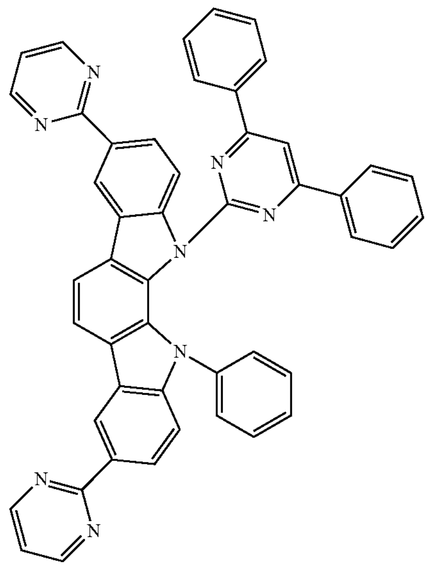
170
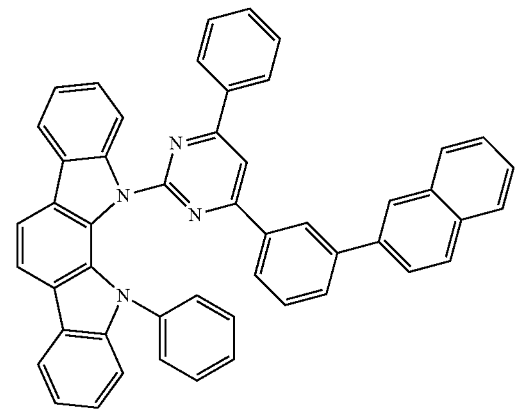
171
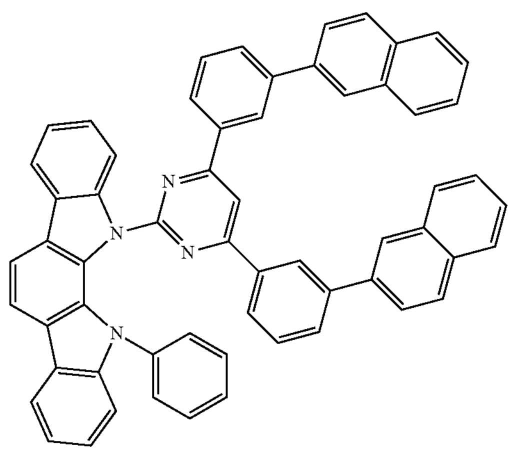
172
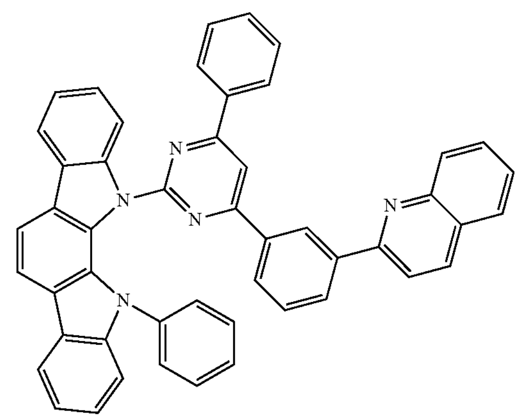
173
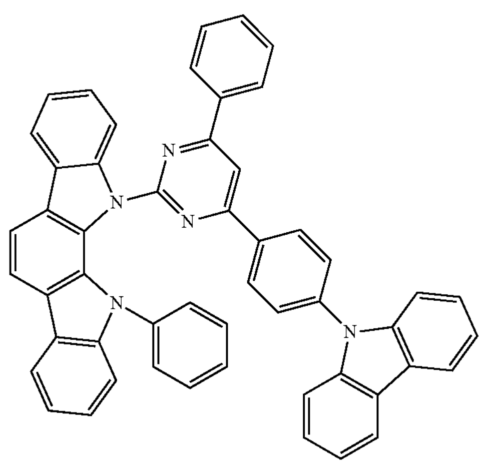
174
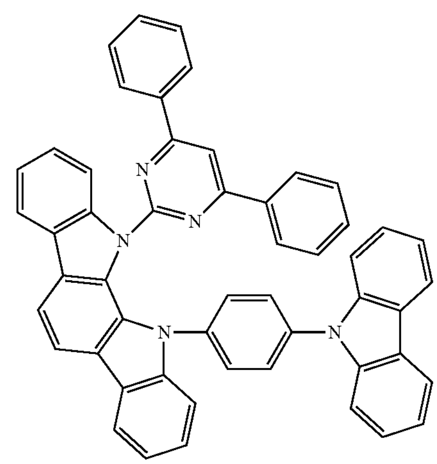

-continued
175
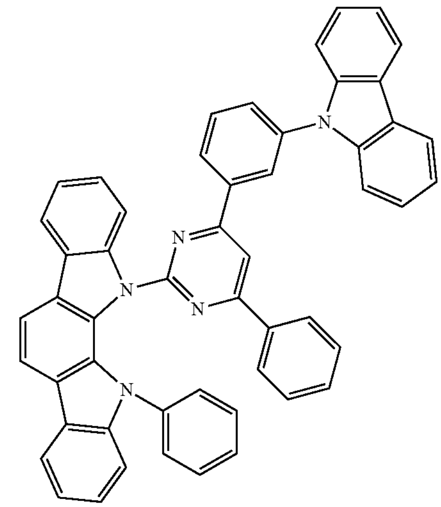
176
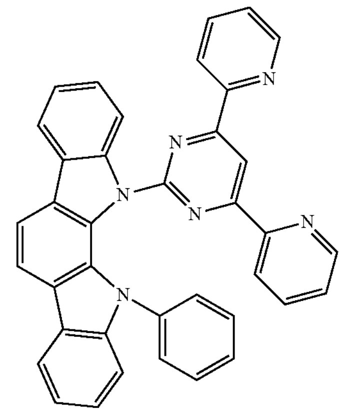
177
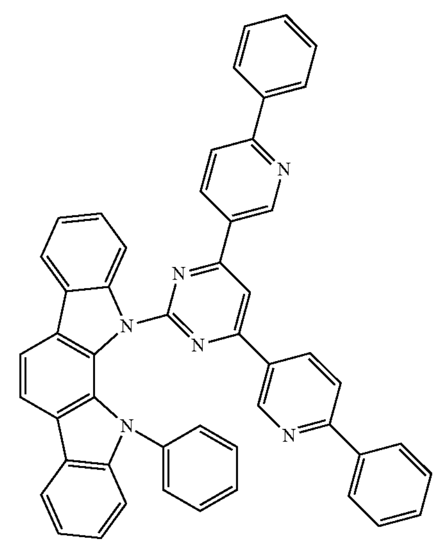
178
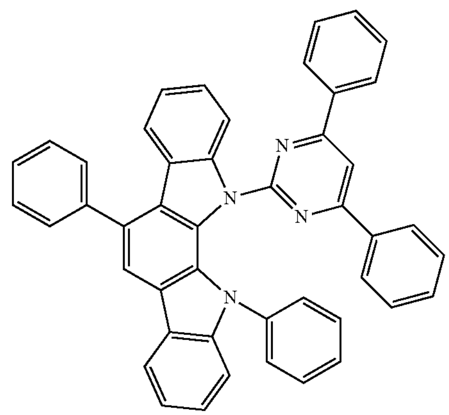
179
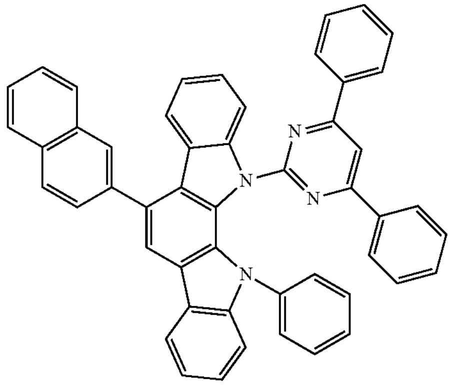
180
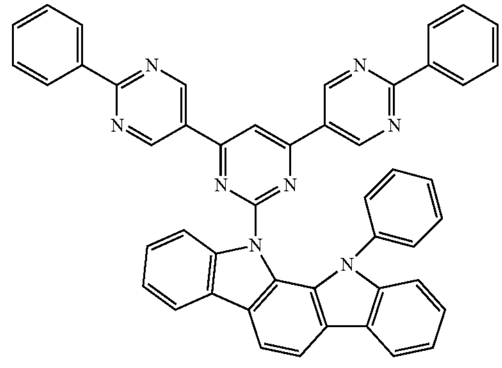

-continued
181
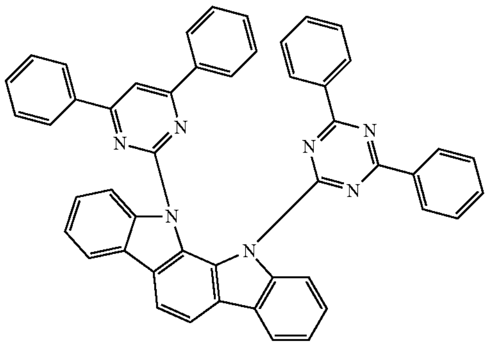
182
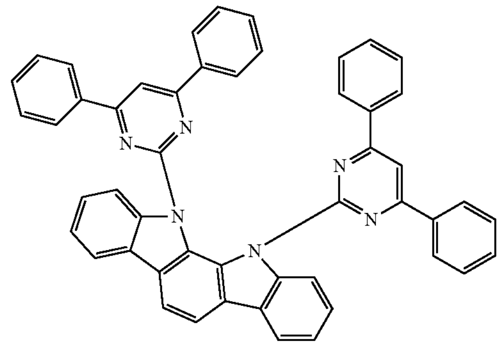
183
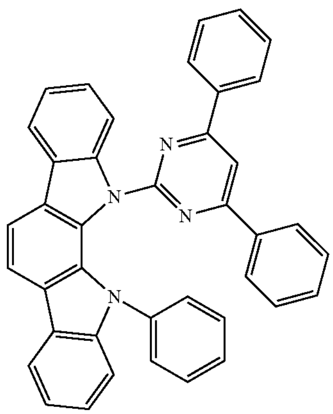
184
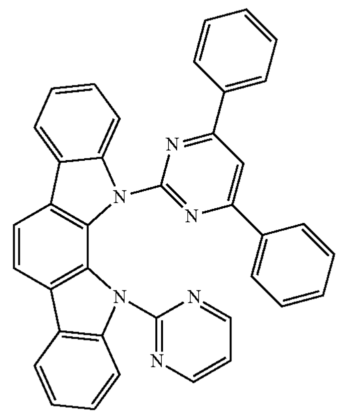
185
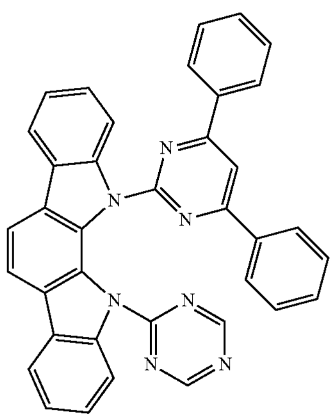
186
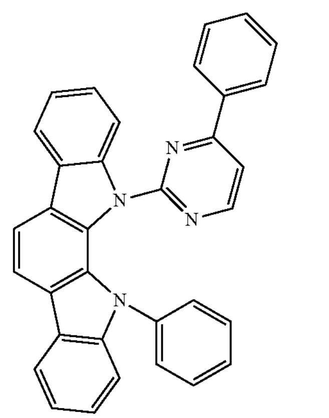
187
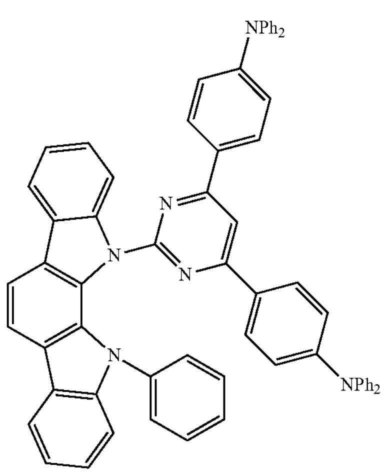
188
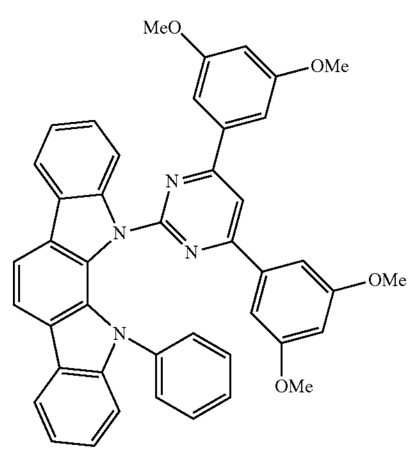

-continued
189
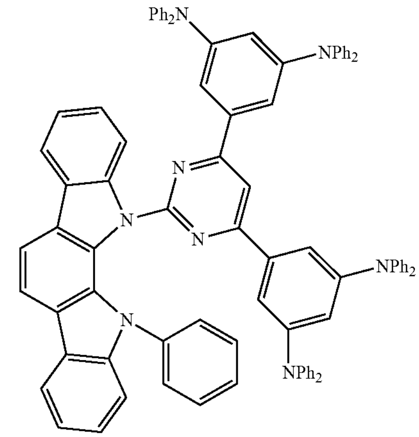
190
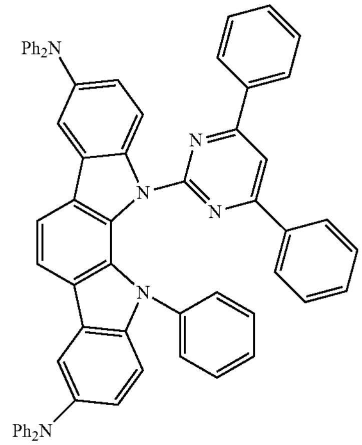
191
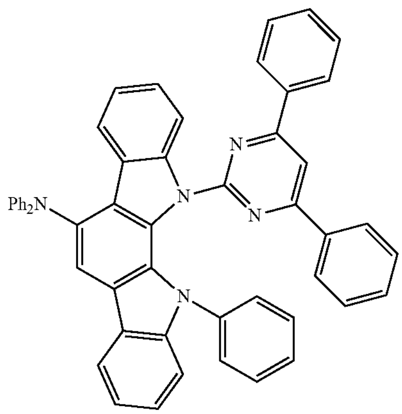
192
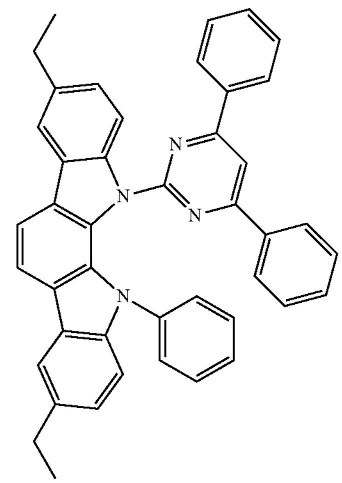
193
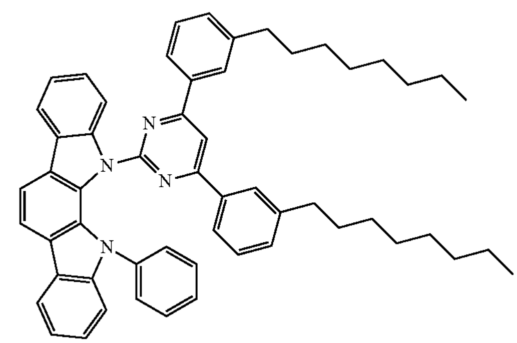
194
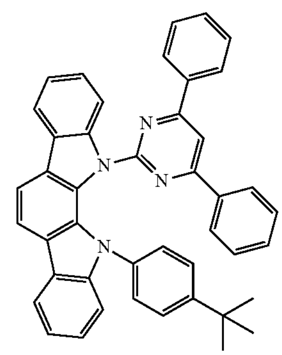
195
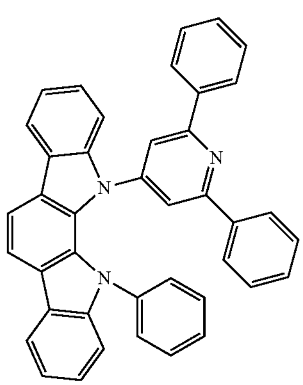
196
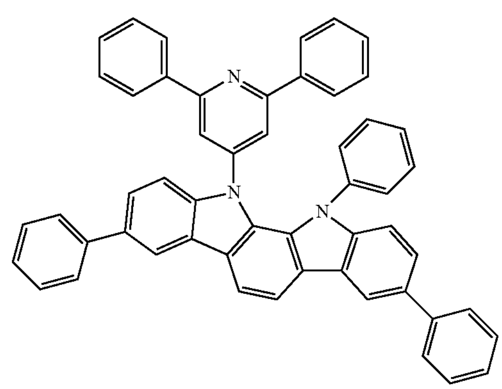

-continued
197
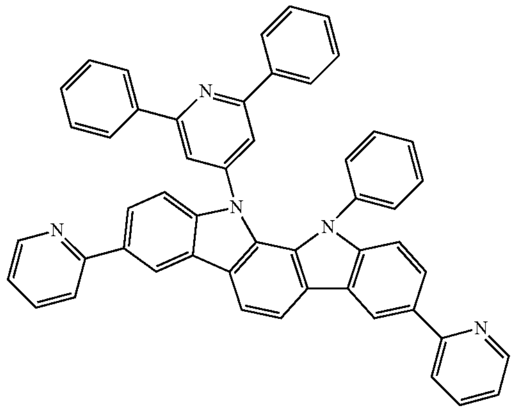
198
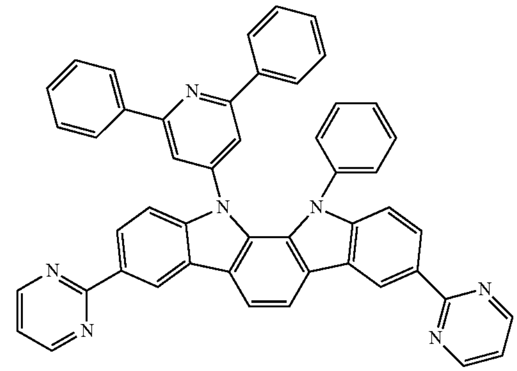
199
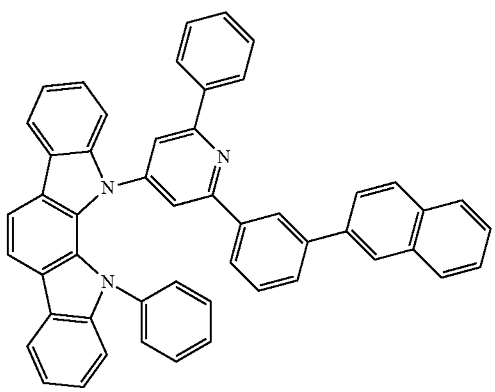
200
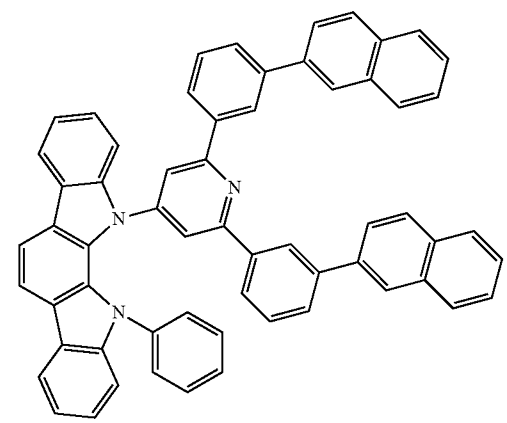
201
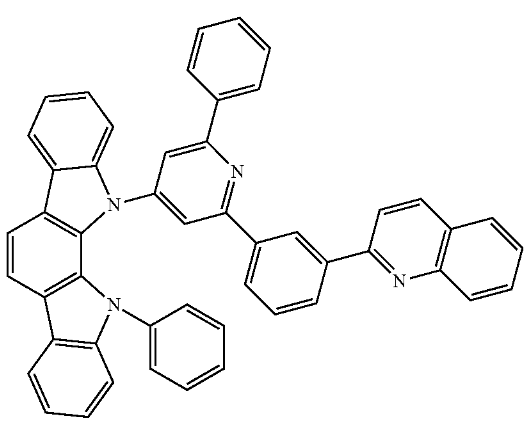
202
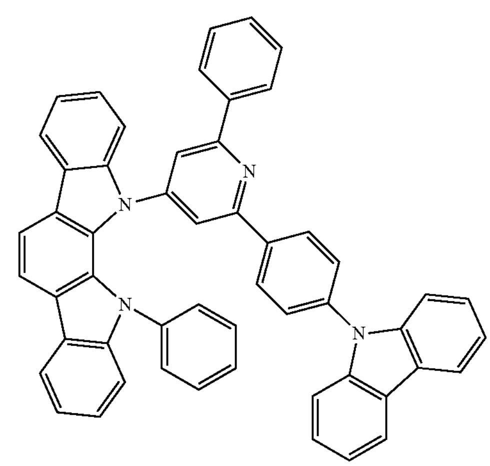

-continued
203
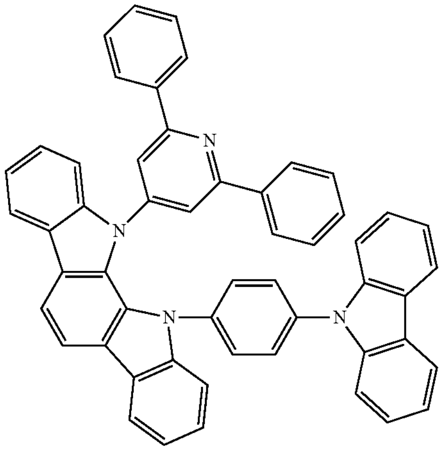
204
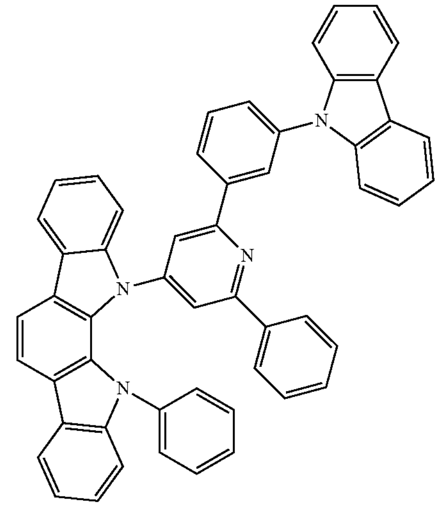
205
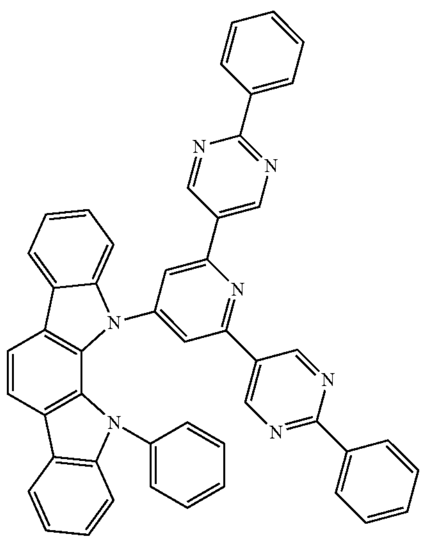
206
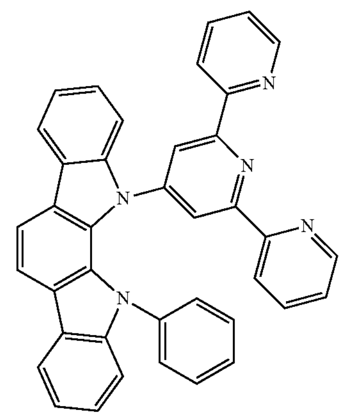
207
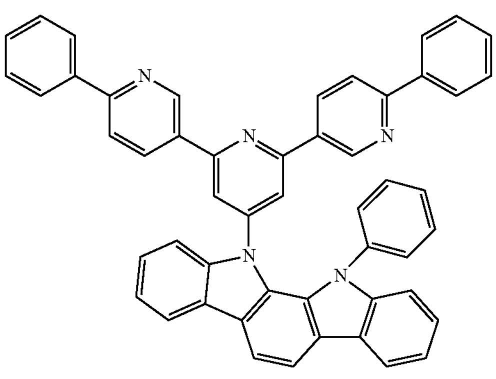
208
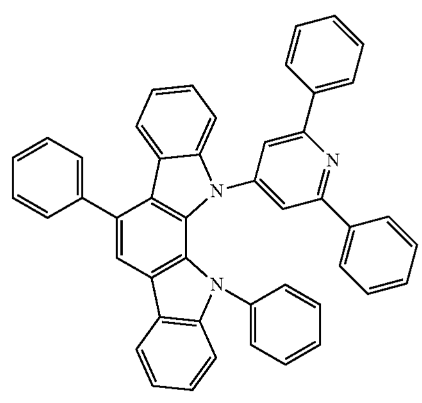

-continued
209
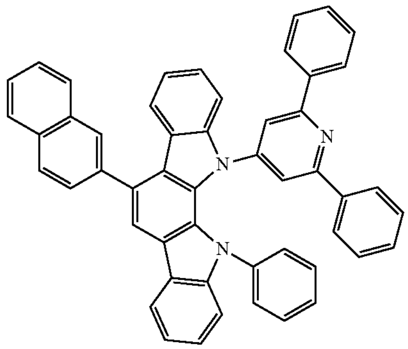
210
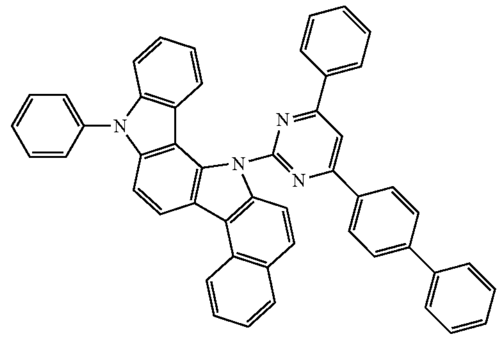
211
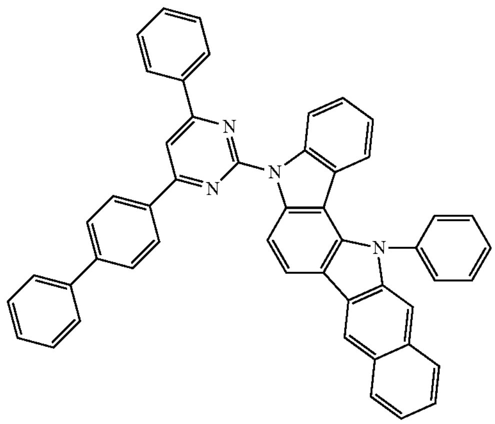
212
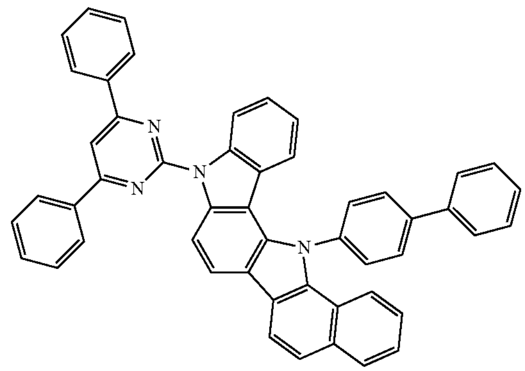
213
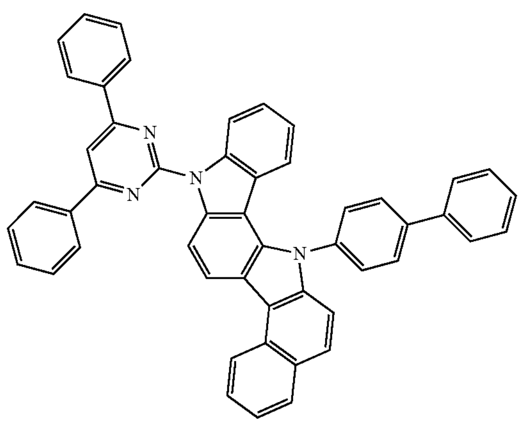
214
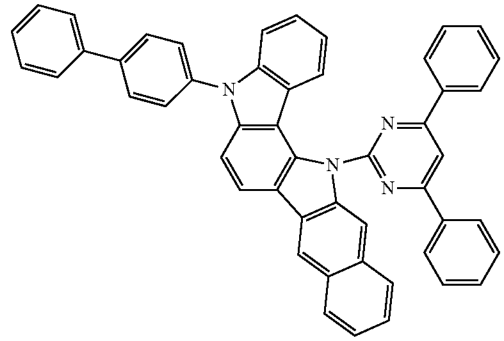
215
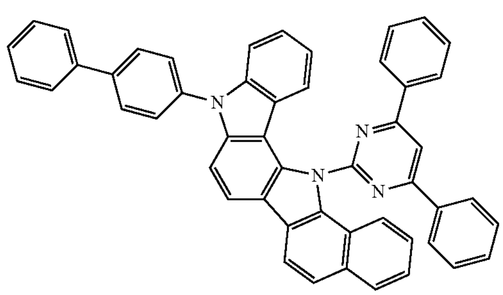
216
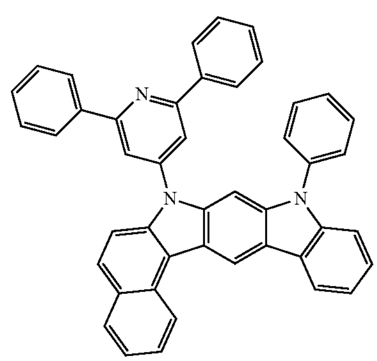

-continued
217
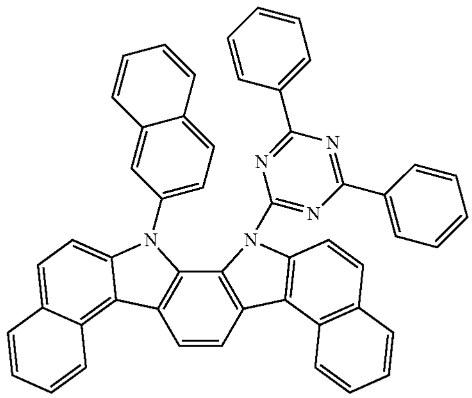
218
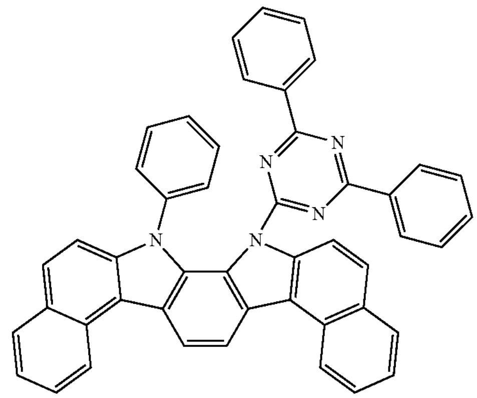
219
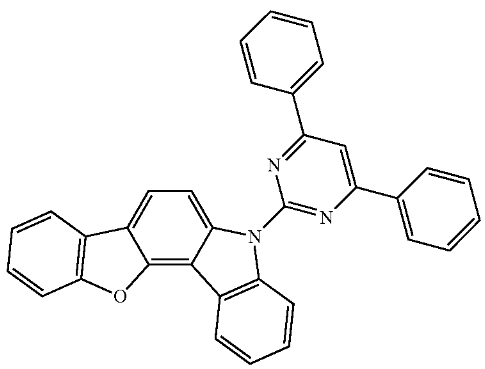
220
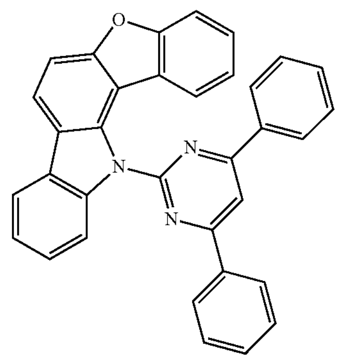
221
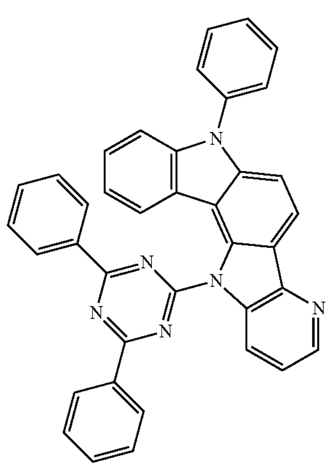
222
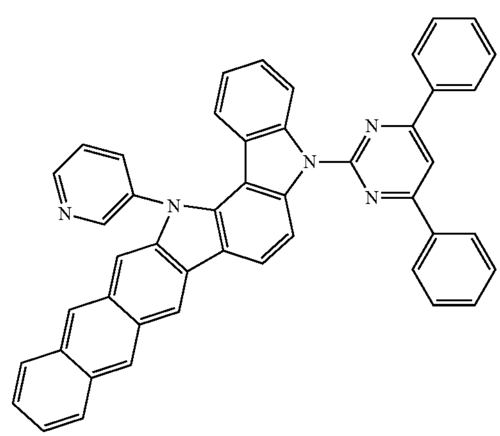

-continued
223
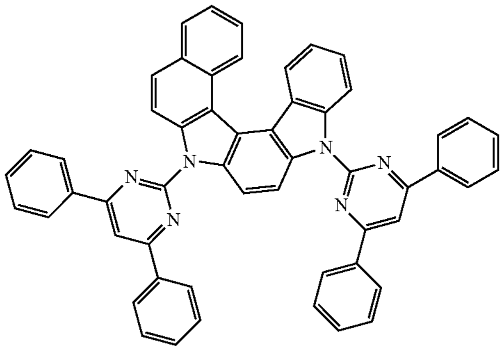
224
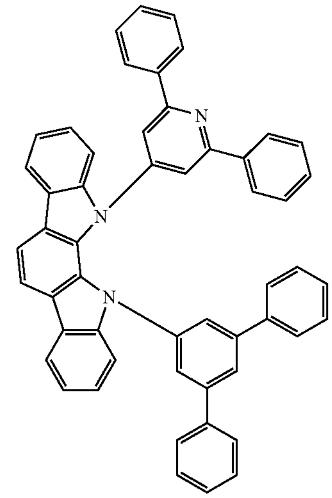
225
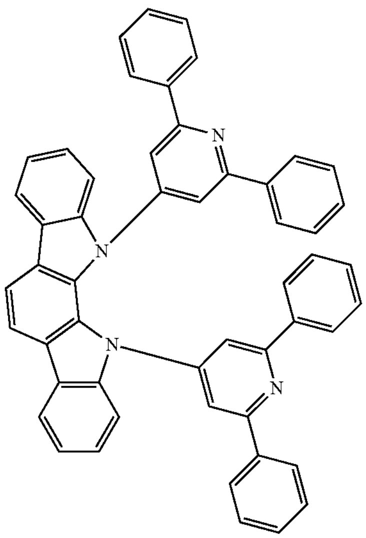
226
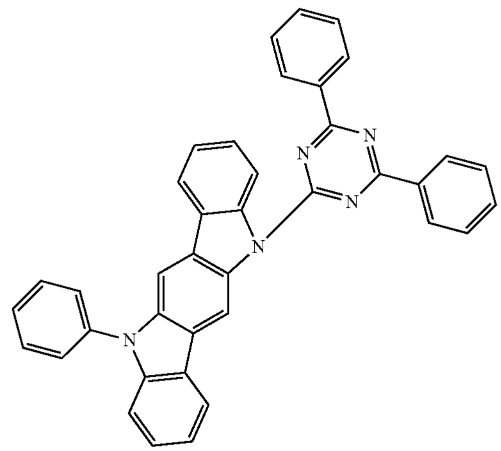
227
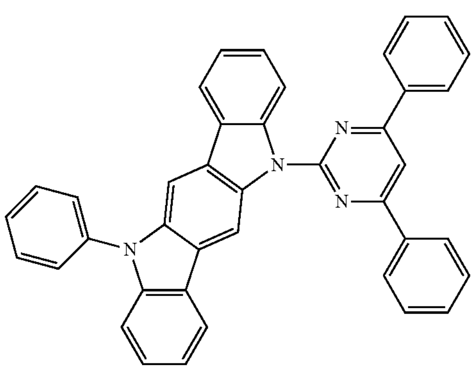
228
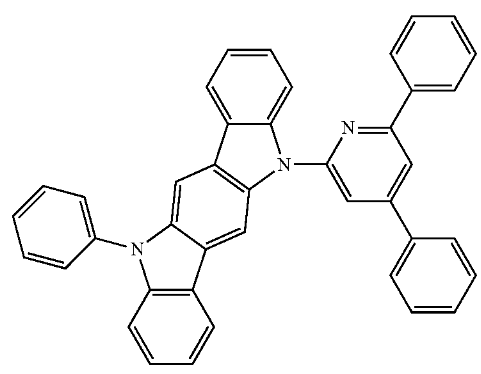

-continued
229
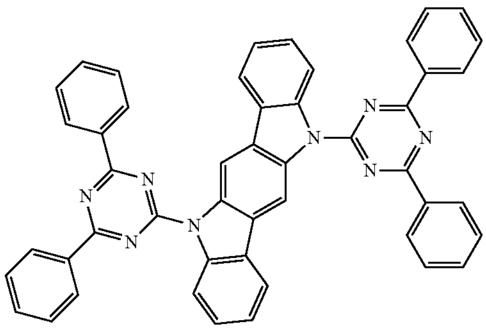
230
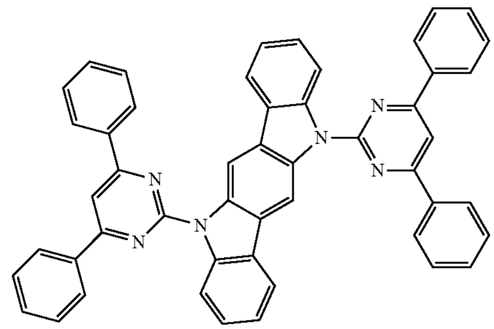
231
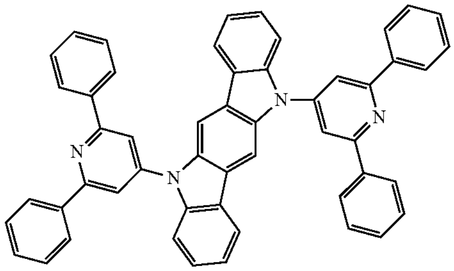
232
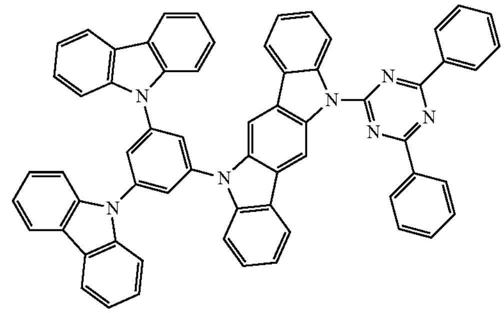
233
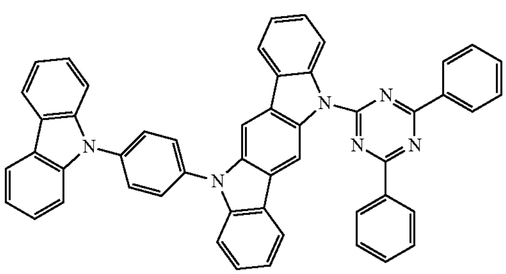
234
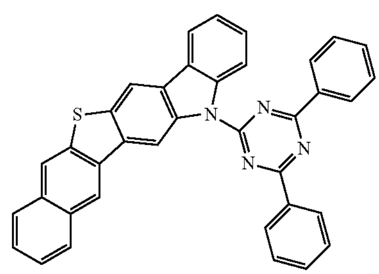
235
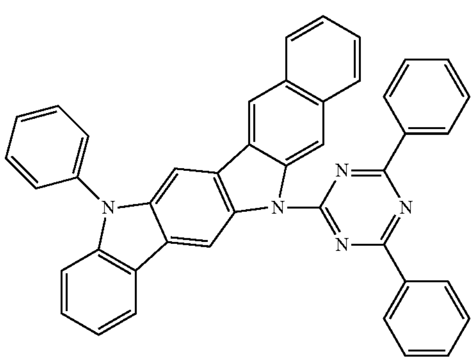
236
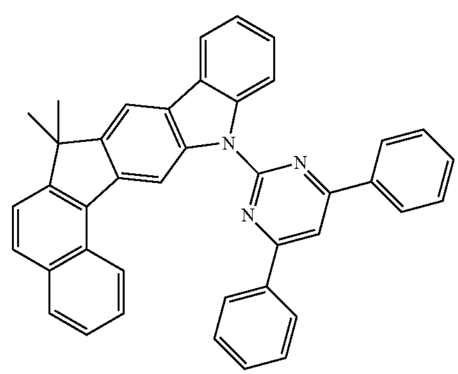

-continued
237
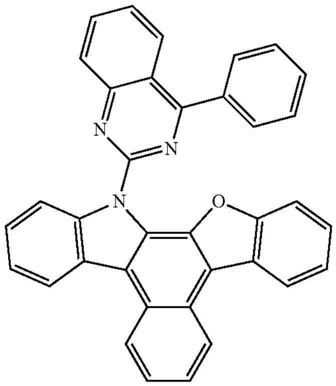
A-1
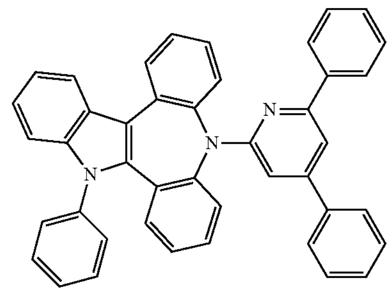
A-2
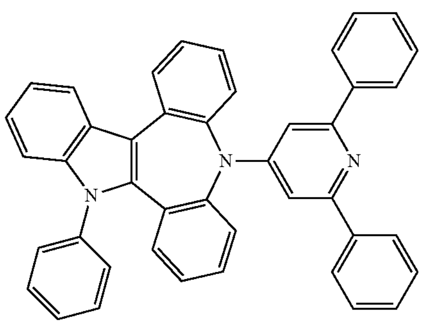
A-3
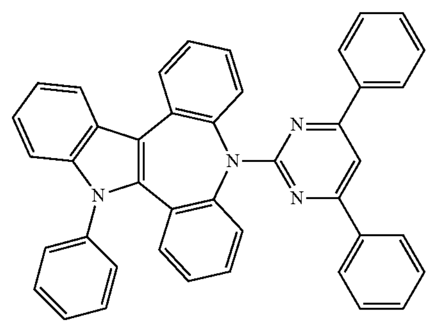
A-4
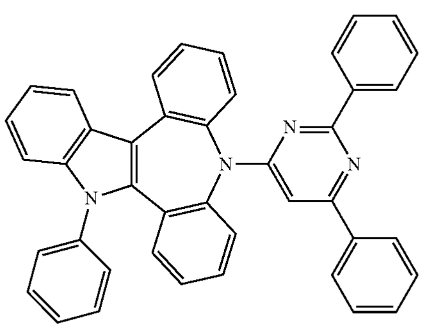
A-5
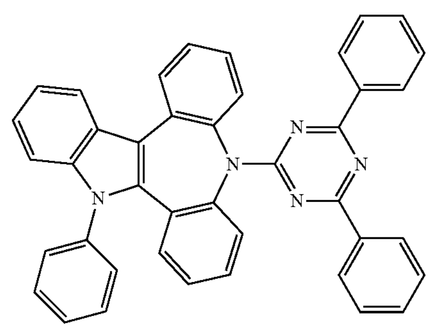
A-6
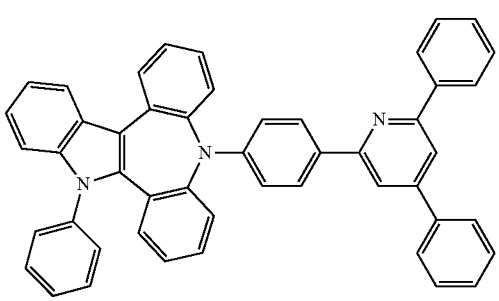
A-7
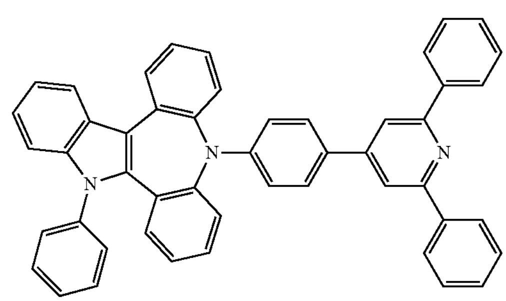

-continued
A-8
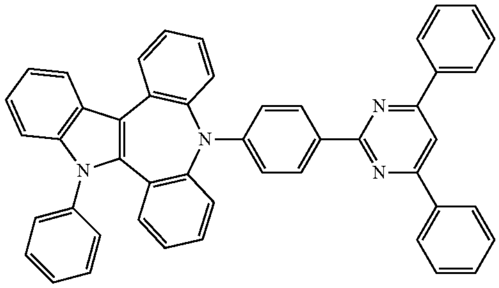
A-9
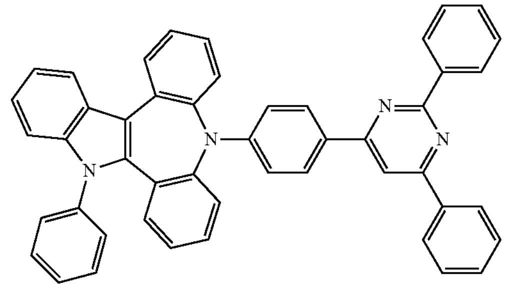
A-10
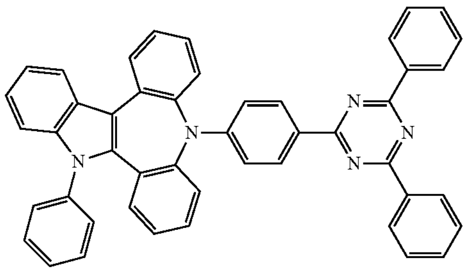
A-11
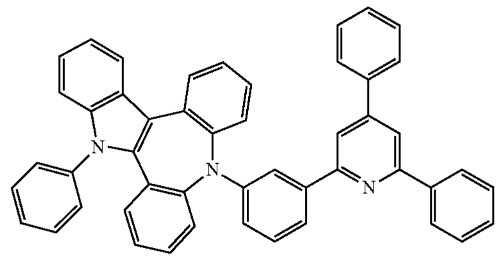
A-12
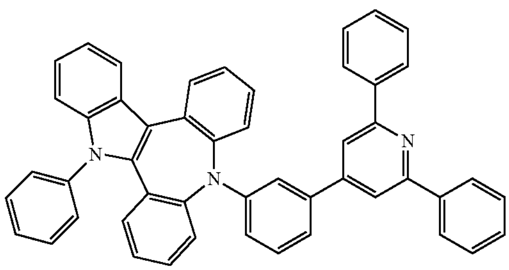
A-13
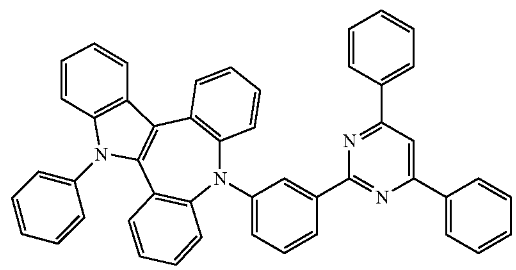
A-14
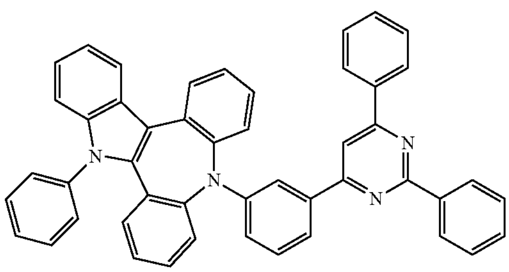
A-15
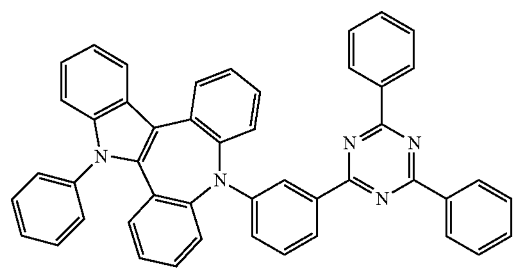
A-16
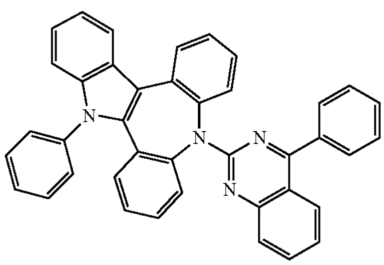
A-17
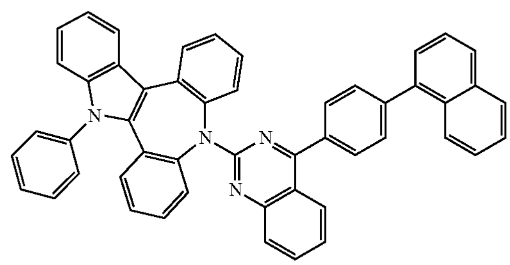
A-18
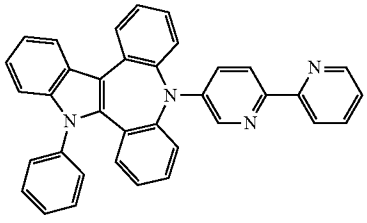
A-19
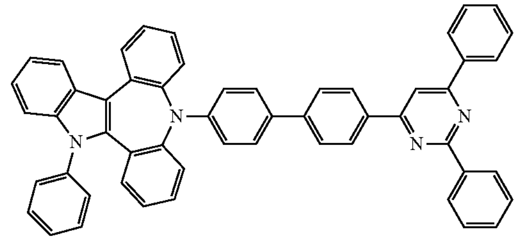

-continued
B-1
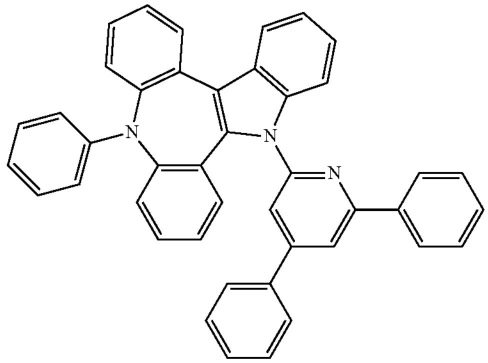
B-2
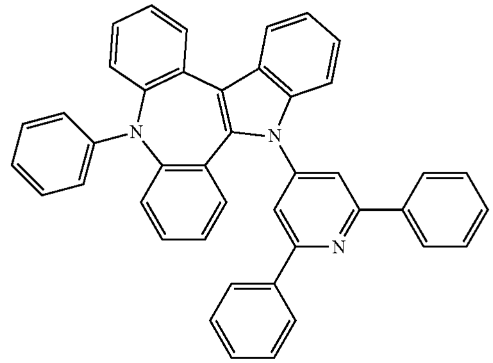
B-3
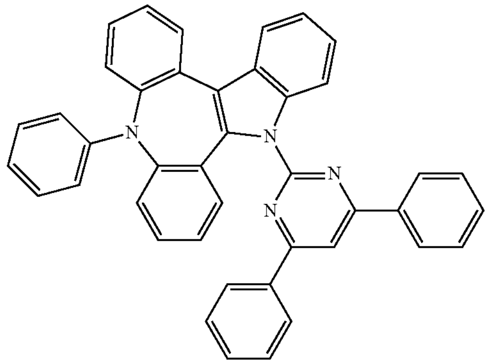
B-4
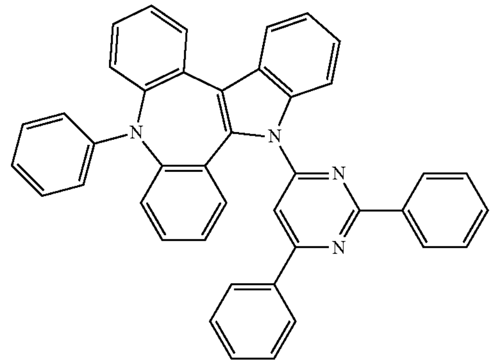
B-5
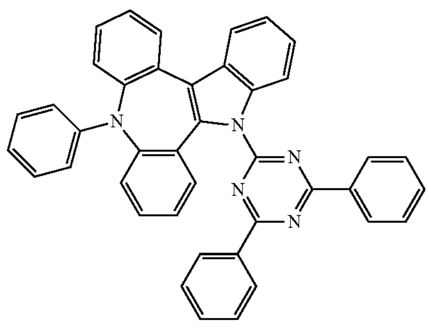
B-6
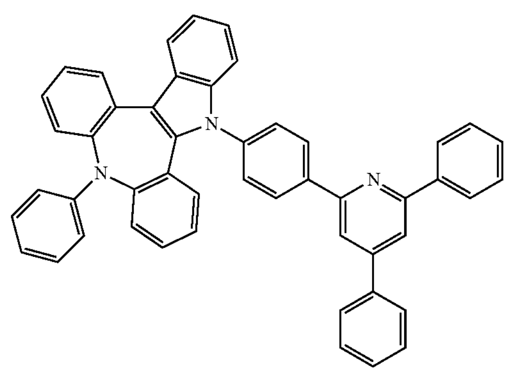
B-7
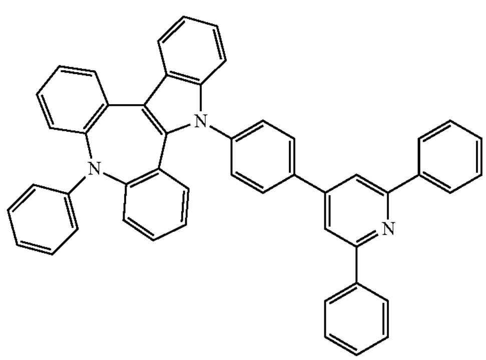
B-8
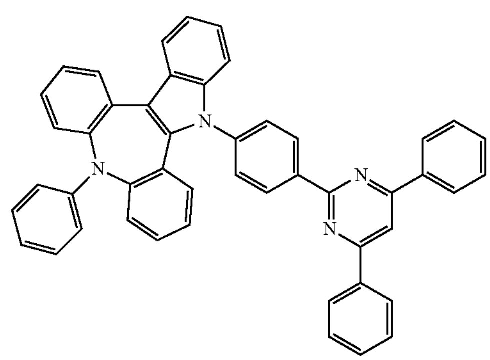

-continued
B-9
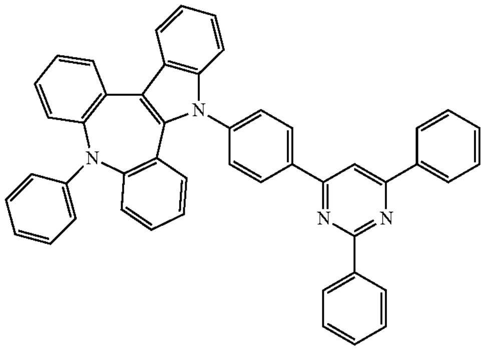
B-10
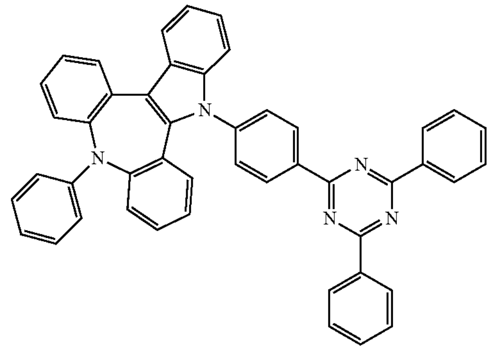
B-11
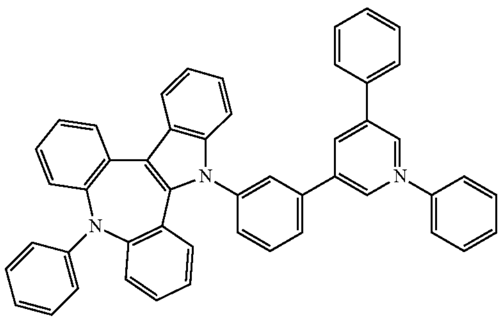
B-12
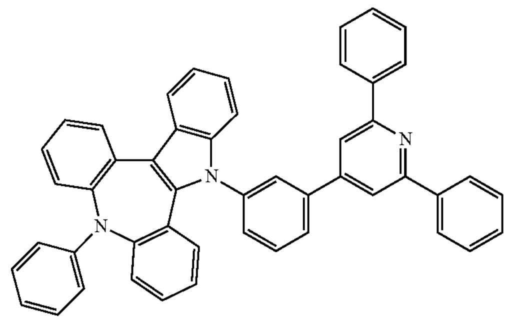
B-13
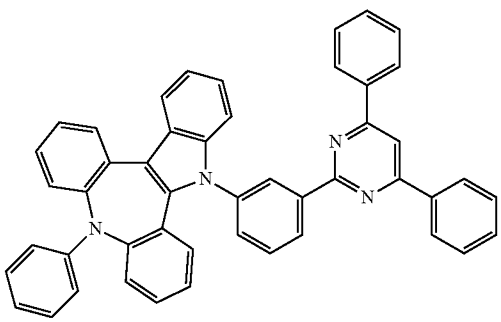
B-14
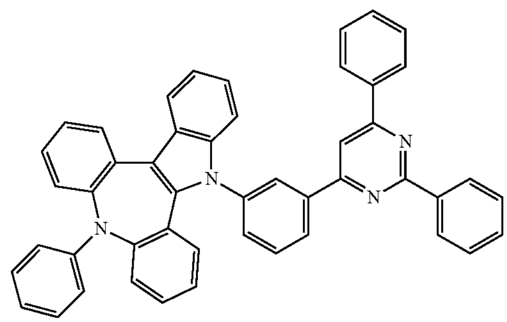
B-15
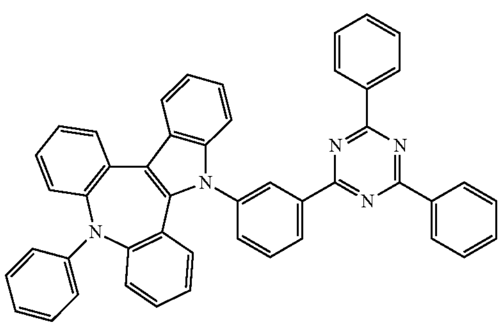
B-16
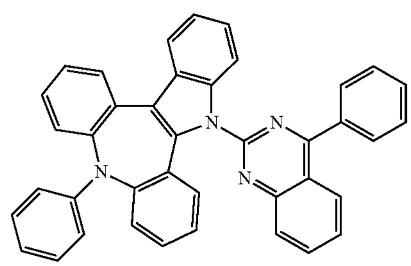
B-17
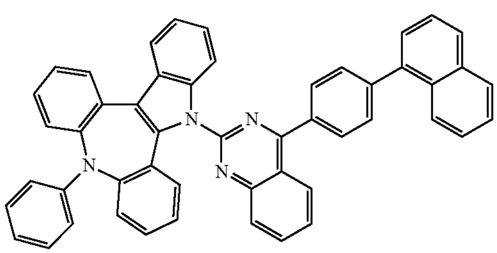
B-18
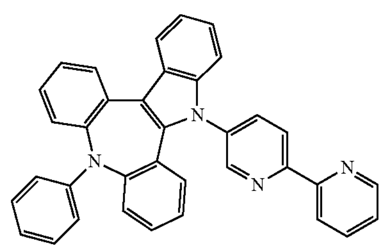

-continued
B-19
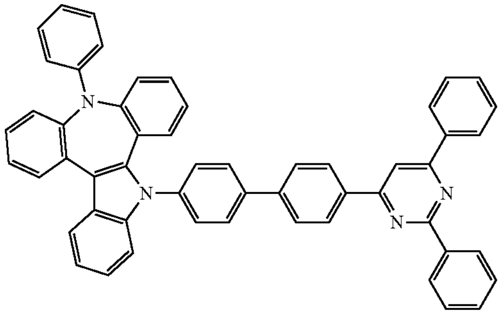
C-1
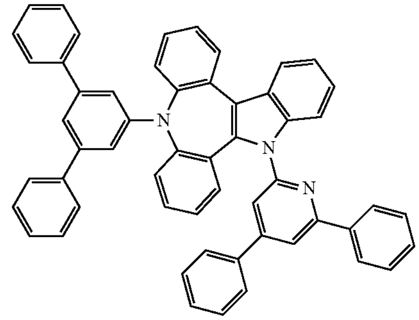
C-2
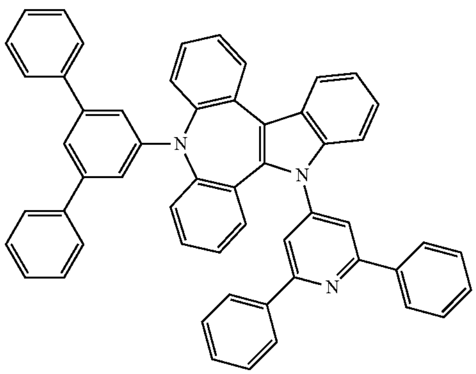
C-3
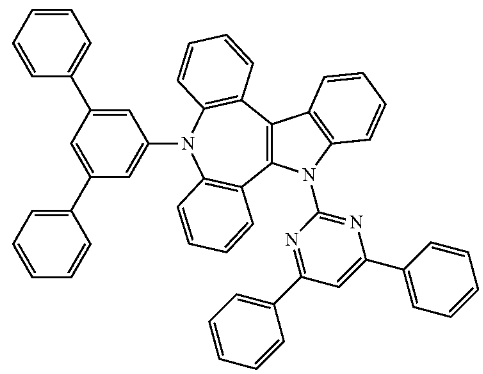
C-4
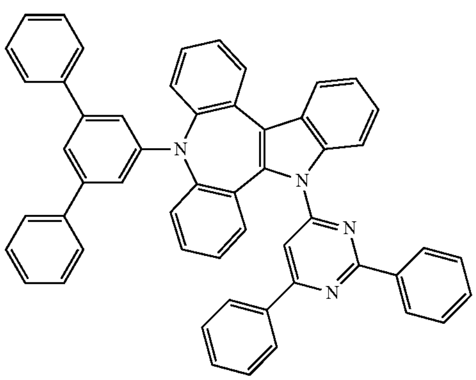
C-5
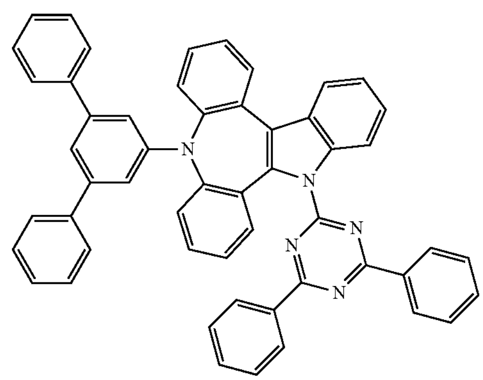
C-6
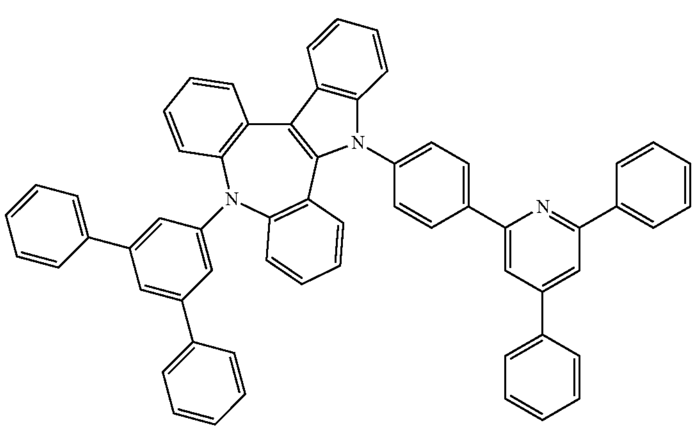

-continued
C-7
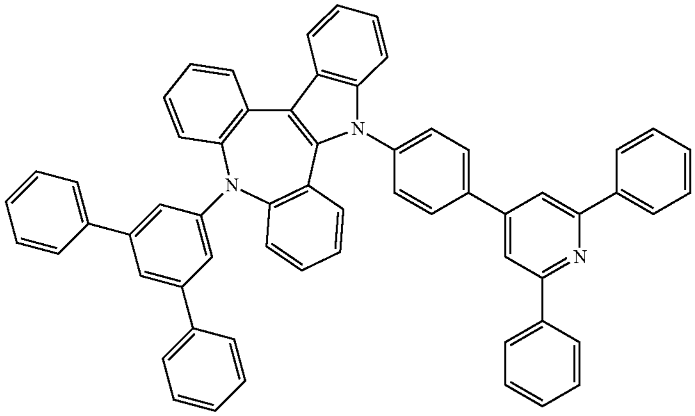
C-8
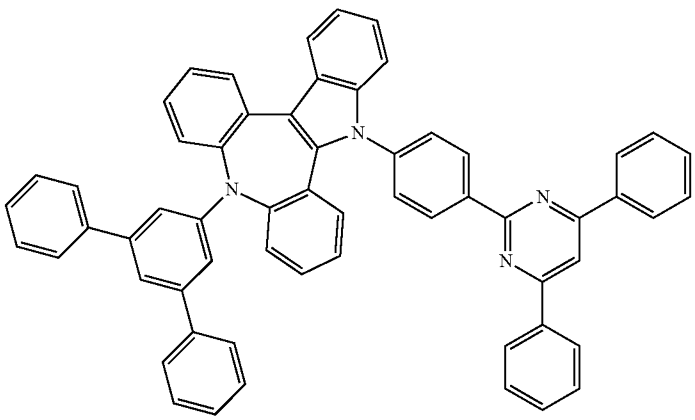
C-9
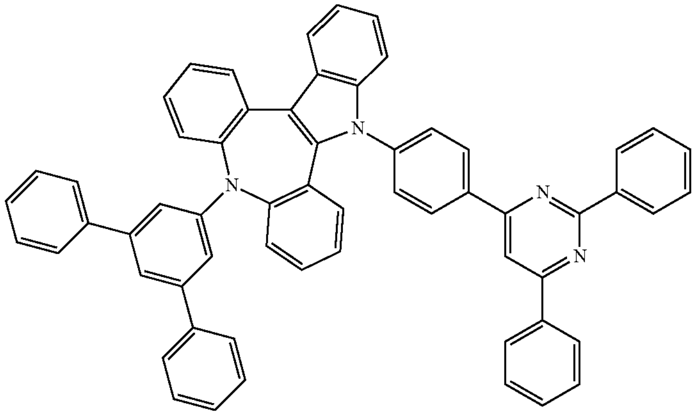

-continued
C-10
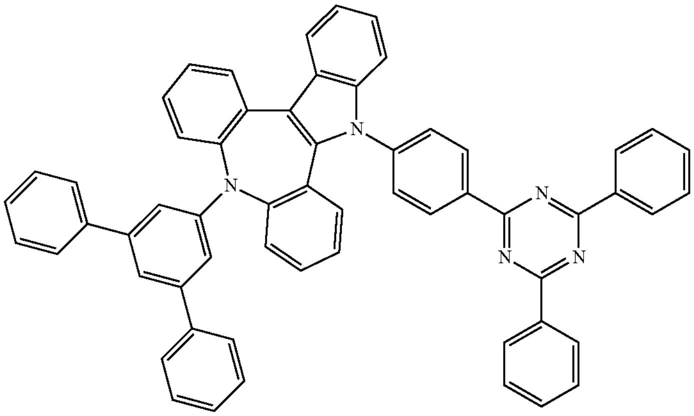
C-11
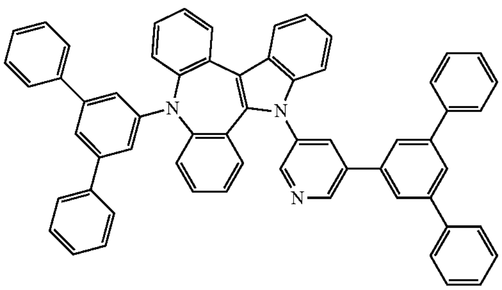
C-12
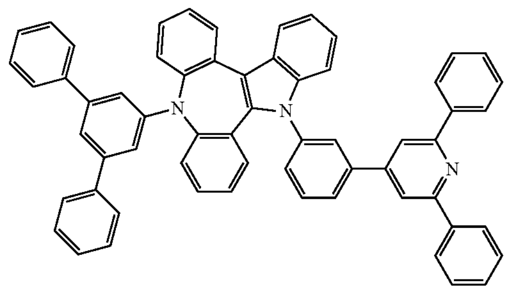
C-13
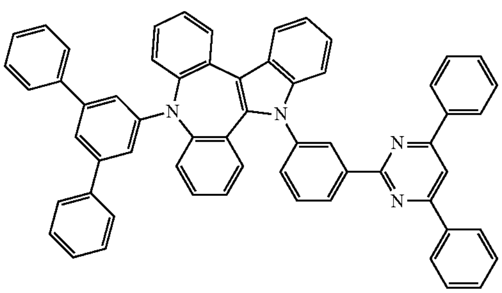
C-14
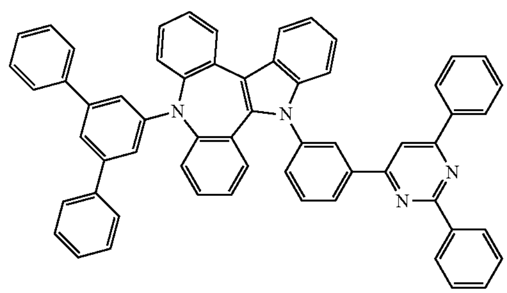
C-15
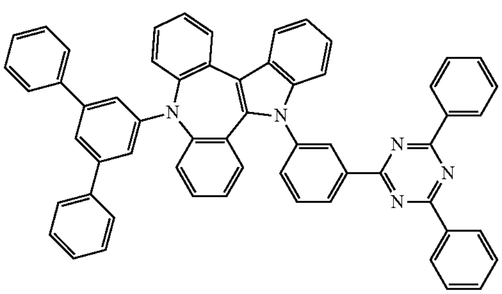
C-16
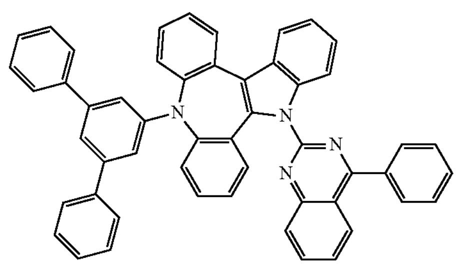
C-17
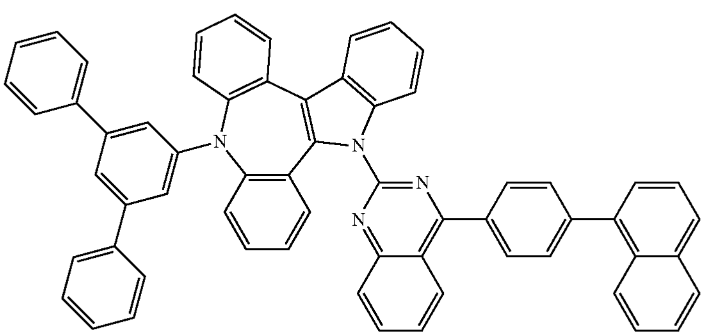

-continued
C-18
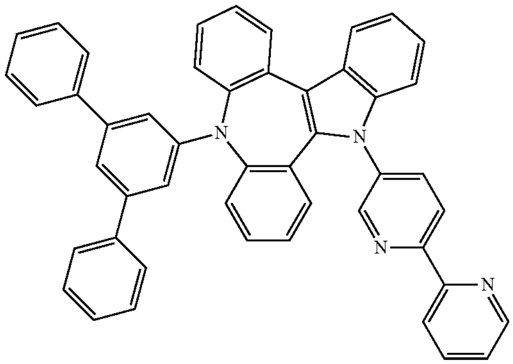
C-19
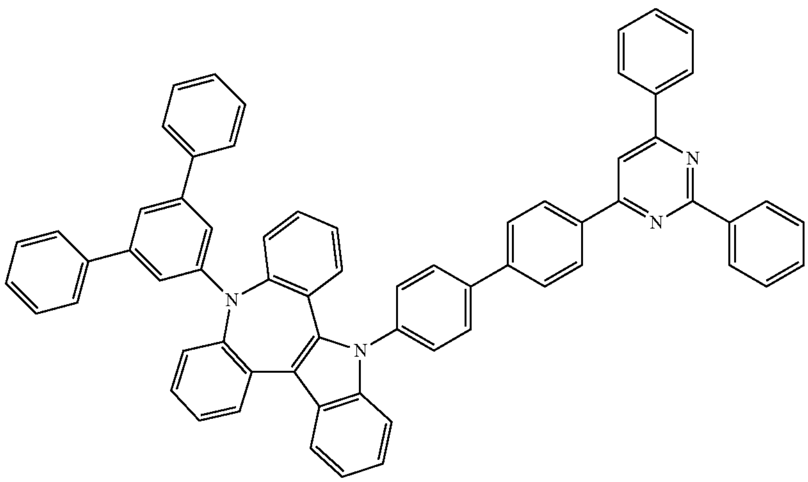
D-1
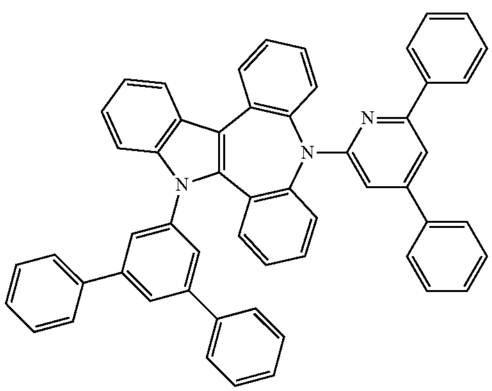
D-2
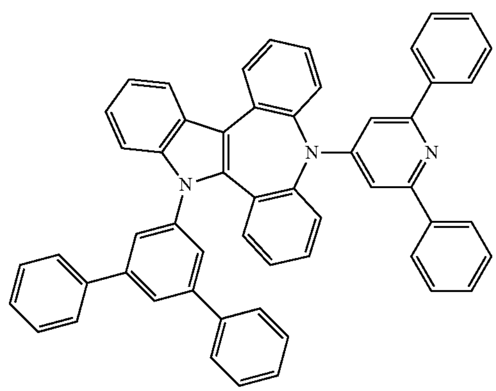
D-3
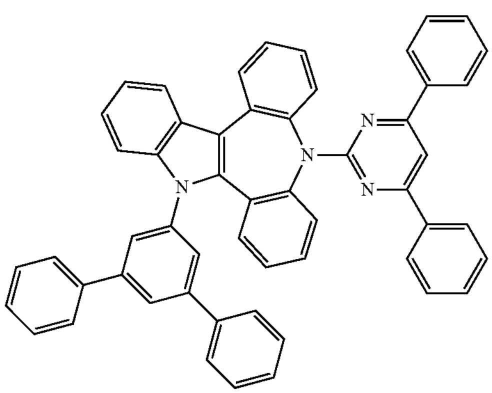
D-4
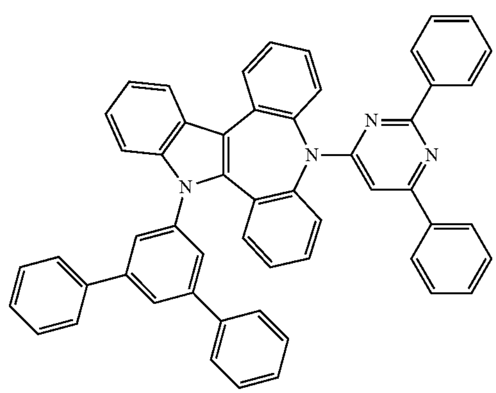

-continued
D-5
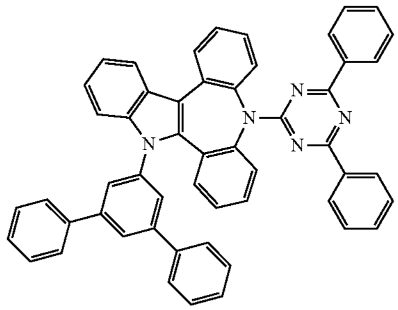
D-6
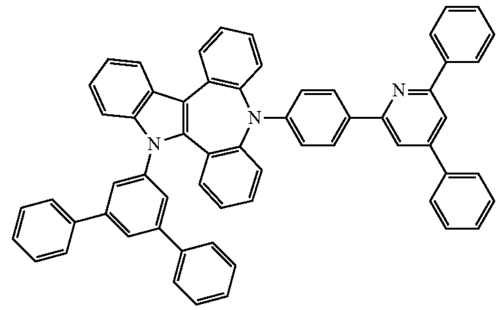
D-7
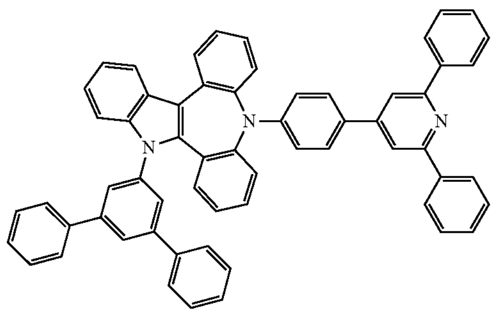
D-8
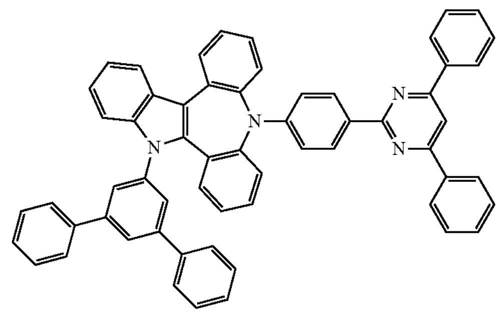
D-9
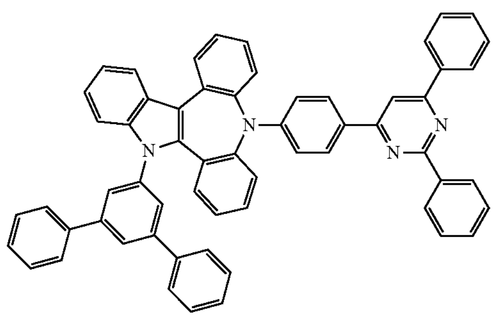
D-10
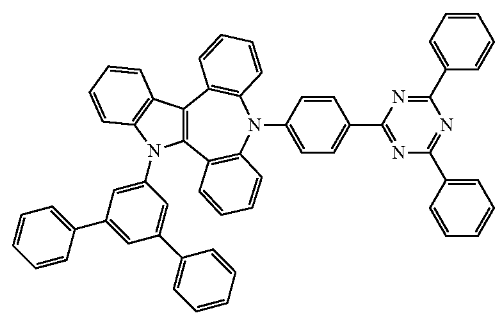
D-11
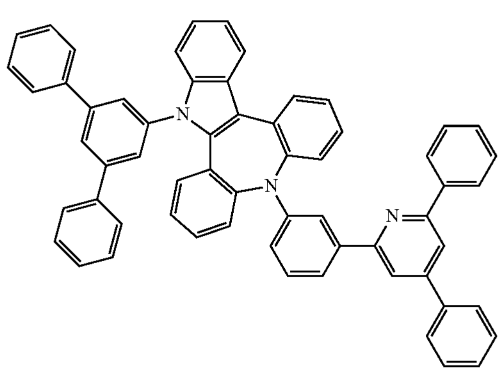
D-12
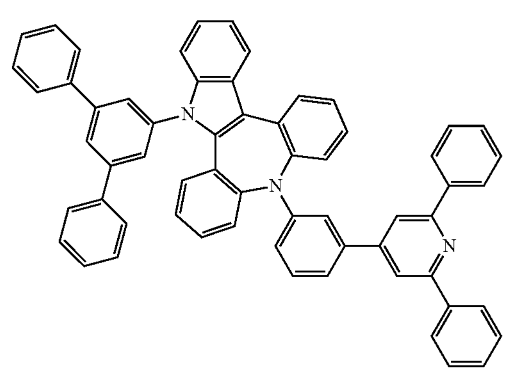

-continued
D-13
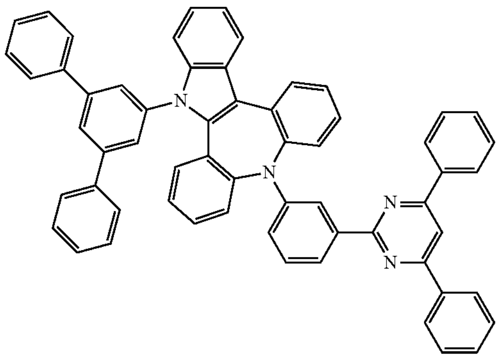
D-14
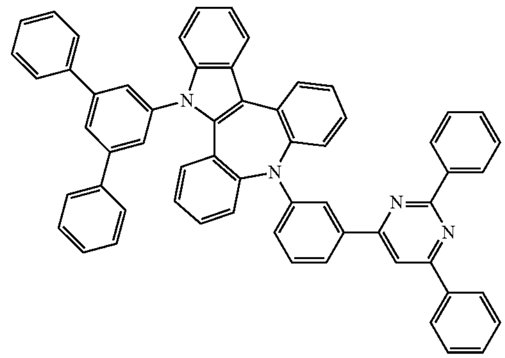
D-15
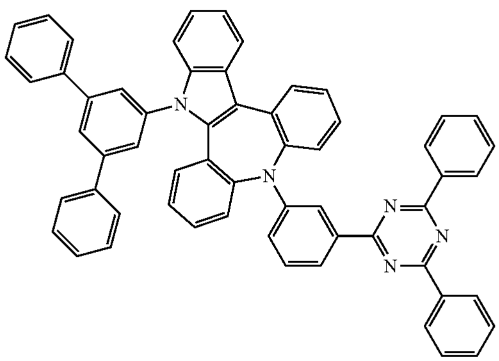
D-16
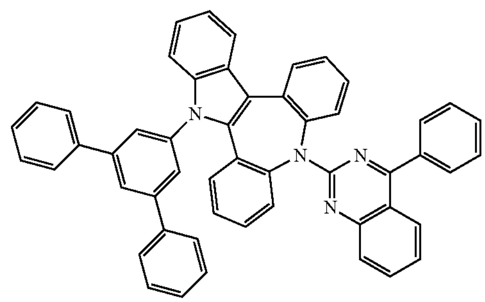
D-17
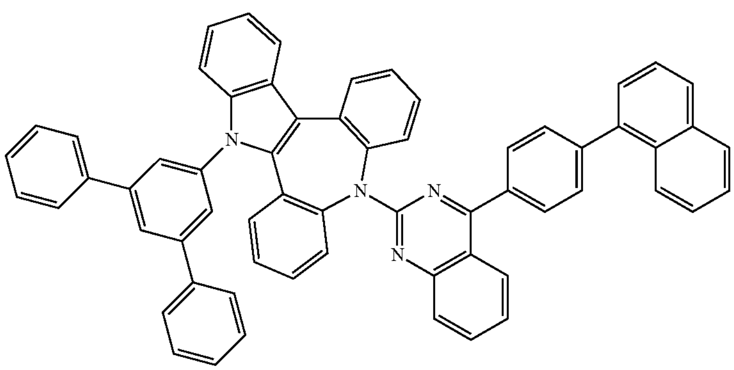
D-18
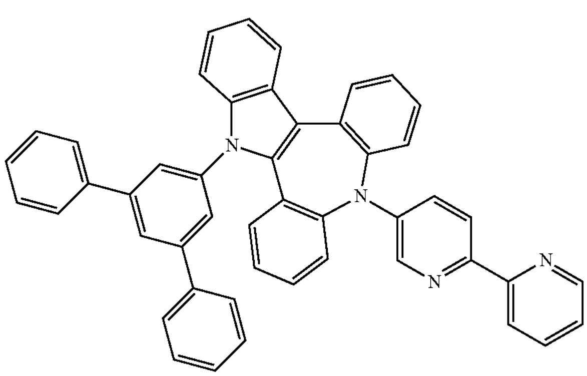

-continued
D-19
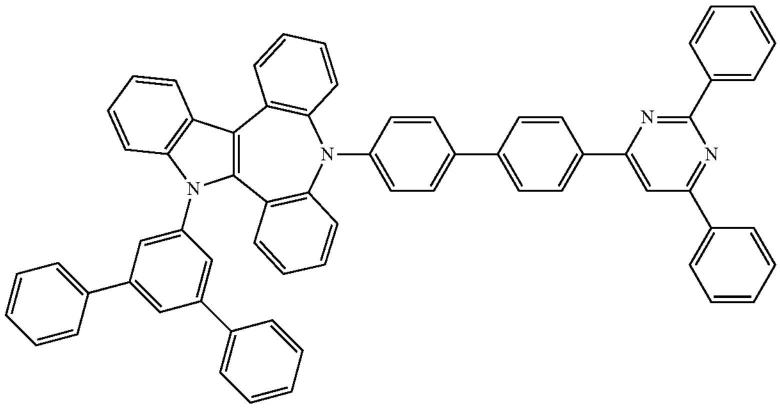
E-1
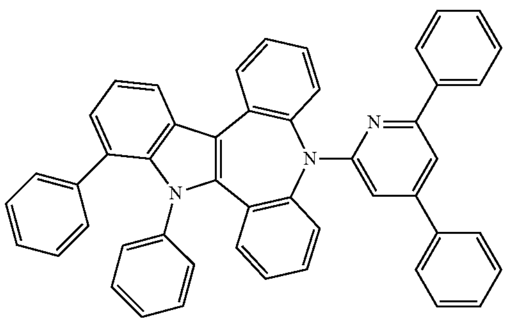
E-2
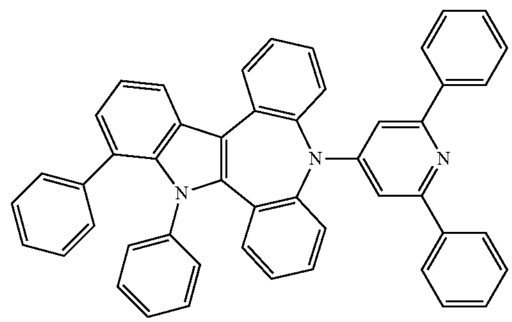
E-3
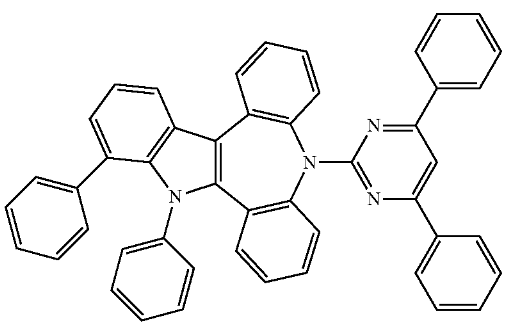
E-4
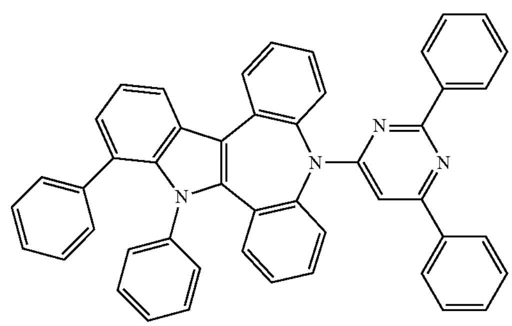
E-5
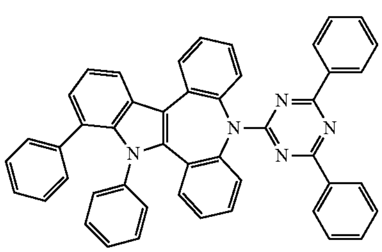
E-6
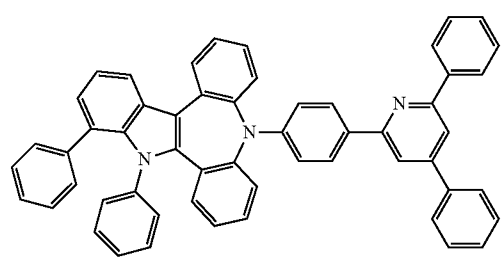
E-7
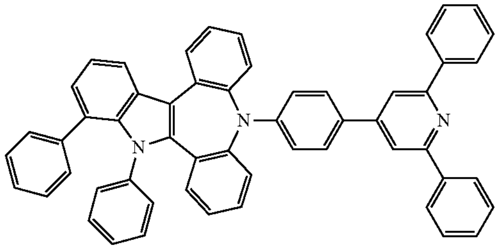
E-8
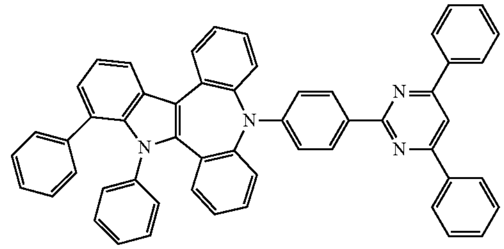

-continued
E-9
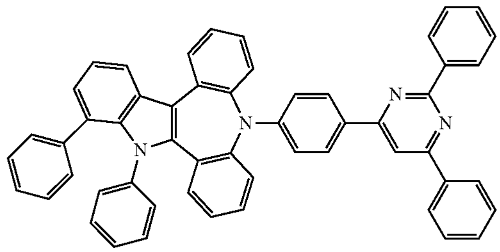
E-10
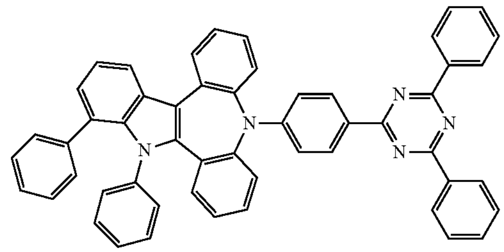
E-11
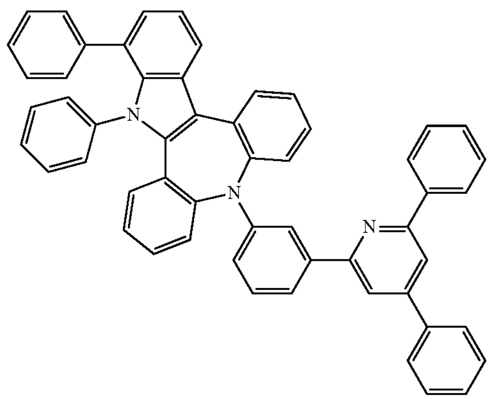
E-12
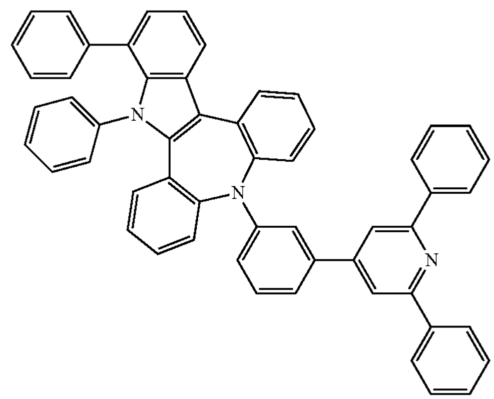
E-13
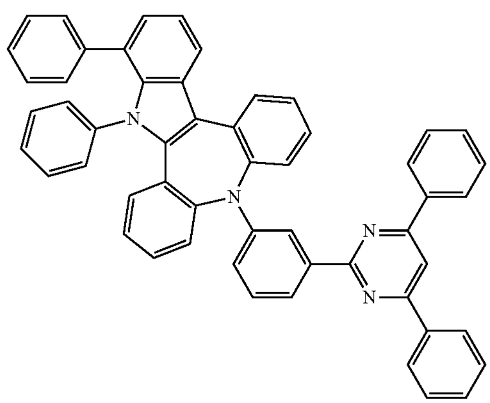
E-14
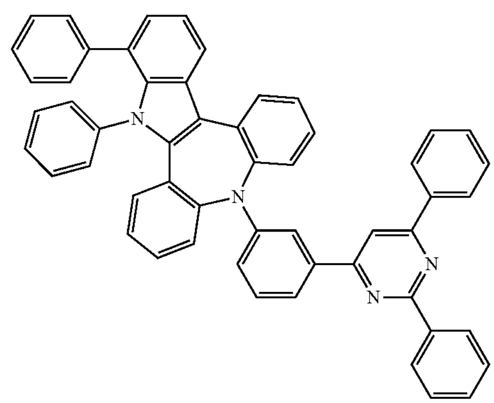
E-15
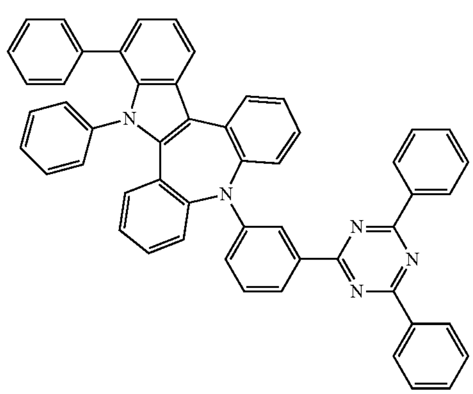
E-16
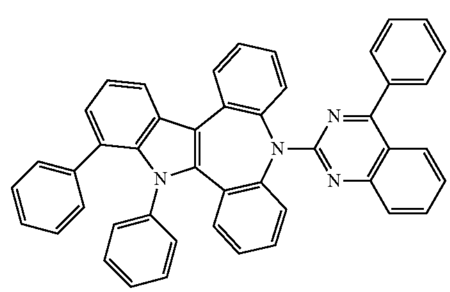

-continued
E-17
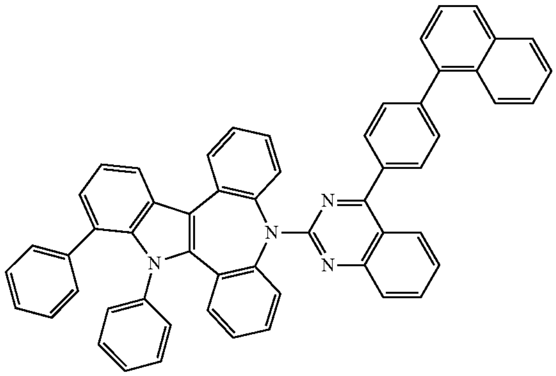
E-18
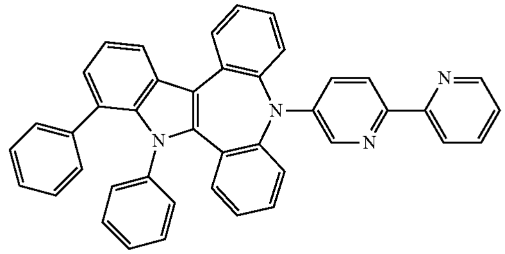
E-19
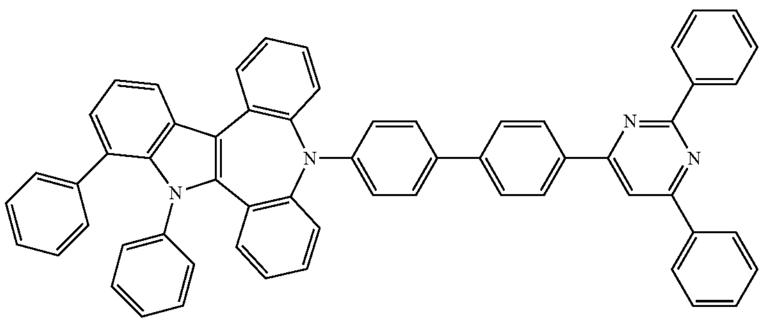
F-1
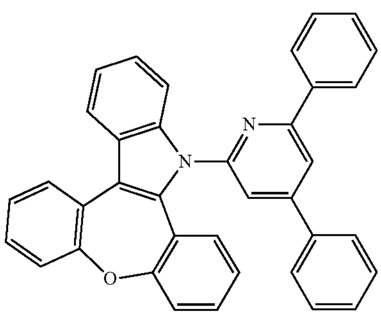
F-2
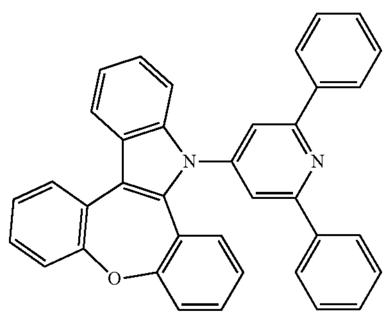
F-3
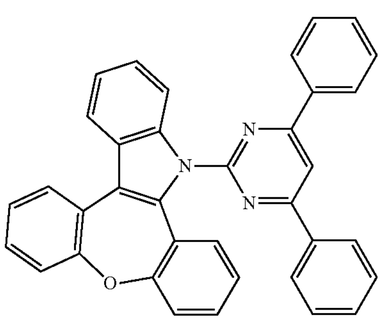
F-4
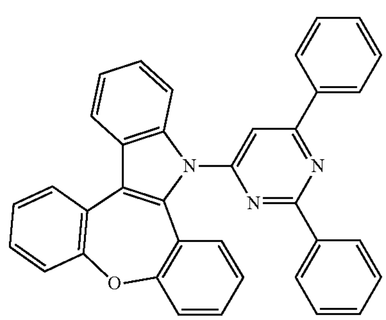

-continued
F-5
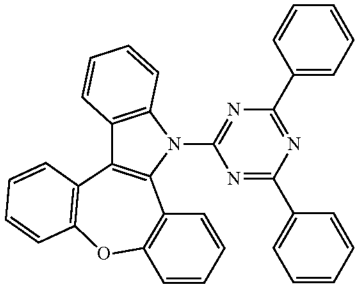
F-6
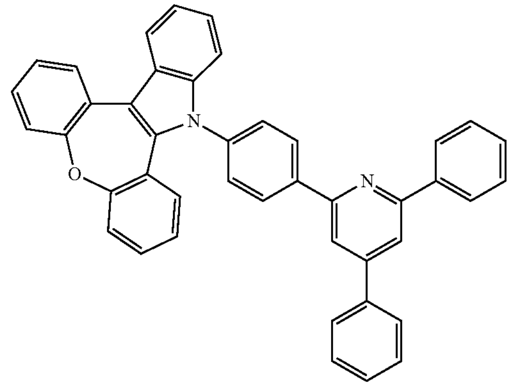
F-7
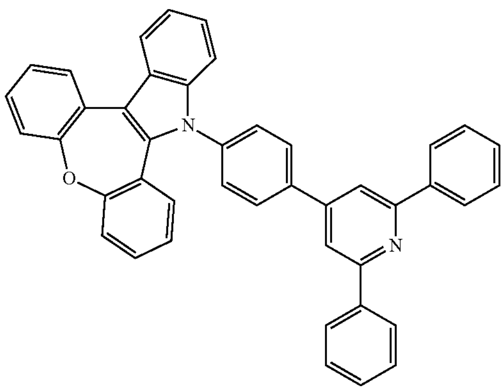
F-8
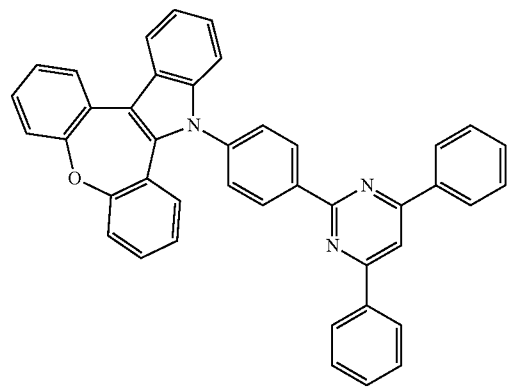
F-9
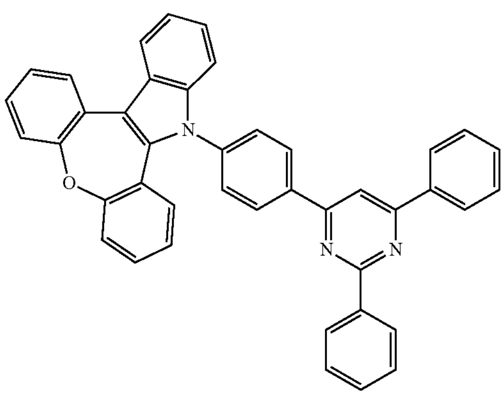
F-10
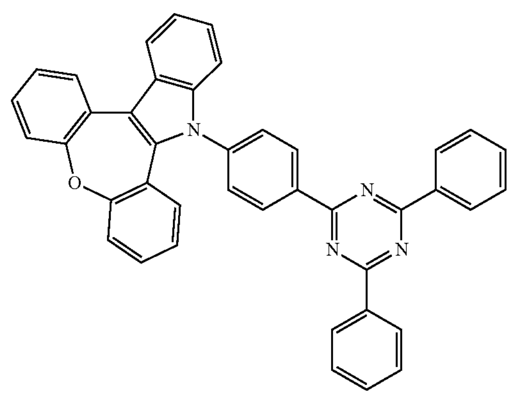
F-11
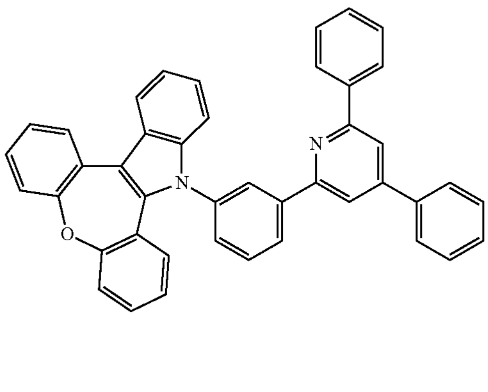
F-12
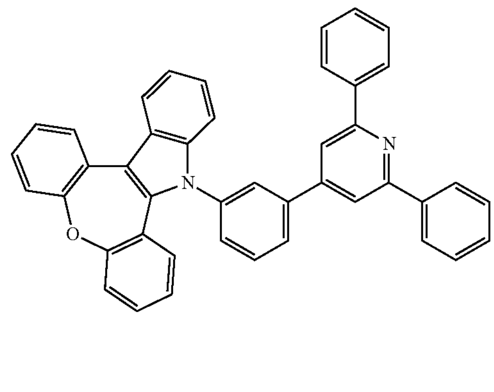

-continued
F-13
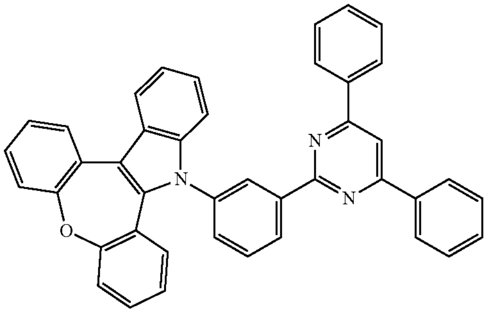
F-14
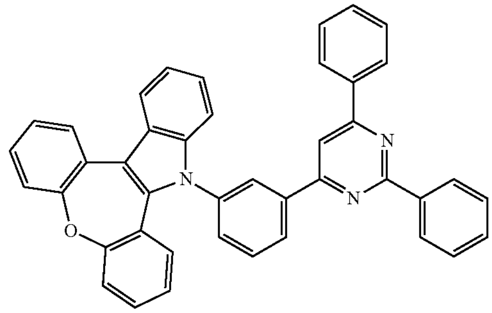
F-15
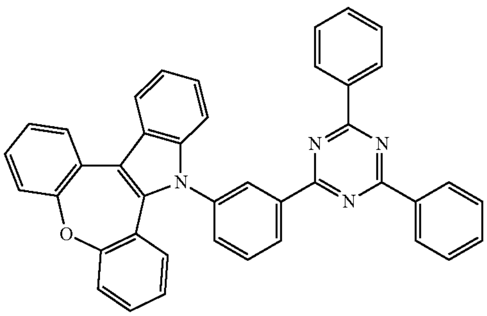
F-16
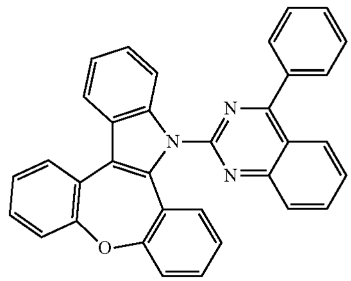
F-17
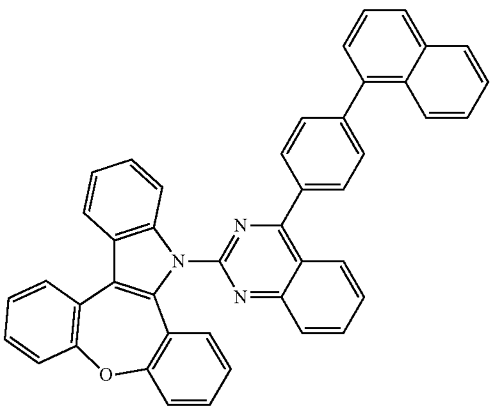
F-18
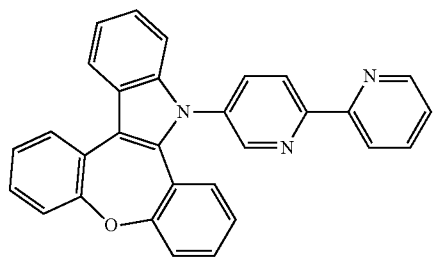
F-19
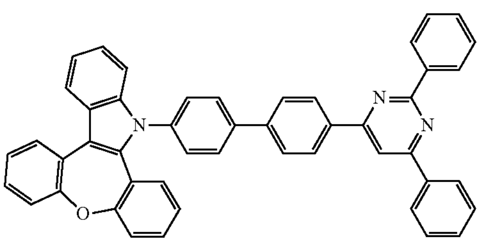
G-1
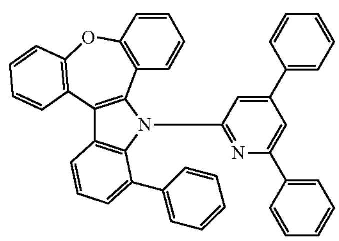
G-2
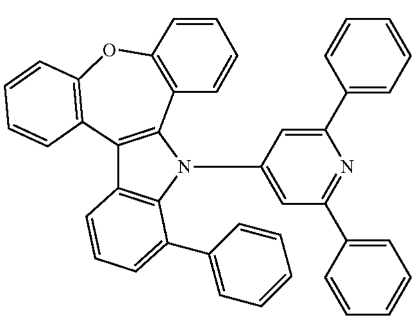
G-3
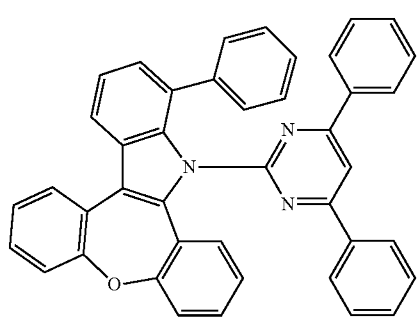

-continued
G-4
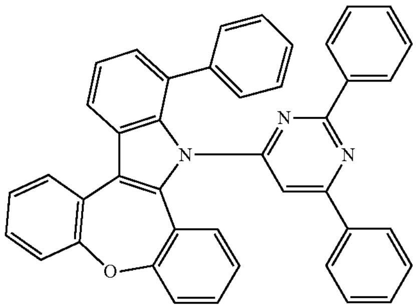
G-5
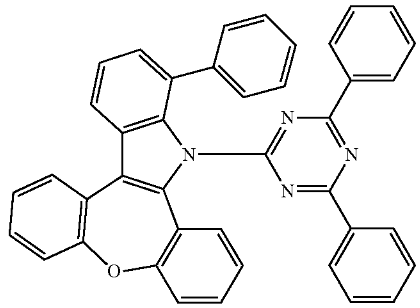
G-6
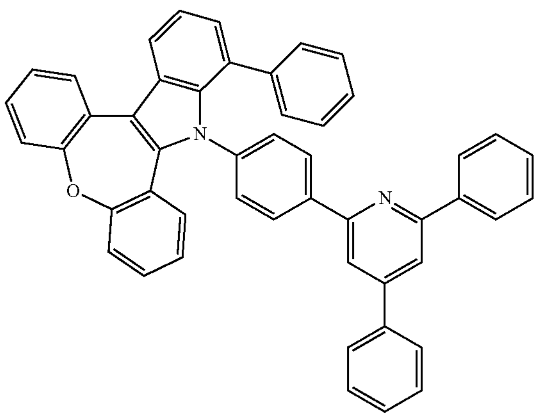
G-7
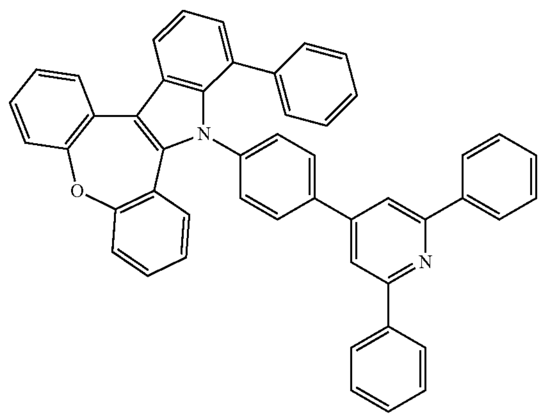
G-8
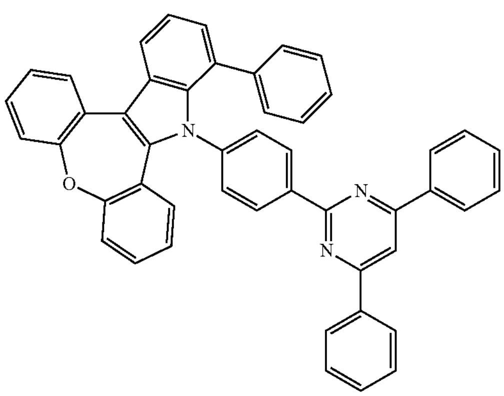
G-9
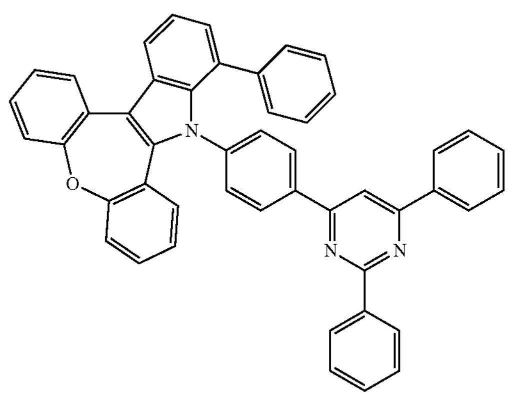
G-10
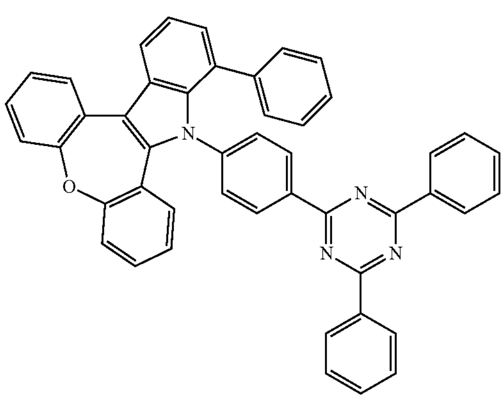
G-11
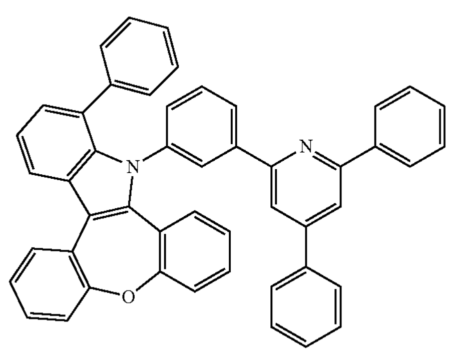

-continued
G-12
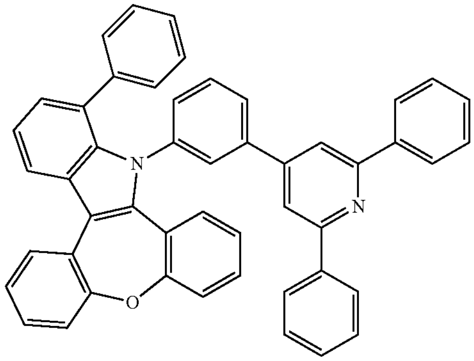
G-13
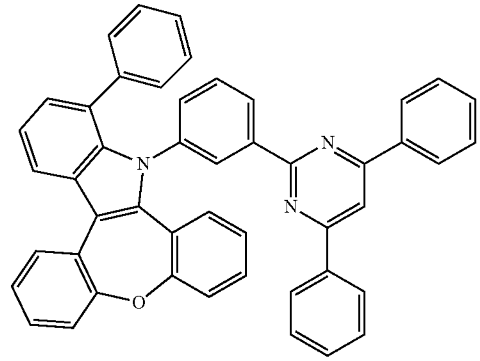
G-14
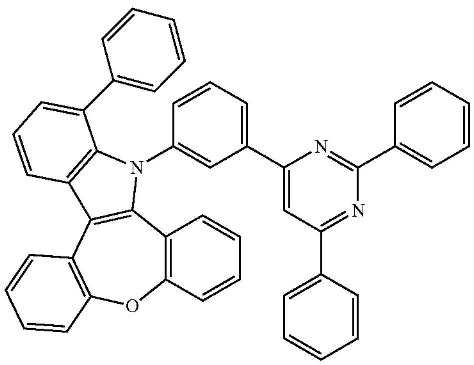
G-15
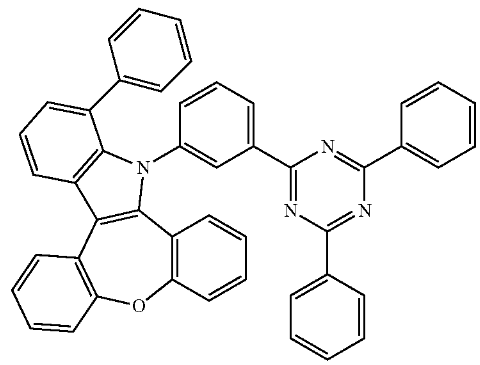
G-16
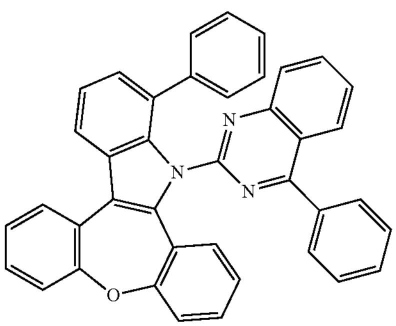
G-17
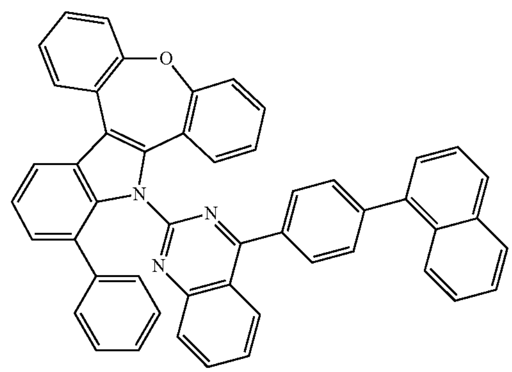
G-18
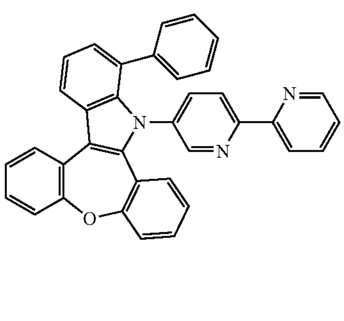
G-19
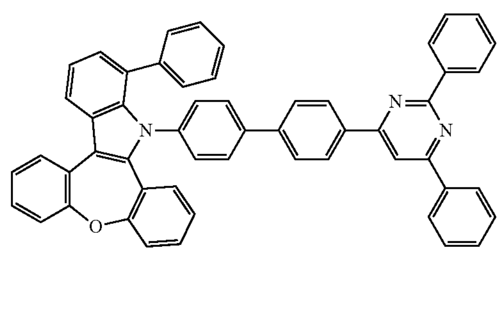

-continued
H-1
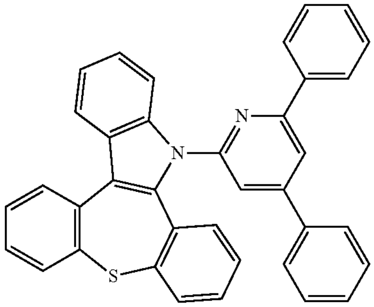
H-2
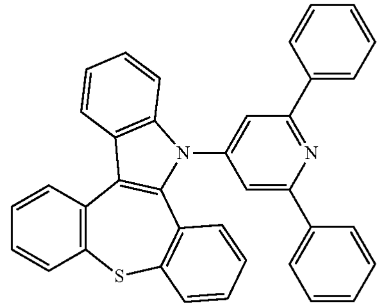
H-3
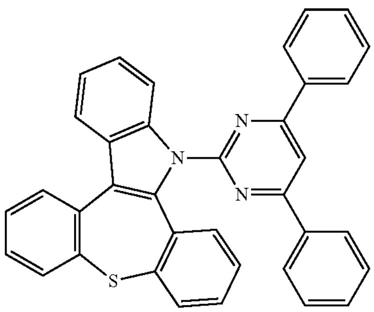
H-4
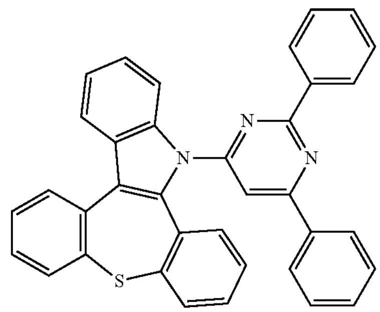
H-5
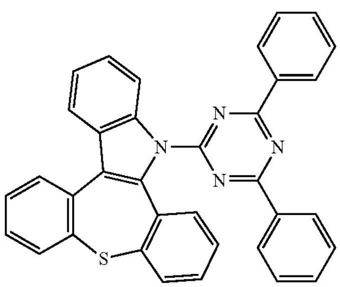
H-6
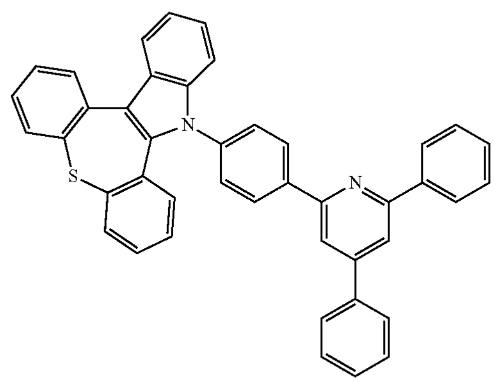
H-7
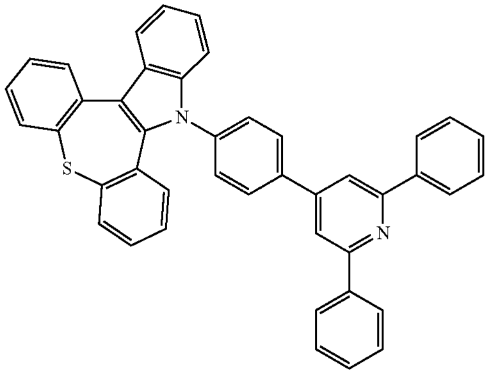
H-8
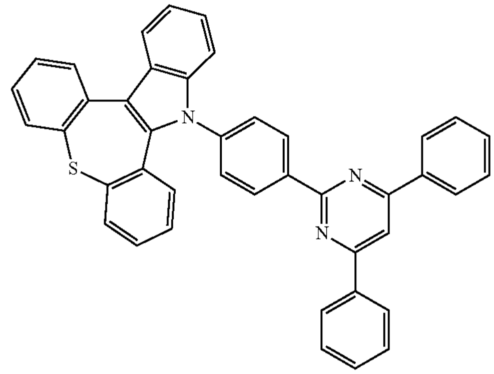

-continued
H-9
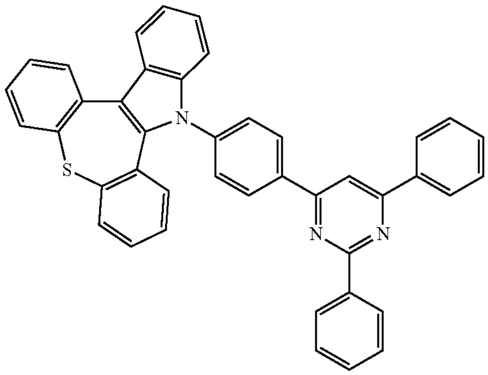
H-10
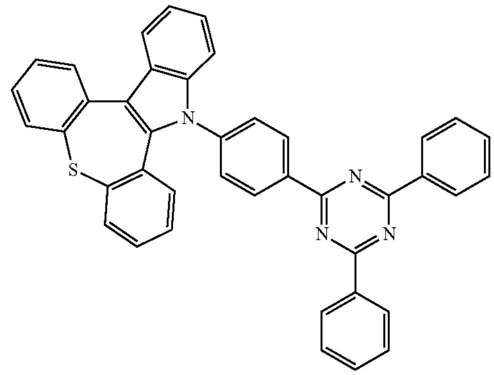
H-11
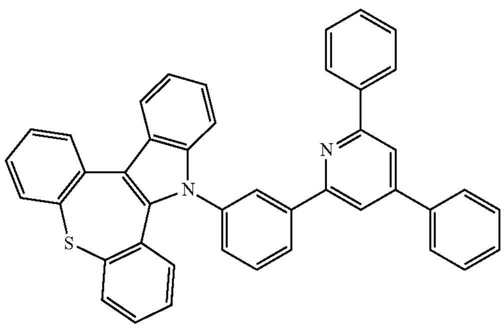
H-12
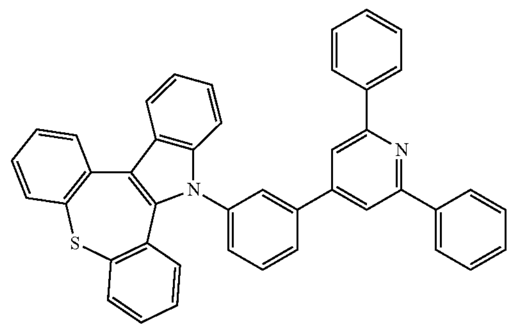
H-13
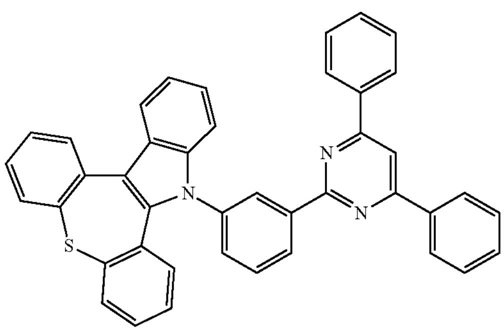
H-14
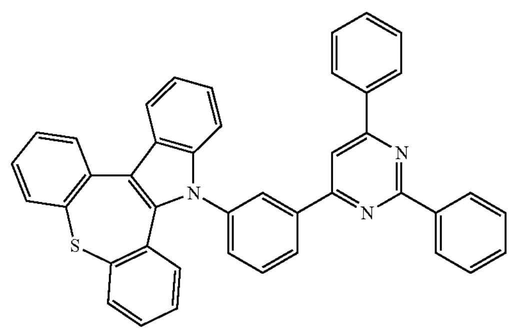
H-15
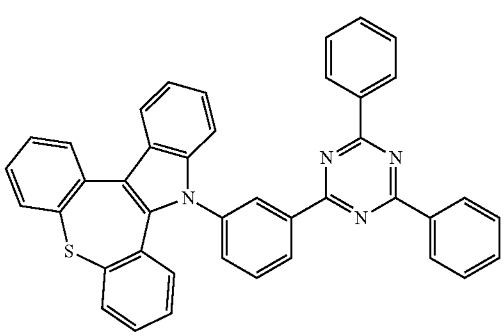
H-16
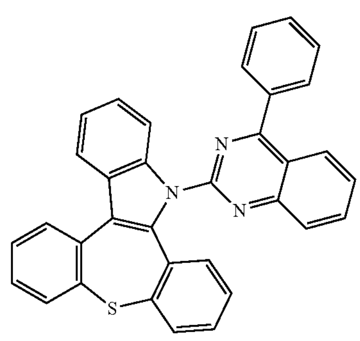

-continued
H-17
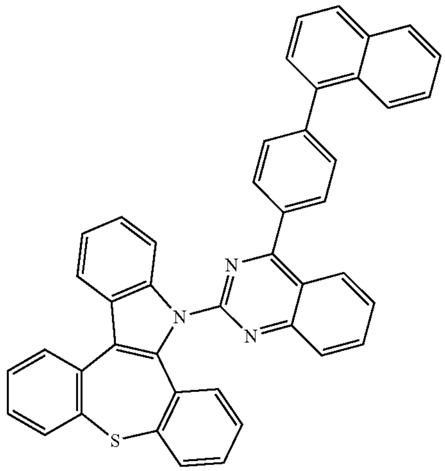
H-18
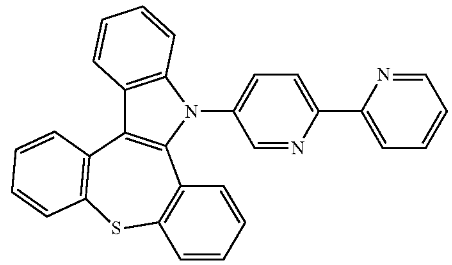
H-19
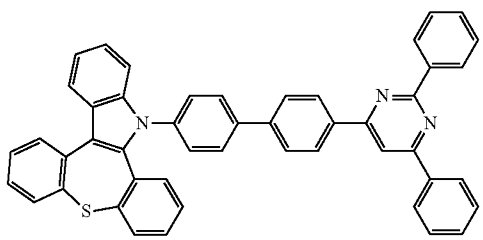
I-1
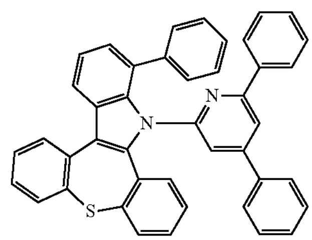
I-2
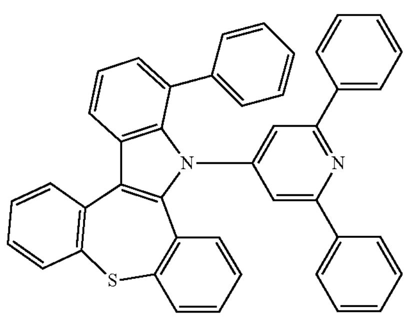
I-3
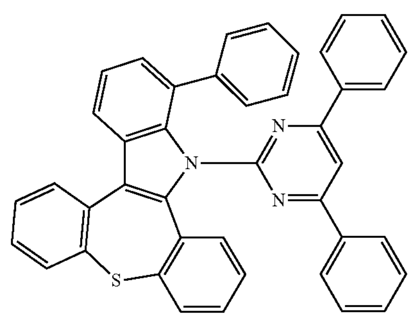
I-4
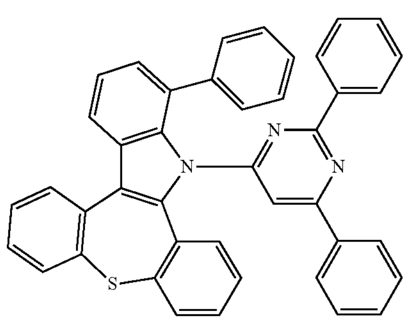
I-5
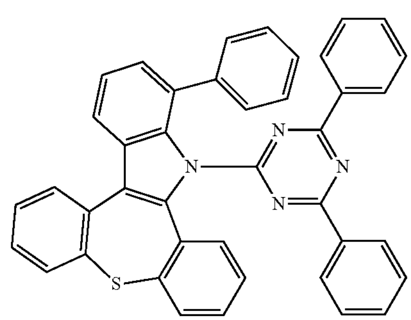

-continued
I-6
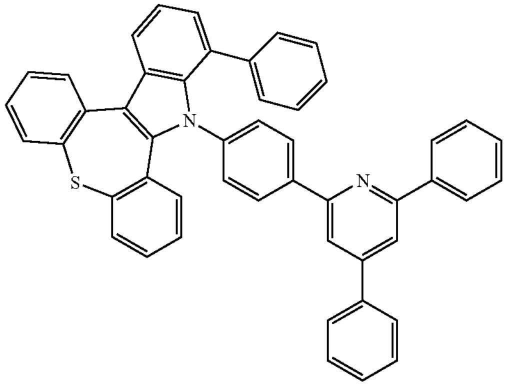
I-7
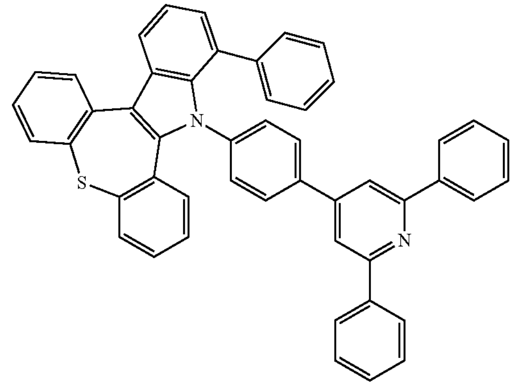
I-8
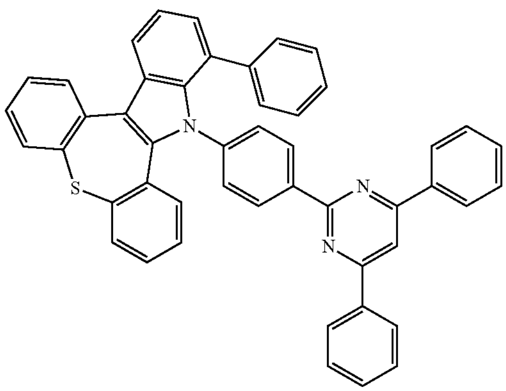
I-9
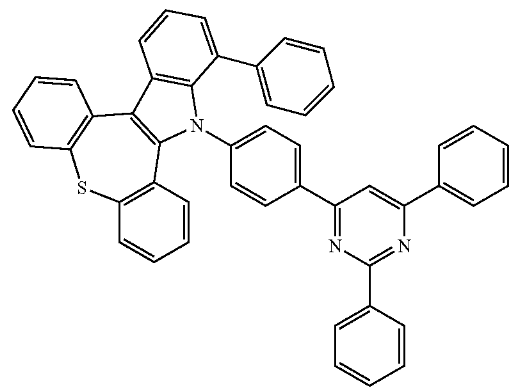
I-10
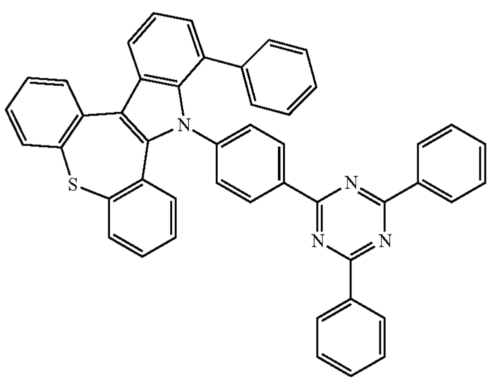
I-11
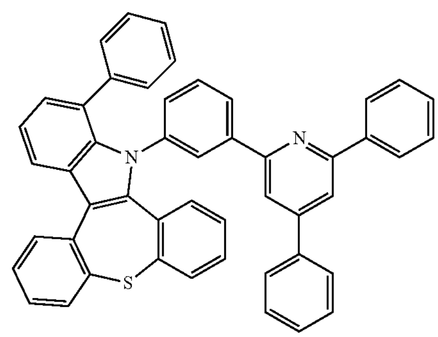
I-12
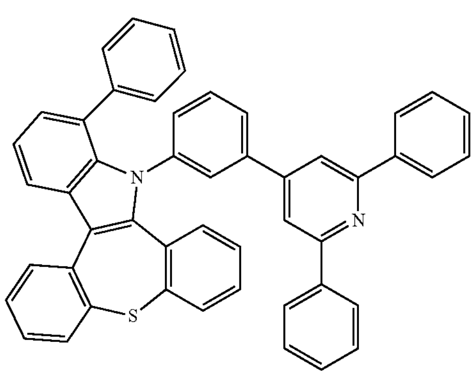
I-13
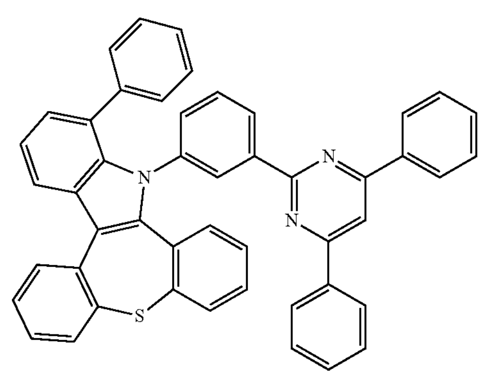

-continued
I-14
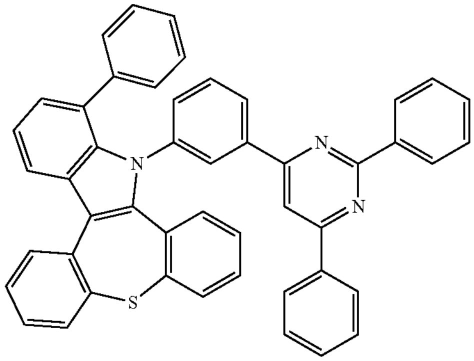
I-15
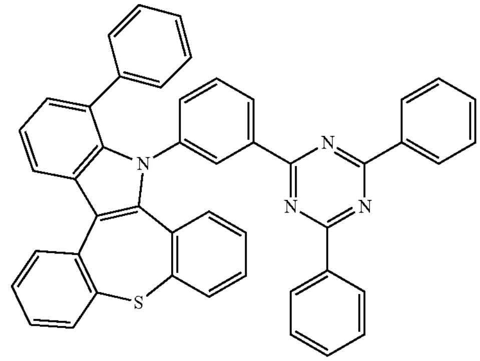
I-16
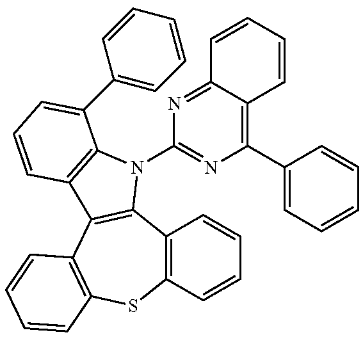
I-17
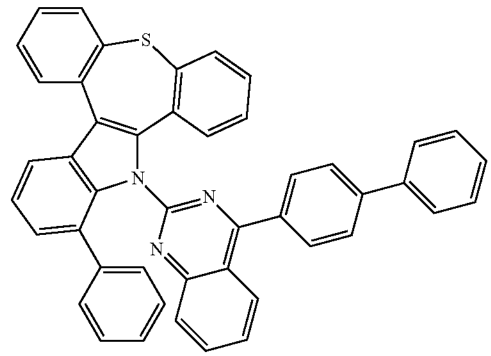
I-18
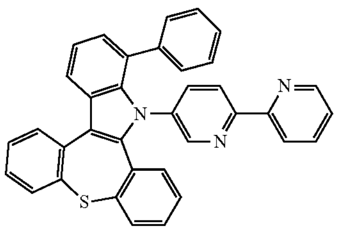
I-19
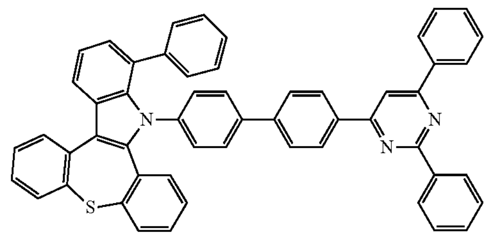
J-1
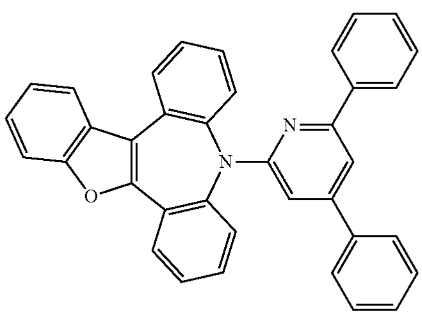
J-2
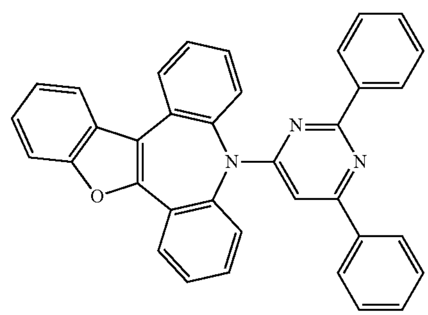
J-3
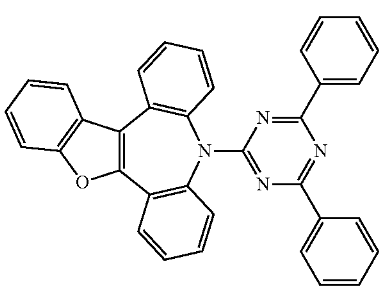
J-4
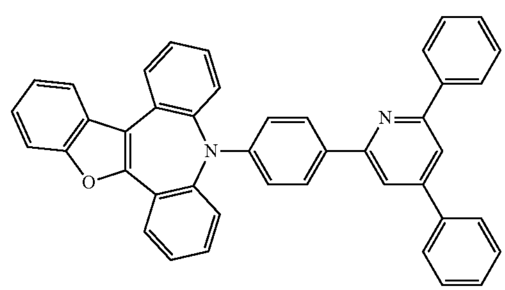

-continued
J-5
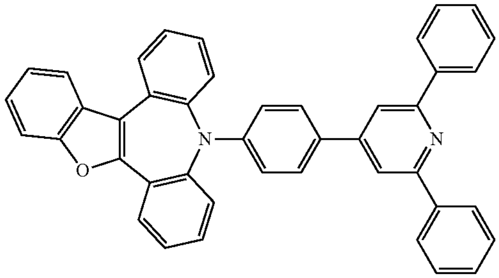
J-6
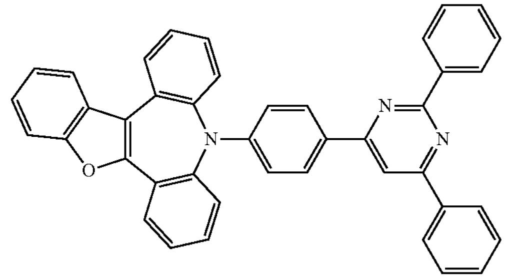
J-7
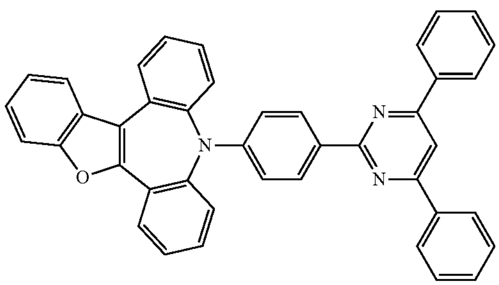
J-8
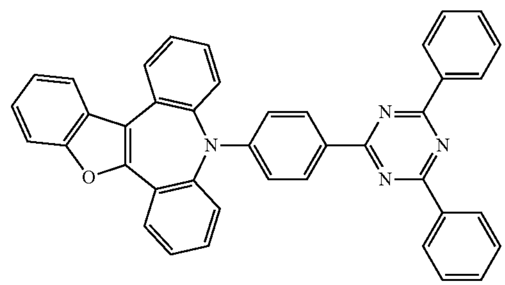
J-9
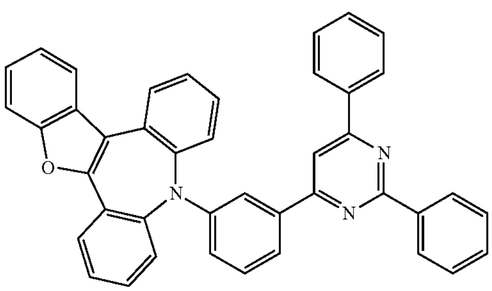
J-10
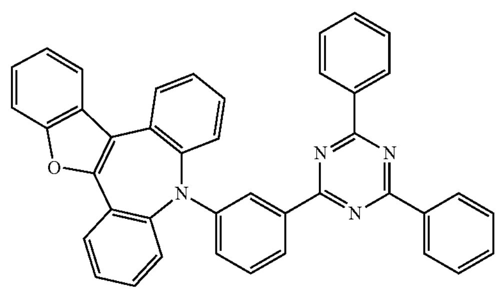
K-1
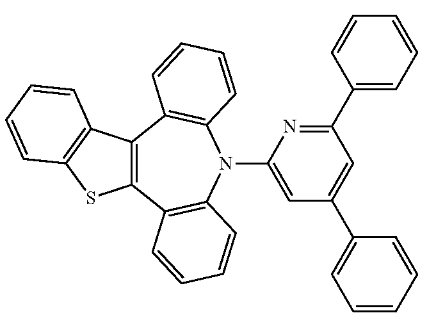
K-2
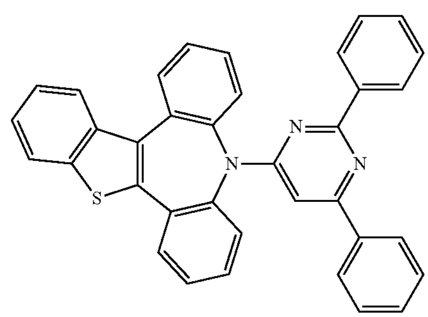
K-3
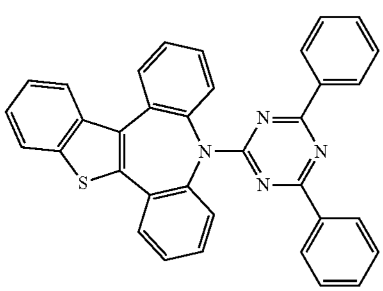
K-4
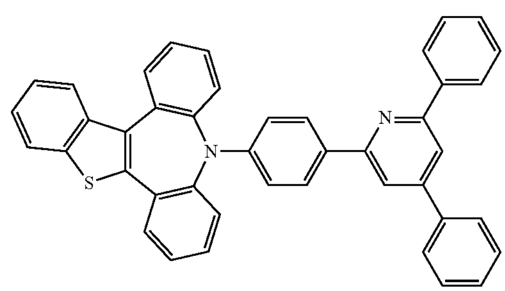

-continued
K-5
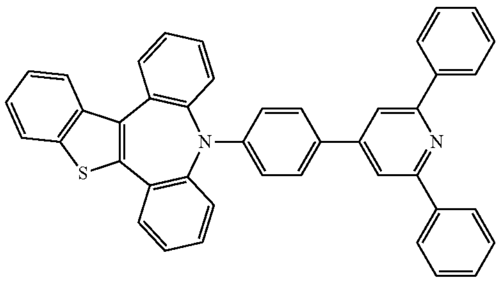
K-6
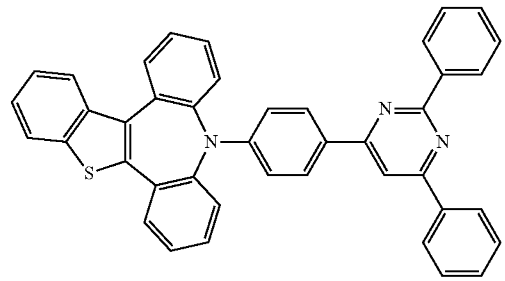
K-7
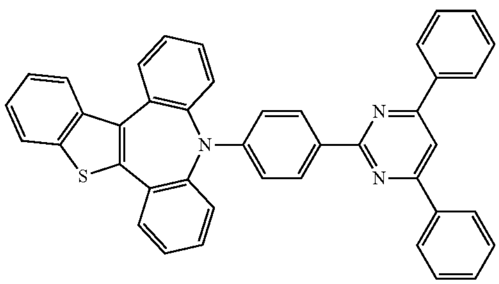
K-8
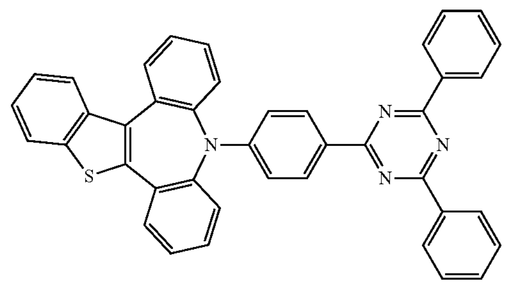
K-9
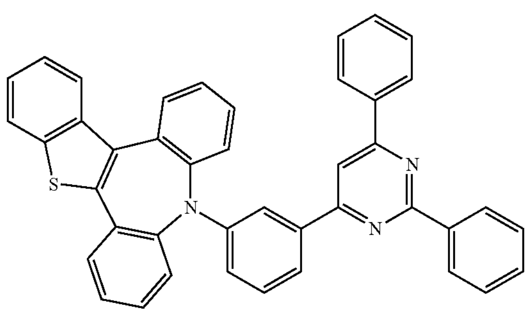
K-10
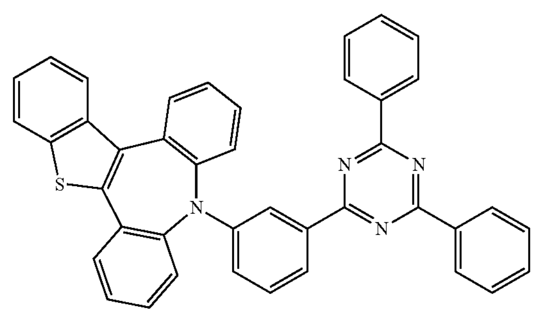
L-1
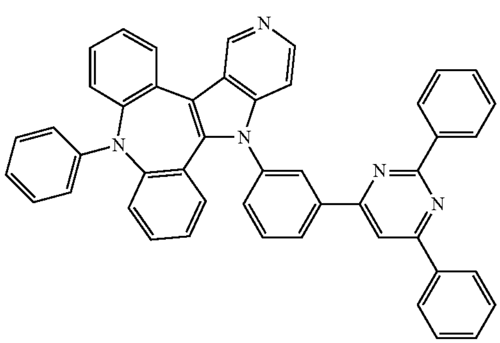
L-2
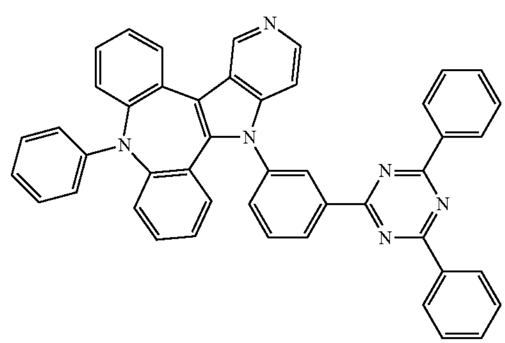
L-3
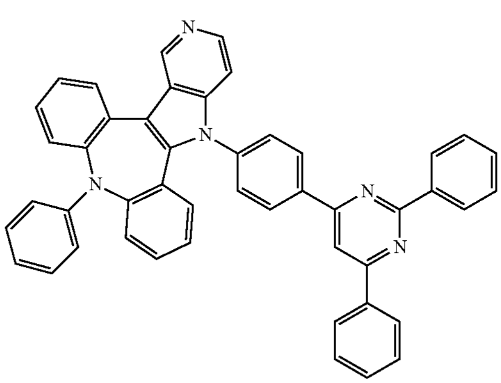
L-4
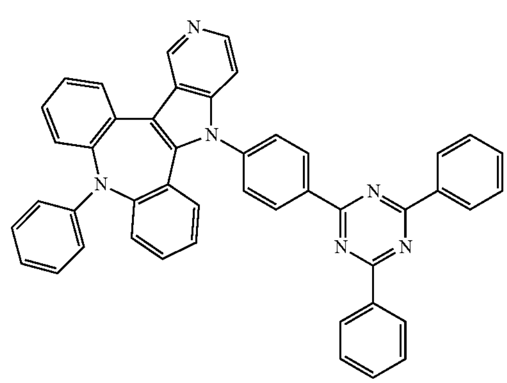

-continued
L-5
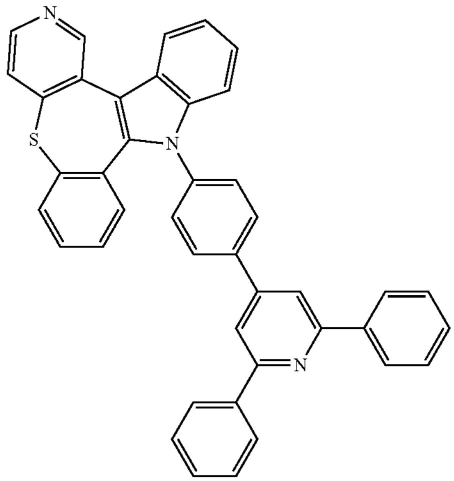
L-6
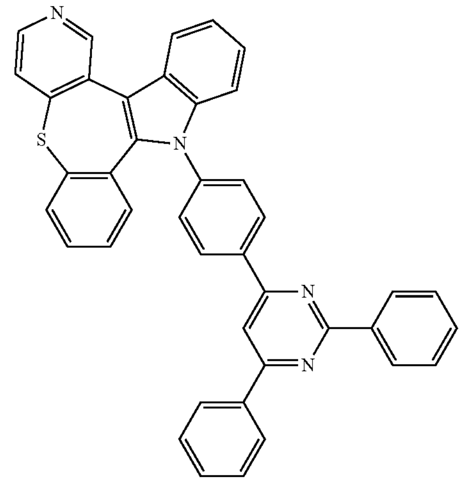
L-7
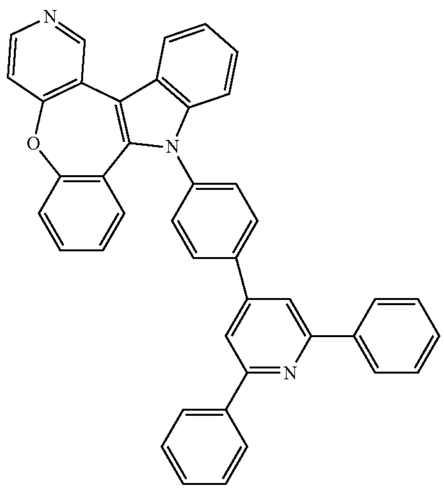
L-8
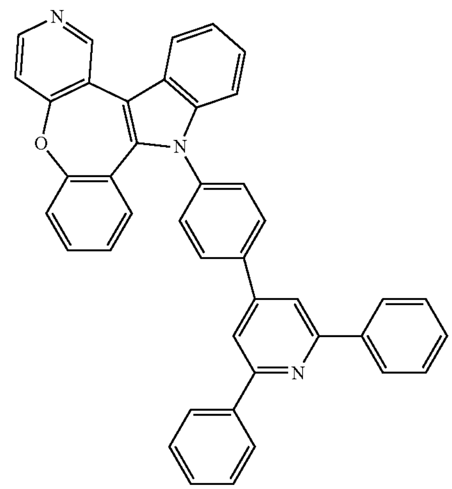
L-9
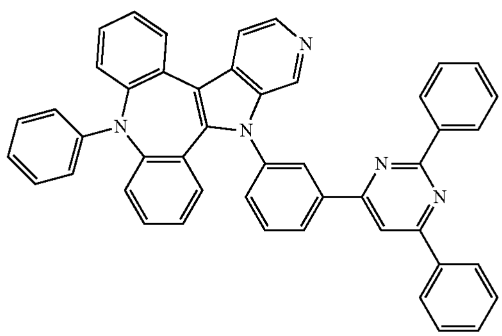
L-10
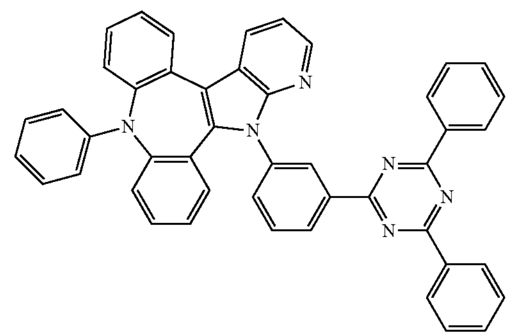
L-11
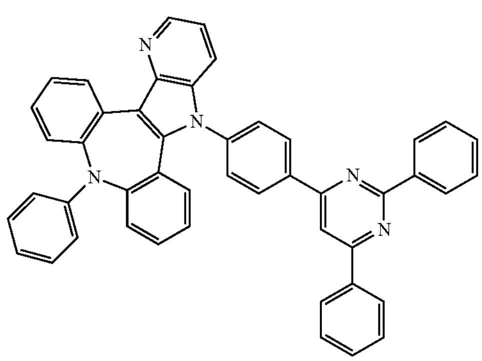
L-12
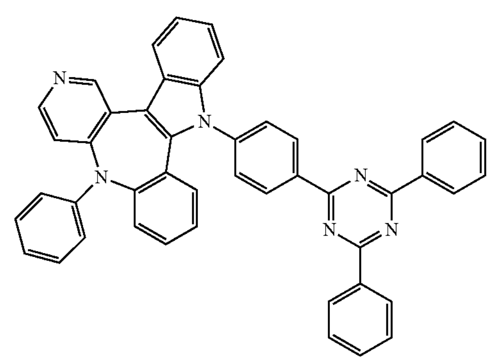

-continued
L-13
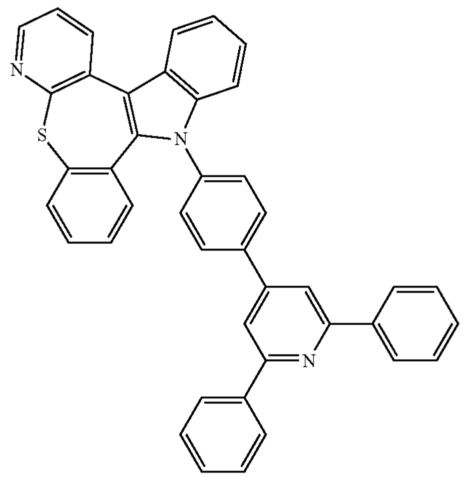
L-14
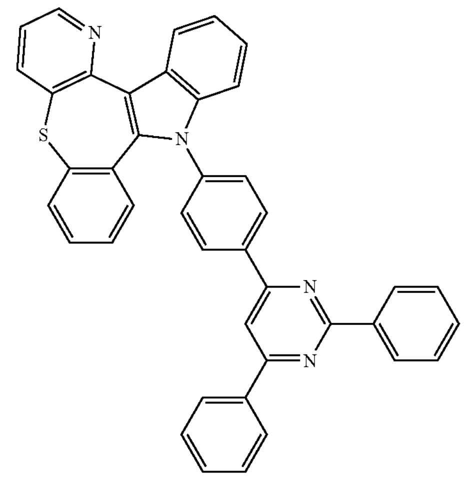
L-15
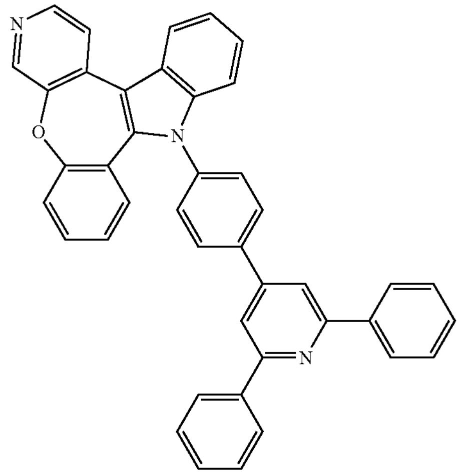
L-16
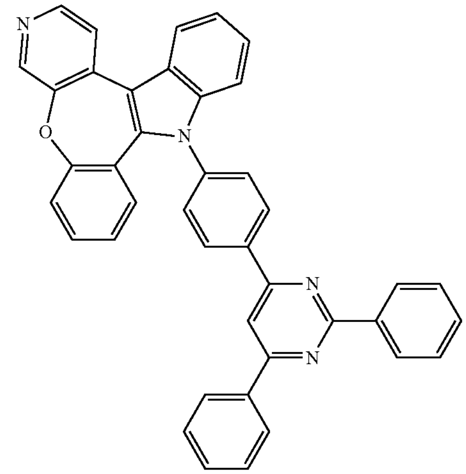
M-1
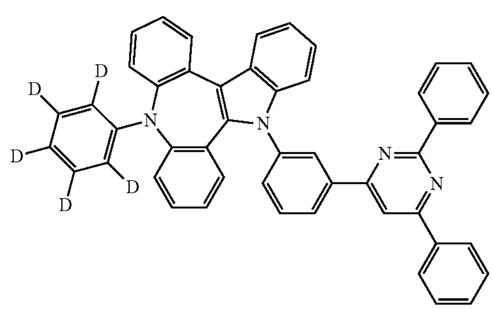
M-2
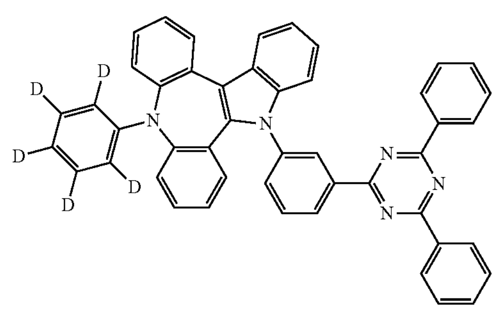

-continued
M-3
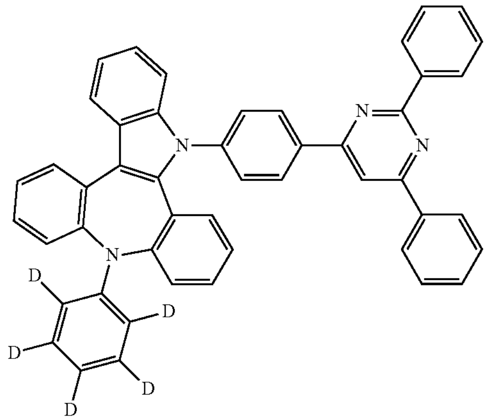
M-4
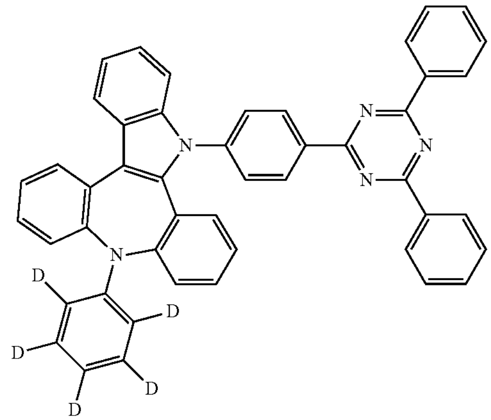
M-5
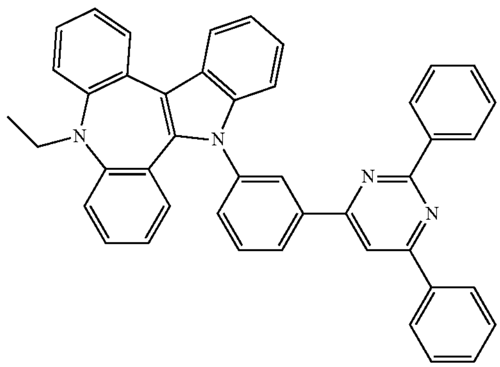
M-6
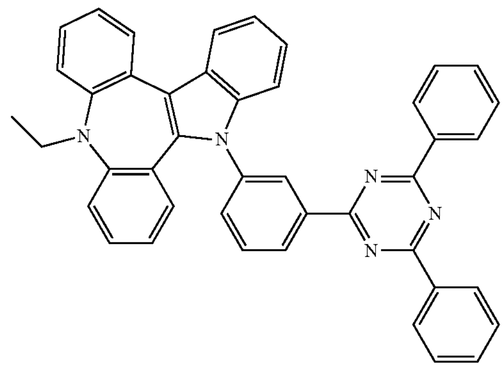
M-7
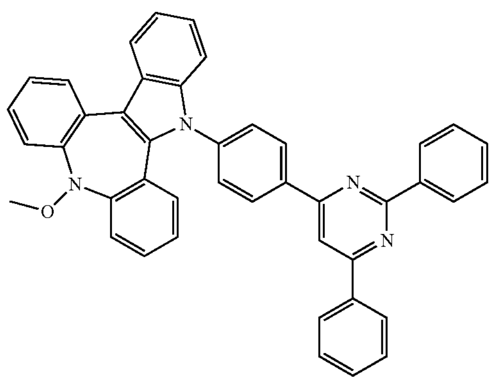
M-8
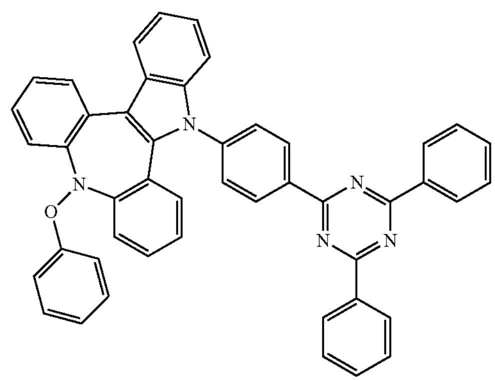
N-1
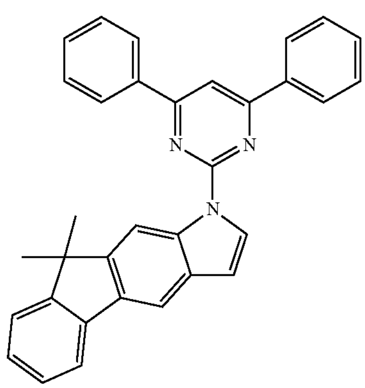
N-2
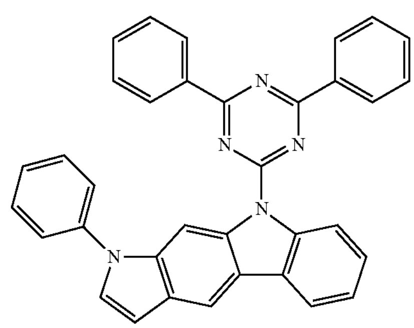

-continued
LE-01
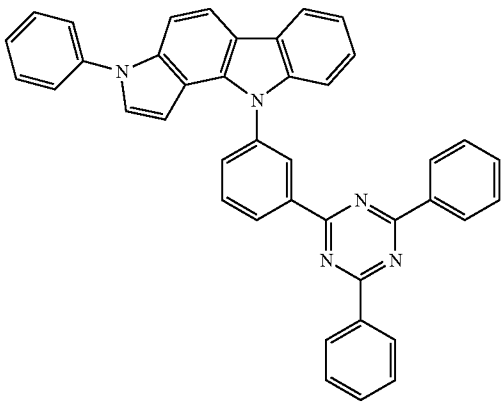
LE-02
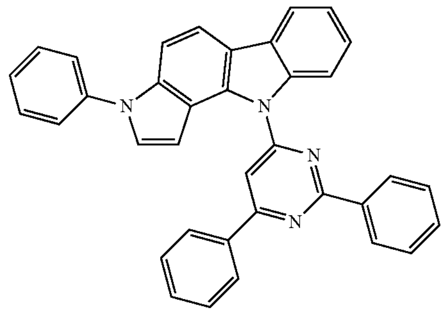
LE-03
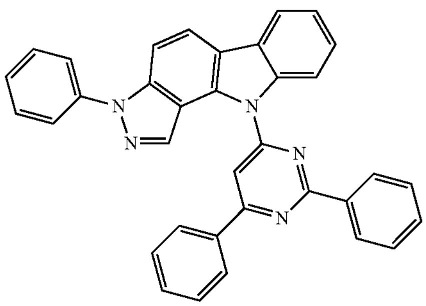
LE-04
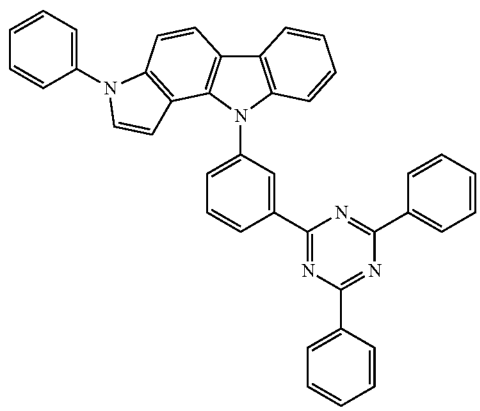
LE-05
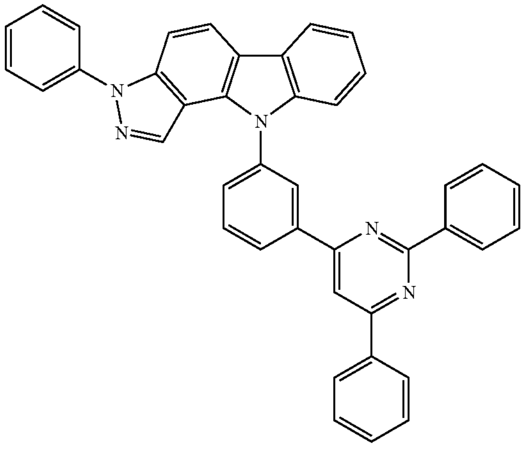
LE-06
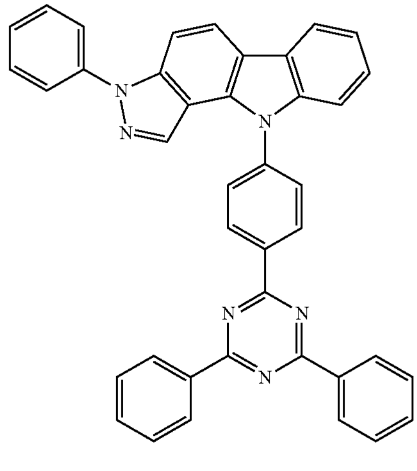

-continued
LE-07
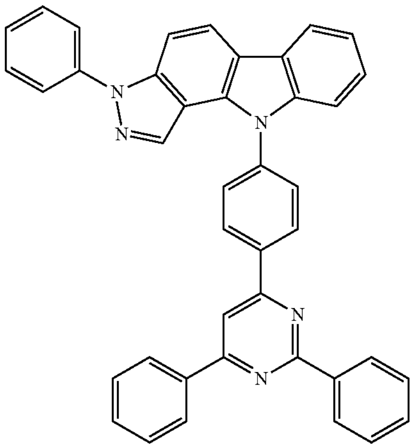
LE-08
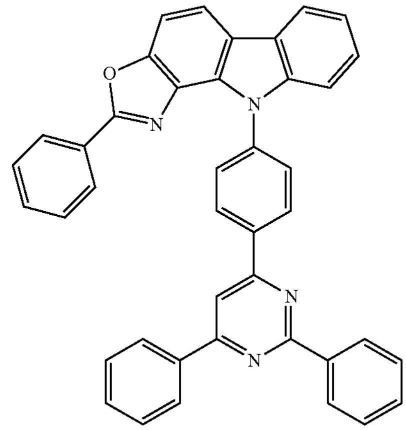
LE-09
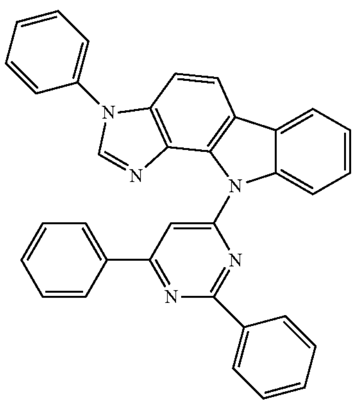
LE-10
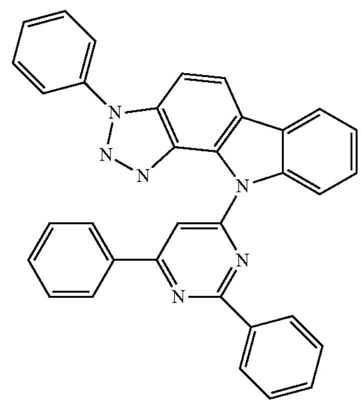
LE-11
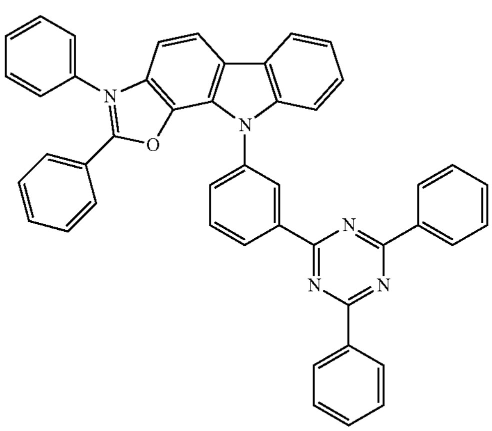
LE-12
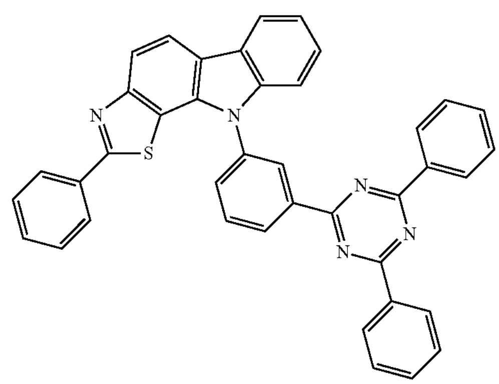

-continued
LE-13
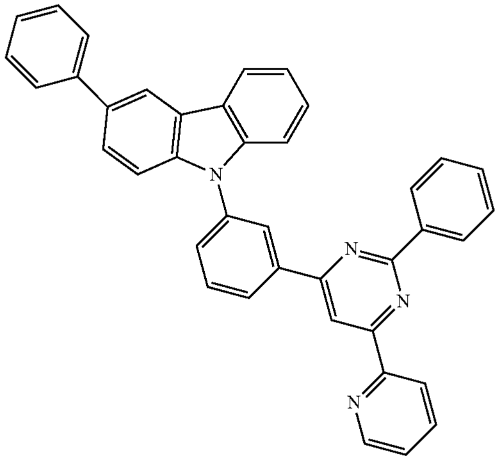
LE-14
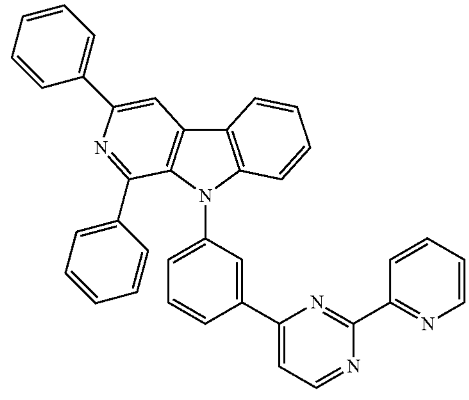
LE-15
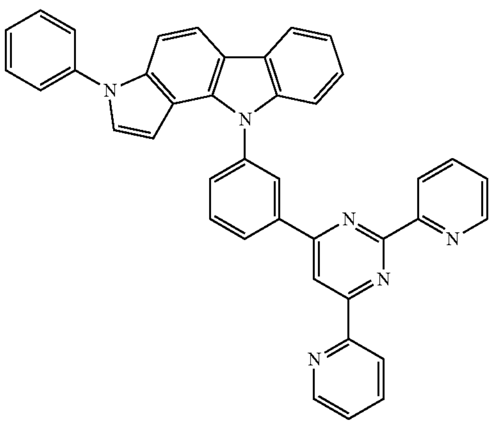
LE-16
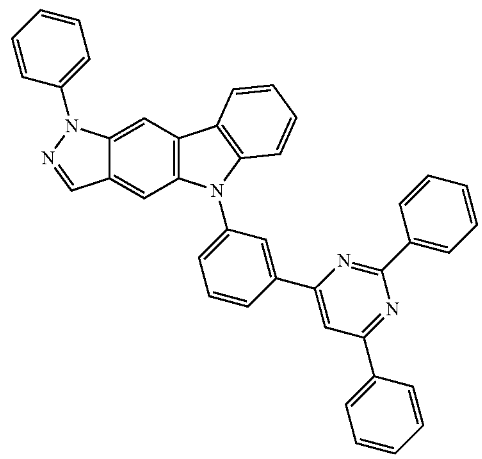
LE-17
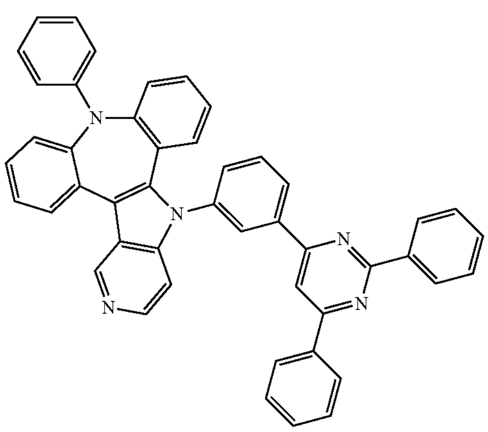
LE-18
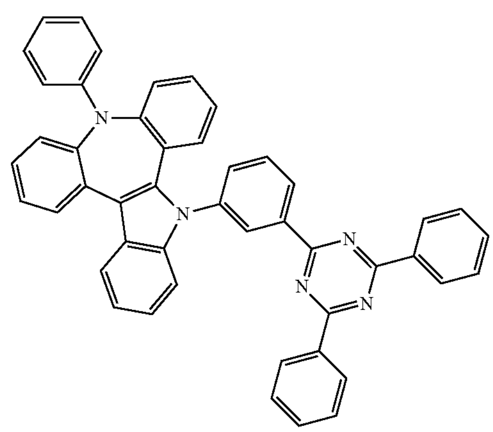

-continued
LE-19
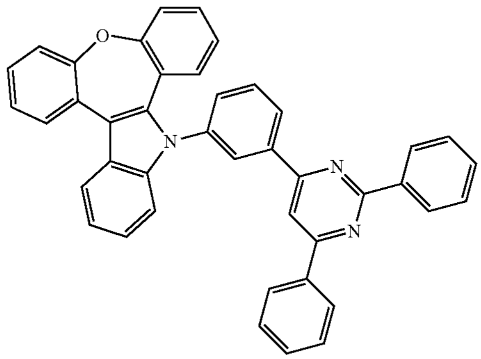
LE-20
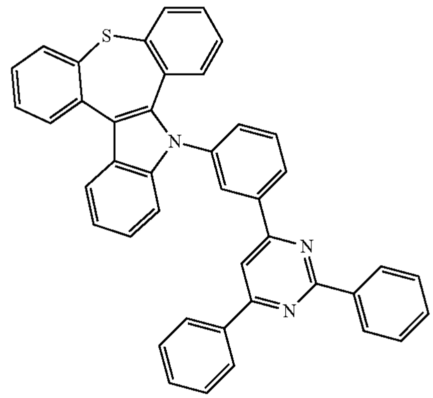
LE-21
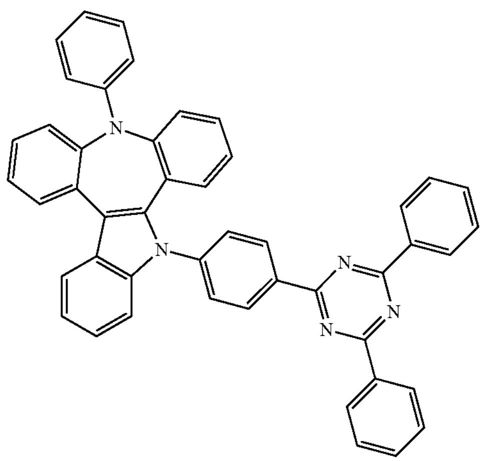
LE-22
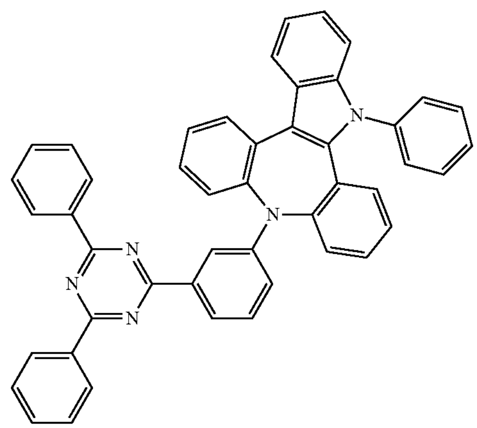
LE-23
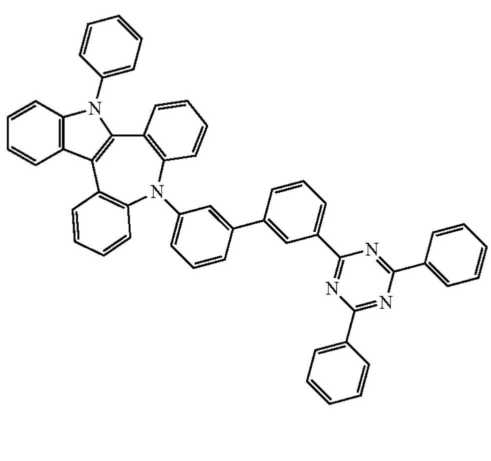
LE-24
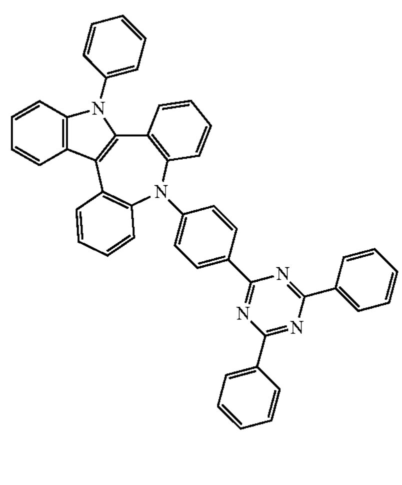

-continued
LE-25
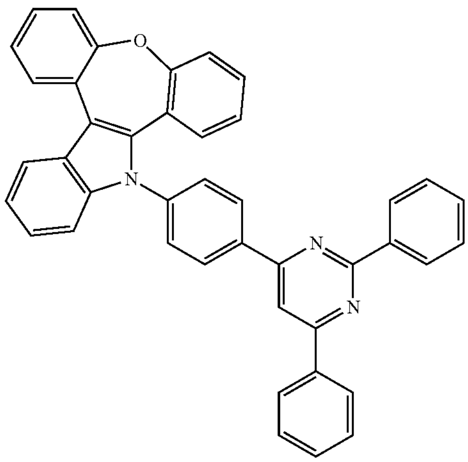
LE-26
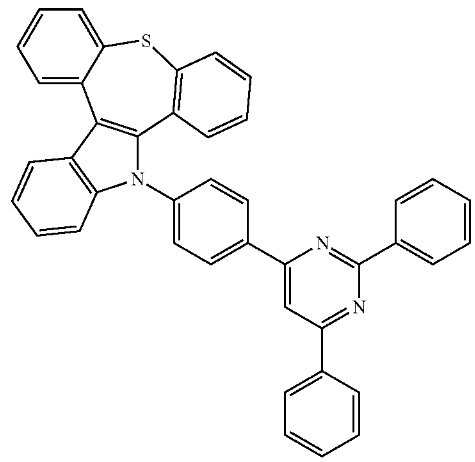
LE-27
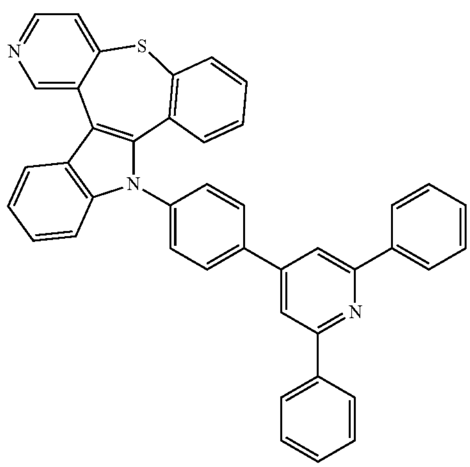
LE-28
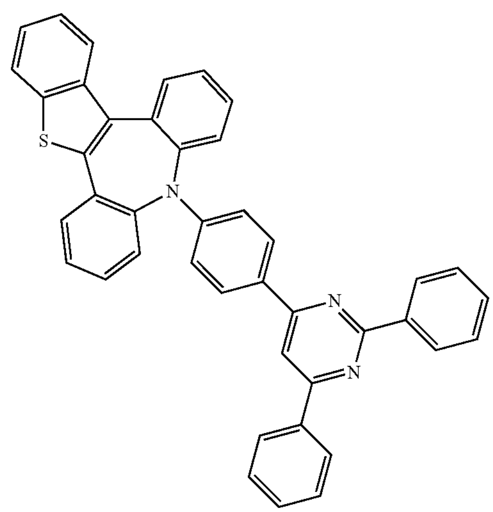
LE-29
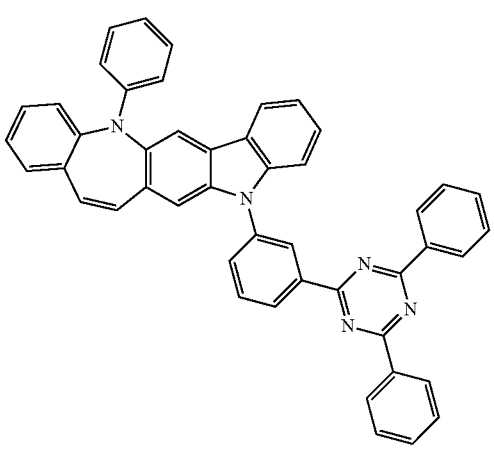
LE-30
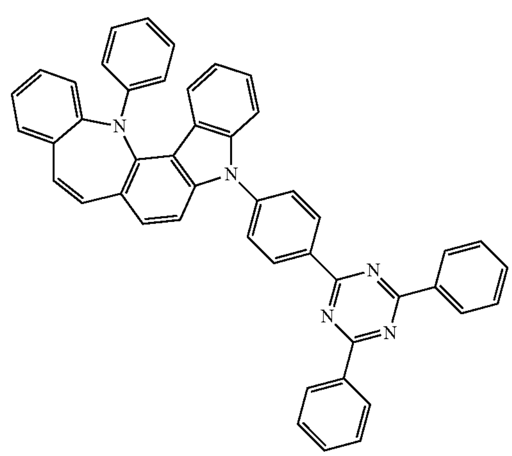

-continued
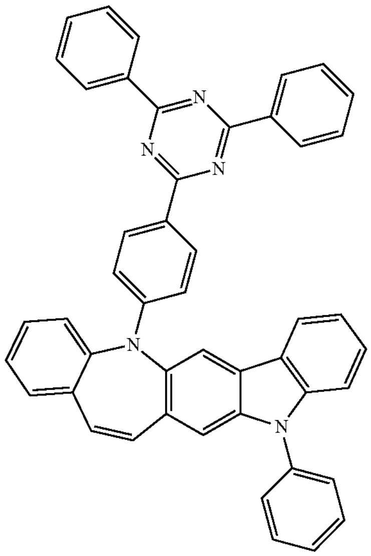
LE-31
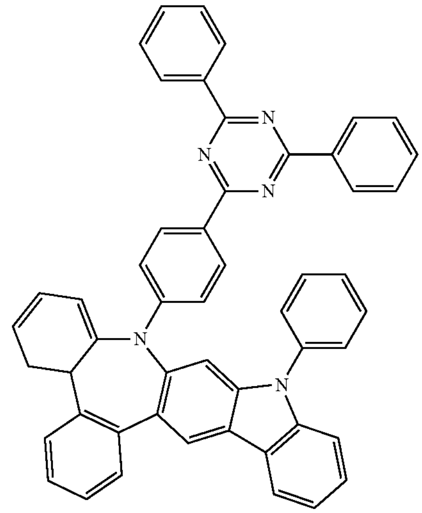
LE-32
15. The organic light-emitting device as claimed in claim 14, wherein:
the first compound is selected from Compounds 102, 104 to 106, 109 to 132, 210 to 223 and 234 to 237.
* * * * *